US011349080B2

(12) United States Patent
Xia

(10) Patent No.: US 11,349,080 B2
(45) Date of Patent: May 31, 2022

(54) ORGANIC ELECTROLUMINESCENT MATERIALS AND DEVICES

(71) Applicant: BEIJING SUMMER SPROUT TECHNOLOGY CO., LTD., Beijing (CN)

(72) Inventor: Chuanjun Xia, Lawrenceville, NJ (US)

(73) Assignee: BEIJING SUMMER SPROUT TECHNOLOGY CO., LTD., Beijing (CN)

( * ) Notice: Subject to any disclaimer, the term of this patent is extended or adjusted under 35 U.S.C. 154(b) by 531 days.

(21) Appl. No.: 16/215,673

(22) Filed: Dec. 11, 2018

(65) Prior Publication Data

US 2019/0181349 A1 Jun. 13, 2019

Related U.S. Application Data

(60) Provisional application No. 62/597,941, filed on Dec. 13, 2017.

(51) Int. Cl.
*H01L 51/50* (2006.01)
*H01L 51/00* (2006.01)
(Continued)

(52) U.S. Cl.
CPC .......... *H01L 51/0053* (2013.01); *C09K 11/06* (2013.01); *H01L 51/0051* (2013.01); *H01L 51/0059* (2013.01); *H01L 51/0074* (2013.01); *H01L 51/504* (2013.01); *H01L 51/5092* (2013.01); *H01L 51/0058* (2013.01); *H01L 51/0067* (2013.01); *H01L 51/0072* (2013.01); *H01L 51/0085* (2013.01); *H01L 51/5016* (2013.01); *H01L 51/5056* (2013.01); *H01L 51/5064* (2013.01); *H01L 51/5072* (2013.01);
(Continued)

(58) Field of Classification Search
None
See application file for complete search history.

(56) References Cited

U.S. PATENT DOCUMENTS 5,703,436 A 12/1997 Forrest et al.
5,707,745 A 1/1998 Forrest et al.
(Continued)

FOREIGN PATENT DOCUMENTS

CA 2145375 9/1995
CN 101222024 7/2008
(Continued)

OTHER PUBLICATIONS

C.W. Tang et al. "Organic electroluminescent diodes", Appl. Phys. Ltt. 51, 913 (1987); doi: 10.1063/1.98799.
(Continued)

*Primary Examiner* — Gregory D Clark
(74) *Attorney, Agent, or Firm* — Alston & Bird LLP

(57) ABSTRACT

Organic electroluminescent materials and devices are disclosed. The organic electroluminescent materials are novel benzodithiophene or its analogous structure compounds, which can be used as charge transporting materials, hole injection materials, or the like in an electroluminescent device. These novel compounds can offer excellent performance compared with existing materials, for example, to further improve the voltage, efficiency and/or lifetime of the OLEDs.

18 Claims, 3 Drawing Sheets

Figure 1:
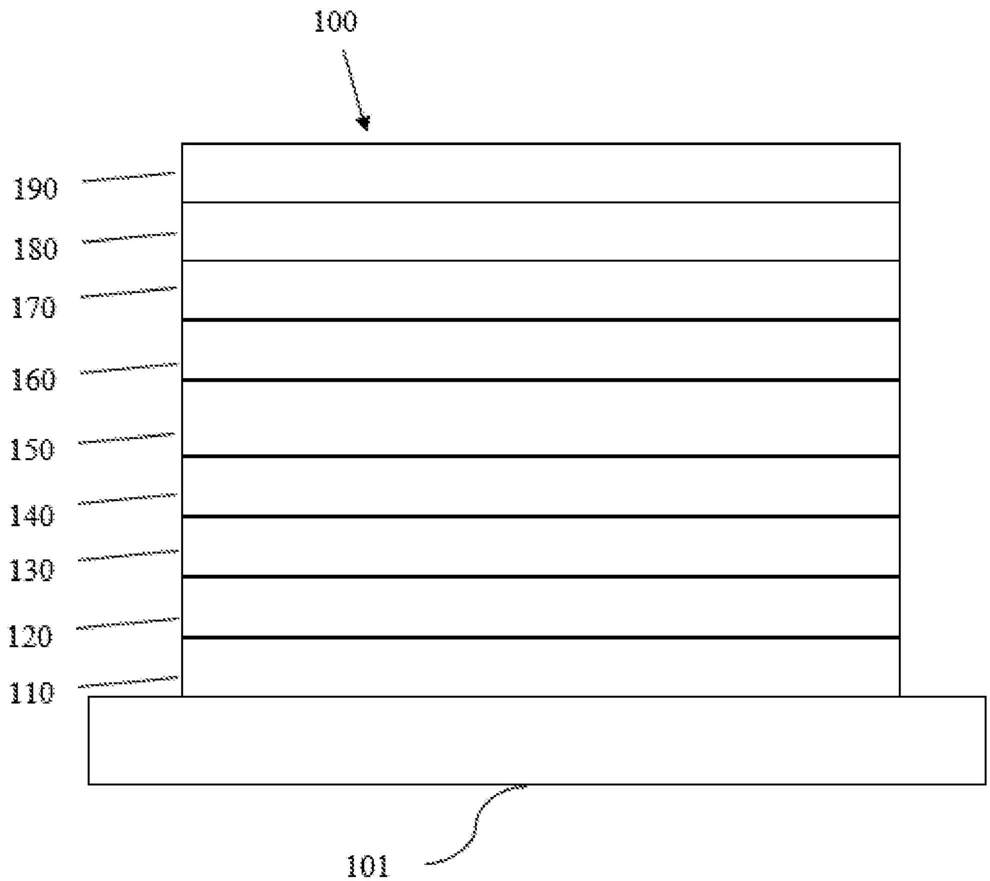

(51) Int. Cl.
*C09K 11/06* (2006.01)
*H01L 51/52* (2006.01)

(52) U.S. Cl.
CPC ...... *H01L 51/5088* (2013.01); *H01L 51/5278* (2013.01)

(56) References Cited

U.S. PATENT DOCUMENTS

| | | | | |
|---|---|---|---|---|
| 5,844,363 | A | 12/1998 | Gu et al. | |
| 6,097,147 | A | 8/2000 | Baldo et al. | |
| 6,303,238 | B1 | 10/2001 | Thompson et al. | |
| 7,279,704 | B2 | 10/2007 | Walters et al. | |
| 7,968,146 | B2 | 6/2011 | Wagner et al. | |
| 2003/0170491 | A1* | 9/2003 | Liao | H01L 51/5278 428/690 |
| 2003/0230980 | A1 | 12/2003 | Forrest et al. | |
| 2004/0174116 | A1 | 9/2004 | Lu et al. | |
| 2005/0121667 | A1 | 6/2005 | Kuehl et al. | |
| 2007/0018569 | A1* | 1/2007 | Kawamura | H05B 33/14 313/504 |
| 2010/0210762 | A1 | 8/2010 | Hanaki et al. | |
| 2011/0155976 | A1 | 6/2011 | Furukawa et al. | |
| 2015/0155490 | A1 | 6/2015 | Ryu et al. | |
| 2015/0349273 | A1 | 12/2015 | Hung et al. | |
| 2016/0013426 | A1 | 1/2016 | Yoshioka et al. | |
| 2016/0359122 | A1 | 12/2016 | Boudreault et al. | |
| 2019/0081250 | A1 | 3/2019 | Yoshioka et al. | |
| 2020/0062778 | A1 | 2/2020 | Cui et al. | |
| 2020/0087311 | A1 | 3/2020 | Cui et al. | |

FOREIGN PATENT DOCUMENTS

| | | | |
|---|---|---|---|
| JP | H06-80672 | 3/1994 | |
| JP | 2009-67720 | 4/2009 | |
| JP | 2009-242339 | 10/2009 | |
| JP | 200924339 | * 10/2009 | H01I 51/40 |
| JP | 2011-154226 | 8/2011 | |
| KR | 10-2018-0137942 | 12/2018 | |
| WO | 2009022738 | 2/2009 | |
| WO | 2010098326 | 9/2010 | |
| WO | 2012109747 | 8/2012 | |
| WO | 2019053968 | 3/2019 | |

OTHER PUBLICATIONS

Ortiz, R. P. et al., "Quinoidal Oligothiophenes: Towards Biradical Ground-State Species", Chemistry A European Journal, 2010, 16, 470-484; doi:10.1002/chem.200902037.

Suzuki, K., et al., "New electron acceptors containing thieno[3,4-b]pyrazine units", Journal of Materials Chemistry, 1998, 8(5), 1117-1119; doi:10.1039/A801558I.

Suzuki, K., et al., "TCNQ analogues composed of heterocyclic rings", Synthetic Metals, 102(1999), 1480-1481; doi:10.1016/50379-6779(98)00562-1.

Takahashi, T., et al., "Extensive Quinoidal Oligothiophenes with Dicyanomethylene Groups at Terminal Positions as Highly Amphoteric Redox Molecules", Journal of American Chemical Society, 2005, 127, 8928-8929; doi:10.1021/ia051840m.

Wang, Shitao, et al., "Donor-acceptor-donor type organic semiconductor containing quinoidal benzo-[1,2-b:4,5-b0] dithiophene for high performancen-channel field-effect transistors", Chemical Communication, 2014, 50, 985-987; doi:10.1039/c3cc47826b.

Yoshida, Shu, et al., "Novel Electron Acceptors Bearing a Heteroquinonoid System. 4. Syntheses, Properties, and Charge-Transfer Complexes of 2,7-Bis(dicyanomethylene)-2,7-dihydrobenzo[2,1-b:3,4-b']dithiophene, 2,7-Bis(dicyanomethylene)-2,7-dihydrobenzo[1,2-b:4,3-b']dithiophene, and 2,6-Bis(dicyanomethylene)-2,6-dihydrobenzo[1,2-b:4,5-b']dithiophene", Journal of Organic Chemistry, 1994, 59, 3077-3081; doi:10.1021/jo00090a027.

Kashiki, T., et al., "Alkylated 2,6-Bis(dicyanomethylene)-2,6-dihydrobenzo[1,2-b:4,5-b0]dithiophenes: New Soluble n-Channel Organic Semiconductors for Air-stable OFETs", Chemistry Letters, 38 (2009), 6, 568-569; doi : 10.1246/cl.2009.568.

Fujii, M., et al., "2.6-bis(dicyanomethylene)-2.6-dihydrobenzo[1,2-b:4,5-b']dithiophene as a Novel Electron Acceptor", Synthetic Metals, 55-57 (1993), 1910-1913; doi:10.1016/0379-6779(93)90346-X.

Hiroki Uoyama et al. "Highli efficient organic light-emitting diodes from delayed fluorescence", Nature, vol. 492, Dec. 13, 2012. doi:10.1038/nature11687, 234.

Search Report issued in CN201811460845.3 dated Feb. 3, 2021.

Chinese Office Action issued in CN201811460845.3 dated Feb. 3, 2021.

Translation of Search Report issued in CN201811460845.3 dated Feb. 3, 2021.

Translation of Chinese Office Action issued in CN201811460845.3 dated Feb. 3, 2021.

* cited by examiner

ORGANIC ELECTROLUMINESCENT MATERIALS AND DEVICES

This application claims the benefit of U.S. Provisional Application No. 62/597,941, filed Dec. 13, 2017, the entire content of which is incorporated herein by reference.

1 FIELD OF THE INVENTION

The present invention relates to compounds for organic electronic devices, such as organic light emitting devices. More specifically, the present invention relates to compounds having a benzodithiophene structure, a benzodifuran structure, a benzodiselenophene structure, or the like, and organic electroluminescent devices comprising the compounds.

2 BACKGROUND ART

An organic electronic device is preferably selected from the group consisting of organic light-emitting diodes (OLEDs), organic field-effect transistors (O-FETs), organic light-emitting transistors (OLETs), organic photovoltaic devices (OPVs), dye-sensitized solar cells (DSSCs), organic optical detectors, organic photoreceptors, organic field-quench devices (OFQDs), light-emitting electrochemical cells (LECs), organic laser diodes and organic plasmon emitting devices.

In 1987, Tang and Van Slyke of Eastman Kodak reported a bilayer organic electroluminescent device, which comprises an arylamine hole transporting layer and a tris-8-hydroxyquinolato-aluminum layer as the electron and emitting layer (Applied Physics Letters, 1987, 51 (12): 913-915). Once a bias is applied to the device, green light was emitted from the device. This invention laid the foundation for the development of modern organic light-emitting diodes (OLEDs). State-of-the-art OLEDs may comprise multiple layers such as charge injection and transporting layers, charge and exciton blocking layers, and one or multiple emissive layers between the cathode and anode. Since OLED is a self-emitting solid state device, it offers tremendous potential for display and lighting applications. In addition, the inherent properties of organic materials, such as their flexibility, may make them well suited for particular applications such as fabrication on flexible substrates.

OLED can be categorized as three different types according to its emitting mechanism. The OLED invented by Tang and van Slyke is a fluorescent OLED. It only utilizes singlet emission. The triplets generated in the device are wasted through nonradiative decay channels. Therefore, the internal quantum efficiency (IQE) of a fluorescent OLED is only 25%. This limitation hindered the commercialization of OLED. In 1997, Forrest and Thompson reported phosphorescent OLED, which uses triplet emission from heave metal containing complexes as the emitter. As a result, both singlet and triplets can be harvested, achieving 100% IQE. The discovery and development of phosphorescent OLED contributed directly to the commercialization of active-matrix OLED (AMOLED) due to its high efficiency. Recently, Adachi achieved high efficiency through thermally activated delayed fluorescence (TADF) of organic compounds. These emitters have small singlet-triplet gap that makes the transition from triplet back to singlet possible. In the TADF device, the triplet excitons can go through reverse intersystem crossing to generate singlet excitons, resulting in high IQE.

OLEDs can also be classified as small molecule and polymer OLEDs according to the forms of the materials used. Small molecule refers to any organic or organometallic material that is not a polymer. The molecular weight of a small molecule can be large as long as it has well defined structure. Dendrimers with well-defined structures are considered as small molecules. Polymer OLEDs include conjugated polymers and non-conjugated polymers with pendant emitting groups. Small molecule OLED can become a polymer OLED if post polymerization occurred during the fabrication process.

There are various methods for OLED fabrication. Small molecule OLEDs are generally fabricated by vacuum thermal evaporation. Polymer OLEDs are fabricated by solution process such as spin-coating, inkjet printing, and slit printing. If the material can be dissolved or dispersed in a solvent, the small molecule OLED can also be produced by solution process.

The emitting color of an OLED can be achieved by emitter structural design. An OLED may comprise one emitting layer or a plurality of emitting layers to achieve desired spectrum. In the case of green, yellow, and red OLEDs, phosphorescent emitters have successfully reached commercialization. Blue phosphorescent emitters still suffer from non-saturated blue color, short device lifetime, and high operating voltage. Commercial full-color OLED displays normally adopt a hybrid strategy, using fluorescent blue and phosphorescent yellow, or red and green. At present, efficiency roll-off of phosphorescent OLEDs at high brightness remains a problem. In addition, it is desirable to have more saturated emitting color, higher efficiency, and longer device lifetime.

In an OLED device, a hole injection layer (HIL) facilitates hole injection from the ITO anode to the organic layers. To achieve a low device driving voltage, it is important to have a minimum charge injection barrier from the anode. Various HIL materials have been developed such as triarylamine compounds having a shallow HOMO energy levels, very electron deficient heterocycles, and triarylamine compounds doped with P-type conductive dopants. To improve OLED performance such as longer device lifetime, higher efficiency and/or lower voltage, it is crucial to develop HIL, HTL materials with better performance.

3 SUMMARY OF THE INVENTION

The present invention aims to solve at least part of above problems by using a charge transporting layer or a hole injection layer, which comprising a benzodithiophene or its analogous structure compound. In addition, a charge generation layer comprising a benzodithiophene or its analogous structure compound is provided, which can be used for the p type charge generation layer in tandem OLEDs structure and can provide better device performance, for example, to further improve the voltage, efficiency and/or lifetime of the OLEDs.

According to an embodiment of the present invention, a compound having Formula 1 is disclosed:

Formula 1

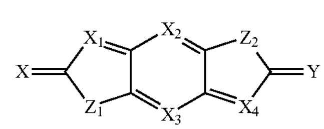

wherein $X_1$, $X_2$, $X_3$, and $X_4$ are each independently selected from the group consisting of CR, and N; when $X_1$, $X_2$, $X_3$, and $X_4$ are each independently selected from CR, each R may be same or different, and at least one of R comprises at least one electron withdrawing group;

$Z_1$ and $Z_2$ are each independently selected from the group consisting of O, S, Se, S═O, and $SO_2$;

X and Y are each independently selected from the group consisting of S, Se, NR', and CR"R'";

R, R', R", and R'" are each independently selected from the group consisting of hydrogen, deuterium, halogen, a substituted or unsubstituted alkyl group having 1 to 20 carbon atoms, a substituted or unsubstituted cycloalkyl group having 3 to 20 ring carbon atoms, a substituted or unsubstituted heteroalkyl group having 1 to 20 carbon atoms, a substituted or unsubstituted arylalkyl group having 7 to 30 carbon atoms, a substituted or unsubstituted alkoxy group having 1 to 20 carbon atoms, a substituted or unsubstituted aryloxy group having 6 to 30 carbon atoms, a substituted or unsubstituted alkenyl group having 2 to 20 carbon atoms, a substituted or unsubstituted aryl group having 6 to 30 carbon atoms, a substituted or unsubstituted heteroaryl group having 3 to 30 carbon atoms, a substituted or unsubstituted alkylsilyl group having 3 to 20 carbon atoms, a substituted or unsubstituted arylsilyl group having 6 to 20 carbon atoms, a substituted or unsubstituted amino group having 0 to 20 carbon atoms, an acyl group, a carbonyl group, a carboxylic acid group, an ester group, a nitrile group, an isonitrile group, a sulfanyl group, a sulfinyl group, a sulfonyl group, a phosphino group, and combinations thereof;

Any adjacent substitution can be optionally joined to form a ring or fused structure.

According to yet another embodiment, an organic light-emitting device is also disclosed, which comprises an anode, a cathode, and organic layer between the anode and the cathode, wherein the organic layer comprises a compound having Formula 1:

Formula 1

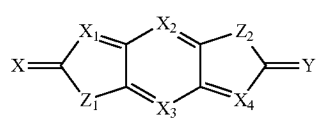

wherein $X_1$ to $X_4$ are each independently selected from the group consisting of CR, and N; when $X_1$, $X_2$, $X_3$, and $X_4$ are each independently selected from CR, each R may be same or different, and at least one of R comprises at least one electron withdrawing group;

$Z_1$ and $Z_2$ are each independently selected from the group consisting of O, S, Se, S═O, and $SO_2$;

X and Y are each independently selected from the group consisting of S, Se, NR', and CR"R'";

R, R', R", and R'" are each independently selected from the group consisting of hydrogen, deuterium, halogen, a substituted or unsubstituted alkyl group having 1 to 20 carbon atoms, a substituted or unsubstituted cycloalkyl group having 3 to 20 ring carbon atoms, a substituted or unsubstituted heteroalkyl group having 1 to 20 carbon atoms, a substituted or unsubstituted arylalkyl group having 7 to 30 carbon atoms, a substituted or unsubstituted alkoxy group having 1 to 20 carbon atoms, a substituted or unsubstituted aryloxy group having 6 to 30 carbon atoms, a substituted or unsubstituted alkenyl group having 2 to 20 carbon atoms, a substituted or unsubstituted aryl group having 6 to 30 carbon atoms, a substituted or unsubstituted heteroaryl group having 3 to 30 carbon atoms, a substituted or unsubstituted alkylsilyl group having 3 to 20 carbon atoms, a substituted or unsubstituted arylsilyl group having 6 to 20 carbon atoms, a substituted or unsubstituted amino group having 0 to 20 carbon atoms, an acyl group, a carbonyl group, a carboxylic acid group, an ester group, a nitrile group, an isonitrile group, a sulfanyl group, a sulfinyl group, a sulfonyl group, a phosphino group, and combinations thereof;

Any adjacent substitution can be optionally joined to form a ring or fused structure.

According to yet another embodiment, an organic light-emitting device is also disclosed, which comprises a plurality of stacks between an anode and a cathode, the stacks comprise a first light-emitting layer and a second light-emitting layer, wherein the first stack comprises a first light-emitting layer, the second stack comprises a second light-emitting layer, and a charge generation layer is disposed between the first stack and the second stack, wherein the charge generation layer comprises a p type charge generation layer and an n type charge generation layer, wherein the p type charge generation layer comprises a compound having Formula 1:

Formula 1

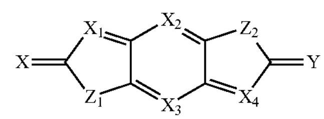

wherein $X_1$ to $X_4$ are each independently selected from the group consisting of CR, and N; when $X_1$, $X_2$, $X_3$, and $X_4$ are each independently selected from CR, each R may be same or different, and at least one of R comprises at least one electron withdrawing group;

$Z_1$ and $Z_2$ are each independently selected from the group consisting of O, S, Se, S═O, and $SO_2$;

X and Y are each independently selected from the group consisting of S, Se, NR', and CR"R'";

R, R', R", and R'" are each independently selected from the group consisting of hydrogen, deuterium, halogen, a substituted or unsubstituted alkyl group having 1 to 20 carbon atoms, a substituted or unsubstituted cycloalkyl group having 3 to 20 ring carbon atoms, a substituted or unsubstituted heteroalkyl group having 1 to 20 carbon atoms, a substituted or unsubstituted arylalkyl group having 7 to 30 carbon atoms, a substituted or unsubstituted alkoxy group having 1 to 20 carbon atoms, a substituted or unsubstituted aryloxy group having 6 to 30 carbon atoms, a substituted or unsubstituted alkenyl group having 2 to 20 carbon atoms, a substituted or unsubstituted aryl group having 6 to 30 carbon atoms, a substituted or unsubstituted heteroaryl group having 3 to 30 carbon atoms, a substituted or unsubstituted alkylsilyl group having 3 to 20 carbon atoms, a substituted or unsubstituted arylsilyl group having 6 to 20 carbon atoms, a substituted or unsubstituted amino group having 0 to 20 carbon atoms, an acyl group, a carbonyl group, a carboxylic acid group, an ester group, a nitrile group, an isonitrile group, a sulfanyl group, a sulfinyl group, a sulfonyl group, a phosphino group, and combinations thereof;

Any adjacent substitution can be optionally joined to form a ring or fused structure.

The novel compounds comprising a benzodithiophene or its analogous structure disclosed in the present invention can be used as charge transporting materials, hole injection materials, or the like in an organic electroluminescent device. Compared with existing materials, these novel compounds can offer excellent device performance.

4 BRIEF DESCRIPTION OF THE DRAWINGS

FIG. 1 schematically shows an organic light emitting device that can incorporate the compound disclosed herein.

Figure 2:
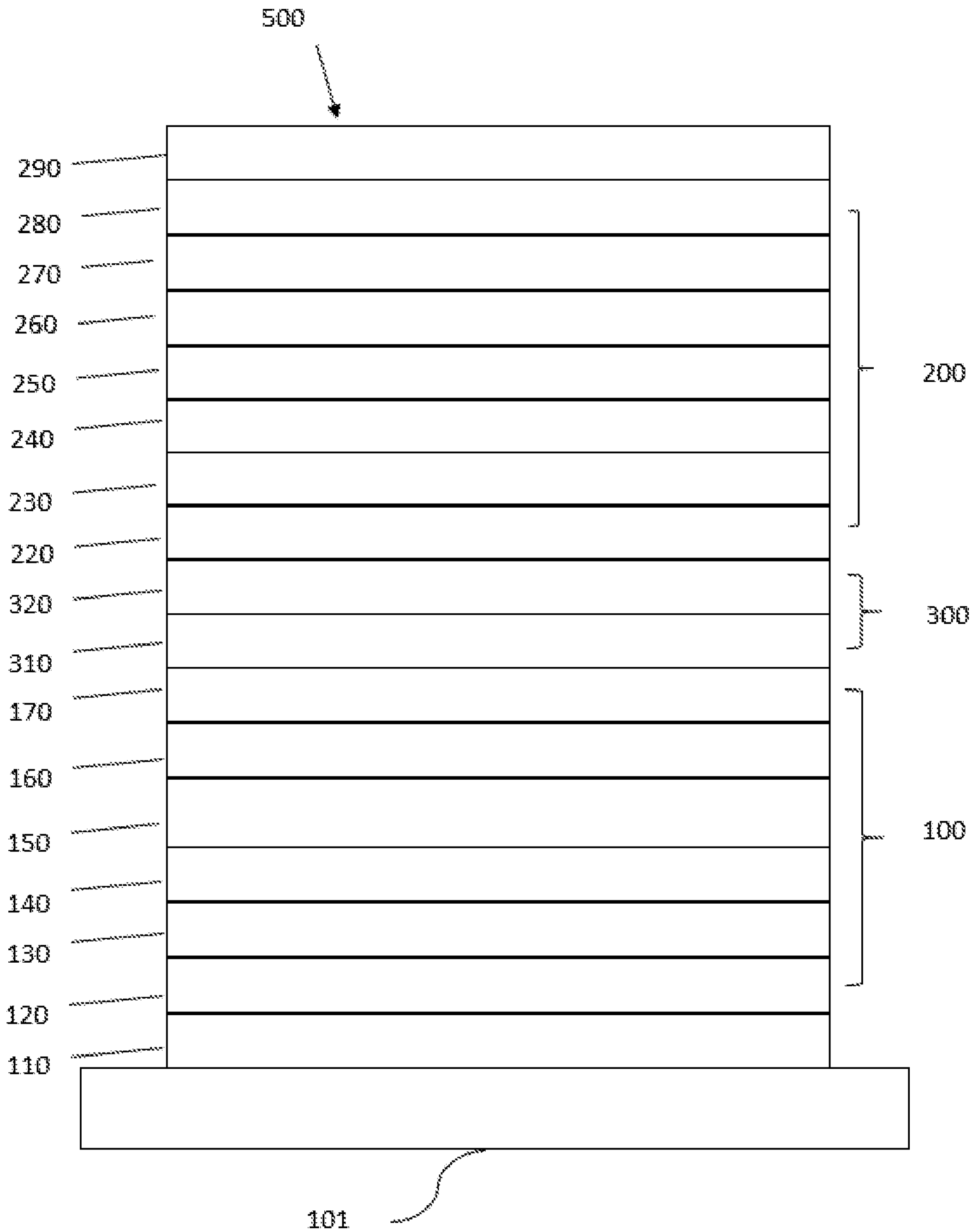

FIG. 2 schematically shows a tandem organic electroluminescent device that can incorporate the compound material disclosed herein.

Figure 3:
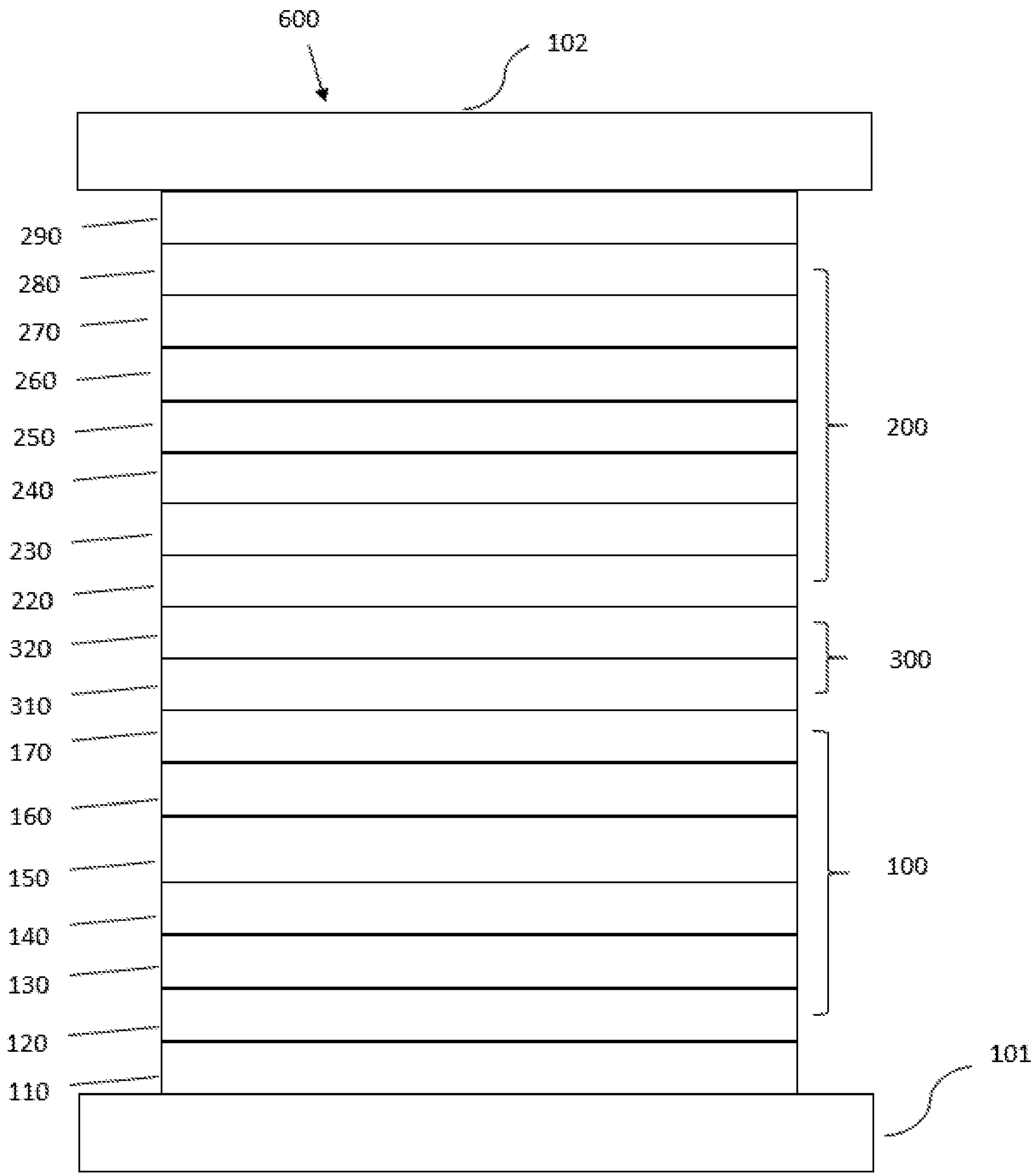

FIG. 3 schematically shows another tandem organic electroluminescent device that can incorporate the compound material disclosed herein.

Figure 4:
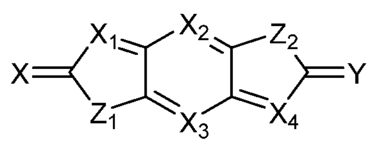

FIG. 4 shows the structural Formula 1 of compound disclosed herein.

5 DETAILED DESCRIPTION

OLEDs can be fabricated on various types of substrates such as glass, plastic, and metal foil. FIG. 1 schematically shows the organic light emitting device 100 without limitation. The figures are not necessarily drawn to scale. Some of the layer in the figure can also be omitted as needed. Device 100 may include a substrate 101, an anode 110, a hole injection layer 120, a hole transport layer 130, an electron blocking layer 140, an emissive layer 150, a hole blocking layer 160, an electron transport layer 170, an electron injection layer 180 and a cathode 190. Device 100 may be fabricated by depositing the layers described in order. The properties and functions of these various layers, as well as example materials, are described in more detail in U.S. Pat. No. 7,279,704 at cols. 6-10, which are incorporated by reference in its entirety.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with F4-TCNQ at a molar ratio of 50:1, as disclosed in U.S. Patent Application Publication No. 2003/0230980, which is incorporated by reference in its entirety. Examples of host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

The layered structure described above is provided by way of non-limiting example. Functional OLEDs may be achieved by combining the various layers described in different ways, or layers may be omitted entirely, such as an electron blocking layer. It may also include other layers not specifically described. Within each layer, a single material or a mixture of multiple materials can be used to achieve optimum performance. Any functional layer may include several sublayers. For example, the emissive layer may have a two layers of different emitting materials to achieve desired emission spectrum. Also for example, the hole transporting layer may comprise the first hole transporting layer and the second hole transporting layer.

In one embodiment, an OLED may be described as having an "organic layer" disposed between a cathode and an anode. This organic layer may comprise a single layer or multiple layers.

In one embodiment, two or more OLED units may be series connection to form a tandem OLED. FIG. 2 schematically shows the tandem organic light emitting device 500 without limitation. The device 500 may include a substrate 101, an anode 110, a first unit 100, a charge generation layer 300, a second unit 200, and a cathode 290. Wherein the first unit 100 includes a hole injection layer 120, a hole transporting layer 130, an electron blocking layer 140, an emissive layer 150, a hole blocking layer 160, an electron transporting layer 170, and the second unit 200 includes a hole injection layer 220, a hole transporting layer 230, an electron blocking layer 240, an emissive layer 250, a hole blocking layer 260, an electron transporting layer 270, and an electron injection layer 280. The charge generation layers 300 include an N type charge generation layer 310 and a P type charge generation layer 320. The device 500 may be manufactured by sequentially depositing the described layers.

An OLED can be encapsulated by a barrier layer. FIG. 3 schematically shows the organic light emitting device 600 without limitation. FIG. 3 differs from FIG. 2 in that the organic light emitting device include a barrier layer 102, which is above the cathode 290, to protect it from harmful species from the environment such as moisture and oxygen. Any material that can provide the barrier function can be used as the barrier layer such as glass and organic-inorganic hybrid layers. The barrier layer should be placed directly or indirectly outside of the OLED device. Multilayer thin film encapsulation was described in U.S. Pat. No. 7,968,146, which is herein incorporated by reference in its entirety.

Devices fabricated in accordance with embodiments of the invention can be incorporated into a wide variety of consumer products that have one or more of the electronic component modules (or units) incorporated therein. Some examples of such consumer products include flat panel displays, monitors, medical monitors, televisions, billboards, lights for interior or exterior illumination and/or signaling, heads-up displays, fully or partially transparent displays, flexible displays, smart phones, tablets, phablets, wearable devices, smart watches, laptop computers, digital cameras, camcorders, viewfinders, micro-displays, 3-D displays, vehicles displays, and vehicle tail lights.

The materials and structures described herein may be used in other organic electronic devices listed above.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processible" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

It is believed that the internal quantum efficiency (IQE) of fluorescent OLEDs can exceed the 25% spin statistics limit through delayed fluorescence. As used herein, there are two types of delayed fluorescence, i.e. P-type delayed fluorescence and E-type delayed fluorescence. P-type delayed fluorescence is generated from triplet-triplet annihilation (TTA).

On the other hand, E-type delayed fluorescence does not rely on the collision of two triplets, but rather on the transition between the triplet states and the singlet excited states. Compounds that are capable of generating E-type delayed fluorescence are required to have very small singlet-triplet gaps to convert between energy states. Thermal energy can activate the transition from the triplet state back to the singlet state. This type of delayed fluorescence is also known as thermally activated delayed fluorescence (TADF). A distinctive feature of TADF is that the delayed component increases as temperature rises. If the reverse intersystem crossing rate is fast enough to minimize the non-radiative decay from the triplet state, the fraction of back populated singlet excited states can potentially reach 75%. The total singlet fraction can be 100%, far exceeding 25% of the spin statistics limit for electrically generated excitons.

E-type delayed fluorescence characteristics can be found in an exciplex system or in a single compound. Without being bound by theory, it is believed that E-type delayed fluorescence requires the luminescent material to have a small singlet-triplet energy gap ($\Delta E_{S-T}$). Organic, non-metal containing, donor-acceptor luminescent materials may be able to achieve this. The emission in these materials is often characterized as a donor-acceptor charge-transfer (CT) type emission. The spatial separation of the HOMO and LUMO in these donor-acceptor type compounds often results in small $\Delta E_{S-T}$. These states may involve CT states. Often, donor-acceptor luminescent materials are constructed by connecting an electron donor moiety such as amino- or carbazole-derivatives and an electron acceptor moiety such as N-containing six-membered aromatic rings.

Definition of Terms of Substituents halogen or halide—as used herein includes fluorine, chlorine, bromine, and iodine.

Alkyl—contemplates both straight and branched chain alkyl groups. Examples of the alkyl group include methyl group, ethyl group, propyl group, isopropyl group, n-butyl group, s-butyl group, isobutyl group, t-butyl group, n-pentyl group, n-hexyl group, n-heptyl group, n-octyl group, n-nonyl group, n-decyl group, n-undecyl group, n-dodecyl group, n-tridecyl group, n-tetradecyl group, n-pentadecyl group, n-hexadecyl group, n-heptadecyl group, n-octadecyl group, neopentyl group, 1-methylpentyl group, 2-methylpentyl group, 1-pentylhexyl group, 1-butylpentyl group, 1-heptyloctyl group, 3-methylpentyl group. Additionally, the alkyl group may be optionally substituted. The carbons in the alkyl chain can be replaced by other hetero atoms. Of the above, preferred are methyl group, ethyl group, propyl group, isopropyl group, n-butyl group, s-butyl group, isobutyl group, t-butyl group, n-pentyl group, and neopentyl group.

Cycloalkyl—as used herein contemplates cyclic alkyl groups. Preferred cycloalkyl groups are those containing 4 to 10 ring carbon atoms and includes cyclobutyl, cyclopentyl, cyclohexyl, 4-methylcyclohexyl, 4,4-dimethylcyclohexyl, 1-adamantyl, 2-adamantyl, 1-norbornyl, 2-norbornyl and the like. Additionally, the cycloalkyl group may be optionally substituted. The carbons in the ring can be replaced by other hetero atoms.

Alkenyl—as used herein contemplates both straight and branched chain alkene groups. Preferred alkenyl groups are those containing two to fifteen carbon atoms. Examples of the alkenyl group include vinyl group, allyl group, 1-butenyl group, 2-butenyl group, 3-butenyl group, 1,3-butandienyl group, 1-methylvinyl group, styryl group, 2,2-diphenylvinyl group, 1,2-diphenylvinyl group, 1-methylallyl group, 1,1-dimethylallyl group, 2-methylallyl group, 1-phenylallyl group, 2-phenylallyl group, 3-phenylallyl group, 3,3-diphenylallyl group, 1,2-dimethylallyl group, 1-phenyl1-butenyl group, and 3-phenyl-1-butenyl group. Additionally, the alkenyl group may be optionally substituted.

Alkynyl—as used herein contemplates both straight and branched chain alkyne groups. Preferred alkynyl groups are those containing two to fifteen carbon atoms. Additionally, the alkynyl group may be optionally substituted.

Aryl or aromatic group—as used herein contemplates noncondensed and condensed systems. Preferred aryl groups are those containing six to sixty carbon atoms, preferably six to twenty carbon atoms, more preferably six to twelve carbon atoms. Examples of the aryl group include phenyl, biphenyl, terphenyl, triphenylene, tetraphenylene, naphthalene, anthracene, phenalene, phenanthrene, fluorene, pyrene, chrysene, perylene, and azulene, preferably phenyl, biphenyl, terphenyl, triphenylene, fluorene, and naphthalene. Additionally, the aryl group may be optionally substituted. Examples of the non-condensed aryl group include phenyl group, biphenyl-2-yl group, biphenyl-3-yl group, biphenyl-4-yl group, p-terphenyl-4-yl group, p-terphenyl-3-yl group, p-terphenyl-2-yl group, m-terphenyl-4-yl group, m-terphenyl-3-yl group, m-terphenyl-2-yl group, o-tolyl group, m-tolyl group, p-tolyl group, p-t-butylphenyl group, p-(2-phenylpropyl)phenyl group, 4'-methylbiphenylyl group, 4"-t-butyl p-terphenyl-4-yl group, o-cumenyl group, m-cumenyl group, p-cumenyl group, 2,3-xylyl group, 3,4-xylyl group, 2,5-xylyl group, mesityl group, and m-quarterphenyl group.

Heterocyclic group or heterocycle—as used herein contemplates aromatic and non-aromatic cyclic groups. Heteroaromatic also means heteroaryl. Preferred non-aromatic heterocyclic groups are those containing 3 to 7 ring atoms which includes at least one hetero atom such as nitrogen, oxygen, and sulfur. The heterocyclic group can also be an aromatic heterocyclic group having at least one heteroatom selected from nitrogen atom, oxygen atom, sulfur atom, and selenium atom.

Heteroaryl—as used herein contemplates noncondensed and condensed hetero-aromatic groups that may include from one to five heteroatoms. Preferred heteroaryl groups are those containing three to thirty carbon atoms, preferably three to twenty carbon atoms, more preferably three to twelve carbon atoms. Suitable heteroaryl groups include dibenzothiophene, dibenzofuran, dibenzoselenophene, furan, thiophene, benzofuran, benzothiophene, benzoselenophene, carbazole, indolocarbazole, pyridylindole, pyrrolodipyridine, pyrazole, imidazole, triazole, oxazole, thiazole, oxadiazole, oxatriazole, dioxazole, thiadiazole, pyridine, pyridazine, pyrimidine, pyrazine, triazine, oxazine, oxathiazine, oxadiazine, indole, benzimidazole, indazole, indoxazine, benzoxazole, benzisoxazole, benzothiazole, quinoline, isoquinoline, cinnoline, quinazoline, quinoxaline, naphthyridine, phthalazine, pteridine, xanthene, acridine, phenazine, phenothiazine, phenoxazine, benzofuropyridine, furodipyridine, benzothienopyridine, thienodipyridine, benzoselenophenopyridine, and selenophenodipyridine, preferably dibenzothiophene, dibenzofuran, dibenzoselenophene, carbazole, indolocarbazole, imidazole, pyridine, triazine, benzimidazole, 1,2-azaborine, 1,3-azaborine, 1,4-azaborine, borazine, and aza-analogs thereof. Additionally, the heteroaryl group may be optionally substituted.

Alkoxy—it is represented by —O-Alkyl. Examples and preferred examples thereof are the same as those described above. Examples of the alkoxy group having 1 to 20 carbon atoms, preferably 1 to 6 carbon atoms include methoxy group, ethoxy group, propoxy group, butoxy group, pentyloxy group, and hexyloxy group. The alkoxy group having 3 or more carbon atoms may be linear, cyclic or branched.

Aryloxy—it is represented by —O-Aryl or —O-heteroaryl. Examples and preferred examples thereof are the same as those described above. Examples of the aryloxy group having 6 to 40 carbon atoms include phenoxy group and biphenyloxy group.

Arylalkyl—as used herein contemplates an alkyl group that has an aryl substituent. Additionally, the arylalkyl group may be optionally substituted. Examples of the arylalkyl group include benzyl group, 1-phenylethyl group, 2-phenylethyl group, 1-phenylisopropyl group, 2-phenylisopropyl group, phenyl-t-butyl group, alpha.-naphthylmethyl group, 1-alpha.-naphthylethyl group, 2-alpha-naphthylethyl group, 1-alpha-naphthylisopropyl group, 2-alpha-naphthylisopropyl group, beta-naphthylmethyl group, 1-beta-naphthylethyl group, 2-beta-naphthylethyl group, 1-beta-naphthylisopropyl group, 2-beta-naphthylisopropyl group, p-methylbenzyl group, m-methylbenzyl group, o-methylbenzyl group, p-chlorobenzyl group, m-chlorobenzyl group, o-chlorobenzyl group, p-bromobenzyl group, m-bromobenzyl group, o-bromobenzyl group, p-iodobenzyl group, m-iodobenzyl group, o-iodobenzyl group, p-hydroxybenzyl group, m-hydroxybenzyl group, o-hydroxybenzyl group, p-aminobenzyl group, m-aminobenzyl group, o-aminobenzyl group, p-nitrobenzyl group, m-nitrobenzyl group, o-nitrobenzyl group, p-cyanobenzyl group, m-cyanobenzyl group, o-cyanobenzyl group, 1-hydroxy-2-phenylisopropyl group, and 1-chloro2-phenylisopropyl group. Of the above, preferred are benzyl group, p-cyanobenzyl group, m-cyanobenzyl group, o-cyanobenzyl group, 1-phenylethyl group, 2-phenylethyl group, 1-phenylisopropyl group, and 2-phenylisopropyl group.

The term "aza" in azadibenzofuran, aza-dibenzothiophene, etc. means that one or more of the C—H groups in the respective aromatic fragment are replaced by a nitrogen atom. For example, azatriphenylene encompasses dibenzo[f,h]quinoxaline,dibenzo[f,h]quinoline and other analogues with two or more nitrogens in the ring system. One of ordinary skill in the art can readily envision other nitrogen analogs of the aza-derivatives described above, and all such analogs are intended to be encompassed by the terms as set forth herein.

The alkyl, cycloalkyl, alkenyl, alkynyl, aralkyl, heterocyclic group, aryl, and heteroaryl may be unsubstituted or may be substituted with one or more substituents selected from the group consisting of deuterium, halogen, alkyl, cycloalkyl, arylalkyl, alkoxy, aryloxy, amino, cyclic amino, silyl, alkenyl, cycloalkenyl, heteroalkenyl, alkynyl, aryl, heteroaryl, an acyl group, a carbonyl group, a carboxylic acid group, an ether group, an ester group, a nitrile group, an isonitrile group, a sulfanyl group, a sulfinyl group, a sulfonyl group, a phosphino group, and combinations thereof.

It is to be understood that when a molecular fragment is described as being a substituent or otherwise attached to another moiety, its name may be written as if it were a fragment (e.g. phenyl, phenylene, naphthyl, dibenzofuryl) or as if it were the whole molecule (e.g. benzene, naphthalene, dibenzofuran). As used herein, these different ways of designating a substituent or attached fragment are considered to be equivalent.

In the compounds mentioned in this disclosure, the hydrogen atoms can be partially or fully replaced by deuterium. Other atoms such as carbon and nitrogen, can also be replaced by their other stable isotopes. The replacement by other stable isotopes in the compounds may be preferred due to its enhancements of device efficiency and stability.

In the compounds mentioned in this disclosure, multiple substitutions refer to a range that includes a double substitution, up to the maximum available substitutions.

In the compounds mentioned in this disclosure, the expression that adjacent substituents are optionally joined to form a ring is intended to be taken to mean that two radicals are linked to each other by a chemical bond. This is illustrated by the following scheme:

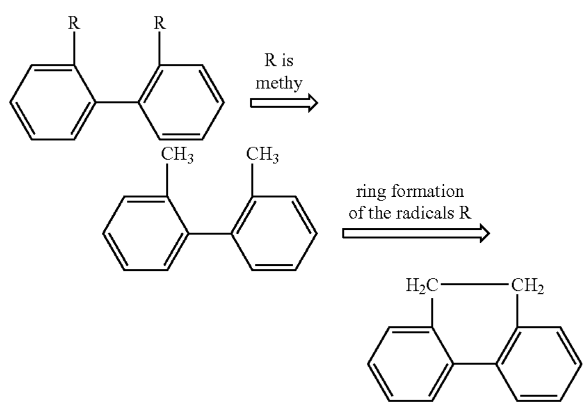

Furthermore, the expression that adjacent substituents are optionally joined to form a ring is also intended to be taken to mean that in the case where one of the two radicals represents hydrogen, the second radical is bonded at a position to which the hydrogen atom was bonded, with formation of a ring. This is illustrated by the following scheme:

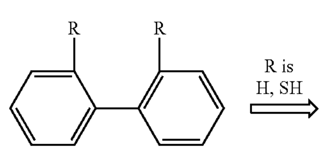

-continued

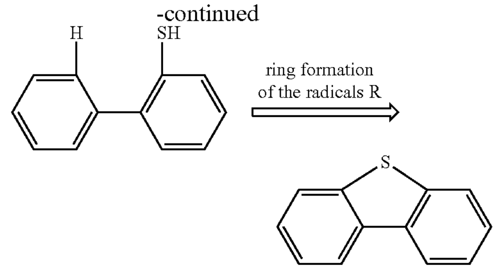

According to an embodiment of the present invention, a compound having Formula 1 is disclosed:

Formula 1

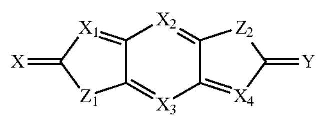

wherein $X_1$, $X_2$, $X_3$, and $X_4$ are each independently selected from the group consisting of CR, and N; when $X_1$, $X_2$, $X_3$, and $X_4$ are each independently selected from CR, each R may be same or different, and at least one of R comprises at least one electron withdrawing group;

$Z_1$ and $Z_2$ are each independently selected from the group consisting of O, S, Se, S═O, and $SO_2$;

X and Y are each independently selected from the group consisting of S, Se, NR', or CR"R'";

R, R', R", and R'" are each independently selected from the group consisting of hydrogen, deuterium, halogen, a substituted or unsubstituted alkyl group having 1 to 20 carbon atoms, a substituted or unsubstituted cycloalkyl group having 3 to 20 ring carbon atoms, a substituted or unsubstituted heteroalkyl group having 1 to 20 carbon atoms, a substituted or unsubstituted arylalkyl group having 7 to 30 carbon atoms, a substituted or unsubstituted alkoxy group having 1 to 20 carbon atoms, a substituted or unsubstituted aryloxy group having 6 to 30 carbon atoms, a substituted or unsubstituted alkenyl group having 2 to 20 carbon atoms, a substituted or unsubstituted aryl group having 6 to 30 carbon atoms, a substituted or unsubstituted heteroaryl group having 3 to 30 carbon atoms, a substituted or unsubstituted alkylsilyl group having 3 to 20 carbon atoms, a substituted or unsubstituted arylsilyl group having 6 to 20 carbon atoms, a substituted or unsubstituted amino group having 0 to 20 carbon atoms, an acyl group, a carbonyl group, a carboxylic acid group, an ester group, a nitrile group, an isonitrile group, a sulfanyl group, a sulfinyl group, a sulfonyl group, a phosphino group, and combinations thereof;

Any adjacent substitution can be optionally joined to form a ring or fused structure.

In one embodiment of the present invention, wherein $Z_1$ and $Z_2$ are S.

In one embodiment of the present invention, wherein $X_2$ and $X_3$ are N.

In one embodiment of the present invention, wherein $X_2$ and $X_3$ are each independently selected from CR, each R may be same or different, and at least one of R comprises at least one electron withdrawing group.

In one embodiment of the present invention, wherein $X_2$ and $X_3$ are each independently selected from CR, each R may be same or different, and each R comprises at least one electron withdrawing group.

In one embodiment of the present invention, wherein R are selected from the group consisting of fluorine, chlorine, trifluoromethyl, trifluoromethoxyl, pentafluoroethyl, pentafluoroethoxyl, cyano, nitro group, methyl sulfonyl, trifluoromethyl sulfonyl, trifluoromethylthio, pentafluorosulfanyl, pyridyl, 3-fluorophenyl, 4-fluorophenyl, 3-cyanophenyl, 4-cyanophenyl, 4-trifluoromethylphenyl, 3-trifluoromethoxylphenyl, 4-trifluoromethoxylphenyl, 4-pentafluoroethylphenyl, 4-pentafluoroethoxylphenyl, 4-nitrophenyl, 4-methyl sulfonyl phenyl, 4-trifluoromethyl sulfonyl phenyl, 3-trifluoromethylsulfanylphenyl, 4-trifluoromethylsulfanylphenyl, 4-pentafluorosulfanylphenyl, pyrimidyl, 2,6-dimethyl-1,3,5-triazine, and combinations thereof.

In one embodiment of the present invention, wherein X and Y are each independently CR"R'".

In one embodiment of the present invention, wherein R', R", and R'" are each independently selected from the group consisting of trifluoromethyl, cyano, pentafluorophenyl, 4-cyano-2,3,5,6-tetrafluorophenyl, and pyridyl.

In one embodiment of the present invention, wherein the compound has the formula:

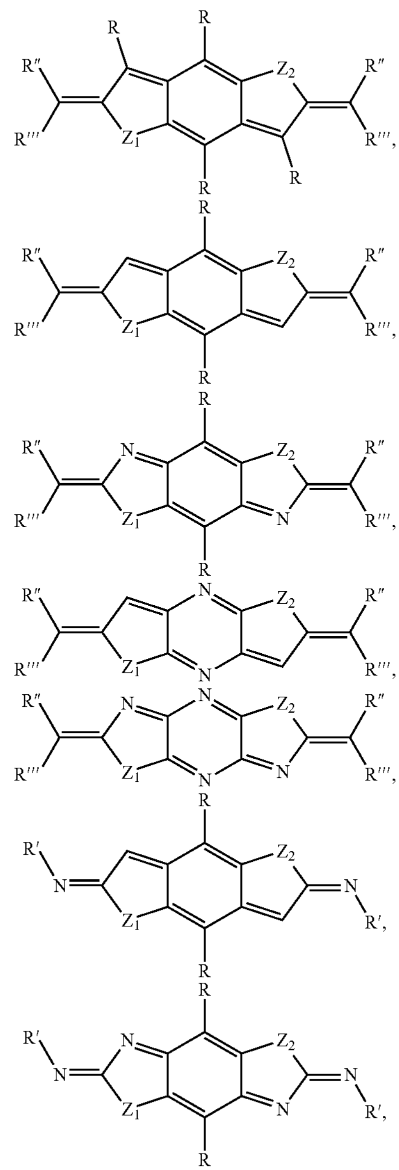

-continued

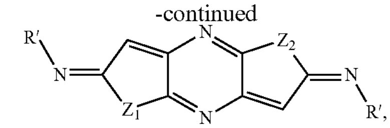

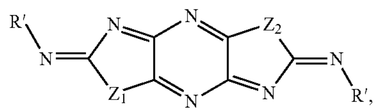

or

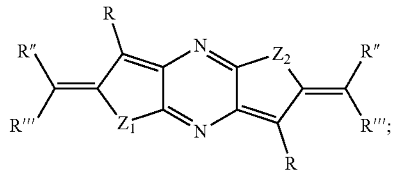

In each formula above, each R can be same or different, at least one of R in each formula comprises at least one electron withdrawing group;

$Z_1$ and $Z_2$ are each independently selected from the group consisting of O, S, Se, S═O, and $SO_2$;

R, R', R", and R'" are each independently selected from the group consisting of hydrogen, deuterium, halogen, a substituted or unsubstituted alkyl group having 1 to 20 carbon atoms, a substituted or unsubstituted cycloalkyl group having 3 to 20 ring carbon atoms, a substituted or unsubstituted heteroalkyl group having 1 to 20 carbon atoms, a substituted or unsubstituted arylalkyl group having 7 to 30 carbon atoms, a substituted or unsubstituted alkoxy group having 1 to 20 carbon atoms, a substituted or unsubstituted aryloxy group having 6 to 30 carbon atoms, a substituted or unsubstituted alkenyl group having 2 to 20 carbon atoms, a substituted or unsubstituted aryl group having 6 to 30 carbon atoms, a substituted or unsubstituted heteroaryl group having 3 to 30 carbon atoms, a substituted or unsubstituted alkylsilyl group having 3 to 20 carbon atoms, a substituted or unsubstituted arylsilyl group having 6 to 20 carbon atoms, a substituted or unsubstituted amino group having 0 to 20 carbon atoms, an acyl group, a carbonyl group, a carboxylic acid group, an ester group, a nitrile group, an isonitrile group, a sulfanyl group, a sulfinyl group, a sulfonyl group, a phosphino group, and combinations thereof;

Any adjacent substitution can be optionally joined to form a ring or fused structure.

In one embodiment of the present invention, wherein the compound is selected from the group consisting of:

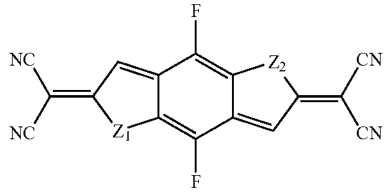

$Z_1 = Z_2 =$ O Compound O-1
$Z_1 = Z_2 =$ S Compound S-1
$Z_1 = Z_2 =$ Se Compound Se-1

-continued

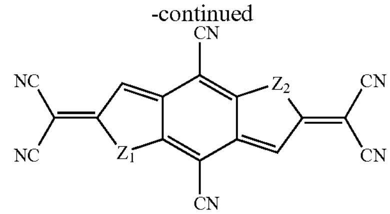

$Z_1 = Z_2 =$ O Compound O-2
$Z_1 = Z_2 =$ S Compound S-2
$Z_1 = Z_2 =$ Se Compound Se-2

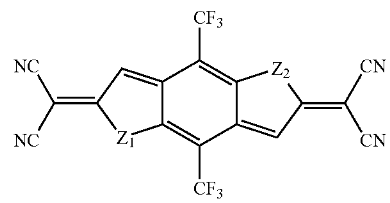

$Z_1 = Z_2 =$ O Compound O-3
$Z_1 = Z_2 =$ S Compound S-3
$Z_1 = Z_2 =$ Se Compound Se-3

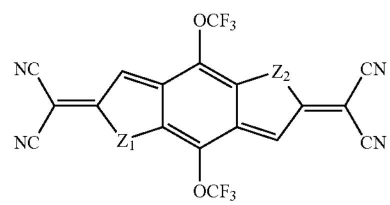

$Z_1 = Z_2 =$ O Compound O-4
$Z_1 = Z_2 =$ S Compound S-4
$Z_1 = Z_2 =$ Se Compound Se-4

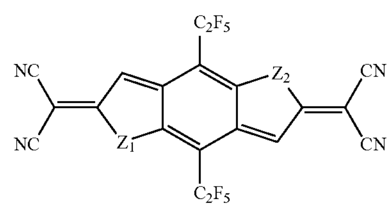

$Z_1 = Z_2 =$ O Compound O-5
$Z_1 = Z_2 =$ S Compound S-5
$Z_1 = Z_2 =$ Se Compound Se-5

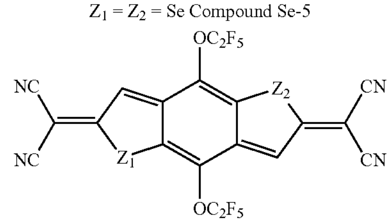

$Z_1 = Z_2 =$ O Compound O-6
$Z_1 = Z_2 =$ S Compound S-6
$Z_1 = Z_2 =$ Se Compound Se-6

-continued

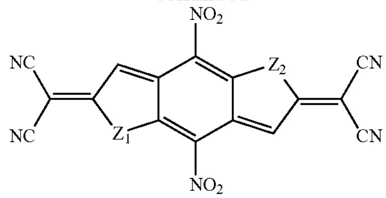

$Z_1 = Z_2 = O$ Compound O-7
$Z_1 = Z_2 = S$ Compound S-7
$Z_1 = Z_2 = Se$ Compound Se-7

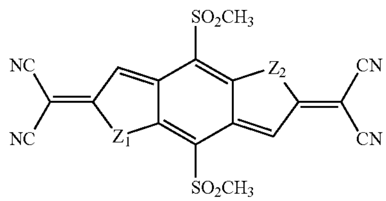

$Z_1 = Z_2 = O$ Compound O-8
$Z_1 = Z_2 = S$ Compound S-8
$Z_1 = Z_2 = Se$ Compound Se-8

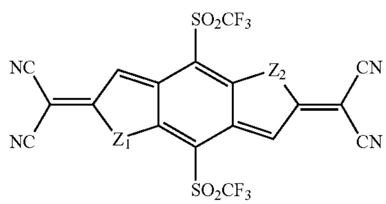

$Z_1 = Z_2 = O$ Compound O-9
$Z_1 = Z_2 = S$ Compound S-9
$Z_1 = Z_2 = Se$ Compound Se-9

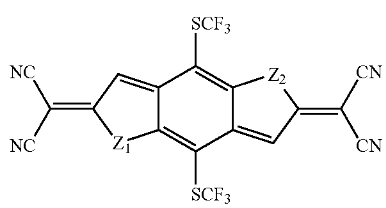

$Z_1 = Z_2 = O$ Compound O-10
$Z_1 = Z_2 = S$ Compound S-10
$Z_1 = Z_2 = Se$ Compound Se-10

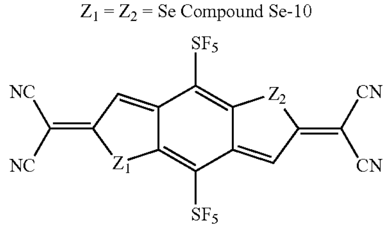

$Z_1 = Z_2 = O$ Compound O-11
$Z_1 = Z_2 = S$ Compound S-11
$Z_1 = Z_2 = Se$ Compound Se-11

-continued

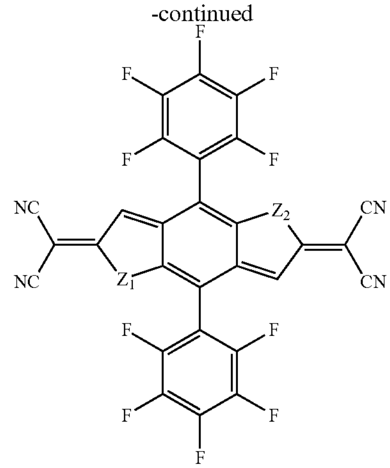

$Z_1 = Z_2 = O$ Compound O-12
$Z_1 = Z_2 = S$ Compound S-12
$Z_1 = Z_2 = Se$ Compound Se-12

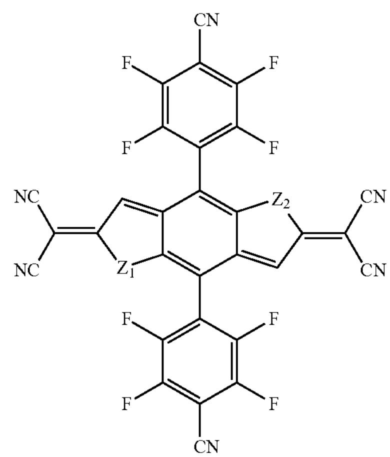

$Z_1 = Z_2 = O$ Compound O-13
$Z_1 = Z_2 = S$ Compound S-13
$Z_1 = Z_2 = Se$ Compound Se-13

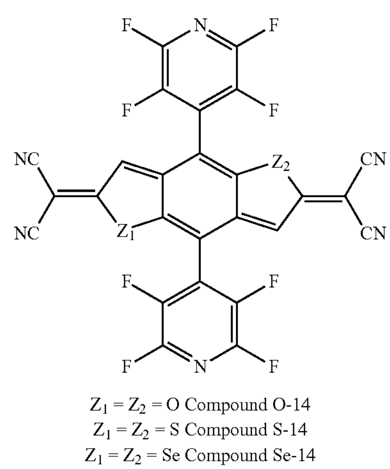

$Z_1 = Z_2 = O$ Compound O-14
$Z_1 = Z_2 = S$ Compound S-14
$Z_1 = Z_2 = Se$ Compound Se-14

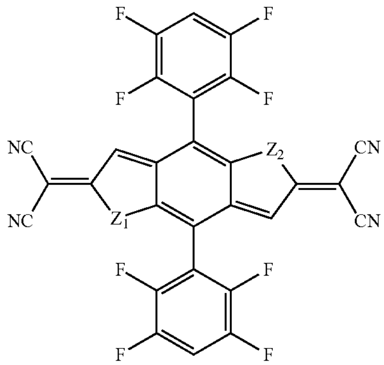

$Z_1 = Z_2 =$ O Compound O-15
$Z_1 = Z_2 =$ S Compound S-15
$Z_1 = Z_2 =$ Se Compound Se-15

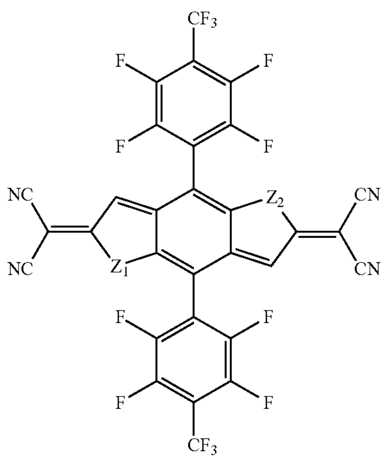

$Z_1 = Z_2 =$ O Compound O-16
$Z_1 = Z_2 =$ S Compound S-16
$Z_1 = Z_2 =$ Se Compound Se-16

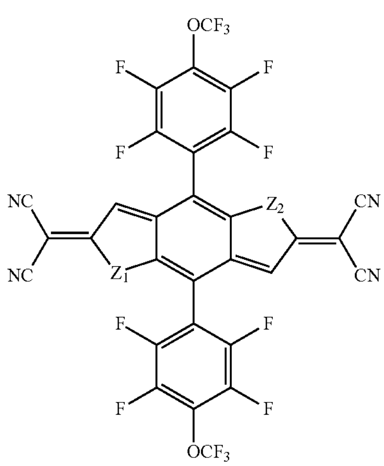

$Z_1 = Z_2 =$ O Compound O-17
$Z_1 = Z_2 =$ S Compound S-17
$Z_1 = Z_2 =$ Se Compound Se-17

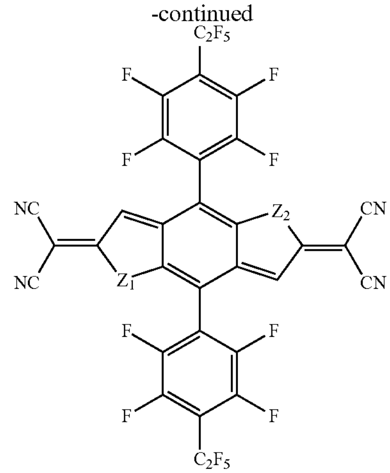

$Z_1 = Z_2 =$ O Compound O-18
$Z_1 = Z_2 =$ S Compound S-18
$Z_1 = Z_2 =$ Se Compound Se-18

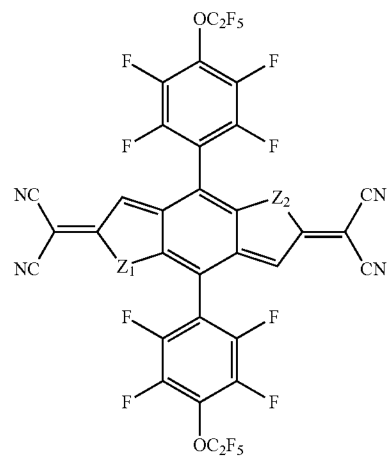

$Z_1 = Z_2 =$ O Compound O-19
$Z_1 = Z_2 =$ S Compound S-19
$Z_1 = Z_2 =$ Se Compound Se-19

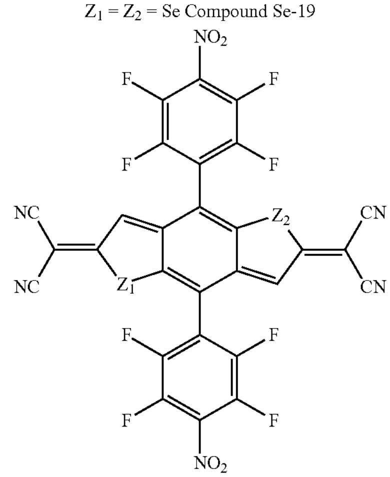

$Z_1 = Z_2 =$ O Compound O-20
$Z_1 = Z_2 =$ S Compound S-20
$Z_1 = Z_2 =$ Se Compound Se-20

-continued

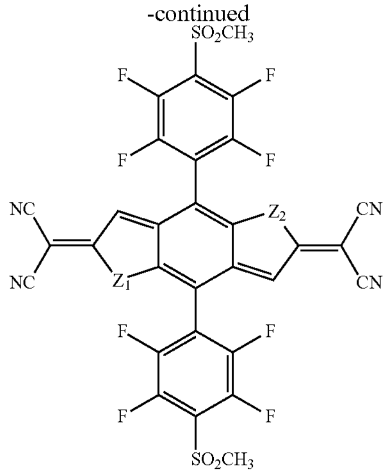

$Z_1 = Z_2 = O$ Compound O-21
$Z_1 = Z_2 = S$ Compound S-21
$Z_1 = Z_2 = Se$ Compound Se-21

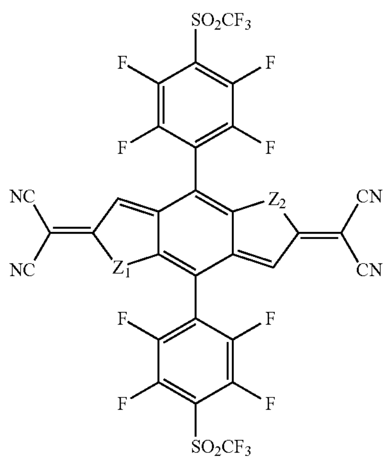

$Z_1 = Z_2 = O$ Compound O-22
$Z_1 = Z_2 = S$ Compound S-22
$Z_1 = Z_2 = Se$ Compound Se-22

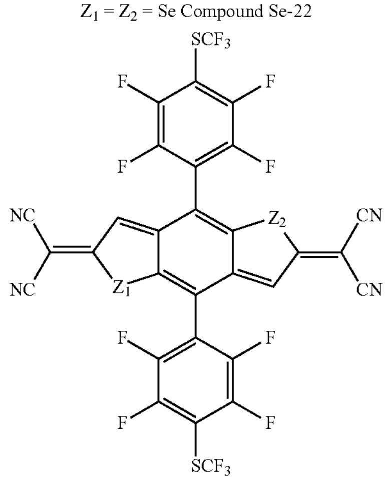

$Z_1 = Z_2 = O$ Compound O-23
$Z_1 = Z_2 = S$ Compound S-23
$Z_1 = Z_2 = Se$ Compound Se-23

-continued

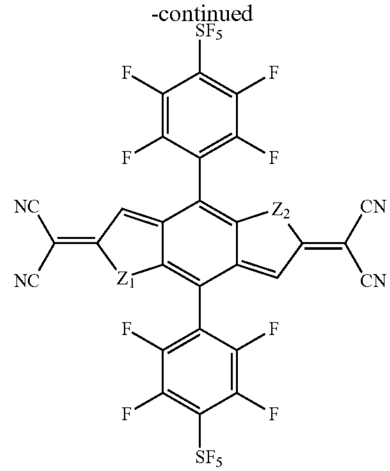

$Z_1 = Z_2 = O$ Compound O-24
$Z_1 = Z_2 = S$ Compound S-24
$Z_1 = Z_2 = Se$ Compound Se-24

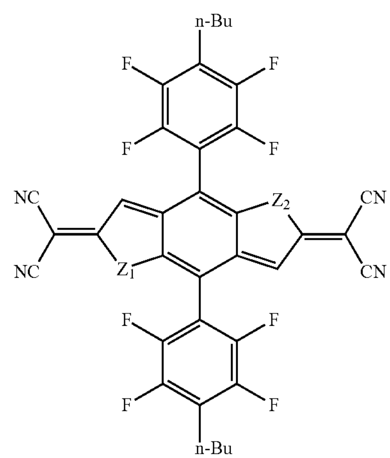

$Z_1 = Z_2 = O$ Compound O-25
$Z_1 = Z_2 = S$ Compound S-25
$Z_1 = Z_2 = Se$ Compound Se-25

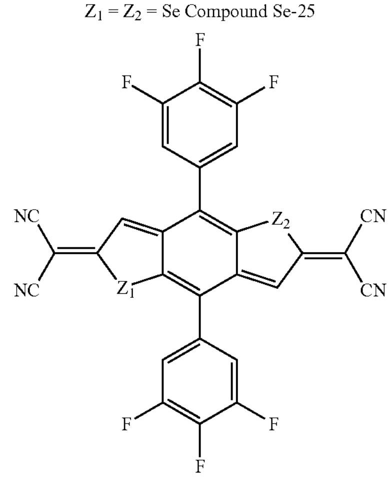

$Z_1 = Z_2 = O$ Compound O-26
$Z_1 = Z_2 = S$ Compound S-26
$Z_1 = Z_2 = Se$ Compound Se-26

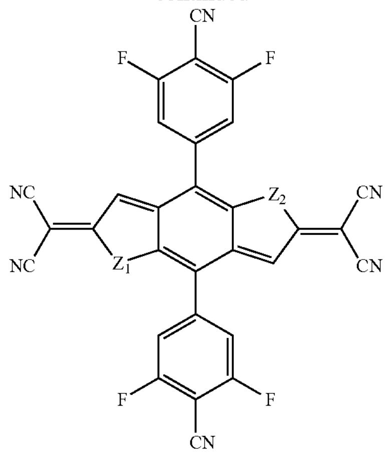

$Z_1 = Z_2$ = O Compound O-27
$Z_1 = Z_2$ = S Compound S-27
$Z_1 = Z_2$ = Se Compound Se-27

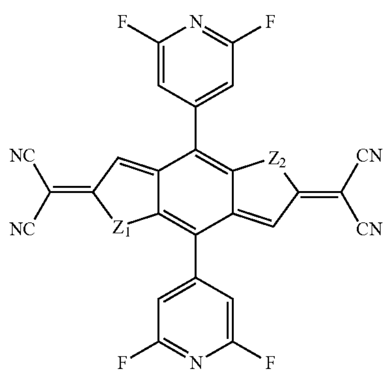

$Z_1 = Z_2$ = O Compound O-28
$Z_1 = Z_2$ = S Compound S-28
$Z_1 = Z_2$ = Se Compound Se-28

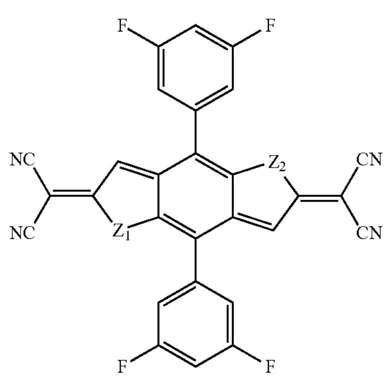

$Z_1 = Z_2$ = O Compound O-29
$Z_1 = Z_2$ = S Compound S-29
$Z_1 = Z_2$ = Se Compound Se-29

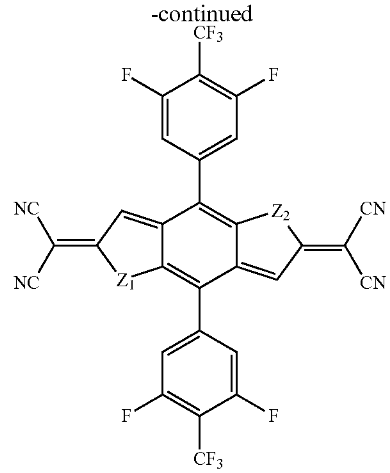

$Z_1 = Z_2$ = O Compound O-30
$Z_1 = Z_2$ = S Compound S-30
$Z_1 = Z_2$ = Se Compound Se-30

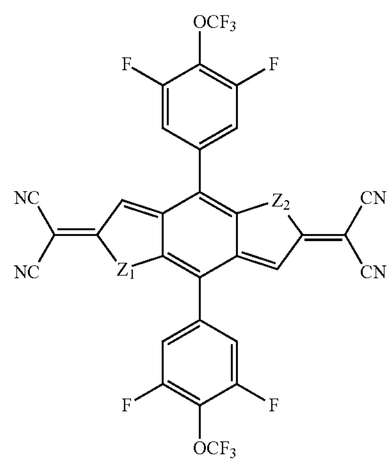

$Z_1 = Z_2$ = O Compound O-31
$Z_1 = Z_2$ = S Compound S-31
$Z_1 = Z_2$ = Se Compound Se-31

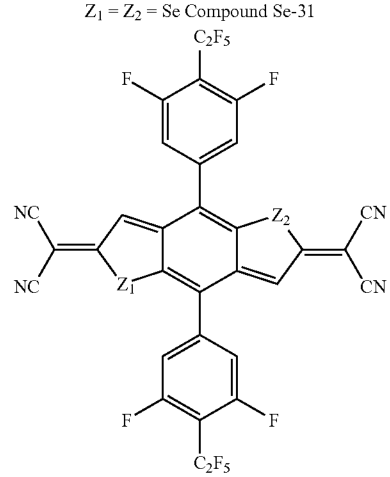

$Z_1 = Z_2$ = O Compound O-32
$Z_1 = Z_2$ = S Compound S-32
$Z_1 = Z_2$ = Se Compound Se-32

-continued

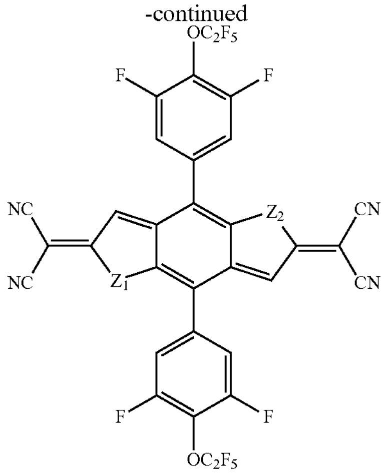

$Z_1 = Z_2 =$ O Compound O-33
$Z_1 = Z_2 =$ S Compound S-33
$Z_1 = Z_2 =$ Se Compound Se-33

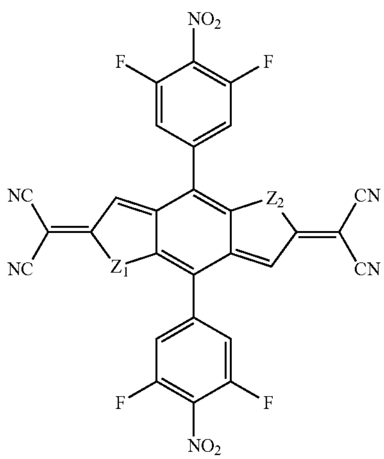

$Z_1 = Z_2 =$ O Compound O-34
$Z_1 = Z_2 =$ S Compound S-34
$Z_1 = Z_2 =$ Se Compound Se-34

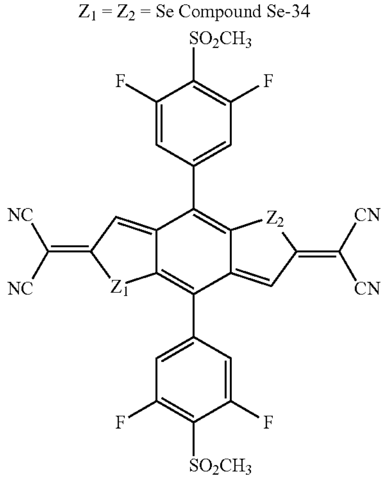

$Z_1 = Z_2 =$ O Compound O-35
$Z_1 = Z_2 =$ S Compound S-35
$Z_1 = Z_2 =$ Se Compound Se-35

-continued

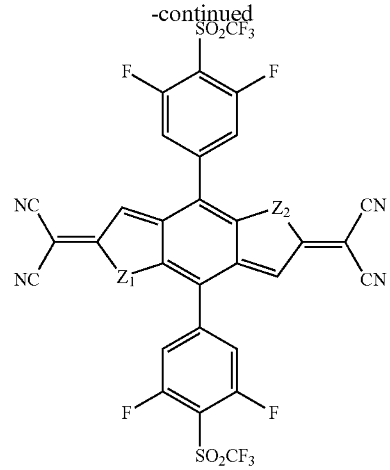

$Z_1 = Z_2 =$ O Compound O-36
$Z_1 = Z_2 =$ S Compound S-36
$Z_1 = Z_2 =$ Se Compound Se-36

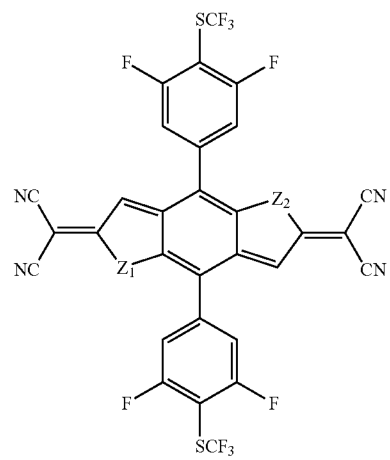

$Z_1 = Z_2 =$ O Compound O-37
$Z_1 = Z_2 =$ S Compound S-37
$Z_1 = Z_2 =$ Se Compound Se-37

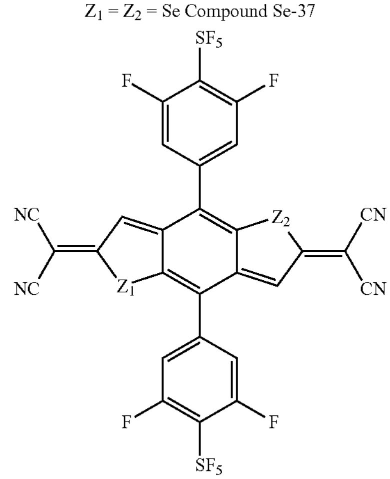

$Z_1 = Z_2 =$ O Compound O-38
$Z_1 = Z_2 =$ S Compound S-38
$Z_1 = Z_2 =$ Se Compound Se-38

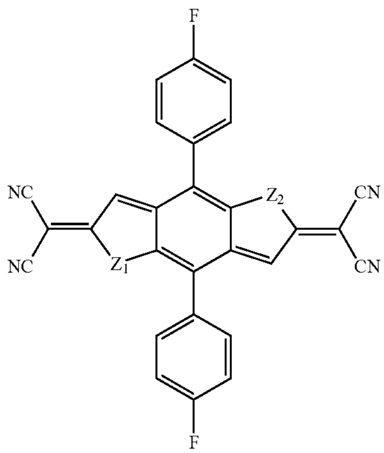

$Z_1 = Z_2 = O$ Compound O-39
$Z_1 = Z_2 = S$ Compound S-39
$Z_1 = Z_2 = Se$ Compound Se-39

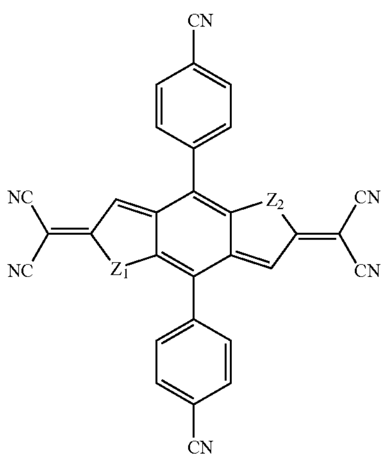

$Z_1 = Z_2 = O$ Compound O-40
$Z_1 = Z_2 = S$ Compound S-40
$Z_1 = Z_2 = Se$ Compound Se-40

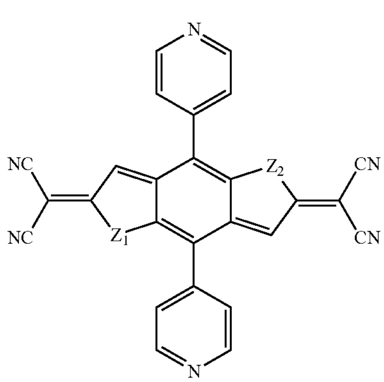

$Z_1 = Z_2 = O$ Compound O-41
$Z_1 = Z_2 = S$ Compound S-41
$Z_1 = Z_2 = Se$ Compound Se-41

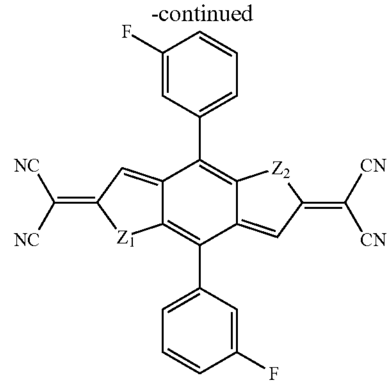

$Z_1 = Z_2 = O$ Compound O-42
$Z_1 = Z_2 = S$ Compound S-42
$Z_1 = Z_2 = Se$ Compound Se-42

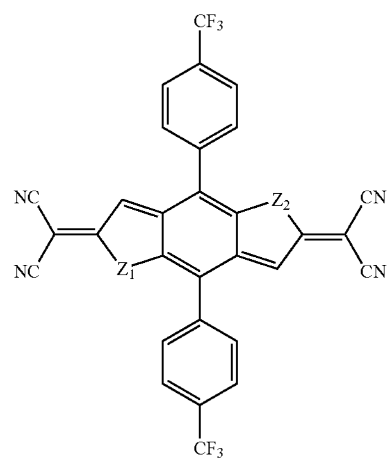

$Z_1 = Z_2 = O$ Compound O-43
$Z_1 = Z_2 = S$ Compound S-43
$Z_1 = Z_2 = Se$ Compound Se-43

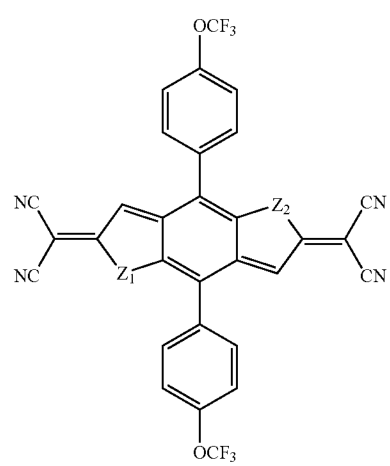

$Z_1 = Z_2 = O$ Compound O-44
$Z_1 = Z_2 = S$ Compound S-44
$Z_1 = Z_2 = Se$ Compound Se-44

-continued

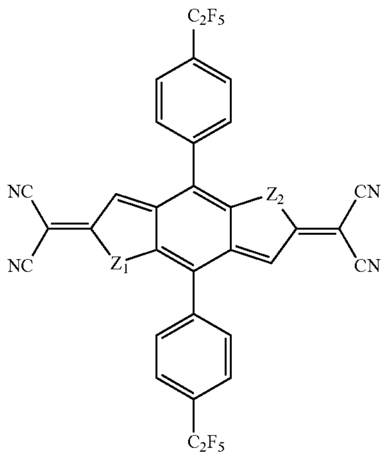

$Z_1 = Z_2 =$ O Compound O-45
$Z_1 = Z_2 =$ S Compound S-45
$Z_1 = Z_2 =$ Se Compound Se-45

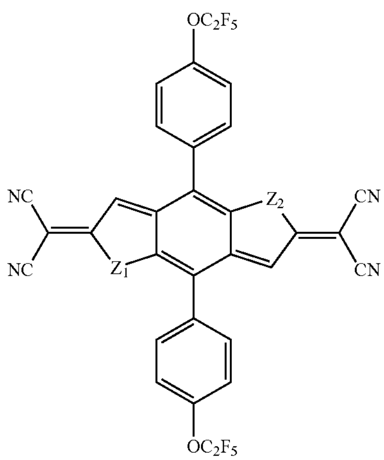

$Z_1 = Z_2 =$ O Compound O-46
$Z_1 = Z_2 =$ S Compound S-46
$Z_1 = Z_2 =$ Se Compound Se-46

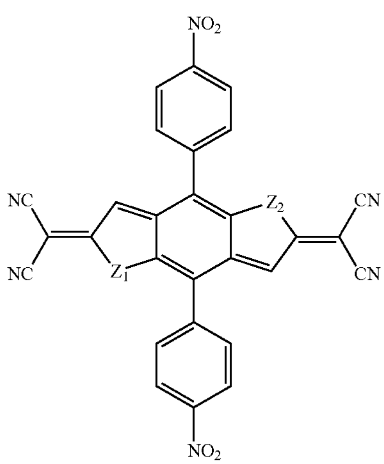

$Z_1 = Z_2 =$ O Compound O-47
$Z_1 = Z_2 =$ S Compound S-47
$Z_1 = Z_2 =$ Se Compound Se-47

-continued

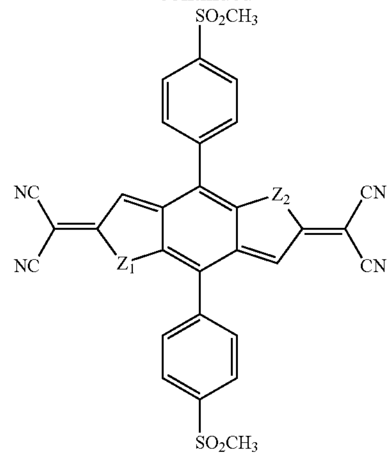

$Z_1 = Z_2 =$ O Compound O-48
$Z_1 = Z_2 =$ S Compound S-48
$Z_1 = Z_2 =$ Se Compound Se-48

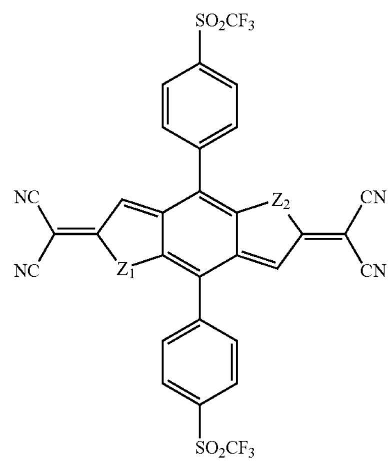

$Z_1 = Z_2 =$ O Compound O-49
$Z_1 = Z_2 =$ S Compound S-49
$Z_1 = Z_2 =$ Se Compound Se-49

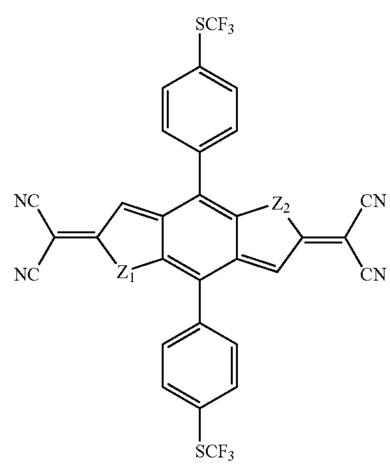

$Z_1 = Z_2 =$ O Compound O-50
$Z_1 = Z_2 =$ S Compound S-50
$Z_1 = Z_2 =$ Se Compound Se-50

-continued

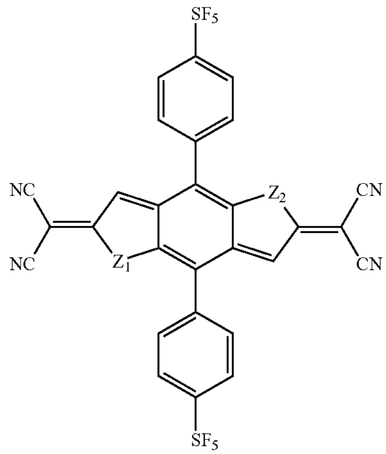

$Z_1 = Z_2 = O$ Compound O-51
$Z_1 = Z_2 = S$ Compound S-51
$Z_1 = Z_2 = Se$ Compound Se-51

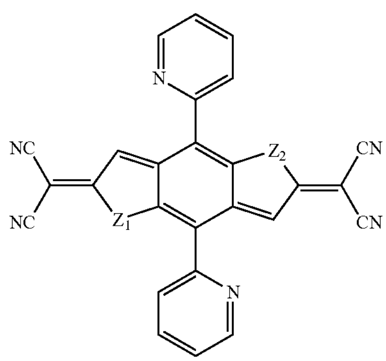

$Z_1 = Z_2 = O$ Compound O-52
$Z_1 = Z_2 = S$ Compound S-52
$Z_1 = Z_2 = Se$ Compound Se-52

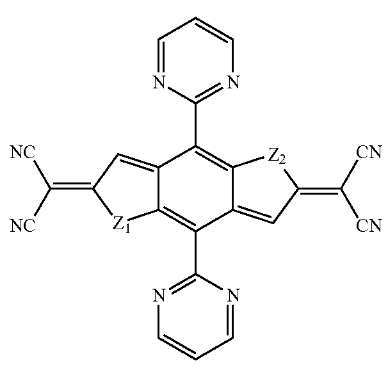

$Z_1 = Z_2 = O$ Compound O-53
$Z_1 = Z_2 = S$ Compound S-53
$Z_1 = Z_2 = Se$ Compound Se-53

-continued

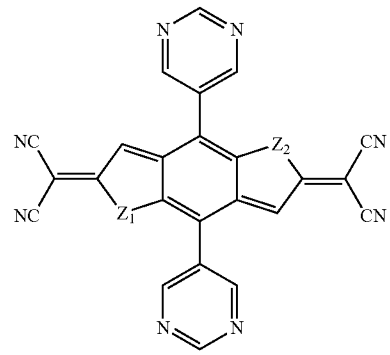

$Z_1 = Z_2 = O$ Compound O-54
$Z_1 = Z_2 = S$ Compound S-54
$Z_1 = Z_2 = Se$ Compound Se-54

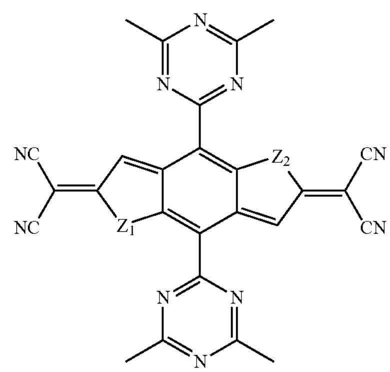

$Z_1 = Z_2 = O$ Compound O-55
$Z_1 = Z_2 = S$ Compound S-55
$Z_1 = Z_2 = Se$ Compound Se-55

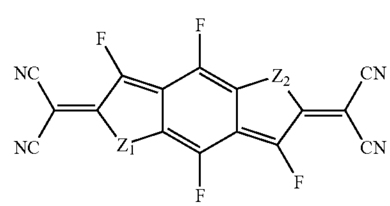

$Z_1 = Z_2 = O$ Compound O-56
$Z_1 = Z_2 = S$ Compound S-56
$Z_1 = Z_2 = Se$ Compound Se-56

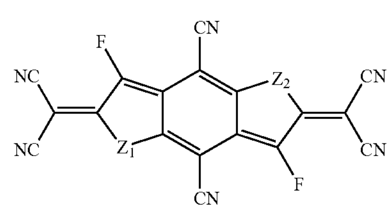

$Z_1 = Z_2 = O$ Compound O-57
$Z_1 = Z_2 = S$ Compound S-57
$Z_1 = Z_2 = Se$ Compound Se-57

-continued

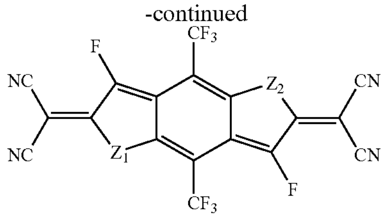

$Z_1 = Z_2 = O$ Compound O-58
$Z_1 = Z_2 = S$ Compound S-58
$Z_1 = Z_2 = Se$ Compound Se-58

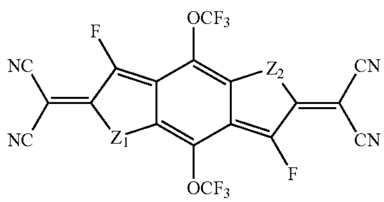

$Z_1 = Z_2 = O$ Compound O-59
$Z_1 = Z_2 = S$ Compound S-59
$Z_1 = Z_2 = Se$ Compound Se-59

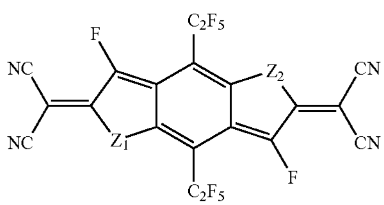

$Z_1 = Z_2 = O$ Compound O-60
$Z_1 = Z_2 = S$ Compound S-60
$Z_1 = Z_2 = Se$ Compound Se-60

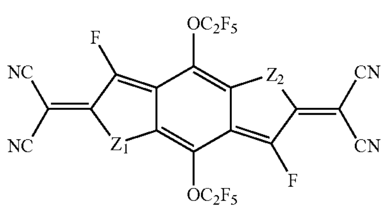

$Z_1 = Z_2 = O$ Compound O-61
$Z_1 = Z_2 = S$ Compound S-61
$Z_1 = Z_2 = Se$ Compound Se-61

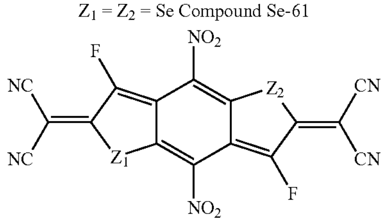

$Z_1 = Z_2 = O$ Compound O-62
$Z_1 = Z_2 = S$ Compound S-62
$Z_1 = Z_2 = Se$ Compound Se-62

-continued

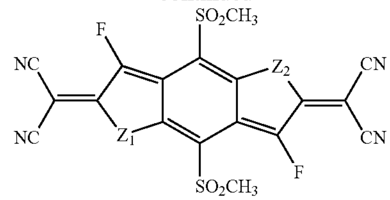

$Z_1 = Z_2 = O$ Compound O-63
$Z_1 = Z_2 = S$ Compound S-63
$Z_1 = Z_2 = Se$ Compound Se-63

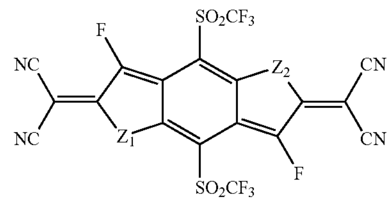

$Z_1 = Z_2 = O$ Compound O-64
$Z_1 = Z_2 = S$ Compound S-64
$Z_1 = Z_2 = Se$ Compound Se-64

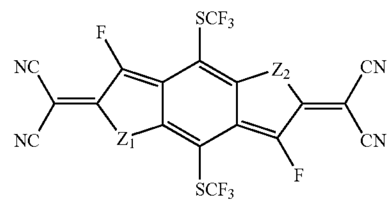

$Z_1 = Z_2 = O$ Compound O-65
$Z_1 = Z_2 = S$ Compound S-65
$Z_1 = Z_2 = Se$ Compound Se-65

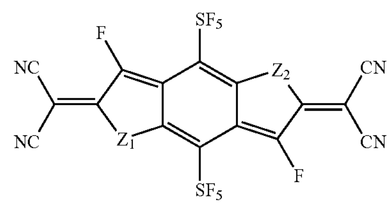

$Z_1 = Z_2 = O$ Compound O-66
$Z_1 = Z_2 = S$ Compound S-66
$Z_1 = Z_2 = Se$ Compound Se-66

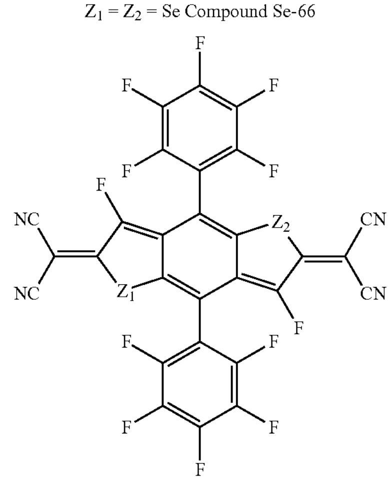

$Z_1 = Z_2 = O$ Compound O-67
$Z_1 = Z_2 = S$ Compound S-67
$Z_1 = Z_2 = Se$ Compound Se-67

-continued

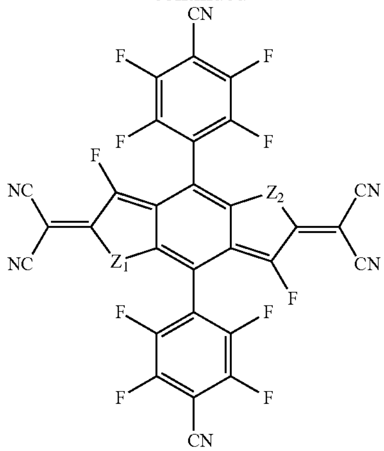

$Z_1 = Z_2 = O$ Compound O-68
$Z_1 = Z_2 = S$ Compound S-68
$Z_1 = Z_2 = Se$ Compound Se-68

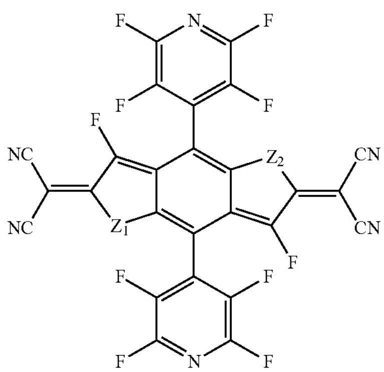

$Z_1 = Z_2 = O$ Compound O-69
$Z_1 = Z_2 = S$ Compound S-69
$Z_1 = Z_2 = Se$ Compound Se-69

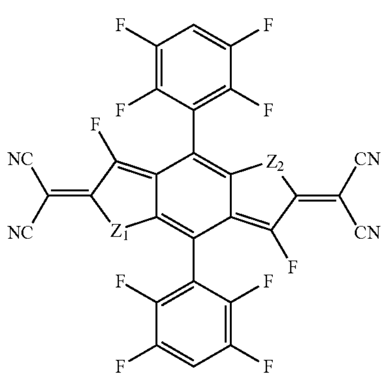

$Z_1 = Z_2 = O$ Compound O-70
$Z_1 = Z_2 = S$ Compound S-70
$Z_1 = Z_2 = Se$ Compound Se-70

-continued

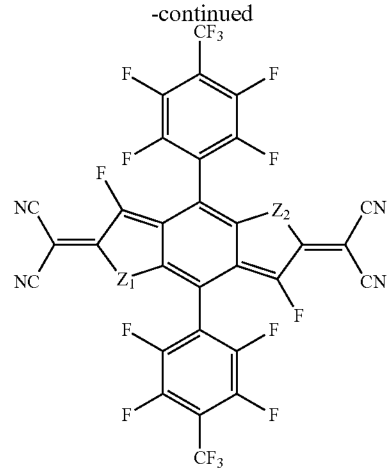

$Z_1 = Z_2 = O$ Compound O-71
$Z_1 = Z_2 = S$ Compound S-71
$Z_1 = Z_2 = Se$ Compound Se-71

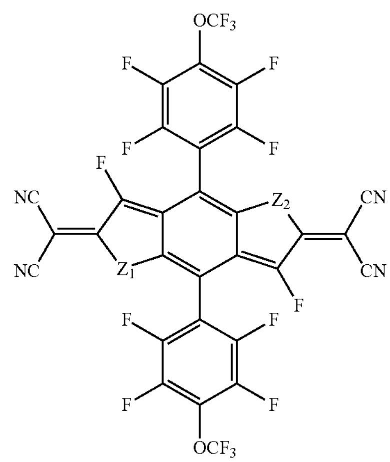

$Z_1 = Z_2 = O$ Compound O-72
$Z_1 = Z_2 = S$ Compound S-72
$Z_1 = Z_2 = Se$ Compound Se-72

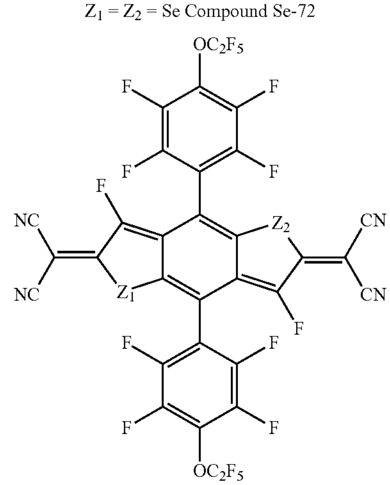

$Z_1 = Z_2 = O$ Compound O-73
$Z_1 = Z_2 = S$ Compound S-73
$Z_1 = Z_2 = Se$ Compound Se-73

-continued

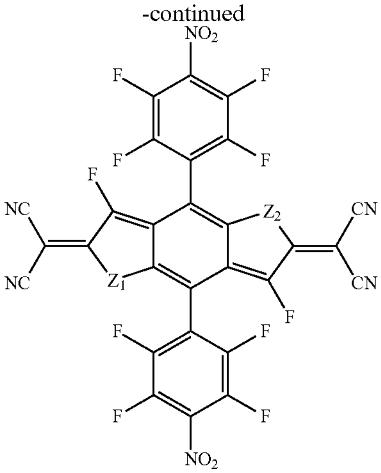

$Z_1 = Z_2 =$ O Compound O-74
$Z_1 = Z_2 =$ S Compound S-74
$Z_1 = Z_2 =$ Se Compound Se-74

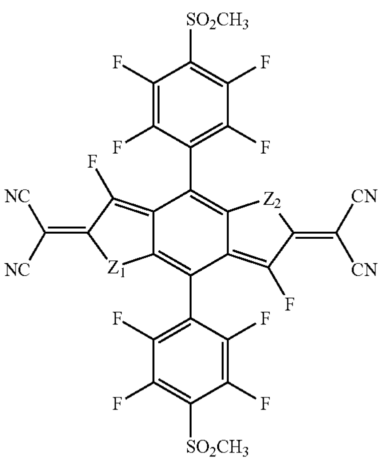

$Z_1 = Z_2 =$ O Compound O-75
$Z_1 = Z_2 =$ S Compound S-75
$Z_1 = Z_2 =$ Se Compound Se-75

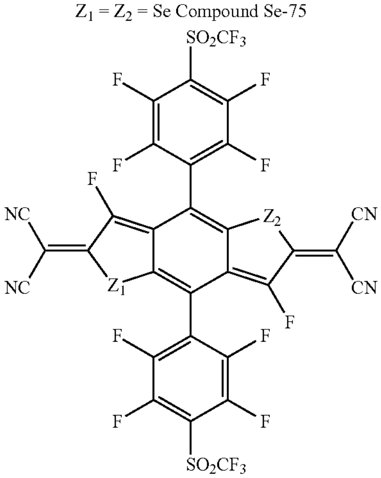

$Z_1 = Z_2 =$ O Compound O-76
$Z_1 = Z_2 =$ S Compound S-76
$Z_1 = Z_2 =$ Se Compound Se-76

-continued

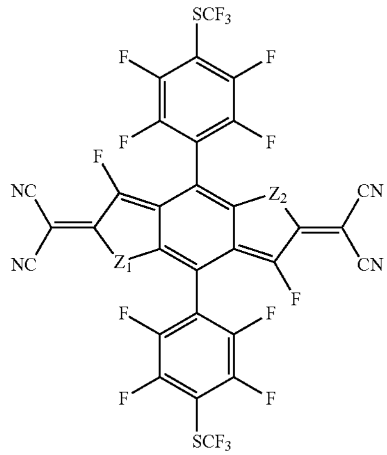

$Z_1 = Z_2 =$ O Compound O-77
$Z_1 = Z_2 =$ S Compound S-77
$Z_1 = Z_2 =$ Se Compound Se-77

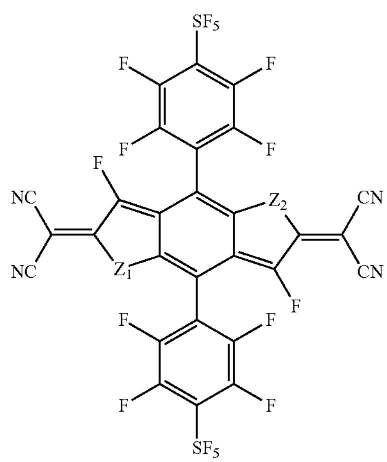

$Z_1 = Z_2 =$ O Compound O-78
$Z_1 = Z_2 =$ S Compound S-78
$Z_1 = Z_2 =$ Se Compound Se-78

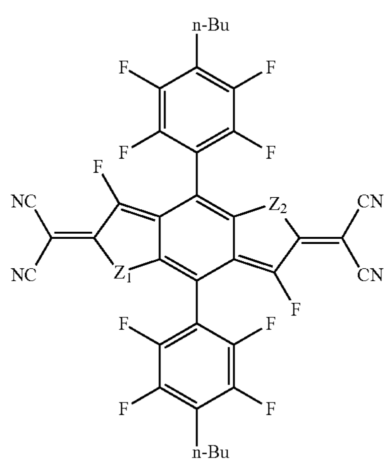

$Z_1 = Z_2 =$ O Compound O-79
$Z_1 = Z_2 =$ S Compound S-79
$Z_1 = Z_2 =$ Se Compound Se-79

-continued

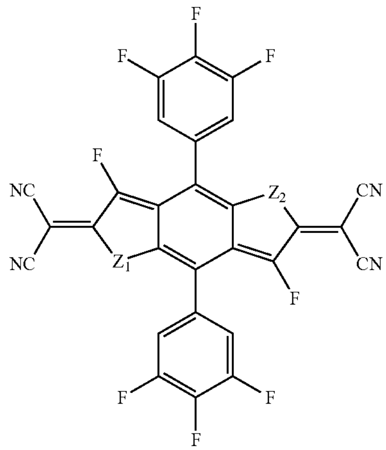

$Z_1 = Z_2 = O$ Compound O-80
$Z_1 = Z_2 = S$ Compound S-80
$Z_1 = Z_2 = Se$ Compound Se-80

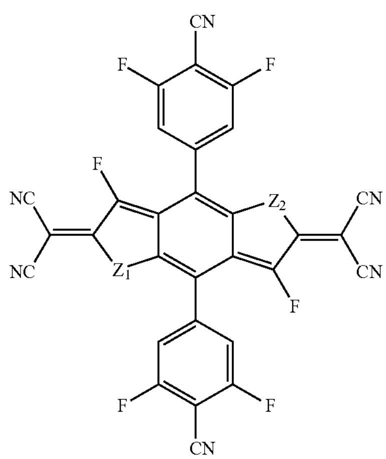

$Z_1 = Z_2 = O$ Compound O-81
$Z_1 = Z_2 = S$ Compound S-81
$Z_1 = Z_2 = Se$ Compound Se-81

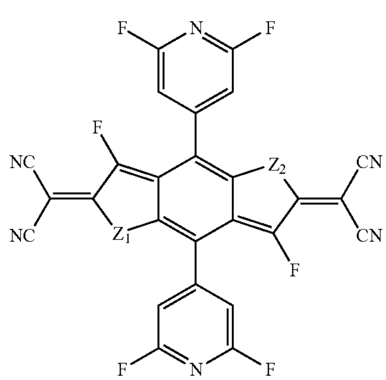

$Z_1 = Z_2 = O$ Compound O-82
$Z_1 = Z_2 = S$ Compound S-82
$Z_1 = Z_2 = Se$ Compound Se-82

-continued

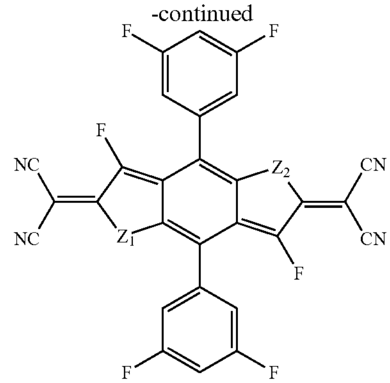

$Z_1 = Z_2 = O$ Compound O-83
$Z_1 = Z_2 = S$ Compound S-83
$Z_1 = Z_2 = Se$ Compound Se-83

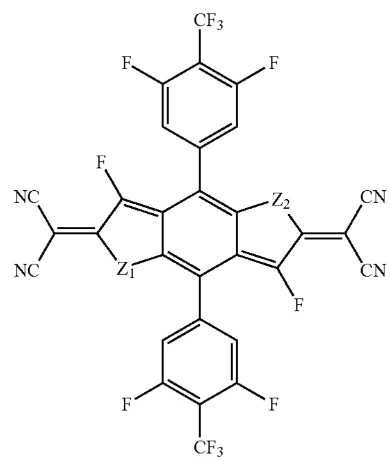

$Z_1 = Z_2 = O$ Compound O-84
$Z_1 = Z_2 = S$ Compound S-84
$Z_1 = Z_2 = Se$ Compound Se-84

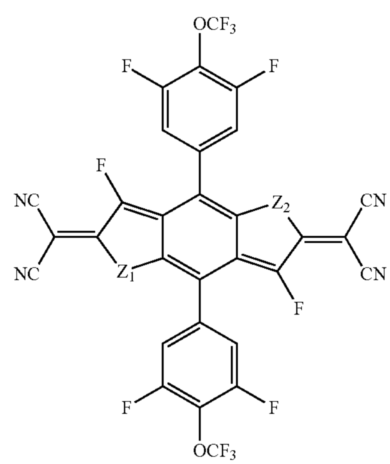

$Z_1 = Z_2 = O$ Compound O-85
$Z_1 = Z_2 = S$ Compound S-85
$Z_1 = Z_2 = Se$ Compound Se-85

-continued

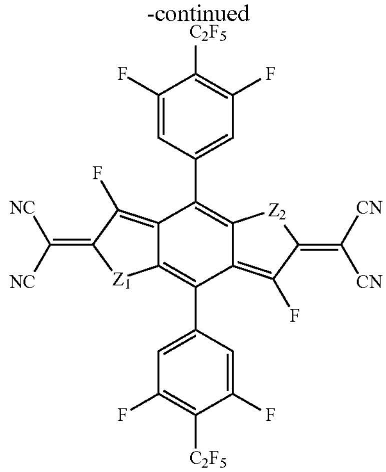

$Z_1 = Z_2 =$ O Compound O-86
$Z_1 = Z_2 =$ S Compound S-86
$Z_1 = Z_2 =$ Se Compound Se-86

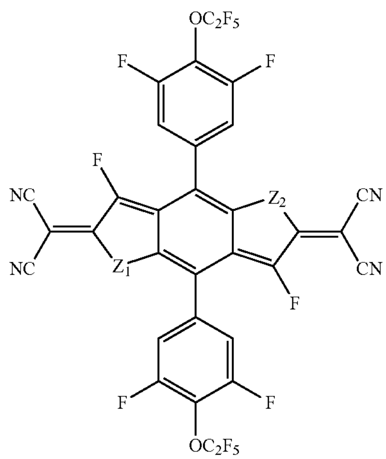

$Z_1 = Z_2 =$ O Compound O-87
$Z_1 = Z_2 =$ S Compound S-87
$Z_1 = Z_2 =$ Se Compound Se-87

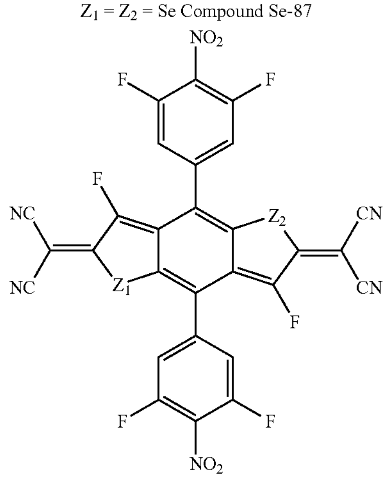

$Z_1 = Z_2 =$ O Compound O-88
$Z_1 = Z_2 =$ S Compound S-88
$Z_1 = Z_2 =$ Se Compound Se-88

-continued

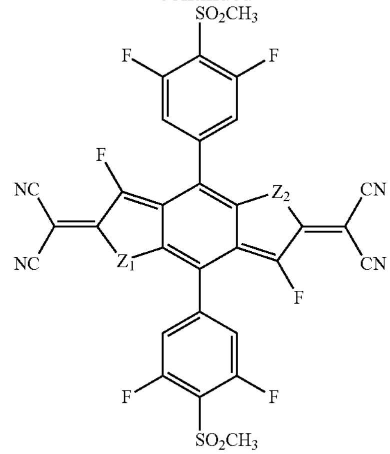

$Z_1 = Z_2 =$ O Compound O-89
$Z_1 = Z_2 =$ S Compound S-89
$Z_1 = Z_2 =$ Se Compound Se-89

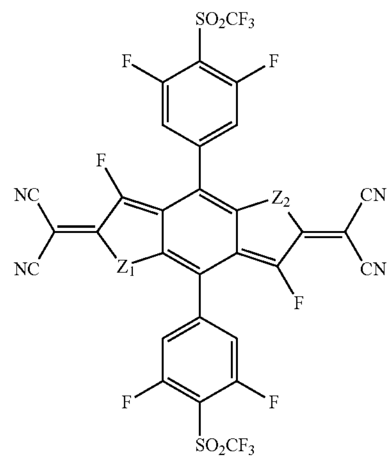

$Z_1 = Z_2 =$ O Compound O-90
$Z_1 = Z_2 =$ S Compound S-90
$Z_1 = Z_2 =$ Se Compound Se-90

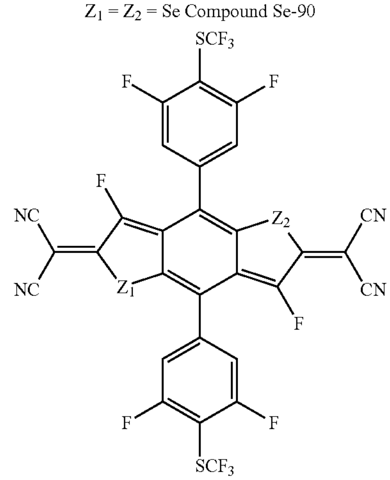

$Z_1 = Z_2 =$ O Compound O-91
$Z_1 = Z_2 =$ S Compound S-91
$Z_1 = Z_2 =$ Se Compound Se-91

-continued

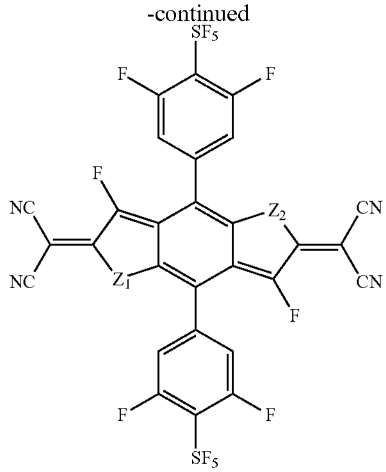

$Z_1 = Z_2 =$ O Compound O-92
$Z_1 = Z_2 =$ S Compound S-92
$Z_1 = Z_2 =$ Se Compound Se-92

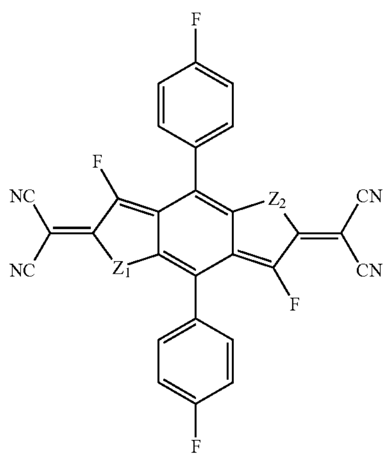

$Z_1 = Z_2 =$ O Compound O-93
$Z_1 = Z_2 =$ S Compound S-93
$Z_1 = Z_2 =$ Se Compound Se-93

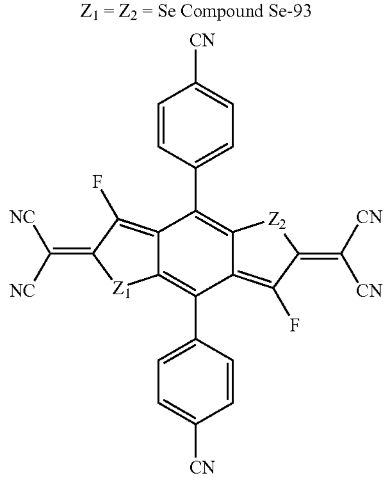

$Z_1 = Z_2 =$ O Compound O-94
$Z_1 = Z_2 =$ S Compound S-94
$Z_1 = Z_2 =$ Se Compound Se-94

-continued

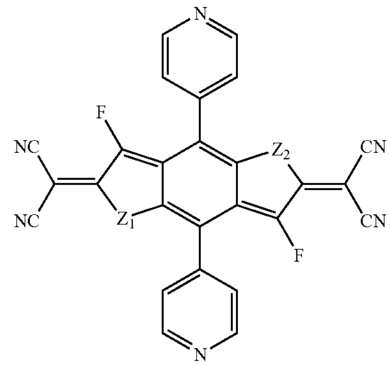

$Z_1 = Z_2 =$ O Compound O-95
$Z_1 = Z_2 =$ S Compound S-95
$Z_1 = Z_2 =$ Se Compound Se-95

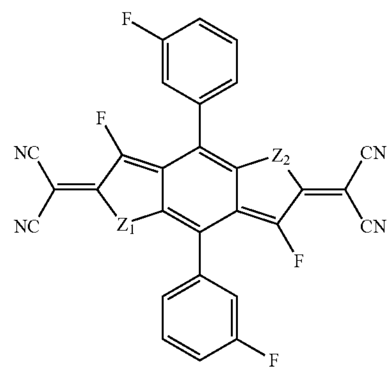

$Z_1 = Z_2 =$ O Compound O-96
$Z_1 = Z_2 =$ S Compound S-96
$Z_1 = Z_2 =$ Se Compound Se-96

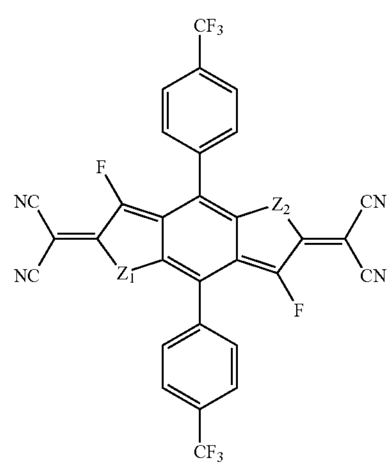

$Z_1 = Z_2 =$ O Compound O-97
$Z_1 = Z_2 =$ S Compound S-97
$Z_1 = Z_2 =$ Se Compound Se-97

-continued

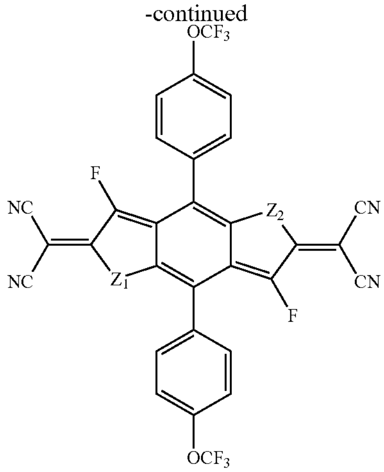

$Z_1 = Z_2 =$ O Compound O-98
$Z_1 = Z_2 =$ S Compound S-98
$Z_1 = Z_2 =$ Se Compound Se-98

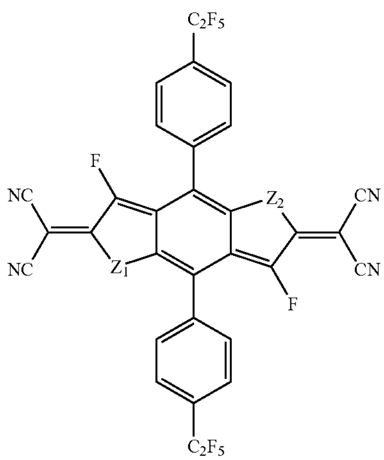

$Z_1 = Z_2 =$ O Compound O-99
$Z_1 = Z_2 =$ S Compound S-99
$Z_1 = Z_2 =$ Se Compound Se-99

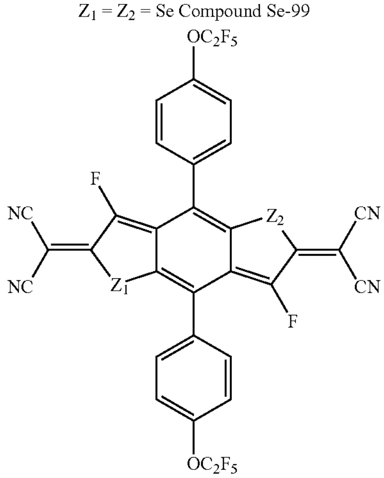

$Z_1 = Z_2 =$ O Compound O-100
$Z_1 = Z_2 =$ S Compound S-100
$Z_1 = Z_2 =$ Se Compound Se-100

-continued

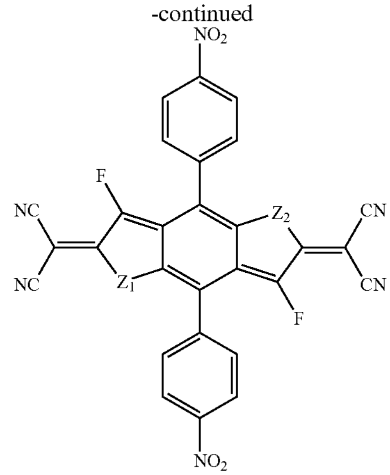

$Z_1 = Z_2 =$ O Compound O-101
$Z_1 = Z_2 =$ S Compound S-101
$Z_1 = Z_2 =$ Se Compound Se-101

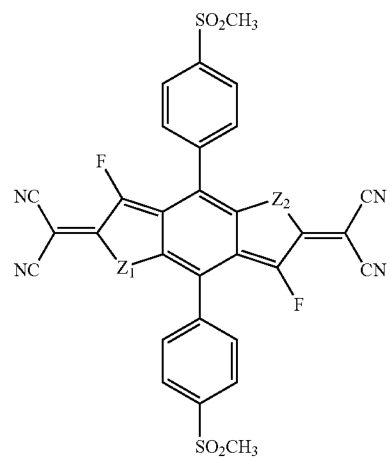

$Z_1 = Z_2 =$ O Compound O-102
$Z_1 = Z_2 =$ S Compound S-102
$Z_1 = Z_2 =$ Se Compound Se-102

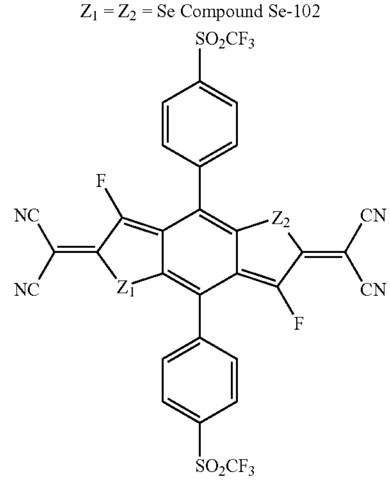

$Z_1 = Z_2 =$ O Compound O-103
$Z_1 = Z_2 =$ S Compound S-103
$Z_1 = Z_2 =$ Se Compound Se-103

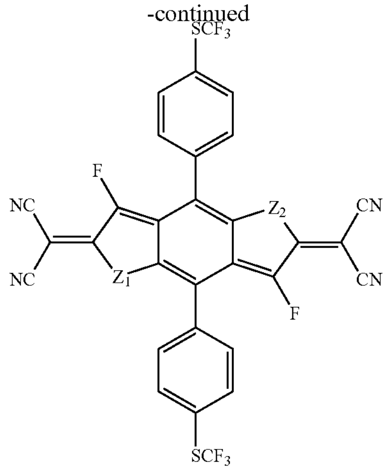

$Z_1 = Z_2 = O$ Compound O-104
$Z_1 = Z_2 = S$ Compound S-104
$Z_1 = Z_2 = Se$ Compound Se-104

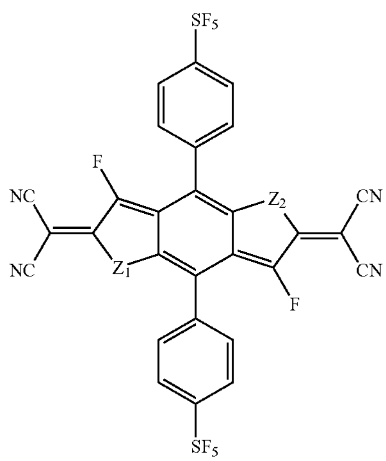

$Z_1 = Z_2 = O$ Compound O-105
$Z_1 = Z_2 = S$ Compound S-105
$Z_1 = Z_2 = Se$ Compound Se-105

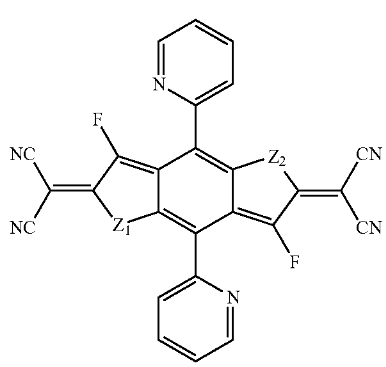

$Z_1 = Z_2 = O$ Compound O-106
$Z_1 = Z_2 = S$ Compound S-106
$Z_1 = Z_2 = Se$ Compound Se-106

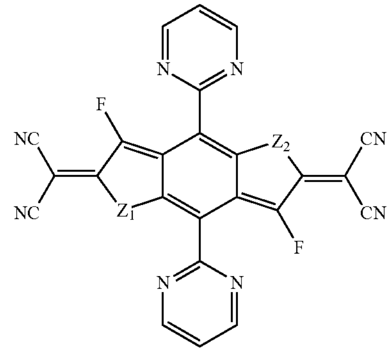

$Z_1 = Z_2 = O$ Compound O-107
$Z_1 = Z_2 = S$ Compound S-107
$Z_1 = Z_2 = Se$ Compound Se-107

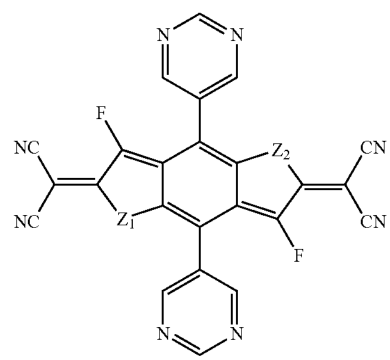

$Z_1 = Z_2 = O$ Compound O-108
$Z_1 = Z_2 = S$ Compound S-108
$Z_1 = Z_2 = Se$ Compound Se-108

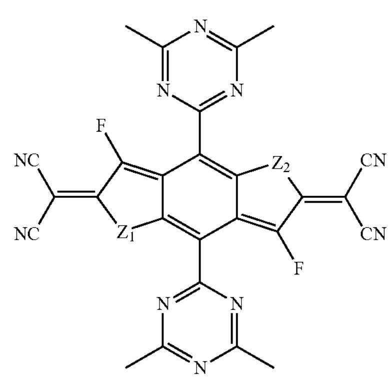

$Z_1 = Z_2 = O$ Compound O-109
$Z_1 = Z_2 = S$ Compound S-109
$Z_1 = Z_2 = Se$ Compound Se-109

-continued

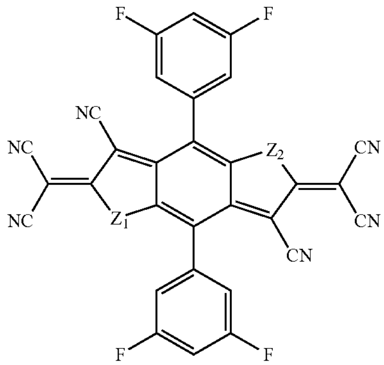

$Z_1 = Z_2 =$ O Compound O-110
$Z_1 = Z_2 =$ S Compound S-110
$Z_1 = Z_2 =$ Se Compound Se-110

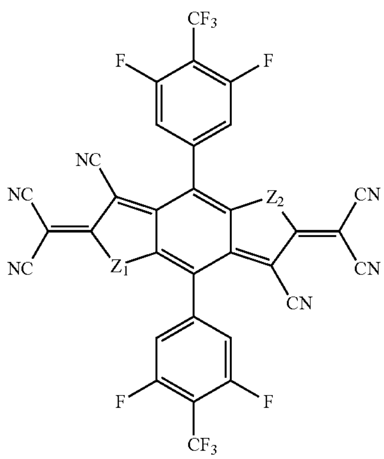

$Z_1 = Z_2 =$ O Compound O-111
$Z_1 = Z_2 =$ S Compound S-111
$Z_1 = Z_2 =$ Se Compound Se-111

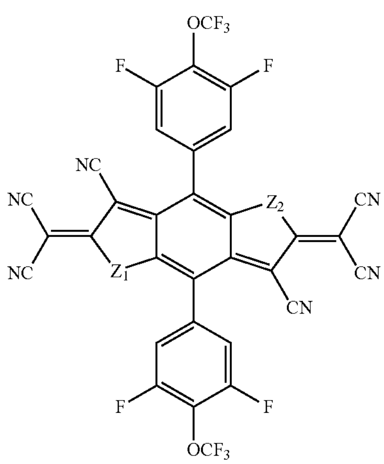

$Z_1 = Z_2 =$ O Compound O-112
$Z_1 = Z_2 =$ S Compound S-112
$Z_1 = Z_2 =$ Se Compound Se-112

-continued

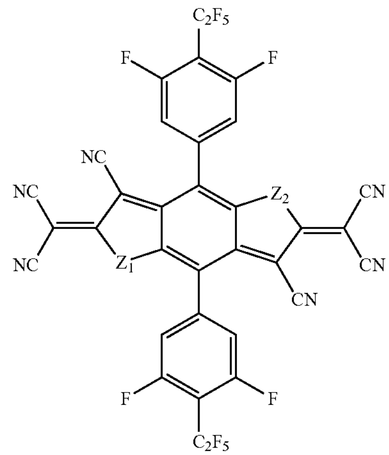

$Z_1 = Z_2 =$ O Compound O-113
$Z_1 = Z_2 =$ S Compound S-113
$Z_1 = Z_2 =$ Se Compound Se-113

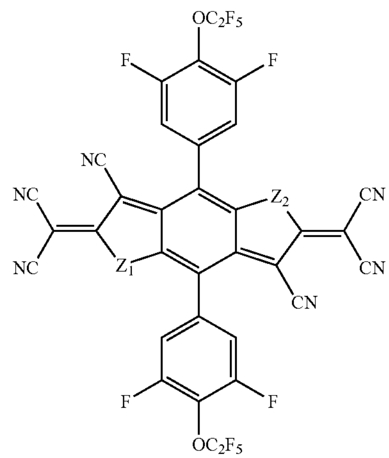

$Z_1 = Z_2 =$ O Compound O-114
$Z_1 = Z_2 =$ S Compound S-114
$Z_1 = Z_2 =$ Se Compound Se-114

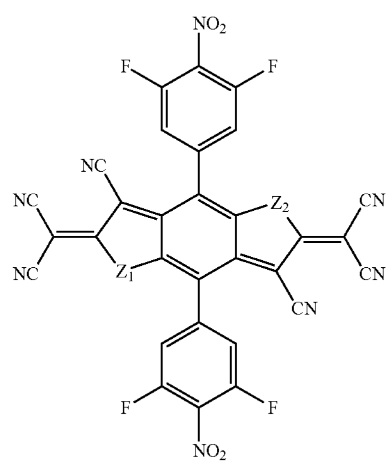

$Z_1 = Z_2 =$ O Compound O-115
$Z_1 = Z_2 =$ S Compound S-115
$Z_1 = Z_2 =$ Se Compound Se-115

-continued

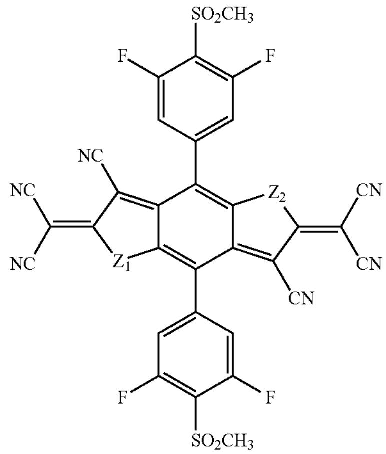

$Z_1 = Z_2 =$ O Compound O-116
$Z_1 = Z_2 =$ S Compound S-116
$Z_1 = Z_2 =$ Se Compound Se-116

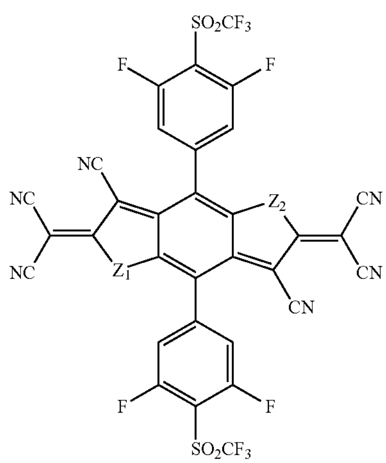

$Z_1 = Z_2 =$ O Compound O-117
$Z_1 = Z_2 =$ S Compound S-117
$Z_1 = Z_2 =$ Se Compound Se-117

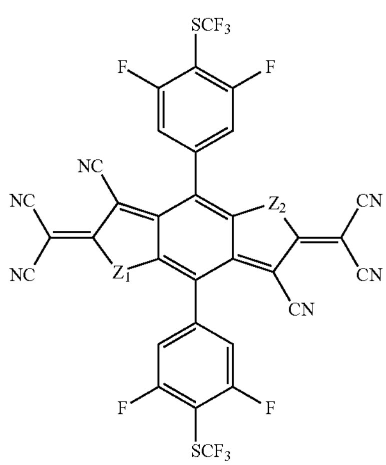

$Z_1 = Z_2 =$ O Compound O-118
$Z_1 = Z_2 =$ S Compound S-118
$Z_1 = Z_2 =$ Se Compound Se-118

-continued

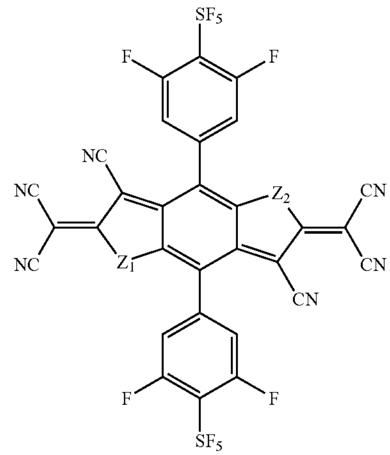

$Z_1 = Z_2 =$ O Compound O-119
$Z_1 = Z_2 =$ S Compound S-119
$Z_1 = Z_2 =$ Se Compound Se-119

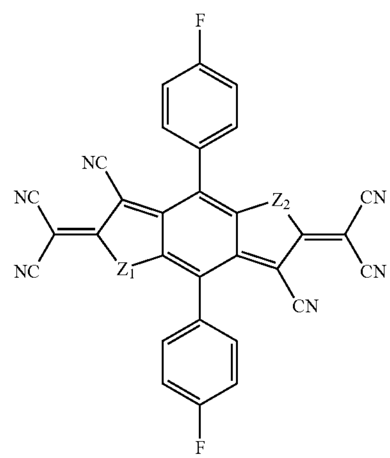

$Z_1 = Z_2 =$ O Compound O-120
$Z_1 = Z_2 =$ S Compound S-120
$Z_1 = Z_2 =$ Se Compound Se-120

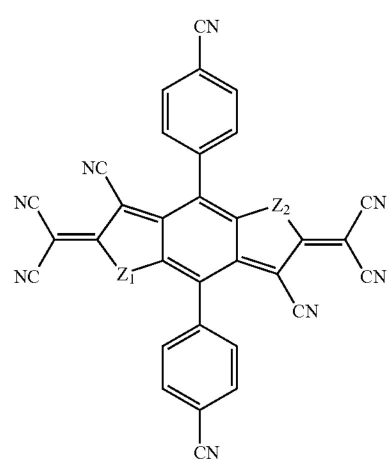

$Z_1 = Z_2 =$ O Compound O-121
$Z_1 = Z_2 =$ S Compound S-121
$Z_1 = Z_2 =$ Se Compound Se-121

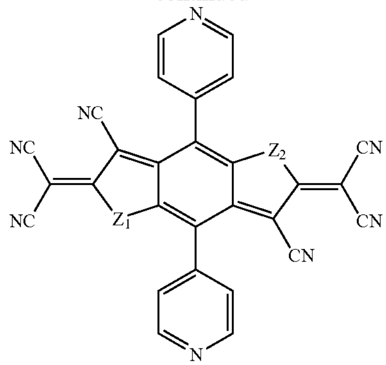

$Z_1 = Z_2 = O$ Compound O-122
$Z_1 = Z_2 = S$ Compound S-122
$Z_1 = Z_2 = Se$ Compound Se-122

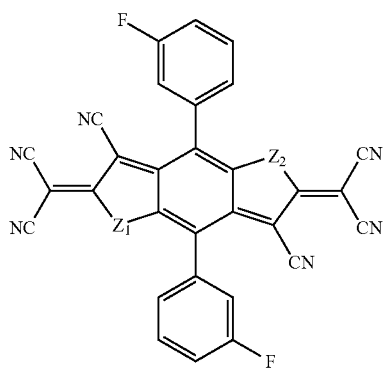

$Z_1 = Z_2 = O$ Compound O-123
$Z_1 = Z_2 = S$ Compound S-123
$Z_1 = Z_2 = Se$ Compound Se-123

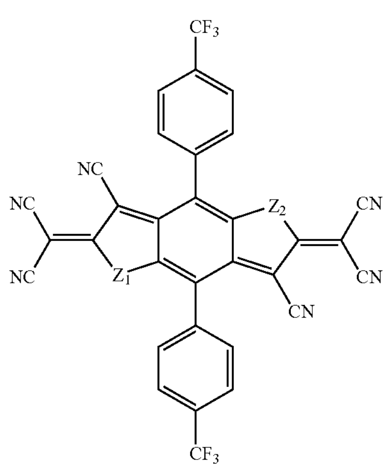

$Z_1 = Z_2 = O$ Compound O-124
$Z_1 = Z_2 = S$ Compound S-124
$Z_1 = Z_2 = Se$ Compound Se-124

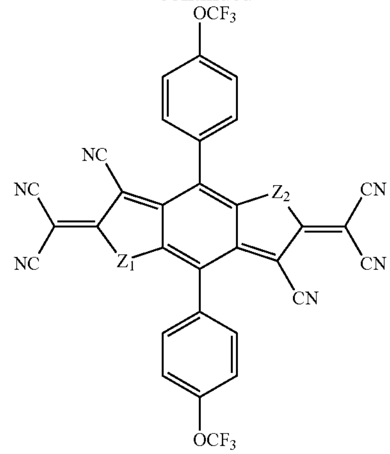

$Z_1 = Z_2 = O$ Compound O-125
$Z_1 = Z_2 = S$ Compound S-125
$Z_1 = Z_2 = Se$ Compound Se-125

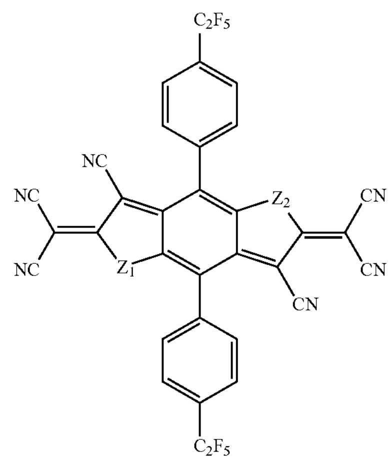

$Z_1 = Z_2 = O$ Compound O-126
$Z_1 = Z_2 = S$ Compound S-126
$Z_1 = Z_2 = Se$ Compound Se-126

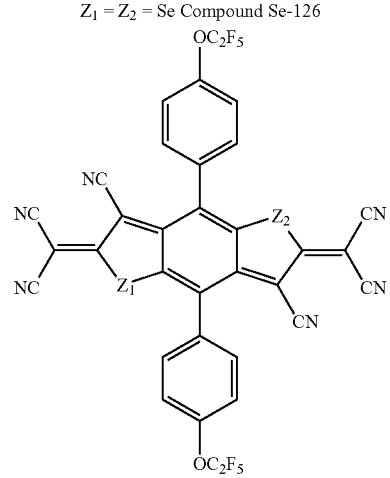

$Z_1 = Z_2 = O$ Compound O-127
$Z_1 = Z_2 = S$ Compound S-127
$Z_1 = Z_2 = Se$ Compound Se-127

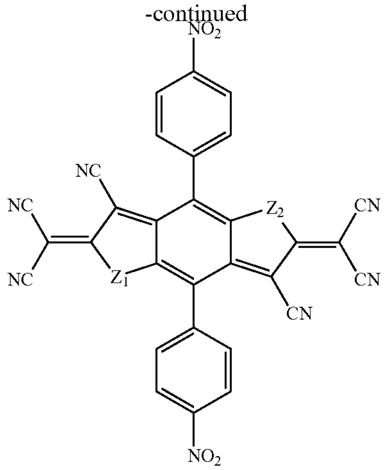

$Z_1 = Z_2 =$ O Compound O-128
$Z_1 = Z_2 =$ S Compound S-128
$Z_1 = Z_2 =$ Se Compound Se-128

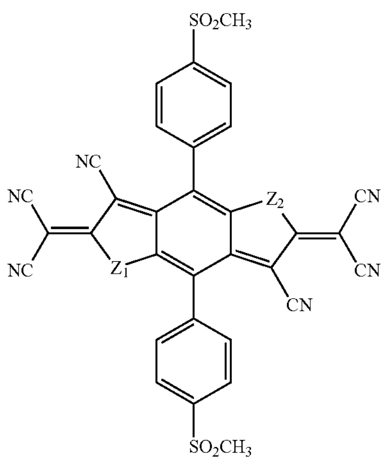

$Z_1 = Z_2 =$ O Compound O-129
$Z_1 = Z_2 =$ S Compound S-129
$Z_1 = Z_2 =$ Se Compound Se-129

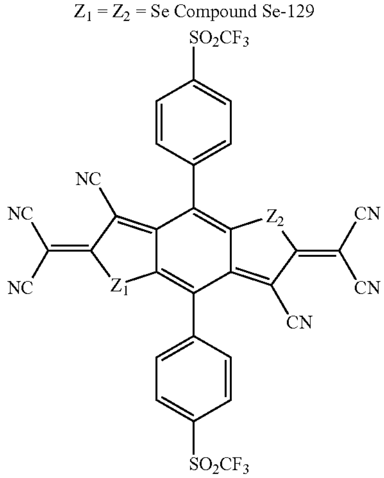

$Z_1 = Z_2 =$ O Compound O-130
$Z_1 = Z_2 =$ S Compound S-130
$Z_1 = Z_2 =$ Se Compound Se-130

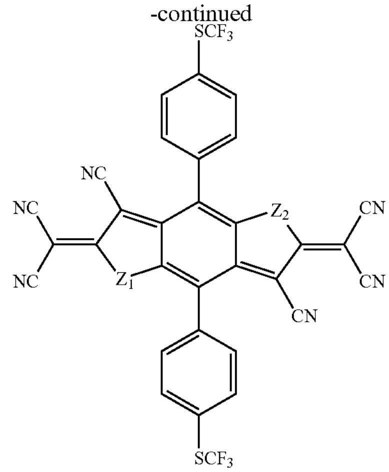

$Z_1 = Z_2 =$ O Compound O-131
$Z_1 = Z_2 =$ S Compound S-131
$Z_1 = Z_2 =$ Se Compound Se-131

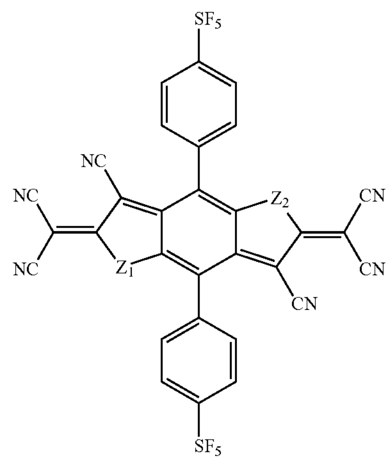

$Z_1 = Z_2 =$ O Compound O-132
$Z_1 = Z_2 =$ S Compound S-132
$Z_1 = Z_2 =$ Se Compound Se-132

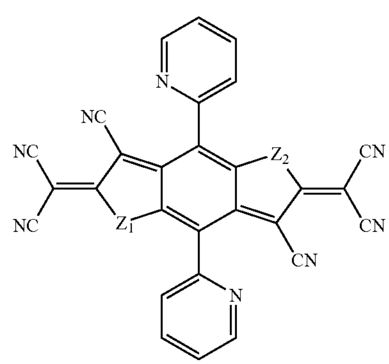

$Z_1 = Z_2 =$ O Compound O-133
$Z_1 = Z_2 =$ S Compound S-133
$Z_1 = Z_2 =$ Se Compound Se-133

-continued

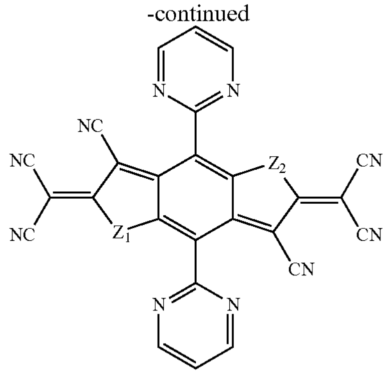

$Z_1 = Z_2 = O$ Compound O-134
$Z_1 = Z_2 = S$ Compound S-134
$Z_1 = Z_2 = Se$ Compound Se-134

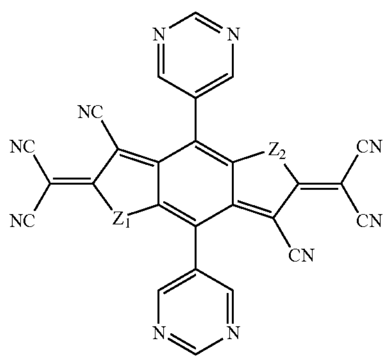

$Z_1 = Z_2 = O$ Compound O-135
$Z_1 = Z_2 = S$ Compound S-135
$Z_1 = Z_2 = Se$ Compound Se-135

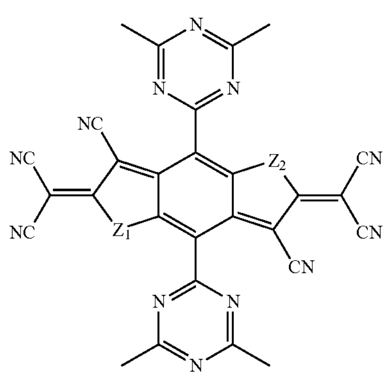

$Z_1 = Z_2 = O$ Compound O-136
$Z_1 = Z_2 = S$ Compound S-136
$Z_1 = Z_2 = Se$ Compound Se-136

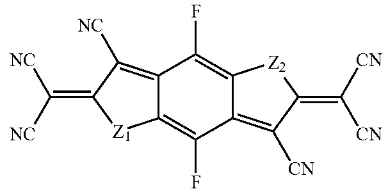

$Z_1 = Z_2 = O$ Compound O-137
$Z_1 = Z_2 = S$ Compound S-137
$Z_1 = Z_2 = Se$ Compound Se-137

-continued

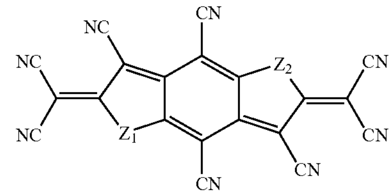

$Z_1 = Z_2 = O$ Compound O-138
$Z_1 = Z_2 = S$ Compound S-138
$Z_1 = Z_2 = Se$ Compound Se-138

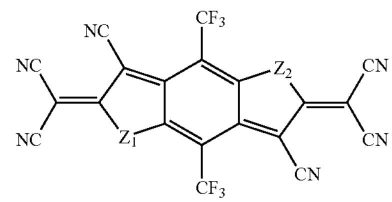

$Z_1 = Z_2 = O$ Compound O-139
$Z_1 = Z_2 = S$ Compound S-139
$Z_1 = Z_2 = Se$ Compound Se-139

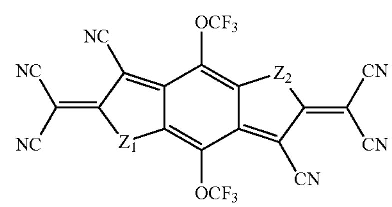

$Z_1 = Z_2 = O$ Compound O-140
$Z_1 = Z_2 = S$ Compound S-140
$Z_1 = Z_2 = Se$ Compound Se-140

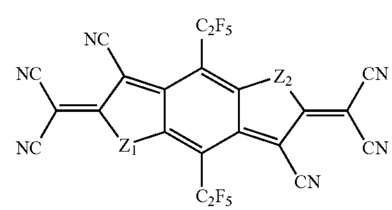

$Z_1 = Z_2 = O$ Compound O-141
$Z_1 = Z_2 = S$ Compound S-141
$Z_1 = Z_2 = Se$ Compound Se-141

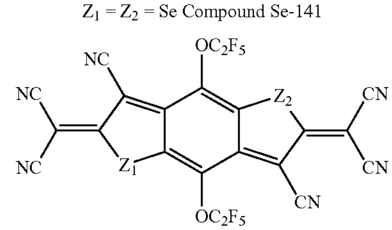

$Z_1 = Z_2 = O$ Compound O-142
$Z_1 = Z_2 = S$ Compound S-142
$Z_1 = Z_2 = Se$ Compound Se-142

-continued

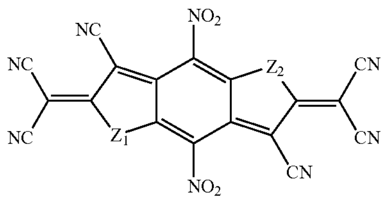

$Z_1 = Z_2 = O$ Compound O-143
$Z_1 = Z_2 = S$ Compound S-143
$Z_1 = Z_2 = Se$ Compound Se-143

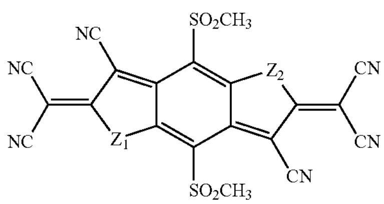

$Z_1 = Z_2 = O$ Compound O-144
$Z_1 = Z_2 = S$ Compound S-144
$Z_1 = Z_2 = Se$ Compound Se-144

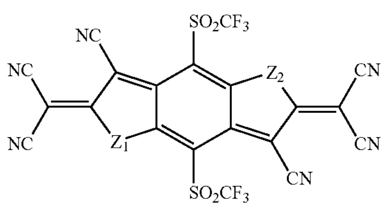

$Z_1 = Z_2 = O$ Compound O-145
$Z_1 = Z_2 = S$ Compound S-145
$Z_1 = Z_2 = Se$ Compound Se-145

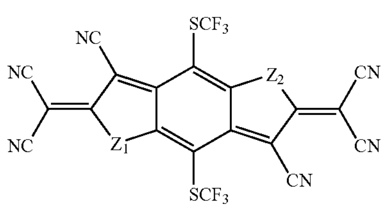

$Z_1 = Z_2 = O$ Compound O-146
$Z_1 = Z_2 = S$ Compound S-146
$Z_1 = Z_2 = Se$ Compound Se-146

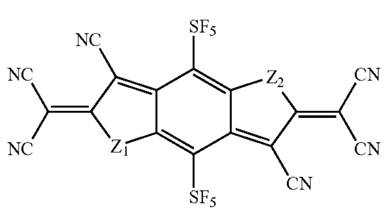

$Z_1 = Z_2 = O$ Compound O-147
$Z_1 = Z_2 = S$ Compound S-147
$Z_1 = Z_2 = Se$ Compound Se-147

-continued

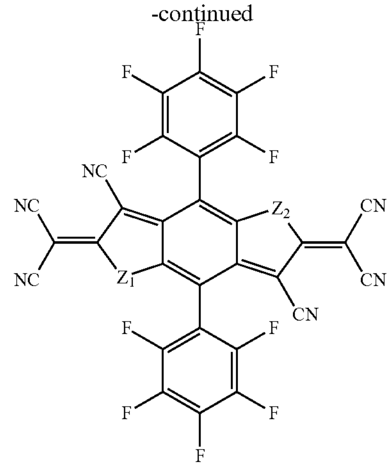

$Z_1 = Z_2 = O$ Compound O-148
$Z_1 = Z_2 = S$ Compound S-148
$Z_1 = Z_2 = Se$ Compound Se-148

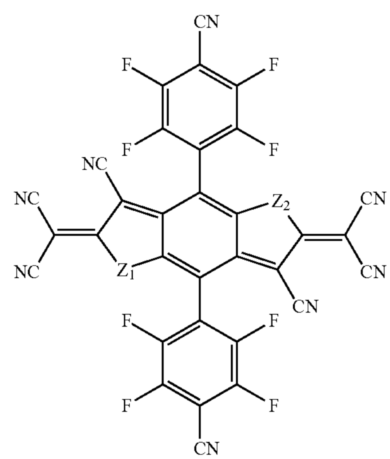

$Z_1 = Z_2 = O$ Compound O-149
$Z_1 = Z_2 = S$ Compound S-149
$Z_1 = Z_2 = Se$ Compound Se-149

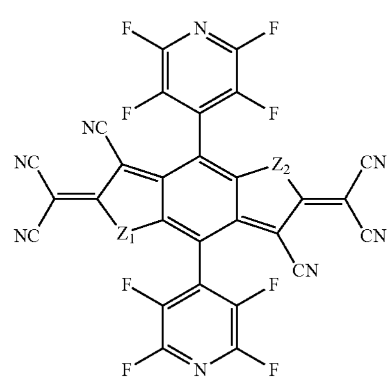

$Z_1 = Z_2 = O$ Compound O-150
$Z_1 = Z_2 = S$ Compound S-150
$Z_1 = Z_2 = Se$ Compound Se-150

-continued

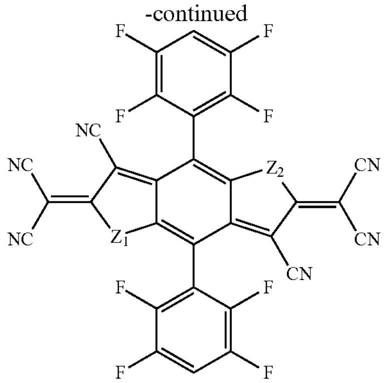

$Z_1 = Z_2 =$ O Compound O-151
$Z_1 = Z_2 =$ S Compound S-151
$Z_1 = Z_2 =$ Se Compound Se-151

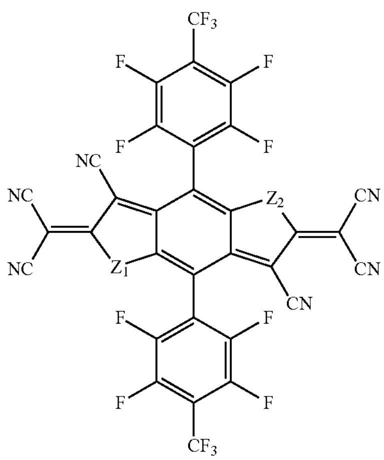

$Z_1 = Z_2 =$ O Compound O-152
$Z_1 = Z_2 =$ S Compound S-152
$Z_1 = Z_2 =$ Se Compound Se-152

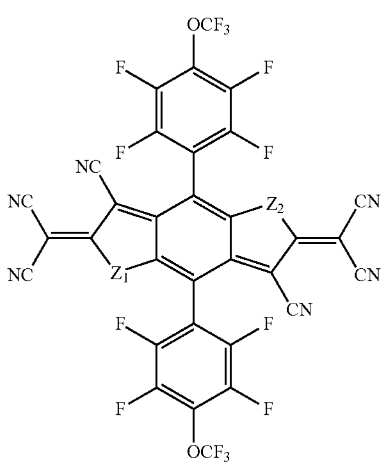

$Z_1 = Z_2 =$ O Compound O-153
$Z_1 = Z_2 =$ S Compound S-153
$Z_1 = Z_2 =$ Se Compound Se-153

-continued

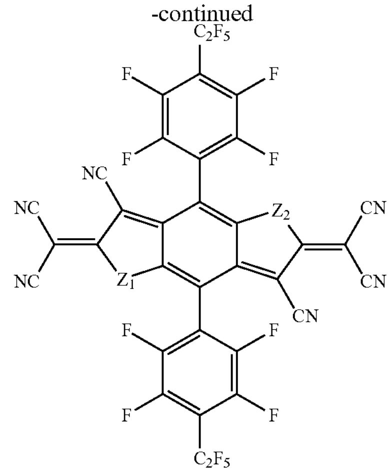

$Z_1 = Z_2 =$ O Compound O-154
$Z_1 = Z_2 =$ S Compound S-154
$Z_1 = Z_2 =$ Se Compound Se-154

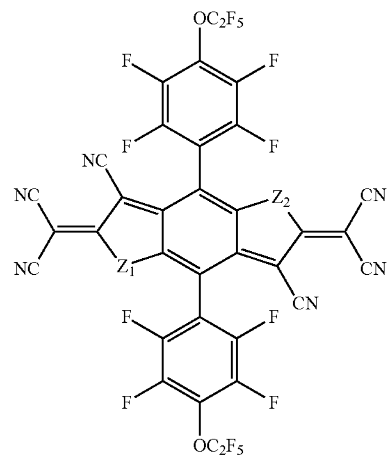

$Z_1 = Z_2 =$ O Compound O-155
$Z_1 = Z_2 =$ S Compound S-155
$Z_1 = Z_2 =$ Se Compound Se-155

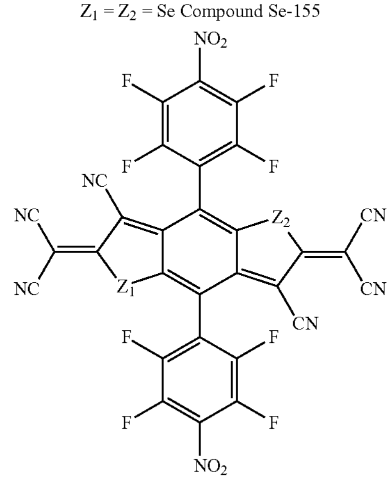

$Z_1 = Z_2 =$ O Compound O-156
$Z_1 = Z_2 =$ S Compound S-156
$Z_1 = Z_2 =$ Se Compound Se-156

-continued

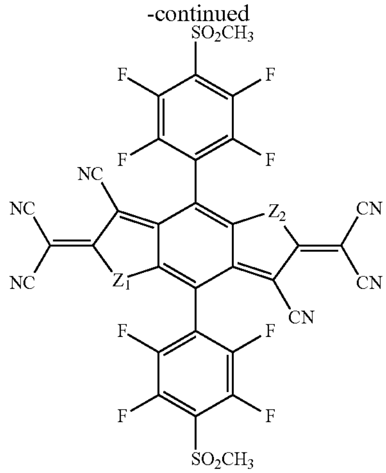

$Z_1 = Z_2 = O$ Compound O-157
$Z_1 = Z_2 = S$ Compound S-157
$Z_1 = Z_2 = Se$ Compound Se-157

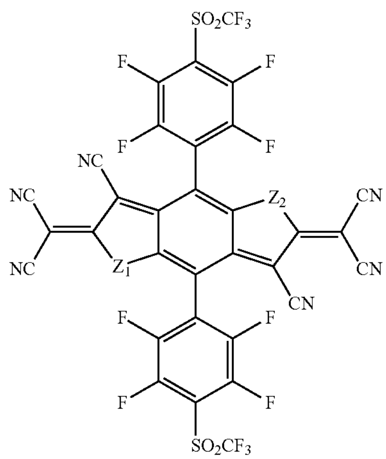

$Z_1 = Z_2 = O$ Compound O-158
$Z_1 = Z_2 = S$ Compound S-158
$Z_1 = Z_2 = Se$ Compound Se-158

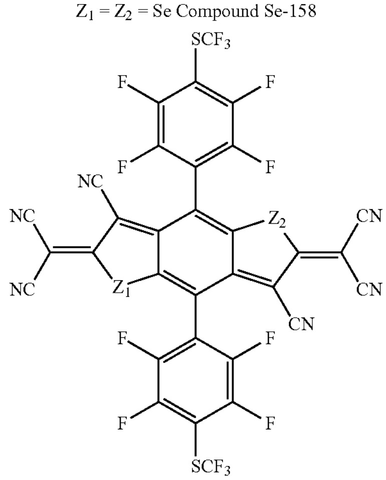

$Z_1 = Z_2 = O$ Compound O-159
$Z_1 = Z_2 = S$ Compound S-159
$Z_1 = Z_2 = Se$ Compound Se-159

-continued

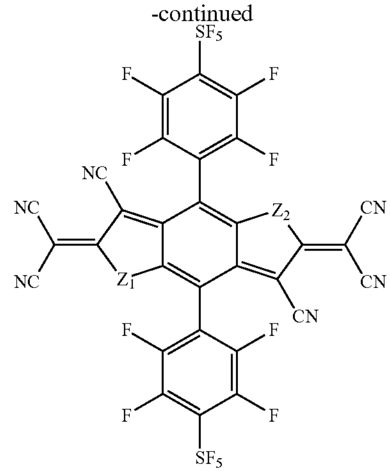

$Z_1 = Z_2 = O$ Compound O-160
$Z_1 = Z_2 = S$ Compound S-160
$Z_1 = Z_2 = Se$ Compound Se-160

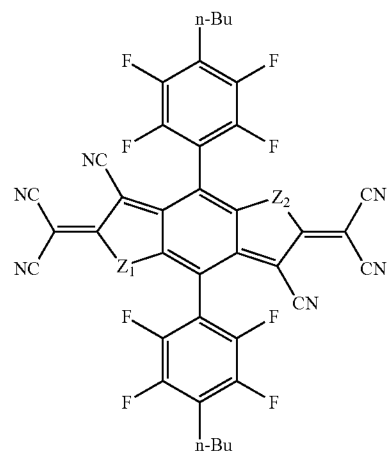

$Z_1 = Z_2 = O$ Compound O-161
$Z_1 = Z_2 = S$ Compound S-161
$Z_1 = Z_2 = Se$ Compound Se-161

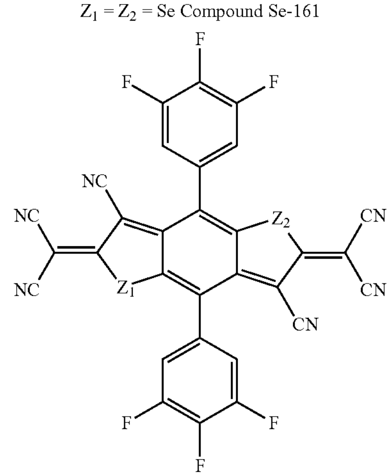

$Z_1 = Z_2 = O$ Compound O-162
$Z_1 = Z_2 = S$ Compound S-162
$Z_1 = Z_2 = Se$ Compound Se-162

-continued

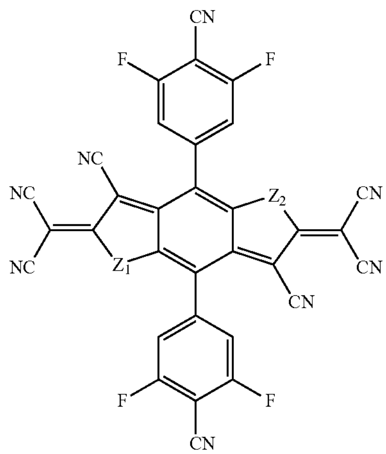

$Z_1 = Z_2$ = O Compound O-163
$Z_1 = Z_2$ = S Compound S-163
$Z_1 = Z_2$ = Se Compound Se-163

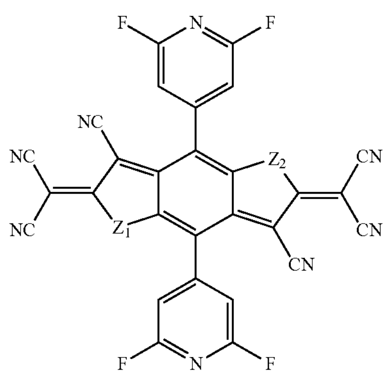

$Z_1 = Z_2$ = O Compound O-164
$Z_1 = Z_2$ = S Compound S-164
$Z_1 = Z_2$ = Se Compound Se-164

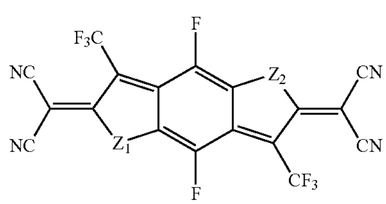

$Z_1 = Z_2$ = O Compound O-165
$Z_1 = Z_2$ = S Compound S-165
$Z_1 = Z_2$ = Se Compound Se-165

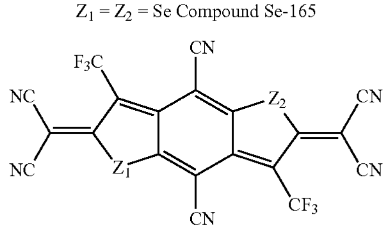

$Z_1 = Z_2$ = O Compound O-166
$Z_1 = Z_2$ = S Compound S-166
$Z_1 = Z_2$ = Se Compound Se-166

-continued

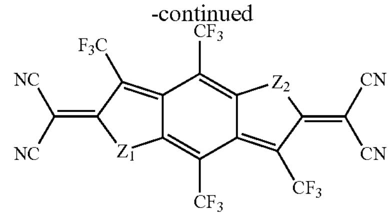

$Z_1 = Z_2$ = O Compound O-167
$Z_1 = Z_2$ = S Compound S-167
$Z_1 = Z_2$ = Se Compound Se-167

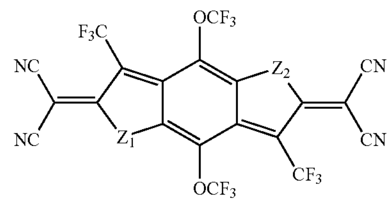

$Z_1 = Z_2$ = O Compound O-168
$Z_1 = Z_2$ = S Compound S-168
$Z_1 = Z_2$ = Se Compound Se-168

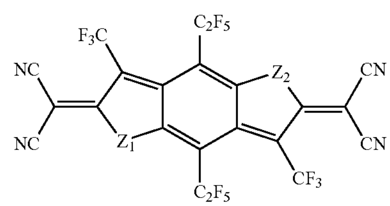

$Z_1 = Z_2$ = O Compound O-169
$Z_1 = Z_2$ = S Compound S-169
$Z_1 = Z_2$ = Se Compound Se-169

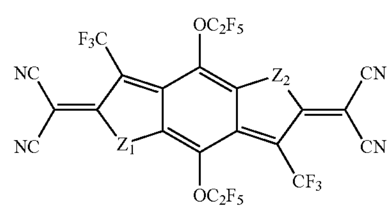

$Z_1 = Z_2$ = O Compound O-170
$Z_1 = Z_2$ = S Compound S-170
$Z_1 = Z_2$ = Se Compound Se-170

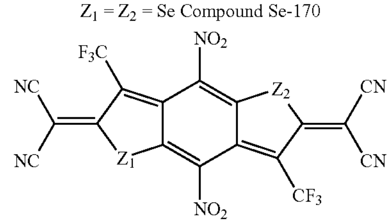

$Z_1 = Z_2$ = O Compound O-171
$Z_1 = Z_2$ = S Compound S-171
$Z_1 = Z_2$ = Se Compound Se-171

-continued

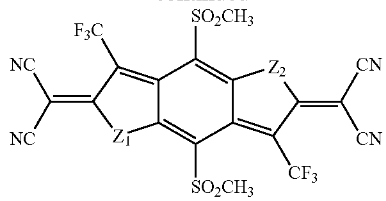

$Z_1 = Z_2 =$ O Compound O-172
$Z_1 = Z_2 =$ S Compound S-172
$Z_1 = Z_2 =$ Se Compound Se-172

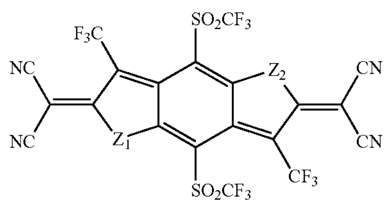

$Z_1 = Z_2 =$ O Compound O-173
$Z_1 = Z_2 =$ S Compound S-173
$Z_1 = Z_2 =$ Se Compound Se-173

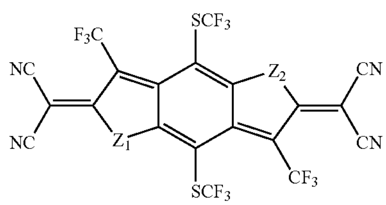

$Z_1 = Z_2 =$ O Compound O-174
$Z_1 = Z_2 =$ S Compound S-174
$Z_1 = Z_2 =$ Se Compound Se-174

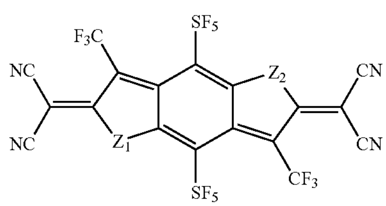

$Z_1 = Z_2 =$ O Compound O-175
$Z_1 = Z_2 =$ S Compound S-175
$Z_1 = Z_2 =$ Se Compound Se-175

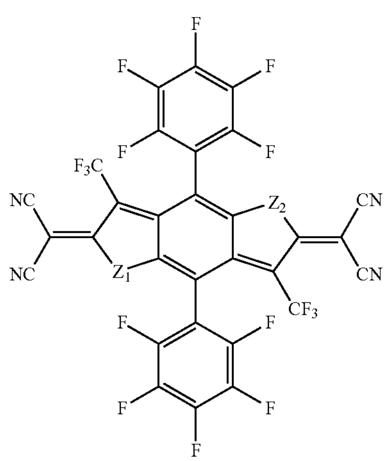

$Z_1 = Z_2 =$ O Compound O-176
$Z_1 = Z_2 =$ S Compound S-176
$Z_1 = Z_2 =$ Se Compound Se-176

-continued

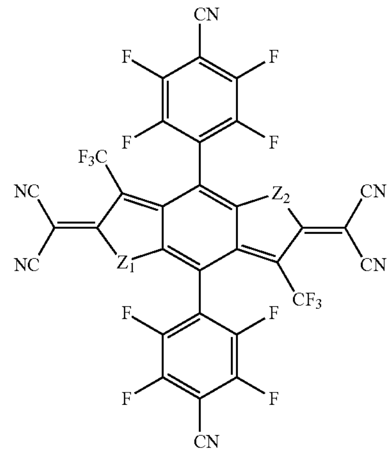

$Z_1 = Z_2 =$ O Compound O-177
$Z_1 = Z_2 =$ S Compound S-177
$Z_1 = Z_2 =$ Se Compound Se-177

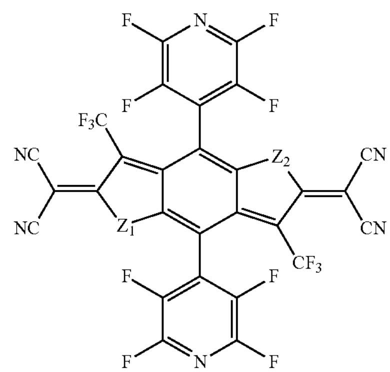

$Z_1 = Z_2 =$ O Compound O-178
$Z_1 = Z_2 =$ S Compound S-178
$Z_1 = Z_2 =$ Se Compound Se-178

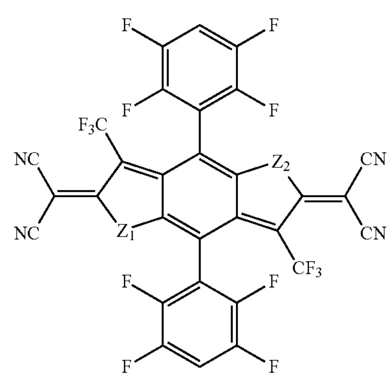

$Z_1 = Z_2 =$ O Compound O-179
$Z_1 = Z_2 =$ S Compound S-179
$Z_1 = Z_2 =$ Se Compound Se-179

-continued

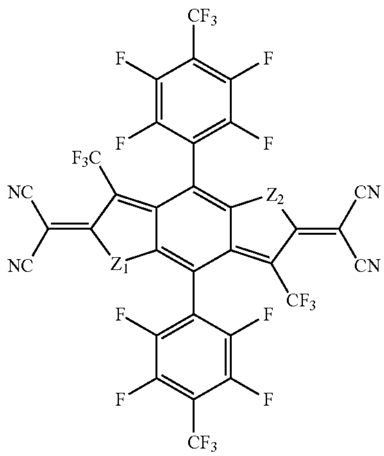

$Z_1 = Z_2 =$ O Compound O-180
$Z_1 = Z_2 =$ S Compound S-180
$Z_1 = Z_2 =$ Se Compound Se-180

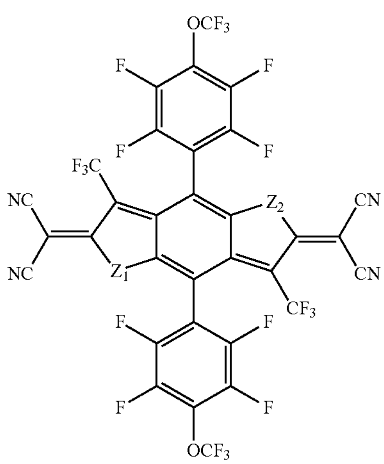

$Z_1 = Z_2 =$ O Compound O-181
$Z_1 = Z_2 =$ S Compound S-181
$Z_1 = Z_2 =$ Se Compound Se-181

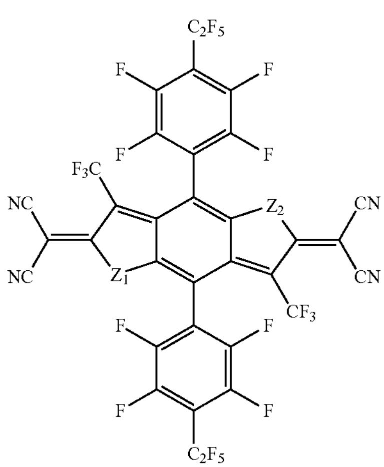

$Z_1 = Z_2 =$ O Compound O-182
$Z_1 = Z_2 =$ S Compound S-182
$Z_1 = Z_2 =$ Se Compound Se-182

-continued

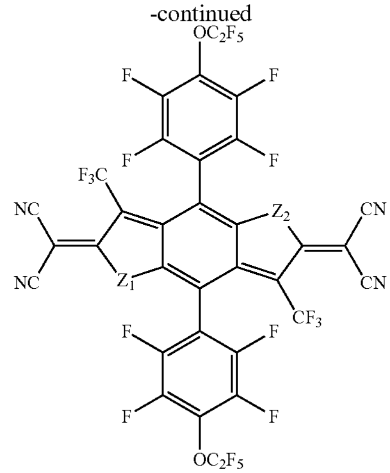

$Z_1 = Z_2 =$ O Compound O-183
$Z_1 = Z_2 =$ S Compound S-183
$Z_1 = Z_2 =$ Se Compound Se-183

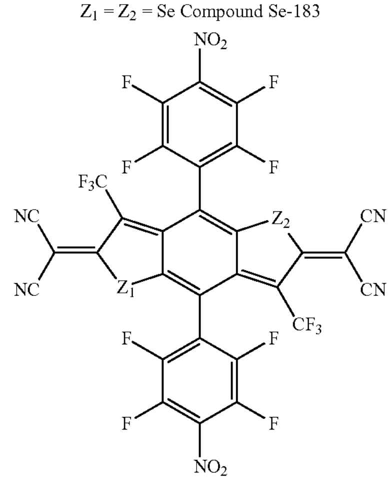

$Z_1 = Z_2 =$ O Compound O-184
$Z_1 = Z_2 =$ S Compound S-184
$Z_1 = Z_2 =$ Se Compound Se-184

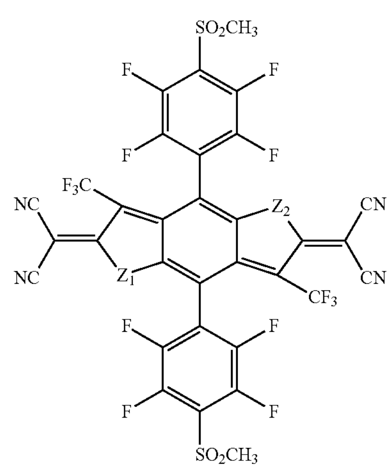

$Z_1$=$Z_1$=O Compound O-185
$Z_1$=$Z_2$=S Compound S-185
$Z_1$=$Z_2$=Se Compound Se-185

-continued

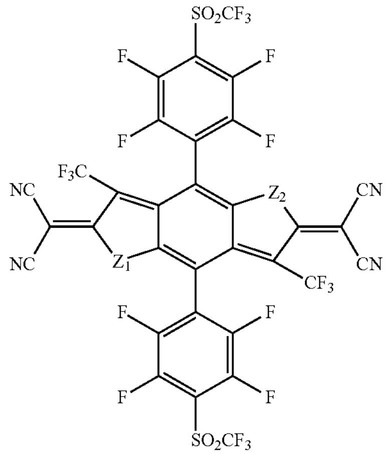

$Z_1$=$Z_1$=O Compound O-186
$Z_1$=$Z_2$=S Compound S-186
$Z_1$=$Z_2$=Se Compound Se-186

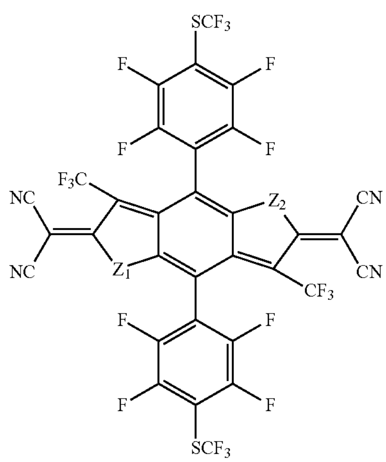

$Z_1$=$Z_1$=O Compound O-187
$Z_1$=$Z_2$=S Compound S-187
$Z_1$=$Z_2$=Se Compound Se-187

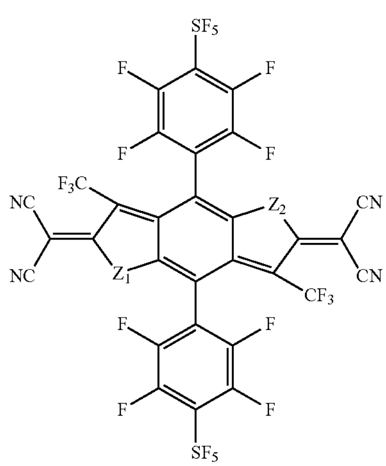

$Z_1$=$Z_1$=O Compound O-188
$Z_1$=$Z_2$=S Compound S-188
$Z_1$=$Z_2$=Se Compound Se-188

-continued

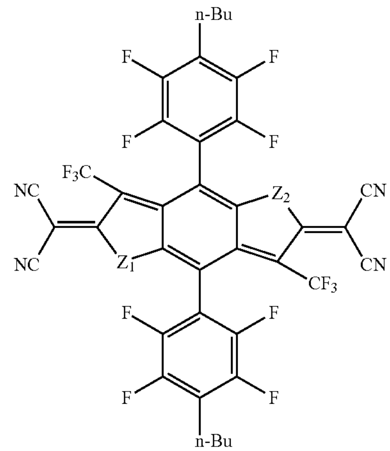

$Z_1$=$Z_1$=O Compound O-189
$Z_1$=$Z_2$=S Compound S-189
$Z_1$=$Z_2$=Se Compound Se-189

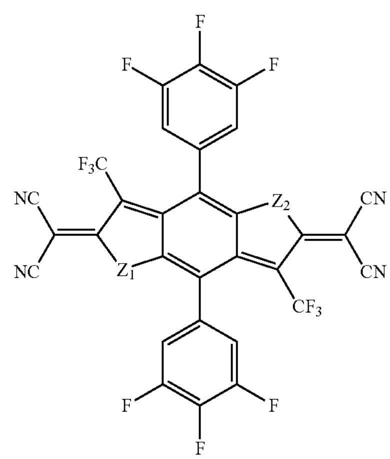

$Z_1$=$Z_1$=O Compound O-190
$Z_1$=$Z_2$=S Compound S-190
$Z_1$=$Z_2$=Se Compound Se-190

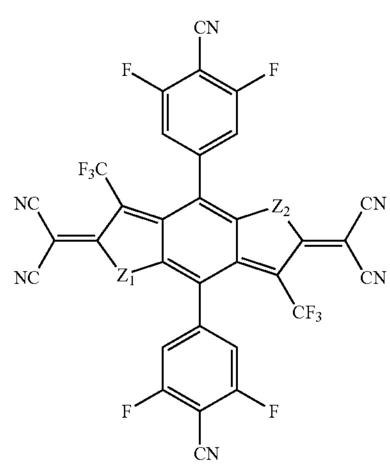

$Z_1$=$Z_1$=O Compound O-191
$Z_1$=$Z_2$=S Compound S-191
$Z_1$=$Z_2$=Se Compound Se-191

-continued

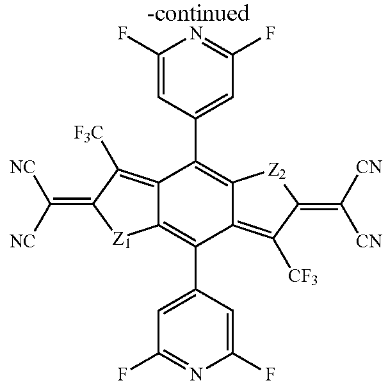

$Z_1$=$Z_1$=O Compound O-192
$Z_1$=$Z_2$=S Compound S-192
$Z_1$=$Z_2$=Se Compound Se-192

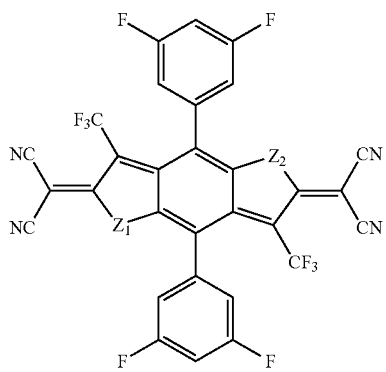

$Z_1$=$Z_1$=O Compound O-193
$Z_1$=$Z_2$=S Compound S-193
$Z_1$=$Z_2$=Se Compound Se-193

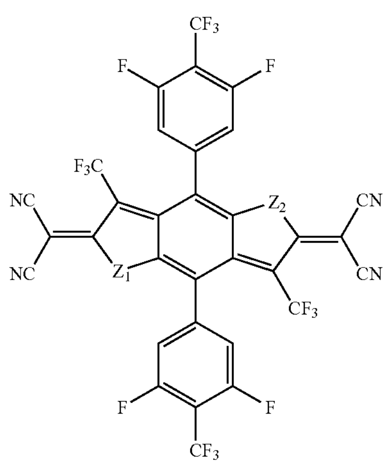

$Z_1$=$Z_1$=O Compound O-194
$Z_1$=$Z_2$=S Compound S-194
$Z_1$=$Z_2$=Se Compound Se-194

-continued

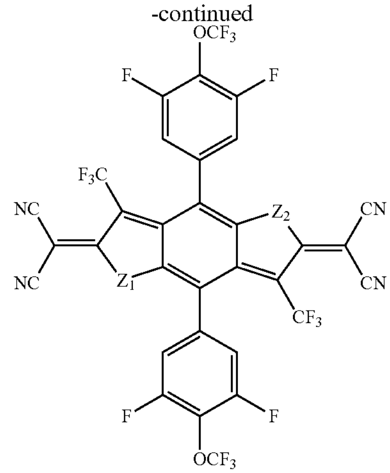

$Z_1$=$Z_1$=O Compound O-195
$Z_1$=$Z_2$=S Compound S-195
$Z_1$=$Z_2$=Se Compound Se-195

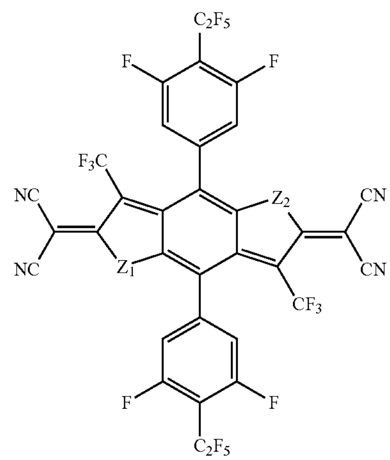

$Z_1$=$Z_1$=O Compound O-196
$Z_1$=$Z_2$=S Compound S-196
$Z_1$=$Z_2$=Se Compound Se-196

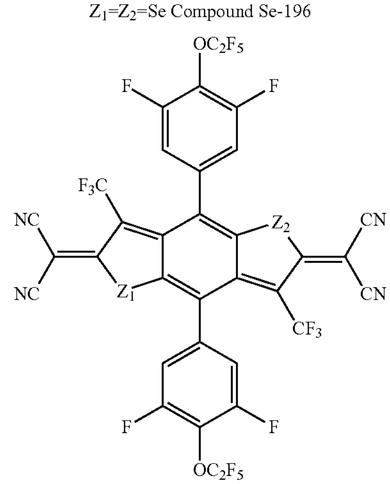

$Z_1$=$Z_1$=O Compound O-197
$Z_1$=$Z_2$=S Compound S-197
$Z_1$=$Z_2$=Se Compound Se-197

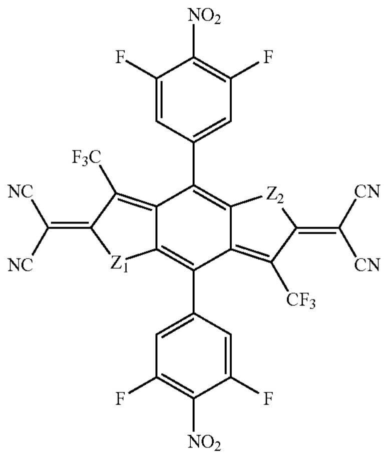

$Z_1$=$Z_1$=O Compound O-198
$Z_1$=$Z_2$=S Compound S-198
$Z_1$=$Z_2$=Se Compound Se-198

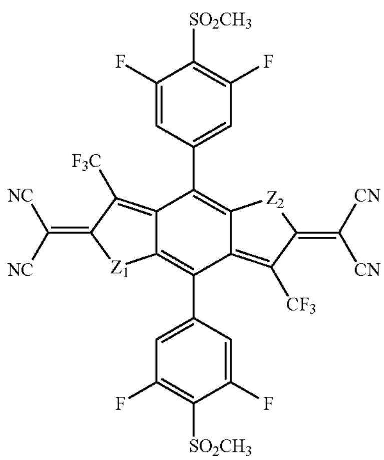

$Z_1$=$Z_1$=O Compound O-199
$Z_1$=$Z_2$=S Compound S-199
$Z_1$=$Z_2$=Se Compound Se-199

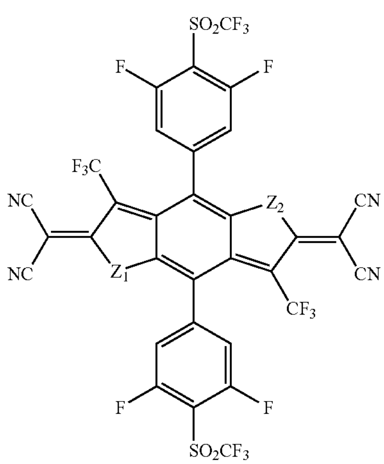

$Z_1$=$Z_1$=O Compound O-200
$Z_1$=$Z_2$=S Compound S-200
$Z_1$=$Z_2$=Se Compound Se-200

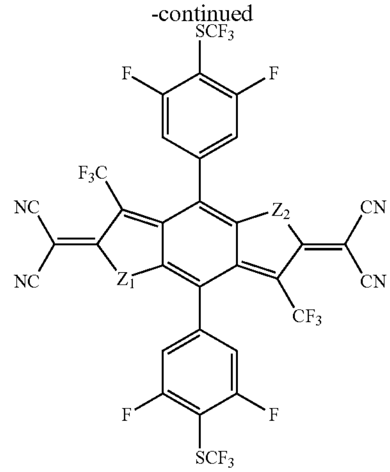

$Z_1$=$Z_1$=O Compound O-201
$Z_1$=$Z_2$=S Compound S-201
$Z_1$=$Z_2$=Se Compound Se-201

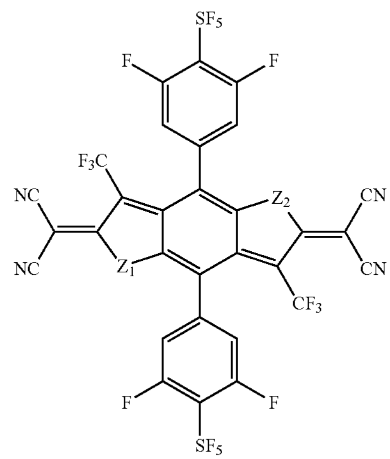

$Z_1$=$Z_1$=O Compound O-202
$Z_1$=$Z_2$=S Compound S-202
$Z_1$=$Z_2$=Se Compound Se-202

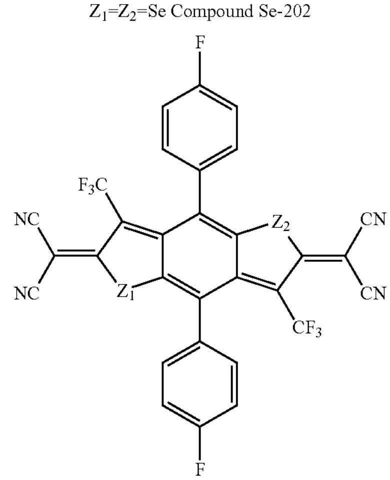

$Z_1$=$Z_1$=O Compound O-203
$Z_1$=$Z_2$=S Compound S-203
$Z_1$=$Z_2$=Se Compound Se-203

-continued

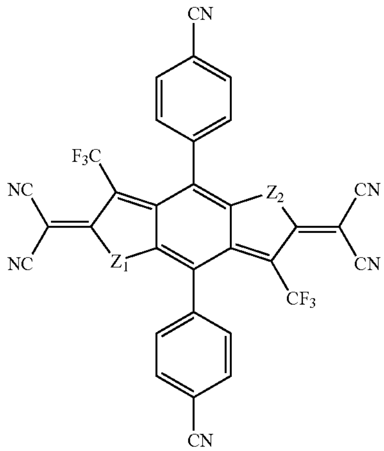

$Z_1$=$Z_1$=O Compound O-204
$Z_1$=$Z_2$=S Compound S-204
$Z_1$=$Z_2$=Se Compound Se-204

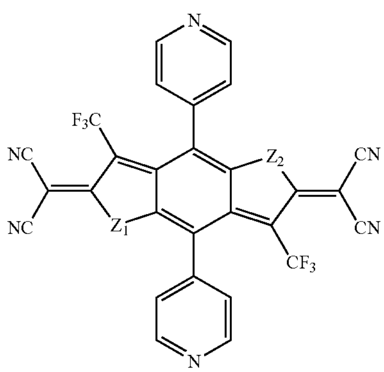

$Z_1$=$Z_1$=O Compound O-205
$Z_1$=$Z_2$=S Compound S-205
$Z_1$=$Z_2$=Se Compound Se-205

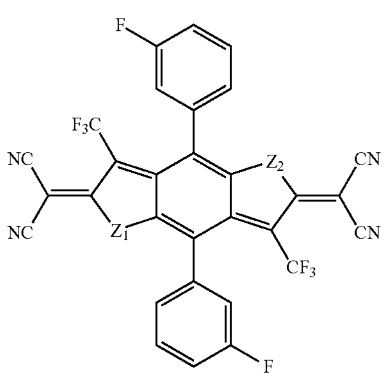

$Z_1$=$Z_1$=O Compound O-206
$Z_1$=$Z_2$=S Compound S-206
$Z_1$=$Z_2$=Se Compound Se-206

-continued

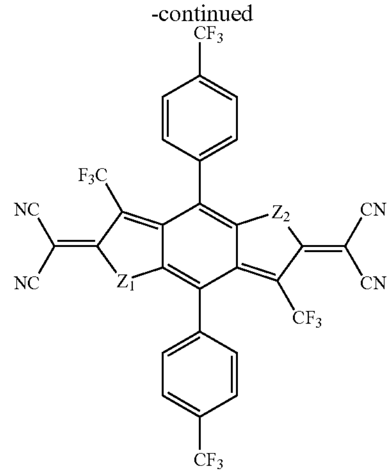

$Z_1$=$Z_1$=O Compound O-207
$Z_1$=$Z_2$=S Compound S-207
$Z_1$=$Z_2$=Se Compound Se-207

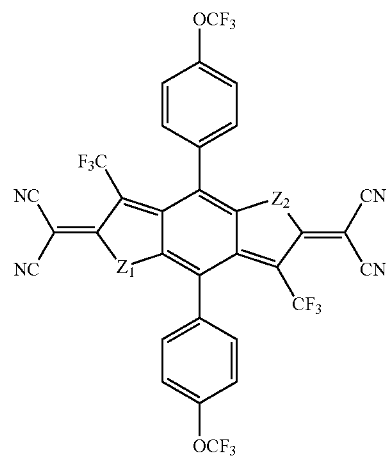

$Z_1$=$Z_1$=O Compound O-208
$Z_1$=$Z_2$=S Compound S-208
$Z_1$=$Z_2$=Se Compound Se-208

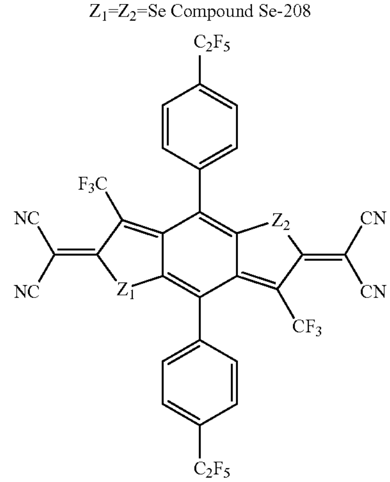

$Z_1$=$Z_1$=O Compound O-209
$Z_1$=$Z_2$=S Compound S-209
$Z_1$=$Z_2$=Se Compound Se-209

-continued

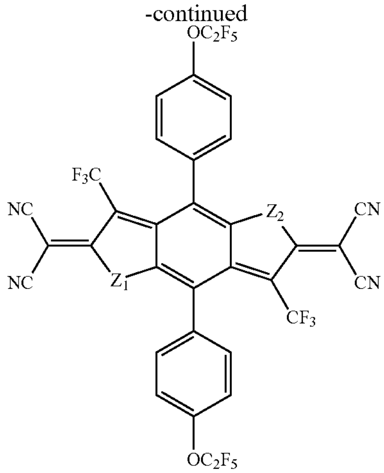

$Z_1$=$Z_1$=O Compound O-210
$Z_1$=$Z_2$=S Compound S-210
$Z_1$=$Z_2$=Se Compound Se-210

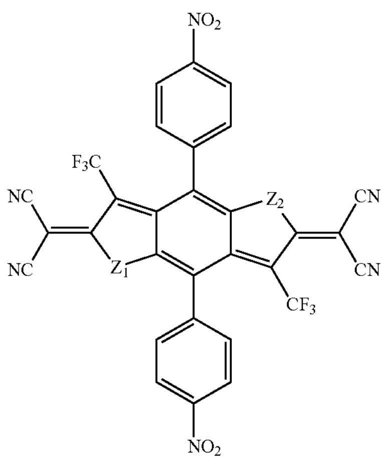

$Z_1$=$Z_1$=O Compound O-211
$Z_1$=$Z_2$=S Compound S-211
$Z_1$=$Z_2$=Se Compound Se-211

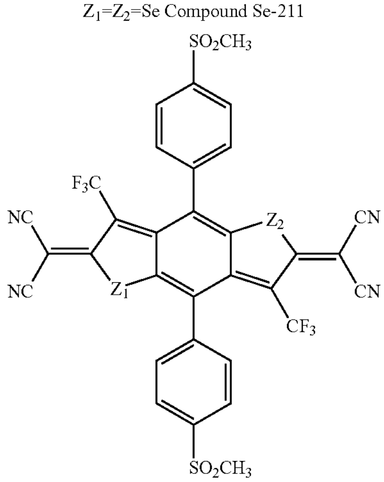

$Z_1$=$Z_1$=O Compound O-212
$Z_1$=$Z_2$=S Compound S-212
$Z_1$=$Z_2$=Se Compound Se-212

-continued

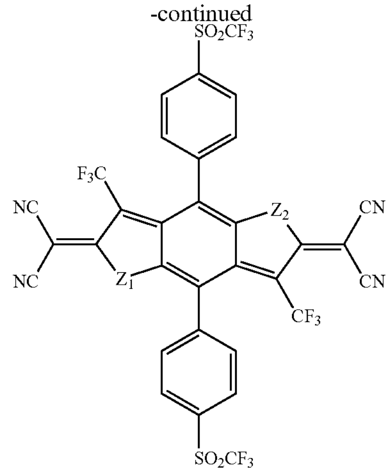

$Z_1$=$Z_1$=O Compound O-213
$Z_1$=$Z_2$=S Compound S-213
$Z_1$=$Z_2$=Se Compound Se-213

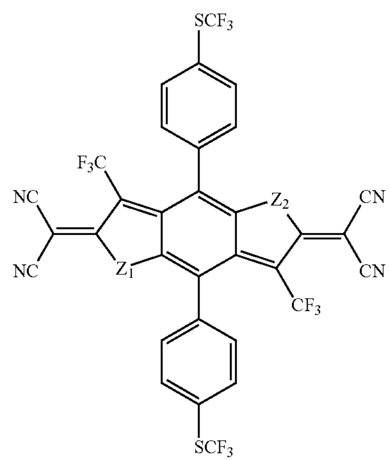

$Z_1$=$Z_1$=O Compound O-214
$Z_1$=$Z_2$=S Compound S-214
$Z_1$=$Z_2$=Se Compound Se-214

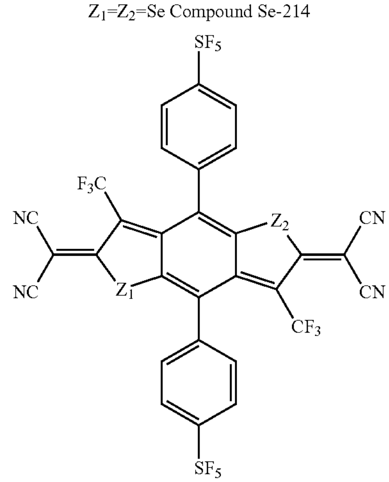

$Z_1$=$Z_1$=O Compound O-215
$Z_1$=$Z_2$=S Compound S-215
$Z_1$=$Z_2$=Se Compound Se-215

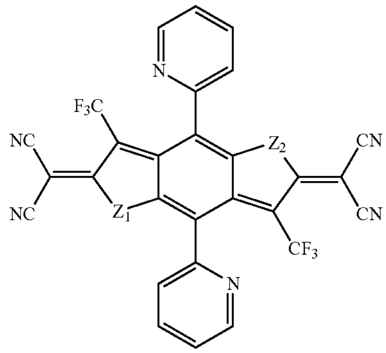

$Z_1$=$Z_1$=O Compound O-216
$Z_1$=$Z_2$=S Compound S-216
$Z_1$=$Z_2$=Se Compound Se-216

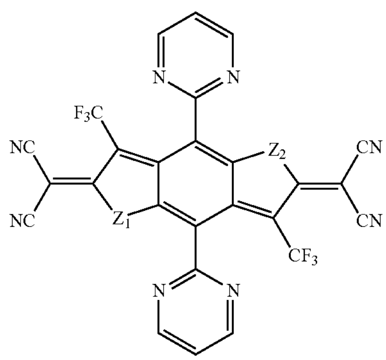

$Z_1$=$Z_1$=O Compound O-217
$Z_1$=$Z_2$=S Compound S-217
$Z_1$=$Z_2$=Se Compound Se-217

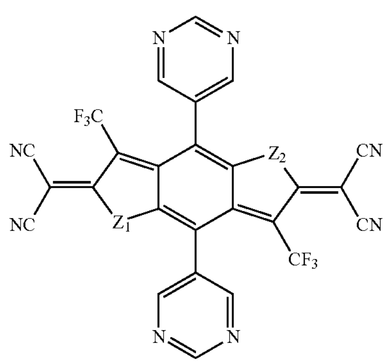

$Z_1$=$Z_1$=O Compound O-218
$Z_1$=$Z_2$=S Compound S-218
$Z_1$=$Z_2$=Se Compound Se-218

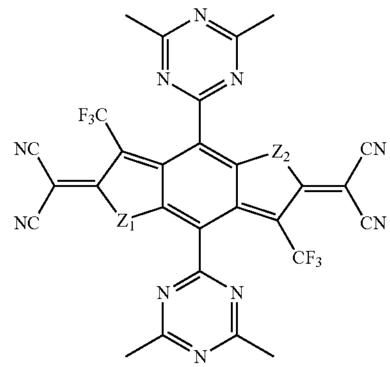

$Z_1$=$Z_1$=O Compound O-219
$Z_1$=$Z_2$=S Compound S-219
$Z_1$=$Z_2$=Se Compound Se-219

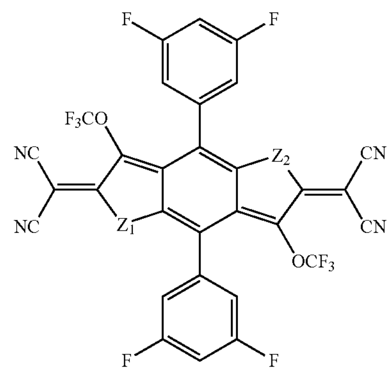

$Z_1$=$Z_1$=O Compound O-220
$Z_1$=$Z_2$=S Compound S-220
$Z_1$=$Z_2$=Se Compound Se-220

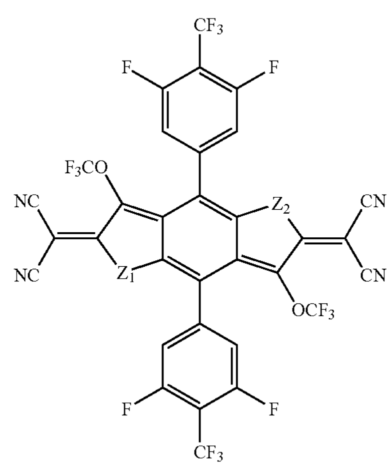

$Z_1$=$Z_1$=O Compound O-221
$Z_1$=$Z_2$=S Compound S-221
$Z_1$=$Z_2$=Se Compound Se-221

-continued

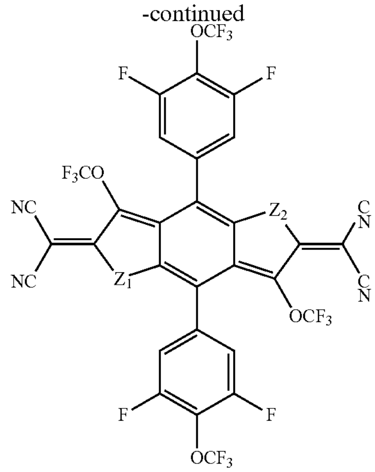

$Z_1$=$Z_1$=O Compound O-222
$Z_1$=$Z_2$=S Compound S-222
$Z_1$=$Z_2$=Se Compound Se-222

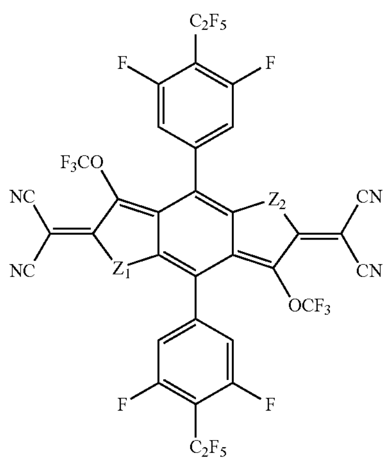

$Z_1$=$Z_1$=O Compound O-223
$Z_1$=$Z_2$=S Compound S-223
$Z_1$=$Z_2$=Se Compound Se-223

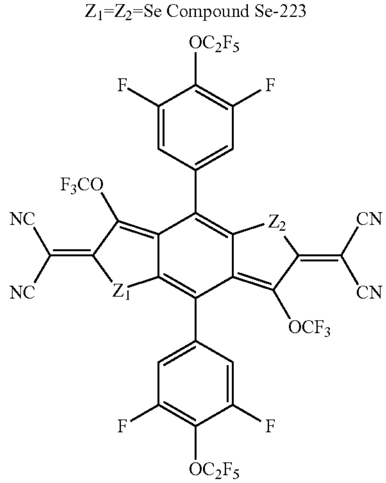

$Z_1$=$Z_1$=O Compound O-224
$Z_1$=$Z_2$=S Compound S-224
$Z_1$=$Z_2$=Se Compound Se-224

-continued

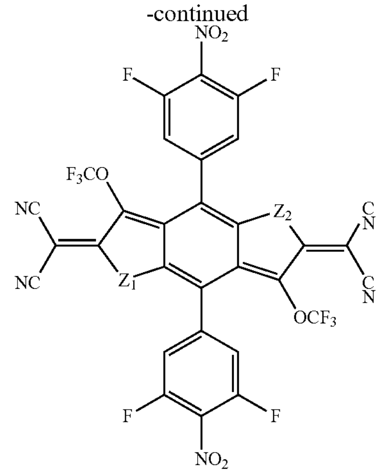

$Z_1$=$Z_1$=O Compound O-225
$Z_1$=$Z_2$=S Compound S-225
$Z_1$=$Z_2$=Se Compound Se-225

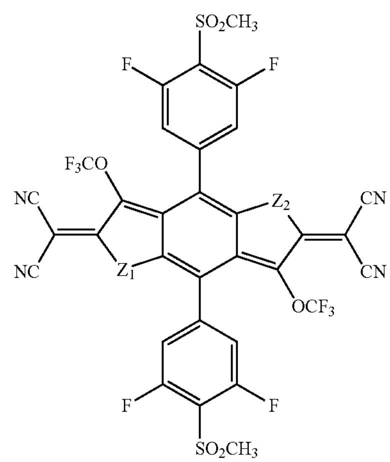

$Z_1$=$Z_1$=O Compound O-226
$Z_1$=$Z_2$=S Compound S-226
$Z_1$=$Z_2$=Se Compound Se-226

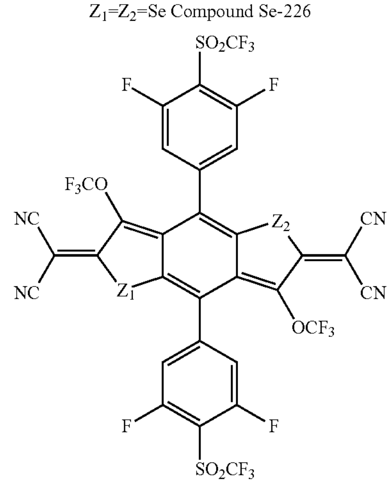

$Z_1$=$Z_1$=O Compound O-227
$Z_1$=$Z_2$=S Compound S-227
$Z_1$=$Z_2$=Se Compound Se-227

-continued

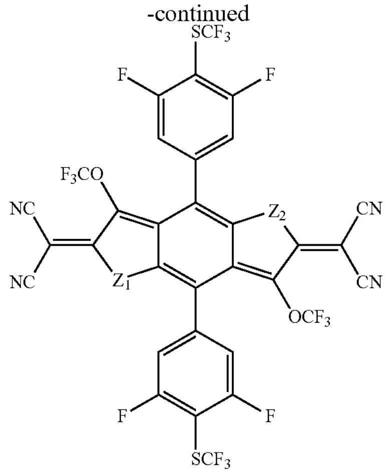

$Z_1$=$Z_1$=O Compound O-228
$Z_1$=$Z_2$=S Compound S-228
$Z_1$=$Z_2$=Se Compound Se-228

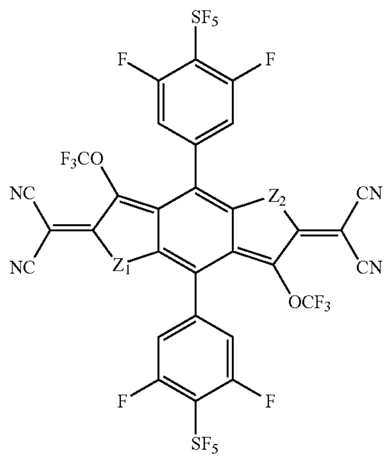

$Z_1$=$Z_1$=O Compound O-229
$Z_1$=$Z_2$=S Compound S-229
$Z_1$=$Z_2$=Se Compound Se-229

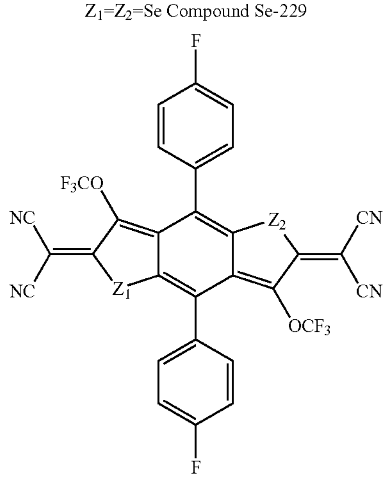

$Z_1$=$Z_1$=O Compound O-230
$Z_1$=$Z_2$=S Compound S-230
$Z_1$=$Z_2$=Se Compound Se-230

-continued

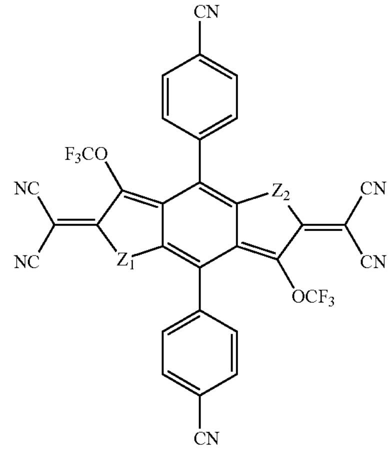

$Z_1$=$Z_1$=O Compound O-231
$Z_1$=$Z_2$=S Compound S-231
$Z_1$=$Z_2$=Se Compound Se-231

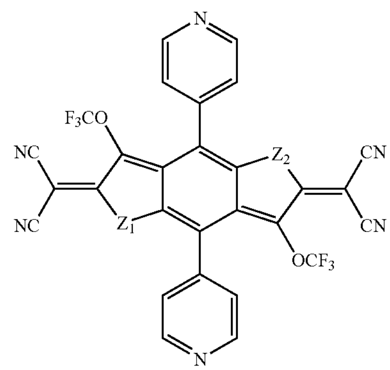

$Z_1$=$Z_1$=O Compound O-232
$Z_1$=$Z_2$=S Compound S-232
$Z_1$=$Z_2$=Se Compound Se-232

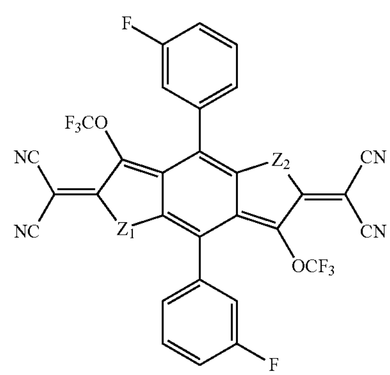

$Z_1$=$Z_1$=O Compound O-233
$Z_1$=$Z_2$=S Compound S-233
$Z_1$=$Z_2$=Se Compound Se-233

-continued

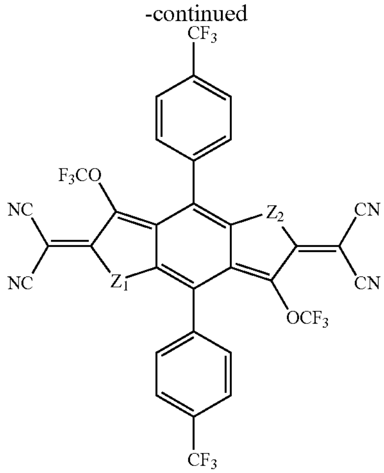

$Z_1$=$Z_1$=O Compound O-234
$Z_1$=$Z_2$=S Compound S-234
$Z_1$=$Z_2$=Se Compound Se-234

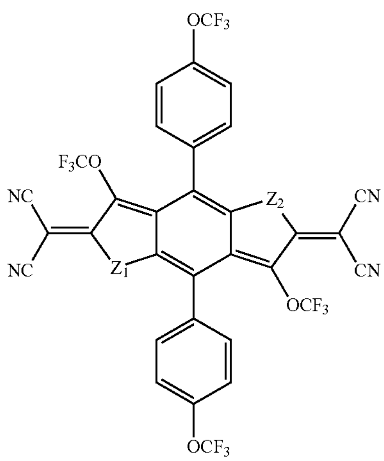

$Z_1$=$Z_1$=O Compound O-235
$Z_1$=$Z_2$=S Compound S-235
$Z_1$=$Z_2$=Se Compound Se-235

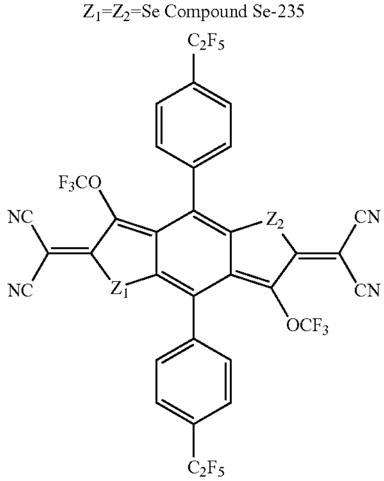

$Z_1$=$Z_1$=O Compound O-236
$Z_1$=$Z_2$=S Compound S-236
$Z_1$=$Z_2$=Se Compound Se-236

-continued

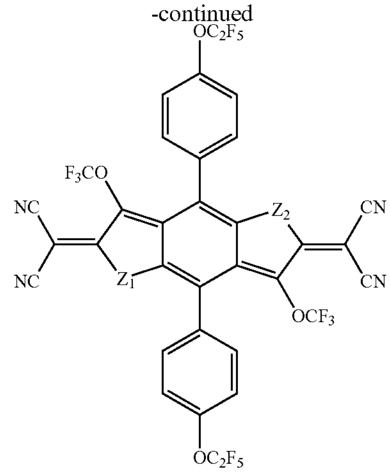

$Z_1$=$Z_1$=O Compound O-237
$Z_1$=$Z_2$=S Compound S-237
$Z_1$=$Z_2$=Se Compound Se-237

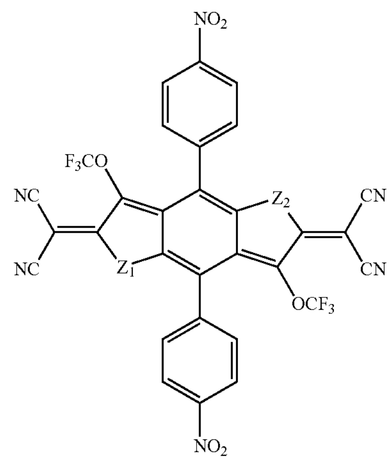

$Z_1$=$Z_1$=O Compound O-238
$Z_1$=$Z_2$=S Compound S-238
$Z_1$=$Z_2$=Se Compound Se-238

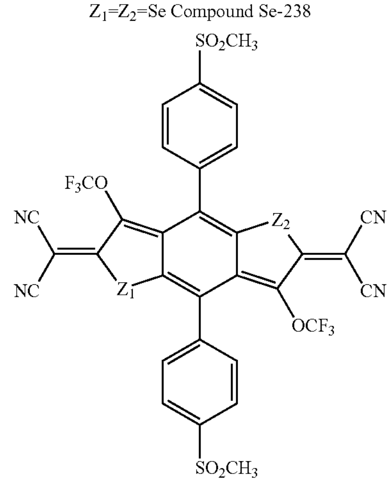

$Z_1$=$Z_1$=O Compound O-239
$Z_1$=$Z_2$=S Compound S-239
$Z_1$=$Z_2$=Se Compound Se-239

-continued

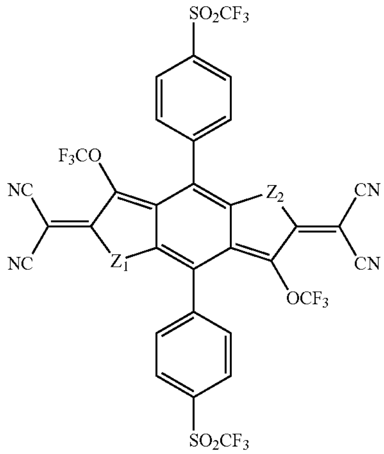

$Z_1$=$Z_1$=O Compound O-240
$Z_1$=$Z_2$=S Compound S-240
$Z_1$=$Z_2$=Se Compound Se-240

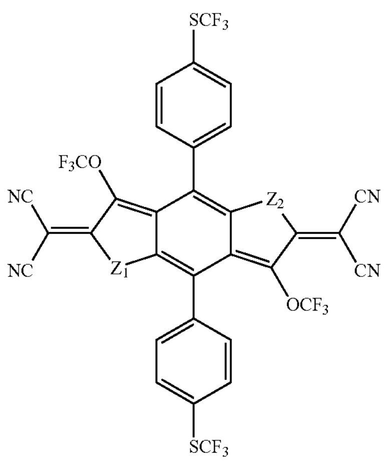

$Z_1$=$Z_1$=O Compound O-241
$Z_1$=$Z_2$=S Compound S-241
$Z_1$=$Z_2$=Se Compound Se-241

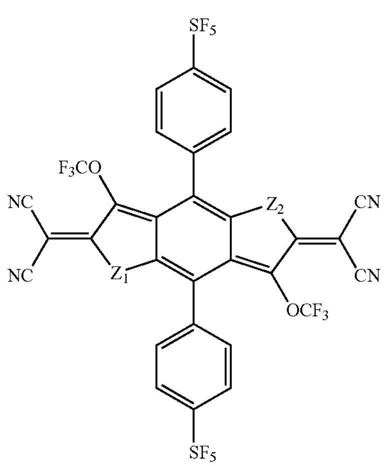

$Z_1$=$Z_1$=O Compound O-242
$Z_1$=$Z_2$=S Compound S-242
$Z_1$=$Z_2$=Se Compound Se-242

-continued

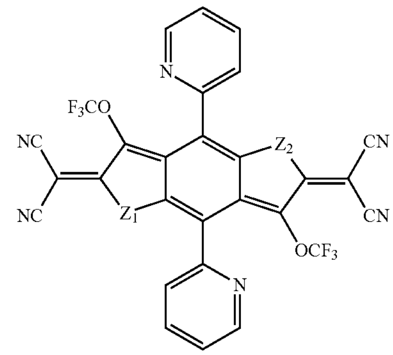

$Z_1$=$Z_1$=O Compound O-243
$Z_1$=$Z_2$=S Compound S-243
$Z_1$=$Z_2$=Se Compound Se-243

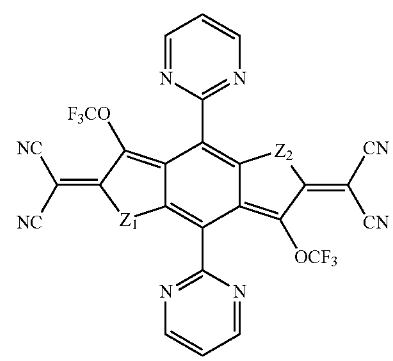

$Z_1$=$Z_1$=O Compound O-244
$Z_1$=$Z_2$=S Compound S-244
$Z_1$=$Z_2$=Se Compound Se-244

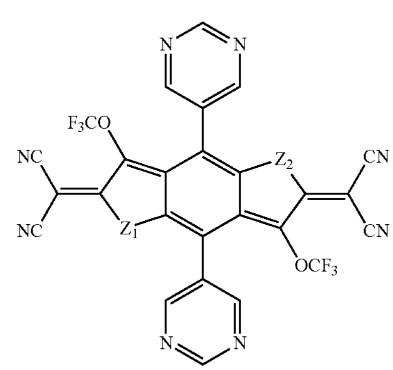

$Z_1$=$Z_1$=O Compound O-245
$Z_1$=$Z_2$=S Compound S-245
$Z_1$=$Z_2$=Se Compound Se-245

-continued

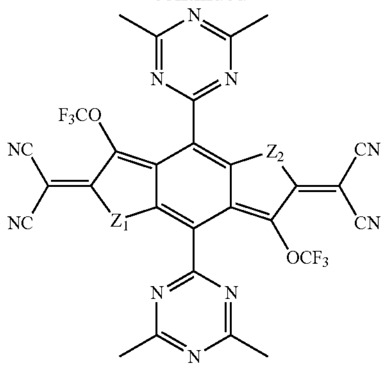

$Z_1=Z_1=O$ Compound O-246
$Z_1=Z_2=S$ Compound S-246
$Z_1=Z_2=Se$ Compound Se-246

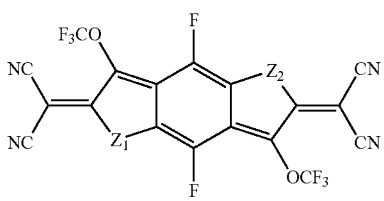

$Z_1=Z_1=O$ Compound O-247
$Z_1=Z_2=S$ Compound S-247
$Z_1=Z_2=Se$ Compound Se-247

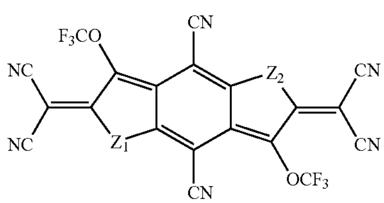

$Z_1=Z_1=O$ Compound O-248
$Z_1=Z_2=S$ Compound S-248
$Z_1=Z_2=Se$ Compound Se-248

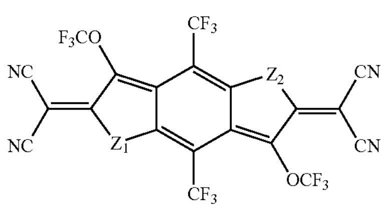

$Z_1=Z_1=O$ Compound O-249
$Z_1=Z_2=S$ Compound S-249
$Z_1=Z_2=Se$ Compound Se-249

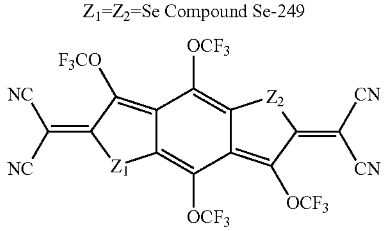

$Z_1=Z_1=O$ Compound O-250
$Z_1=Z_2=S$ Compound S-250
$Z_1=Z_2=Se$ Compound Se-250

-continued

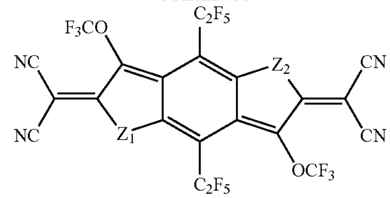

$Z_1=Z_1=O$ Compound O-251
$Z_1=Z_2=S$ Compound S-251
$Z_1=Z_2=Se$ Compound Se-251

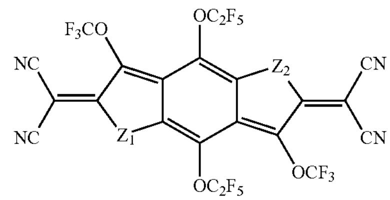

$Z_1=Z_1=O$ Compound O-252
$Z_1=Z_2=S$ Compound S-252
$Z_1=Z_2=Se$ Compound Se-252

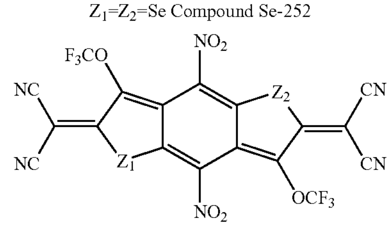

$Z_1=Z_1=O$ Compound O-253
$Z_1=Z_2=S$ Compound S-253
$Z_1=Z_2=Se$ Compound Se-253

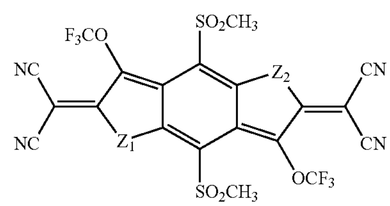

$Z_1=Z_1=O$ Compound O-254
$Z_1=Z_2=S$ Compound S-254
$Z_1=Z_2=Se$ Compound Se-254

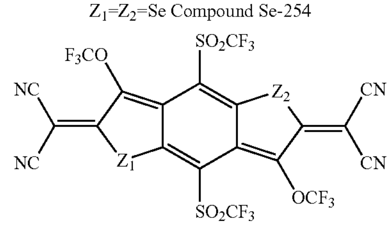

$Z_1=Z_1=O$ Compound O-255
$Z_1=Z_2=S$ Compound S-255
$Z_1=Z_2=Se$ Compound Se-255

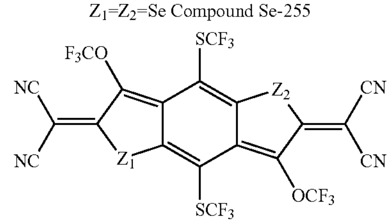

$Z_1=Z_1=O$ Compound O-256
$Z_1=Z_2=S$ Compound S-256
$Z_1=Z_2=Se$ Compound Se-256

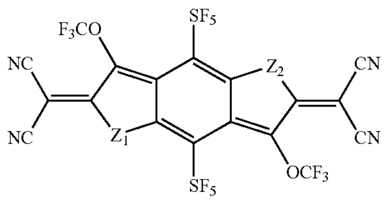

$Z_1$=$Z_1$=O Compound O-257
$Z_1$=$Z_2$=S Compound S-257
$Z_1$=$Z_2$=Se Compound Se-257

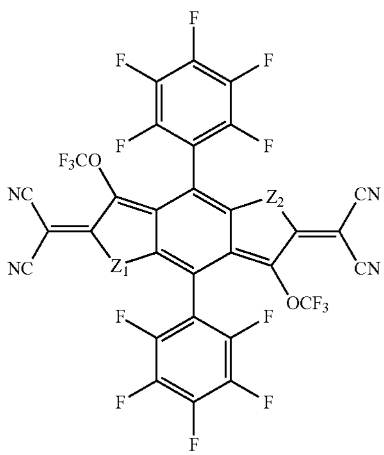

$Z_1$=$Z_1$=O Compound O-258
$Z_1$=$Z_2$=S Compound S-258
$Z_1$=$Z_2$=Se Compound Se-258

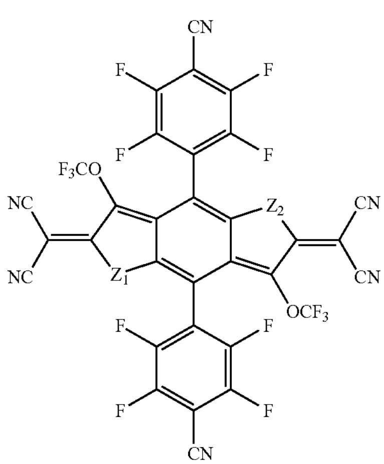

$Z_1$=$Z_1$=O Compound O-259
$Z_1$=$Z_2$=S Compound S-259
$Z_1$=$Z_2$=Se Compound Se-259

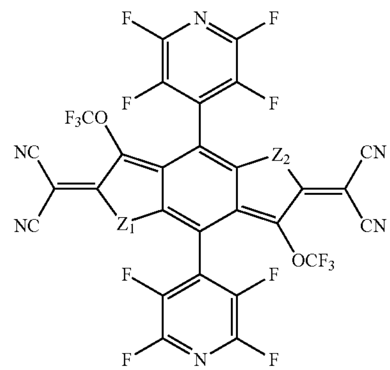

$Z_1$=$Z_1$=O Compound O-260
$Z_1$=$Z_2$=S Compound S-260
$Z_1$=$Z_2$=Se Compound Se-260

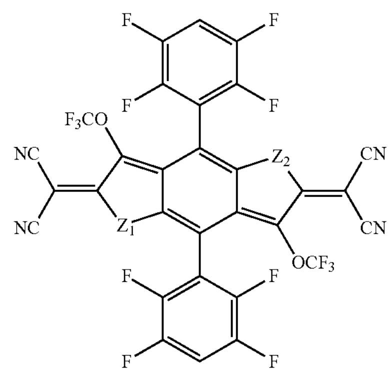

$Z_1$=$Z_1$=O Compound O-261
$Z_1$=$Z_2$=S Compound S-261
$Z_1$=$Z_2$=Se Compound Se-261

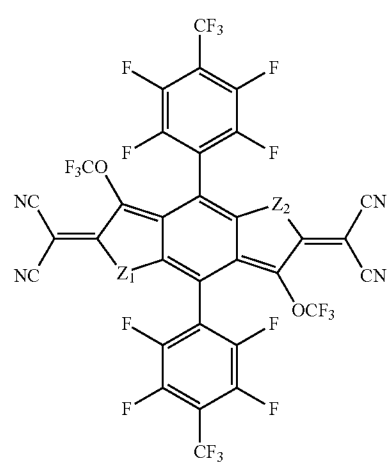

$Z_1$=$Z_1$=O Compound O-262
$Z_1$=$Z_2$=S Compound S-262
$Z_1$=$Z_2$=Se Compound Se-262

-continued

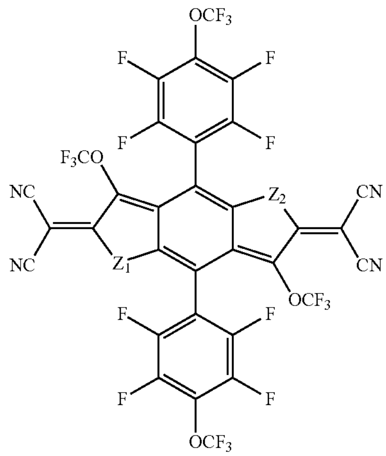

$Z_1$=$Z_1$=O Compound O-263
$Z_1$=$Z_2$=S Compound S-263
$Z_1$=$Z_2$=Se Compound Se-263

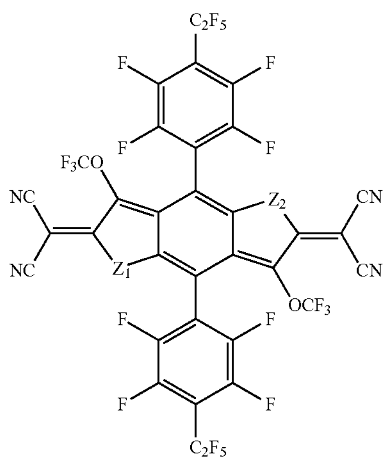

$Z_1$=$Z_1$=O Compound O-264
$Z_1$=$Z_2$=S Compound S-264
$Z_1$=$Z_2$=Se Compound Se-264

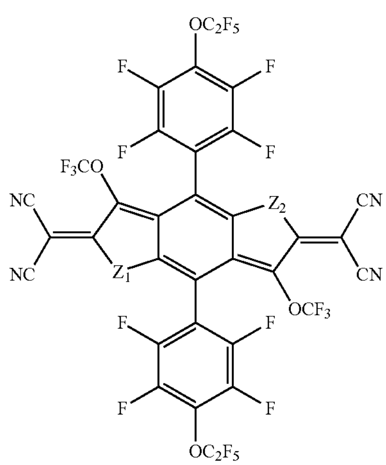

$Z_1$=$Z_1$=O Compound O-265
$Z_1$=$Z_2$=S Compound S-265
$Z_1$=$Z_2$=Se Compound Se-265

-continued

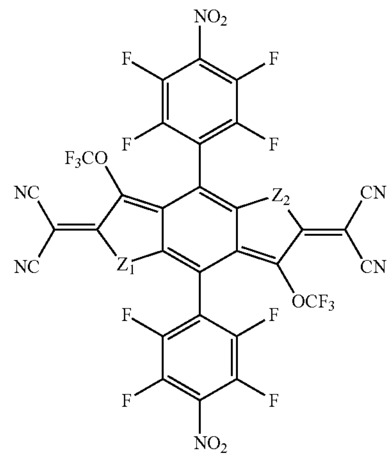

$Z_1$=$Z_1$=O Compound O-266
$Z_1$=$Z_2$=S Compound S-266
$Z_1$=$Z_2$=Se Compound Se-266

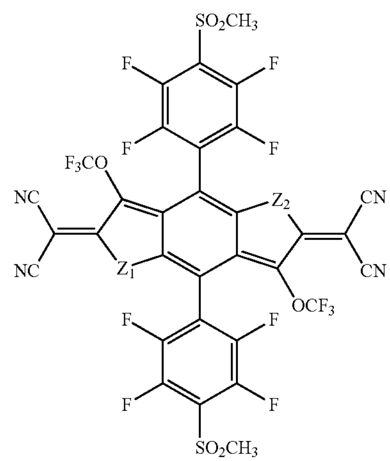

$Z_1$=$Z_1$=O Compound O-267
$Z_1$=$Z_2$=S Compound S-267
$Z_1$=$Z_2$=Se Compound Se-267

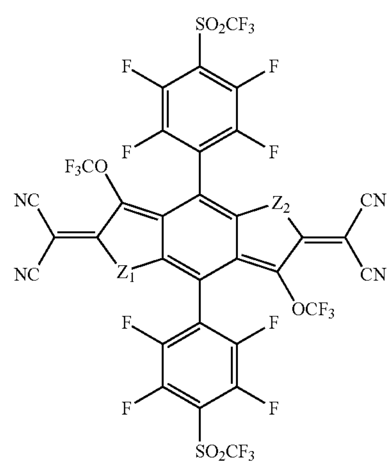

$Z_1$=$Z_1$=O Compound O-268
$Z_1$=$Z_2$=S Compound S-268
$Z_1$=$Z_2$=Se Compound Se-268

-continued

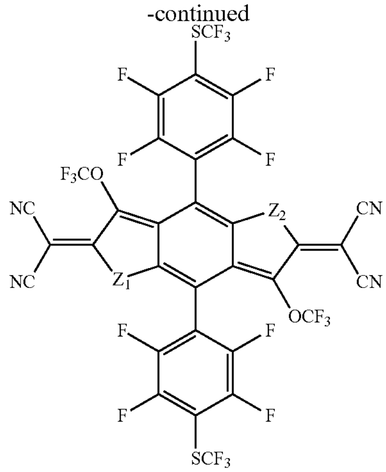

$Z_1$=$Z_1$=O Compound O-269
$Z_1$=$Z_2$=S Compound S-269
$Z_1$=$Z_2$=Se Compound Se-269

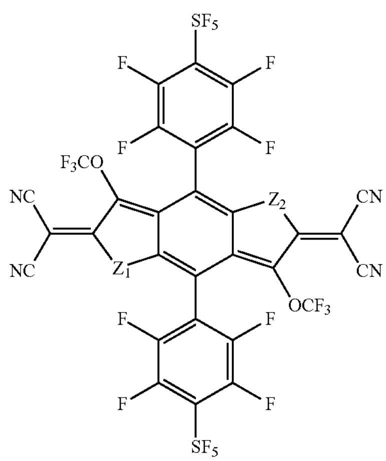

$Z_1$=$Z_1$=O Compound O-270
$Z_1$=$Z_2$=S Compound S-270
$Z_1$=$Z_2$=Se Compound Se-270

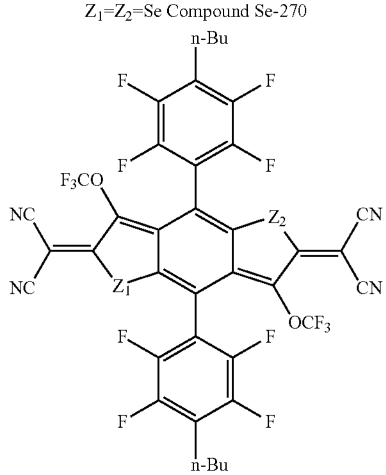

$Z_1$=$Z_1$=O Compound O-271
$Z_1$=$Z_2$=S Compound S-271
$Z_1$=$Z_2$=Se Compound Se-271

-continued

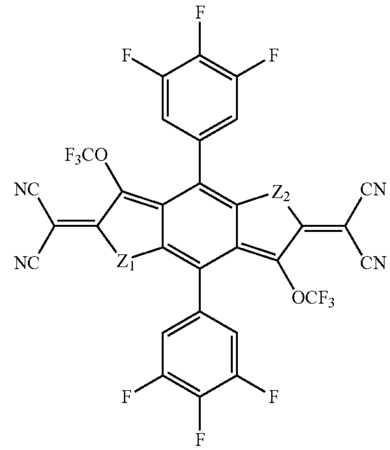

$Z_1$=$Z_1$=O Compound O-272
$Z_1$=$Z_2$=S Compound S-272
$Z_1$=$Z_2$=Se Compound Se-272

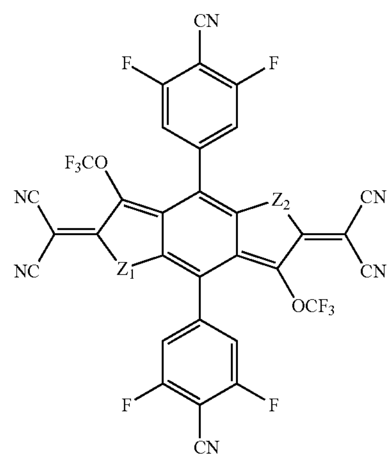

$Z_1$=$Z_1$=O Compound O-273
$Z_1$=$Z_2$=S Compound S-273
$Z_1$=$Z_2$=Se Compound Se-273

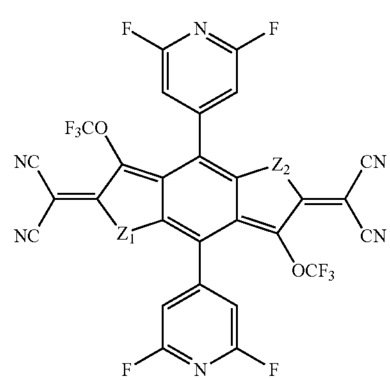

$Z_1$=$Z_1$=O Compound O-274
$Z_1$=$Z_2$=S Compound S-274
$Z_1$=$Z_2$=Se Compound Se-274

-continued

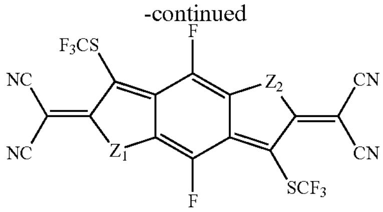

$Z_1$=$Z_1$=O Compound O-275
$Z_1$=$Z_2$=S Compound S-275
$Z_1$=$Z_2$=Se Compound Se-275

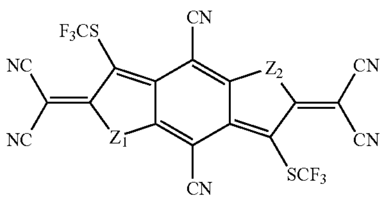

$Z_1$=$Z_1$=O Compound O-276
$Z_1$=$Z_2$=S Compound S-276
$Z_1$=$Z_2$=Se Compound Se-276

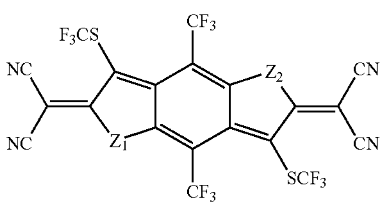

$Z_1$=$Z_1$=O Compound O-277
$Z_1$=$Z_2$=S Compound S-277
$Z_1$=$Z_2$=Se Compound Se-277

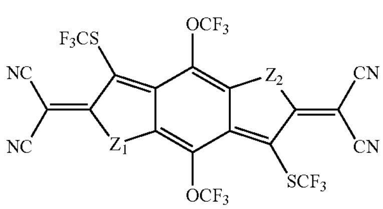

$Z_1$=$Z_1$=O Compound O-278
$Z_1$=$Z_2$=S Compound S-278
$Z_1$=$Z_2$=Se Compound Se-278

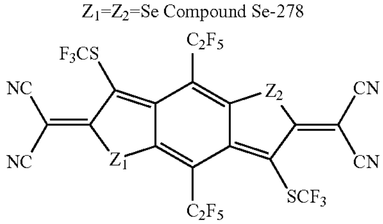

$Z_1$=$Z_1$=O Compound O-279
$Z_1$=$Z_2$=S Compound S-279
$Z_1$=$Z_2$=Se Compound Se-279

-continued

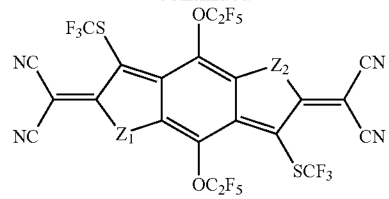

$Z_1$=$Z_1$=O Compound O-280
$Z_1$=$Z_2$=S Compound S-280
$Z_1$=$Z_2$=Se Compound Se-280

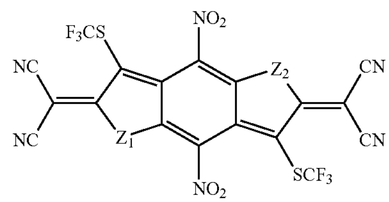

$Z_1$=$Z_1$=O Compound O-281
$Z_1$=$Z_2$=S Compound S-281
$Z_1$=$Z_2$=Se Compound Se-281

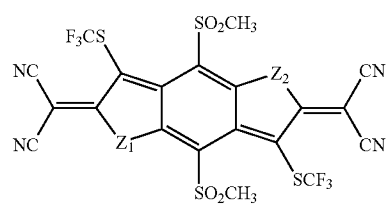

$Z_1$=$Z_1$=O Compound O-282
$Z_1$=$Z_2$=S Compound S-282
$Z_1$=$Z_2$=Se Compound Se-282

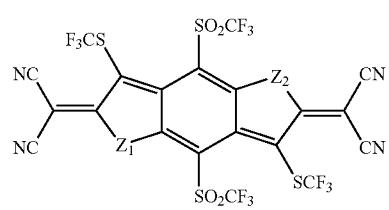

$Z_1$=$Z_1$=O Compound O-283
$Z_1$=$Z_2$=S Compound S-283
$Z_1$=$Z_2$=Se Compound Se-283

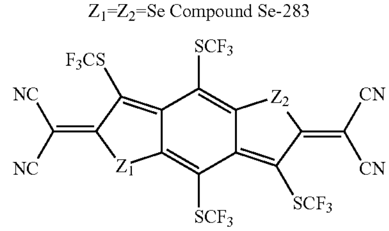

$Z_1$=$Z_1$=O Compound O-284
$Z_1$=$Z_2$=S Compound S-284
$Z_1$=$Z_2$=Se Compound Se-284

-continued

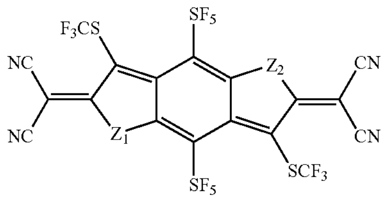

$Z_1$=$Z_1$=O Compound O-285
$Z_1$=$Z_2$=S Compound S-285
$Z_1$=$Z_2$=Se Compound Se-285

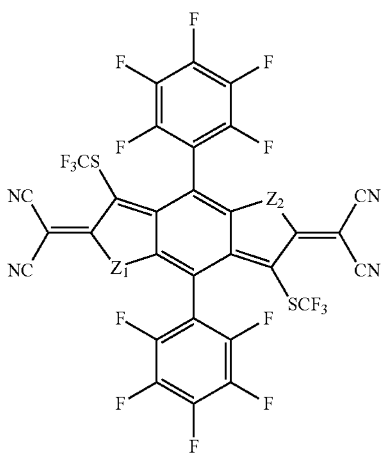

$Z_1$=$Z_1$=O Compound O-286
$Z_1$=$Z_2$=S Compound S-286
$Z_1$=$Z_2$=Se Compound Se-286

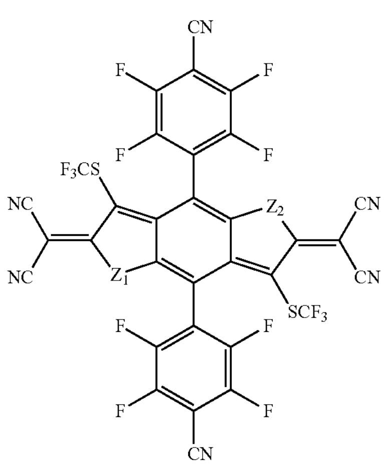

$Z_1$=$Z_1$=O Compound O-287
$Z_1$=$Z_2$=S Compound S-287
$Z_1$=$Z_2$=Se Compound Se-287

-continued

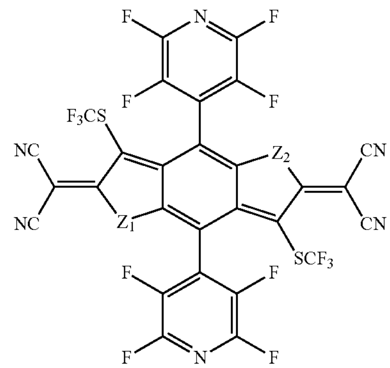

$Z_1$=$Z_1$=O Compound O-288
$Z_1$=$Z_2$=S Compound S-288
$Z_1$=$Z_2$=Se Compound Se-288

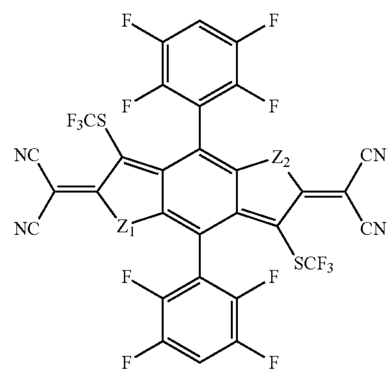

$Z_1$=$Z_1$=O Compound O-289
$Z_1$=$Z_2$=S Compound S-289
$Z_1$=$Z_2$=Se Compound Se-289

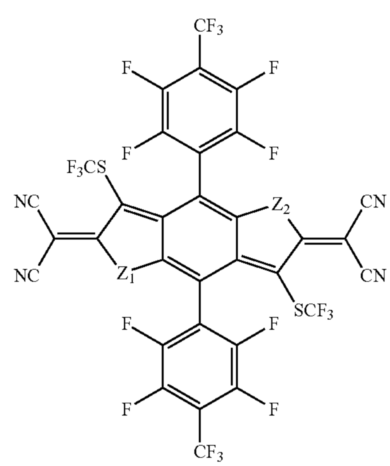

$Z_1$=$Z_1$=O Compound O-290
$Z_1$=$Z_2$=S Compound S-290
$Z_1$=$Z_2$=Se Compound Se-290

-continued

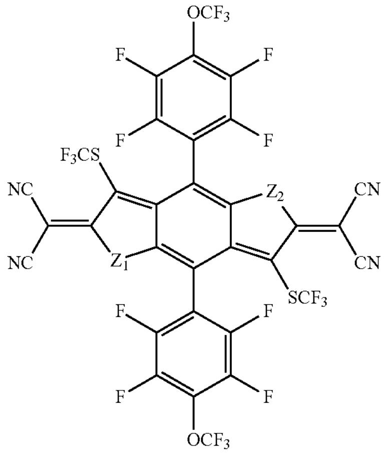

$Z_1$=$Z_1$=O Compound O-291
$Z_1$=$Z_2$=S Compound S-291
$Z_1$=$Z_2$=Se Compound Se-291

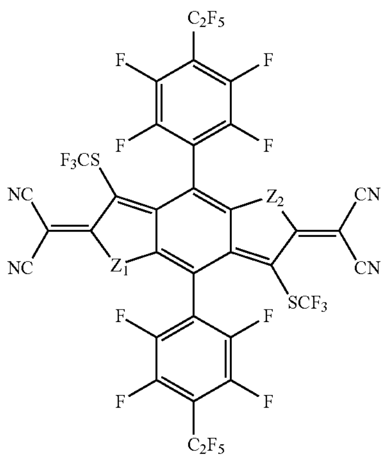

$Z_1$=$Z_1$=O Compound O-292
$Z_1$=$Z_2$=S Compound S-292
$Z_1$=$Z_2$=Se Compound Se-292

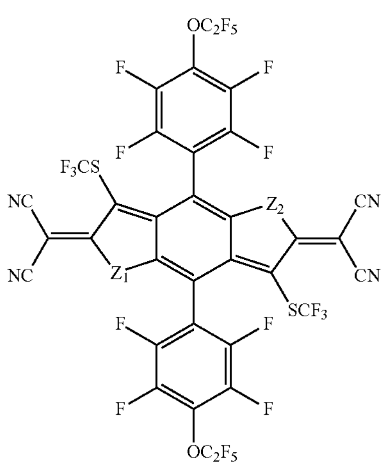

$Z_1$=$Z_1$=O Compound O-293
$Z_1$=$Z_2$=S Compound S-293
$Z_1$=$Z_2$=Se Compound Se-293

-continued

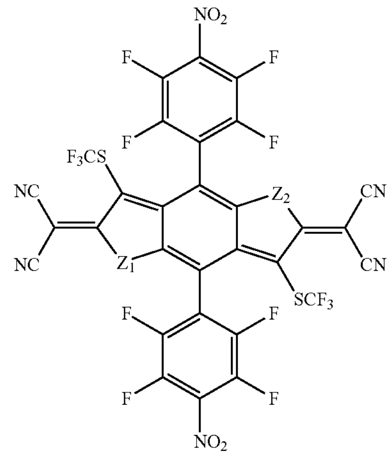

$Z_1$=$Z_1$=O Compound O-294
$Z_1$=$Z_2$=S Compound S-294
$Z_1$=$Z_2$=Se Compound Se-294

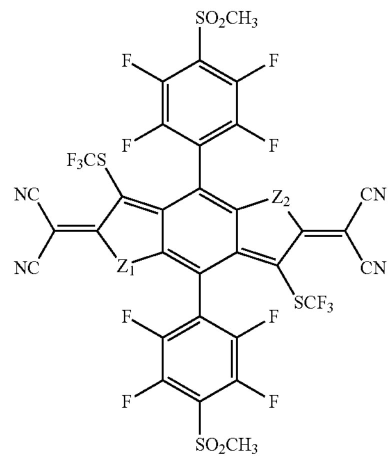

$Z_1$=$Z_1$=O Compound O-295
$Z_1$=$Z_2$=S Compound S-295
$Z_1$=$Z_2$=Se Compound Se-295

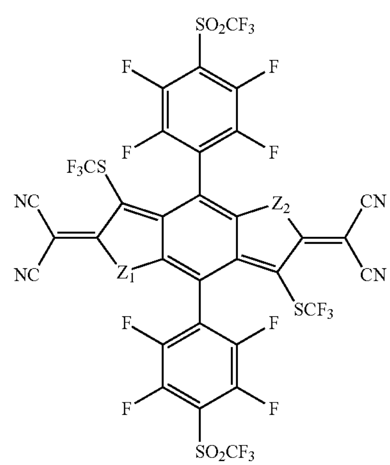

$Z_1$=$Z_1$=O Compound O-296
$Z_1$=$Z_2$=S Compound S-296
$Z_1$=$Z_2$=Se Compound Se-296

-continued

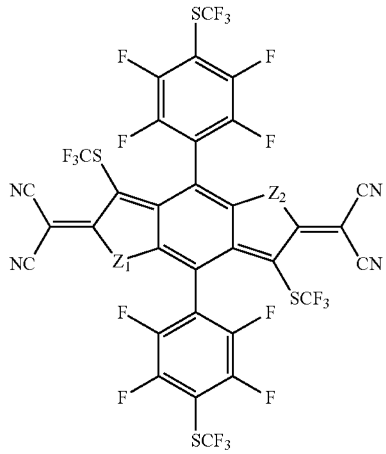

$Z_1$=$Z_1$=O Compound O-297
$Z_1$=$Z_2$=S Compound S-297
$Z_1$=$Z_2$=Se Compound Se-297

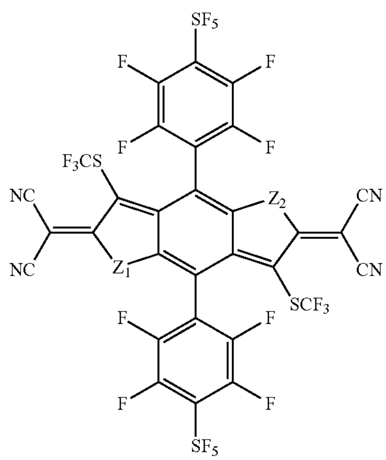

$Z_1$=$Z_1$=O Compound O-298
$Z_1$=$Z_2$=S Compound S-298
$Z_1$=$Z_2$=Se Compound Se-298

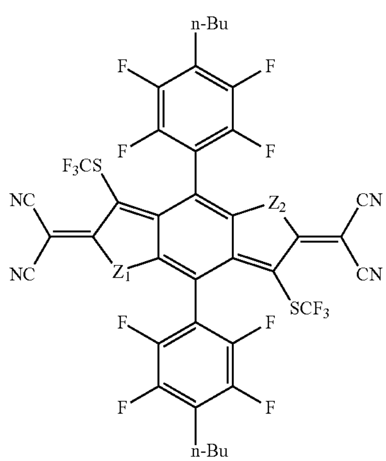

$Z_1$=$Z_1$=O Compound O-299
$Z_1$=$Z_2$=S Compound S-299
$Z_1$=$Z_2$=Se Compound Se-299

-continued

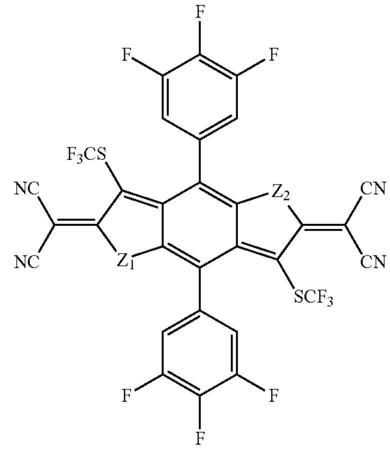

$Z_1$=$Z_1$=O Compound O-300
$Z_1$=$Z_2$=S Compound S-300
$Z_1$=$Z_2$=Se Compound Se-300

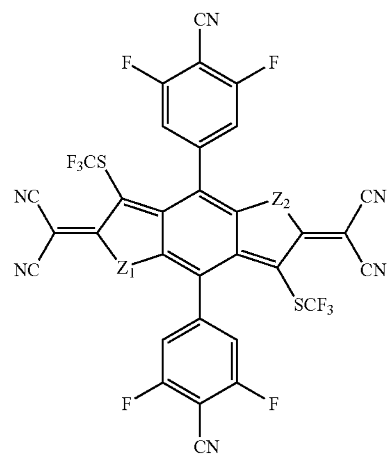

$Z_1$=$Z_1$=O Compound O-301
$Z_1$=$Z_2$=S Compound S-301
$Z_1$=$Z_2$=Se Compound Se-301

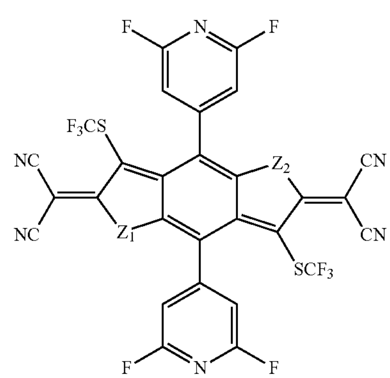

$Z_1$=$Z_1$=O Compound O-302
$Z_1$=$Z_2$=S Compound S-302
$Z_1$=$Z_2$=Se Compound Se-302

-continued

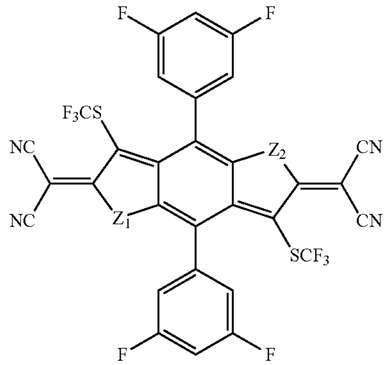

$Z_1$=$Z_1$=O Compound O-303
$Z_1$=$Z_2$=S Compound S-303
$Z_1$=$Z_2$=Se Compound Se-303

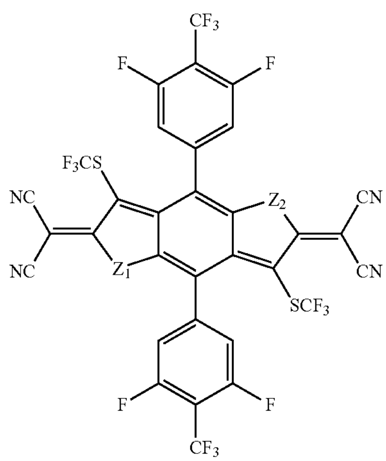

$Z_1$=$Z_1$=O Compound O-304
$Z_1$=$Z_2$=S Compound S-304
$Z_1$=$Z_2$=Se Compound Se-304

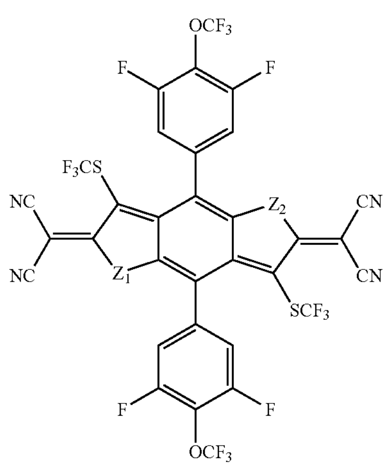

$Z_1$=$Z_1$=O Compound O-305
$Z_1$=$Z_2$=S Compound S-305
$Z_1$=$Z_2$=Se Compound Se-305

-continued

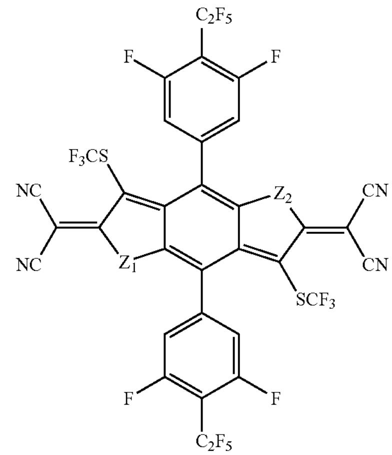

$Z_1$=$Z_1$=O Compound O-306
$Z_1$=$Z_2$=S Compound S-306
$Z_1$=$Z_2$=Se Compound Se-306

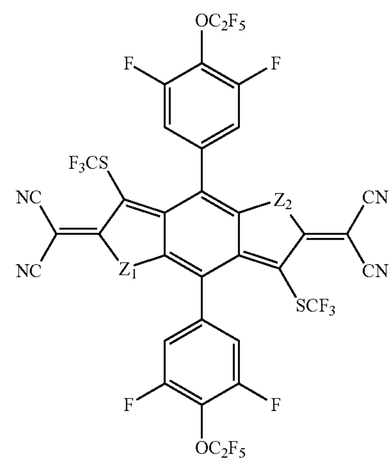

$Z_1$=$Z_1$=O Compound O-307
$Z_1$=$Z_2$=S Compound S-307
$Z_1$=$Z_2$=Se Compound Se-307

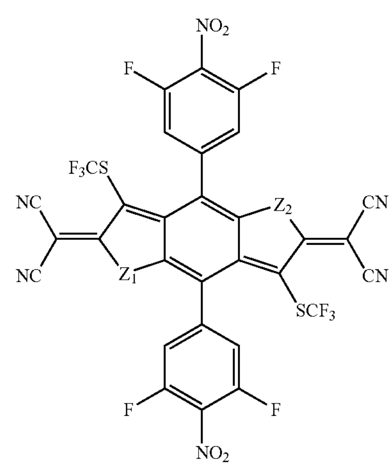

$Z_1$=$Z_1$=O Compound O-308
$Z_1$=$Z_2$=S Compound S-308
$Z_1$=$Z_2$=Se Compound Se-308

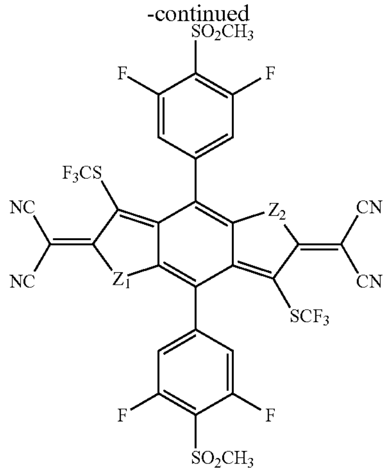

$Z_1$=$Z_1$=O Compound O-309
$Z_1$=$Z_2$=S Compound S-309
$Z_1$=$Z_2$=Se Compound Se-309

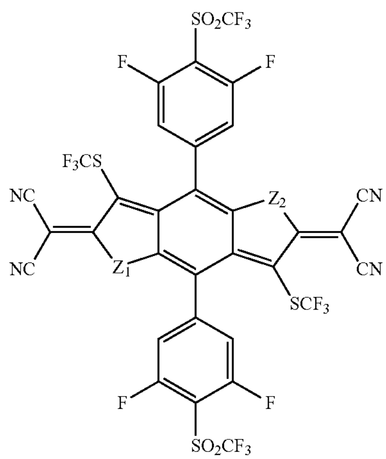

$Z_1$=$Z_1$=O Compound O-310
$Z_1$=$Z_2$=S Compound S-310
$Z_1$=$Z_2$=Se Compound Se-310

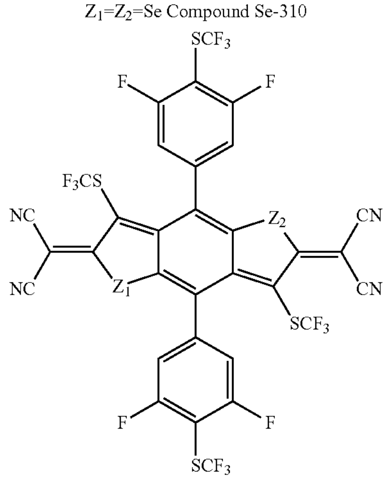

$Z_1$=$Z_1$=O Compound O-311
$Z_1$=$Z_2$=S Compound S-311
$Z_1$=$Z_2$=Se Compound Se-311

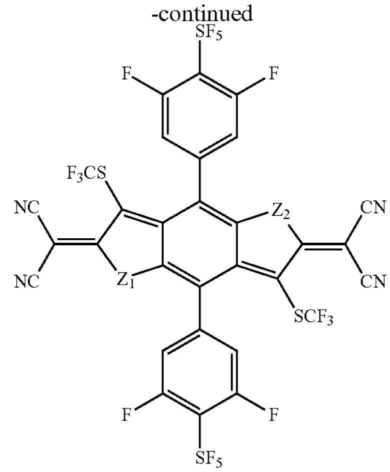

$Z_1$=$Z_1$=O Compound O-312
$Z_1$=$Z_2$=S Compound S-312
$Z_1$=$Z_2$=Se Compound Se-312

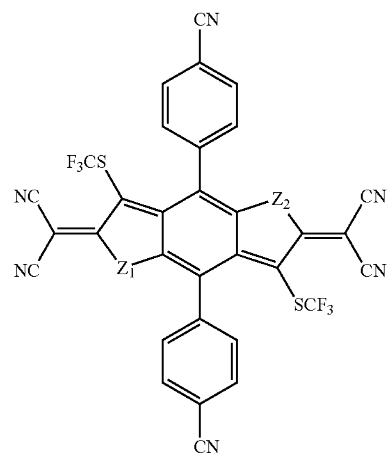

$Z_1$=$Z_1$=O Compound O-313
$Z_1$=$Z_2$=S Compound S-313
$Z_1$=$Z_2$=Se Compound Se-313

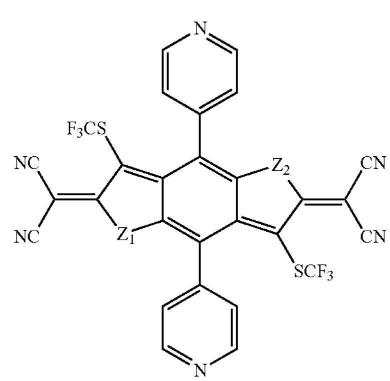

$Z_1$=$Z_1$=O Compound O-314
$Z_1$=$Z_2$=S Compound S-314
$Z_1$=$Z_2$=Se Compound Se-314

-continued

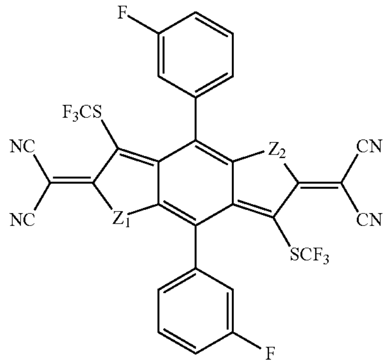

$Z_1$=$Z_1$=O Compound O-315
$Z_1$=$Z_2$=S Compound S-315
$Z_1$=$Z_2$=Se Compound Se-315

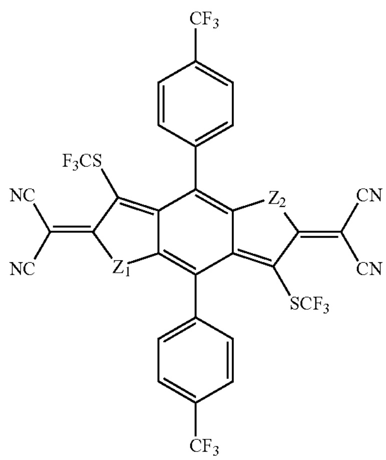

$Z_1$=$Z_1$=O Compound O-316
$Z_1$=$Z_2$=S Compound S-316
$Z_1$=$Z_2$=Se Compound Se-316

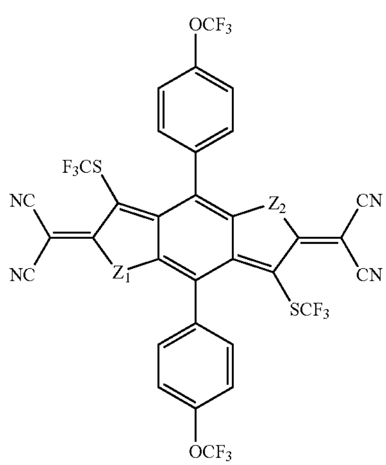

$Z_1$=$Z_1$=O Compound O-317
$Z_1$=$Z_2$=S Compound S-317
$Z_1$=$Z_2$=Se Compound Se-317

-continued

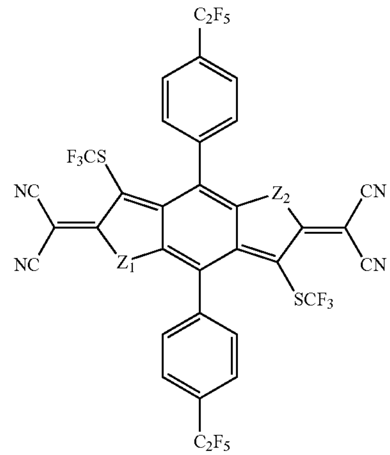

$Z_1$=$Z_1$=O Compound O-318
$Z_1$=$Z_2$=S Compound S-318
$Z_1$=$Z_2$=Se Compound Se-318

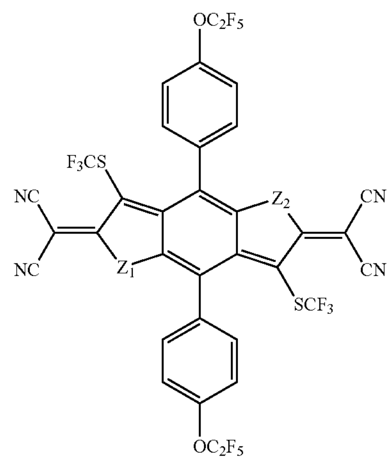

$Z_1$=$Z_1$=O Compound O-319
$Z_1$=$Z_2$=S Compound S-319
$Z_1$=$Z_2$=Se Compound Se-319

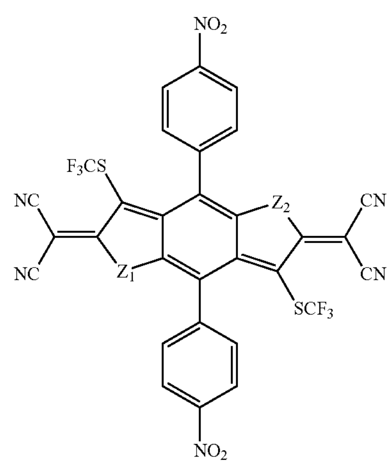

$Z_1$=$Z_1$=O Compound O-320
$Z_1$=$Z_2$=S Compound S-320
$Z_1$=$Z_2$=Se Compound Se-320

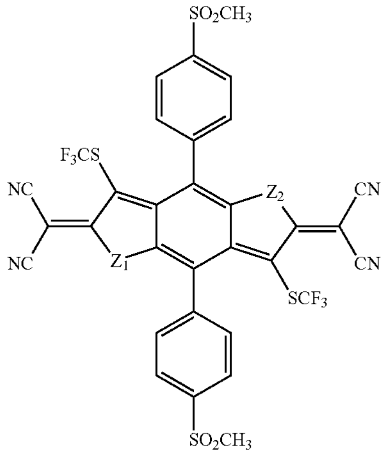

$Z_1$=$Z_1$=O Compound O-321
$Z_1$=$Z_2$=S Compound S-321
$Z_1$=$Z_2$=Se Compound Se-321

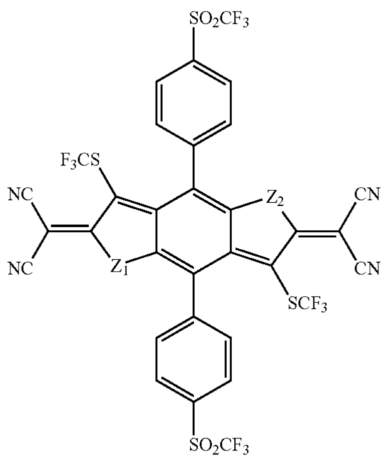

$Z_1$=$Z_1$=O Compound O-322
$Z_1$=$Z_2$=S Compound S-322
$Z_1$=$Z_2$=Se Compound Se-322

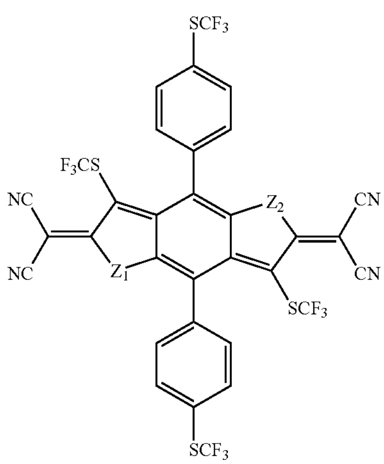

$Z_1$=$Z_1$=O Compound O-323
$Z_1$=$Z_2$=S Compound S-323
$Z_1$=$Z_2$=Se Compound Se-323

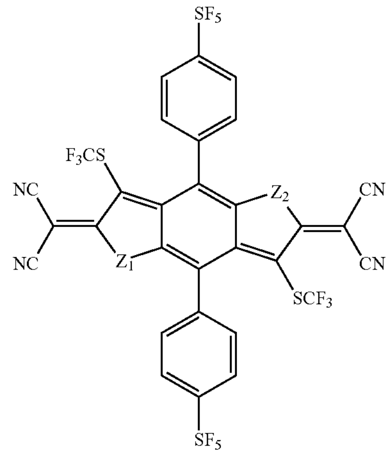

$Z_1$=$Z_1$=O Compound O-324
$Z_1$=$Z_2$=S Compound S-324
$Z_1$=$Z_2$=Se Compound Se-324

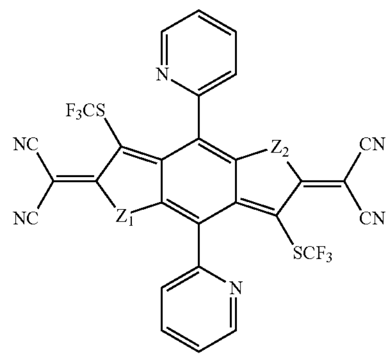

$Z_1$=$Z_1$=O Compound O-325
$Z_1$=$Z_2$=S Compound S-325
$Z_1$=$Z_2$=Se Compound Se-325

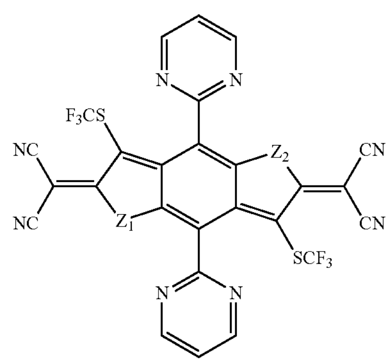

$Z_1$=$Z_1$=O Compound O-326
$Z_1$=$Z_2$=S Compound S-326
$Z_1$=$Z_2$=Se Compound Se-326

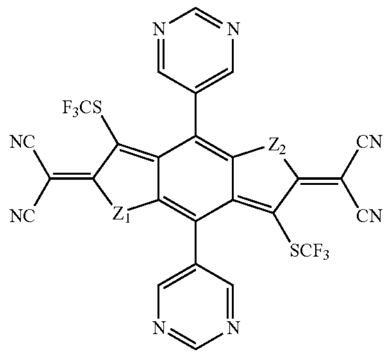

$Z_1$=$Z_1$=O Compound O-327
$Z_1$=$Z_2$=S Compound S-327
$Z_1$=$Z_2$=Se Compound Se-327

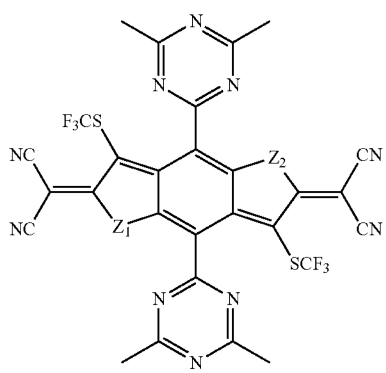

$Z_1$=$Z_1$=O Compound O-328
$Z_1$=$Z_2$=S Compound S-328
$Z_1$=$Z_2$=Se Compound Se-328

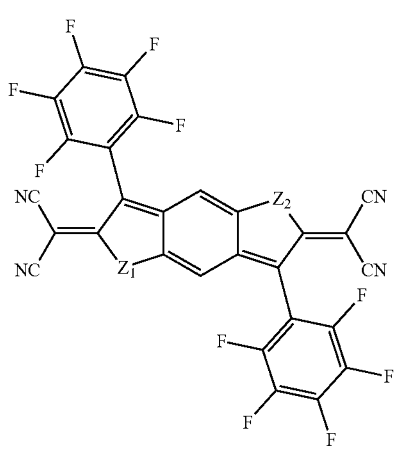

$Z_1$=$Z_1$=O Compound O-329
$Z_1$=$Z_2$=S Compound S-329
$Z_1$=$Z_2$=Se Compound Se-329

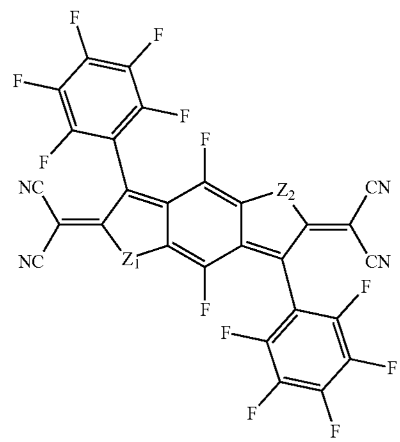

$Z_1$=$Z_1$=O Compound O-330
$Z_1$=$Z_2$=S Compound S-330
$Z_1$=$Z_2$=Se Compound Se-330

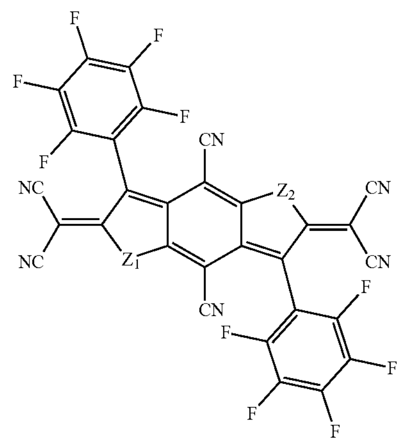

$Z_1$=$Z_1$=O Compound O-331
$Z_1$=$Z_2$=S Compound S-331
$Z_1$=$Z_2$=Se Compound Se-331

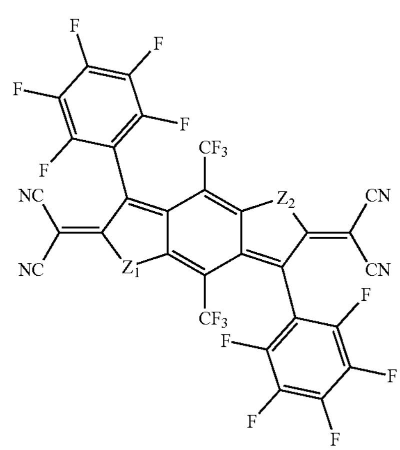

$Z_1$=$Z_1$=O Compound O-332
$Z_1$=$Z_2$=S Compound S-332
$Z_1$=$Z_2$=Se Compound Se-332

-continued

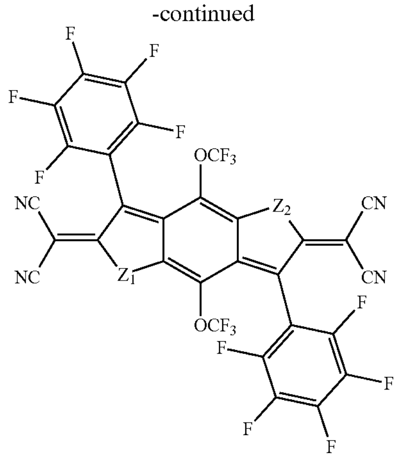

$Z_1$=$Z_1$=O Compound O-333
$Z_1$=$Z_2$=S Compound S-333
$Z_1$=$Z_2$=Se Compound Se-333

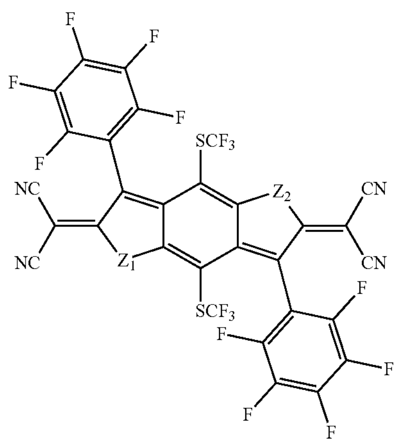

$Z_1$=$Z_1$=O Compound O-334
$Z_1$=$Z_2$=S Compound S-334
$Z_1$=$Z_2$=Se Compound Se-334

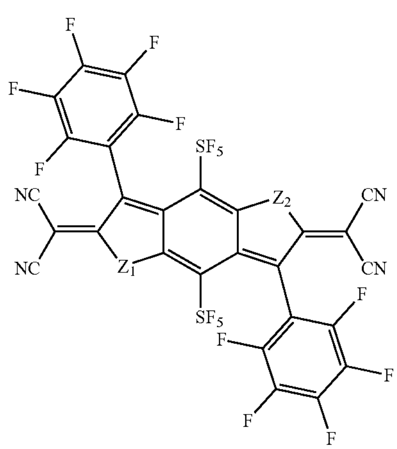

$Z_1$=$Z_1$=O Compound O-335
$Z_1$=$Z_2$=S Compound S-335
$Z_1$=$Z_2$=Se Compound Se-335

-continued

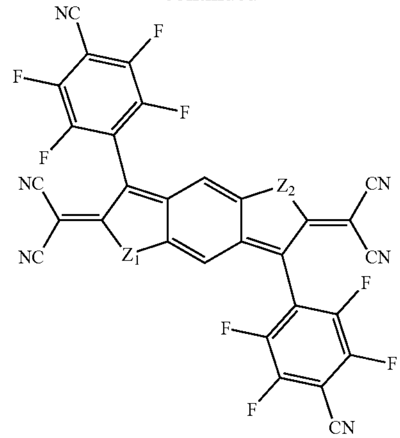

$Z_1$=$Z_1$=O Compound O-336
$Z_1$=$Z_2$=S Compound S-336
$Z_1$=$Z_2$=Se Compound Se-336

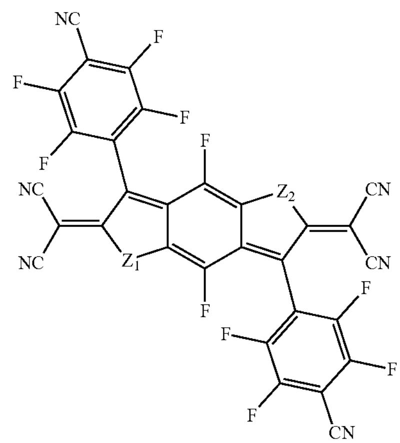

$Z_1$=$Z_1$=O Compound O-337
$Z_1$=$Z_2$=S Compound S-337
$Z_1$=$Z_2$=Se Compound Se-337

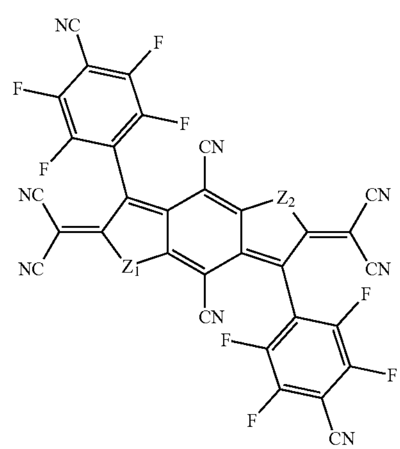

$Z_1$=$Z_1$=O Compound O-338
$Z_1$=$Z_2$=S Compound S-338
$Z_1$=$Z_2$=Se Compound Se-338

-continued

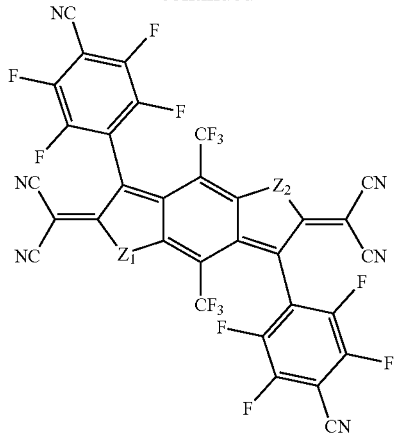

$Z_1$=$Z_1$=O Compound O-339
$Z_1$=$Z_2$=S Compound S-339
$Z_1$=$Z_2$=Se Compound Se-339

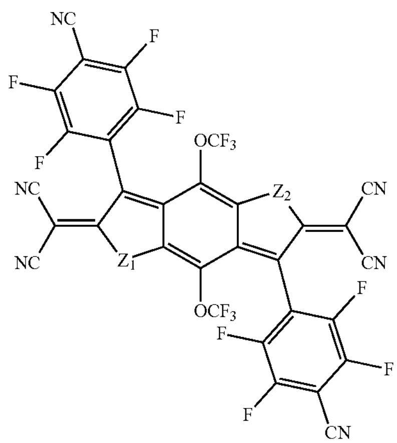

$Z_1$=$Z_1$=O Compound O-340
$Z_1$=$Z_2$=S Compound S-340
$Z_1$=$Z_2$=Se Compound Se-340

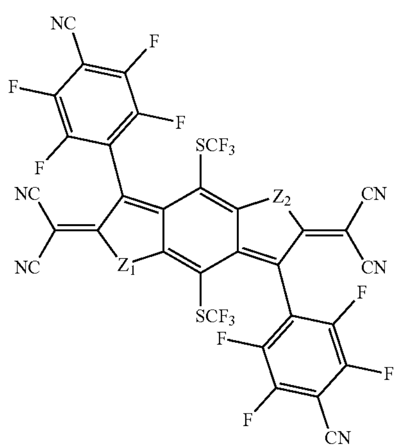

$Z_1$=$Z_1$=O Compound O-341
$Z_1$=$Z_2$=S Compound S-341
$Z_1$=$Z_2$=Se Compound Se-341

-continued

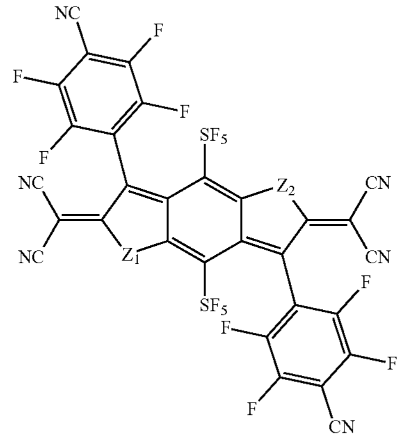

$Z_1$=$Z_1$=O Compound O-342
$Z_1$=$Z_2$=S Compound S-342
$Z_1$=$Z_2$=Se Compound Se-342

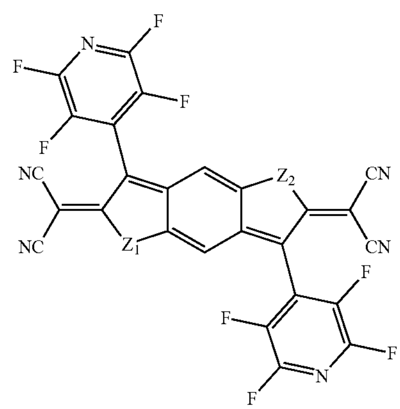

$Z_1$=$Z_1$=O Compound O-343
$Z_1$=$Z_2$=S Compound S-343
$Z_1$=$Z_2$=Se Compound Se-343

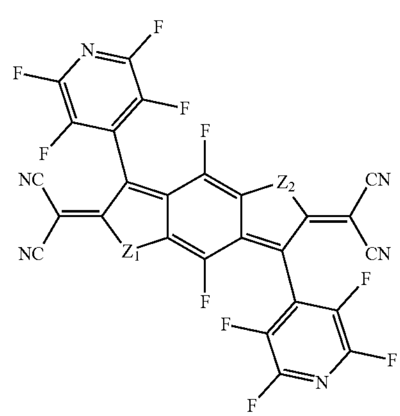

$Z_1$=$Z_1$=O Compound O-344
$Z_1$=$Z_2$=S Compound S-344
$Z_1$=$Z_2$=Se Compound Se-344

-continued

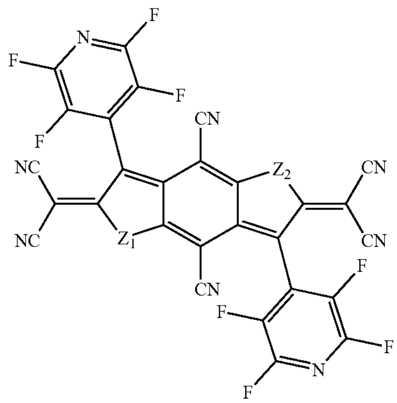

$Z_1$=$Z_1$=O Compound O-345
$Z_1$=$Z_2$=S Compound S-345
$Z_1$=$Z_2$=Se Compound Se-345

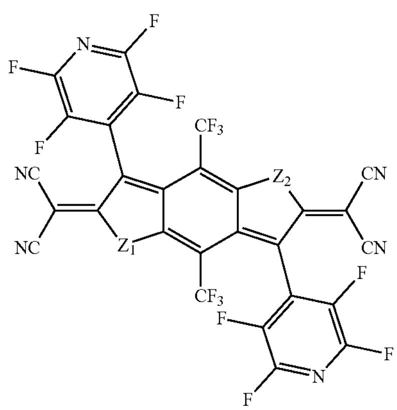

$Z_1$=$Z_1$=O Compound O-346
$Z_1$=$Z_2$=S Compound S-346
$Z_1$=$Z_2$=Se Compound Se-346

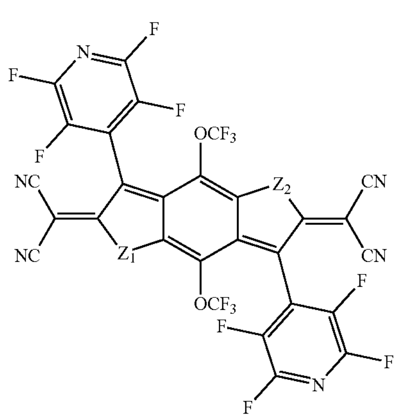

$Z_1$=$Z_1$=O Compound O-347
$Z_1$=$Z_2$=S Compound S-347
$Z_1$=$Z_2$=Se Compound Se-347

-continued

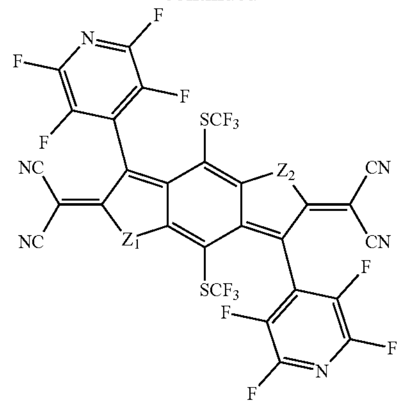

$Z_1$=$Z_1$=O Compound O-348
$Z_1$=$Z_2$=S Compound S-348
$Z_1$=$Z_2$=Se Compound Se-348

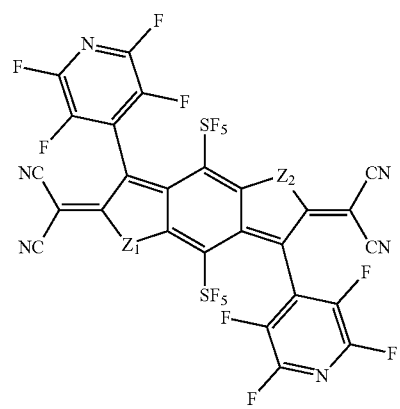

$Z_1$=$Z_1$=O Compound O-349
$Z_1$=$Z_2$=S Compound S-349
$Z_1$=$Z_2$=Se Compound Se-349

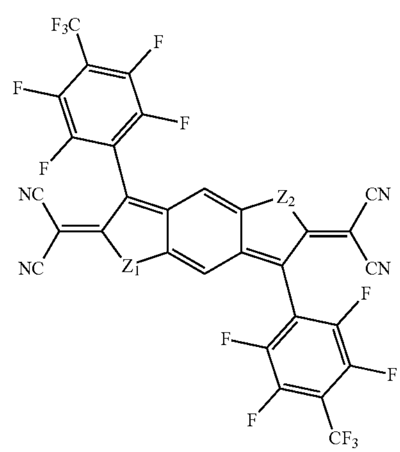

$Z_1$=$Z_1$=O Compound O-350
$Z_1$=$Z_2$=S Compound S-350
$Z_1$=$Z_2$=Se Compound Se-350

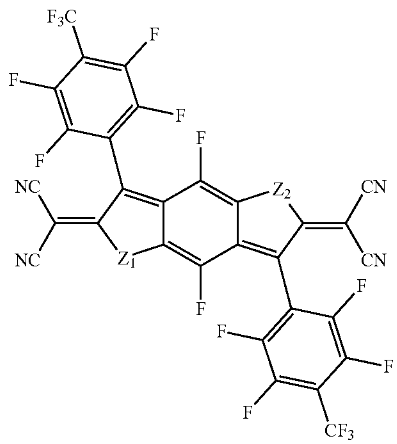

$Z_1$=$Z_1$=O Compound O-351
$Z_1$=$Z_2$=S Compound S-351
$Z_1$=$Z_2$=Se Compound Se-351

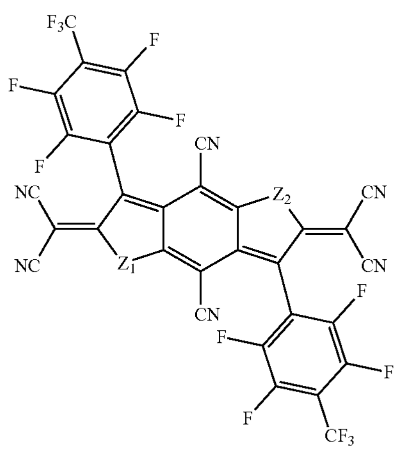

$Z_1$=$Z_1$=O Compound O-352
$Z_1$=$Z_2$=S Compound S-352
$Z_1$=$Z_2$=Se Compound Se-352

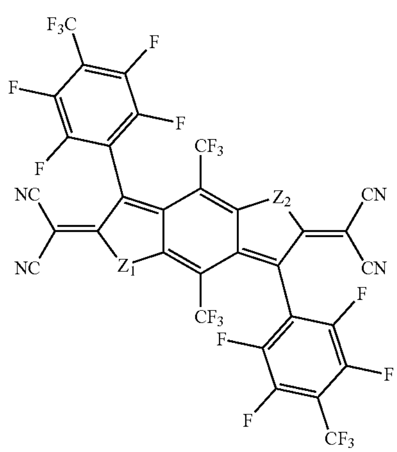

$Z_1$=$Z_1$=O Compound O-353
$Z_1$=$Z_2$=S Compound S-353
$Z_1$=$Z_2$=Se Compound Se-353

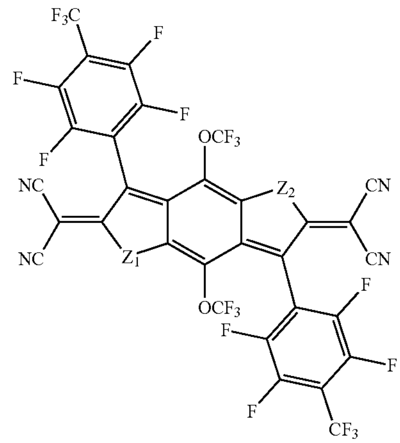

$Z_1$=$Z_1$=O Compound O-354
$Z_1$=$Z_2$=S Compound S-354
$Z_1$=$Z_2$=Se Compound Se-354

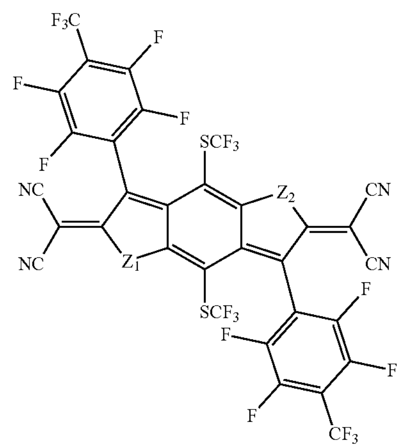

$Z_1$=$Z_1$=O Compound O-355
$Z_1$=$Z_2$=S Compound S-355
$Z_1$=$Z_2$=Se Compound Se-355

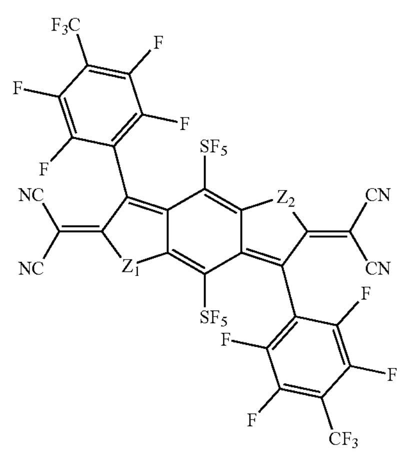

$Z_1$=$Z_1$=O Compound O-356
$Z_1$=$Z_2$=S Compound S-356
$Z_1$=$Z_2$=Se Compound Se-356

-continued

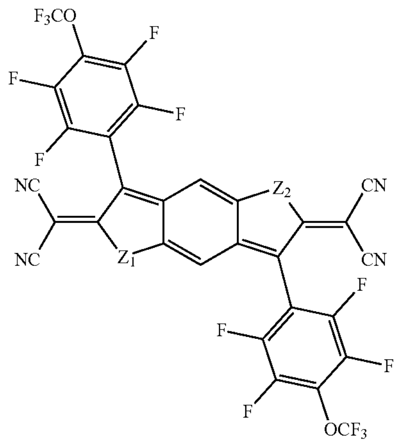

$Z_1$=$Z_1$=O Compound O-357
$Z_1$=$Z_2$=S Compound S-357
$Z_1$=$Z_2$=Se Compound Se-357

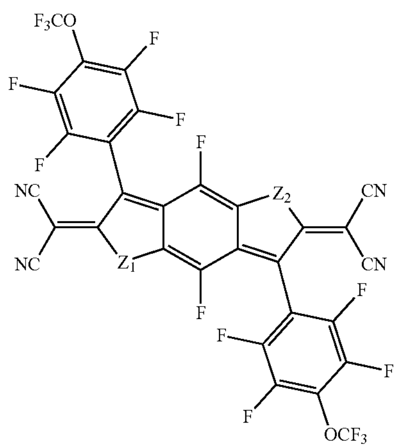

$Z_1$=$Z_1$=O Compound O-358
$Z_1$=$Z_2$=S Compound S-358
$Z_1$=$Z_2$=Se Compound Se-358

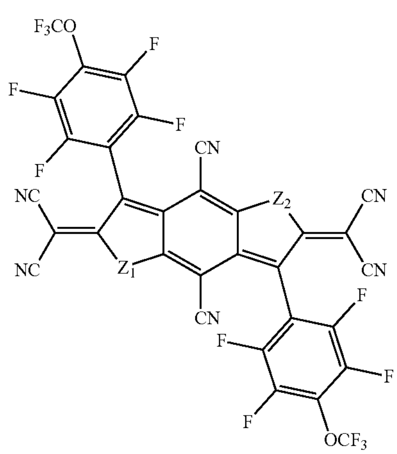

$Z_1$=$Z_1$=O Compound O-359
$Z_1$=$Z_2$=S Compound S-359
$Z_1$=$Z_2$=Se Compound Se-359

-continued

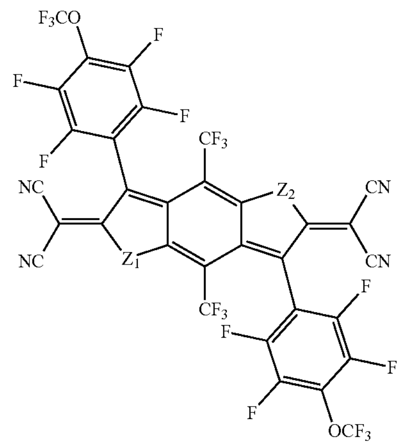

$Z_1$=$Z_1$=O Compound O-360
$Z_1$=$Z_2$=S Compound S-360
$Z_1$=$Z_2$=Se Compound Se-360

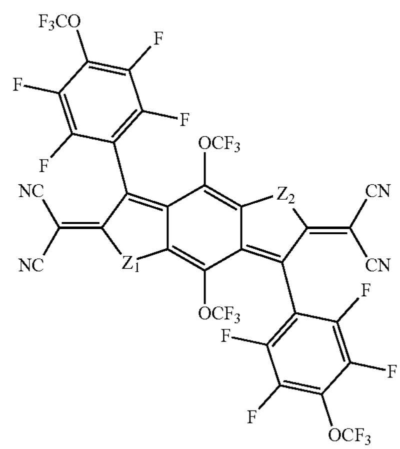

$Z_1$=$Z_1$=O Compound O-361
$Z_1$=$Z_2$=S Compound S-361
$Z_1$=$Z_2$=Se Compound Se-361

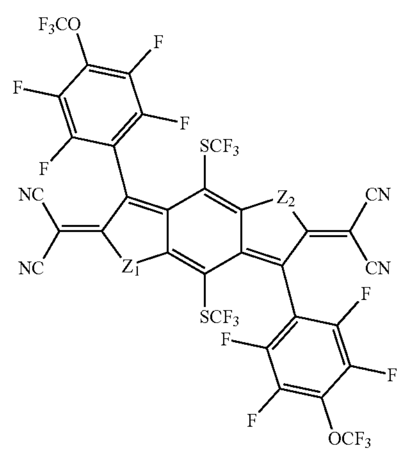

$Z_1$=$Z_1$=O Compound O-362
$Z_1$=$Z_2$=S Compound S-362
$Z_1$=$Z_2$=Se Compound Se-362

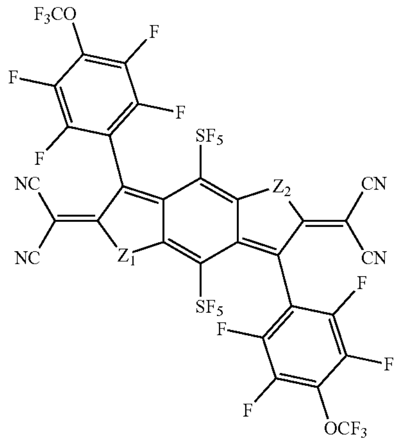

$Z_1$=$Z_1$=O Compound O-363
$Z_1$=$Z_2$=S Compound S-363
$Z_1$=$Z_2$=Se Compound Se-363

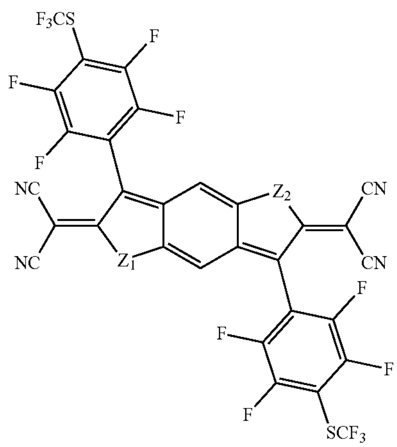

$Z_1$=$Z_1$=O Compound O-364
$Z_1$=$Z_2$=S Compound S-364
$Z_1$=$Z_2$=Se Compound Se-364

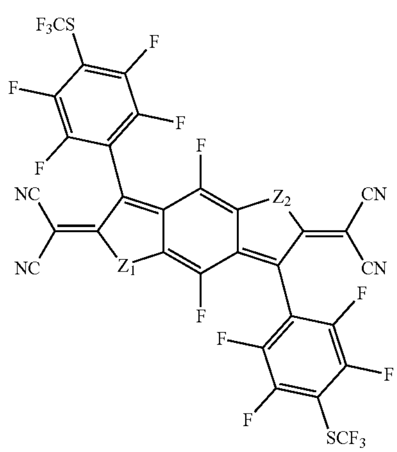

$Z_1$=$Z_1$=O Compound O-365
$Z_1$=$Z_2$=S Compound S-365
$Z_1$=$Z_2$=Se Compound Se-365

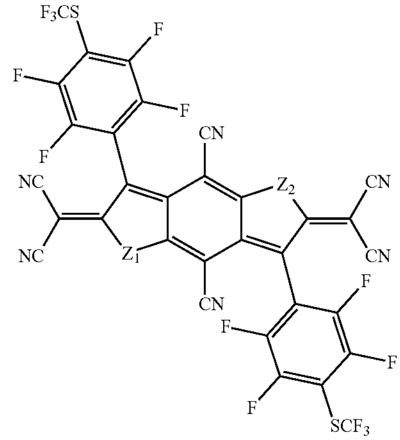

$Z_1$=$Z_1$=O Compound O-366
$Z_1$=$Z_2$=S Compound S-366
$Z_1$=$Z_2$=Se Compound Se-366

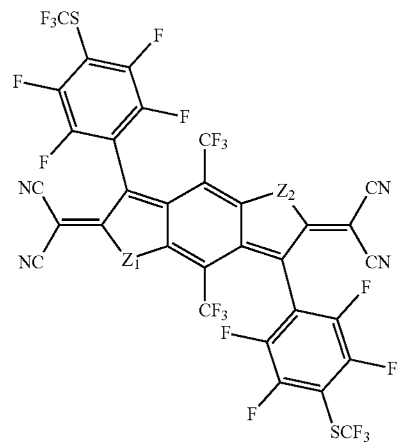

$Z_1$=$Z_1$=O Compound O-367
$Z_1$=$Z_2$=S Compound S-367
$Z_1$=$Z_2$=Se Compound Se-367

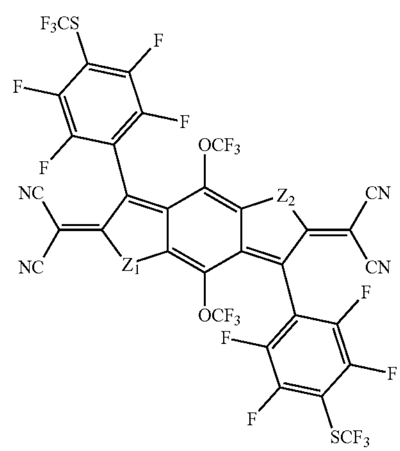

$Z_1$=$Z_1$=O Compound O-368
$Z_1$=$Z_2$=S Compound S-368
$Z_1$=$Z_2$=Se Compound Se-368

-continued

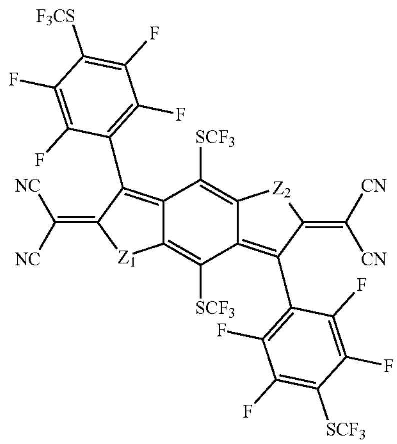

$Z_1$=$Z_1$=O Compound O-369
$Z_1$=$Z_2$=S Compound S-369
$Z_1$=$Z_2$=Se Compound Se-369

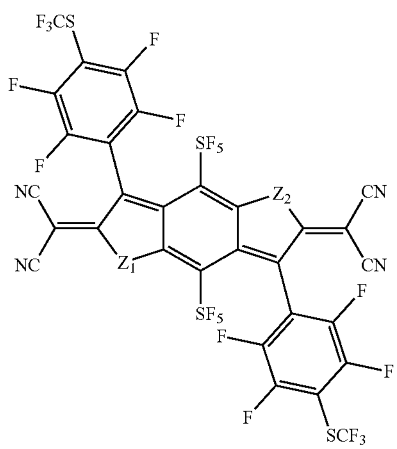

$Z_1$=$Z_1$=O Compound O-370
$Z_1$=$Z_2$=S Compound S-370
$Z_1$=$Z_2$=Se Compound Se-370

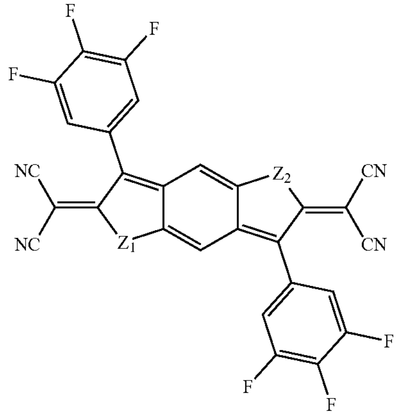

$Z_1$=$Z_1$=O Compound O-371
$Z_1$=$Z_2$=S Compound S-371
$Z_1$=$Z_2$=Se Compound Se-371

-continued

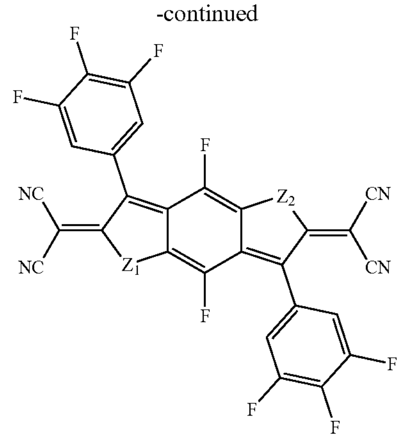

$Z_1$=$Z_1$=O Compound O-372
$Z_1$=$Z_2$=S Compound S-372
$Z_1$=$Z_2$=Se Compound Se-372

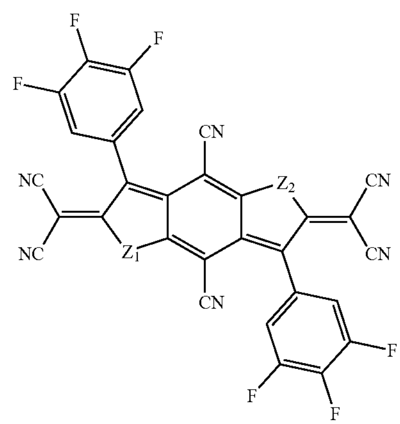

$Z_1$=$Z_1$=O Compound O-373
$Z_1$=$Z_2$=S Compound S-373
$Z_1$=$Z_2$=Se Compound Se-373

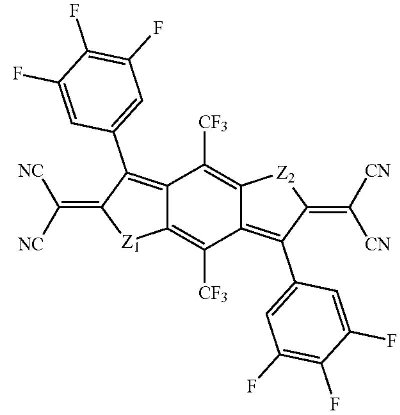

$Z_1$=$Z_1$=O Compound O-374
$Z_1$=$Z_2$=S Compound S-374
$Z_1$=$Z_2$=Se Compound Se-374

-continued

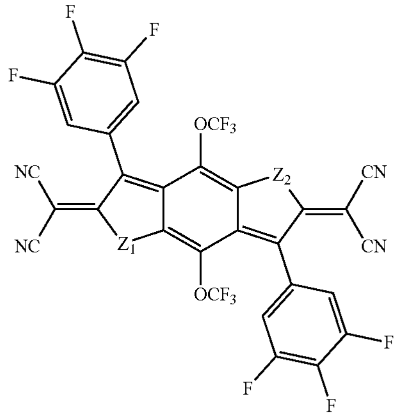

$Z_1$=$Z_1$=O Compound O-375
$Z_1$=$Z_2$=S Compound S-375
$Z_1$=$Z_2$=Se Compound Se-375

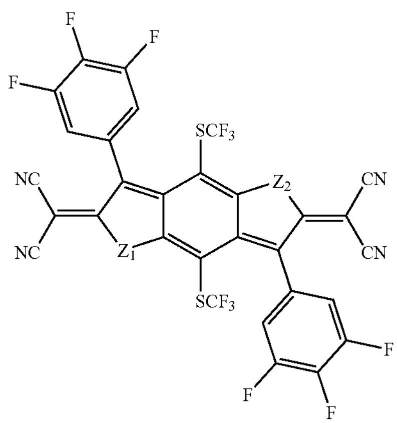

$Z_1$=$Z_1$=O Compound O-376
$Z_1$=$Z_2$=S Compound S-376
$Z_1$=$Z_2$=Se Compound Se-376

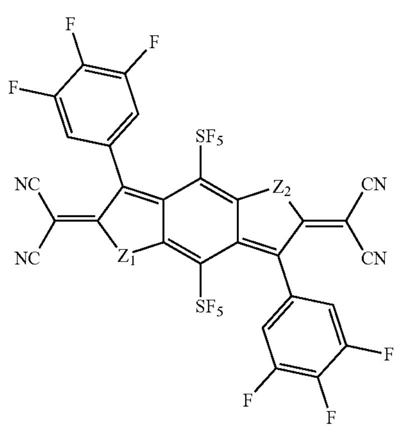

$Z_1$=$Z_1$=O Compound O-377
$Z_1$=$Z_2$=S Compound S-377
$Z_1$=$Z_2$=Se Compound Se-377

-continued

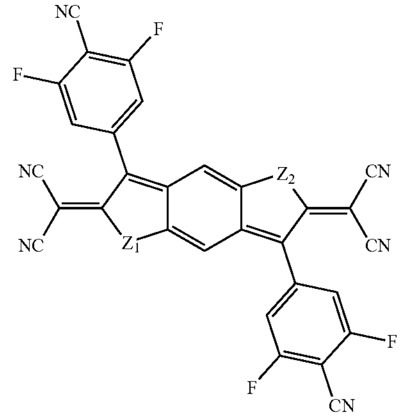

$Z_1$=$Z_1$=O Compound O-378
$Z_1$=$Z_2$=S Compound S-378
$Z_1$=$Z_2$=Se Compound Se-378

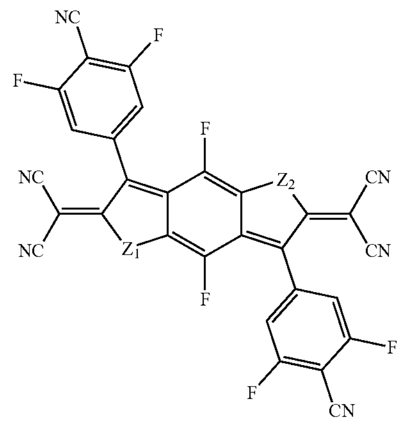

$Z_1$=$Z_1$=O Compound O-379
$Z_1$=$Z_2$=S Compound S-379
$Z_1$=$Z_2$=Se Compound Se-379

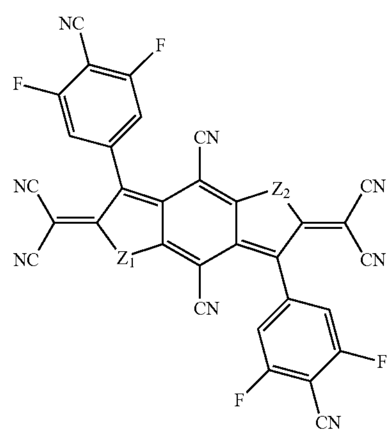

$Z_1$ = $Z_2$ = O Compound O-380
$Z_1$ = $Z_2$ = S Compound S-380
$Z_1$ = $Z_2$ = Se Compound Se-380

-continued

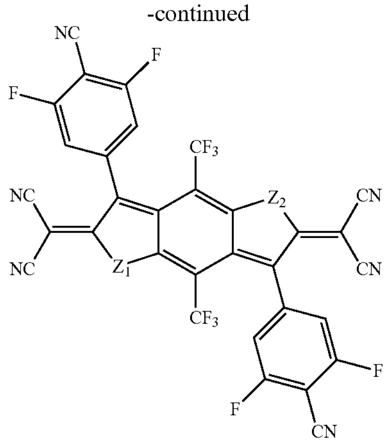

$Z_1 = Z_2 = O$ Compound O-381
$Z_1 = Z_2 = S$ Compound S-381
$Z_1 = Z_2 = Se$ Compound Se-381

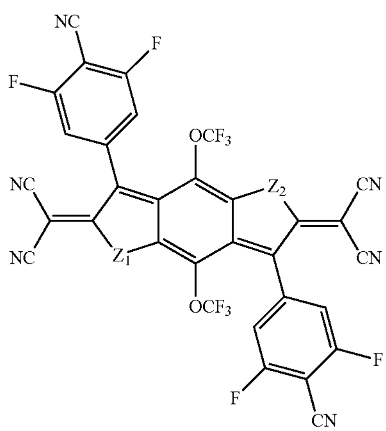

$Z_1 = Z_2 = O$ Compound O-382
$Z_1 = Z_2 = S$ Compound S-382
$Z_1 = Z_2 = Se$ Compound Se-382

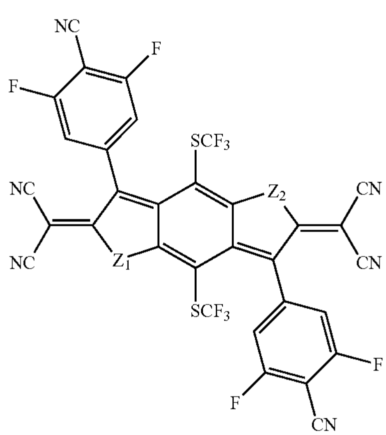

$Z_1 = Z_2 = O$ Compound O-383
$Z_1 = Z_2 = S$ Compound S-383
$Z_1 = Z_2 = Se$ Compound Se-383

-continued

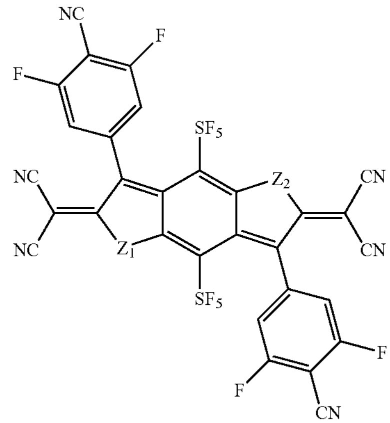

$Z_1 = Z_2 = O$ Compound O-384
$Z_1 = Z_2 = S$ Compound S-384
$Z_1 = Z_2 = Se$ Compound Se-384

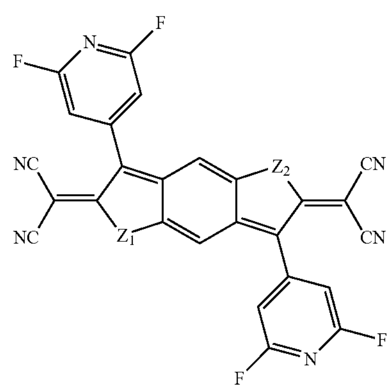

$Z_1 = Z_2 = O$ Compound O-385
$Z_1 = Z_2 = S$ Compound S-385
$Z_1 = Z_2 = Se$ Compound Se-385

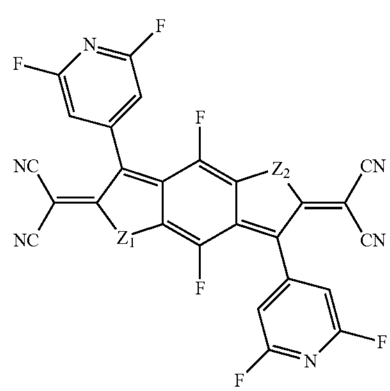

$Z_1 = Z_2 = O$ Compound O-386
$Z_1 = Z_2 = S$ Compound S-386
$Z_1 = Z_2 = Se$ Compound Se-386

-continued

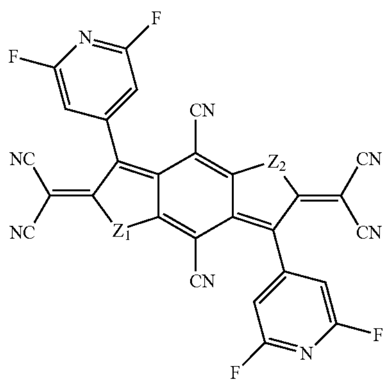

$Z_1 = Z_2 = O$ Compound O-387
$Z_1 = Z_2 = S$ Compound S-387
$Z_1 = Z_2 = Se$ Compound Se-387

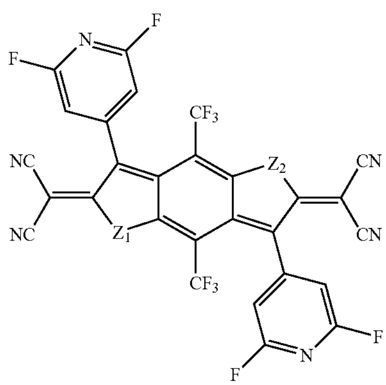

$Z_1 = Z_2 = O$ Compound O-388
$Z_1 = Z_2 = S$ Compound S-388
$Z_1 = Z_2 = Se$ Compound Se-388

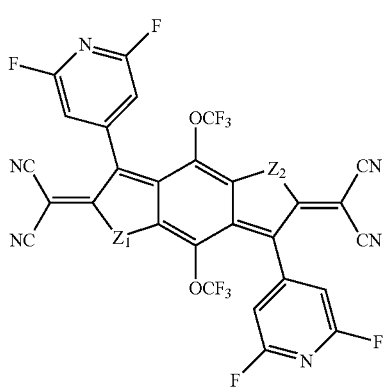

$Z_1 = Z_2 = O$ Compound O-389
$Z_1 = Z_2 = S$ Compound S-389
$Z_1 = Z_2 = Se$ Compound Se-389

-continued

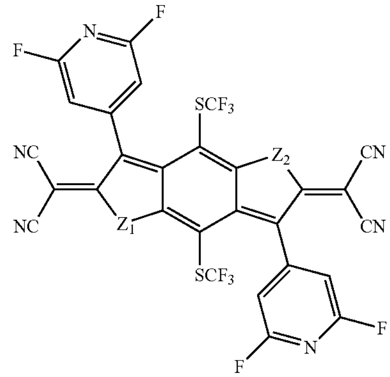

$Z_1 = Z_2 = O$ Compound O-390
$Z_1 = Z_2 = S$ Compound S-390
$Z_1 = Z_2 = Se$ Compound Se-390

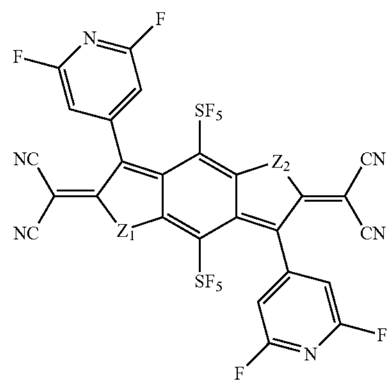

$Z_1 = Z_2 = O$ Compound O-391
$Z_1 = Z_2 = S$ Compound S-391
$Z_1 = Z_2 = Se$ Compound Se-391

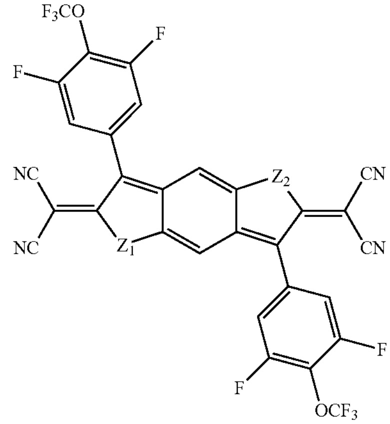

$Z_1 = Z_2 = O$ Compound O-392
$Z_1 = Z_2 = S$ Compound S-392
$Z_1 = Z_2 = Se$ Compound Se-392

-continued

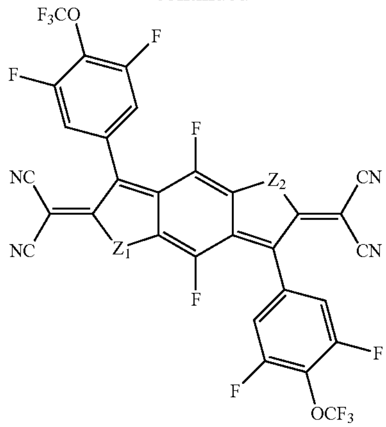

$Z_1 = Z_2 = O$ Compound O-393
$Z_1 = Z_2 = S$ Compound S-393
$Z_1 = Z_2 = Se$ Compound Se-393

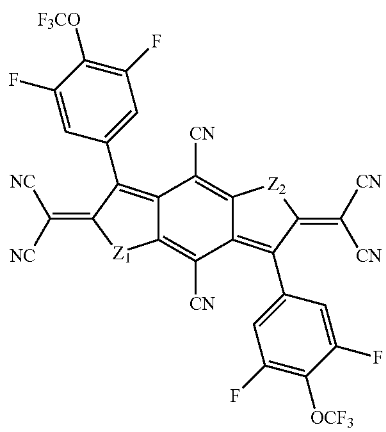

$Z_1 = Z_2 = O$ Compound O-394
$Z_1 = Z_2 = S$ Compound S-394
$Z_1 = Z_2 = Se$ Compound Se-394

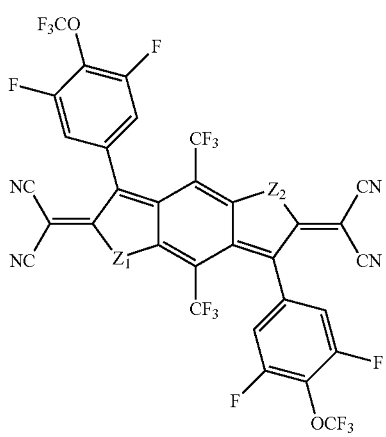

$Z_1 = Z_2 = O$ Compound O-395
$Z_1 = Z_2 = S$ Compound S-395
$Z_1 = Z_2 = Se$ Compound Se-395

-continued

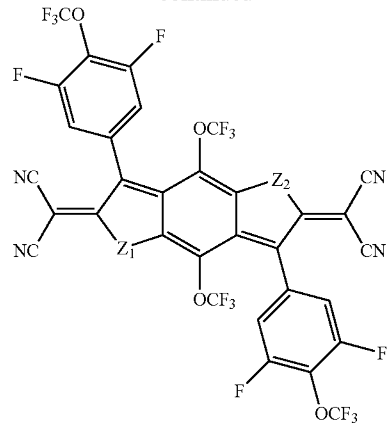

$Z_1 = Z_2 = O$ Compound O-396
$Z_1 = Z_2 = S$ Compound S-396
$Z_1 = Z_2 = Se$ Compound Se-396

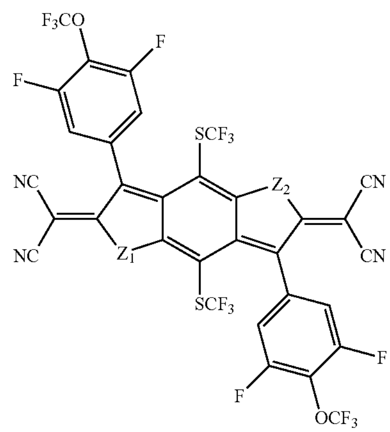

$Z_1 = Z_2 = O$ Compound O-397
$Z_1 = Z_2 = S$ Compound S-397
$Z_1 = Z_2 = Se$ Compound Se-397

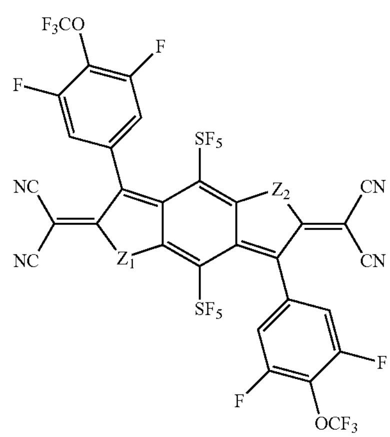

$Z_1 = Z_2 = O$ Compound O-398
$Z_1 = Z_2 = S$ Compound S-398
$Z_1 = Z_2 = Se$ Compound Se-398

-continued

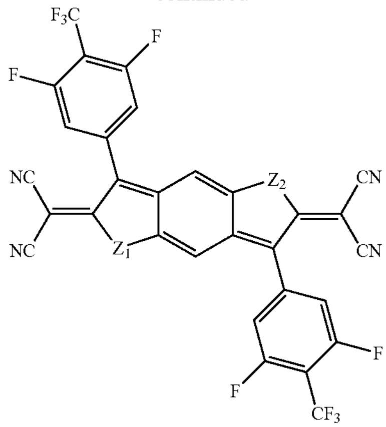

$Z_1 = Z_2 = O$ Compound O-399
$Z_1 = Z_2 = S$ Compound S-399
$Z_1 = Z_2 = Se$ Compound Se-399

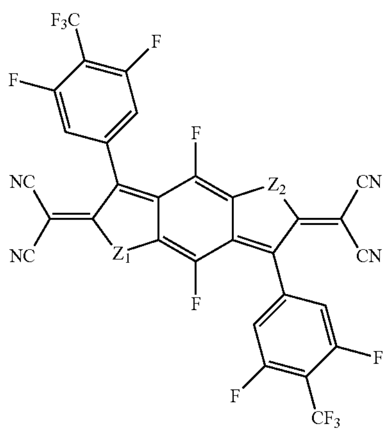

$Z_1 = Z_2 = O$ Compound O-400
$Z_1 = Z_2 = S$ Compound S-400
$Z_1 = Z_2 = Se$ Compound Se-400

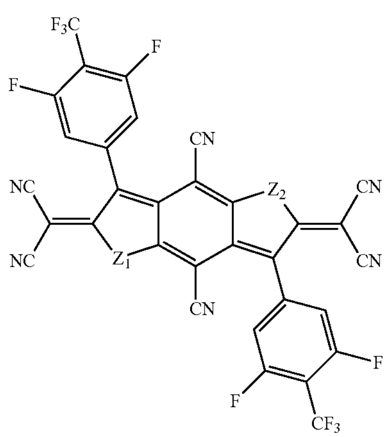

$Z_1 = Z_2 = O$ Compound O-401
$Z_1 = Z_2 = S$ Compound S-401
$Z_1 = Z_2 = Se$ Compound Se-401

-continued

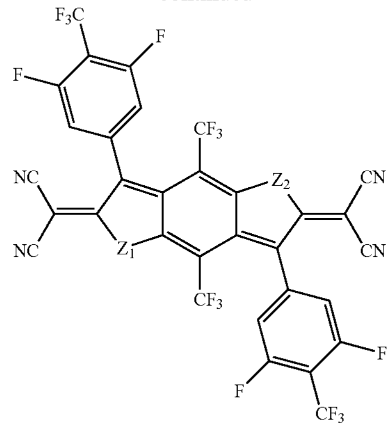

$Z_1 = Z_2 = O$ Compound O-402
$Z_1 = Z_2 = S$ Compound S-402
$Z_1 = Z_2 = Se$ Compound Se-402

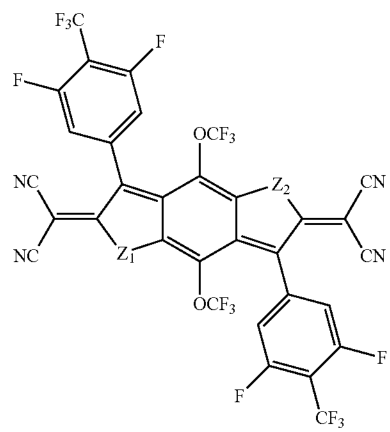

$Z_1 = Z_2 = O$ Compound O-403
$Z_1 = Z_2 = S$ Compound S-403
$Z_1 = Z_2 = Se$ Compound Se-403

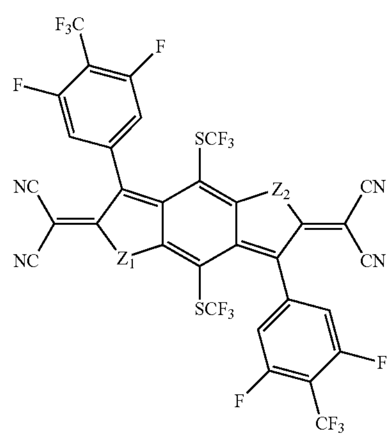

$Z_1 = Z_2 = O$ Compound O-404
$Z_1 = Z_2 = S$ Compound S-404
$Z_1 = Z_2 = Se$ Compound Se-404

-continued

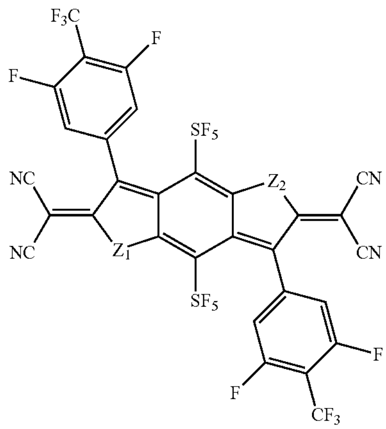

$Z_1 = Z_2 = O$ Compound O-405
$Z_1 = Z_2 = S$ Compound S-405
$Z_1 = Z_2 = Se$ Compound Se-405

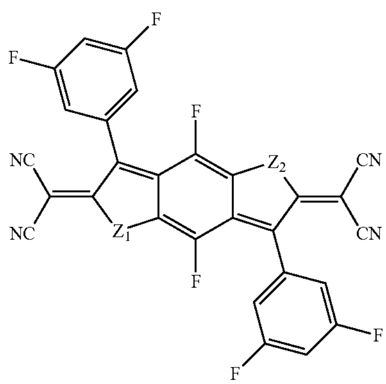

$Z_1 = Z_2 = O$ Compound O-406
$Z_1 = Z_2 = S$ Compound S-406
$Z_1 = Z_2 = Se$ Compound Se-406

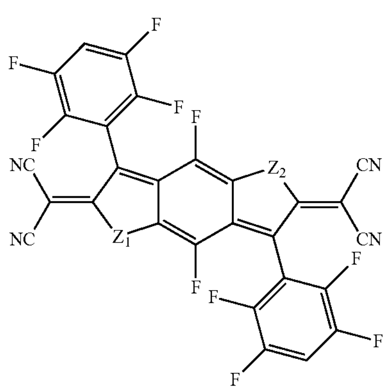

$Z_1 = Z_2 = O$ Compound O-407
$Z_1 = Z_2 = S$ Compound S-407
$Z_1 = Z_2 = Se$ Compound Se-407

-continued

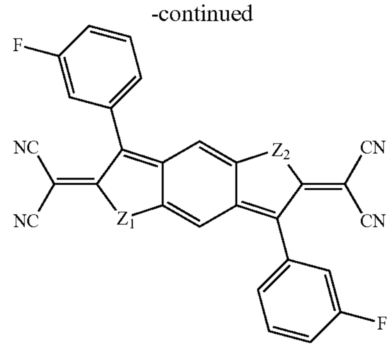

$Z_1 = Z_2 = O$ Compound O-408
$Z_1 = Z_2 = S$ Compound S-408
$Z_1 = Z_2 = Se$ Compound Se-408

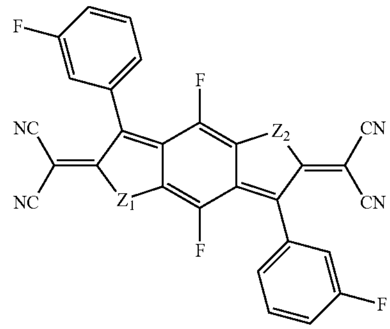

$Z_1 = Z_2 = O$ Compound O-409
$Z_1 = Z_2 = S$ Compound S-409
$Z_1 = Z_2 = Se$ Compound Se-409

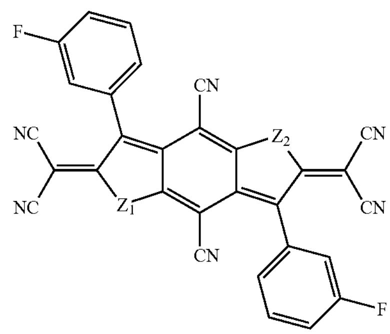

$Z_1 = Z_2 = O$ Compound O-410
$Z_1 = Z_2 = S$ Compound S-410
$Z_1 = Z_2 = Se$ Compound Se-410

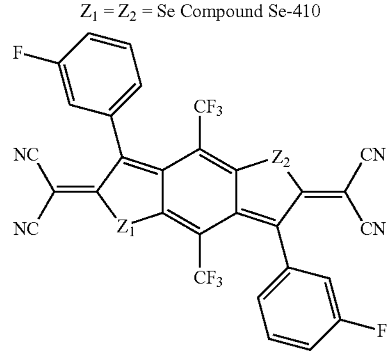

$Z_1 = Z_2 = O$ Compound O-411
$Z_1 = Z_2 = S$ Compound S-411
$Z_1 = Z_2 = Se$ Compound Se-411

-continued

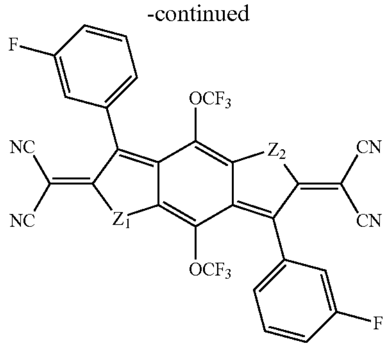

$Z_1 = Z_2 =$ O Compound O-412
$Z_1 = Z_2 =$ S Compound S-412
$Z_1 = Z_2 =$ Se Compound Se-412

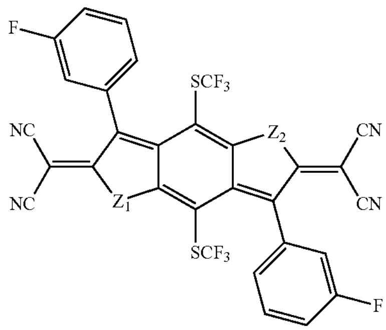

$Z_1 = Z_2 =$ O Compound O-413
$Z_1 = Z_2 =$ S Compound S-413
$Z_1 = Z_2 =$ Se Compound Se-413

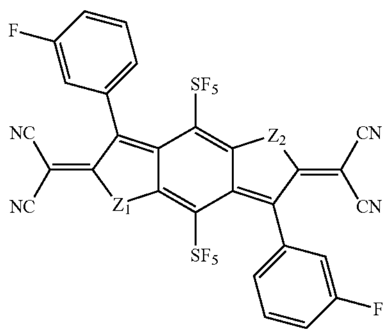

$Z_1 = Z_2 =$ O Compound O-414
$Z_1 = Z_2 =$ S Compound S-414
$Z_1 = Z_2 =$ Se Compound Se-414

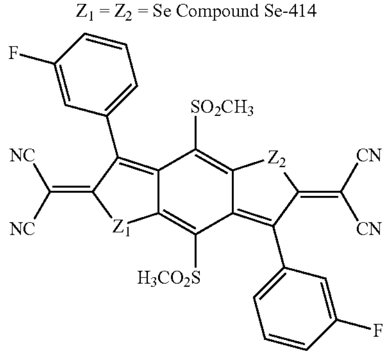

$Z_1 = Z_2 =$ O Compound O-415
$Z_1 = Z_2 =$ S Compound S-415
$Z_1 = Z_2 =$ Se Compound Se-415

-continued

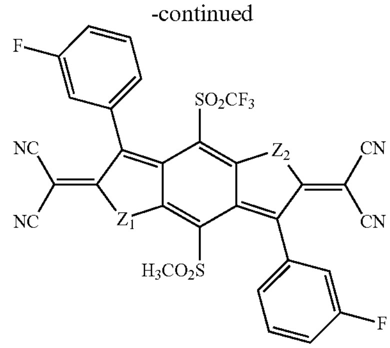

$Z_1 = Z_2 =$ O Compound O-416
$Z_1 = Z_2 =$ S Compound S-416
$Z_1 = Z_2 =$ Se Compound Se-416

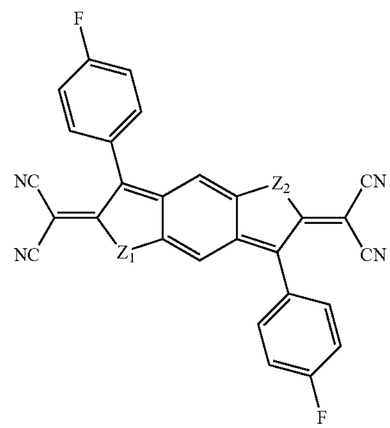

$Z_1 = Z_2 =$ O Compound O-417
$Z_1 = Z_2 =$ S Compound S-417
$Z_1 = Z_2 =$ Se Compound Se-417

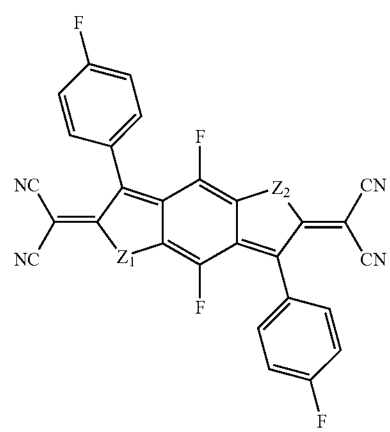

$Z_1 = Z_2 =$ O Compound O-418
$Z_1 = Z_2 =$ S Compound S-418
$Z_1 = Z_2 =$ Se Compound Se-418

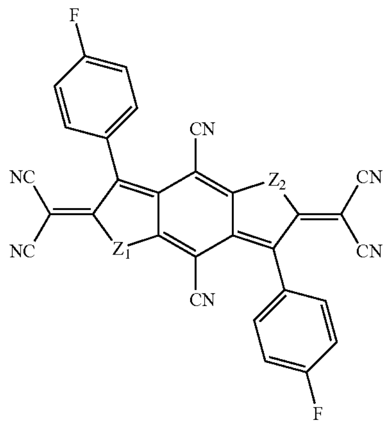

$Z_1 = Z_2 = O$ Compound O-419
$Z_1 = Z_2 = S$ Compound S-419
$Z_1 = Z_2 = Se$ Compound Se-419

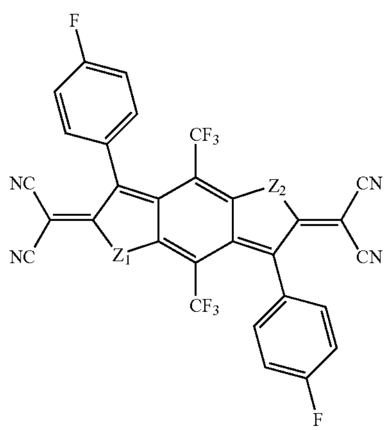

$Z_1 = Z_2 = O$ Compound O-420
$Z_1 = Z_2 = S$ Compound S-420
$Z_1 = Z_2 = Se$ Compound Se-420

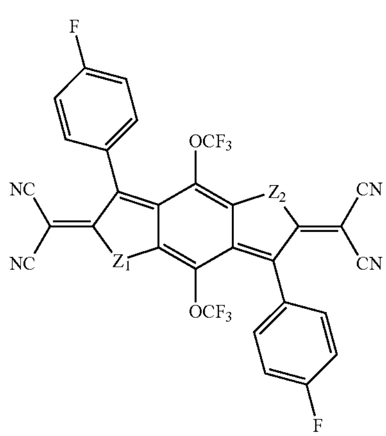

$Z_1 = Z_2 = O$ Compound O-421
$Z_1 = Z_2 = S$ Compound S-421
$Z_1 = Z_2 = Se$ Compound Se-421

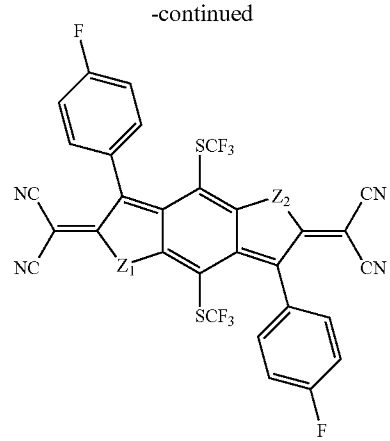

$Z_1 = Z_2 = O$ Compound O-422
$Z_1 = Z_2 = S$ Compound S-422
$Z_1 = Z_2 = Se$ Compound Se-422

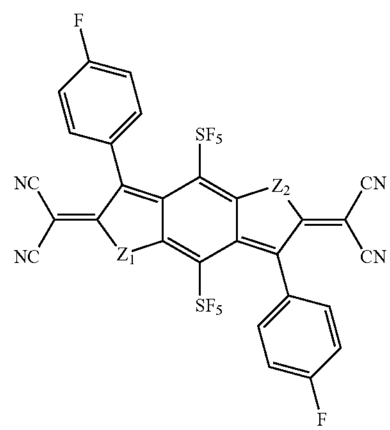

$Z_1 = Z_2 = O$ Compound O-423
$Z_1 = Z_2 = S$ Compound S-423
$Z_1 = Z_2 = Se$ Compound Se-423

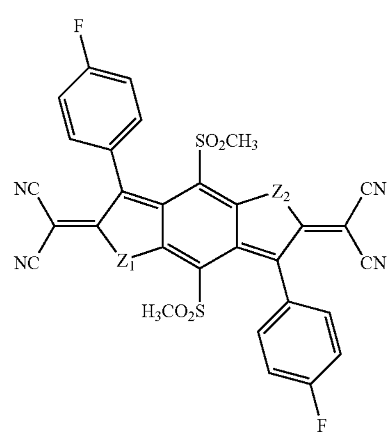

$Z_1 = Z_2 = O$ Compound O-424
$Z_1 = Z_2 = S$ Compound S-424
$Z_1 = Z_2 = Se$ Compound Se-424

-continued

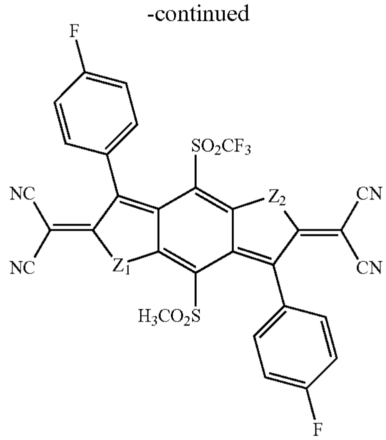

$Z_1 = Z_2 = O$ Compound O-425
$Z_1 = Z_2 = S$ Compound S-425
$Z_1 = Z_2 = Se$ Compound Se-425

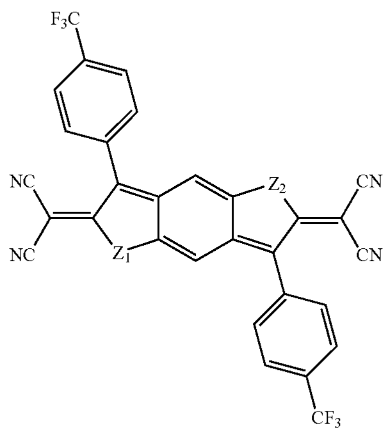

$Z_1 = Z_2 = O$ Compound O-426
$Z_1 = Z_2 = S$ Compound S-426
$Z_1 = Z_2 = Se$ Compound Se-426

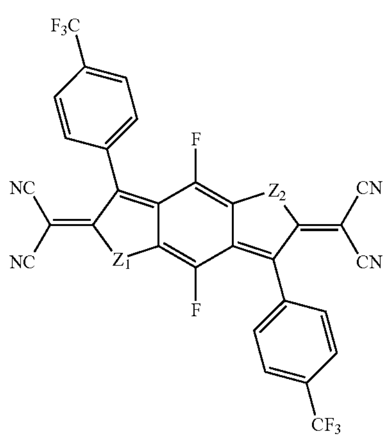

$Z_1 = Z_2 = O$ Compound O-427
$Z_1 = Z_2 = S$ Compound S-427
$Z_1 = Z_2 = Se$ Compound Se-427

-continued

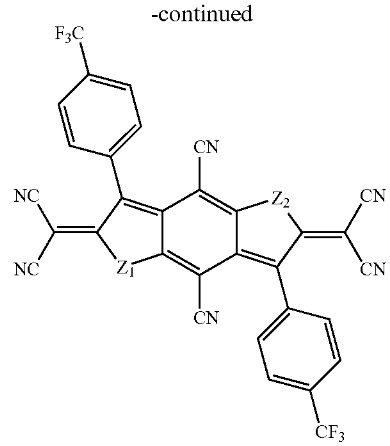

$Z_1 = Z_2 = O$ Compound O-428
$Z_1 = Z_2 = S$ Compound S-428
$Z_1 = Z_2 = Se$ Compound Se-428

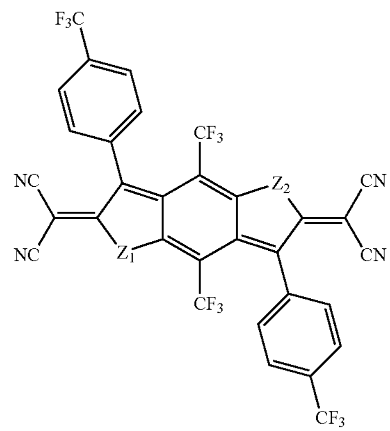

$Z_1 = Z_2 = O$ Compound O-429
$Z_1 = Z_2 = S$ Compound S-429
$Z_1 = Z_2 = Se$ Compound Se-429

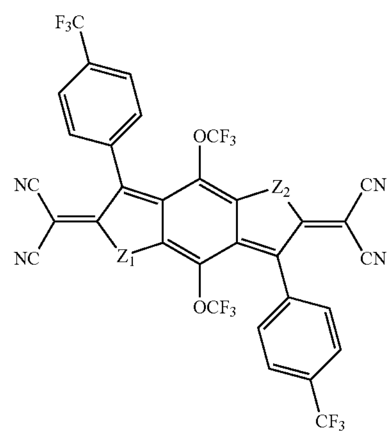

$Z_1 = Z_2 = O$ Compound O-430
$Z_1 = Z_2 = S$ Compound S-430
$Z_1 = Z_2 = Se$ Compound Se-430

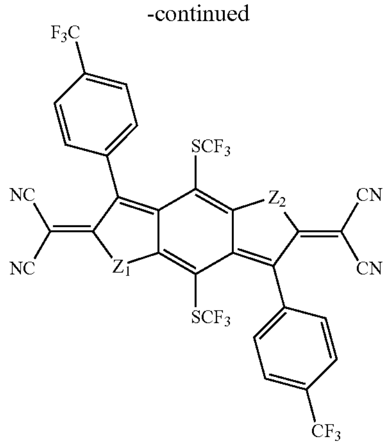

$Z_1 = Z_2 =$ O Compound O-431
$Z_1 = Z_2 =$ S Compound S-431
$Z_1 = Z_2 =$ Se Compound Se-431

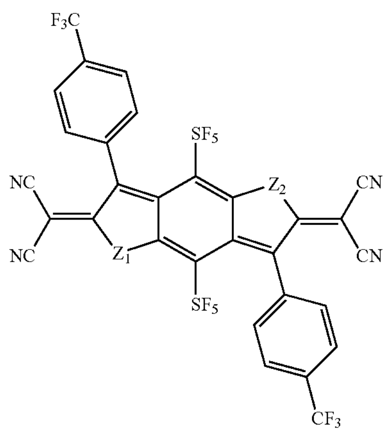

$Z_1 = Z_2 =$ O Compound O-432
$Z_1 = Z_2 =$ S Compound S-432
$Z_1 = Z_2 =$ Se Compound Se-432

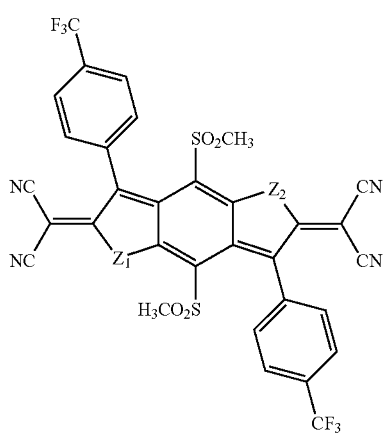

$Z_1 = Z_2 =$ O Compound O-433
$Z_1 = Z_2 =$ S Compound S-433
$Z_1 = Z_2 =$ Se Compound Se-433

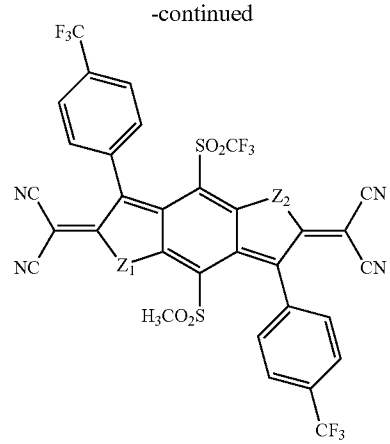

$Z_1 = Z_2 =$ O Compound O-434
$Z_1 = Z_2 =$ S Compound S-434
$Z_1 = Z_2 =$ Se Compound Se-434

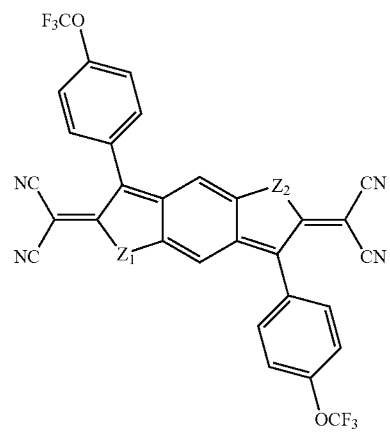

$Z_1 = Z_2 =$ O Compound O-435
$Z_1 = Z_2 =$ S Compound S-435
$Z_1 = Z_2 =$ Se Compound Se-435

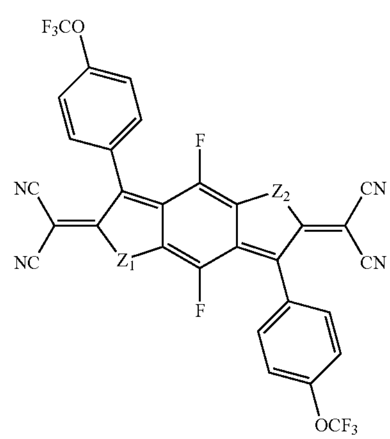

$Z_1 = Z_2 =$ O Compound O-436
$Z_1 = Z_2 =$ S Compound S-436
$Z_1 = Z_2 =$ Se Compound Se-436

-continued

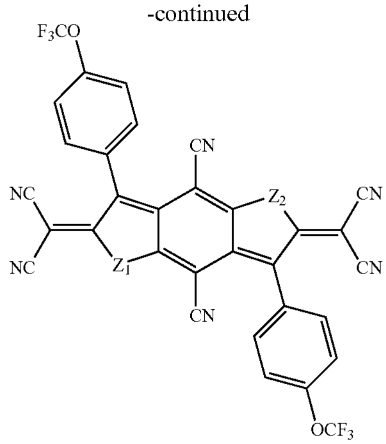

$Z_1 = Z_2 = O$ Compound O-437
$Z_1 = Z_2 = S$ Compound S-437
$Z_1 = Z_2 = Se$ Compound Se-437

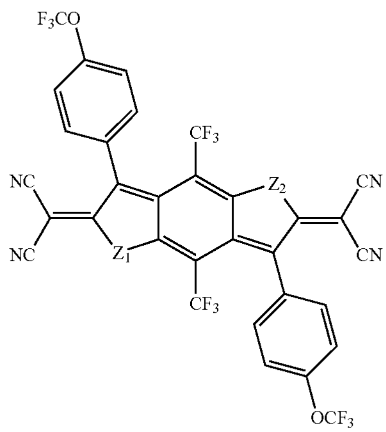

$Z_1 = Z_2 = O$ Compound O-438
$Z_1 = Z_2 = S$ Compound S-438
$Z_1 = Z_2 = Se$ Compound Se-438

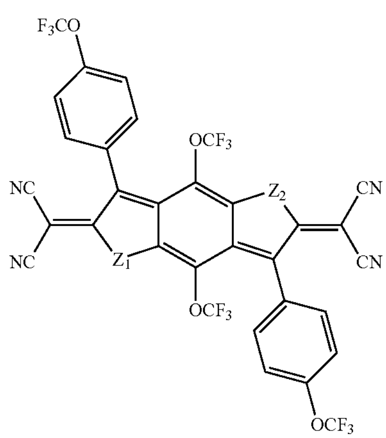

$Z_1 = Z_2 = O$ Compound O-439
$Z_1 = Z_2 = S$ Compound S-439
$Z_1 = Z_2 = Se$ Compound Se-439

-continued

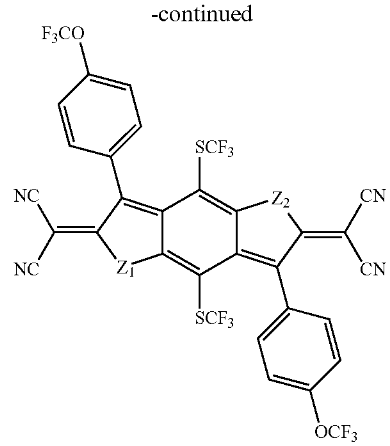

$Z_1 = Z_2 = O$ Compound O-440
$Z_1 = Z_2 = S$ Compound S-440
$Z_1 = Z_2 = Se$ Compound Se-440

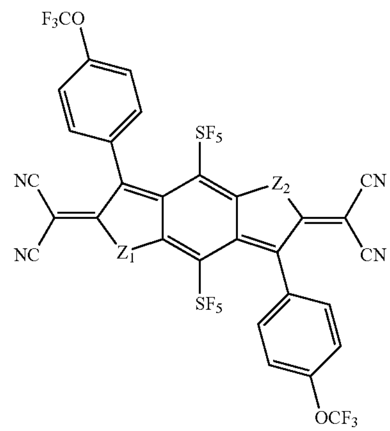

$Z_1 = Z_2 = O$ Compound O-441
$Z_1 = Z_2 = S$ Compound S-441
$Z_1 = Z_2 = Se$ Compound Se-441

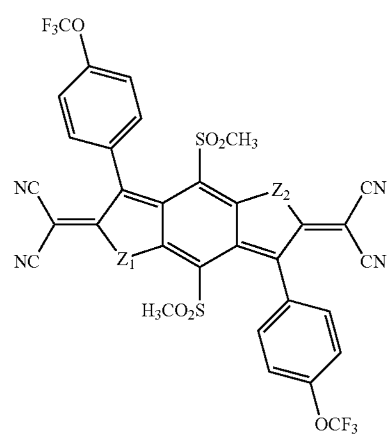

$Z_1 = Z_2 = O$ Compound O-442
$Z_1 = Z_2 = S$ Compound S-442
$Z_1 = Z_2 = Se$ Compound Se-442

-continued

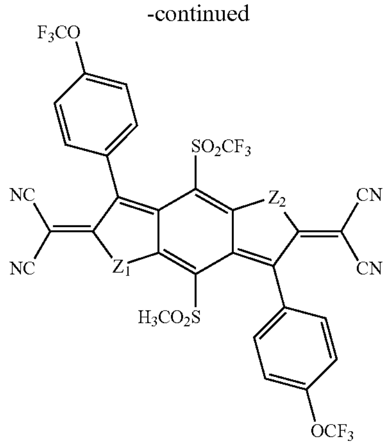

$Z_1 = Z_2 = O$ Compound O-443
$Z_1 = Z_2 = S$ Compound S-443
$Z_1 = Z_2 = Se$ Compound Se-443

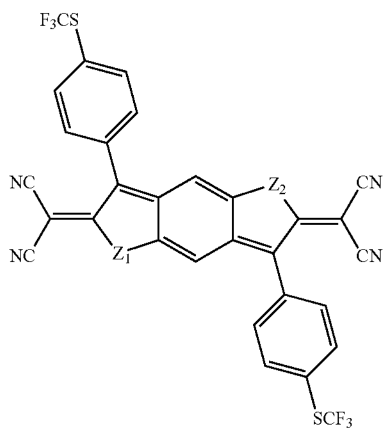

$Z_1 = Z_2 = O$ Compound O-444
$Z_1 = Z_2 = S$ Compound S-444
$Z_1 = Z_2 = Se$ Compound Se-444

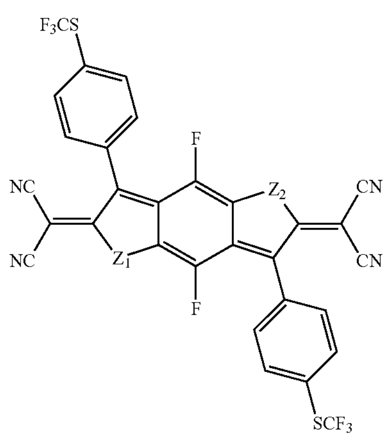

$Z_1 = Z_2 = O$ Compound O-445
$Z_1 = Z_2 = S$ Compound S-445
$Z_1 = Z_2 = Se$ Compound Se-445

-continued

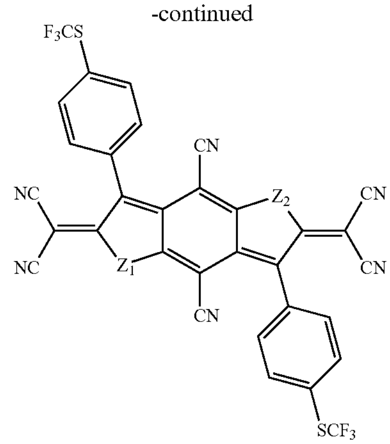

$Z_1 = Z_2 = O$ Compound O-446
$Z_1 = Z_2 = S$ Compound S-446
$Z_1 = Z_2 = Se$ Compound Se-446

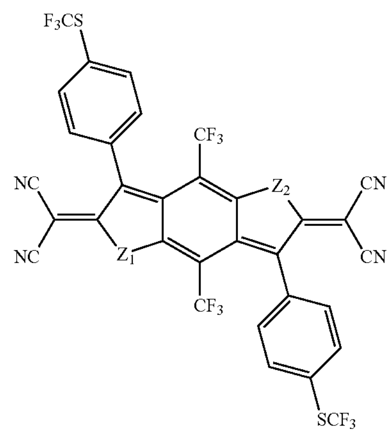

$Z_1 = Z_2 = O$ Compound O-447
$Z_1 = Z_2 = S$ Compound S-447
$Z_1 = Z_2 = Se$ Compound Se-447

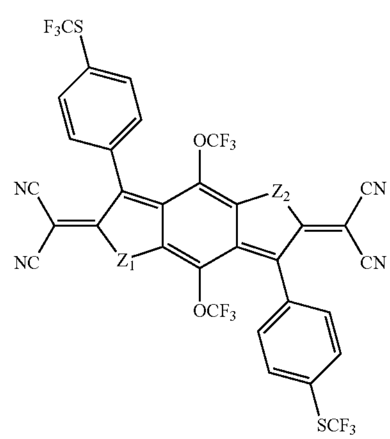

$Z_1 = Z_2 = O$ Compound O-448
$Z_1 = Z_2 = S$ Compound S-448
$Z_1 = Z_2 = Se$ Compound Se-448

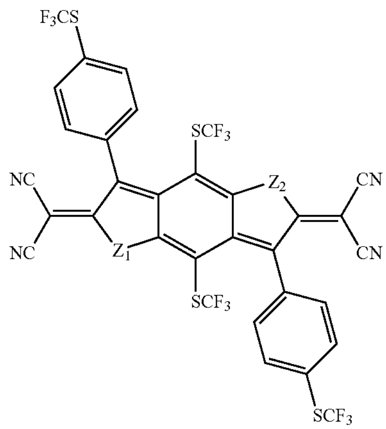

$Z_1 = Z_2$ = O Compound O-449
$Z_1 = Z_2$ = S Compound S-449
$Z_1 = Z_2$ = Se Compound Se-449

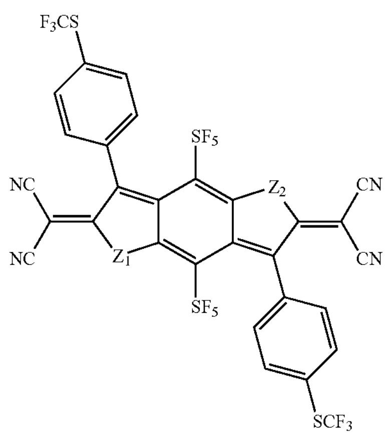

$Z_1 = Z_2$ = O Compound O-450
$Z_1 = Z_2$ = S Compound S-450
$Z_1 = Z_2$ = Se Compound Se-450

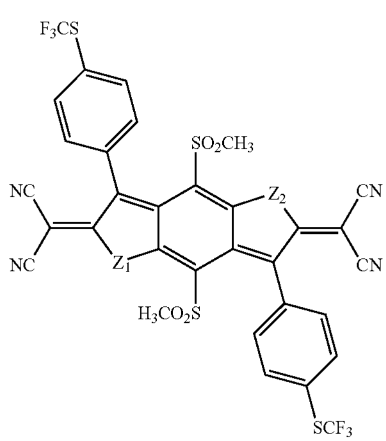

$Z_1 = Z_2$ = O Compound O-451
$Z_1 = Z_2$ = S Compound S-451
$Z_1 = Z_2$ = Se Compound Se-451

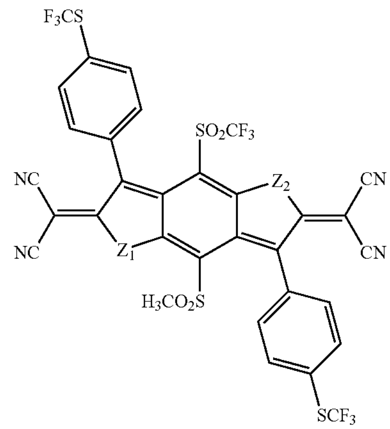

$Z_1 = Z_2$ = O Compound O-452
$Z_1 = Z_2$ = S Compound S-452
$Z_1 = Z_2$ = Se Compound Se-452

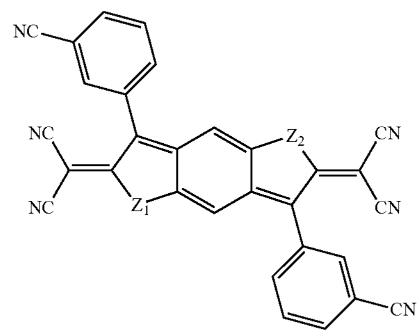

$Z_1 = Z_2$ = O Compound O-453
$Z_1 = Z_2$ = S Compound S-453
$Z_1 = Z_2$ = Se Compound Se-453

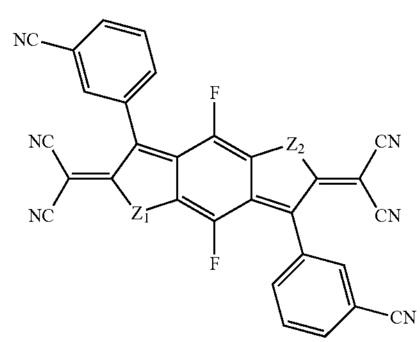

$Z_1 = Z_2$ = O Compound O-454
$Z_1 = Z_2$ = S Compound S-454
$Z_1 = Z_2$ = Se Compound Se-454

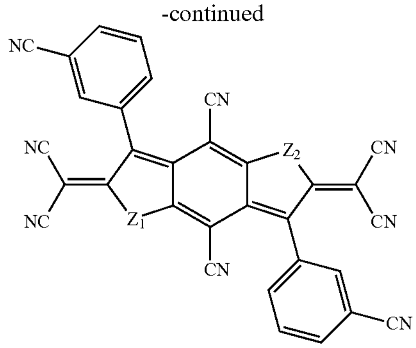

$Z_1 = Z_2 =$ O Compound O-455
$Z_1 = Z_2 =$ S Compound S-455
$Z_1 = Z_2 =$ Se Compound Se-455

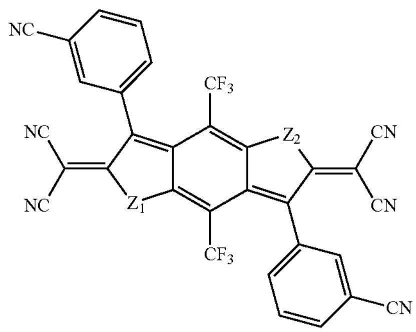

$Z_1 = Z_2 =$ O Compound O-456
$Z_1 = Z_2 =$ S Compound S-456
$Z_1 = Z_2 =$ Se Compound Se-456

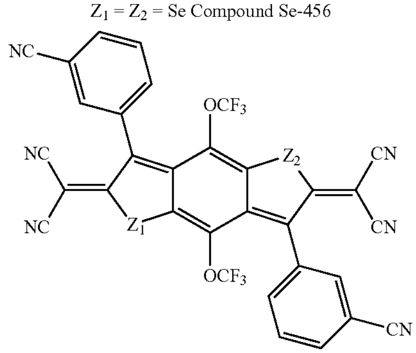

$Z_1 = Z_2 =$ O Compound O-457
$Z_1 = Z_2 =$ S Compound S-457
$Z_1 = Z_2 =$ Se Compound Se-457

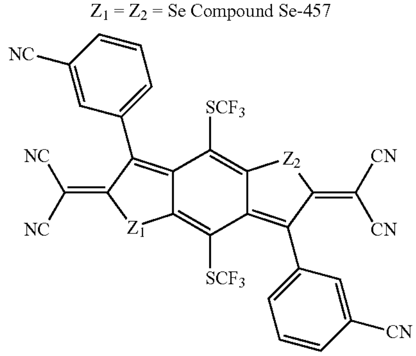

$Z_1 = Z_2 =$ O Compound O-458
$Z_1 = Z_2 =$ S Compound S-458
$Z_1 = Z_2 =$ Se Compound Se-458

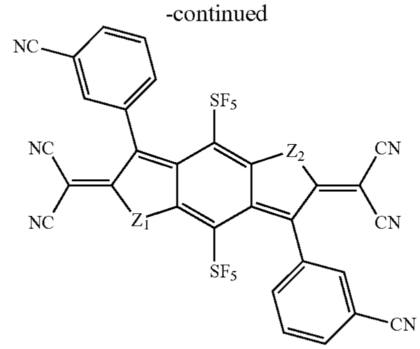

$Z_1 = Z_2 =$ O Compound O-459
$Z_1 = Z_2 =$ S Compound S-459
$Z_1 = Z_2 =$ Se Compound Se-459

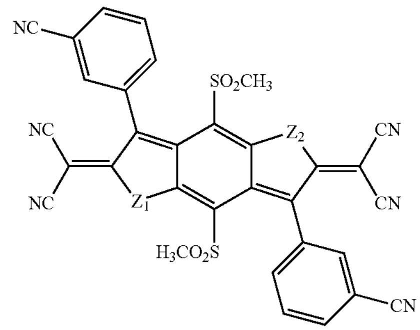

$Z_1 = Z_2 =$ O Compound O-460
$Z_1 = Z_2 =$ S Compound S-460
$Z_1 = Z_2 =$ Se Compound Se-460

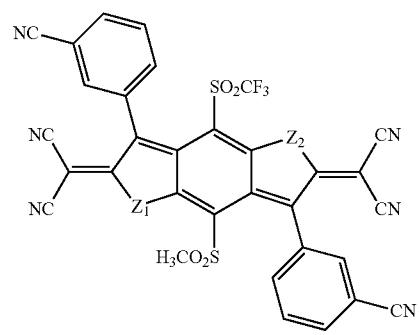

$Z_1 = Z_2 =$ O Compound O-461
$Z_1 = Z_2 =$ S Compound S-461
$Z_1 = Z_2 =$ Se Compound Se-461

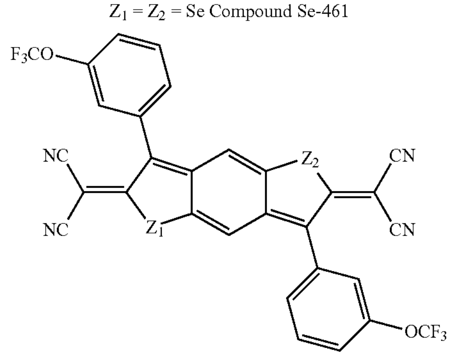

$Z_1 = Z_2 =$ O Compound O-462
$Z_1 = Z_2 =$ S Compound S-462
$Z_1 = Z_2 =$ Se Compound Se-462

-continued

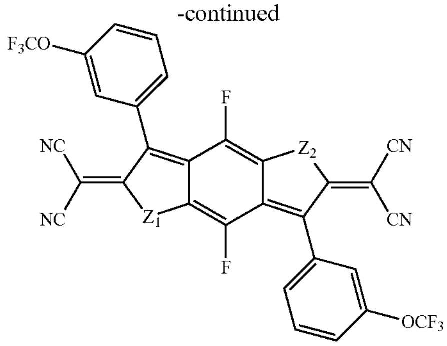

$Z_1 = Z_2 = O$ Compound O-463
$Z_1 = Z_2 = S$ Compound S-463
$Z_1 = Z_2 = Se$ Compound Se-463

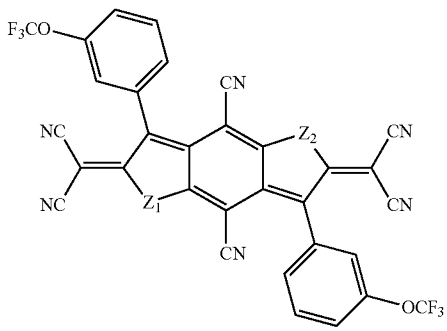

$Z_1 = Z_2 = O$ Compound O-464
$Z_1 = Z_2 = S$ Compound S-464
$Z_1 = Z_2 = Se$ Compound Se-464

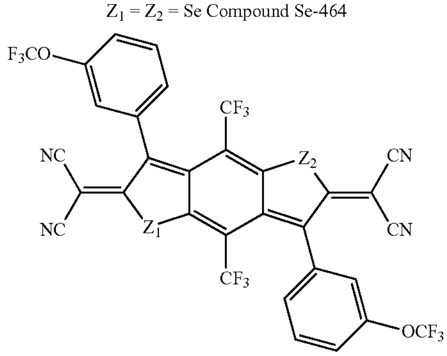

$Z_1 = Z_2 = O$ Compound O-465
$Z_1 = Z_2 = S$ Compound S-465
$Z_1 = Z_2 = Se$ Compound Se-465

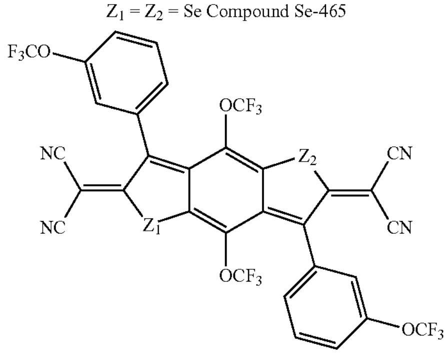

$Z_1 = Z_2 = O$ Compound O-466
$Z_1 = Z_2 = S$ Compound S-466
$Z_1 = Z_2 = Se$ Compound Se-466

-continued

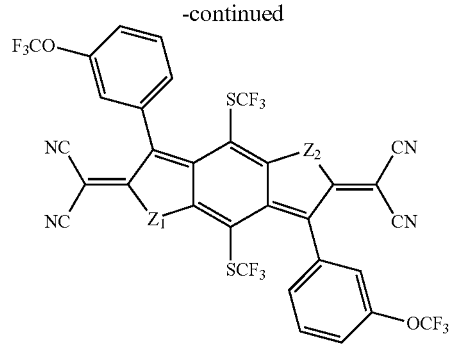

$Z_1 = Z_2 = O$ Compound O-467
$Z_1 = Z_2 = S$ Compound S-467
$Z_1 = Z_2 = Se$ Compound Se-467

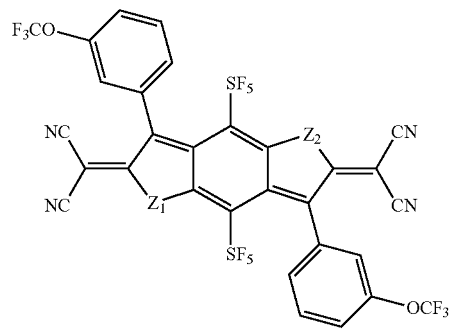

$Z_1 = Z_2 = O$ Compound O-468
$Z_1 = Z_2 = S$ Compound S-468
$Z_1 = Z_2 = Se$ Compound Se-468

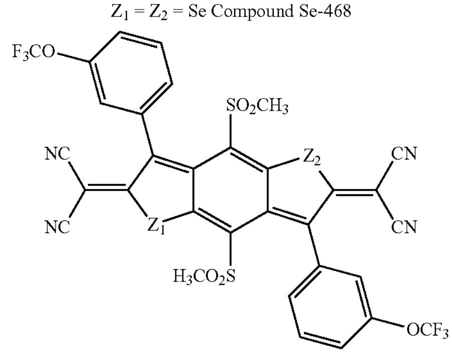

$Z_1 = Z_2 = O$ Compound O-469
$Z_1 = Z_2 = S$ Compound S-469
$Z_1 = Z_2 = Se$ Compound Se-469

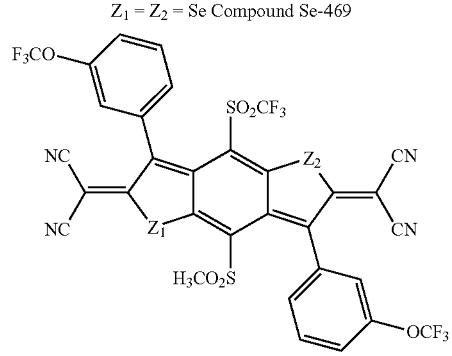

$Z_1 = Z_2 = O$ Compound O-470
$Z_1 = Z_2 = S$ Compound S-470
$Z_1 = Z_2 = Se$ Compound Se-470

-continued

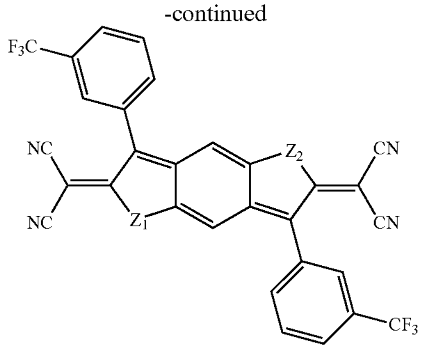

$Z_1 = Z_2 = O$ Compound O-471
$Z_1 = Z_2 = S$ Compound S-471
$Z_1 = Z_2 = Se$ Compound Se-471

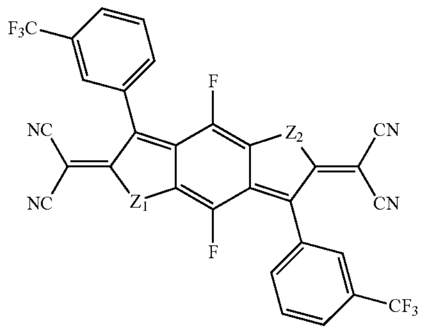

$Z_1 = Z_2 = O$ Compound O-472
$Z_1 = Z_2 = S$ Compound S-472
$Z_1 = Z_2 = Se$ Compound Se-472

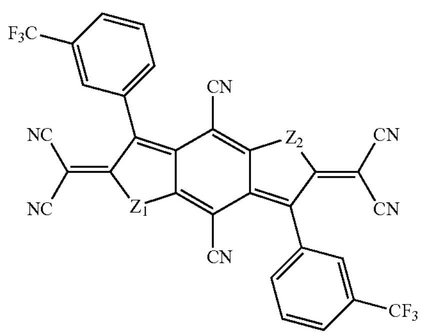

$Z_1 = Z_2 = O$ Compound O-473
$Z_1 = Z_2 = S$ Compound S-473
$Z_1 = Z_2 = Se$ Compound Se-473

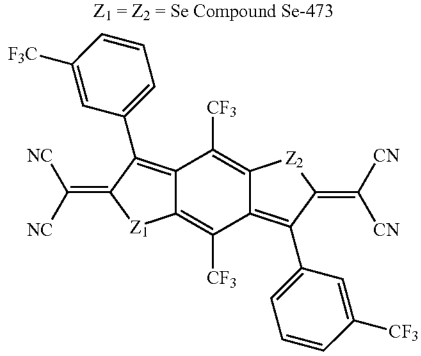

$Z_1 = Z_2 = O$ Compound O-474
$Z_1 = Z_2 = S$ Compound S-474
$Z_1 = Z_2 = Se$ Compound Se-474

-continued

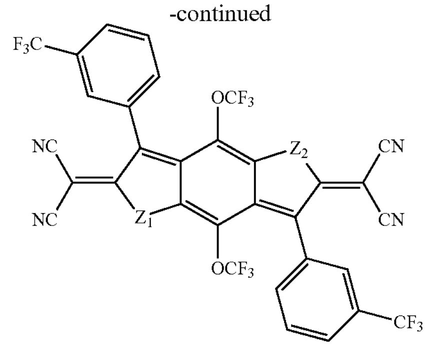

$Z_1 = Z_2 = O$ Compound O-475
$Z_1 = Z_2 = S$ Compound S-475
$Z_1 = Z_2 = Se$ Compound Se-475

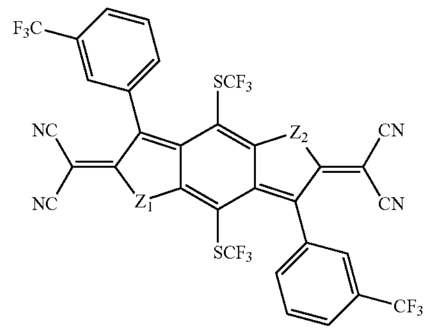

$Z_1 = Z_2 = O$ Compound O-476
$Z_1 = Z_2 = S$ Compound S-476
$Z_1 = Z_2 = Se$ Compound Se-476

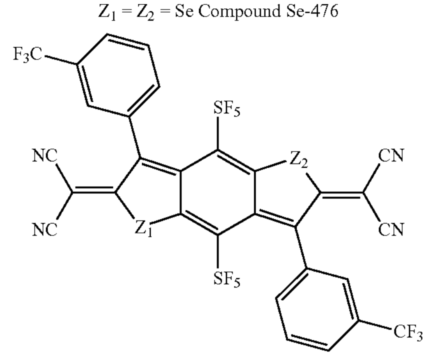

$Z_1 = Z_2 = O$ Compound O-477
$Z_1 = Z_2 = S$ Compound S-477
$Z_1 = Z_2 = Se$ Compound Se-477

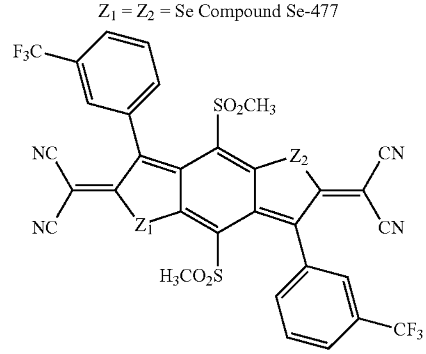

$Z_1 = Z_2 = O$ Compound O-478
$Z_1 = Z_2 = S$ Compound S-478
$Z_1 = Z_2 = Se$ Compound Se-478

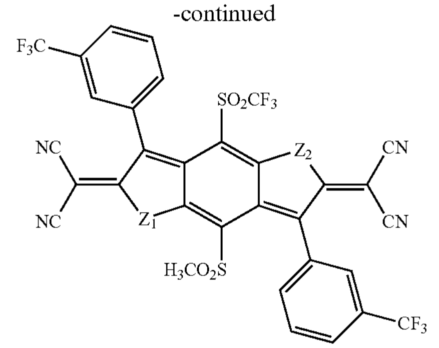

$Z_1 = Z_2 =$ O Compound O-479
$Z_1 = Z_2 =$ S Compound S-479
$Z_1 = Z_2 =$ Se Compound Se-479

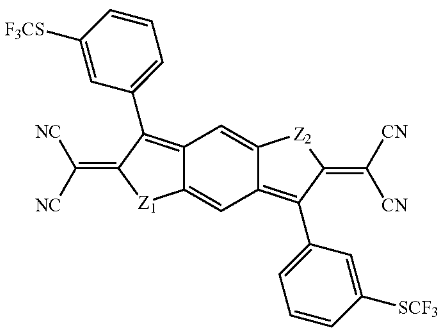

$Z_1 = Z_2 =$ O Compound O-480
$Z_1 = Z_2 =$ S Compound S-480
$Z_1 = Z_2 =$ Se Compound Se-480

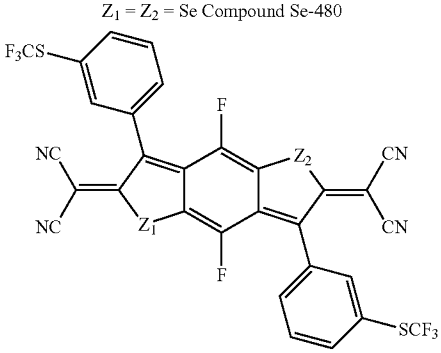

$Z_1 = Z_2 =$ O Compound O-481
$Z_1 = Z_2 =$ S Compound S-481
$Z_1 = Z_2 =$ Se Compound Se-481

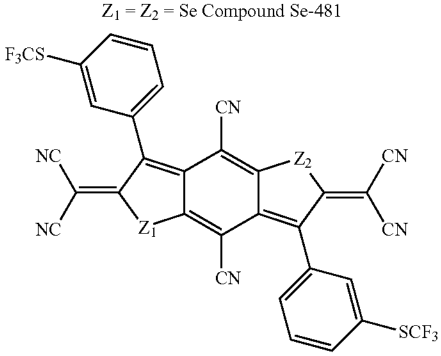

$Z_1 = Z_2 =$ O Compound O-482
$Z_1 = Z_2 =$ S Compound S-482
$Z_1 = Z_2 =$ Se Compound Se-482

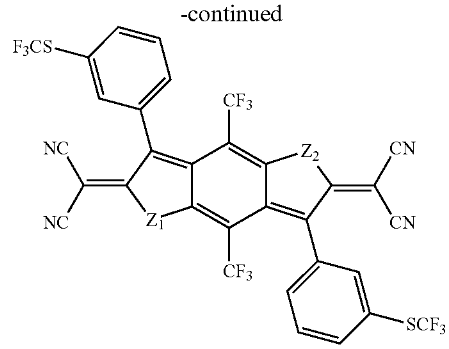

$Z_1 = Z_2 =$ O Compound O-483
$Z_1 = Z_2 =$ S Compound S-483
$Z_1 = Z_2 =$ Se Compound Se-483

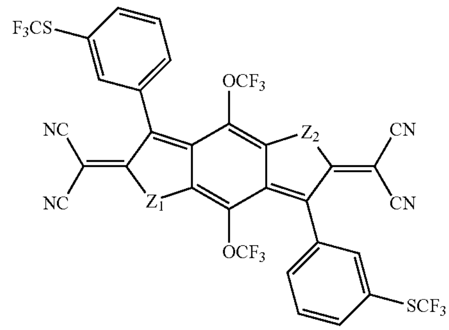

$Z_1 = Z_2 =$ O Compound O-484
$Z_1 = Z_2 =$ S Compound S-484
$Z_1 = Z_2 =$ Se Compound Se-484

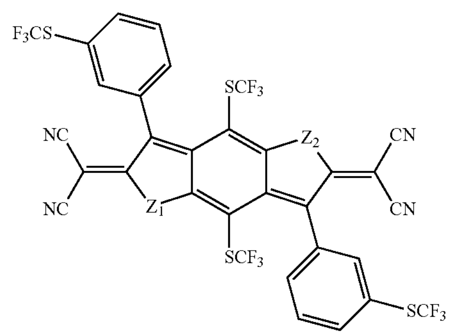

$Z_1 = Z_2 =$ O Compound O-485
$Z_1 = Z_2 =$ S Compound S-485
$Z_1 = Z_2 =$ Se Compound Se-485

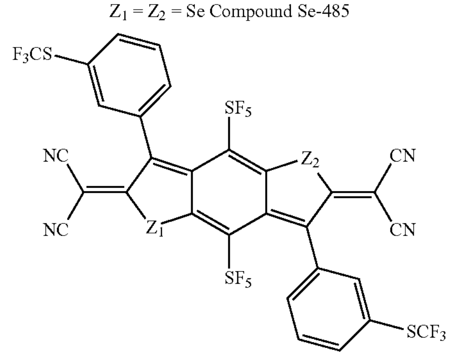

$Z_1 = Z_2 =$ O Compound O-486
$Z_1 = Z_2 =$ S Compound S-486
$Z_1 = Z_2 =$ Se Compound Se-486

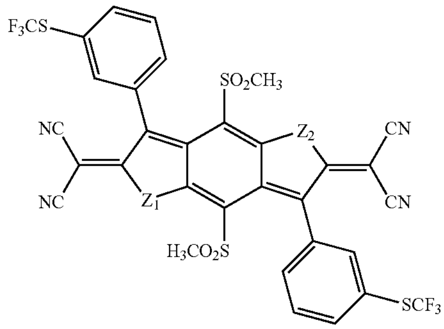

$Z_1 = Z_2 =$ O Compound O-487
$Z_1 = Z_2 =$ S Compound S-487
$Z_1 = Z_2 =$ Se Compound Se-487

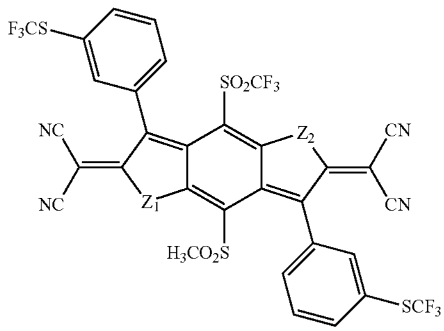

$Z_1 = Z_2 =$ O Compound O-488
$Z_1 = Z_2 =$ S Compound S-488
$Z_1 = Z_2 =$ Se Compound Se-488

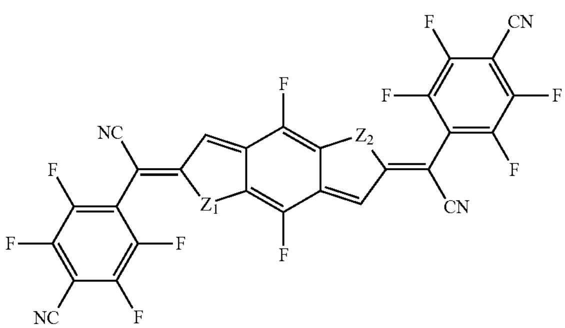

$Z_1 = Z_2 =$ O Compound O-489
$Z_1 = Z_2 =$ S Compound S-489
$Z_1 = Z_2 =$ Se Compound Se-489

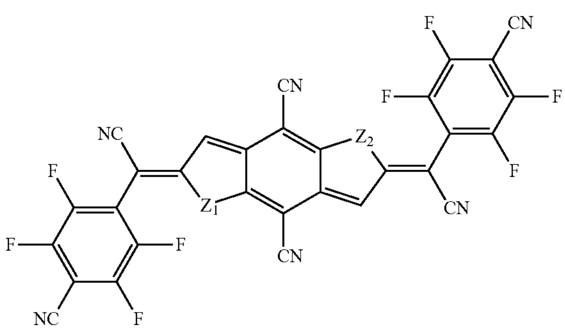

$Z_1 = Z_2 =$ O Compound O-490
$Z_1 = Z_2 =$ S Compound S-490
$Z_1 = Z_2 =$ Se Compound Se-490

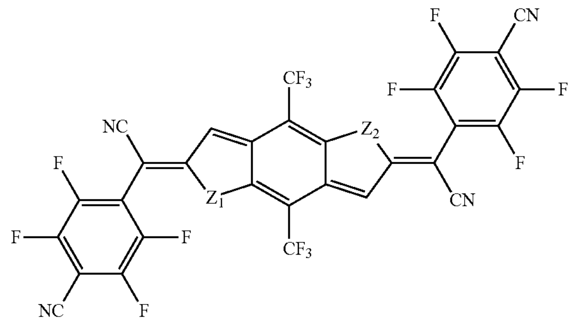

$Z_1 = Z_2 =$ O Compound O-491
$Z_1 = Z_2 =$ S Compound S-491
$Z_1 = Z_2 =$ Se Compound Se-491

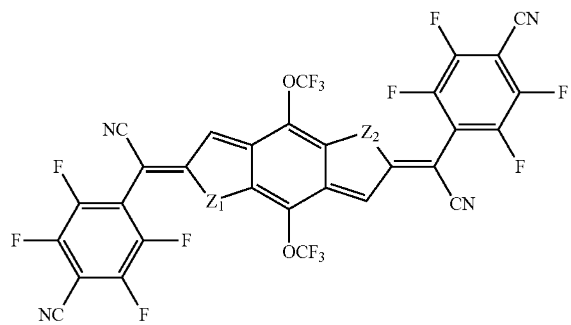

$Z_1 = Z_2 =$ O Compound O-492
$Z_1 = Z_2 =$ S Compound S-492
$Z_1 = Z_2 =$ Se Compound Se-492

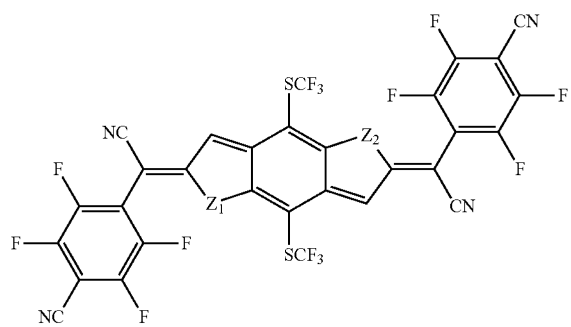

$Z_1 = Z_2 =$ O Compound O-493
$Z_1 = Z_2 =$ S Compound S-493
$Z_1 = Z_2 =$ Se Compound Se-493

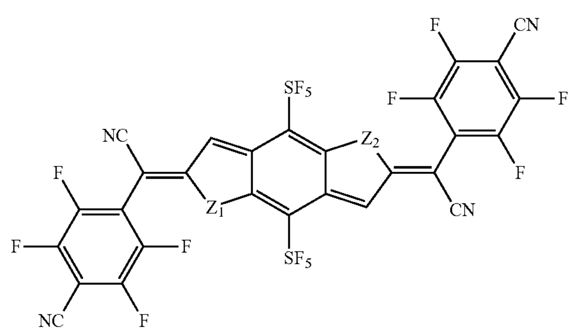

$Z_1 = Z_2 =$ O Compound O-494
$Z_1 = Z_2 =$ S Compound S-494
$Z_1 = Z_2 =$ Se Compound Se-494

-continued

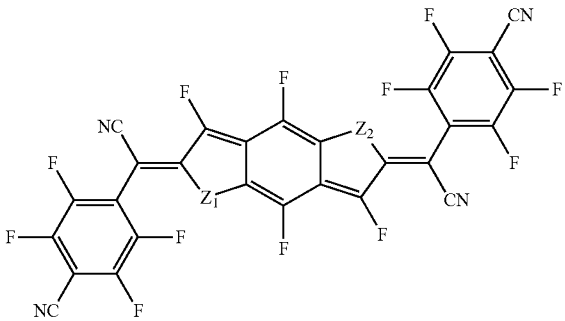

$Z_1 = Z_2 =$ O Compound O-495
$Z_1 = Z_2 =$ S Compound S-495
$Z_1 = Z_2 =$ Se Compound Se-495

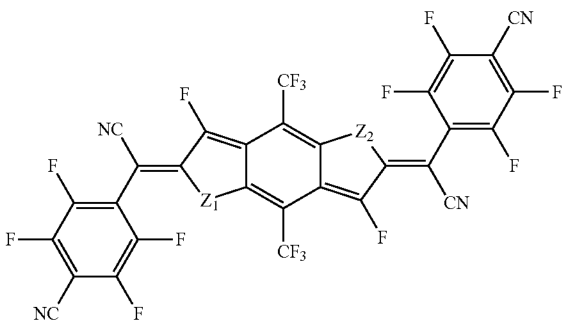

$Z_1 = Z_2 =$ O Compound O-496
$Z_1 = Z_2 =$ S Compound S-496
$Z_1 = Z_2 =$ Se Compound Se-496

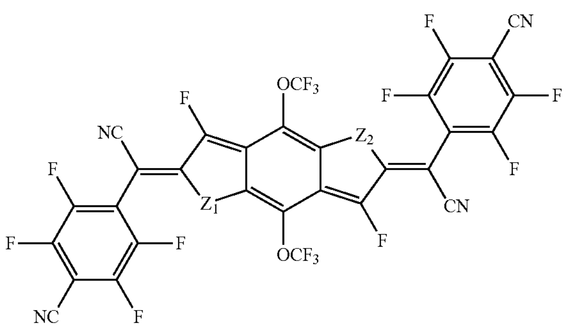

$Z_1 = Z_2 =$ O Compound O-497
$Z_1 = Z_2 =$ S Compound S-497
$Z_1 = Z_2 =$ Se Compound Se-497

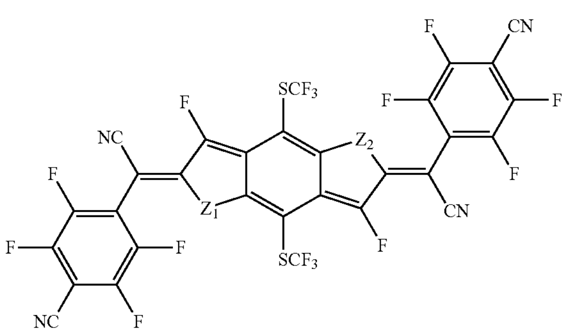

$Z_1 = Z_2 =$ O Compound O-498
$Z_1 = Z_2 =$ S Compound S-498
$Z_1 = Z_2 =$ Se Compound Se-498

-continued

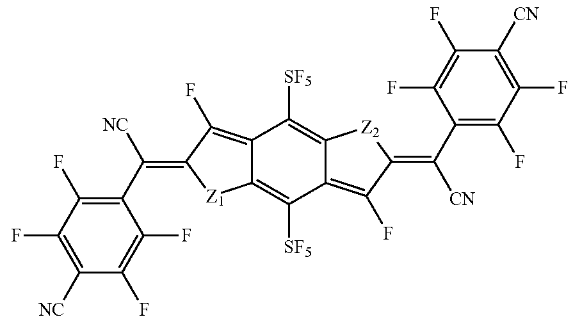

$Z_1 = Z_2 =$ O Compound O-499
$Z_1 = Z_2 =$ S Compound S-499
$Z_1 = Z_2 =$ Se Compound Se-499

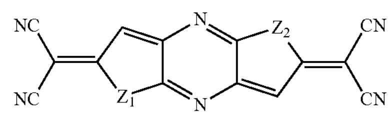

$Z_1 = Z_2 =$ O Compound O-500
$Z_1 = Z_2 =$ S Compound S-500
$Z_1 = Z_2 =$ Se Compound Se-500

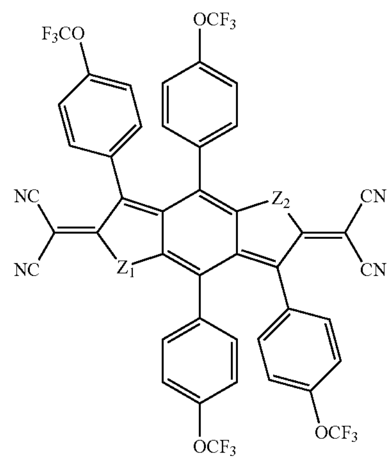

$Z_1 = Z_2 =$ O Compound O-501
$Z_1 = Z_2 =$ S Compound S-501
$Z_1 = Z_2 =$ Se Compound Se-501

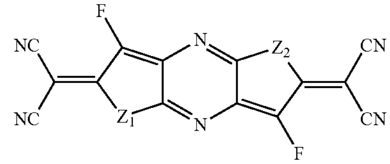

$Z_1 = Z_2 =$ O Compound O-502
$Z_1 = Z_2 =$ S Compound S-502
$Z_1 = Z_2 =$ Se Compound Se-502

-continued

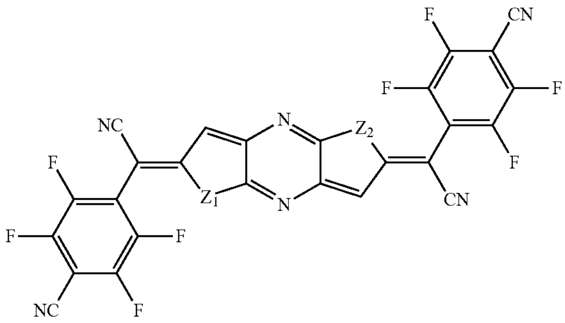

$Z_1 = Z_2 = O$ Compound O-503
$Z_1 = Z_2 = S$ Compound S-503
$Z_1 = Z_2 = Se$ Compound Se-503

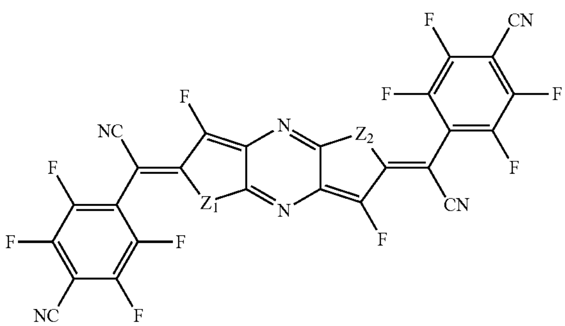

$Z_1 = Z_2 = O$ Compound O-504
$Z_1 = Z_2 = S$ Compound S-504
$Z_1 = Z_2 = Se$ Compound Se-504

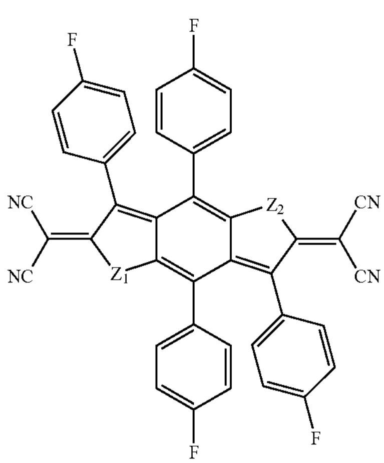

$Z_1 = Z_2 = O$ Compound O-505
$Z_1 = Z_2 = S$ Compound S-505
$Z_1 = Z_2 = Se$ Compound Se-505

-continued

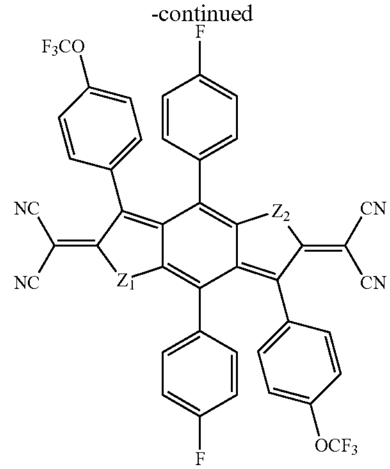

$Z_1 = Z_2 = O$ Compound O-506
$Z_1 = Z_2 = S$ Compound S-506
$Z_1 = Z_2 = Se$ Compound Se-506

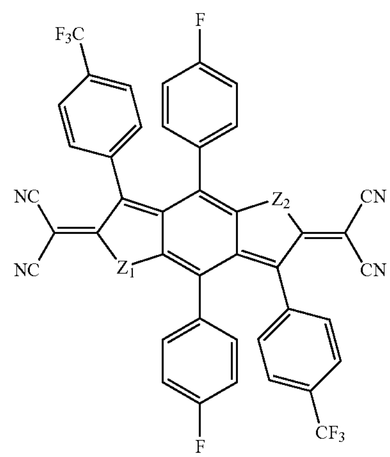

$Z_1 = Z_2 = O$ Compound O-507
$Z_1 = Z_2 = S$ Compound S-507
$Z_1 = Z_2 = Se$ Compound Se-507

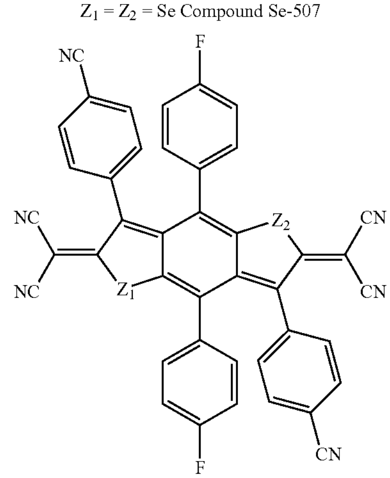

$Z_1 = Z_2 = O$ Compound O-508
$Z_1 = Z_2 = S$ Compound S-508
$Z_1 = Z_2 = Se$ Compound Se-508

-continued

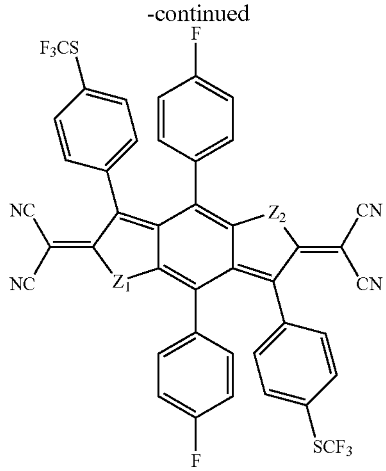

$Z_1 = Z_2 = O$ Compound O-509
$Z_1 = Z_2 = S$ Compound S-509
$Z_1 = Z_2 = Se$ Compound Se-509

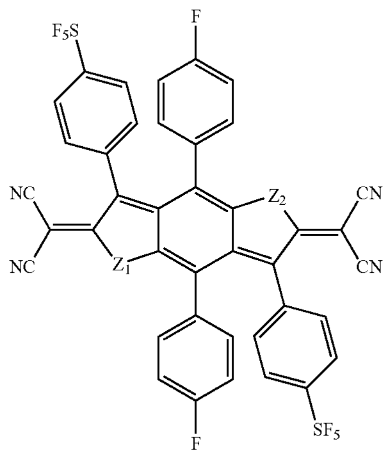

$Z_1 = Z_2 = O$ Compound O-510
$Z_1 = Z_2 = S$ Compound S-510
$Z_1 = Z_2 = Se$ Compound Se-510

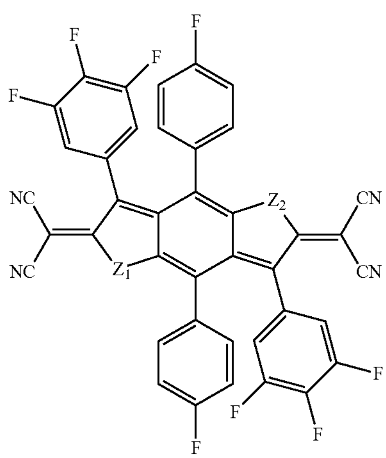

$Z_1 = Z_2 = O$ Compound O-511
$Z_1 = Z_2 = S$ Compound S-511
$Z_1 = Z_2 = Se$ Compound Se-511

-continued

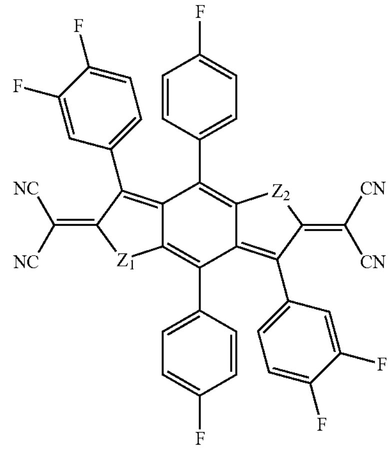

$Z_1 = Z_2 = O$ Compound O-512
$Z_1 = Z_2 = S$ Compound S-512
$Z_1 = Z_2 = Se$ Compound Se-512

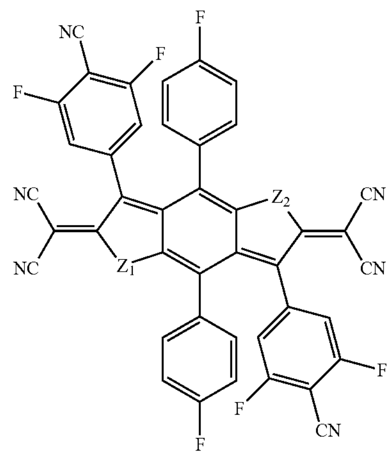

$Z_1 = Z_2 = O$ Compound O-513
$Z_1 = Z_2 = S$ Compound S-513
$Z_1 = Z_2 = Se$ Compound Se-513

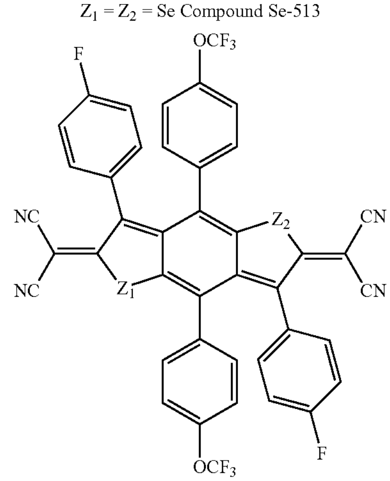

$Z_1 = Z_2 = O$ Compound O-514
$Z_1 = Z_2 = S$ Compound S-514
$Z_1 = Z_2 = Se$ Compound Se-514

-continued

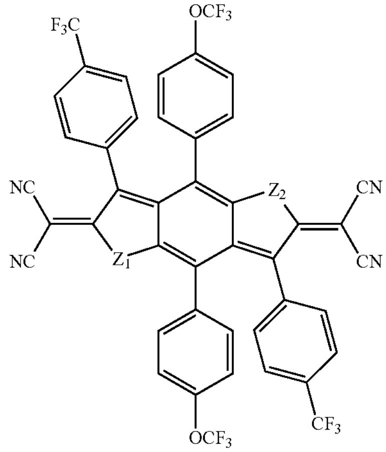

$Z_1 = Z_2 =$ O Compound O-515
$Z_1 = Z_2 =$ S Compound S-515
$Z_1 = Z_2 =$ Se Compound Se-515

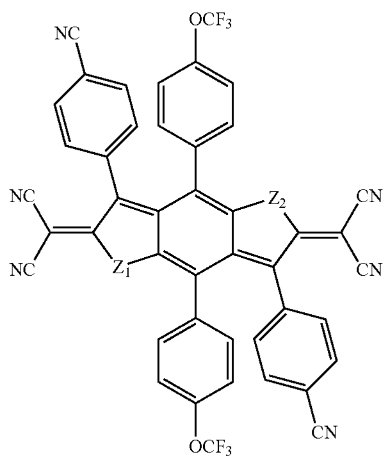

$Z_1 = Z_2 =$ O Compound O-516
$Z_1 = Z_2 =$ S Compound S-516
$Z_1 = Z_2 =$ Se Compound Se-516

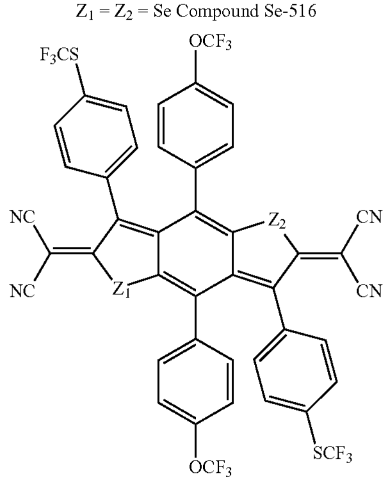

$Z_1 = Z_2 =$ O Compound O-517
$Z_1 = Z_2 =$ S Compound S-517
$Z_1 = Z_2 =$ Se Compound Se-517

-continued

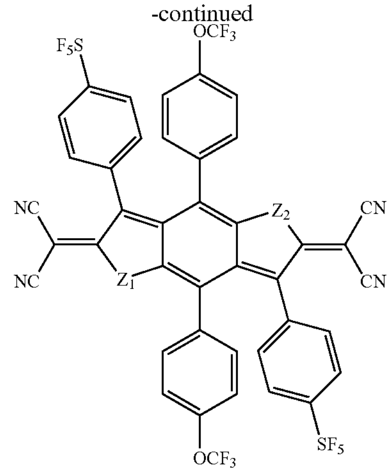

$Z_1 = Z_2 =$ O Compound O-518
$Z_1 = Z_2 =$ S Compound S-518
$Z_1 = Z_2 =$ Se Compound Se-518

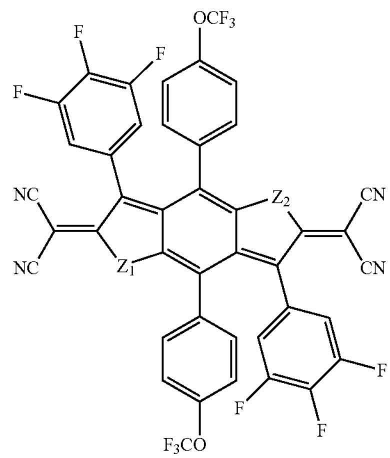

$Z_1 = Z_2 =$ O Compound O-519
$Z_1 = Z_2 =$ S Compound S-519
$Z_1 = Z_2 =$ Se Compound Se-519

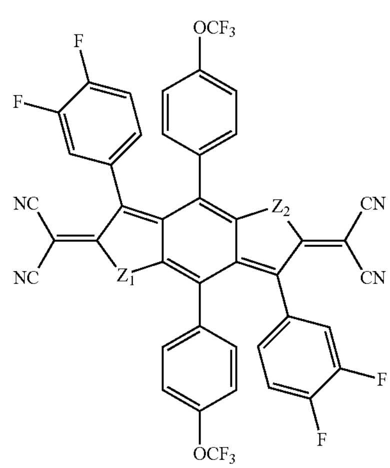

$Z_1 = Z_2 =$ O Compound O-520
$Z_1 = Z_2 =$ S Compound S-520
$Z_1 = Z_2 =$ Se Compound Se-520

-continued

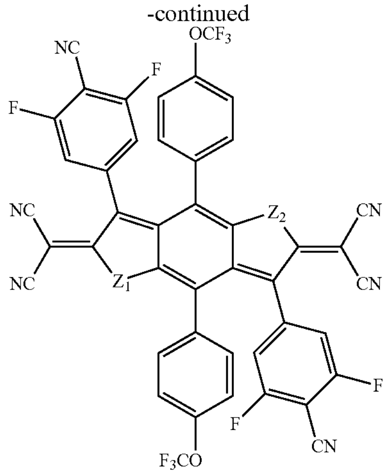

$Z_1 = Z_2 =$ O Compound O-521
$Z_1 = Z_2 =$ S Compound S-521
$Z_1 = Z_2 =$ Se Compound Se-521

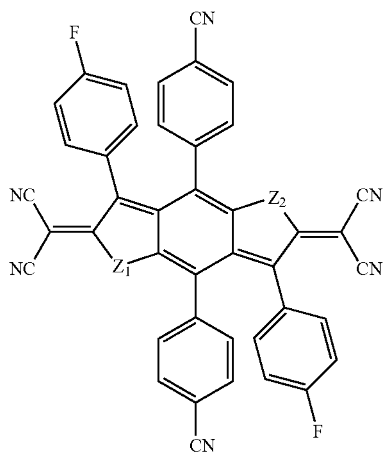

$Z_1 = Z_2 =$ O Compound O-522
$Z_1 = Z_2 =$ S Compound S-522
$Z_1 = Z_2 =$ Se Compound Se-522

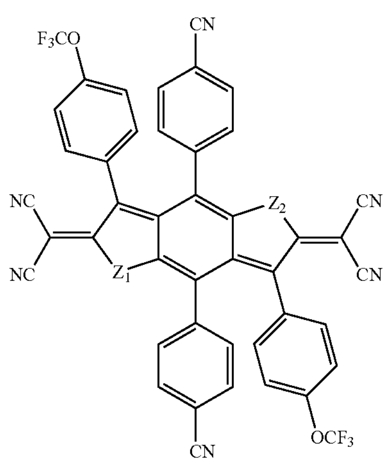

$Z_1 = Z_2 =$ O Compound O-523
$Z_1 = Z_2 =$ S Compound S-523
$Z_1 = Z_2 =$ Se Compound Se-523

-continued

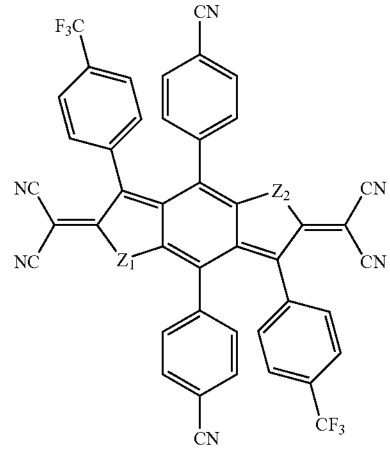

$Z_1 = Z_2 =$ O Compound O-524
$Z_1 = Z_2 =$ S Compound S-524
$Z_1 = Z_2 =$ Se Compound Se-524

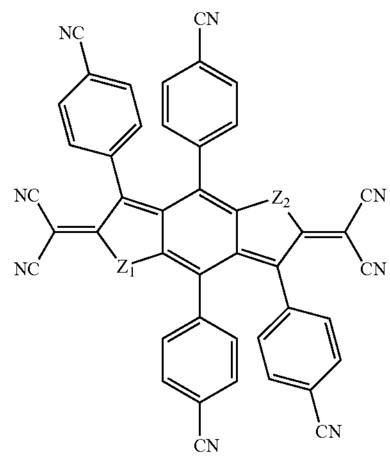

$Z_1 = Z_2 =$ O Compound O-525
$Z_1 = Z_2 =$ S Compound S-525
$Z_1 = Z_2 =$ Se Compound Se-525

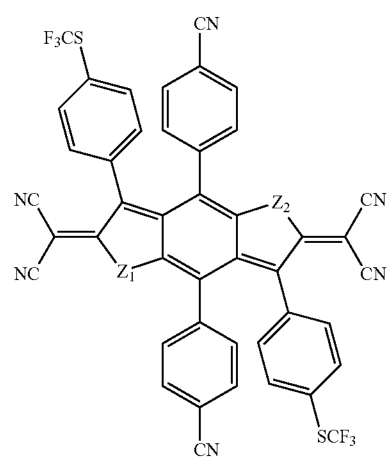

$Z_1 = Z_2 =$ O Compound O-526
$Z_1 = Z_2 =$ S Compound S-526
$Z_1 = Z_2 =$ Se Compound Se-526

-continued

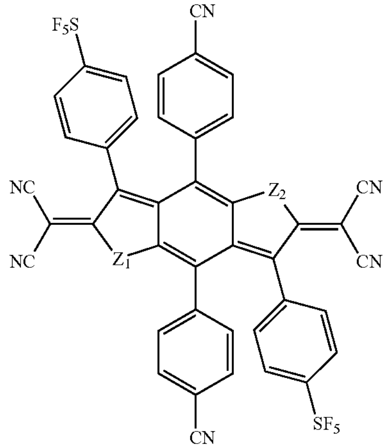

$Z_1 = Z_2 = O$ Compound O-527
$Z_1 = Z_2 = S$ Compound S-527
$Z_1 = Z_2 = Se$ Compound Se-527

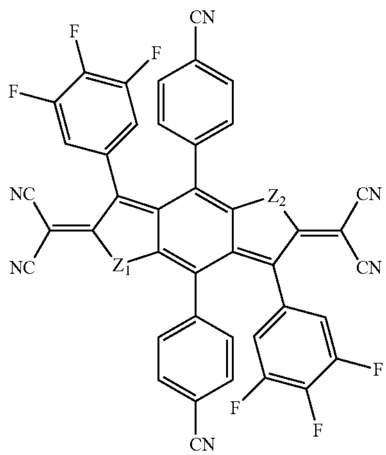

$Z_1 = Z_2 = O$ Compound O-528
$Z_1 = Z_2 = S$ Compound S-528
$Z_1 = Z_2 = Se$ Compound Se-528

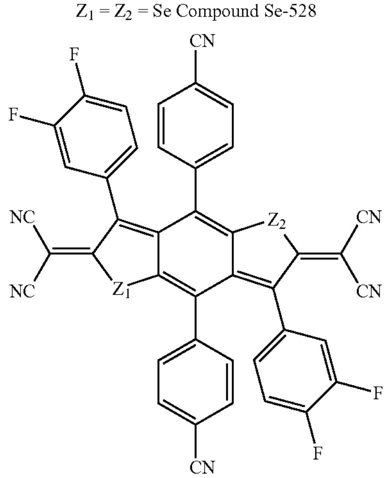

$Z_1 = Z_2 = O$ Compound O-529
$Z_1 = Z_2 = S$ Compound S-529
$Z_1 = Z_2 = Se$ Compound Se-529

-continued

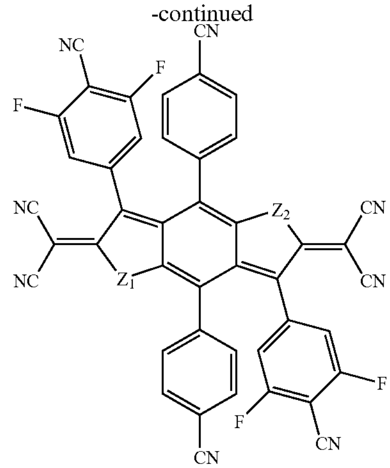

$Z_1 = Z_2 = O$ Compound O-530
$Z_1 = Z_2 = S$ Compound S-530
$Z_1 = Z_2 = Se$ Compound Se-530

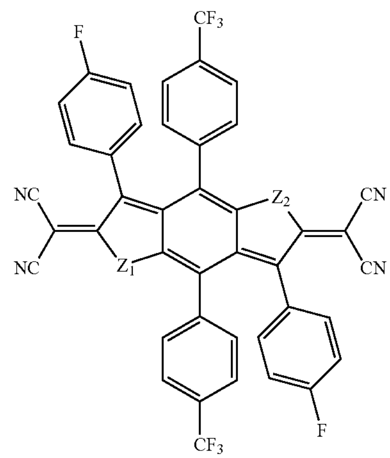

$Z_1 = Z_2 = O$ Compound O-531
$Z_1 = Z_2 = S$ Compound S-531
$Z_1 = Z_2 = Se$ Compound Se-531

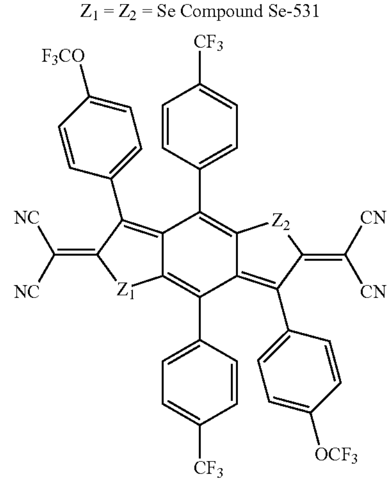

$Z_1 = Z_2 = O$ Compound O-532
$Z_1 = Z_2 = S$ Compound S-532
$Z_1 = Z_2 = Se$ Compound Se-532

-continued

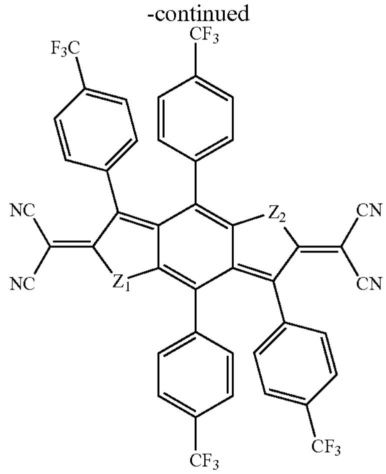

$Z_1 = Z_2 = O$ Compound O-533
$Z_1 = Z_2 = S$ Compound S-533
$Z_1 = Z_2 = Se$ Compound Se-533

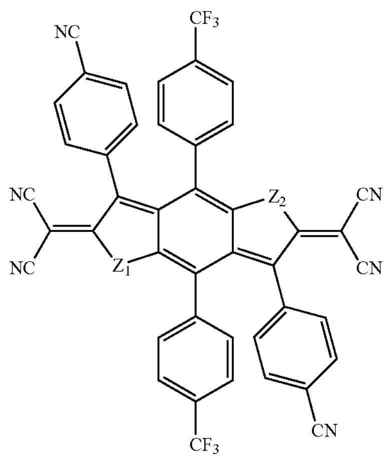

$Z_1 = Z_2 = O$ Compound O-534
$Z_1 = Z_2 = S$ Compound S-534
$Z_1 = Z_2 = Se$ Compound Se-534

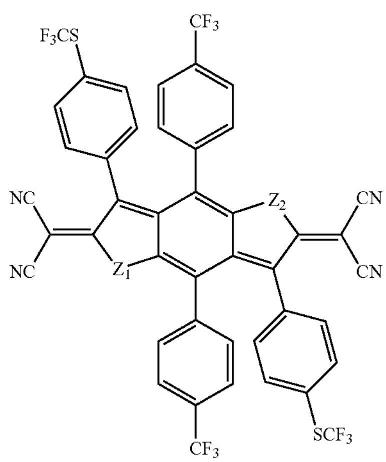

$Z_1 = Z_2 = O$ Compound O-535
$Z_1 = Z_2 = S$ Compound S-535
$Z_1 = Z_2 = Se$ Compound Se-535

-continued

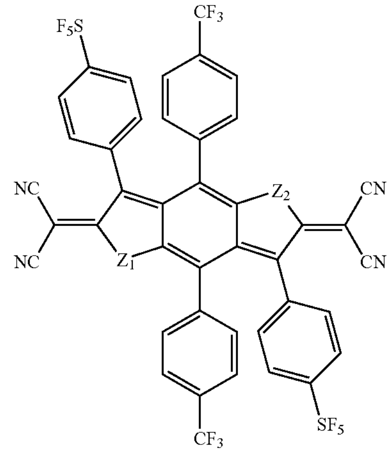

$Z_1 = Z_2 = O$ Compound O-536
$Z_1 = Z_2 = S$ Compound S-536
$Z_1 = Z_2 = Se$ Compound Se-536

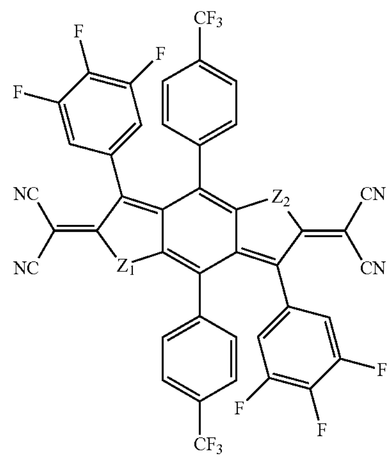

$Z_1 = Z_2 = O$ Compound O-537
$Z_1 = Z_2 = S$ Compound S-537
$Z_1 = Z_2 = Se$ Compound Se-537

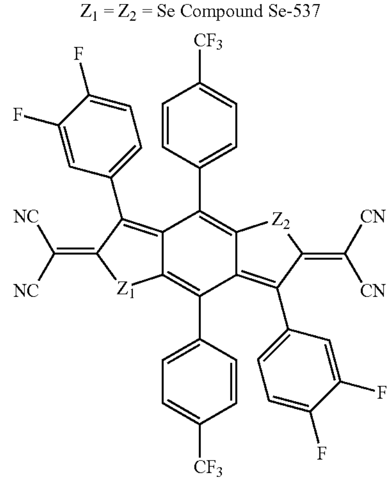

$Z_1 = Z_2 = O$ Compound O-538
$Z_1 = Z_2 = S$ Compound S-538
$Z_1 = Z_2 = Se$ Compound Se-538

-continued

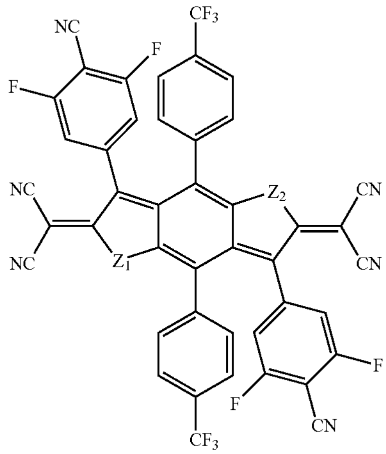

$Z_1 = Z_2 = O$ Compound O-539
$Z_1 = Z_2 = S$ Compound S-539
$Z_1 = Z_2 = Se$ Compound Se-539

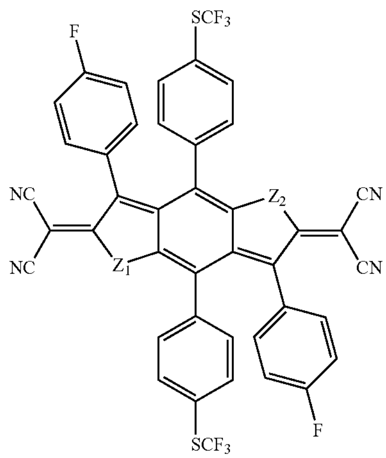

$Z_1 = Z_2 = O$ Compound O-540
$Z_1 = Z_2 = S$ Compound S-540
$Z_1 = Z_2 = Se$ Compound Se-540

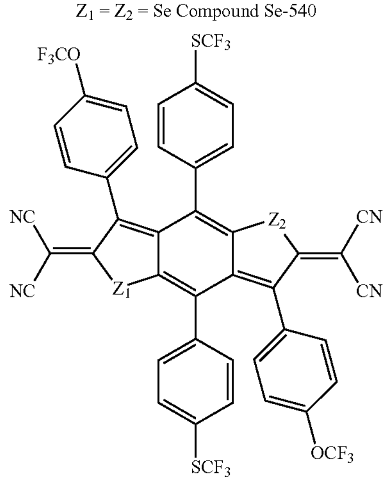

$Z_1 = Z_2 = O$ Compound O-541
$Z_1 = Z_2 = S$ Compound S-541
$Z_1 = Z_2 = Se$ Compound Se-541

-continued

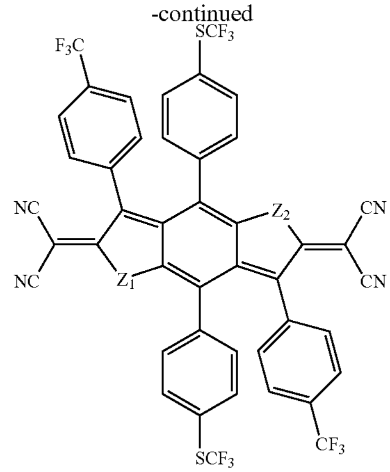

$Z_1 = Z_2 = O$ Compound O-542
$Z_1 = Z_2 = S$ Compound S-542
$Z_1 = Z_2 = Se$ Compound Se-542

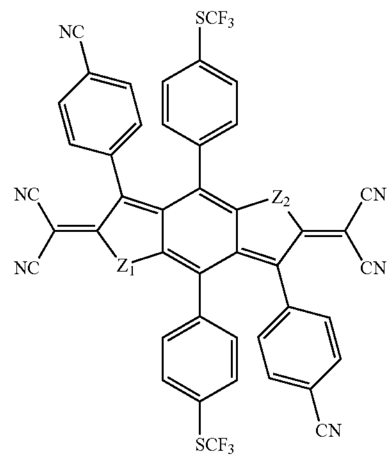

$Z_1 = Z_2 = O$ Compound O-543
$Z_1 = Z_2 = S$ Compound S-543
$Z_1 = Z_2 = Se$ Compound Se-543

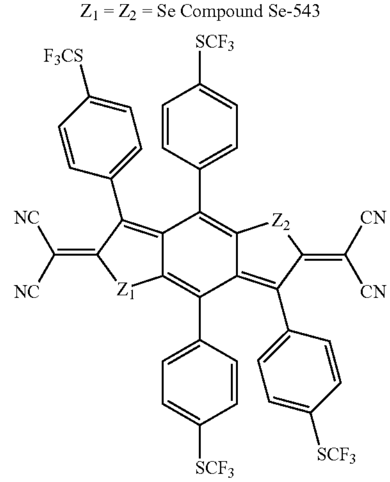

$Z_1 = Z_2 = O$ Compound O-544
$Z_1 = Z_2 = S$ Compound S-544
$Z_1 = Z_2 = Se$ Compound Se-544

-continued

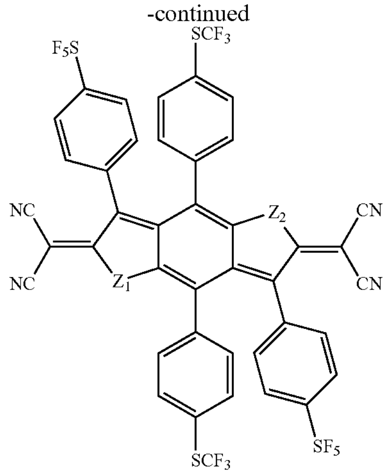

$Z_1 = Z_2 = O$ Compound O-545
$Z_1 = Z_2 = S$ Compound S-545
$Z_1 = Z_2 = Se$ Compound Se-545

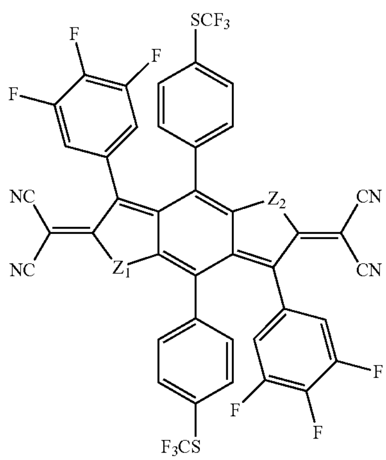

$Z_1 = Z_2 = O$ Compound O-546
$Z_1 = Z_2 = S$ Compound S-546
$Z_1 = Z_2 = Se$ Compound Se-546

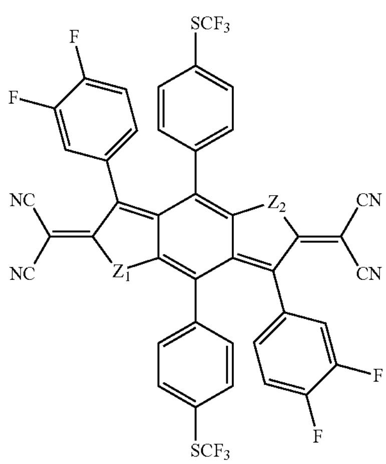

$Z_1 = Z_2 = O$ Compound O-547
$Z_1 = Z_2 = S$ Compound S-547
$Z_1 = Z_2 = Se$ Compound Se-547

-continued

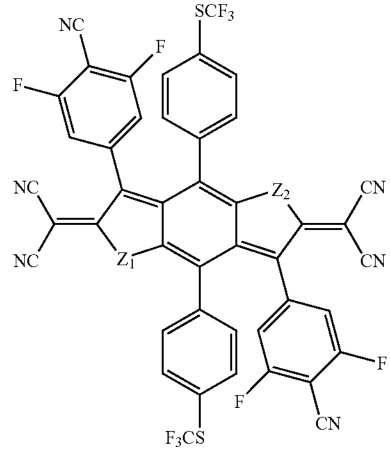

$Z_1 = Z_2 = O$ Compound O-548
$Z_1 = Z_2 = S$ Compound S-548
$Z_1 = Z_2 = Se$ Compound Se-548

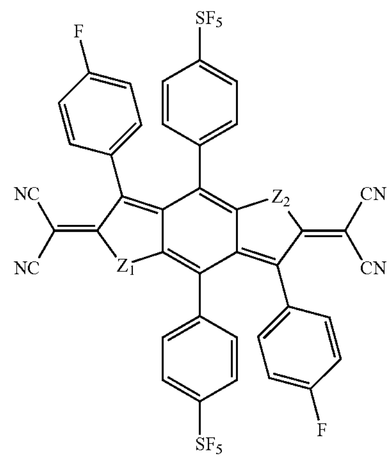

$Z_1 = Z_2 = O$ Compound O-549
$Z_1 = Z_2 = S$ Compound S-549
$Z_1 = Z_2 = Se$ Compound Se-549

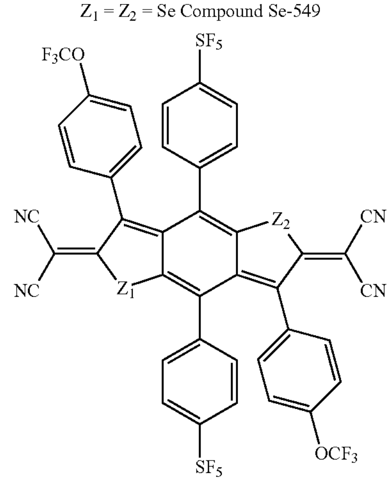

$Z_1 = Z_2 = O$ Compound O-550
$Z_1 = Z_2 = S$ Compound S-550
$Z_1 = Z_2 = Se$ Compound Se-550

-continued

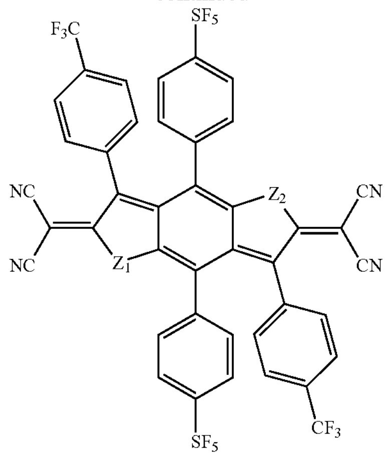

$Z_1 = Z_2 =$ O Compound O-551
$Z_1 = Z_2 =$ S Compound S-551
$Z_1 = Z_2 =$ Se Compound Se-551

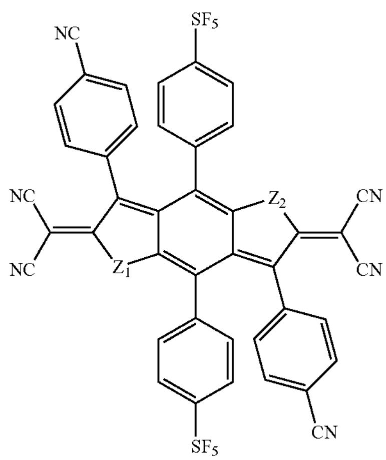

$Z_1 = Z_2 =$ O Compound O-552
$Z_1 = Z_2 =$ S Compound S-552
$Z_1 = Z_2 =$ Se Compound Se-552

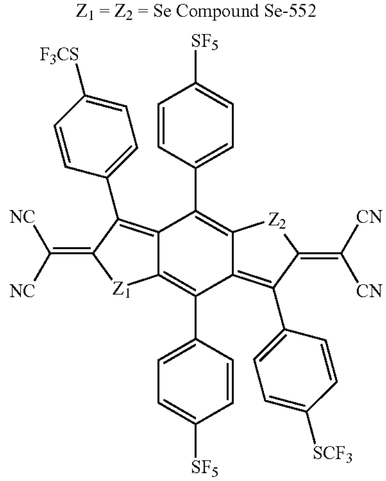

$Z_1 = Z_2 =$ O Compound O-553
$Z_1 = Z_2 =$ S Compound S-553
$Z_1 = Z_2 =$ Se Compound Se-553

-continued

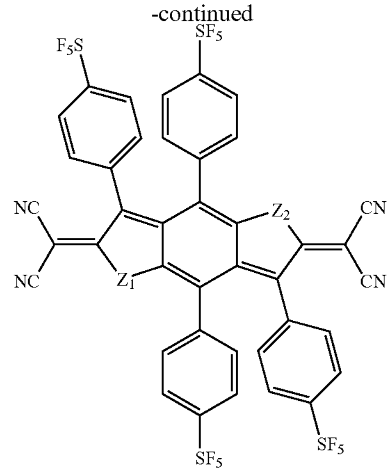

$Z_1 = Z_2 =$ O Compound O-554
$Z_1 = Z_2 =$ S Compound S-554
$Z_1 = Z_2 =$ Se Compound Se-554

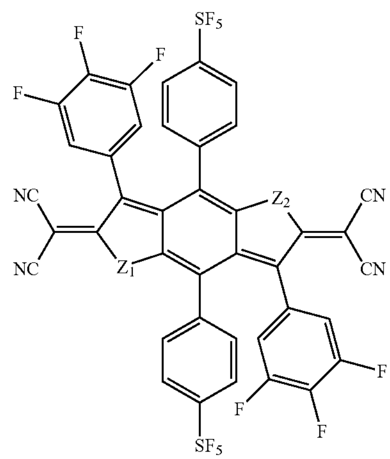

$Z_1 = Z_2 =$ O Compound O-555
$Z_1 = Z_2 =$ S Compound S-555
$Z_1 = Z_2 =$ Se Compound Se-555

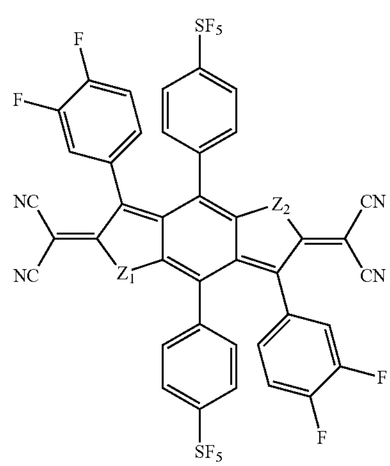

$Z_1 = Z_2 =$ O Compound O-556
$Z_1 = Z_2 =$ S Compound S-556
$Z_1 = Z_2 =$ Se Compound Se-556

-continued

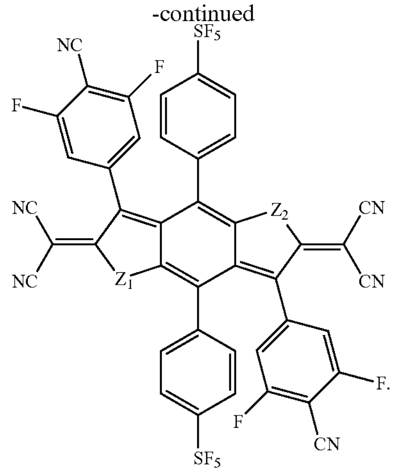

$Z_1 = Z_2 = O$ Compound O-557

$Z_1 = Z_2 = S$ Compound S-557

$Z_1 = Z_2 = Se$ Compound Se-557

In one embodiment of the present invention, an electroluminescent device is disclosed, which comprises:

an anode, a cathode, and an organic layer disposed between the anode and the cathode, wherein comprising a compound having Formula 1:

Formula 1

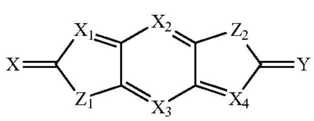

wherein $X_1$, $X_2$, $X_3$, and $X_4$ are each independently selected from the group consisting of CR, and N; when $X_1$, $X_2$, $X_3$, and $X_4$ are each independently selected from CR, each R may be same or different, and at least one of R comprises at least one electron withdrawing group;

$Z_1$ and $Z_2$ are each independently selected from the group consisting of O, S, Se, S═O, and $SO_2$;

X and Y are each independently selected from the group consisting of S, Se, NR', or CR"R'";

R, R', R", and R'" are each independently selected from the group consisting of hydrogen, deuterium, halogen, a substituted or unsubstituted alkyl group having 1 to 20 carbon atoms, a substituted or unsubstituted cycloalkyl group having 3 to 20 ring carbon atoms, a substituted or unsubstituted heteroalkyl group having 1 to 20 carbon atoms, a substituted or unsubstituted arylalkyl group having 7 to 30 carbon atoms, a substituted or unsubstituted alkoxy group having 1 to 20 carbon atoms, a substituted or unsubstituted aryloxy group having 6 to 30 carbon atoms, a substituted or unsubstituted alkenyl group having 2 to 20 carbon atoms, a substituted or unsubstituted aryl group having 6 to 30 carbon atoms, a substituted or unsubstituted heteroaryl group having 3 to 30 carbon atoms, a substituted or unsubstituted alkylsilyl group having 3 to 20 carbon atoms, a substituted or unsubstituted arylsilyl group having 6 to 20 carbon atoms, a substituted or unsubstituted amino group having 0 to 20 carbon atoms, an acyl group, a carbonyl group, a carboxylic acid group, an ester group, a nitrile group, an isonitrile group, a sulfanyl group, a sulfinyl group, a sulfonyl group, a phosphino group, and combinations thereof;

Any adjacent substitution can be optionally joined to form a ring or fused structure.

In one embodiment of the present invention, wherein the organic layer is a charge transporting layer.

In one embodiment of the present invention, wherein the organic layer is a hole injection layer.

In one embodiment of the present invention, wherein the organic layer is a charge transporting layer, and the organic layer further comprises an arylamine compound.

In one embodiment of the present invention, wherein the organic layer is a hole injection layer, and the organic layer further comprises an arylamine compound.

In one embodiment of the present invention, wherein the device further comprises a light emitting layer.

In yet another embodiment of the present invention, an organic light-emitting device is also disclosed. The organic light-emitting device comprises a plurality of stacks between an anode and a cathode is disclosed, the stacks comprise a first light-emitting layer and a second light-emitting layer, wherein the first stack comprises a first light-emitting layer, the second stack comprises a second light-emitting layer, and a charge generation layer is disposed between the first stack and the second stack, wherein the charge generation layer comprises a p type charge generation layer and an n type charge generation layer, wherein the p type charge generation layer comprises a compound according to Formula 1:

Formula 1

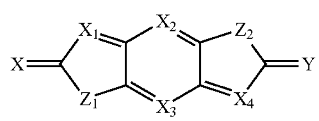

wherein $X_1$, $X_2$, $X_3$, and $X_4$ are each independently selected from the group consisting of CR, and N; when $X_1$, $X_2$, $X_3$, and $X_4$ are each independently selected from CR, each R may be same or different, and at least one of R comprises at least one electron withdrawing group;

$Z_1$ and $Z_2$ are each independently selected from the group consisting of O, S, Se, S═O, and $SO_2$;

X and Y are each independently selected from the group consisting of S, Se, NR', or CR"R'";

R, R', R", and R'" are each independently selected from the group consisting of hydrogen, deuterium, halogen, a substituted or unsubstituted alkyl group having 1 to 20 carbon atoms, a substituted or unsubstituted cycloalkyl group having 3 to 20 ring carbon atoms, a substituted or unsubstituted heteroalkyl group having 1 to 20 carbon atoms, a substituted or unsubstituted arylalkyl group having 7 to 30 carbon atoms, a substituted or unsubstituted alkoxy group having 1 to 20 carbon atoms, a substituted or unsubstituted aryloxy group having 6 to 30 carbon atoms, a substituted or unsubstituted alkenyl group having 2 to 20 carbon atoms, a substituted or unsubstituted aryl group having 6 to 30 carbon atoms, a substituted or unsubstituted heteroaryl group having 3 to 30 carbon atoms, a substituted or unsubstituted alkylsilyl group having 3 to 20 carbon atoms, a substituted or unsubstituted arylsilyl group having 6 to 20 carbon atoms, a substituted or unsubstituted amino group having 0 to 20 carbon atoms, an acyl group, a carbonyl group, a carboxylic acid group, an ester group, a nitrile group, an isonitrile group, a sulfanyl group, a sulfinyl group, a sulfonyl group, a phosphino group, and combinations thereof;

Any adjacent substitution can be optionally joined to form a ring or fused structure.

Combination with Other Materials

The materials described herein as useful for a particular layer in an organic light emitting device may be used in combination with a wide variety of other materials present in the device. The combinations of these materials are described in more detail in U.S. Pat. App. No. 20160359122 at paragraphs 0132-0161, which are incorporated by reference in its entirety. The materials described or referred to the disclosure are non-limiting examples of materials that may be useful in combination with the compounds disclosed herein, and one of skill in the art can readily consult the literature to identify other materials that may be useful in combination.

The materials described herein as useful for a particular layer in an organic light emitting device may be used in combination with a variety of other materials present in the device. For example, materials disclosed herein may be used in combination with a wide variety of emitters, hosts, transport layers, blocking layers, injection layers, electrodes and other layers that may be present. The combination of these materials is described in detail in paragraphs 0080-0101 of U.S. Pat. App. No. 20150349273, which are incorporated by reference in its entirety. The materials described or referred to the disclosure are non-limiting examples of materials that may be useful in combination with the compounds disclosed herein, and one of skill in the art can readily consult the literature to identify other materials that may be useful in combination.

In the embodiments of material synthesis, all reactions were performed under nitrogen protection unless otherwise stated. All reaction solvents were anhydrous and used as received from commercial sources. Synthetic products were structurally confirmed and tested for properties using one or more conventional equipment in the art (including, but not limited to, nuclear magnetic resonance instrument produced by BRUKER, liquid chromatograph produced by SHIMADZU, liquid chromatography-mass spectrometer produced by SHIMADZU, gas chromatography-mass spectrometer produced by SHIMADZU, differential Scanning calorimeters produced by SHIMADZU, fluorescence spectrophotometer produced by SHANGHAI LENGGUANG TECH., electrochemical workstation produced by WUHAN CORRTEST, and sublimation apparatus produced by ANHUI BEQ, etc.) by methods well known to the persons skilled in the art. In the embodiments of the device, the characteristics of the device were also tested using conventional equipment in the art (including, but not limited to, evaporator produced by ANGSTROM ENGINEERING, optical testing system produced by SUZHOU FATAR, life testing system produced by SUZHOU FATAR, and ellipsometer produced by BEIJING ELLITOP, etc.) by methods well known to the persons skilled in the art. As the persons skilled in the art are aware of the above-mentioned equipment use, test methods and other related contents, the inherent data of the sample can be obtained with certainty and without influence, so the above related contents are not further described in this patent.

Synthesis Examples:

The method for preparing the compounds of the present invention is not limited. The following compounds are exemplified as a typical but non-limiting example, and the synthesis route and preparation method are as follows:

Synthesis Example 1: Synthesis of S-1

Step 1: Synthesis of S-1-1

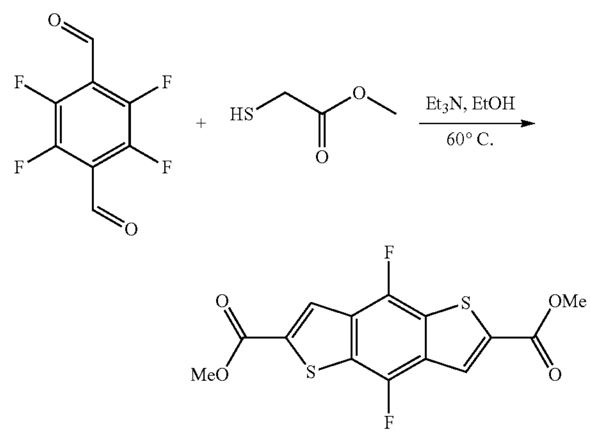

S-1-1

To a solution of 2,3,5,6-tetrafluoroterephthalaldehyde (15.6 g, 75.7 mmol) and triethylamine (42 mL, 303 mmol) in ethanol (300 mL) was added methyl 2-mercaptoacetate (14 mL, 159 mmol) dropwise at room temperature, then stirred at 60° C. for 12 hours. The solution was cooled to room temperature and filtered, the solid was washed with small amount of ethanol to obtain intermediate S-1-1 as yellow solid (20 g, 77% yield).

Step 2: Synthesis of S-1-2

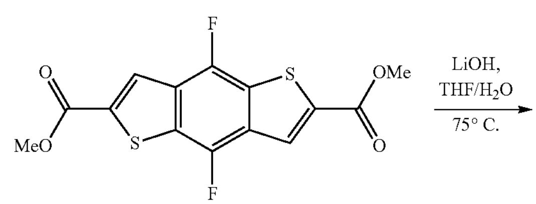

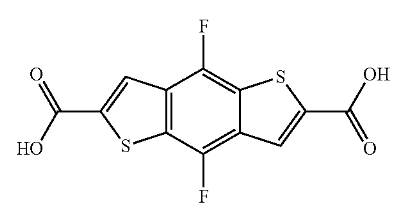

S-1-2

To a suspension of dimethyl 4,8-difluorobenzo[1,2-b:4,5-b']dithiophene-2,6-dicarboxylate (20 g, 58.5 mmol) in THF (200 mL) was added aqueous lithium hydroxide (234 mL, 1N), then stirred at 75° C. for 12 hours. The solution was cooled to room temperature and HCl (500 mL, 2 N) was added, the solid was collected by filtration and washed with small amount of water, vacuum dried to obtain intermediate S-1-2 as yellow solid (19 g, 99% yield).

Step 3: Synthesis of S-1-3

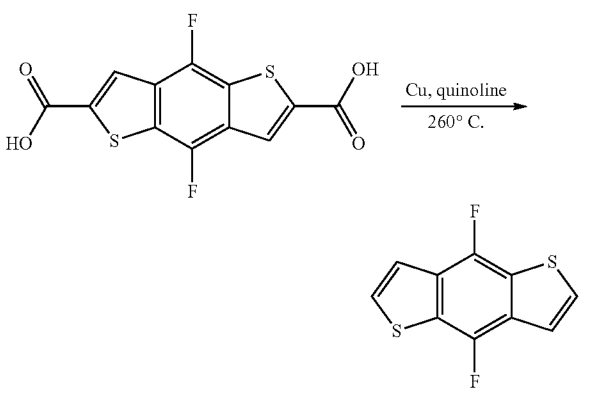

S-1-3

To a suspension of 4,8-difluorobenzo[1,2-b:4,5-b']dithiophene-2,6-dicarboxylic acid (20 g, 58.5 mmol) in quinoline (100 mL) was added copper powder (750 mg, 11.7 mmol), then stirred at 260° C. for 3 hours. The solution was cooled to room temperature and added HCl (500 mL, 3N), the mixture was extracted with EA (200 mL*3), organic phase was combined and washed with HCl (300 mL, 3N) and brine successively and dried using magnesium sulfate. A column-chromatography was performed onto the resultant and then recrystallized from n-hexane and DCM to obtain intermediate S-1-3 as white solid (6 g, 45% yield).

Step 4: Synthesis of S-1-4

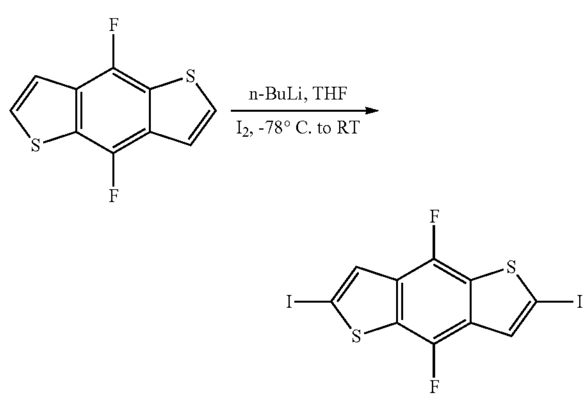

S-1-4

To a solution of 4,8-difluorobenzo[1,2-b:4,5-b']dithiophene (3 g, 13.27 mmol) in THF (130 mL) was n-BuLi (16 mL, 2.5 M) dropwise at −78° C. with stirring, after 1 hour at the same temperature, the reaction temperature was risen to room temperature slowly and stayed at room temperature for 10 minutes. Then the reaction was cooled back to −78° C. with cooling bath and kept for 30 minutes. A solution of iodine (10 g, 39.8 mmol) in THF (20 mL) was added, the cooling bath was removed and stirred overnight. The reaction was quenched with saturated aqueous ammonia chloride (100 mL), the aqueous layer was extracted with DCM (100 mL×3), the organic phase was combined and washed with aqueous sodium thiosulfate (100 mL, 1N) and brine successively and dried using magnesium sulfate. Removed of solvent and recrystallized from DCM to obtain intermediate S-1-4 as white solid (5.3 g, 90% yield).

Step 5: Synthesis of S-1-5

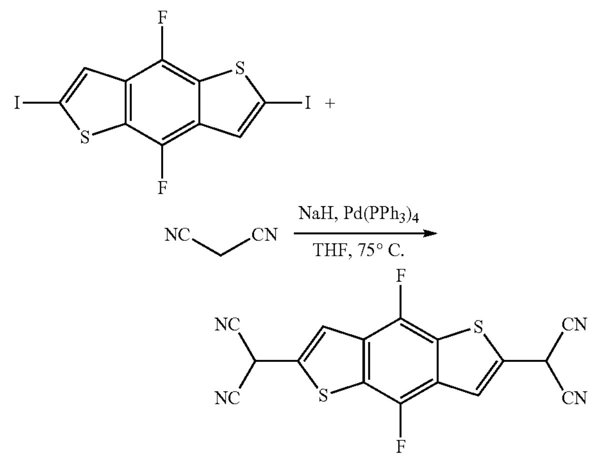

S-1-5

To a solution of malononitrile (1.84 g, 29.5 mmol) in THF (100 mL) was added NaH (2.33 g, 59 mmol) carefully at 0° C. with stirring. After 0.5 hour at the same temperature, 4,8-difluoro-2,6-diiodobenzo[1,2-b:4,5-b']dithiophene (5.3 g, 11.7 mmol) and Tetrakis(triphenylphosphine)palladium (645 mg, 0.59 mmol) was added with bubbling of nitrogen. After 20 minutes, the mixture was heated at 75° C. for 12 hours. The solvent was removed and HCl (100 mL, 2 N) was added, the yellow precipitates was collected by filtration and washed with small amount of water, ethanol and PE, vacuum dried to obtain intermediate S-1-5 as yellow solid (3.4 g, 86% yield).

Step 6: Synthesis of S-1

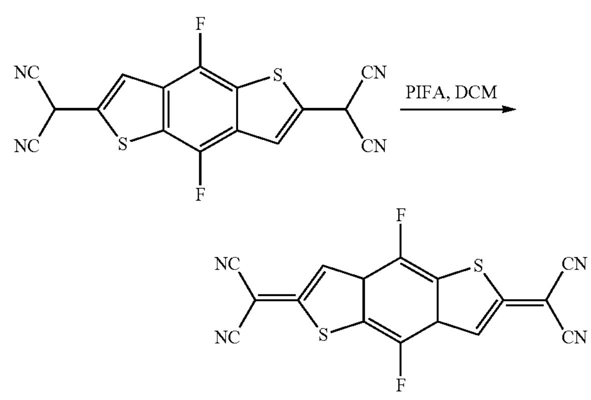

S-1

To a suspension of 2,2'-(4,8-difluorobenzo[1,2-b:4,5-b']dithiophene-2,6-diyl)dimalononitrile (3.4 g, 9 mmol) in DCM (100 mL) was added [Bis(trifluoroacetoxy)iodo]benzene (PIFA, 4.3 g, 9.9 mmol), then stirred for 12 hours at room temperature. The volume of solvent was reduced to approximate 50 mL by vacuum evaporation and the residue mixture was cooled to 0° C., the dark precipitates were collected by filtration and washed with DCM to obtain Compound S-1 as black solid (2.1 g, 65% yield). Further purification was carried out by vacuum sublimation. The product was confirmed as the target product, with a molecular weight of 352.

Synthesis Example 2: Synthesis of S-44

Step 1: Synthesis of S-44-1

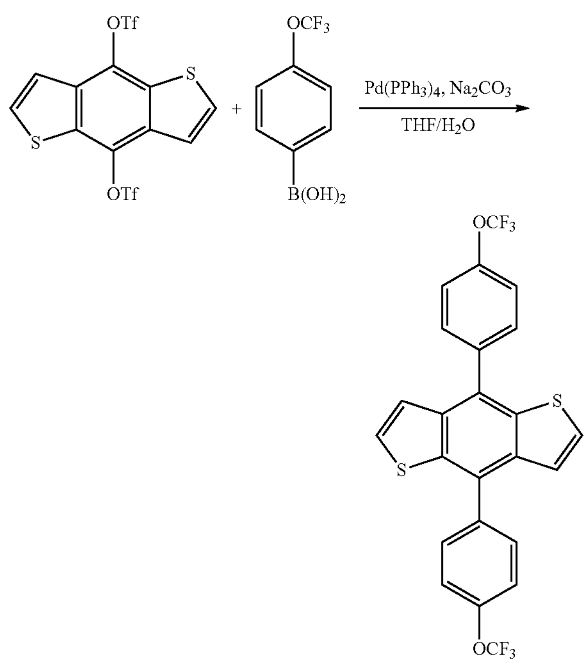

S-44-1

In a 500 mL three-necked round-bottomed flask benzo[1,2-b:4,5-b']dithiophene-4,8-diylbis(trifluoromethanesulfonate) (13 g, 27 mmol) and (4-(trifluoromethoxy)phenyl)boronic acid (13.9 g, 67.5 mmol) were dissolved in THF (200 mL). Tetrakis(triphenylphosphine)palladium(0) (1.55 g, 1.35 mmol) and sodium carbonate solution (135 mL, 1M) were added to the reaction mixture. The reaction mixture was heated at 75° C. for 12 hours. Water was added to the reaction mixture followed by extraction with DCM and washed with brine. The combined organic layers were concentrated. The crude product was purified by column-chromatography to obtain S-44-1 as white solid (11 g, 80% yield).

Step 2: Synthesis of S-44-2

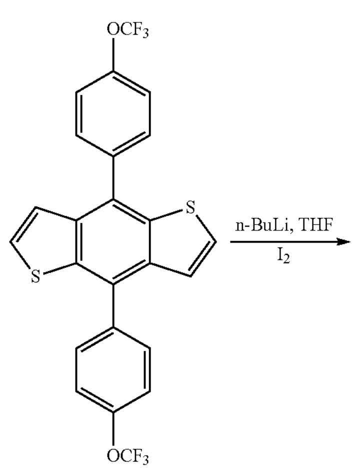

-continued

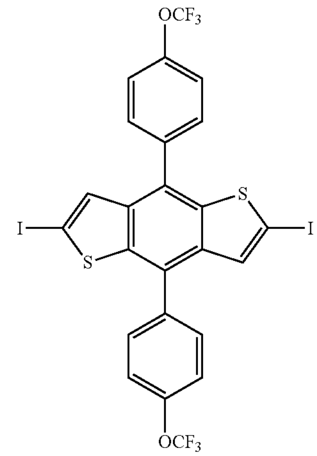

S-44-2

The procedure of the synthesis of S-44-2 was repeated as the synthesis of S-1-4 except for using S-44-1 in place of S-1-3. S-44-2 was obtained as white solid (7.3 g, 80% yield).

Step 3: Synthesis of S-44-3

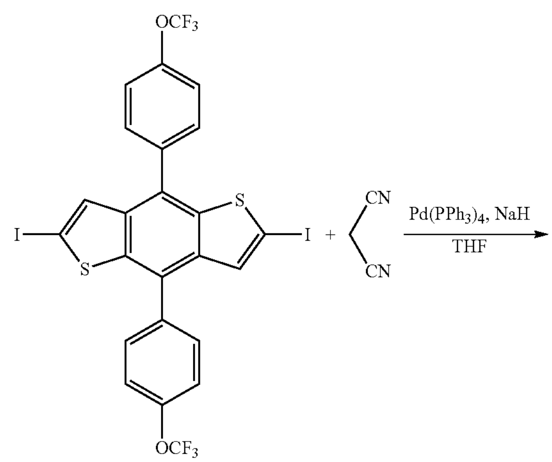

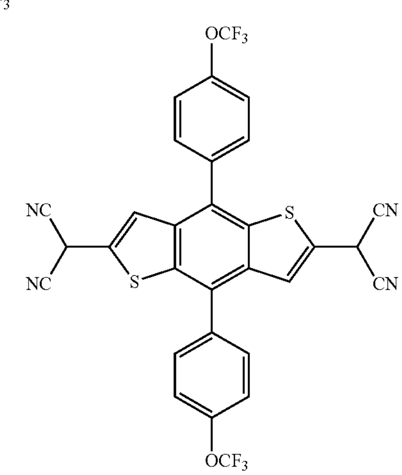

S-44-3

The procedure of the synthesis of S-44-3 was repeated as the synthesis of S-1-5 except for using S-44-2 in place of S-1-4. S-44-3 was obtained as yellow solid (3.6 g, 60% yield).

Step 4: Synthesis of S-44

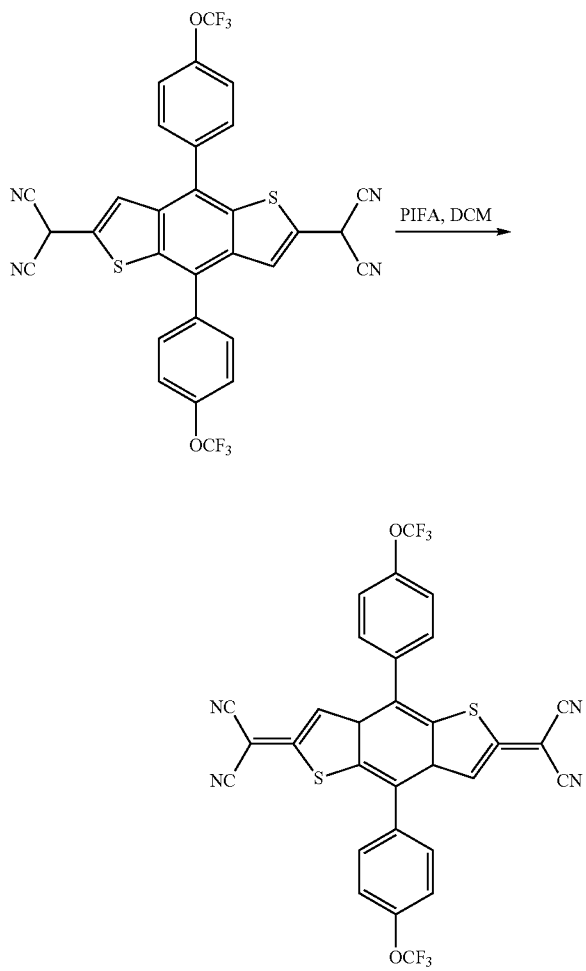

S-44

The procedure of the synthesis of S-44 was repeated as the synthesis of S-1 except for using S-44-3 in place of S-1-5. S-44 was obtained as violet solid (1.7 g, 45% yield). The product was confirmed as the target product, with a molecular weight of 637.

Synthesis Example 3: Synthesis of S-26

Step 1: Synthesis of S-26-1

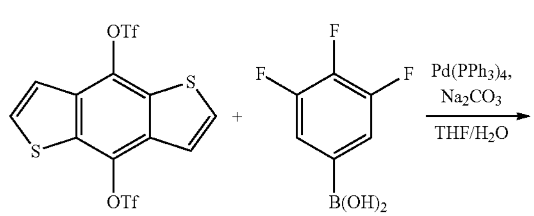

-continued

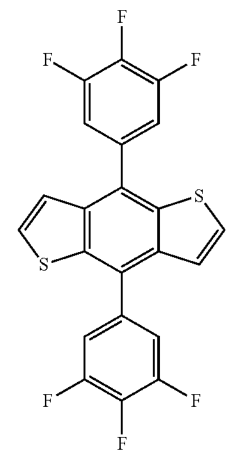

S-26-1

The procedure of the synthesis of S-26-1 was repeated as the synthesis of S-44-1 except for using (3,4,5-trifluorophenyl)boronic acid in place of (4-(trifluoromethoxy)phenyl) boronic acid. S-26-1 was obtained as white solid (10 g, 60% yield).

Step 2: Synthesis of S-26-2

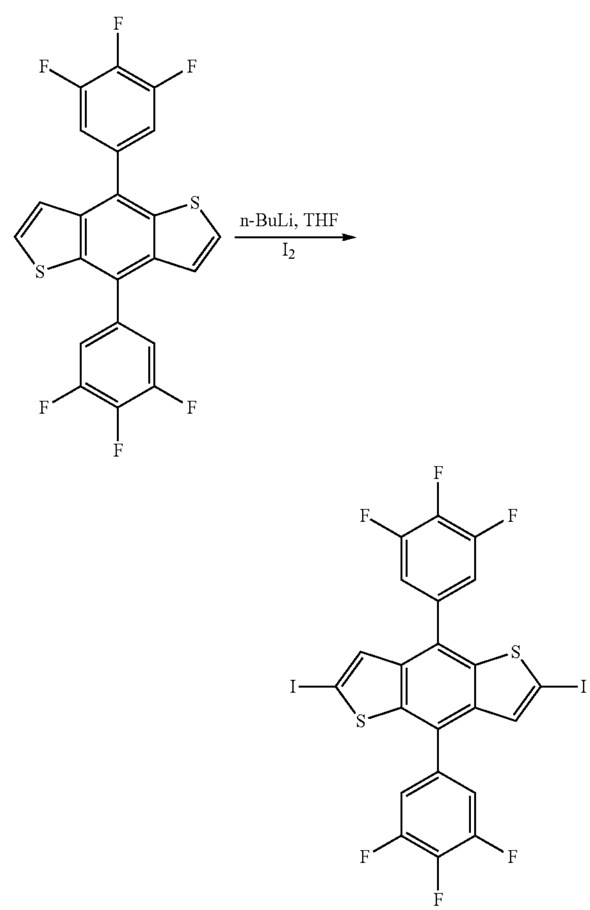

S-26-2

The procedure of the synthesis of S-26-2 was repeated as the synthesis of S-1-4 except for using S-26-1 in place of S-1-3. S-26-2 was obtained as white solid (6.8 g, 80% yield).

Step 3: Synthesis of S-26-3

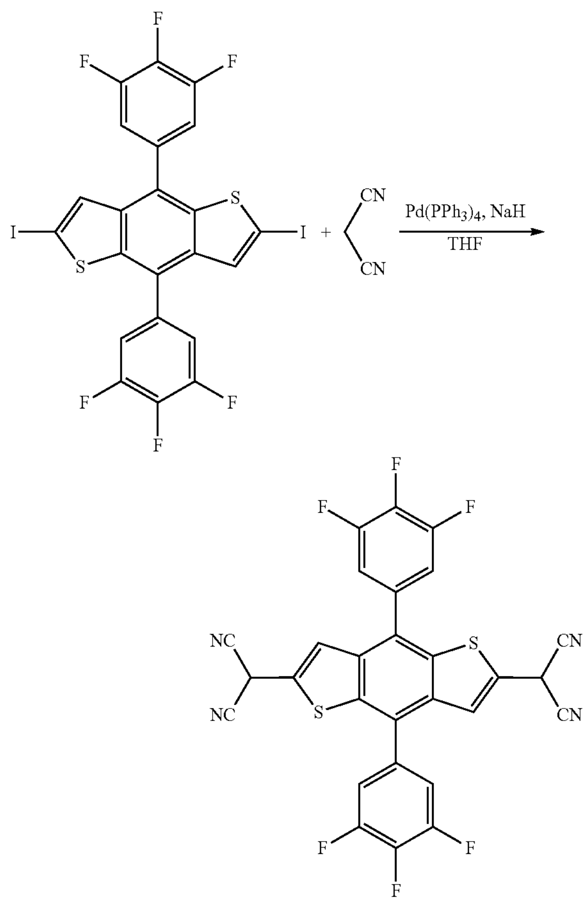

S-26-3

The procedure of the synthesis of S-26-3 was repeated as the synthesis of S-1-5 except for using S-26-2 in place of S-1-4. S-26-3 was obtained as yellow solid (3.2 g, 60% yield).

Step 4: Synthesis of S-26

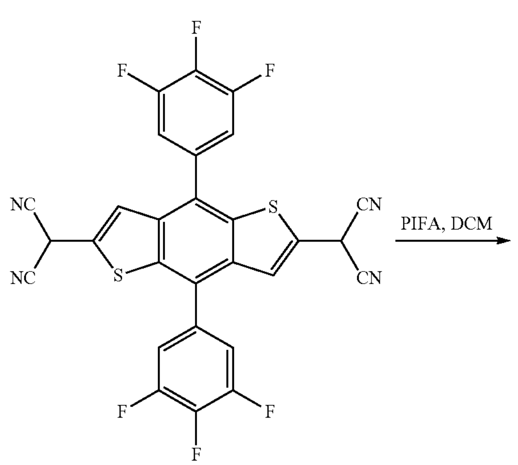

-continued

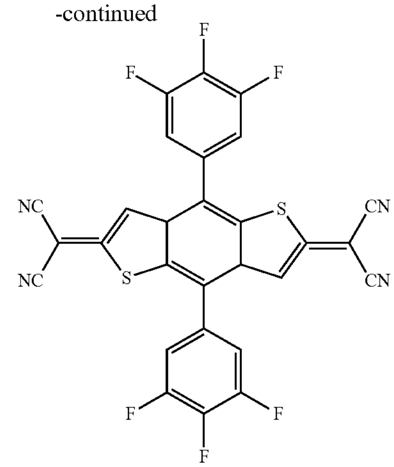

S-26

The procedure of the synthesis of S-26 was repeated as the synthesis of S-1 except for using S-26-3 in place of S-1-5. S-26 was obtained as violet solid (1.3 g, 47% yield). The product was confirmed as the target product, with a molecular weight of 576.

The persons skilled in the art should know that the above preparation method is only an illustrative example, and the persons skilled in the art can obtain the structure of other compounds of the present invention by modifying the above preparation method.

Synthesis Comparative Example 1: Synthesis of A-1

Step 1: Synthesis of A-1-1

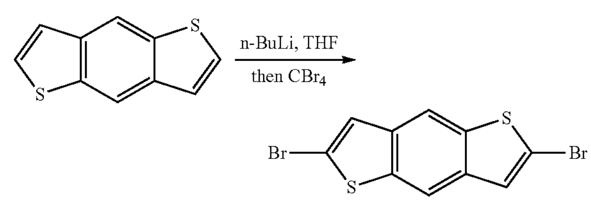

A-1-1

The procedure of the synthesis of A-1-1 was repeated as the synthesis of S-1-4 except for using benzo[1,2-b:4,5-b'] dithiophene and carbon tetrabromide in place of S-1-3 and iodine respectively. A-1-1 was obtained as light yellow solid (3.2 g, 80% yield).

Step 2: Synthesis of A-1-2

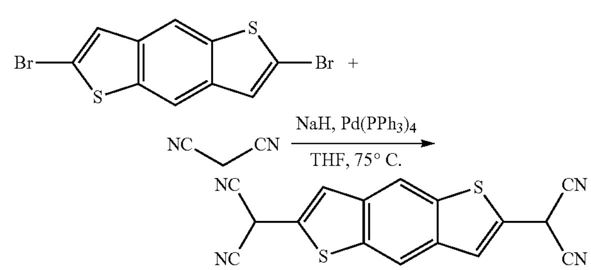

A-1-2

The procedure of the synthesis of A-1-2 was repeated as the synthesis of S-1-5 except for using A-1-1 in place of S-1-4. A-1-2 was obtained as yellow solid (2.8 g, 97% yield).

Step 3: Synthesis of A-1

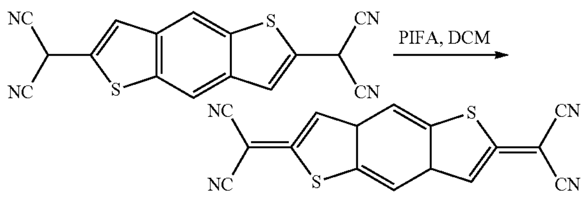

A-1

The procedure of the synthesis of A-1 was repeated as the synthesis of S-1 except for using A-1-2 in place of S-1-5. A-1 was obtained as black solid (2.1 g, 75% yield). The product was confirmed as the target product, with a molecular weight of 316.

The above synthesized compounds of the present invention all can keep stable during sublimation, proving that they are suitable for the vacuum deposition fabrication of OLED. Otherwise, the comparative compound A-1 degrades during sublimation, proving that it is not suitable for the vacuum deposition fabrication of OLED. And also, the solubility of comparative compound A-1 in organic solvents is very low, so it is also not suitable for the printing fabrication of OLED.

These above synthesized compounds of the present invention are more electron deficient than the comparative compound A-1. Measuring with Cyclic voltammetry test, the LUMO of compound S-1 and S-44 are −4.74 eV and −4.67 eV, respectively, while which of comparative compound A-1 is only −4.30 eV, and the difference is more than 0.3 eV. This suggests that compound S-1 and S-44 are more easily to reduce than comparative compound A-1, more effectively to obtain p type conductive doped triarylamine compounds in HIL and/or HTL, and can improve performance of OLED, for example, longer device lifetime, higher efficiency and/or lower voltage. And this proves that the compounds having Formula 1, one feature of which is having electron withdrawing group at the $X_1$ and $X_4$ position of the five-membered ring and/or $X_2$ and $X_3$ position of the six-membered ring, can effectively improve the electron deficiency of the molecules, reduce LUMO, match with HOMO of triarylamine compounds, and form p-type conduction of HIL and/or HTL. The compound of Formula 1 can obtain similar effects when the five-membered ring and/or six-membered ring of Formula 1 are aza-heterocycles, for the electron withdrawing effects of the nitrogen on the heterocycles.

Device Example

Example 1

A glass substrate with 120 nm thick of ITO transparent electrode was subjected to oxygen plasma and UV ozone treatment. The cleaned glass substrate was dried on a hotplate in a glovebox before deposition. The following materials were deposited onto the surface of the glass at the rate of 0.02-0.2 nm/s under the pressure of $10^{-8}$ torr. First, Compound HI was deposited onto the surface of the glass to form a 10 nm-thick film as a hole-injecting layer (HIL). Subsequently, Compound HT and Compound S-1 (weight ratio 97:3) was codeposited onto on the above obtained film to form a 20 nm-thick film which served as the first hole-transporting layer (HTL1). Further, Compound HT was deposited onto on the above obtained film to form a 20 nm-thick film which served as the second hole-transporting layer (HTL2). Further, Compound H1, Compound H2 and Compound GD (weight ratio 45:45:10) was codeposited onto on the above obtained film to form a 40 nm-thick film which served as the emitting layer (EML). Further, Compound H2 was deposited onto on the above obtained film to form a 10 nm-thick film which served as the hole-blocking layer (HBL). Then, 8-Hydroxyquinolinolato-lithium (Liq) and Compound ET (weight ratio 60:40) was codeposited onto on the above obtained film to form a 35 nm-thick film which served as the electron-transporting layer (ETL). Finally, Liq was deposited to form a 1 nm-thick film which served as the electron-injecting layer (EIL) and 120 nm-thick of Al was deposited to form the cathode.

Example 2 was fabricated in the same manner as in Example 1, except that Compound HT and Compound S-1 with a weight ratio of 91:9 (10 nm) was used as the HIL and Compound HT and Compound S-1 with a weight ratio of 91:9 (20 nm) was used as the HTL1.

Example 3 was fabricated in the same manner as in Example 1, except that in the HTL1, Compound HT and Compound S-44 with a weight ratio 97:3 was used.

Example 4 was fabricated in the same manner as in Example 2, except that Compound HT and Compound S-44 with a weight ratio of 97:3 (10 nm) was used as the HIL, and Compound HT and Compound S-44 with a weight ratio of 97:3 (20 nm) was used as the HTL1.

Comparative Example 1 was fabricated in the same manner as in Example 1, except that Compound HT (20 nm) was used in the HTL1.

The partial structures of devices are shown in Table 1:

TABLE 1

| Device ID | HIL (10 nm) | HTL1 (20 nm) | HTL2 (20 nm) |
|---|---|---|---|
| Example 1 | HI | HT:S-1 (97:3) | HT |
| Example 2 | HT:S-1 (91:9) | HT:S-1 (91:9) | |
| Example 3 | HI | HT:S-44 (97:3) | |
| Example 4 | HT:S-44 (97:3) | HT:S-44 (97:3) | |
| Comparative Example 1 | HI | HT | |

Structure of the materials used in the devices are shown as below:

Compound HI

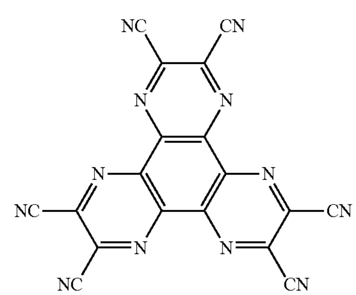

-continued

Compound HT

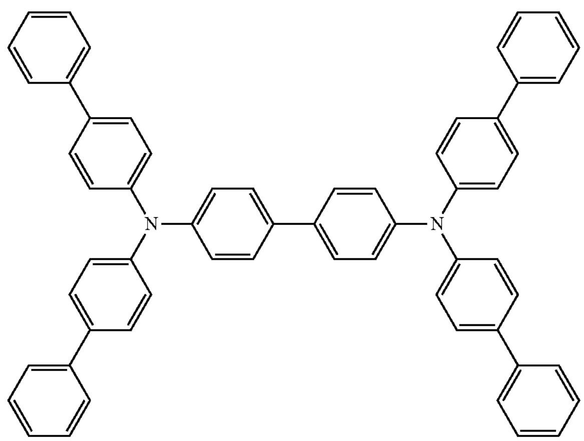

Compound H1

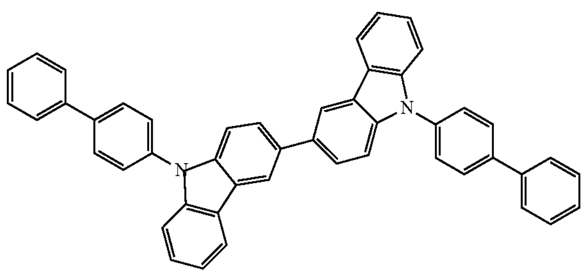

Compound H2

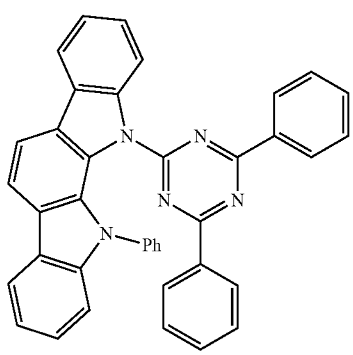

Compound GD

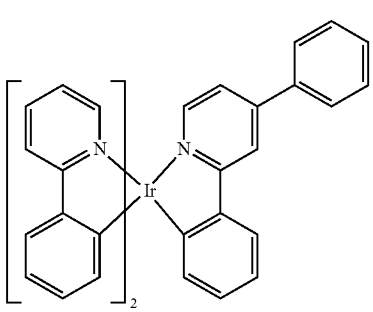

-continued

Compound ET

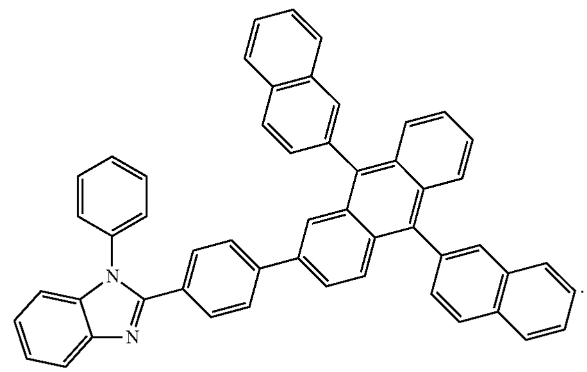

The devices were evaluated by measuring the External Quantum Efficiency (EQE), current efficiency (CE) and CIE at 1000 cd/$m^2$ and LT97 from an initial luminance of 21750 cd/$m^2$. The results obtained are shown in Table 2.

TABLE 2

| Device ID | EQE (%) | CE (cd/A) | CIE (x, y) | | LT97 (h) |
|---|---|---|---|---|---|
| Example 1 | 19.37 | 66.09 | 0.435 | 0.553 | 196 |
| Example 2 | 20.17 | 69.27 | 0.427 | 0.560 | 202 |
| Example 3 | 20.71 | 70.79 | 0.437 | 0.552 | 264 |
| Example 4 | 27.18 | 90.35 | 0.438 | 0.550 | 171 |
| Comparative Example 1 | 22.06 | 75.25 | 0.439 | 0.549 | 174 |

Discussion:

As shown in Table 2, Device Example 1 using Compound S-1 as a dopant in the HTL1 has better lifetime than Comparative Example 1 using only representative HTL material of the art (196 h vs 174 h). Device Example 2 using Compound S-1 as a dopant in both the HIL and HTL1 has a better lifetime than Comparative Example 1 using only representative HIL, HTL materials of the art (202 h vs 174 h). Device Example 3 using Compound S-44 as a dopant in the HTL1 has much better lifetime than Comparative Example 1 using only representative HTL material of the art (264 h vs 174 h). Remarkably, Device Example 4 using Compound S-44 as a dopant in both the HIL and HTL1 has a much higher efficiency than Comparative Example 1 using only representative HIL, HTL materials of the art (27.18% vs 22.06%, 90.35 cd/A vs 75.25 cd/A), while maintaining a similar lifetime as Comparative Example 1 (171 h vs 174 h). The result conclusively proves that compounds of Formula 1 in the present invention can offer similar or even better performance of devices than the representative materials of the art, especially in terms of device lifetime and/or efficiency, when used in the HIL or HTL layers.

It is understood that the various embodiments described herein are by way of example only, and are not intended to limit the scope of the invention. The present invention as claimed may therefore include variations from the particular examples and preferred embodiments described herein, as will be apparent to one of skill in the art. Many of the materials and structures described herein may be substituted with other materials and structures without deviating from the spirit of the invention. It is understood that various theories as to why the invention works are not intended to be limiting.

What is claimed is:

1. A compound having Formula 1:

Formula 1

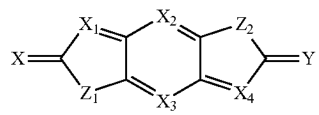

wherein $X_1$, $X_2$, $X_3$, and $X_4$ are each independently selected from the group consisting of CR, and N; when $X_1$, $X_2$, $X_3$, and $X_4$ are each independently selected from CR, each R may be same or different, and at least one of R comprises at least one electron withdrawing group;

$Z_1$ and $Z_2$ are each independently selected from the group consisting of O, S, Se, S═O, and $SO_2$;

X and Y are each independently selected from the group consisting of S, Se, NR', and CR"R'";

R, R', R", and R'" are each independently selected from the group consisting of hydrogen, deuterium, halogen, a substituted or unsubstituted alkyl group having 1 to 20 carbon atoms, a substituted or unsubstituted cycloalkyl group having 3 to 20 ring carbon atoms, a substituted or unsubstituted heteroalkyl group having 1 to 20 carbon atoms, a substituted or unsubstituted arylalkyl group having 7 to 30 carbon atoms, a substituted or unsubstituted alkoxy group having 1 to 20 carbon atoms, a substituted or unsubstituted aryloxy group having 6 to 30 carbon atoms, a substituted or unsubstituted alkenyl group having 2 to 20 carbon atoms, a substituted or unsubstituted aryl group having 6 to 30 carbon atoms, a substituted or unsubstituted heteroaryl group having 3 to 30 carbon atoms, a substituted or unsubstituted alkylsilyl group having 3 to 20 carbon atoms, a substituted or unsubstituted arylsilyl group having 6 to 20 carbon atoms, a substituted or unsubstituted amino group having 0 to 20 carbon atoms, an acyl group, a carbonyl group, a carboxylic acid group, an ester group, a nitrile group, an isonitrile group, a sulfanyl group, a sulfinyl group, a sulfonyl group, a phosphino group, and combinations thereof;

Any adjacent substitution can be optionally joined to form a ring or fused structure.

2. The compound of claim 1, wherein $Z_1$ and $Z_2$ are S.

3. The compound of claim 1, wherein $X_2$ and $X_3$ are N.

4. The compound of claim 1, wherein $X_2$ and $X_3$ are each independently selected from CR, each R may be same or different, and at least one of R comprises at least one electron withdrawing group.

5. The compound of claim 4, wherein each R comprises at least one electron withdrawing group.

6. The compound of claim 4, wherein R are selected from the group consisting of fluorine, chlorine, trifluoromethyl, trifluoromethoxyl, pentafluoroethyl, pentafluoroethoxyl, cyano, nitro group, methyl sulfonyl, trifluoromethyl sulfonyl, trifluoromethylthio, pentafluorosulfanyl, pyridyl, 3-fluorophenyl, 4-fluorophenyl, 3-cyanophenyl, 4-cyanophenyl, 4-trifluoromethylphenyl, 3-trifluoromethoxylphenyl, 4-trifluoromethoxylphenyl, 4-pentafluoroethylphenyl, 4-pentafluoroethoxylphenyl, 4-nitrophenyl, 4-methyl sulfonyl phenyl, 4-trifluoromethyl sulfonyl phenyl, 3-trifluoromethylsulfanylphenyl, 4-trifluoromethylsulfanylphenyl, 4-pentafluorosulfanylphenyl, pyrimidyl, 2,6-dimethyl-1,3,5-triazine, and combinations thereof.

7. The compound of claim 1, wherein X and Y are each independently CR"R'".

8. The compound of claim 7, wherein R" and R'" are each independently selected from the group consisting of trifluoromethyl, cyano, pentafluorophenyl, 4-cyano-2,3,5,6-tetrafluorophenyl, and pyridyl.

9. The compound of claim 1, wherein the compound has the formula:

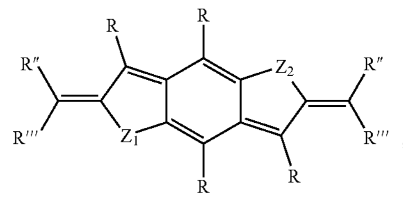

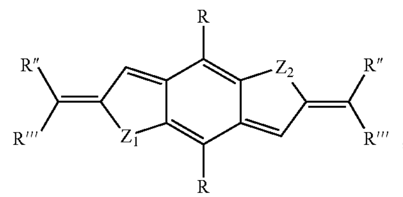

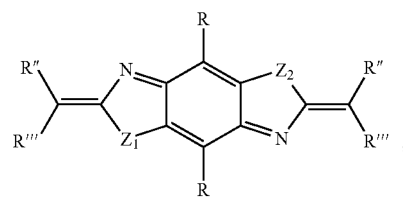

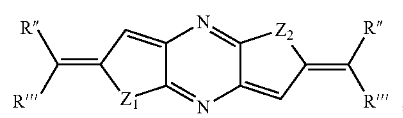

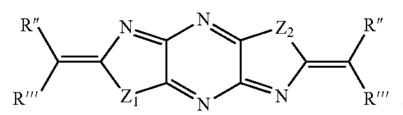

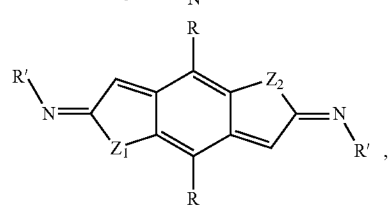

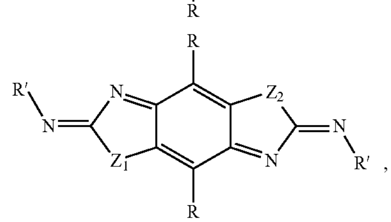

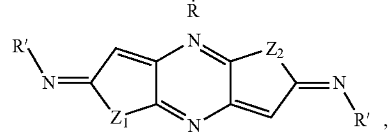

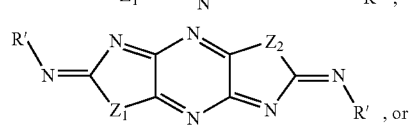

-continued

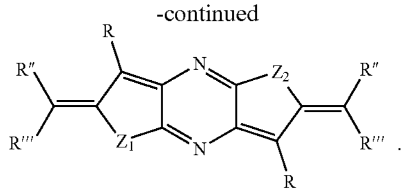

10. The compound of claim 1, wherein the compound is selected from the group consisting of:

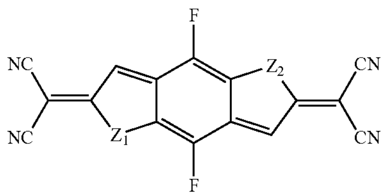

$Z_1 = Z_2 = O$ Compound O-1
$Z_1 = Z_2 = S$ Compound S-1
$Z_1 = Z_2 = Se$ Compound Se-1

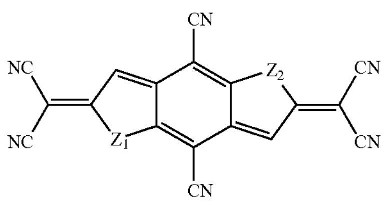

$Z_1 = Z_2 = O$ Compound O-2
$Z_1 = Z_2 = S$ Compound S-2
$Z_1 = Z_2 = Se$ Compound Se-2

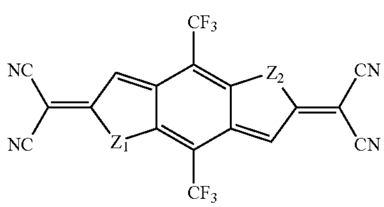

$Z_1 = Z_2 = O$ Compound O-3
$Z_1 = Z_2 = S$ Compound S-3
$Z_1 = Z_2 = Se$ Compound Se-3

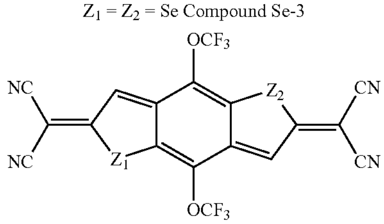

$Z_1 = Z_2 = O$ Compound O-4
$Z_1 = Z_2 = S$ Compound S-4
$Z_1 = Z_2 = Se$ Compound Se-4

-continued

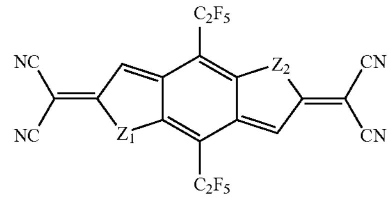

$Z_1 = Z_2 = O$ Compound O-5
$Z_1 = Z_2 = S$ Compound S-5
$Z_1 = Z_2 = Se$ Compound Se-5

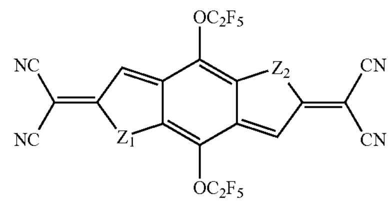

$Z_1 = Z_2 = O$ Compound O-6
$Z_1 = Z_2 = S$ Compound S-6
$Z_1 = Z_2 = Se$ Compound Se-6

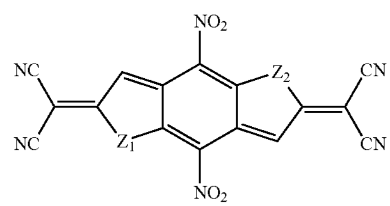

$Z_1 = Z_2 = O$ Compound O-7
$Z_1 = Z_2 = S$ Compound S-7
$Z_1 = Z_2 = Se$ Compound Se-7

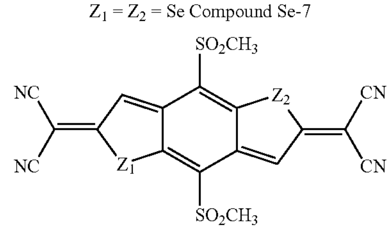

$Z_1 = Z_2 = O$ Compound O-8
$Z_1 = Z_2 = S$ Compound S-8
$Z_1 = Z_2 = Se$ Compound Se-8

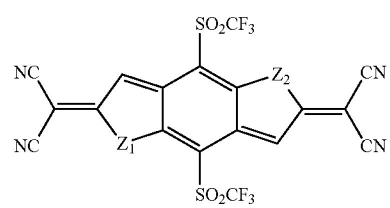

$Z_1 = Z_2 = O$ Compound O-9
$Z_1 = Z_2 = S$ Compound S-9
$Z_1 = Z_2 = Se$ Compound Se-9

-continued

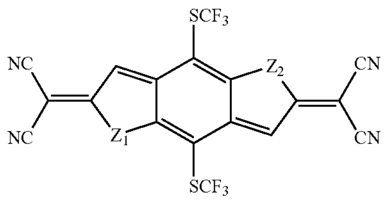

$Z_1 = Z_2 = O$ Compound O-10
$Z_1 = Z_2 = S$ Compound S-10
$Z_1 = Z_2 = Se$ Compound Se-10

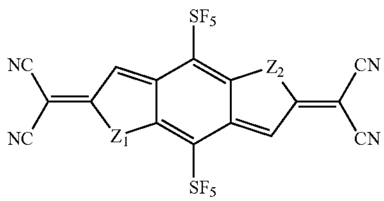

$Z_1 = Z_2 = O$ Compound O-11
$Z_1 = Z_2 = S$ Compound S-11
$Z_1 = Z_2 = Se$ Compound Se-11

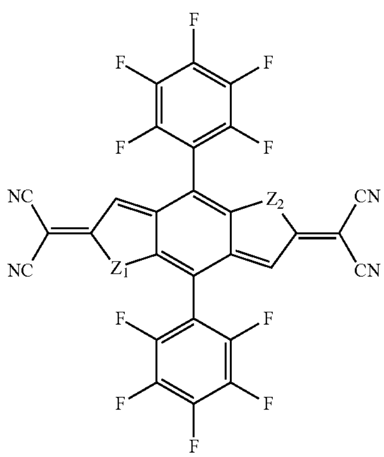

$Z_1 = Z_2 = O$ Compound O-12
$Z_1 = Z_2 = S$ Compound S-12
$Z_1 = Z_2 = Se$ Compound Se-12

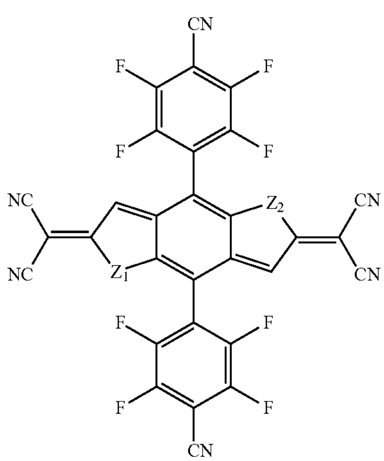

$Z_1 = Z_2 = O$ Compound O-13
$Z_1 = Z_2 = S$ Compound S-13
$Z_1 = Z_2 = Se$ Compound Se-13

-continued

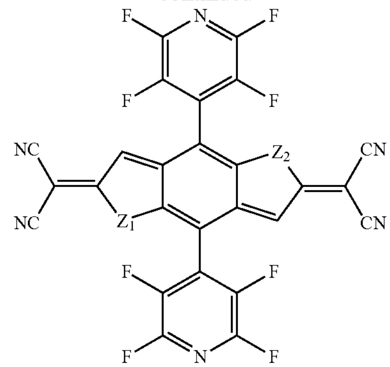

$Z_1 = Z_2 = O$ Compound O-14
$Z_1 = Z_2 = S$ Compound S-14
$Z_1 = Z_2 = Se$ Compound Se-14

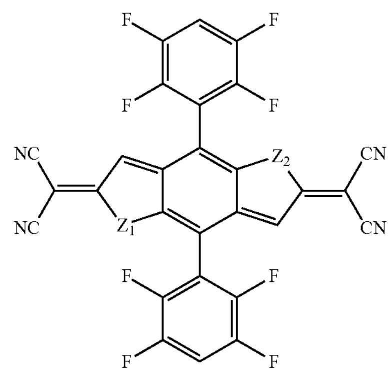

$Z_1 = Z_2 = O$ Compound O-15
$Z_1 = Z_2 = S$ Compound S-15
$Z_1 = Z_2 = Se$ Compound Se-15

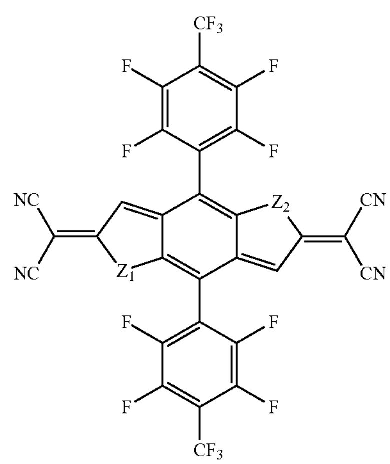

$Z_1 = Z_2 = O$ Compound O-16
$Z_1 = Z_2 = S$ Compound S-16
$Z_1 = Z_2 = Se$ Compound Se-16

-continued

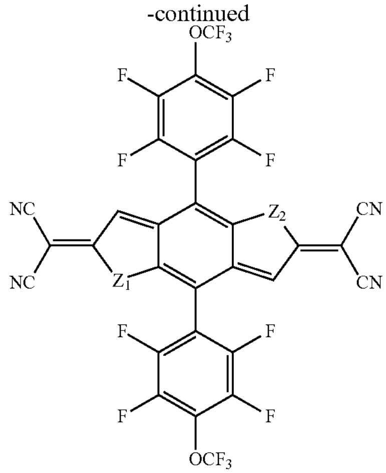

$Z_1 = Z_2 =$ O Compound O-17
$Z_1 = Z_2 =$ S Compound S-17
$Z_1 = Z_2 =$ Se Compound Se-17

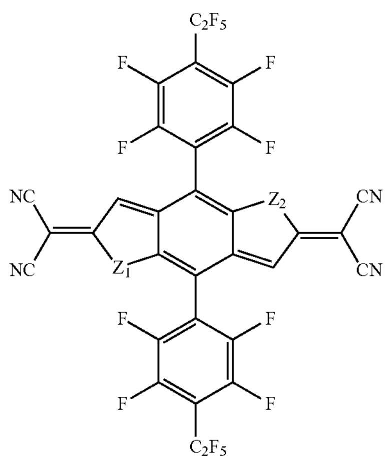

$Z_1 = Z_2 =$ O Compound O-18
$Z_1 = Z_2 =$ S Compound S-18
$Z_1 = Z_2 =$ Se Compound Se-18

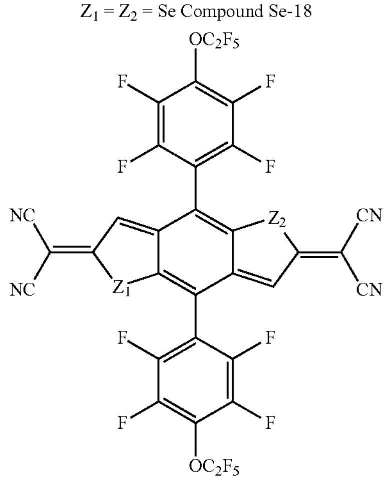

$Z_1 = Z_2 =$ O Compound O-19
$Z_1 = Z_2 =$ S Compound S-19
$Z_1 = Z_2 =$ Se Compound Se-19

-continued

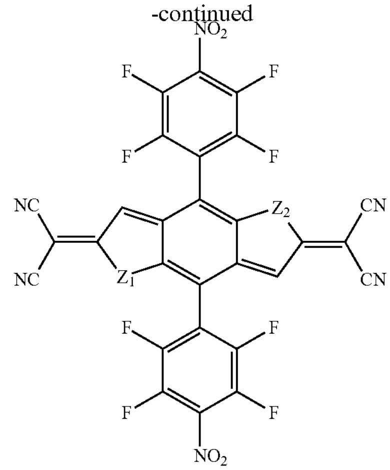

$Z_1 = Z_2 =$ O Compound O-20
$Z_1 = Z_2 =$ S Compound S-20
$Z_1 = Z_2 =$ Se Compound Se-20

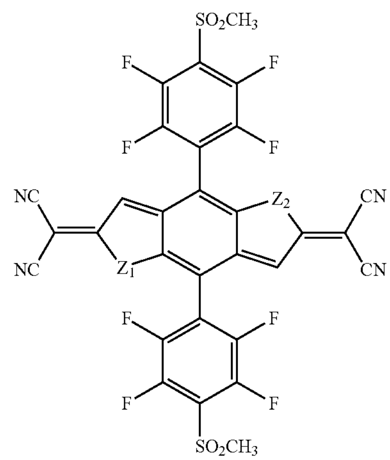

$Z_1 = Z_2 =$ O Compound O-21
$Z_1 = Z_2 =$ S Compound S-21
$Z_1 = Z_2 =$ Se Compound Se-21

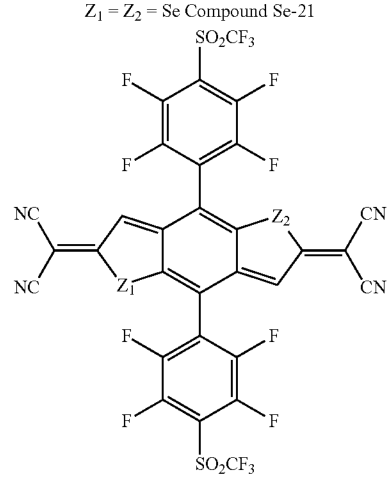

$Z_1 = Z_2 =$ O Compound O-22
$Z_1 = Z_2 =$ S Compound S-22
$Z_1 = Z_2 =$ Se Compound Se-22

-continued

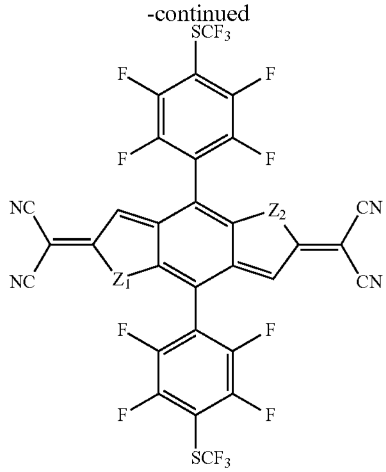

$Z_1 = Z_2 =$ O Compound O-23
$Z_1 = Z_2 =$ S Compound S-23
$Z_1 = Z_2 =$ Se Compound Se-23

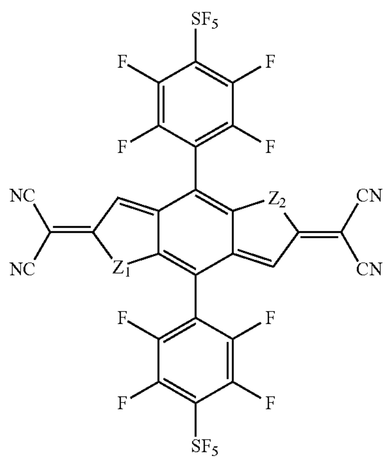

$Z_1 = Z_2 =$ O Compound O-24
$Z_1 = Z_2 =$ S Compound S-24
$Z_1 = Z_2 =$ Se Compound Se-24

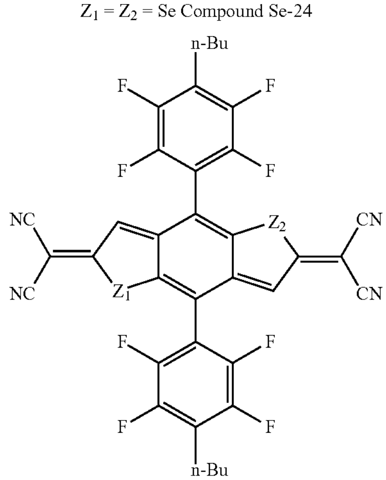

$Z_1 = Z_2 =$ O Compound O-25
$Z_1 = Z_2 =$ S Compound S-25
$Z_1 = Z_2 =$ Se Compound Se-25

-continued

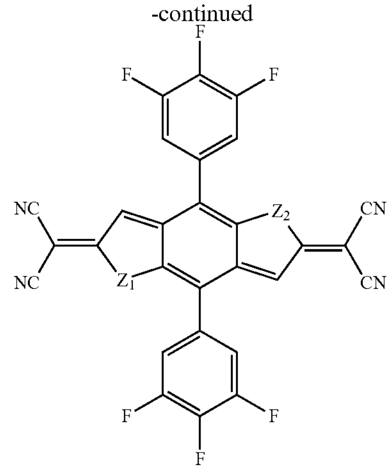

$Z_1 = Z_2 =$ O Compound O-26
$Z_1 = Z_2 =$ S Compound S-26
$Z_1 = Z_2 =$ Se Compound Se-26

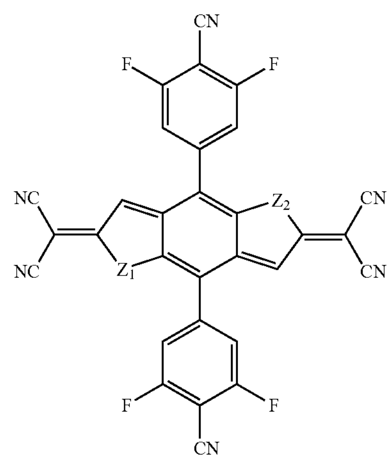

$Z_1 = Z_2 =$ O Compound O-27
$Z_1 = Z_2 =$ S Compound S-27
$Z_1 = Z_2 =$ Se Compound Se-27

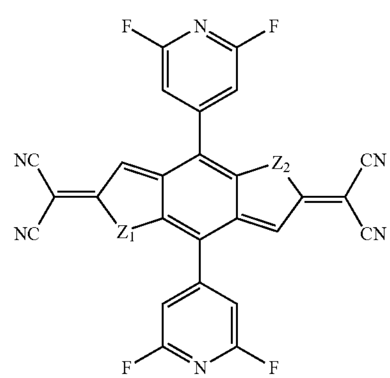

$Z_1 = Z_2 =$ O Compound O-28
$Z_1 = Z_2 =$ S Compound S-28
$Z_1 = Z_2 =$ Se Compound Se-28

-continued

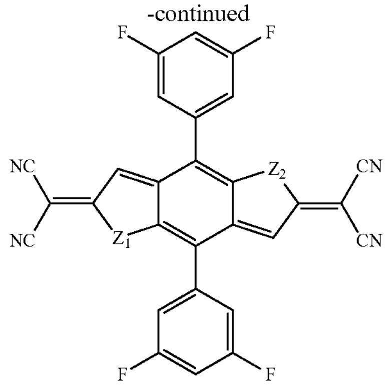

$Z_1 = Z_2 =$ O Compound O-29
$Z_1 = Z_2 =$ S Compound S-29
$Z_1 = Z_2 =$ Se Compound Se-29

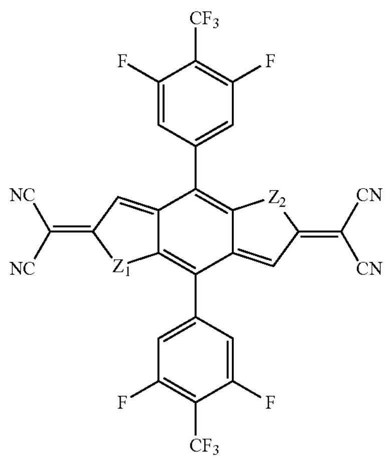

$Z_1 = Z_2 =$ O Compound O-30
$Z_1 = Z_2 =$ S Compound S-30
$Z_1 = Z_2 =$ Se Compound Se-30

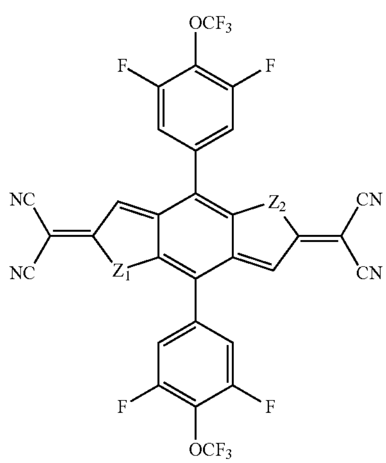

$Z_1 = Z_2 =$ O Compound O-31
$Z_1 = Z_2 =$ S Compound S-31
$Z_1 = Z_2 =$ Se Compound Se-31

-continued

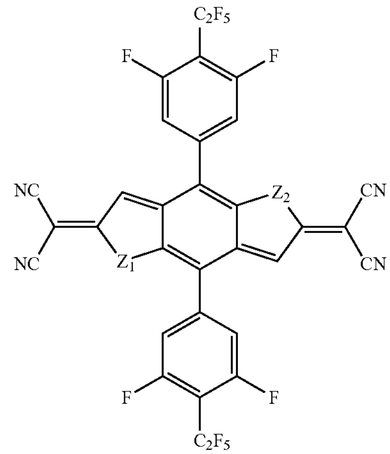

$Z_1 = Z_2 =$ O Compound O-32
$Z_1 = Z_2 =$ S Compound S-32
$Z_1 = Z_2 =$ Se Compound Se-32

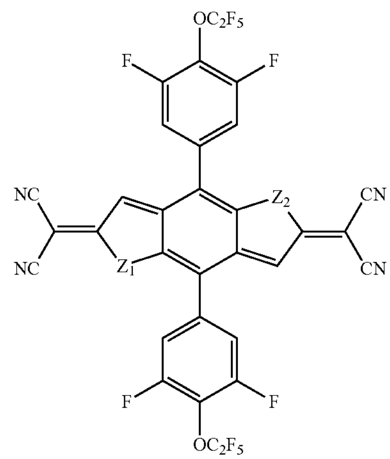

$Z_1 = Z_2 =$ O Compound O-33
$Z_1 = Z_2 =$ S Compound S-33
$Z_1 = Z_2 =$ Se Compound Se-33

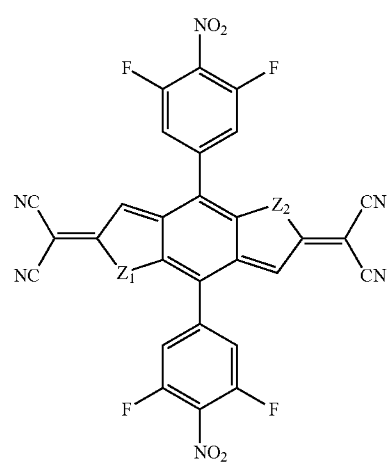

$Z_1 = Z_2 =$ O Compound O-34
$Z_1 = Z_2 =$ S Compound S-34
$Z_1 = Z_2 =$ Se Compound Se-34

-continued

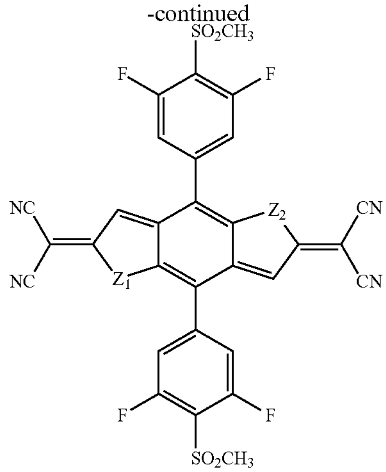

$Z_1 = Z_2 =$ O Compound O-35
$Z_1 = Z_2 =$ S Compound S-35
$Z_1 = Z_2 =$ Se Compound Se-35

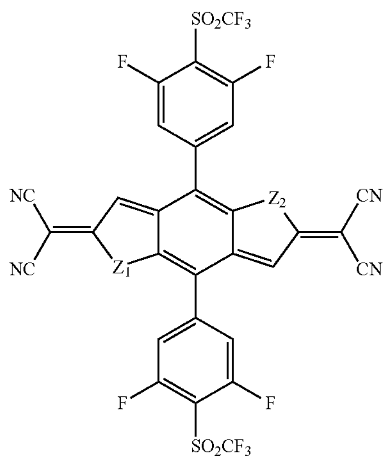

$Z_1 = Z_2 =$ O Compound O-36
$Z_1 = Z_2 =$ S Compound S-36
$Z_1 = Z_2 =$ Se Compound Se-36

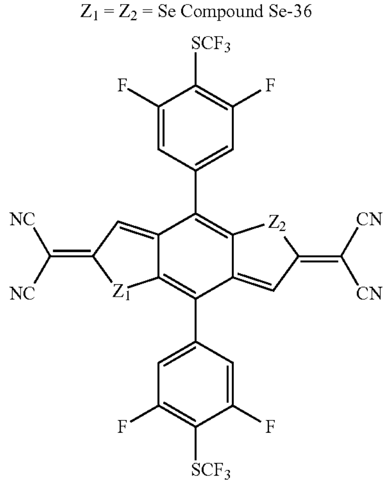

$Z_1 = Z_2 =$ O Compound O-37
$Z_1 = Z_2 =$ S Compound S-37
$Z_1 = Z_2 =$ Se Compound Se-37

-continued

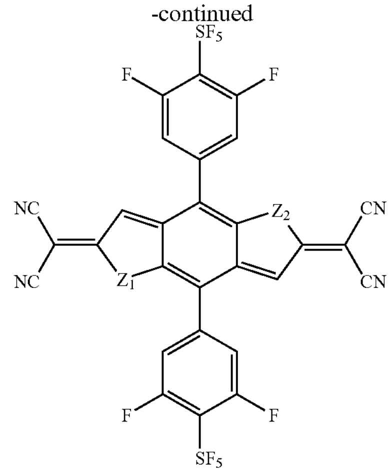

$Z_1 = Z_2 =$ O Compound O-38
$Z_1 = Z_2 =$ S Compound S-38
$Z_1 = Z_2 =$ Se Compound Se-38

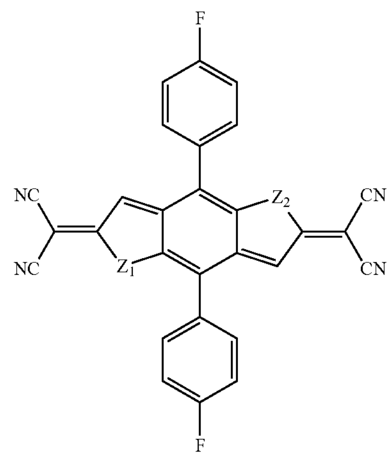

$Z_1 = Z_2 =$ O Compound O-39
$Z_1 = Z_2 =$ S Compound S-39
$Z_1 = Z_2 =$ Se Compound Se-39

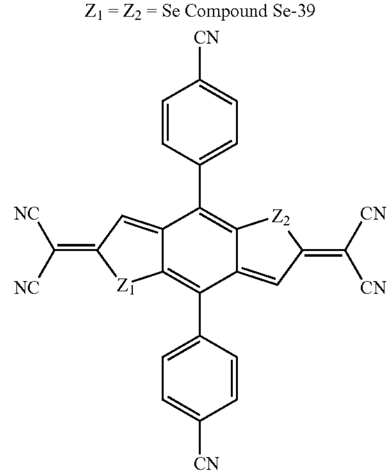

$Z_1 = Z_2 =$ O Compound O-40
$Z_1 = Z_2 =$ S Compound S-40
$Z_1 = Z_2 =$ Se Compound Se-40

-continued

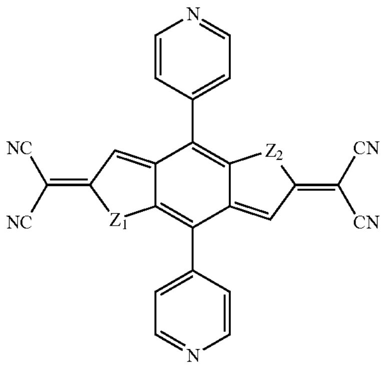

$Z_1 = Z_2 = O$ Compound O-41
$Z_1 = Z_2 = S$ Compound S-41
$Z_1 = Z_2 = Se$ Compound Se-41

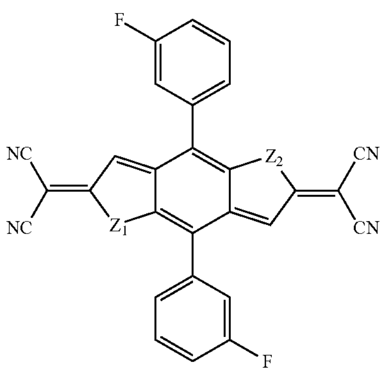

$Z_1 = Z_2 = O$ Compound O-42
$Z_1 = Z_2 = S$ Compound S-42
$Z_1 = Z_2 = Se$ Compound Se-42

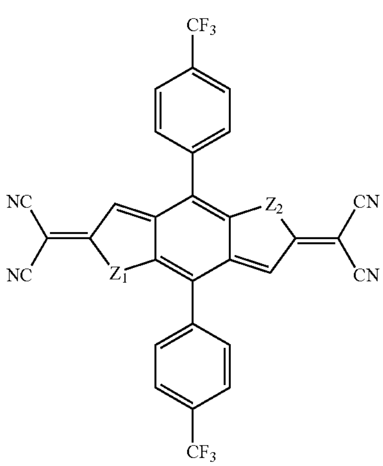

$Z_1 = Z_2 = O$ Compound O-43
$Z_1 = Z_2 = S$ Compound S-43
$Z_1 = Z_2 = Se$ Compound Se-43

-continued

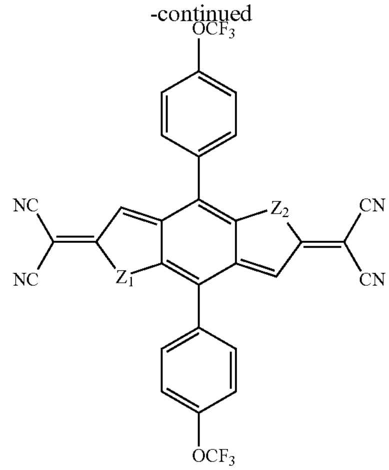

$Z_1 = Z_2 = O$ Compound O-44
$Z_1 = Z_2 = S$ Compound S-44
$Z_1 = Z_2 = Se$ Compound Se-44

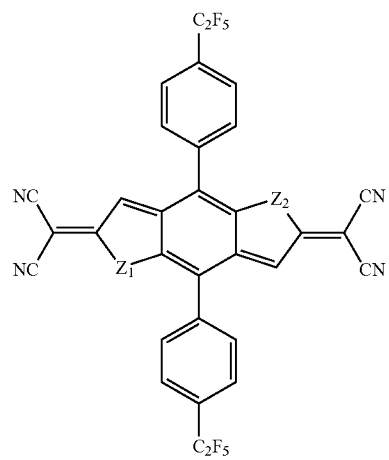

$Z_1 = Z_2 = O$ Compound O-45
$Z_1 = Z_2 = S$ Compound S-45
$Z_1 = Z_2 = Se$ Compound Se-45

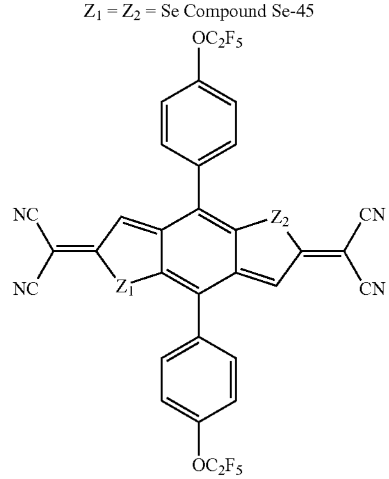

$Z_1 = Z_2 = O$ Compound O-46
$Z_1 = Z_2 = S$ Compound S-46
$Z_1 = Z_2 = Se$ Compound Se-46

-continued

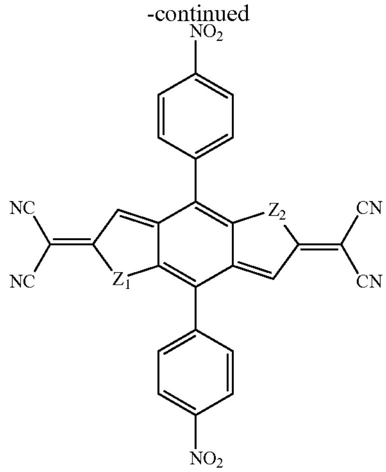

$Z_1 = Z_2 =$ O Compound O-47
$Z_1 = Z_2 =$ S Compound S-47
$Z_1 = Z_2 =$ Se Compound Se-47

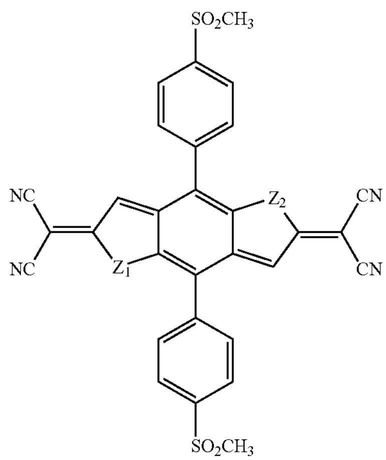

$Z_1 = Z_2 =$ O Compound O-48
$Z_1 = Z_2 =$ S Compound S-48
$Z_1 = Z_2 =$ Se Compound Se-48

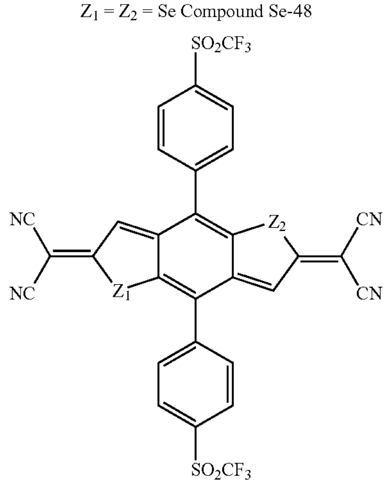

$Z_1 = Z_2 =$ O Compound O-49
$Z_1 = Z_2 =$ S Compound S-49
$Z_1 = Z_2 =$ Se Compound Se-49

-continued

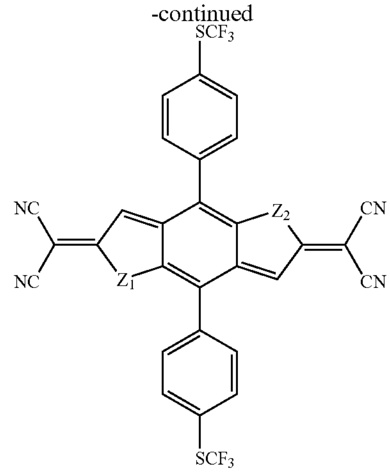

$Z_1 = Z_2 =$ O Compound O-50
$Z_1 = Z_2 =$ S Compound S-50
$Z_1 = Z_2 =$ Se Compound Se-50

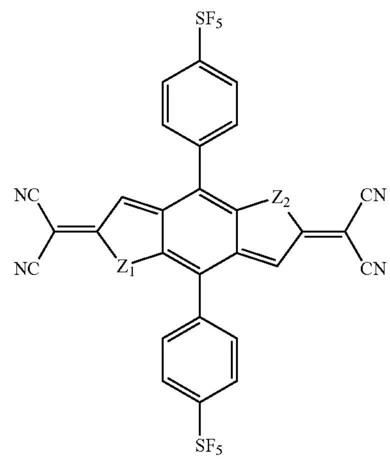

$Z_1 = Z_2 =$ O Compound O-51
$Z_1 = Z_2 =$ S Compound S-51
$Z_1 = Z_2 =$ Se Compound Se-51

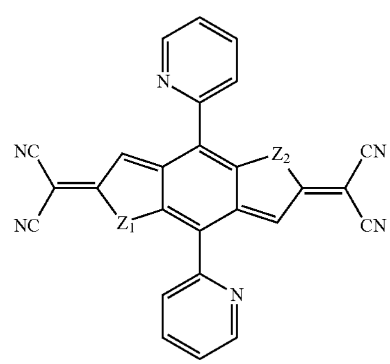

$Z_1 = Z_2 =$ O Compound O-52
$Z_1 = Z_2 =$ S Compound S-52
$Z_1 = Z_2 =$ Se Compound Se-52

-continued

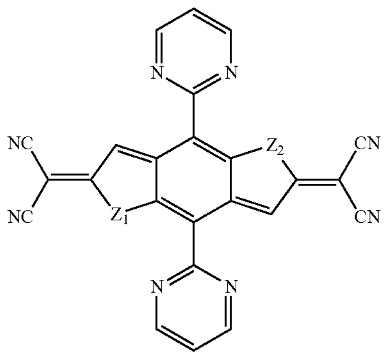

$Z_1 = Z_2 =$ O Compound O-53
$Z_1 = Z_2 =$ S Compound S-53
$Z_1 = Z_2 =$ Se Compound Se-53

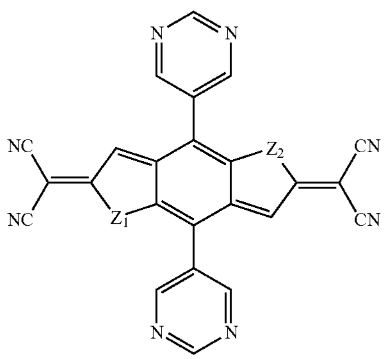

$Z_1 = Z_2 =$ O Compound O-54
$Z_1 = Z_2 =$ S Compound S-54
$Z_1 = Z_2 =$ Se Compound Se-54

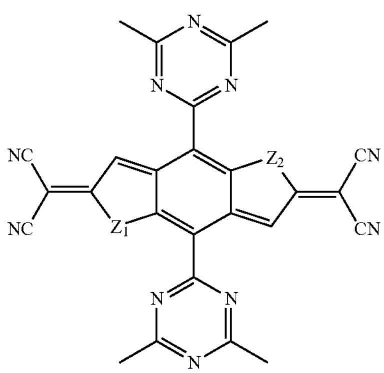

$Z_1 = Z_2 =$ O Compound O-55
$Z_1 = Z_2 =$ S Compound S-55
$Z_1 = Z_2 =$ Se Compound Se-55

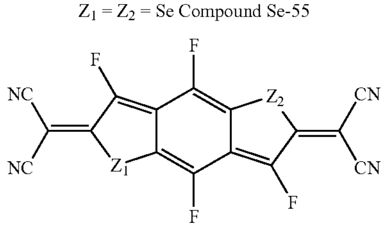

$Z_1 = Z_2 =$ O Compound O-56
$Z_1 = Z_2 =$ S Compound S-56
$Z_1 = Z_2 =$ Se Compound Se-56

-continued

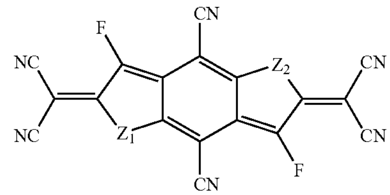

$Z_1 = Z_2 =$ O Compound O-57
$Z_1 = Z_2 =$ S Compound S-57
$Z_1 = Z_2 =$ Se Compound Se-57

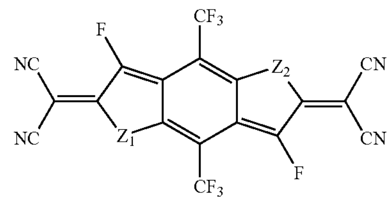

$Z_1 = Z_2 =$ O Compound O-58
$Z_1 = Z_2 =$ S Compound S-58
$Z_1 = Z_2 =$ Se Compound Se-58

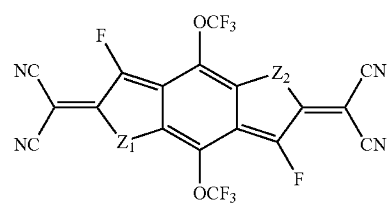

$Z_1 = Z_2 =$ O Compound O-59
$Z_1 = Z_2 =$ S Compound S-59
$Z_1 = Z_2 =$ Se Compound Se-59

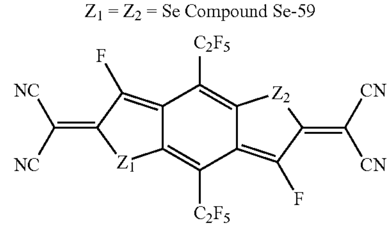

$Z_1 = Z_2 =$ O Compound O-60
$Z_1 = Z_2 =$ S Compound S-60
$Z_1 = Z_2 =$ Se Compound Se-60

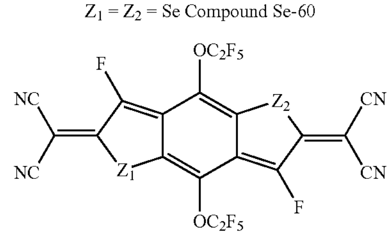

$Z_1 = Z_2 =$ O Compound O-61
$Z_1 = Z_2 =$ S Compound S-61
$Z_1 = Z_2 =$ Se Compound Se-61

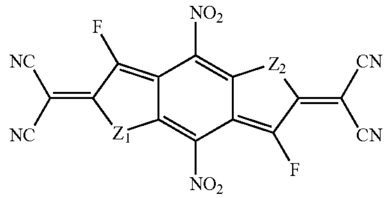

$Z_1 = Z_2$ = O Compound O-62
$Z_1 = Z_2$ = S Compound S-62
$Z_1 = Z_2$ = Se Compound Se-62

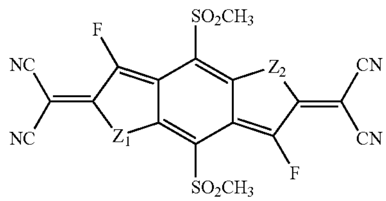

$Z_1 = Z_2$ = O Compound O-63
$Z_1 = Z_2$ = S Compound S-63
$Z_1 = Z_2$ = Se Compound Se-63

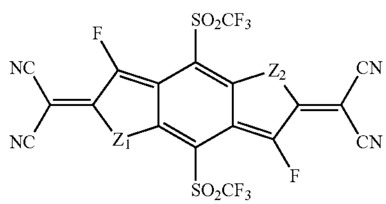

$Z_1 = Z_2$ = O Compound O-64
$Z_1 = Z_2$ = S Compound S-64
$Z_1 = Z_2$ = Se Compound Se-64

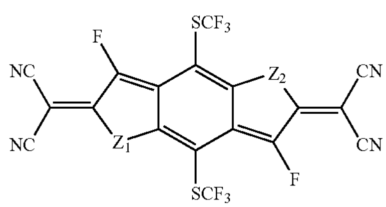

$Z_1 = Z_2$ = O Compound O-65
$Z_1 = Z_2$ = S Compound S-65
$Z_1 = Z_2$ = Se Compound Se-65

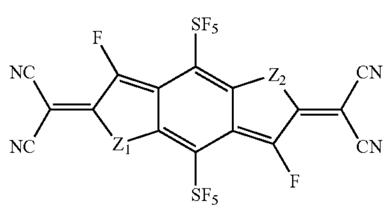

$Z_1 = Z_2$ = O Compound O-66
$Z_1 = Z_2$ = S Compound S-66
$Z_1 = Z_2$ = Se Compound Se-66

-continued

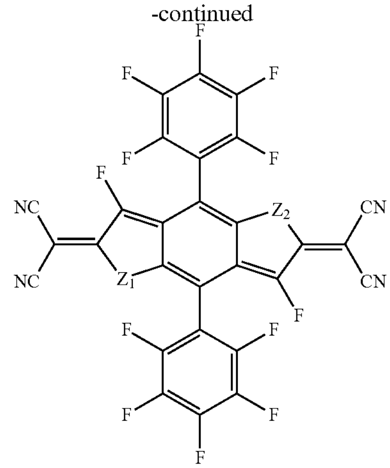

$Z_1 = Z_2$ = O Compound O-67
$Z_1 = Z_2$ = S Compound S-67
$Z_1 = Z_2$ = Se Compound Se-67

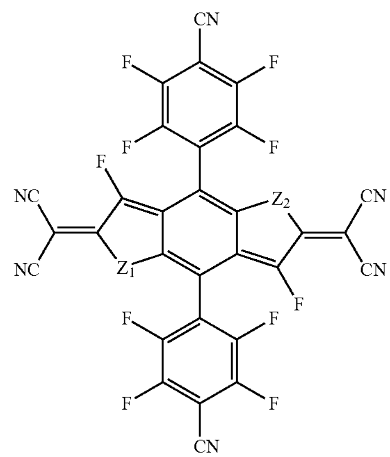

$Z_1 = Z_2$ = O Compound O-68
$Z_1 = Z_2$ = S Compound S-68
$Z_1 = Z_2$ = Se Compound Se-68

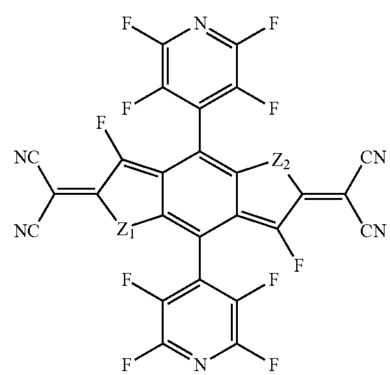

$Z_1 = Z_2$ = O Compound O-69
$Z_1 = Z_2$ = S Compound S-69
$Z_1 = Z_2$ = Se Compound Se-69

-continued

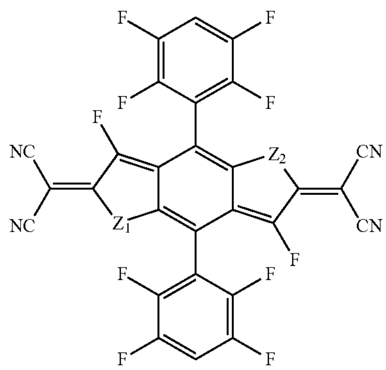

$Z_1 = Z_2 =$ O Compound O-70
$Z_1 = Z_2 =$ S Compound S-70
$Z_1 = Z_2 =$ Se Compound Se-70

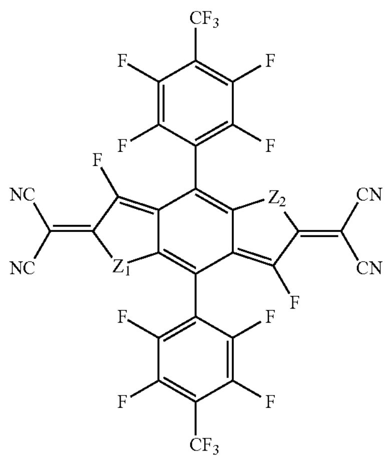

$Z_1 = Z_2 =$ O Compound O-71
$Z_1 = Z_2 =$ S Compound S-71
$Z_1 = Z_2 =$ Se Compound Se-71

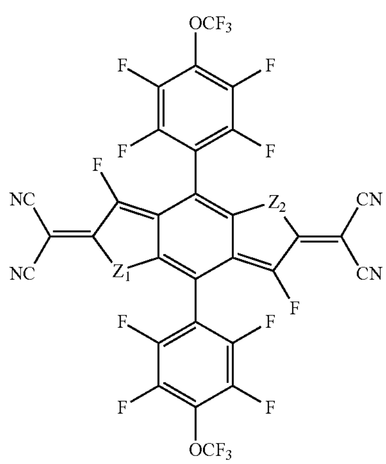

$Z_1 = Z_2 =$ O Compound O-72
$Z_1 = Z_2 =$ S Compound S-72
$Z_1 = Z_2 =$ Se Compound Se-72

-continued

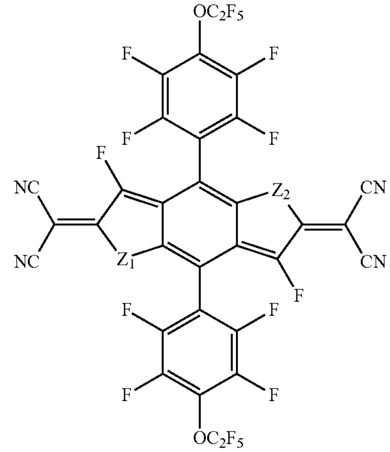

$Z_1 = Z_2 =$ O Compound O-73
$Z_1 = Z_2 =$ S Compound S-73
$Z_1 = Z_2 =$ Se Compound Se-73

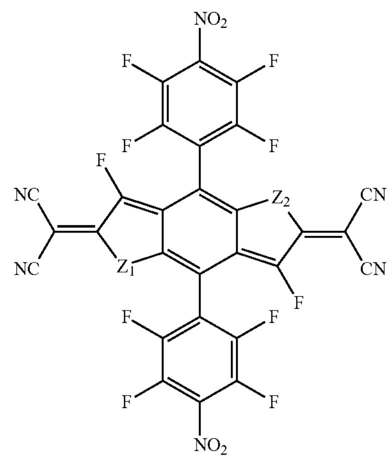

$Z_1 = Z_2 =$ O Compound O-74
$Z_1 = Z_2 =$ S Compound S-74
$Z_1 = Z_2 =$ Se Compound Se-74

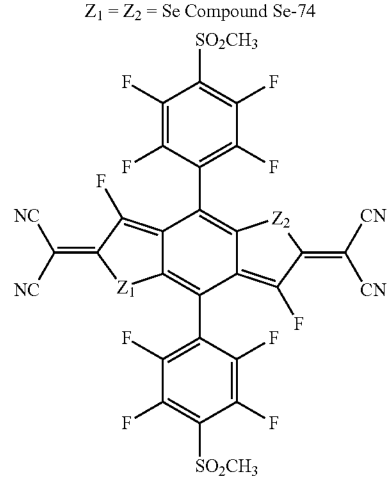

$Z_1 = Z_2 =$ O Compound O-75
$Z_1 = Z_2 =$ S Compound S-75
$Z_1 = Z_2 =$ Se Compound Se-75

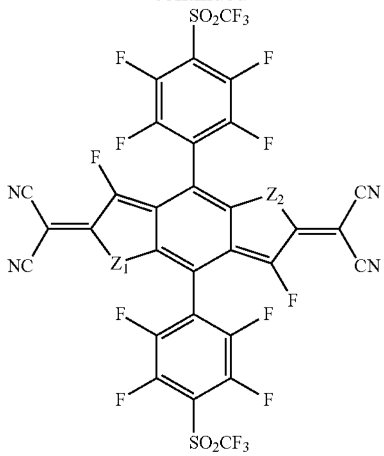

$Z_1 = Z_2 =$ O Compound O-76
$Z_1 = Z_2 =$ S Compound S-76
$Z_1 = Z_2 =$ Se Compound Se-76

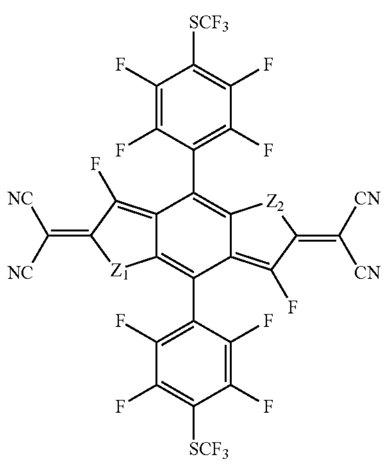

$Z_1 = Z_2 =$ O Compound O-77
$Z_1 = Z_2 =$ S Compound S-77
$Z_1 = Z_2 =$ Se Compound Se-77

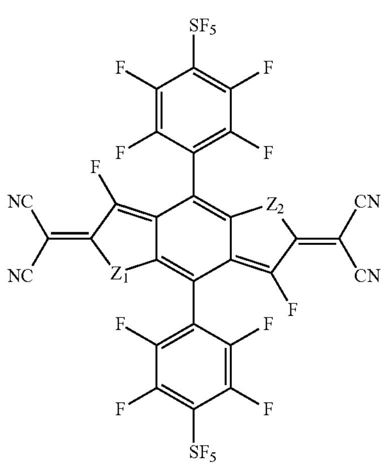

$Z_1 = Z_2 =$ O Compound O-78
$Z_1 = Z_2 =$ S Compound S-78
$Z_1 = Z_2 =$ Se Compound Se-78

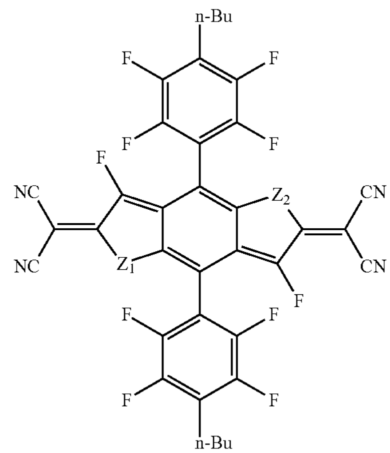

$Z_1 = Z_2 =$ O Compound O-79
$Z_1 = Z_2 =$ S Compound S-79
$Z_1 = Z_2 =$ Se Compound Se-79

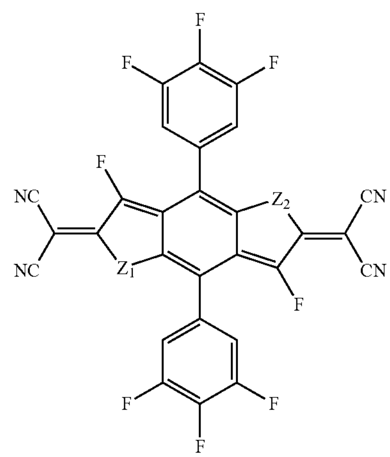

$Z_1 = Z_2 =$ O Compound O-80
$Z_1 = Z_2 =$ S Compound S-80
$Z_1 = Z_2 =$ Se Compound Se-80

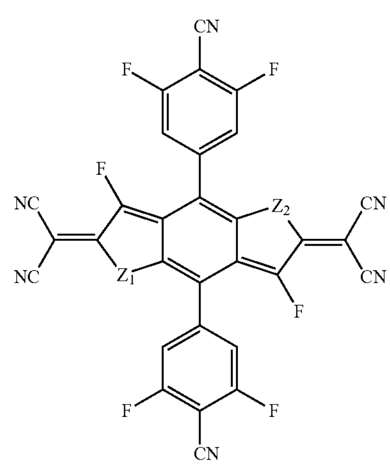

$Z_1 = Z_2 =$ O Compound O-81
$Z_1 = Z_2 =$ S Compound S-81
$Z_1 = Z_2 =$ Se Compound Se-81

-continued

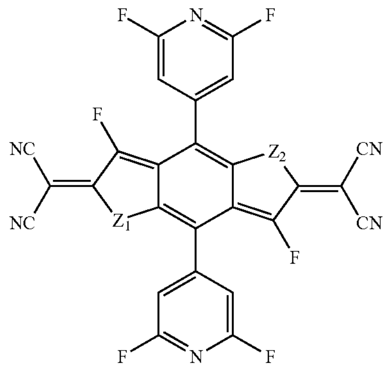

$Z_1 = Z_2 = O$ Compound O-82
$Z_1 = Z_2 = S$ Compound S-82
$Z_1 = Z_2 = Se$ Compound Se-82

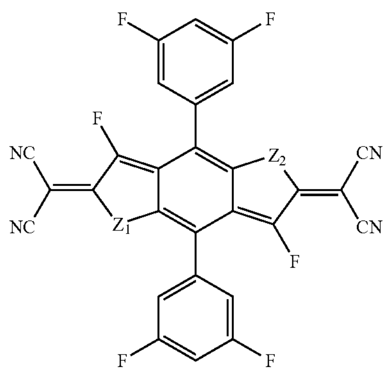

$Z_1 = Z_2 = O$ Compound O-83
$Z_1 = Z_2 = S$ Compound S-83
$Z_1 = Z_2 = Se$ Compound Se-83

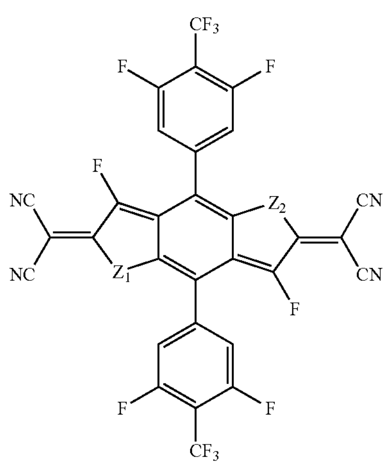

$Z_1 = Z_2 = O$ Compound O-84
$Z_1 = Z_2 = S$ Compound S-84
$Z_1 = Z_2 = Se$ Compound Se-84

-continued

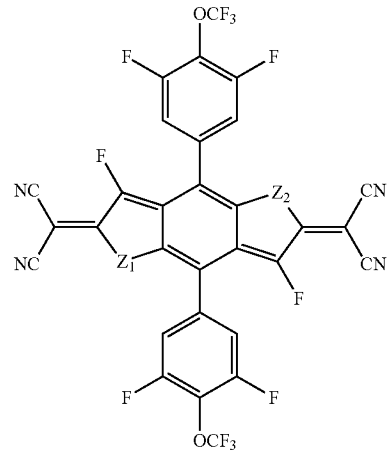

$Z_1 = Z_2 = O$ Compound O-85
$Z_1 = Z_2 = S$ Compound S-85
$Z_1 = Z_2 = Se$ Compound Se-85

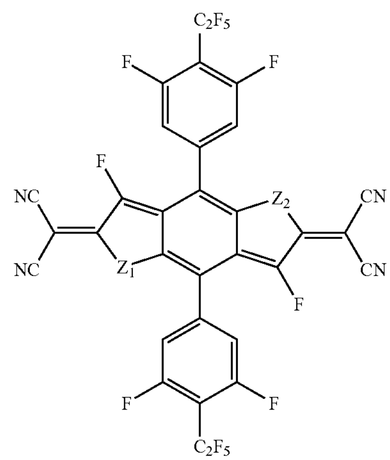

$Z_1 = Z_2 = O$ Compound O-86
$Z_1 = Z_2 = S$ Compound S-86
$Z_1 = Z_2 = Se$ Compound Se-86

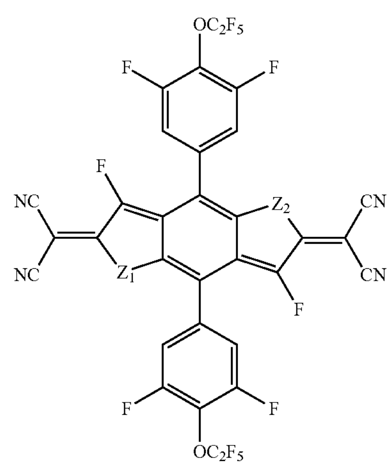

$Z_1 = Z_2 = O$ Compound O-87
$Z_1 = Z_2 = S$ Compound S-87
$Z_1 = Z_2 = Se$ Compound Se-87

-continued

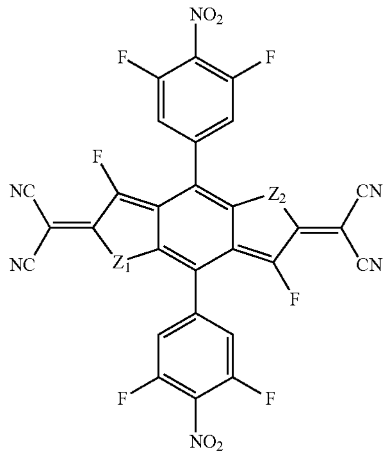

$Z_1 = Z_2 = O$ Compound O-88
$Z_1 = Z_2 = S$ Compound S-88
$Z_1 = Z_2 = Se$ Compound Se-88

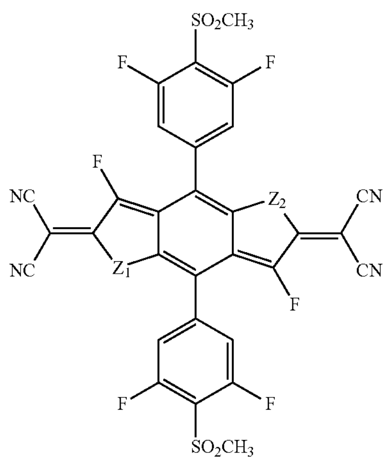

$Z_1 = Z_2 = O$ Compound O-89
$Z_1 = Z_2 = S$ Compound S-89
$Z_1 = Z_2 = Se$ Compound Se-89

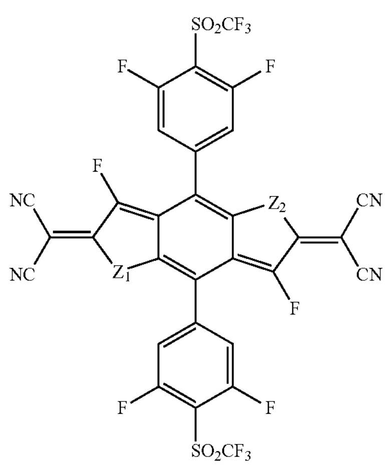

$Z_1 = Z_2 = O$ Compound O-90
$Z_1 = Z_2 = S$ Compound S-90
$Z_1 = Z_2 = Se$ Compound Se-90

-continued

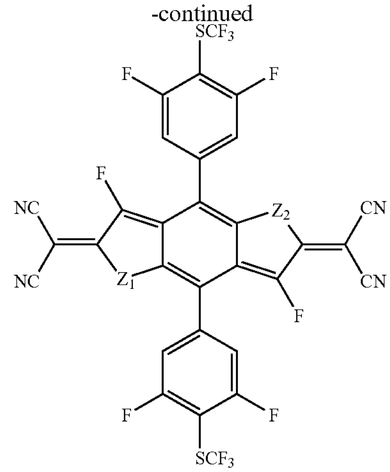

$Z_1 = Z_2 = O$ Compound O-91
$Z_1 = Z_2 = S$ Compound S-91
$Z_1 = Z_2 = Se$ Compound Se-91

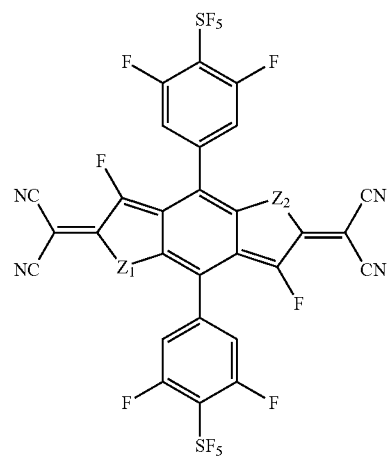

$Z_1 = Z_2 = O$ Compound O-92
$Z_1 = Z_2 = S$ Compound S-92
$Z_1 = Z_2 = Se$ Compound Se-92

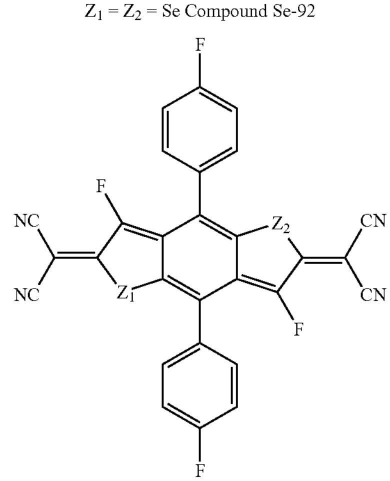

$Z_1 = Z_2 = O$ Compound O-93
$Z_1 = Z_2 = S$ Compound S-93
$Z_1 = Z_2 = Se$ Compound Se-93

-continued

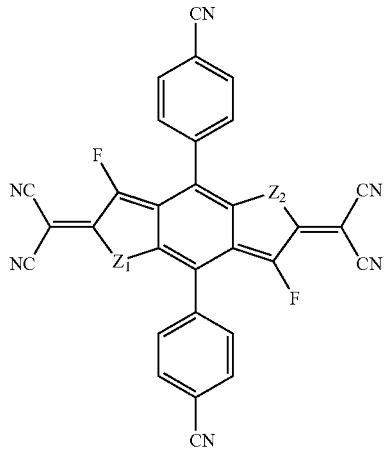

$Z_1 = Z_2 = O$ Compound O-94
$Z_1 = Z_2 = S$ Compound S-94
$Z_1 = Z_2 = Se$ Compound Se-94

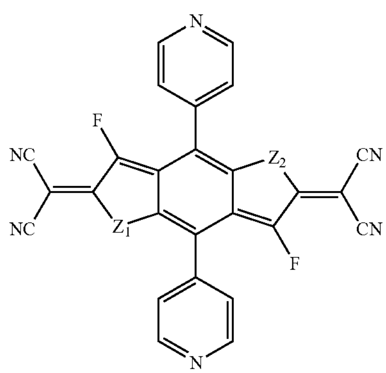

$Z_1 = Z_2 = O$ Compound O-95
$Z_1 = Z_2 = S$ Compound S-95
$Z_1 = Z_2 = Se$ Compound Se-95

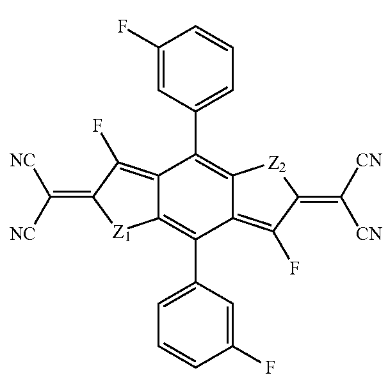

$Z_1 = Z_2 = O$ Compound O-96
$Z_1 = Z_2 = S$ Compound S-96
$Z_1 = Z_2 = Se$ Compound Se-96

-continued

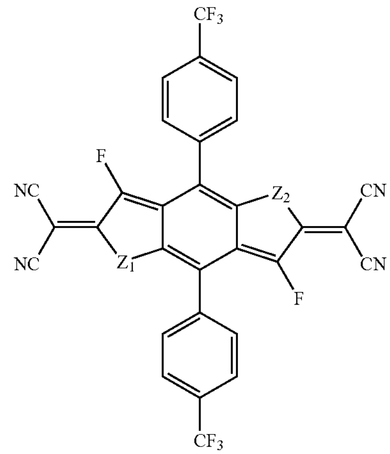

$Z_1 = Z_2 = O$ Compound O-97
$Z_1 = Z_2 = S$ Compound S-97
$Z_1 = Z_2 = Se$ Compound Se-97

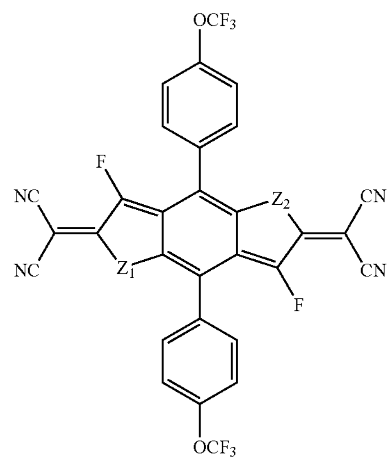

$Z_1 = Z_2 = O$ Compound O-98
$Z_1 = Z_2 = S$ Compound S-98
$Z_1 = Z_2 = Se$ Compound Se-98

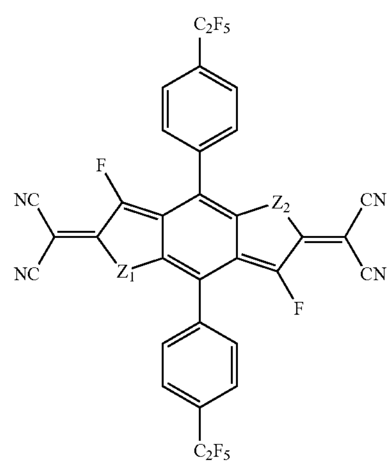

$Z_1 = Z_2 = O$ Compound O-99
$Z_1 = Z_2 = S$ Compound S-99
$Z_1 = Z_2 = Se$ Compound Se-99

-continued

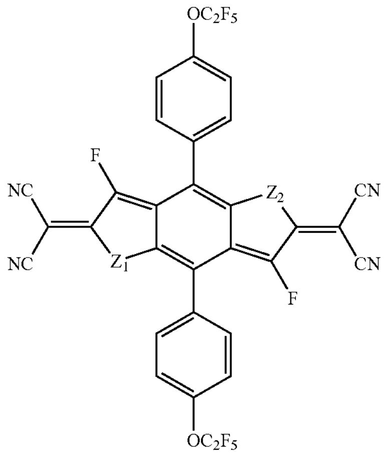

$Z_1 = Z_2 = O$ Compound O-100
$Z_1 = Z_2 = S$ Compound S-100
$Z_1 = Z_2 = Se$ Compound Se-100

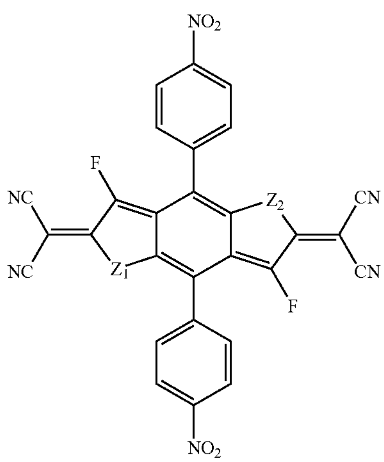

$Z_1 = Z_2 = O$ Compound O-101
$Z_1 = Z_2 = S$ Compound S-101
$Z_1 = Z_2 = Se$ Compound Se-101

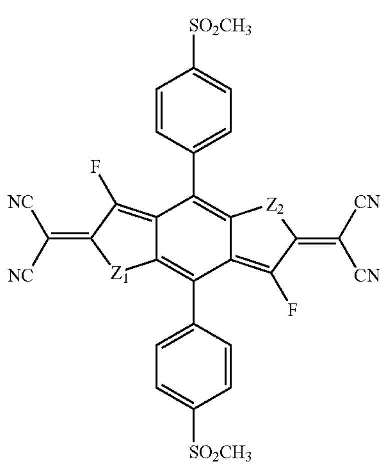

$Z_1 = Z_2 = O$ Compound O-102
$Z_1 = Z_2 = S$ Compound S-102
$Z_1 = Z_2 = Se$ Compound Se-102

-continued

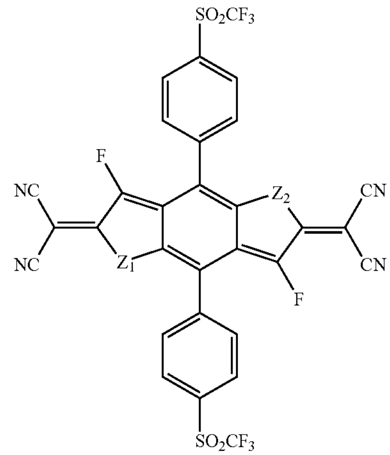

$Z_1 = Z_2 = O$ Compound O-103
$Z_1 = Z_2 = S$ Compound S-103
$Z_1 = Z_2 = Se$ Compound Se-103

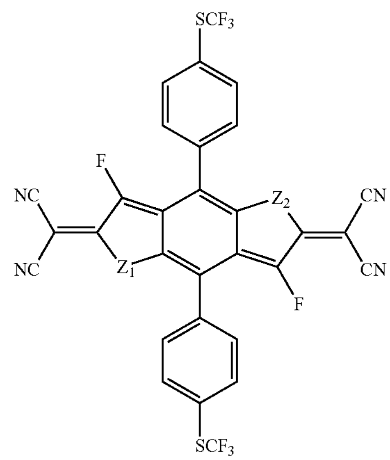

$Z_1 = Z_2 = O$ Compound O-104
$Z_1 = Z_2 = S$ Compound S-104
$Z_1 = Z_2 = Se$ Compound Se-104

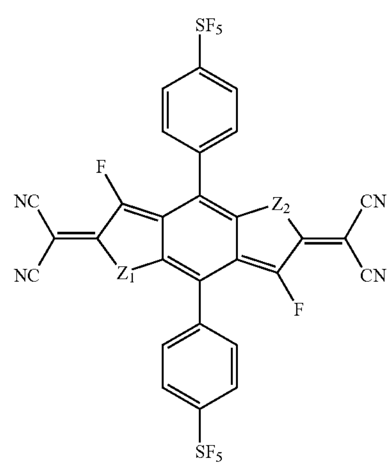

$Z_1 = Z_2 = O$ Compound O-105
$Z_1 = Z_2 = S$ Compound S-105
$Z_1 = Z_2 = Se$ Compound Se-105

-continued

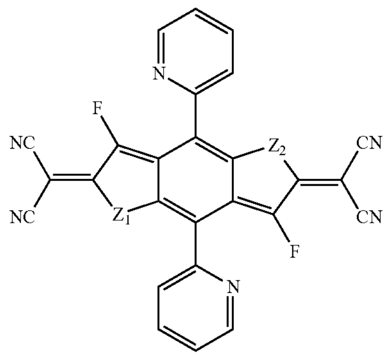

$Z_1 = Z_2 = O$ Compound O-106
$Z_1 = Z_2 = S$ Compound S-106
$Z_1 = Z_2 = Se$ Compound Se-106

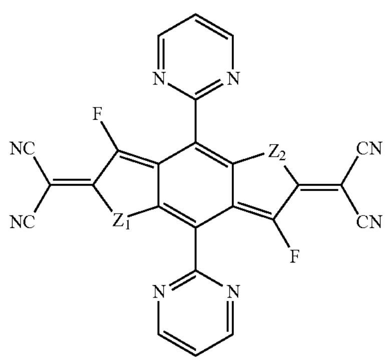

$Z_1 = Z_2 = O$ Compound O-107
$Z_1 = Z_2 = S$ Compound S-107
$Z_1 = Z_2 = Se$ Compound Se-107

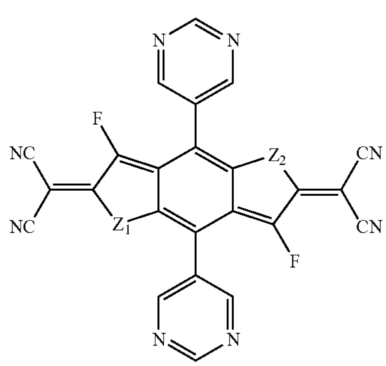

$Z_1 = Z_2 = O$ Compound O-108
$Z_1 = Z_2 = S$ Compound S-108
$Z_1 = Z_2 = Se$ Compound Se-108

-continued

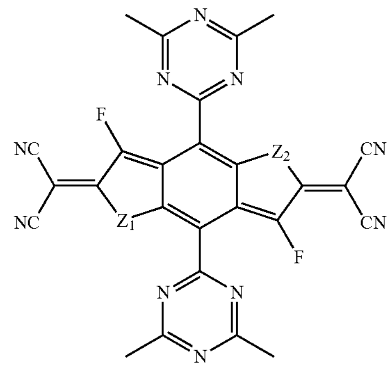

$Z_1 = Z_2 = O$ Compound O-109
$Z_1 = Z_2 = S$ Compound S-109
$Z_1 = Z_2 = Se$ Compound Se-109

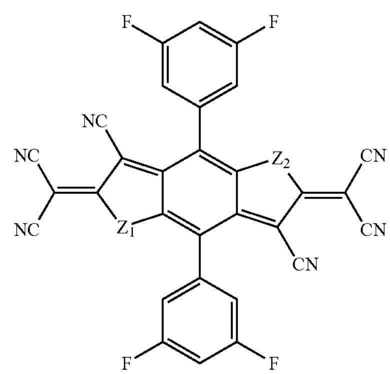

$Z_1 = Z_2 = O$ Compound O-110
$Z_1 = Z_2 = S$ Compound S-110
$Z_1 = Z_2 = Se$ Compound Se-110

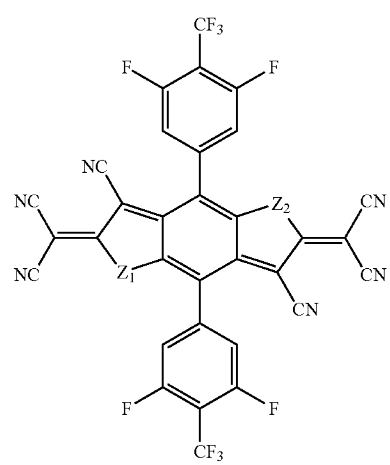

$Z_1 = Z_2 = O$ Compound O-111
$Z_1 = Z_2 = S$ Compound S-111
$Z_1 = Z_2 = Se$ Compound Se-111

-continued

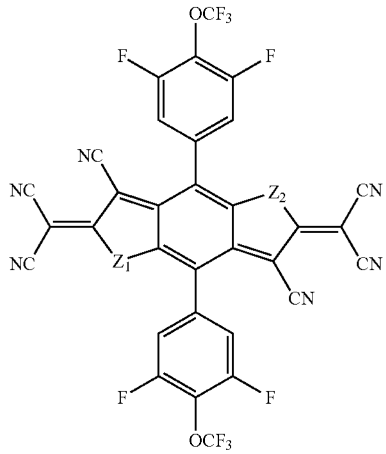

$Z_1 = Z_2 = O$ Compound O-112
$Z_1 = Z_2 = S$ Compound S-112
$Z_1 = Z_2 = Se$ Compound Se-112

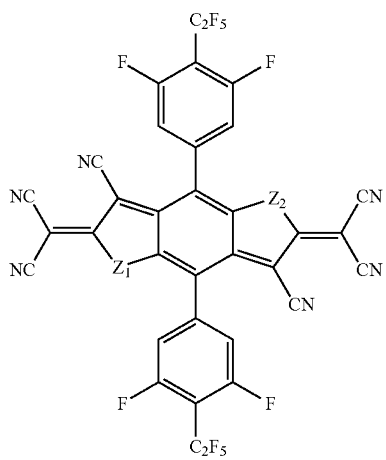

$Z_1 = Z_2 = O$ Compound O-113
$Z_1 = Z_2 = S$ Compound S-113
$Z_1 = Z_2 = Se$ Compound Se-113

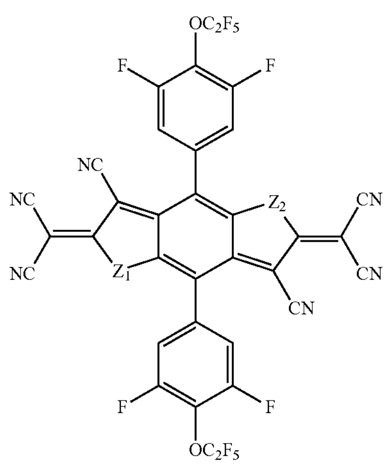

$Z_1 = Z_2 = O$ Compound O-114
$Z_1 = Z_2 = S$ Compound S-114
$Z_1 = Z_2 = Se$ Compound Se-114

-continued

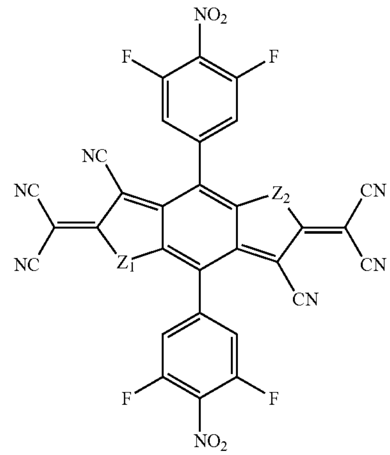

$Z_1 = Z_2 = O$ Compound O-115
$Z_1 = Z_2 = S$ Compound S-115
$Z_1 = Z_2 = Se$ Compound Se-115

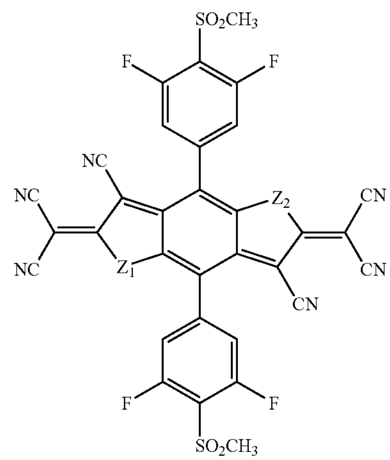

$Z_1 = Z_2 = O$ Compound O-116
$Z_1 = Z_2 = S$ Compound S-116
$Z_1 = Z_2 = Se$ Compound Se-116

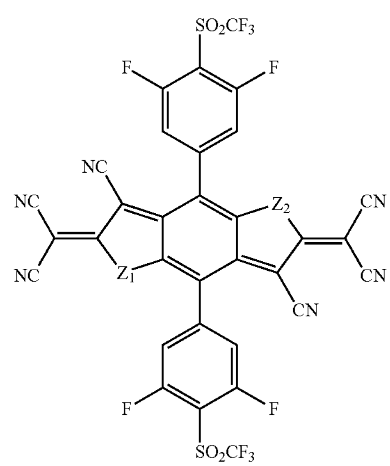

$Z_1 = Z_2 = O$ Compound O-117
$Z_1 = Z_2 = S$ Compound S-117
$Z_1 = Z_2 = Se$ Compound Se-117

-continued

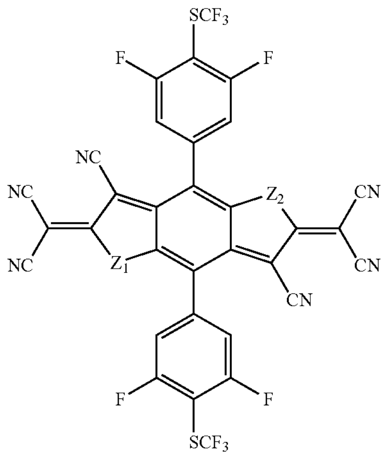

$Z_1 = Z_2 =$ O Compound O-118
$Z_1 = Z_2 =$ S Compound S-118
$Z_1 = Z_2 =$ Se Compound Se-118

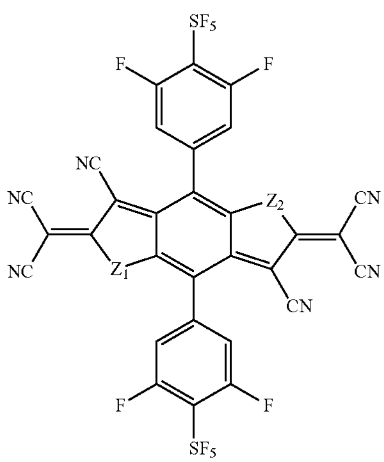

$Z_1 = Z_2 =$ O Compound O-119
$Z_1 = Z_2 =$ S Compound S-119
$Z_1 = Z_2 =$ Se Compound Se-119

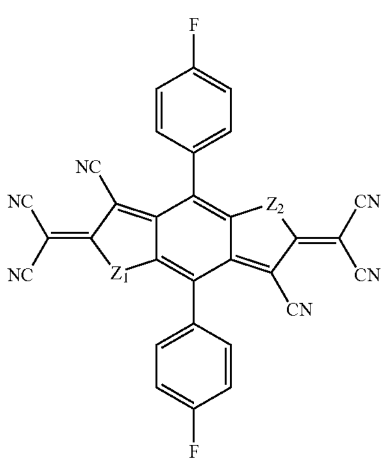

$Z_1 = Z_2 =$ O Compound O-120
$Z_1 = Z_2 =$ S Compound S-120
$Z_1 = Z_2 =$ Se Compound Se-120

-continued

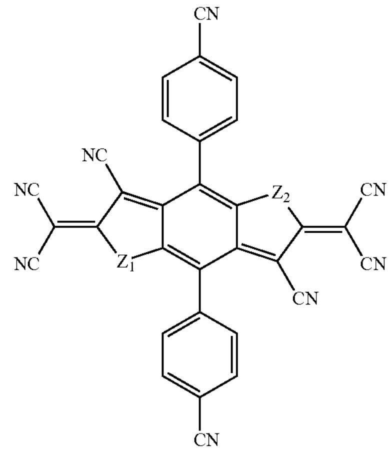

$Z_1 = Z_2 =$ O Compound O-121
$Z_1 = Z_2 =$ S Compound S-121
$Z_1 = Z_2 =$ Se Compound Se-121

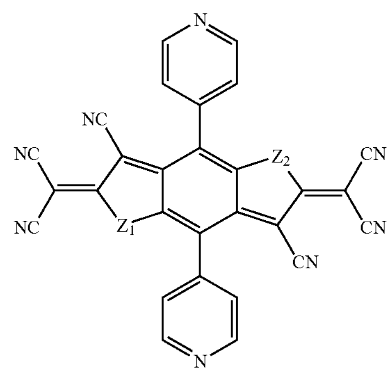

$Z_1 = Z_2 =$ O Compound O-122
$Z_1 = Z_2 =$ S Compound S-122
$Z_1 = Z_2 =$ Se Compound Se-122

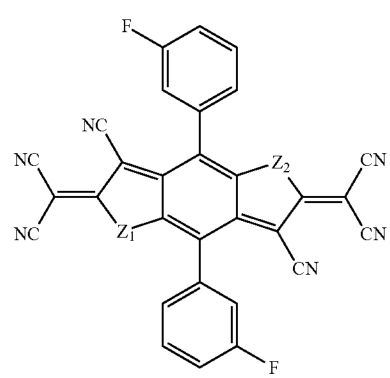

$Z_1 = Z_2 =$ O Compound O-123
$Z_1 = Z_2 =$ S Compound S-123
$Z_1 = Z_2 =$ Se Compound Se-123

-continued

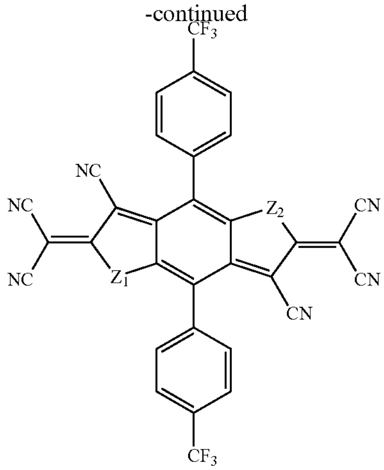

$Z_1 = Z_2 =$ O Compound O-124
$Z_1 = Z_2 =$ S Compound S-124
$Z_1 = Z_2 =$ Se Compound Se-124

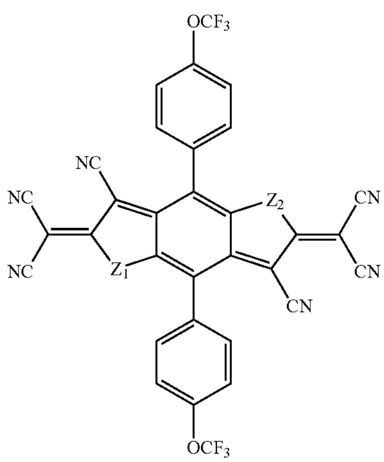

$Z_1 = Z_2 =$ O Compound O-125
$Z_1 = Z_2 =$ S Compound S-125
$Z_1 = Z_2 =$ Se Compound Se-125

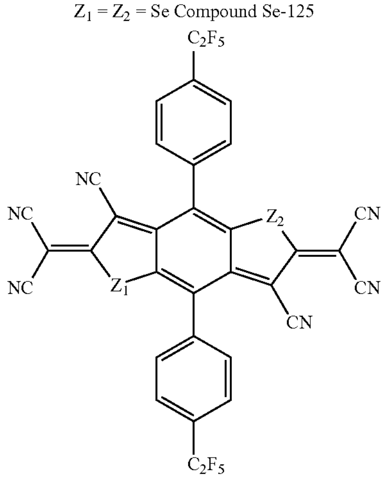

$Z_1 = Z_2 =$ O Compound O-126
$Z_1 = Z_2 =$ S Compound S-126
$Z_1 = Z_2 =$ Se Compound Se-126

-continued

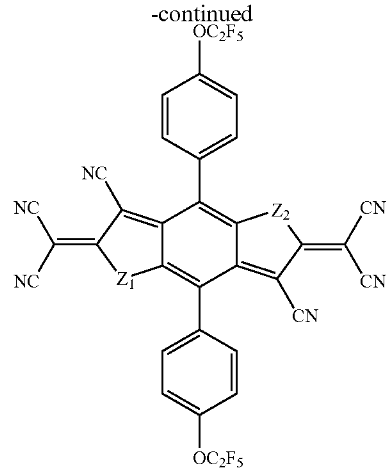

$Z_1 = Z_2 =$ O Compound O-127
$Z_1 = Z_2 =$ S Compound S-127
$Z_1 = Z_2 =$ Se Compound Se-127

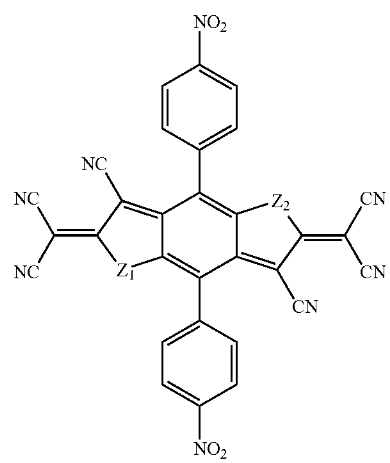

$Z_1 = Z_2 =$ O Compound O-128
$Z_1 = Z_2 =$ S Compound S-128
$Z_1 = Z_2 =$ Se Compound Se-128

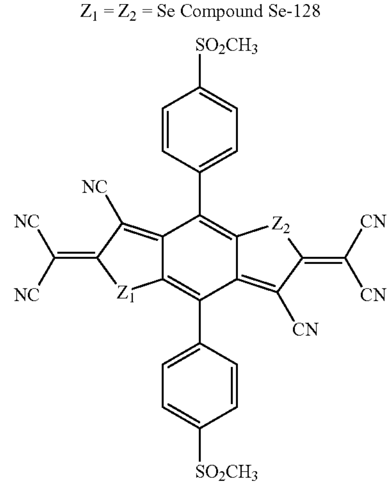

$Z_1 = Z_2 =$ O Compound O-129
$Z_1 = Z_2 =$ S Compound S-129
$Z_1 = Z_2 =$ Se Compound Se-129

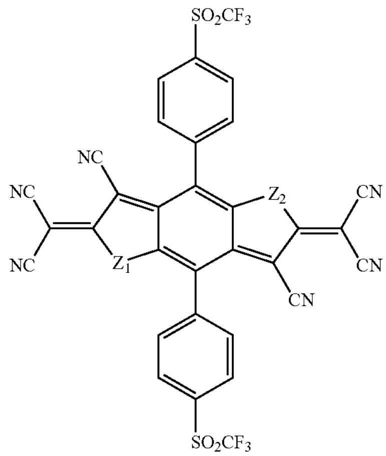

$Z_1 = Z_2 = O$ Compound O-130
$Z_1 = Z_2 = S$ Compound S-130
$Z_1 = Z_2 = Se$ Compound Se-130

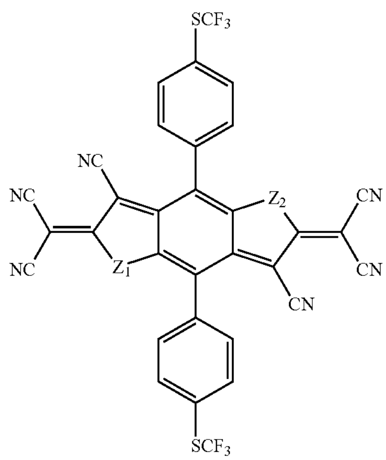

$Z_1 = Z_2 = O$ Compound O-131
$Z_1 = Z_2 = S$ Compound S-131
$Z_1 = Z_2 = Se$ Compound Se-131

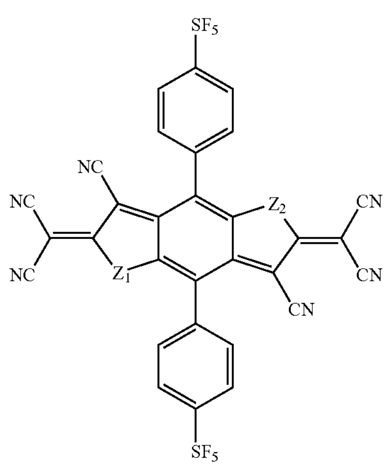

$Z_1 = Z_2 = O$ Compound O-132
$Z_1 = Z_2 = S$ Compound S-132
$Z_1 = Z_2 = Se$ Compound Se-132

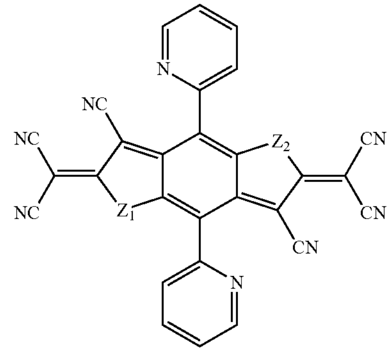

$Z_1 = Z_2 = O$ Compound O-133
$Z_1 = Z_2 = S$ Compound S-133
$Z_1 = Z_2 = Se$ Compound Se-133

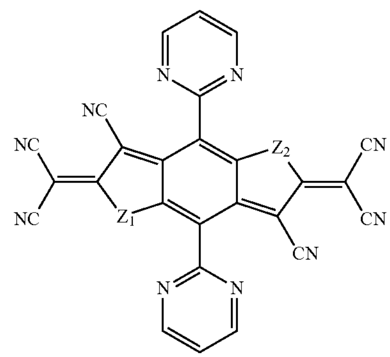

$Z_1 = Z_2 = O$ Compound O-134
$Z_1 = Z_2 = S$ Compound S-134
$Z_1 = Z_2 = Se$ Compound Se-134

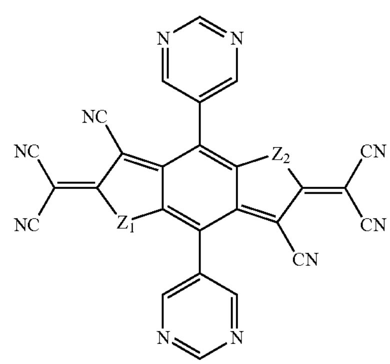

$Z_1 = Z_2 = O$ Compound O-135
$Z_1 = Z_2 = S$ Compound S-135
$Z_1 = Z_2 = Se$ Compound Se-135

-continued

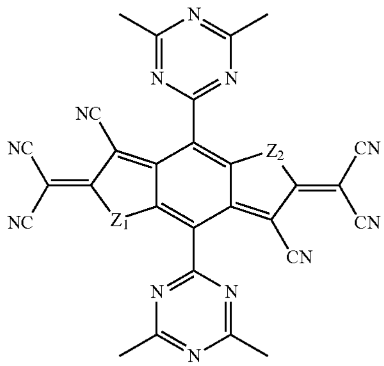

$Z_1 = Z_2 = O$ Compound O-136
$Z_1 = Z_2 = S$ Compound S-136
$Z_1 = Z_2 = Se$ Compound Se-136

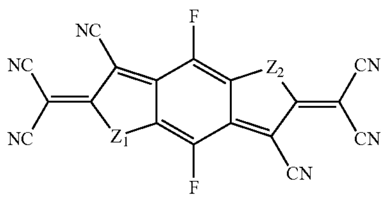

$Z_1 = Z_2 = O$ Compound O-137
$Z_1 = Z_2 = S$ Compound S-137
$Z_1 = Z_2 = Se$ Compound Se-137

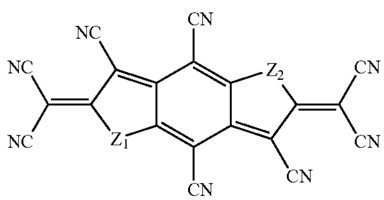

$Z_1 = Z_2 = O$ Compound O-138
$Z_1 = Z_2 = S$ Compound S-138
$Z_1 = Z_2 = Se$ Compound Se-138

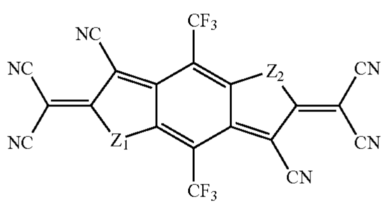

$Z_1 = Z_2 = O$ Compound O-139
$Z_1 = Z_2 = S$ Compound S-139
$Z_1 = Z_2 = Se$ Compound Se-139

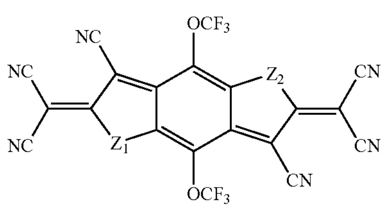

$Z_1 = Z_2 = O$ Compound O-140
$Z_1 = Z_2 = S$ Compound S-140
$Z_1 = Z_2 = Se$ Compound Se-140

-continued

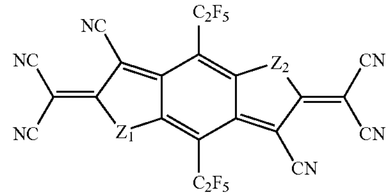

$Z_1 = Z_2 = O$ Compound O-141
$Z_1 = Z_2 = S$ Compound S-141
$Z_1 = Z_2 = Se$ Compound Se-141

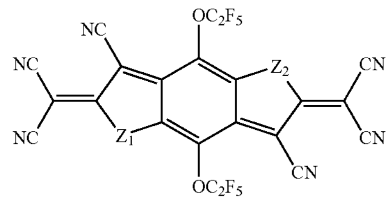

$Z_1 = Z_2 = O$ Compound O-142
$Z_1 = Z_2 = S$ Compound S-142
$Z_1 = Z_2 = Se$ Compound Se-142

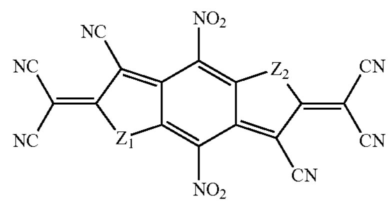

$Z_1 = Z_2 = O$ Compound O-143
$Z_1 = Z_2 = S$ Compound S-143
$Z_1 = Z_2 = Se$ Compound Se-143

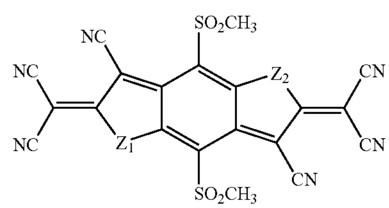

$Z_1 = Z_2 = O$ Compound O-144
$Z_1 = Z_2 = S$ Compound S-144
$Z_1 = Z_2 = Se$ Compound Se-144

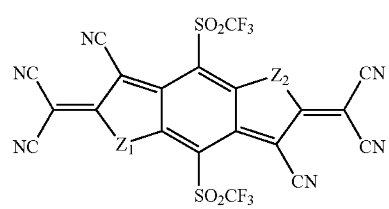

$Z_1 = Z_2 = O$ Compound O-145
$Z_1 = Z_2 = S$ Compound S-145
$Z_1 = Z_2 = Se$ Compound Se-145

-continued

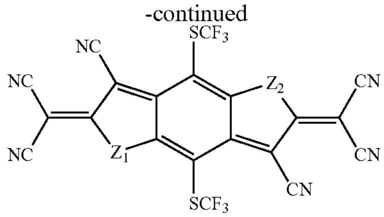

$Z_1 = Z_2 =$ O Compound O-146
$Z_1 = Z_2 =$ S Compound S-146
$Z_1 = Z_2 =$ Se Compound Se-146

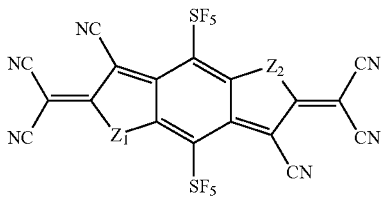

$Z_1 = Z_2 =$ O Compound O-147
$Z_1 = Z_2 =$ S Compound S-147
$Z_1 = Z_2 =$ Se Compound Se-147

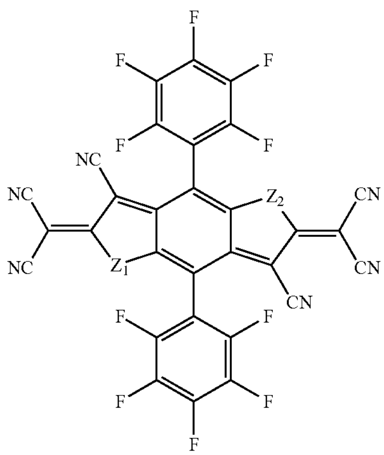

$Z_1 = Z_2 =$ O Compound O-148
$Z_1 = Z_2 =$ S Compound S-148
$Z_1 = Z_2 =$ Se Compound Se-148

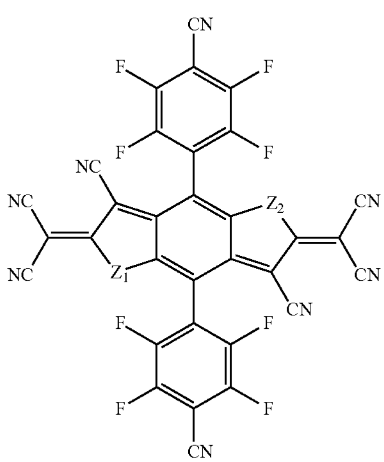

$Z_1 = Z_2 =$ O Compound O-149
$Z_1 = Z_2 =$ S Compound S-149
$Z_1 = Z_2 =$ Se Compound Se-149

-continued

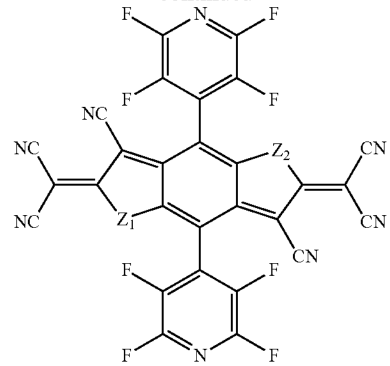

$Z_1 = Z_2 =$ O Compound O-150
$Z_1 = Z_2 =$ S Compound S-150
$Z_1 = Z_2 =$ Se Compound Se-150

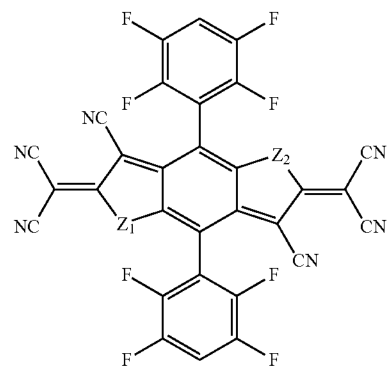

$Z_1 = Z_2 =$ O Compound O-151
$Z_1 = Z_2 =$ S Compound S-151
$Z_1 = Z_2 =$ Se Compound Se-151

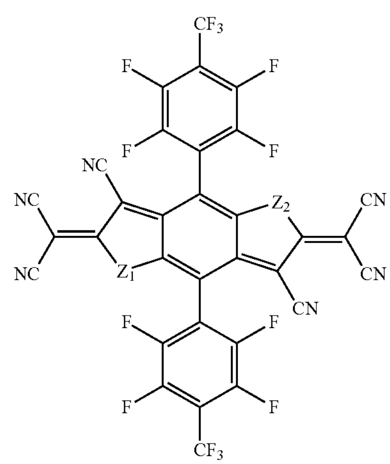

$Z_1 = Z_2 =$ O Compound O-152
$Z_1 = Z_2 =$ S Compound S-152
$Z_1 = Z_2 =$ Se Compound Se-152

-continued

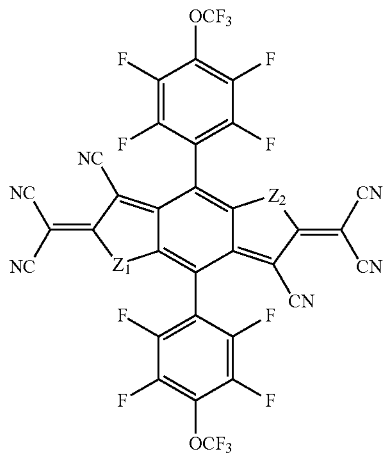

$Z_1 = Z_2 =$ O Compound O-153
$Z_1 = Z_2 =$ S Compound S-153
$Z_1 = Z_2 =$ Se Compound Se-153

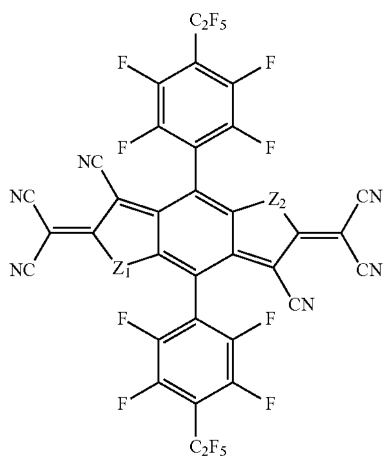

$Z_1 = Z_2 =$ O Compound O-154
$Z_1 = Z_2 =$ S Compound S-154
$Z_1 = Z_2 =$ Se Compound Se-154

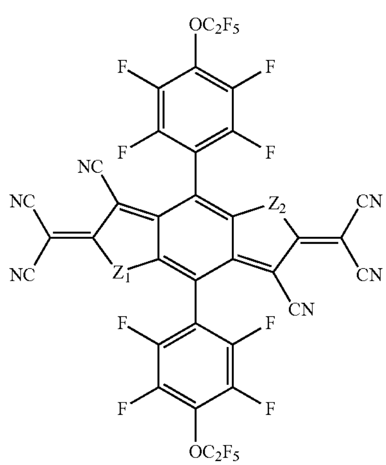

$Z_1 = Z_2 =$ O Compound O-155
$Z_1 = Z_2 =$ S Compound S-155
$Z_1 = Z_2 =$ Se Compound Se-155

-continued

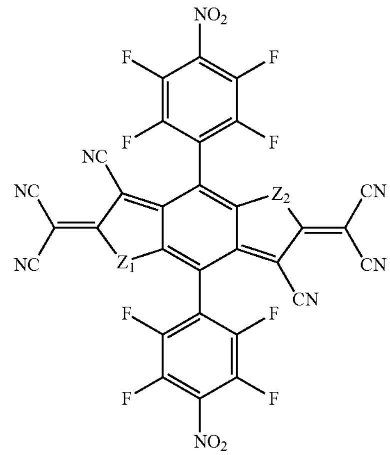

$Z_1 = Z_2 =$ O Compound O-156
$Z_1 = Z_2 =$ S Compound S-156
$Z_1 = Z_2 =$ Se Compound Se-156

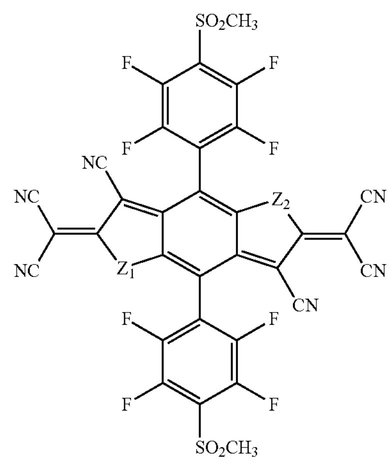

$Z_1 = Z_2 =$ O Compound O-157
$Z_1 = Z_2 =$ S Compound S-157
$Z_1 = Z_2 =$ Se Compound Se-157

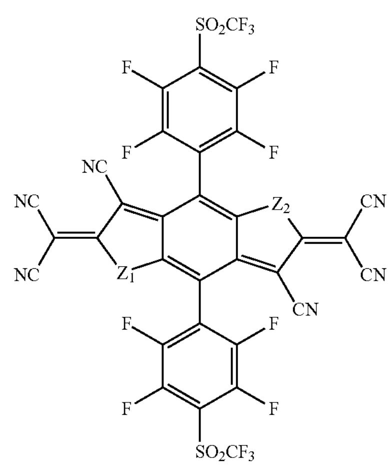

$Z_1 = Z_2 =$ O Compound O-158
$Z_1 = Z_2 =$ S Compound S-158
$Z_1 = Z_2 =$ Se Compound Se-158

-continued

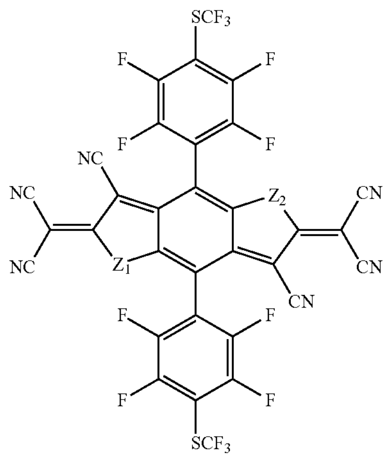

$Z_1 = Z_2 = O$ Compound O-159
$Z_1 = Z_2 = S$ Compound S-159
$Z_1 = Z_2 = Se$ Compound Se-159

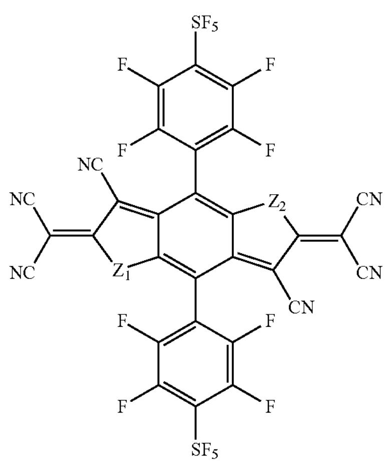

$Z_1 = Z_2 = O$ Compound O-160
$Z_1 = Z_2 = S$ Compound S-160
$Z_1 = Z_2 = Se$ Compound Se-160

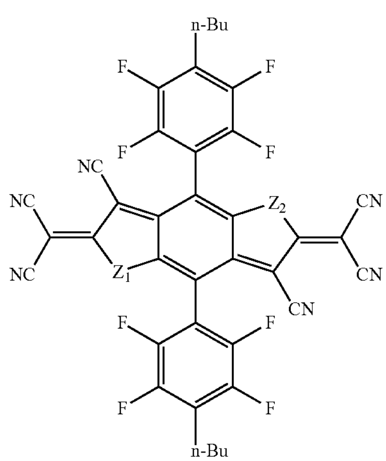

$Z_1 = Z_2 = O$ Compound O-161
$Z_1 = Z_2 = S$ Compound S-161
$Z_1 = Z_2 = Se$ Compound Se-161

-continued

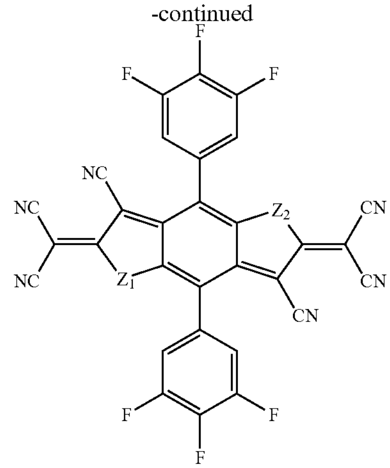

$Z_1 = Z_2 = O$ Compound O-162
$Z_1 = Z_2 = S$ Compound S-162
$Z_1 = Z_2 = Se$ Compound Se-162

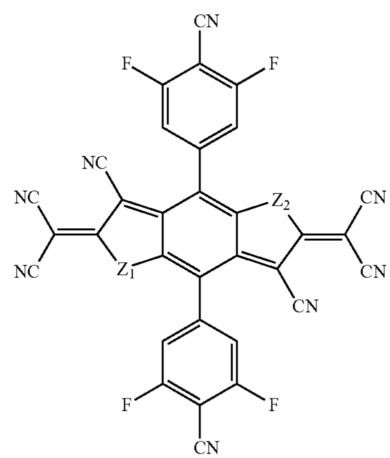

$Z_1 = Z_2 = O$ Compound O-163
$Z_1 = Z_2 = S$ Compound S-163
$Z_1 = Z_2 = Se$ Compound Se-163

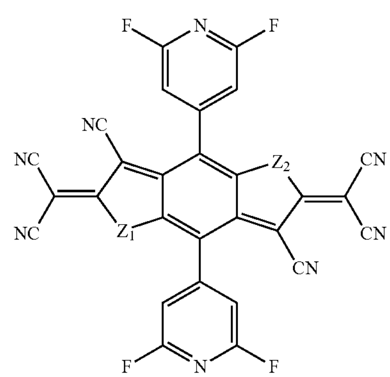

$Z_1 = Z_2 = O$ Compound O-164
$Z_1 = Z_2 = S$ Compound S-164
$Z_1 = Z_2 = Se$ Compound Se-164

-continued

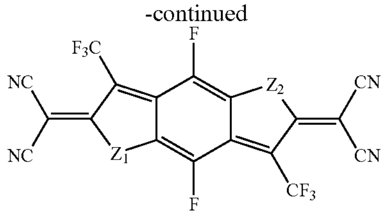

$Z_1 = Z_2$ = O Compound O-165
$Z_1 = Z_2$ = S Compound S-165
$Z_1 = Z_2$ = Se Compound Se-165

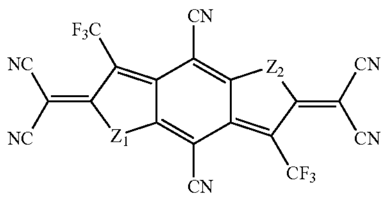

$Z_1 = Z_2$ = O Compound O-166
$Z_1 = Z_2$ = S Compound S-166
$Z_1 = Z_2$ = Se Compound Se-166

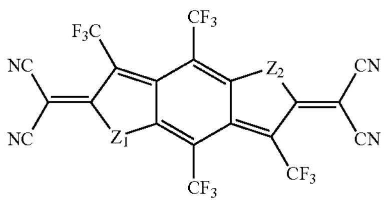

$Z_1 = Z_2$ = O Compound O-167
$Z_1 = Z_2$ = S Compound S-167
$Z_1 = Z_2$ = Se Compound Se-167

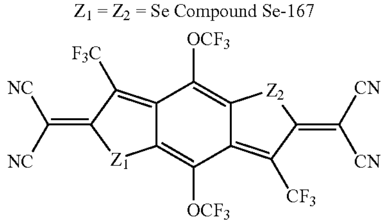

$Z_1 = Z_2$ = O Compound O-168
$Z_1 = Z_2$ = S Compound S-168
$Z_1 = Z_2$ = Se Compound Se-168

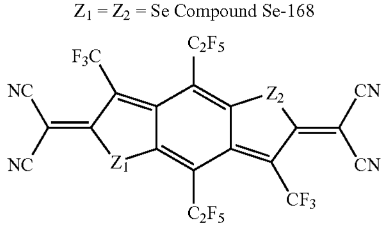

$Z_1 = Z_2$ = O Compound O-169
$Z_1 = Z_2$ = S Compound S-169
$Z_1 = Z_2$ = Se Compound Se-169

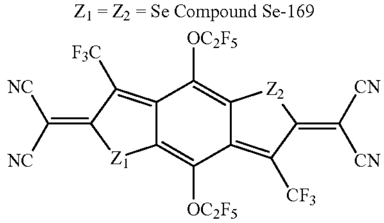

$Z_1 = Z_2$ = O Compound O-170
$Z_1 = Z_2$ = S Compound S-170
$Z_1 = Z_2$ = Se Compound Se-170

-continued

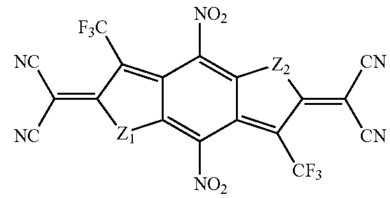

$Z_1 = Z_2$ = O Compound O-171
$Z_1 = Z_2$ = S Compound S-171
$Z_1 = Z_2$ = Se Compound Se-171

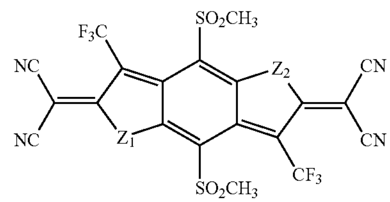

$Z_1 = Z_2$ = O Compound O-172
$Z_1 = Z_2$ = S Compound S-172
$Z_1 = Z_2$ = Se Compound Se-172

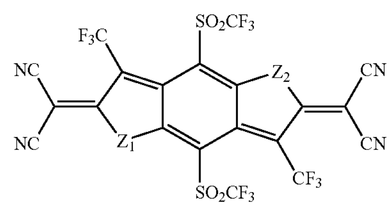

$Z_1 = Z_2$ = O Compound O-173
$Z_1 = Z_2$ = S Compound S-173
$Z_1 = Z_2$ = Se Compound Se-173

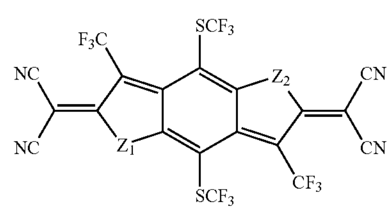

$Z_1 = Z_2$ = O Compound O-174
$Z_1 = Z_2$ = S Compound S-174
$Z_1 = Z_2$ = Se Compound Se-174

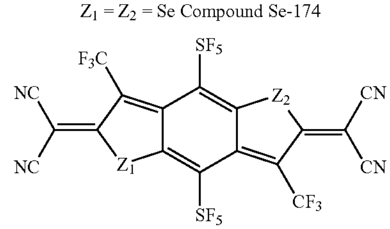

$Z_1 = Z_2$ = O Compound O-175
$Z_1 = Z_2$ = S Compound S-175
$Z_1 = Z_2$ = Se Compound Se-175

-continued

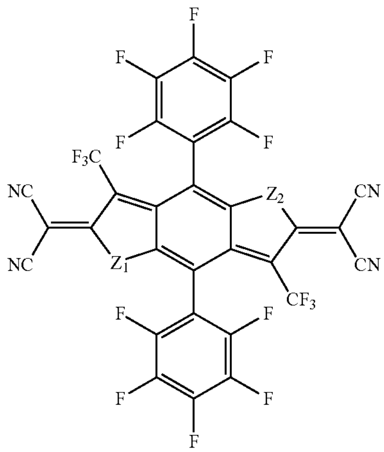

$Z_1 = Z_2 =$ O Compound O-176
$Z_1 = Z_2 =$ S Compound S-176
$Z_1 = Z_2 =$ Se Compound Se-176

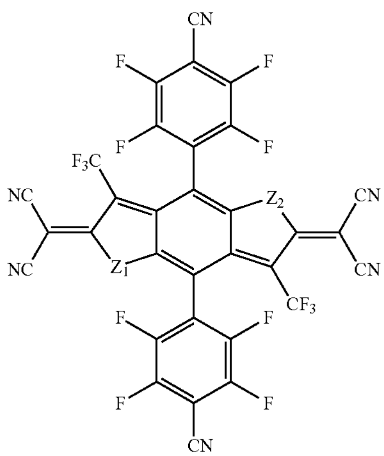

$Z_1 = Z_2 =$ O Compound O-177
$Z_1 = Z_2 =$ S Compound S-177
$Z_1 = Z_2 =$ Se Compound Se-177

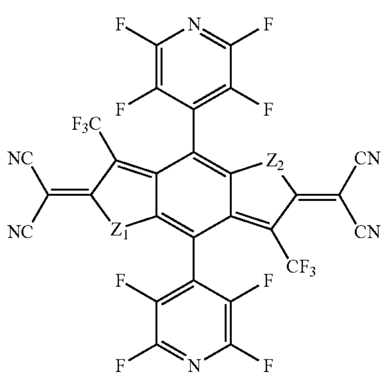

$Z_1 = Z_2 =$ O Compound O-178
$Z_1 = Z_2 =$ S Compound S-178
$Z_1 = Z_2 =$ Se Compound Se-178

-continued

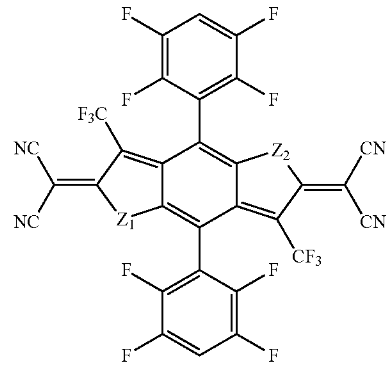

$Z_1 = Z_2 =$ O Compound O-179
$Z_1 = Z_2 =$ S Compound S-179
$Z_1 = Z_2 =$ Se Compound Se-179

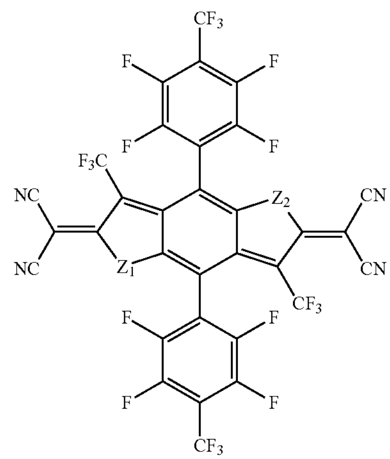

$Z_1 = Z_2 =$ O Compound O-180
$Z_1 = Z_2 =$ S Compound S-180
$Z_1 = Z_2 =$ Se Compound Se-180

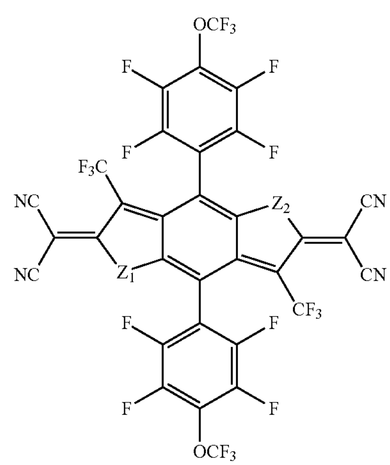

$Z_1 = Z_2 =$ O Compound O-181
$Z_1 = Z_2 =$ S Compound S-181
$Z_1 = Z_2 =$ Se Compound Se-181

-continued

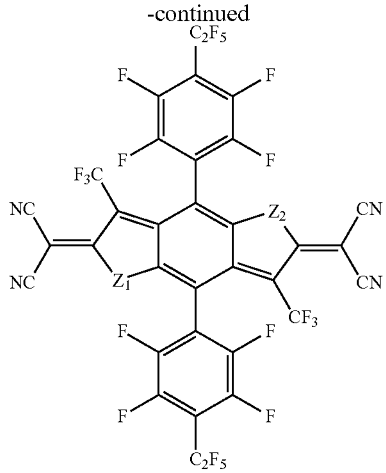

$Z_1 = Z_2 =$ O Compound O-182
$Z_1 = Z_2 =$ S Compound S-182
$Z_1 = Z_2 =$ Se Compound Se-182

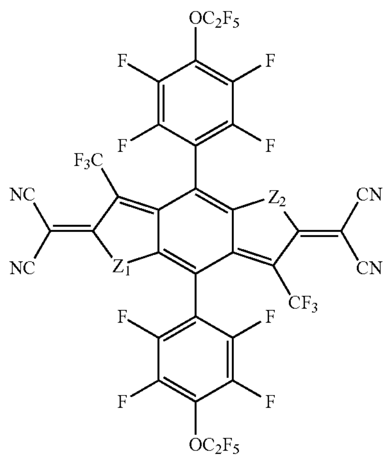

$Z_1 = Z_2 =$ O Compound O-183
$Z_1 = Z_2 =$ S Compound S-183
$Z_1 = Z_2 =$ Se Compound Se-183

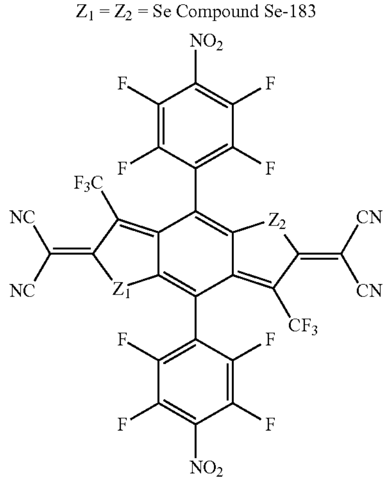

$Z_1 = Z_2 =$ O Compound O-184
$Z_1 = Z_2 =$ S Compound S-184
$Z_1 = Z_2 =$ Se Compound Se-184

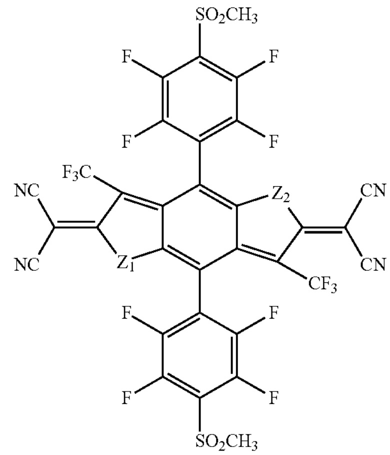

$Z_1$=$Z_1$=O Compound O-185
$Z_1$=$Z_2$=S Compound S-185
$Z_1$=$Z_2$=Se Compound Se-185

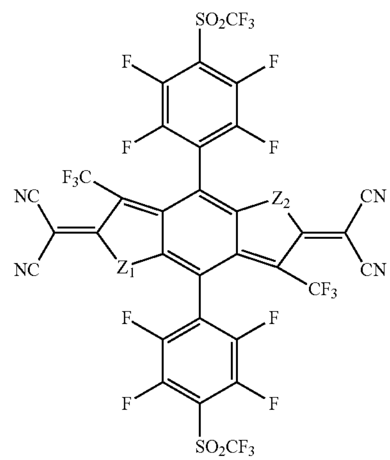

$Z_1$=$Z_1$=O Compound O-186
$Z_1$=$Z_2$=S Compound S-186
$Z_1$=$Z_2$=Se Compound Se-186

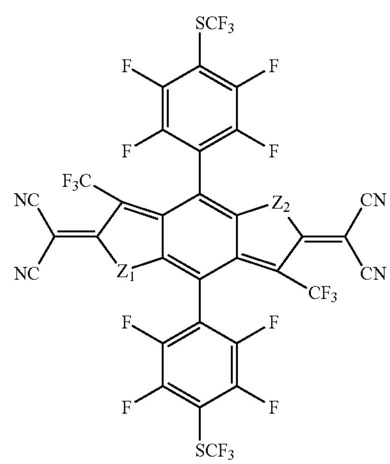

$Z_1$=$Z_1$=O Compound O-187
$Z_1$=$Z_2$=S Compound S-187
$Z_1$=$Z_2$=Se Compound Se-187

-continued

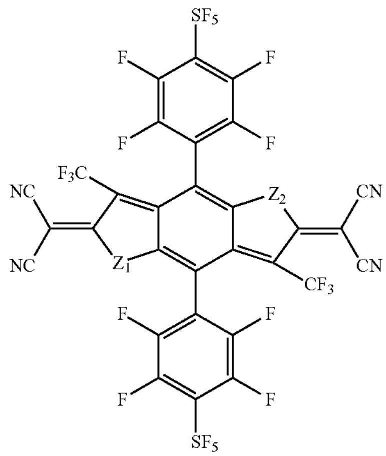

$Z_1$=$Z_1$=O Compound O-188
$Z_1$=$Z_2$=S Compound S-188
$Z_1$=$Z_2$=Se Compound Se-188

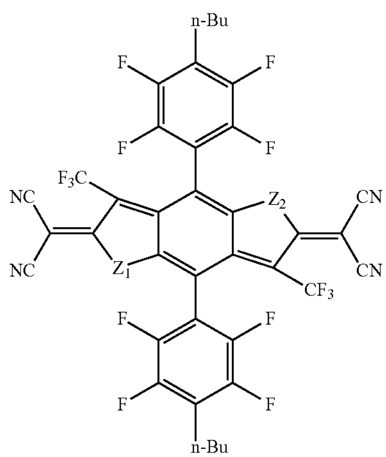

$Z_1$=$Z_1$=O Compound O-189
$Z_1$=$Z_2$=S Compound S-189
$Z_1$=$Z_2$=Se Compound Se-189

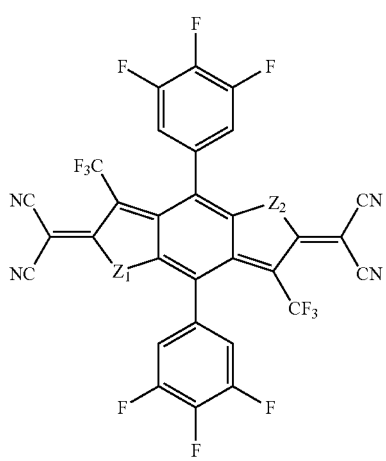

$Z_1$=$Z_1$=O Compound O-190
$Z_1$=$Z_2$=S Compound S-190
$Z_1$=$Z_2$=Se Compound Se-190

-continued

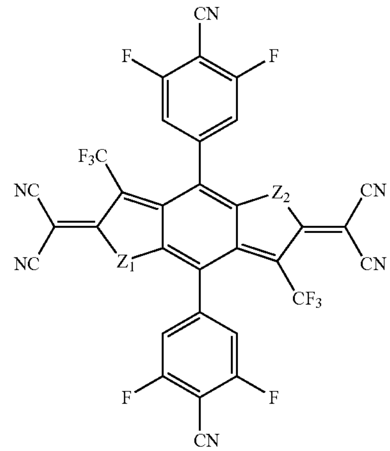

$Z_1$=$Z_1$=O Compound O-191
$Z_1$=$Z_2$=S Compound S-191
$Z_1$=$Z_2$=Se Compound Se-191

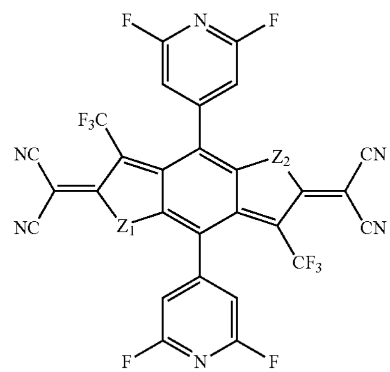

$Z_1$=$Z_1$=O Compound O-192
$Z_1$=$Z_2$=S Compound S-192
$Z_1$=$Z_2$=Se Compound Se-192

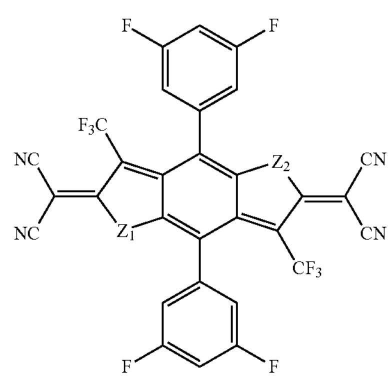

$Z_1$=$Z_1$=O Compound O-193
$Z_1$=$Z_2$=S Compound S-193
$Z_1$=$Z_2$=Se Compound Se-193

-continued

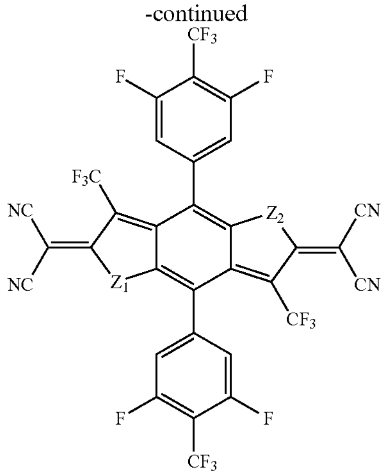

$Z_1$=$Z_1$=O Compound O-194
$Z_1$=$Z_2$=S Compound S-194
$Z_1$=$Z_2$=Se Compound Se-194

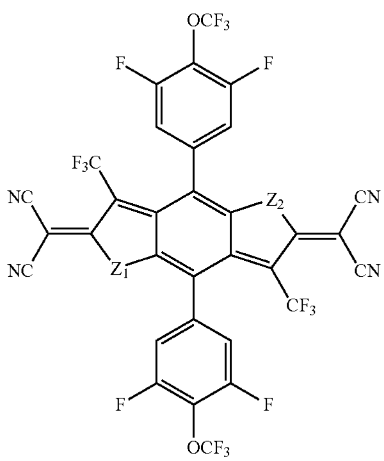

$Z_1$=$Z_1$=O Compound O-195
$Z_1$=$Z_2$=S Compound S-195
$Z_1$=$Z_2$=Se Compound Se-195

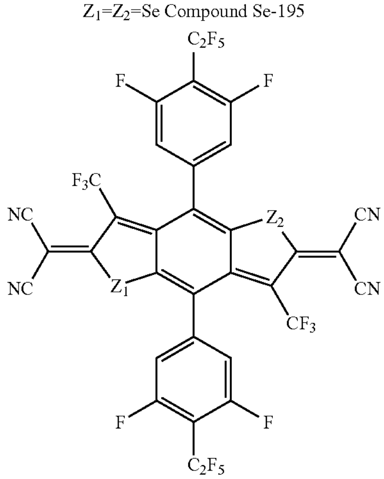

$Z_1$=$Z_1$=O Compound O-196
$Z_1$=$Z_2$=S Compound S-196
$Z_1$=$Z_2$=Se Compound Se-196

-continued

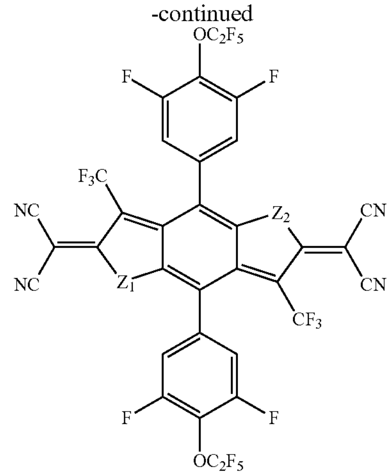

$Z_1$=$Z_1$=O Compound O-197
$Z_1$=$Z_2$=S Compound S-197
$Z_1$=$Z_2$=Se Compound Se-197

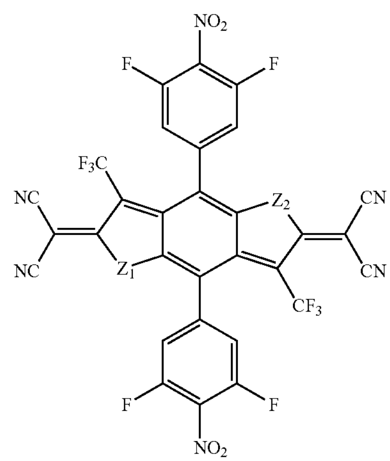

$Z_1$=$Z_1$=O Compound O-198
$Z_1$=$Z_2$=S Compound S-198
$Z_1$=$Z_2$=Se Compound Se-198

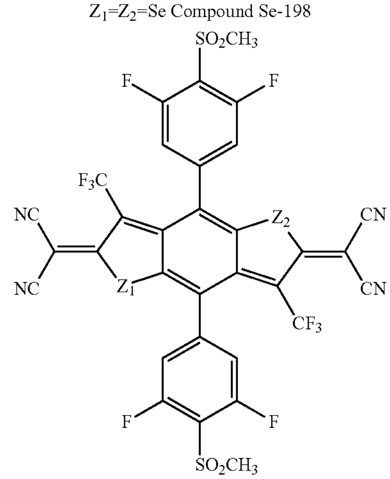

$Z_1$=$Z_1$=O Compound O-199
$Z_1$=$Z_2$=S Compound S-199
$Z_1$=$Z_2$=Se Compound Se-199

-continued

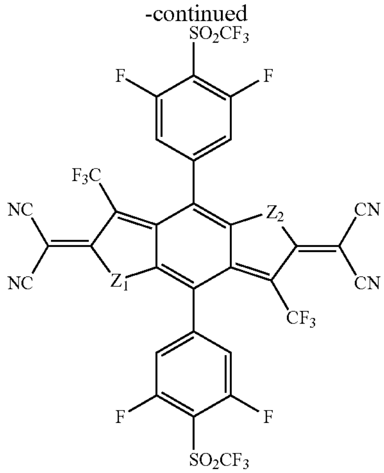

$Z_1$=$Z_1$=O Compound O-200
$Z_1$=$Z_2$=S Compound S-200
$Z_1$=$Z_2$=Se Compound Se-200

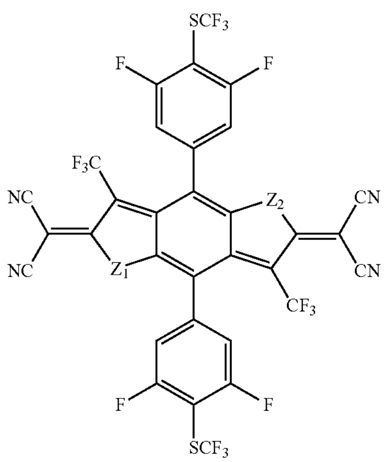

$Z_1$=$Z_1$=O Compound O-201
$Z_1$=$Z_2$=S Compound S-201
$Z_1$=$Z_2$=Se Compound Se-201

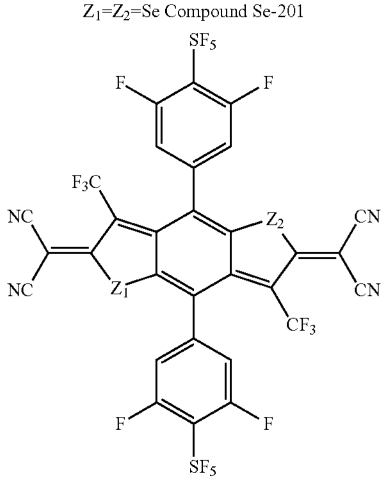

$Z_1$=$Z_1$=O Compound O-202
$Z_1$=$Z_2$=S Compound S-202
$Z_1$=$Z_2$=Se Compound Se-202

-continued

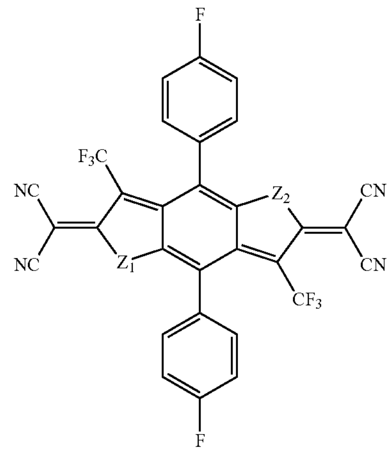

$Z_1$=$Z_1$=O Compound O-203
$Z_1$=$Z_2$=S Compound S-203
$Z_1$=$Z_2$=Se Compound Se-203

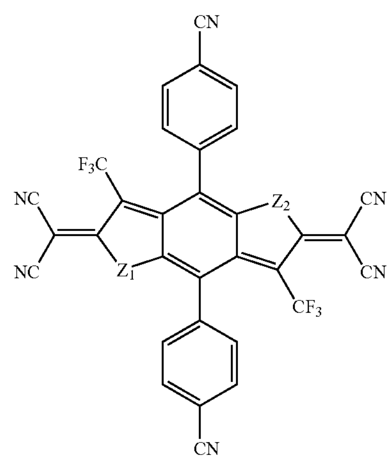

$Z_1$=$Z_1$=O Compound O-204
$Z_1$=$Z_2$=S Compound S-204
$Z_1$=$Z_2$=Se Compound Se-204

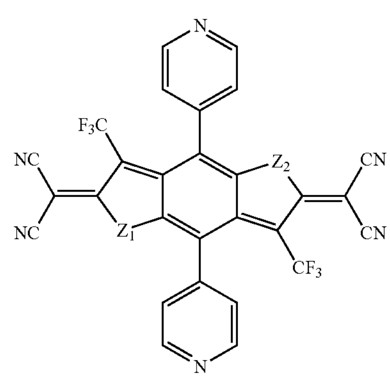

$Z_1$=$Z_1$=O Compound O-205
$Z_1$=$Z_2$=S Compound S-205
$Z_1$=$Z_2$=Se Compound Se-205

-continued

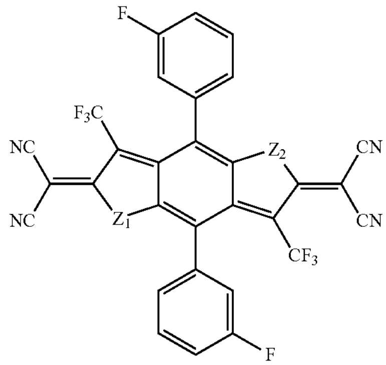

$Z_1=Z_1=O$ Compound O-206
$Z_1=Z_2=S$ Compound S-206
$Z_1=Z_2=Se$ Compound Se-206

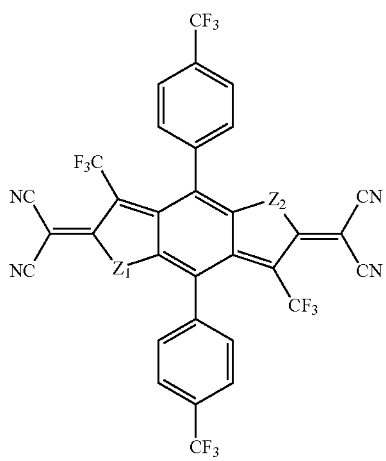

$Z_1=Z_1=O$ Compound O-207
$Z_1=Z_2=S$ Compound S-207
$Z_1=Z_2=Se$ Compound Se-207

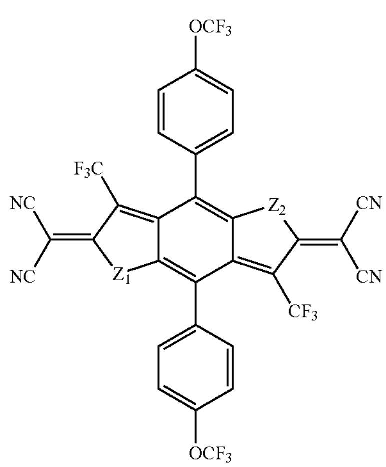

$Z_1=Z_1=O$ Compound O-208
$Z_1=Z_2=S$ Compound S-208
$Z_1=Z_2=Se$ Compound Se-208

-continued

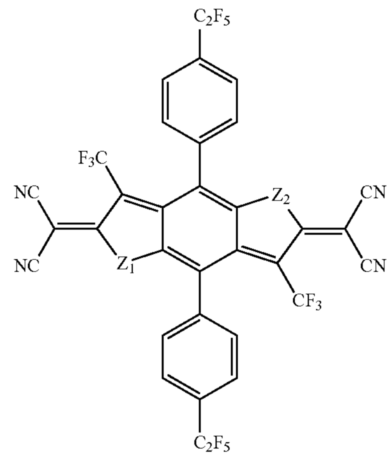

$Z_1=Z_1=O$ Compound O-209
$Z_1=Z_2=S$ Compound S-209
$Z_1=Z_2=Se$ Compound Se-209

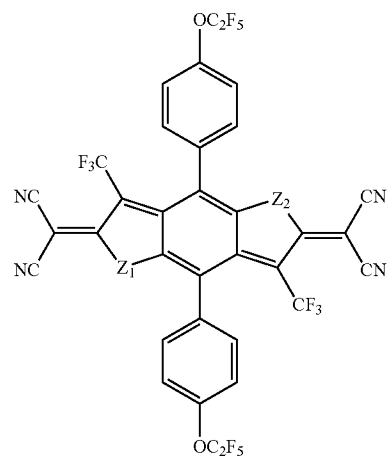

$Z_1=Z_1=O$ Compound O-210
$Z_1=Z_2=S$ Compound S-210
$Z_1=Z_2=Se$ Compound Se-210

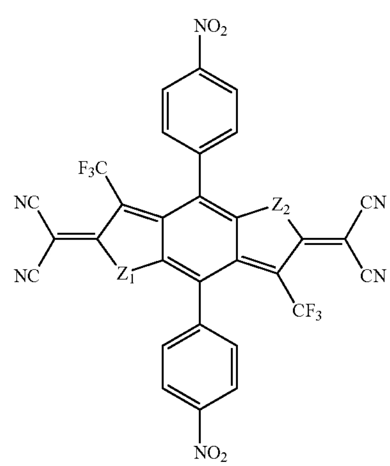

$Z_1=Z_1=O$ Compound O-211
$Z_1=Z_2=S$ Compound S-211
$Z_1=Z_2=Se$ Compound Se-211

-continued

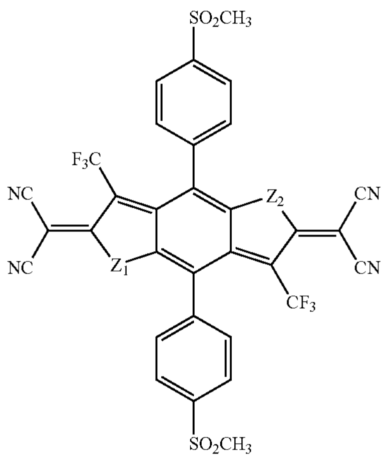

$Z_1$=$Z_1$=O Compound O-212
$Z_1$=$Z_2$=S Compound S-212
$Z_1$=$Z_2$=Se Compound Se-212

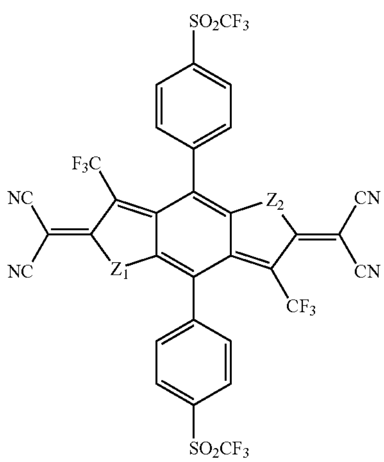

$Z_1$=$Z_1$=O Compound O-213
$Z_1$=$Z_2$=S Compound S-213
$Z_1$=$Z_2$=Se Compound Se-213

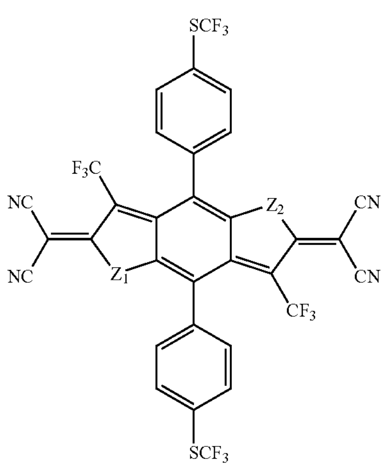

$Z_1$=$Z_1$=O Compound O-214
$Z_1$=$Z_2$=S Compound S-214
$Z_1$=$Z_2$=Se Compound Se-214

-continued

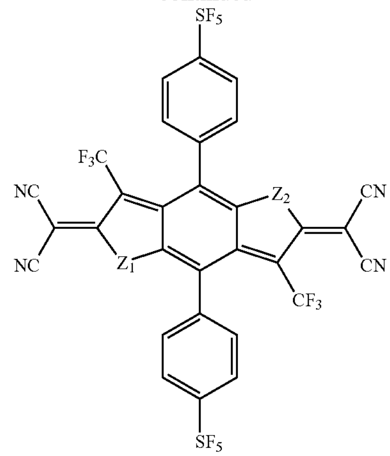

$Z_1$=$Z_1$=O Compound O-215
$Z_1$=$Z_2$=S Compound S-215
$Z_1$=$Z_2$=Se Compound Se-215

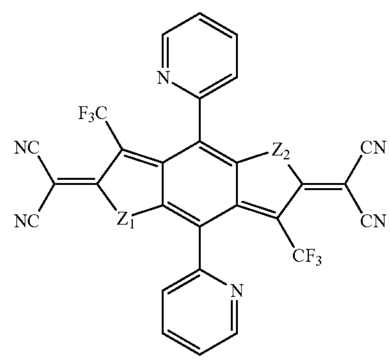

$Z_1$=$Z_1$=O Compound O-216
$Z_1$=$Z_2$=S Compound S-216
$Z_1$=$Z_2$=Se Compound Se-216

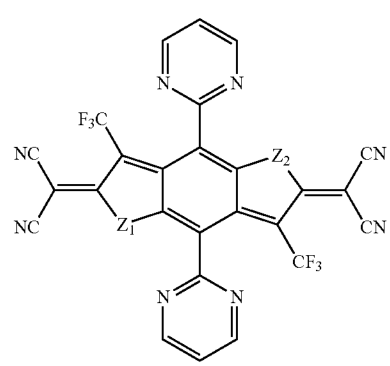

$Z_1$=$Z_1$=O Compound O-217
$Z_1$=$Z_2$=S Compound S-217
$Z_1$=$Z_2$=Se Compound Se-217

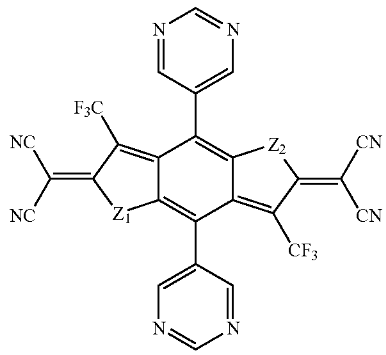

$Z_1$=$Z_1$=O Compound O-218
$Z_1$=$Z_2$=S Compound S-218
$Z_1$=$Z_2$=Se Compound Se-218

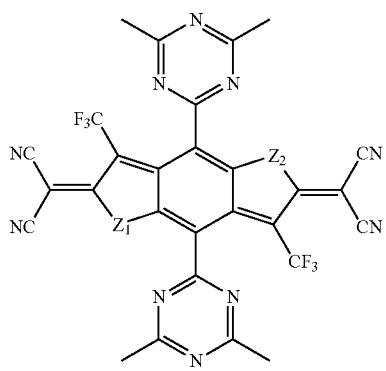

$Z_1$=$Z_1$=O Compound O-219
$Z_1$=$Z_2$=S Compound S-219
$Z_1$=$Z_2$=Se Compound Se-219

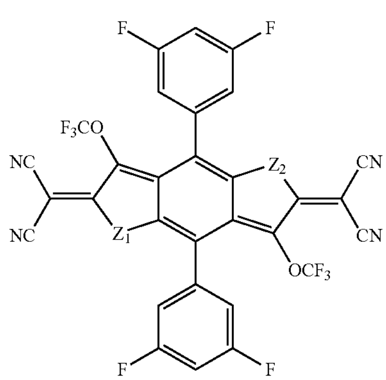

$Z_1$=$Z_1$=O Compound O-220
$Z_1$=$Z_2$=S Compound S-220
$Z_1$=$Z_2$=Se Compound Se-220

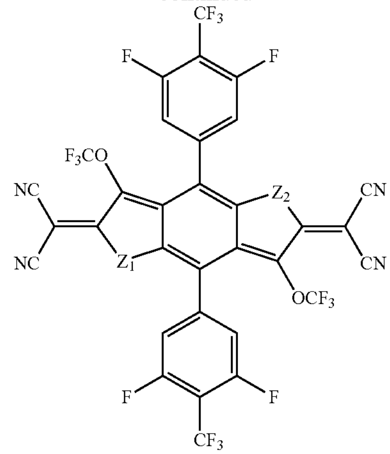

$Z_1$=$Z_1$=O Compound O-221
$Z_1$=$Z_2$=S Compound S-221
$Z_1$=$Z_2$=Se Compound Se-221

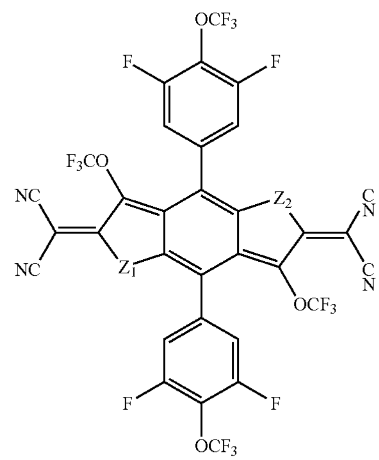

$Z_1$=$Z_1$=O Compound O-222
$Z_1$=$Z_2$=S Compound S-222
$Z_1$=$Z_2$=Se Compound Se-222

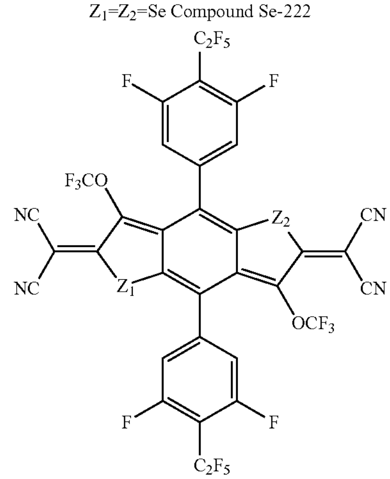

$Z_1$=$Z_1$=O Compound O-223
$Z_1$=$Z_2$=S Compound S-223
$Z_1$=$Z_2$=Se Compound Se-223

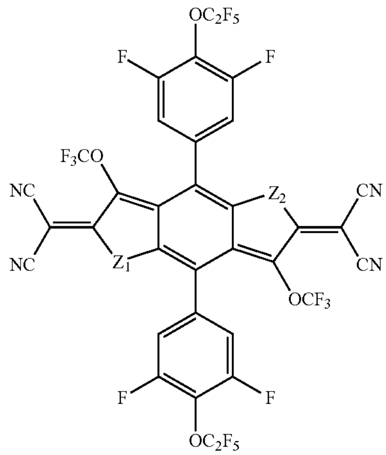

$Z_1$=$Z_1$=O Compound O-224
$Z_1$=$Z_2$=S Compound S-224
$Z_1$=$Z_2$=Se Compound Se-224

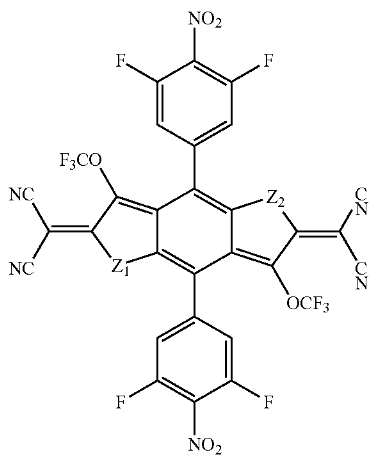

$Z_1$=$Z_1$=O Compound O-225
$Z_1$=$Z_2$=S Compound S-225
$Z_1$=$Z_2$=Se Compound Se-225

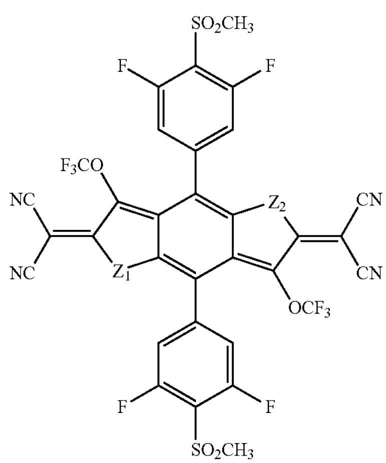

$Z_1$=$Z_1$=O Compound O-226
$Z_1$=$Z_2$=S Compound S-226
$Z_1$=$Z_2$=Se Compound Se-226

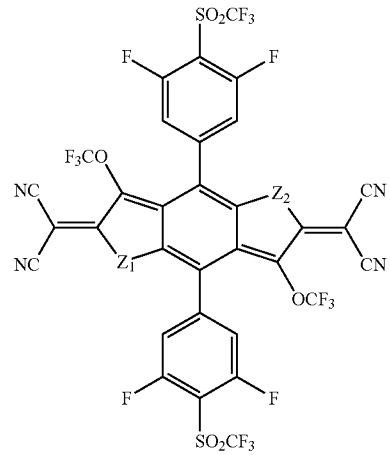

$Z_1$=$Z_1$=O Compound O-227
$Z_1$=$Z_2$=S Compound S-227
$Z_1$=$Z_2$=Se Compound Se-227

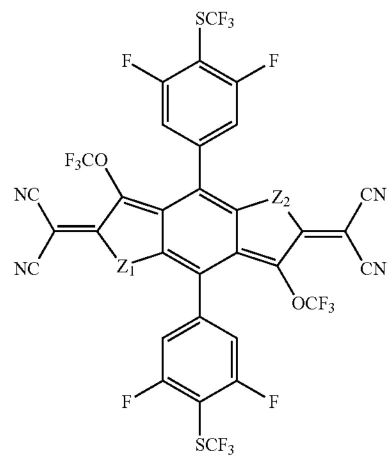

$Z_1$=$Z_1$=O Compound O-228
$Z_1$=$Z_2$=S Compound S-228
$Z_1$=$Z_2$=Se Compound Se-228

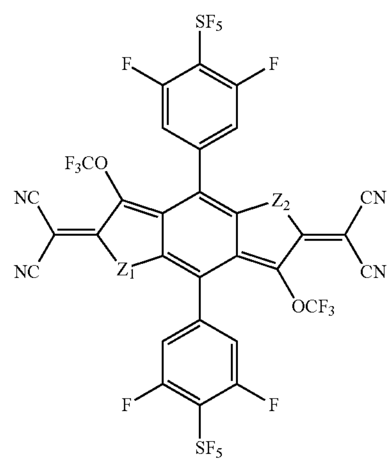

$Z_1$=$Z_1$=O Compound O-229
$Z_1$=$Z_2$=S Compound S-229
$Z_1$=$Z_2$=Se Compound Se-229

-continued

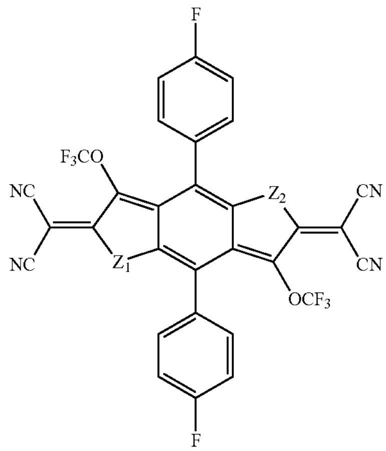

$Z_1$=$Z_1$=O Compound O-230
$Z_1$=$Z_2$=S Compound S-230
$Z_1$=$Z_2$=Se Compound Se-230

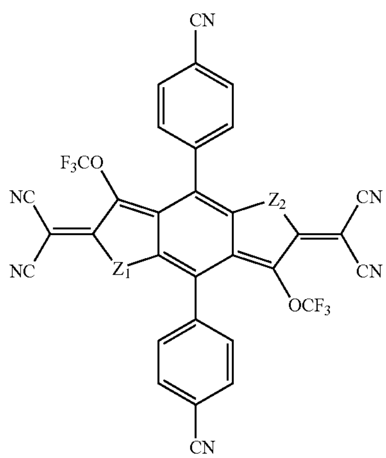

$Z_1$=$Z_1$=O Compound O-231
$Z_1$=$Z_2$=S Compound S-231
$Z_1$=$Z_2$=Se Compound Se-231

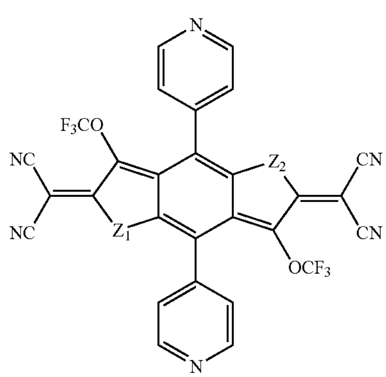

$Z_1$=$Z_1$=O Compound O-232
$Z_1$=$Z_2$=S Compound S-232
$Z_1$=$Z_2$=Se Compound Se-232

-continued

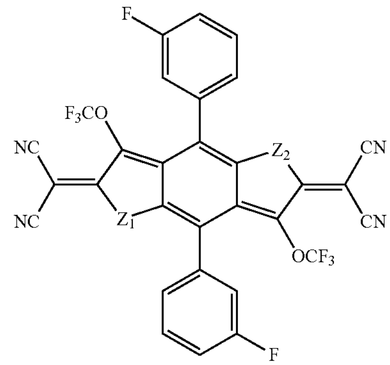

$Z_1$=$Z_1$=O Compound O-233
$Z_1$=$Z_2$=S Compound S-233
$Z_1$=$Z_2$=Se Compound Se-233

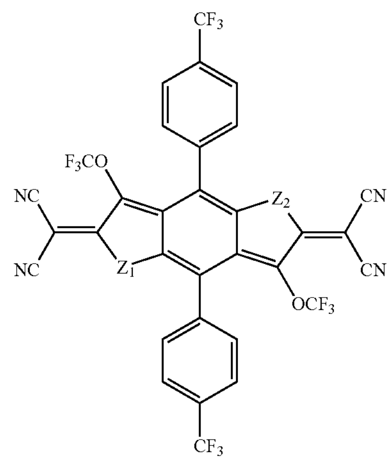

$Z_1$=$Z_1$=O Compound O-234
$Z_1$=$Z_2$=S Compound S-234
$Z_1$=$Z_2$=Se Compound Se-234

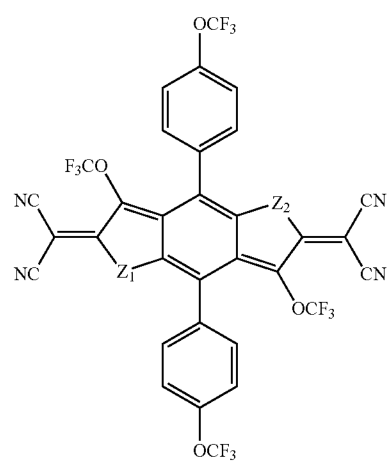

$Z_1$=$Z_1$=O Compound O-235
$Z_1$=$Z_2$=S Compound S-235
$Z_1$=$Z_2$=Se Compound Se-235

-continued

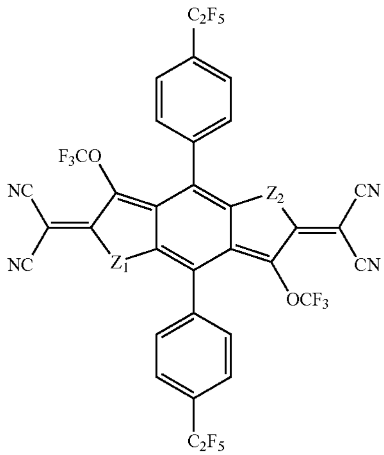

$Z_1$=$Z_1$=O Compound O-236
$Z_1$=$Z_2$=S Compound S-236
$Z_1$=$Z_2$=Se Compound Se-236

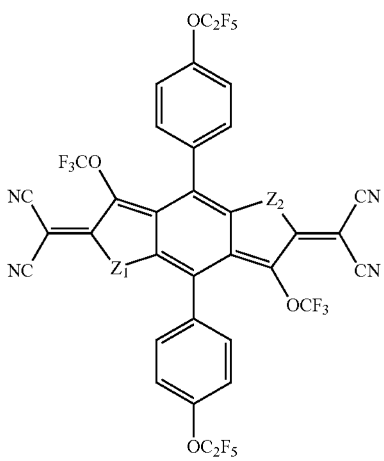

$Z_1$=$Z_1$=O Compound O-237
$Z_1$=$Z_2$=S Compound S-237
$Z_1$=$Z_2$=Se Compound Se-237

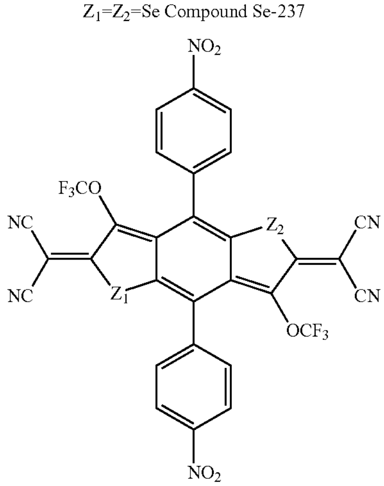

$Z_1$=$Z_1$=O Compound O-238
$Z_1$=$Z_2$=S Compound S-238
$Z_1$=$Z_2$=Se Compound Se-238

-continued

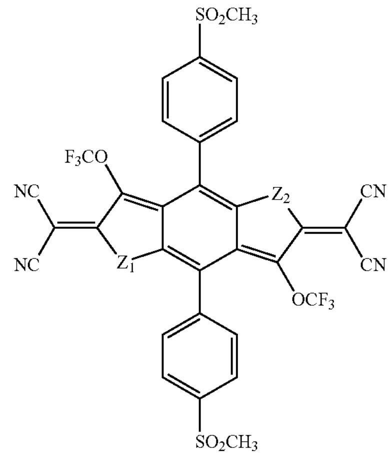

$Z_1$=$Z_1$=O Compound O-239
$Z_1$=$Z_2$=S Compound S-239
$Z_1$=$Z_2$=Se Compound Se-239

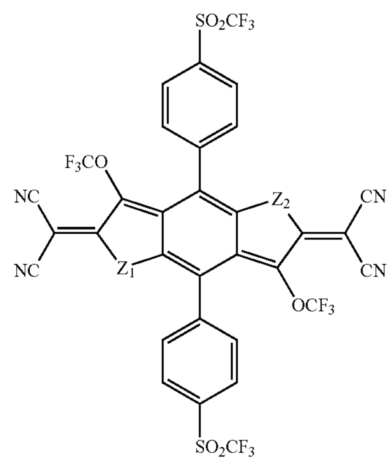

$Z_1$=$Z_1$=O Compound O-240
$Z_1$=$Z_2$=S Compound S-240
$Z_1$=$Z_2$=Se Compound Se-240

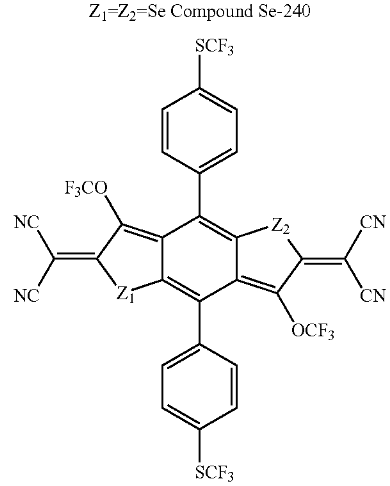

$Z_1$=$Z_1$=O Compound O-241
$Z_1$=$Z_2$=S Compound S-241
$Z_1$=$Z_2$=Se Compound Se-241

-continued

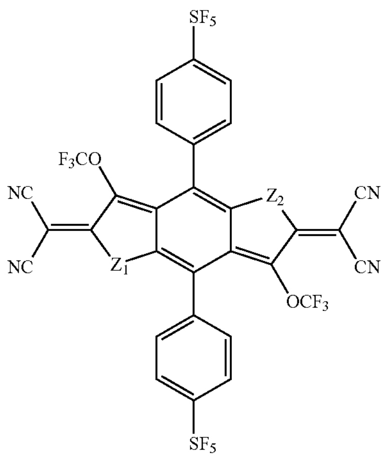

$Z_1$=$Z_1$=O Compound O-242
$Z_1$=$Z_2$=S Compound S-242
$Z_1$=$Z_2$=Se Compound Se-242

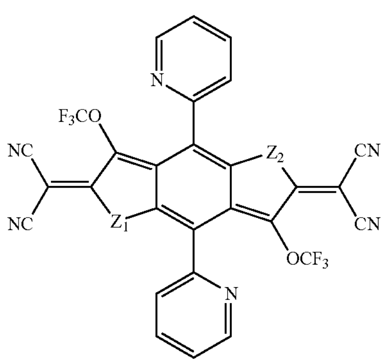

$Z_1$=$Z_1$=O Compound O-243
$Z_1$=$Z_2$=S Compound S-243
$Z_1$=$Z_2$=Se Compound Se-243

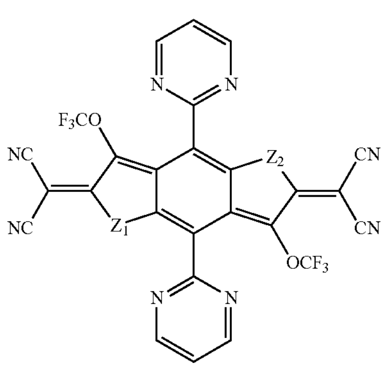

$Z_1$=$Z_1$=O Compound O-244
$Z_1$=$Z_2$=S Compound S-244
$Z_1$=$Z_2$=Se Compound Se-244

-continued

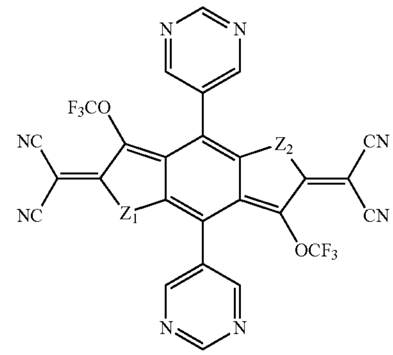

$Z_1$=$Z_1$=O Compound O-245
$Z_1$=$Z_2$=S Compound S-245
$Z_1$=$Z_2$=Se Compound Se-245

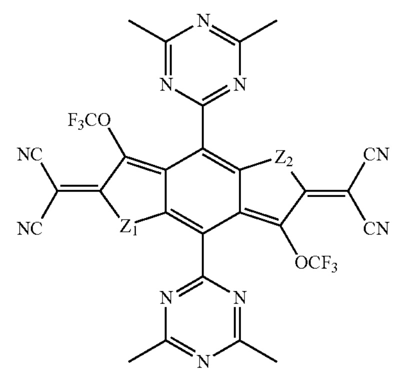

$Z_1$=$Z_1$=O Compound O-246
$Z_1$=$Z_2$=S Compound S-246
$Z_1$=$Z_2$=Se Compound Se-246

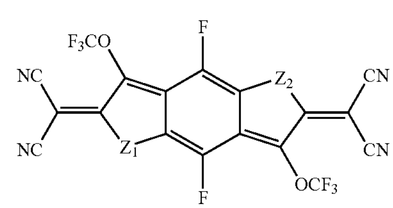

$Z_1$=$Z_1$=O Compound O-247
$Z_1$=$Z_2$=S Compound S-247
$Z_1$=$Z_2$=Se Compound Se-247

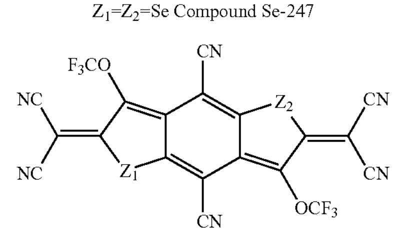

$Z_1$=$Z_1$=O Compound O-248
$Z_1$=$Z_2$=S Compound S-248
$Z_1$=$Z_2$=Se Compound Se-248

-continued

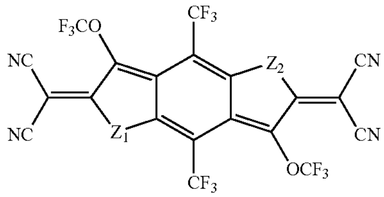

$Z_1$=$Z_1$=O Compound O-249
$Z_1$=$Z_2$=S Compound S-249
$Z_1$=$Z_2$=Se Compound Se-249

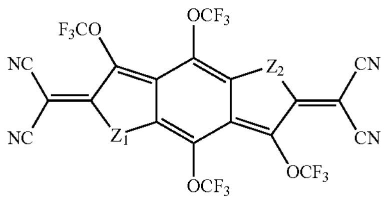

$Z_1$=$Z_1$=O Compound O-250
$Z_1$=$Z_2$=S Compound S-250
$Z_1$=$Z_2$=Se Compound Se-250

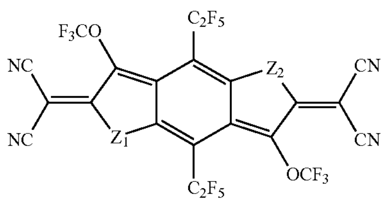

$Z_1$=$Z_1$=O Compound O-251
$Z_1$=$Z_2$=S Compound S-251
$Z_1$=$Z_2$=Se Compound Se-251

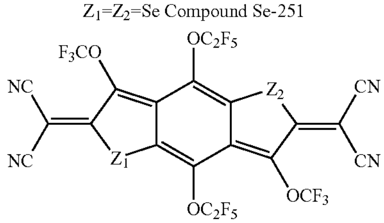

$Z_1$=$Z_1$=O Compound O-252
$Z_1$=$Z_2$=S Compound S-252
$Z_1$=$Z_2$=Se Compound Se-252

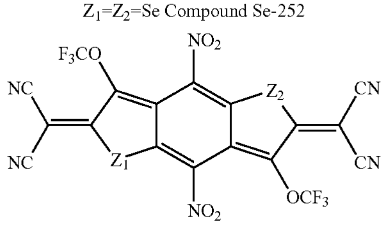

$Z_1$=$Z_1$=O Compound O-253
$Z_1$=$Z_2$=S Compound S-253
$Z_1$=$Z_2$=Se Compound Se-253

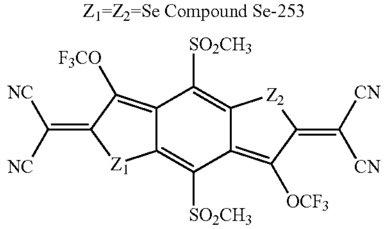

$Z_1$=$Z_1$=O Compound O-254
$Z_1$=$Z_2$=S Compound S-254
$Z_1$=$Z_2$=Se Compound Se-254

-continued

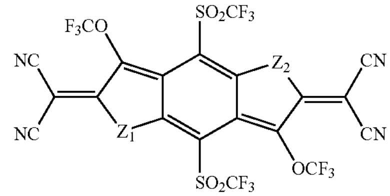

$Z_1$=$Z_1$=O Compound O-255
$Z_1$=$Z_2$=S Compound S-255
$Z_1$=$Z_2$=Se Compound Se-255

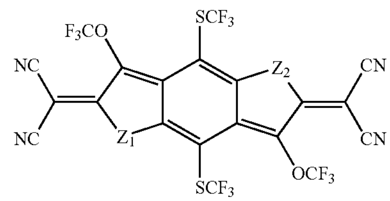

$Z_1$=$Z_1$=O Compound O-256
$Z_1$=$Z_2$=S Compound S-256
$Z_1$=$Z_2$=Se Compound Se-256

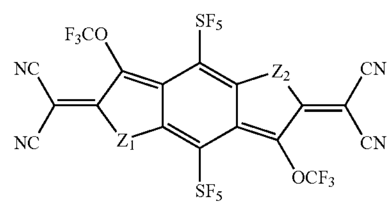

$Z_1$=$Z_1$=O Compound O-257
$Z_1$=$Z_2$=S Compound S-257
$Z_1$=$Z_2$=Se Compound Se-257

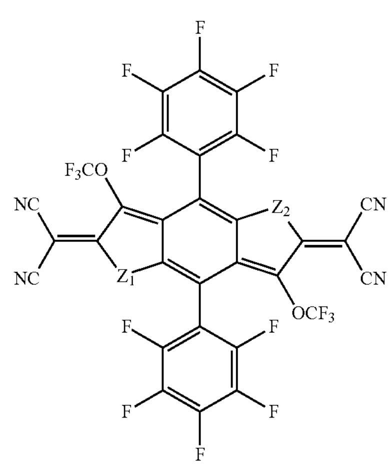

$Z_1$=$Z_1$=O Compound O-258
$Z_1$=$Z_2$=S Compound S-258
$Z_1$=$Z_2$=Se Compound Se-258

-continued

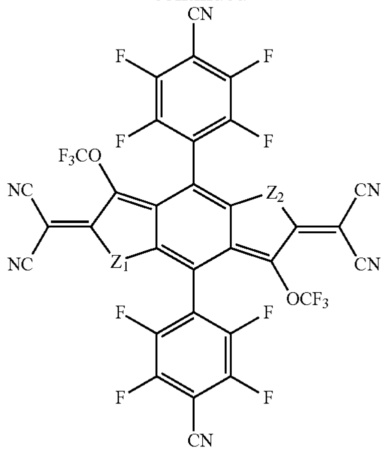

$Z_1$=$Z_1$=O Compound O-259
$Z_1$=$Z_2$=S Compound S-259
$Z_1$=$Z_2$=Se Compound Se-259

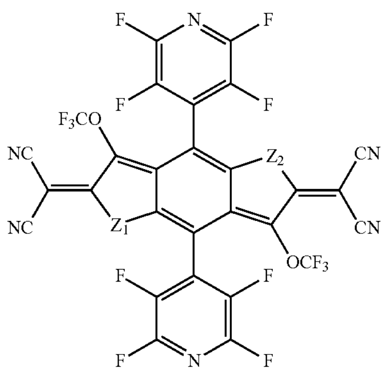

$Z_1$=$Z_1$=O Compound O-260
$Z_1$=$Z_2$=S Compound S-260
$Z_1$=$Z_2$=Se Compound Se-260

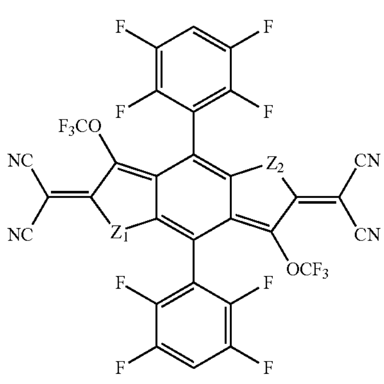

$Z_1$=$Z_1$=O Compound O-261
$Z_1$=$Z_2$=S Compound S-261
$Z_1$=$Z_2$=Se Compound Se-261

-continued

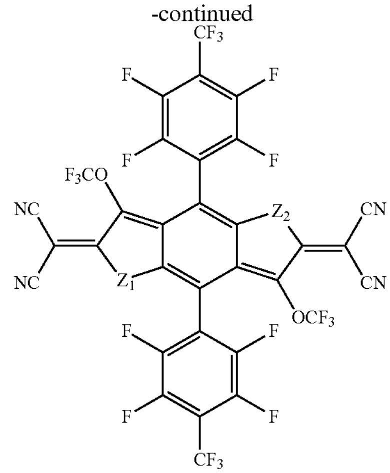

$Z_1$=$Z_1$=O Compound O-262
$Z_1$=$Z_2$=S Compound S-262
$Z_1$=$Z_2$=Se Compound Se-262

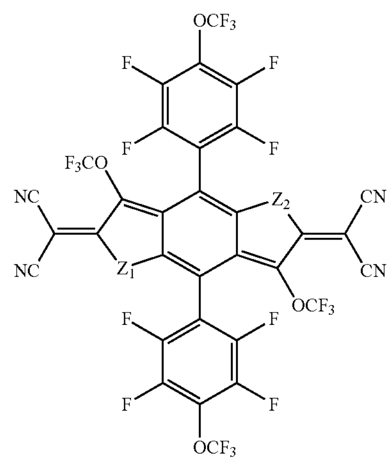

$Z_1$=$Z_1$=O Compound O-263
$Z_1$=$Z_2$=S Compound S-263
$Z_1$=$Z_2$=Se Compound Se-263

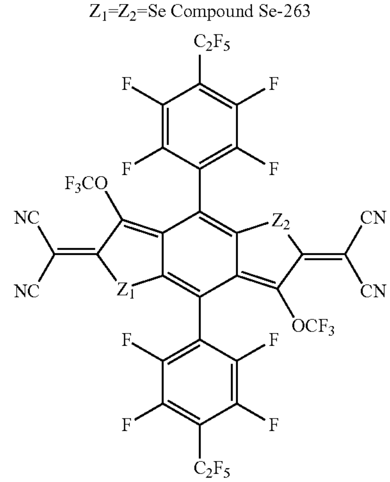

$Z_1$=$Z_1$=O Compound O-264
$Z_1$=$Z_2$=S Compound S-264
$Z_1$=$Z_2$=Se Compound Se-264

-continued

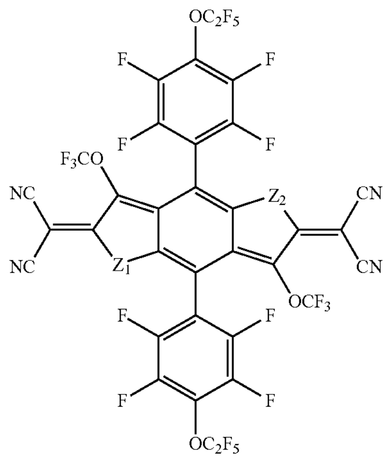

$Z_1$=$Z_1$=O Compound O-265
$Z_1$=$Z_2$=S Compound S-265
$Z_1$=$Z_2$=Se Compound Se-265

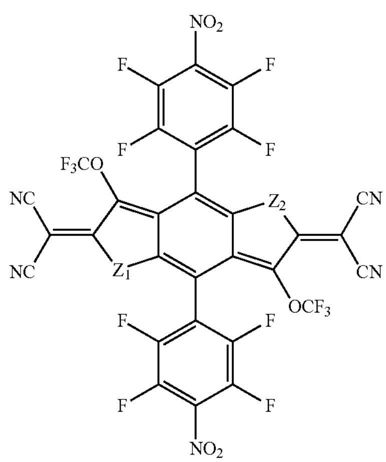

$Z_1$=$Z_1$=O Compound O-266
$Z_1$=$Z_2$=S Compound S-266
$Z_1$=$Z_2$=Se Compound Se-266

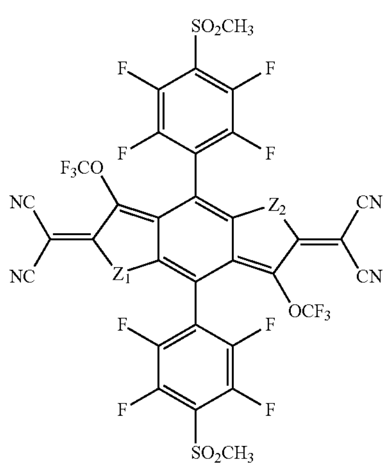

$Z_1$=$Z_1$=O Compound O-267
$Z_1$=$Z_2$=S Compound S-267
$Z_1$=$Z_2$=Se Compound Se-267

-continued

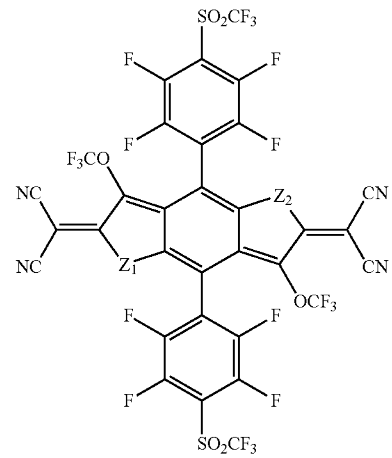

$Z_1$=$Z_1$=O Compound O-268
$Z_1$=$Z_2$=S Compound S-268
$Z_1$=$Z_2$=Se Compound Se-268

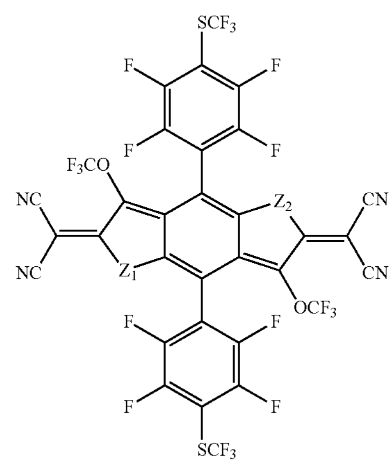

$Z_1$=$Z_1$=O Compound O-269
$Z_1$=$Z_2$=S Compound S-269
$Z_1$=$Z_2$=Se Compound Se-269

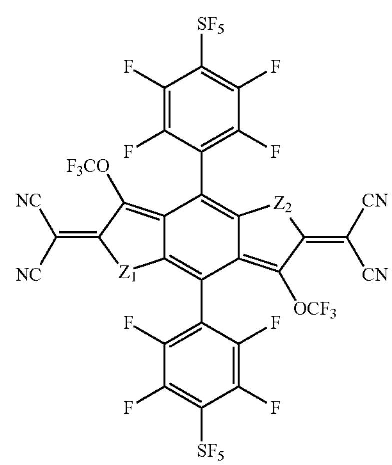

$Z_1$=$Z_1$=O Compound O-270
$Z_1$=$Z_2$=S Compound S-270
$Z_1$=$Z_2$=Se Compound Se-270

-continued

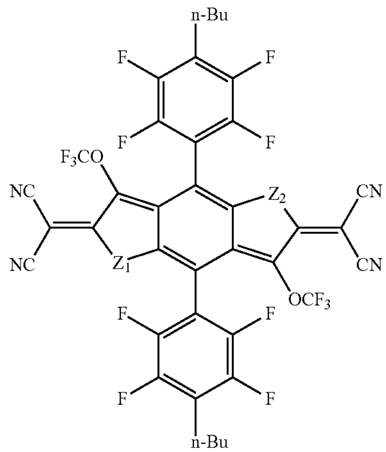

$Z_1$=$Z_1$=O Compound O-271
$Z_1$=$Z_2$=S Compound S-271
$Z_1$=$Z_2$=Se Compound Se-271

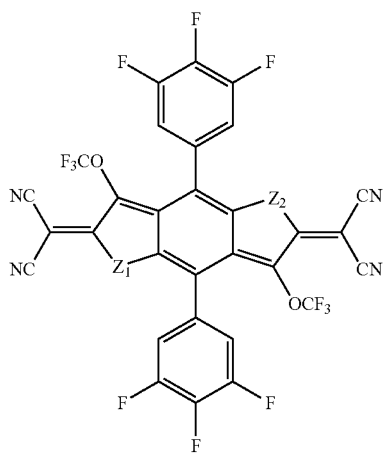

$Z_1$=$Z_1$=O Compound O-272
$Z_1$=$Z_2$=S Compound S-272
$Z_1$=$Z_2$=Se Compound Se-272

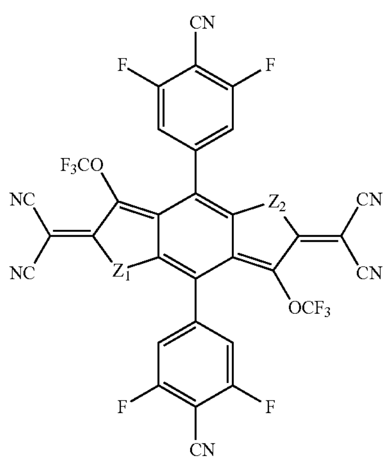

$Z_1$=$Z_1$=O Compound O-273
$Z_1$=$Z_2$=S Compound S-273
$Z_1$=$Z_2$=Se Compound Se-273

-continued

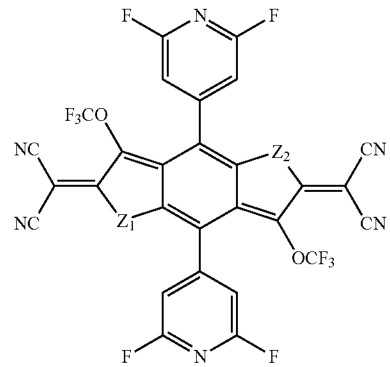

$Z_1$=$Z_1$=O Compound O-274
$Z_1$=$Z_2$=S Compound S-274
$Z_1$=$Z_2$=Se Compound Se-274

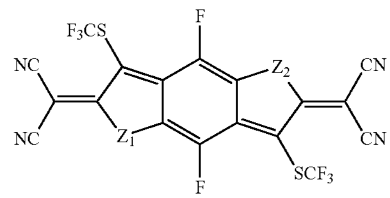

$Z_1$=$Z_1$=O Compound O-275
$Z_1$=$Z_2$=S Compound S-275
$Z_1$=$Z_2$=Se Compound Se-275

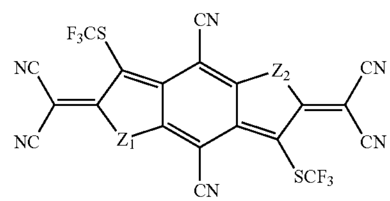

$Z_1$=$Z_1$=O Compound O-276
$Z_1$=$Z_2$=S Compound S-276
$Z_1$=$Z_2$=Se Compound Se-276

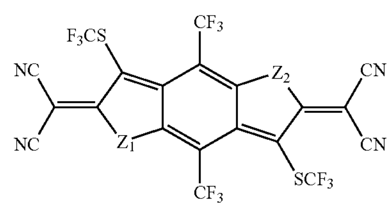

$Z_1$=$Z_1$=O Compound O-277
$Z_1$=$Z_2$=S Compound S-277
$Z_1$=$Z_2$=Se Compound Se-277

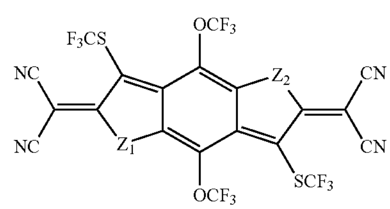

$Z_1$=$Z_1$=O Compound O-278
$Z_1$=$Z_2$=S Compound S-278
$Z_1$=$Z_2$=Se Compound Se-278

-continued

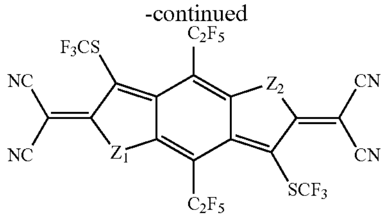

$Z_1$=$Z_1$=O Compound O-279
$Z_1$=$Z_2$=S Compound S-279
$Z_1$=$Z_2$=Se Compound Se-279

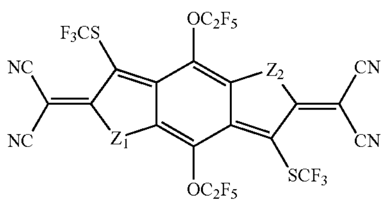

$Z_1$=$Z_1$=O Compound O-280
$Z_1$=$Z_2$=S Compound S-280
$Z_1$=$Z_2$=Se Compound Se-280

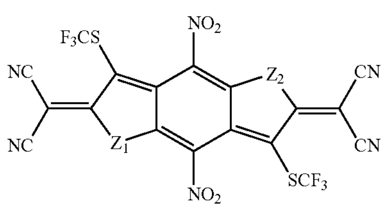

$Z_1$=$Z_1$=O Compound O-281
$Z_1$=$Z_2$=S Compound S-281
$Z_1$=$Z_2$=Se Compound Se-281

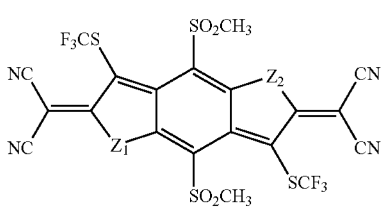

$Z_1$=$Z_1$=O Compound O-282
$Z_1$=$Z_2$=S Compound S-282
$Z_1$=$Z_2$=Se Compound Se-282

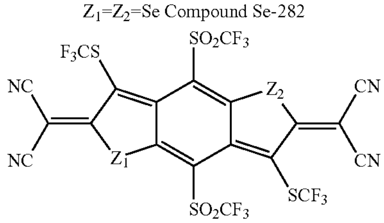

$Z_1$=$Z_1$=O Compound O-283
$Z_1$=$Z_2$=S Compound S-283
$Z_1$=$Z_2$=Se Compound Se-283

-continued

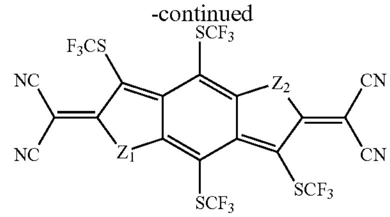

$Z_1$=$Z_1$=O Compound O-284
$Z_1$=$Z_2$=S Compound S-284
$Z_1$=$Z_2$=Se Compound Se-284

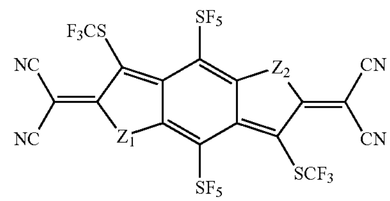

$Z_1$=$Z_1$=O Compound O-285
$Z_1$=$Z_2$=S Compound S-285
$Z_1$=$Z_2$=Se Compound Se-285

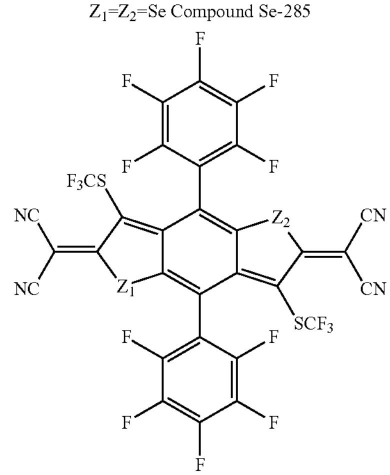

$Z_1$=$Z_1$=O Compound O-286
$Z_1$=$Z_2$=S Compound S-286
$Z_1$=$Z_2$=Se Compound Se-286

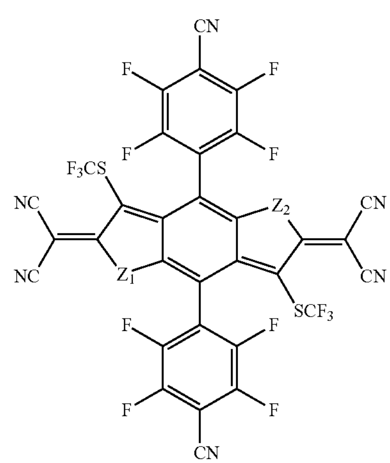

$Z_1$=$Z_1$=O Compound O-287
$Z_1$=$Z_2$=S Compound S-287
$Z_1$=$Z_2$=Se Compound Se-287

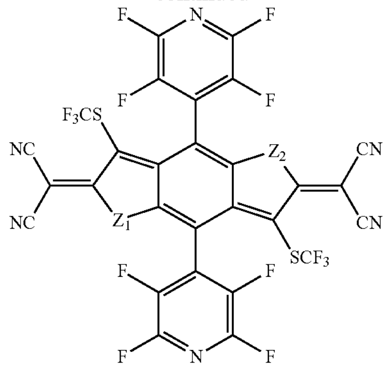

$Z_1$=$Z_1$=O Compound O-288
$Z_1$=$Z_2$=S Compound S-288
$Z_1$=$Z_2$=Se Compound Se-288

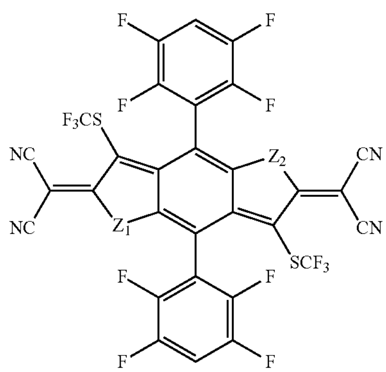

$Z_1$=$Z_1$=O Compound O-289
$Z_1$=$Z_2$=S Compound S-289
$Z_1$=$Z_2$=Se Compound Se-289

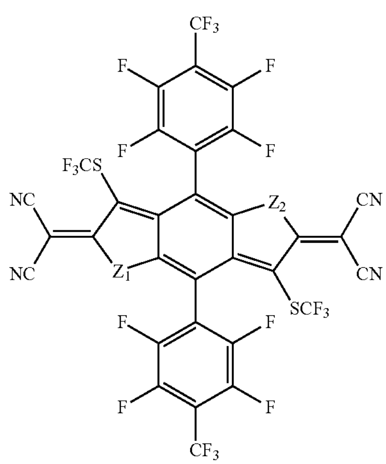

$Z_1$=$Z_1$=O Compound O-290
$Z_1$=$Z_2$=S Compound S-290
$Z_1$=$Z_2$=Se Compound Se-290

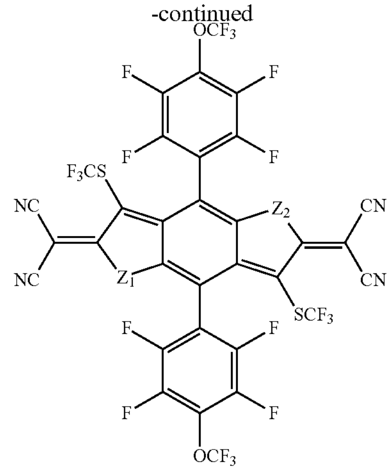

$Z_1$=$Z_1$=O Compound O-291
$Z_1$=$Z_2$=S Compound S-291
$Z_1$=$Z_2$=Se Compound Se-291

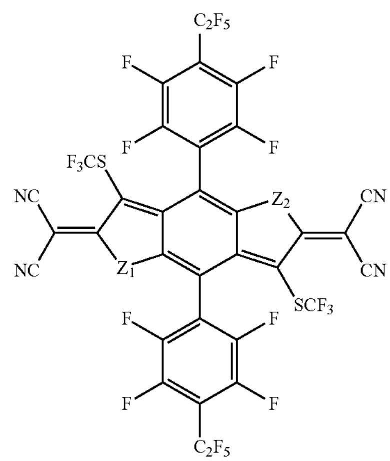

$Z_1$=$Z_1$=O Compound O-292
$Z_1$=$Z_2$=S Compound S-292
$Z_1$=$Z_2$=Se Compound Se-292

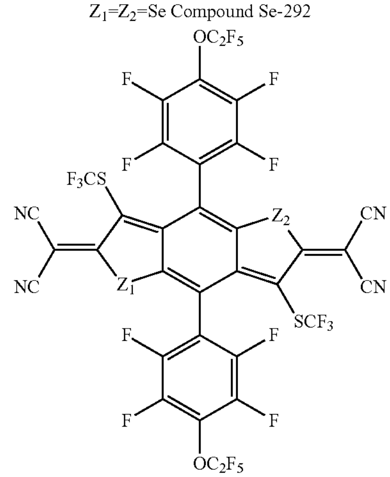

$Z_1$=$Z_1$=O Compound O-293
$Z_1$=$Z_2$=S Compound S-293
$Z_1$=$Z_2$=Se Compound Se-293

-continued

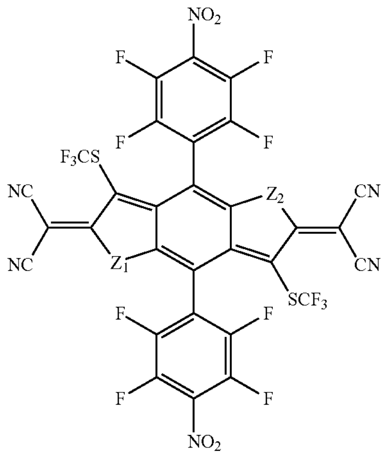

$Z_1$=$Z_1$=O Compound O-294
$Z_1$=$Z_2$=S Compound S-294
$Z_1$=$Z_2$=Se Compound Se-294

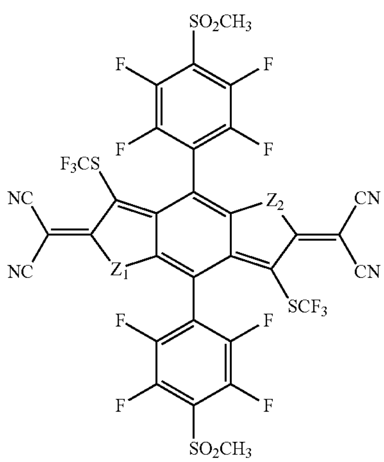

$Z_1$=$Z_1$=O Compound O-295
$Z_1$=$Z_2$=S Compound S-295
$Z_1$=$Z_2$=Se Compound Se-295

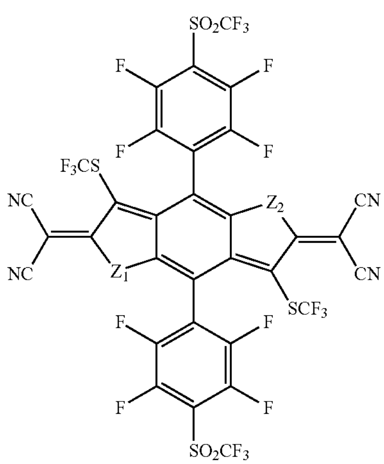

$Z_1$=$Z_1$=O Compound O-296
$Z_1$=$Z_2$=S Compound S-296
$Z_1$=$Z_2$=Se Compound Se-296

-continued

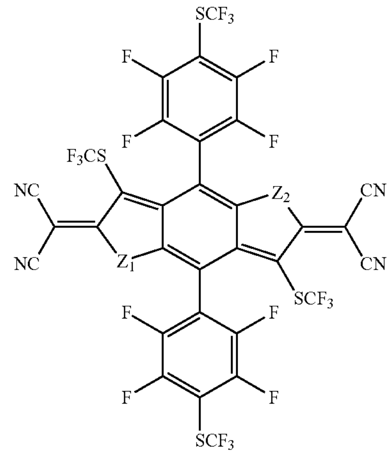

$Z_1$=$Z_1$=O Compound O-297
$Z_1$=$Z_2$=S Compound S-297
$Z_1$=$Z_2$=Se Compound Se-297

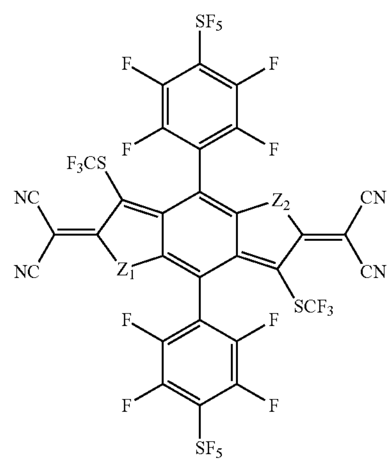

$Z_1$=$Z_1$=O Compound O-298
$Z_1$=$Z_2$=S Compound S-298
$Z_1$=$Z_2$=Se Compound Se-298

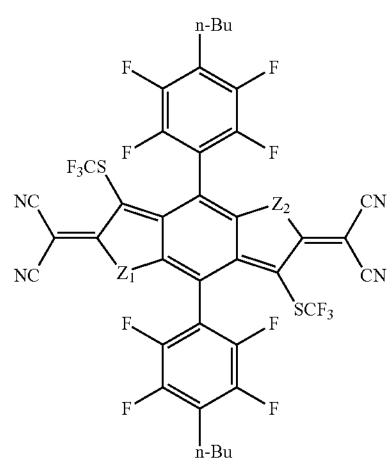

$Z_1$=$Z_1$=O Compound O-299
$Z_1$=$Z_2$=S Compound S-299
$Z_1$=$Z_2$=Se Compound Se-299

-continued

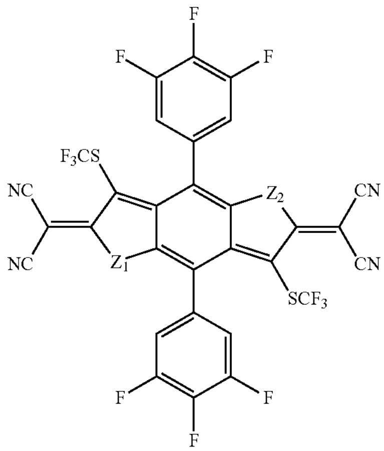

$Z_1$=$Z_1$=O Compound O-300
$Z_1$=$Z_2$=S Compound S-300
$Z_1$=$Z_2$=Se Compound Se-300

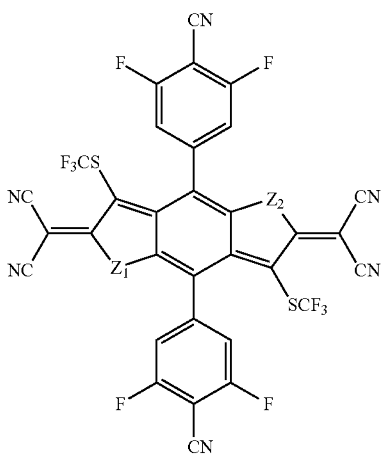

$Z_1$=$Z_1$=O Compound O-301
$Z_1$=$Z_2$=S Compound S-301
$Z_1$=$Z_2$=Se Compound Se-301

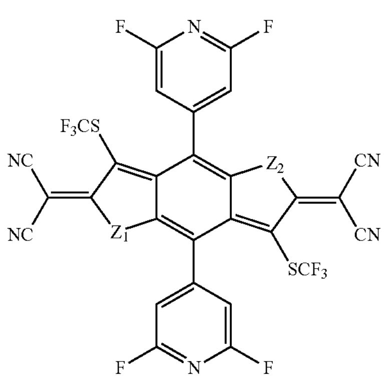

$Z_1$=$Z_1$=O Compound O-302
$Z_1$=$Z_2$=S Compound S-302
$Z_1$=$Z_2$=Se Compound Se-302

-continued

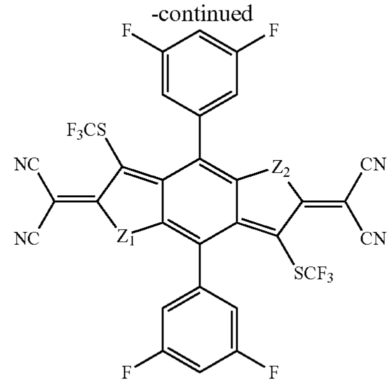

$Z_1$=$Z_1$=O Compound O-303
$Z_1$=$Z_2$=S Compound S-303
$Z_1$=$Z_2$=Se Compound Se-303

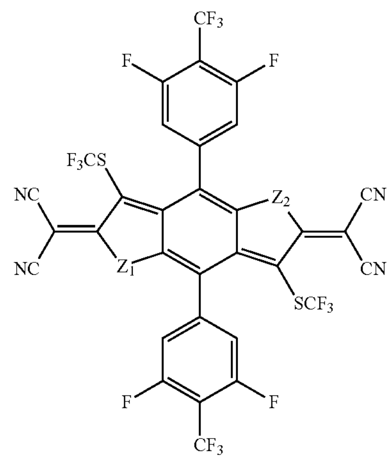

$Z_1$=$Z_1$=O Compound O-304
$Z_1$=$Z_2$=S Compound S-304
$Z_1$=$Z_2$=Se Compound Se-304

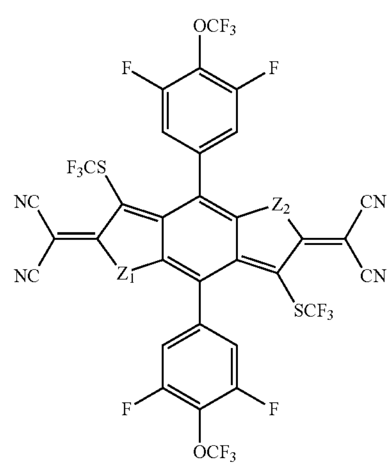

$Z_1$=$Z_1$=O Compound O-305
$Z_1$=$Z_2$=S Compound S-305
$Z_1$=$Z_2$=Se Compound Se-305

-continued

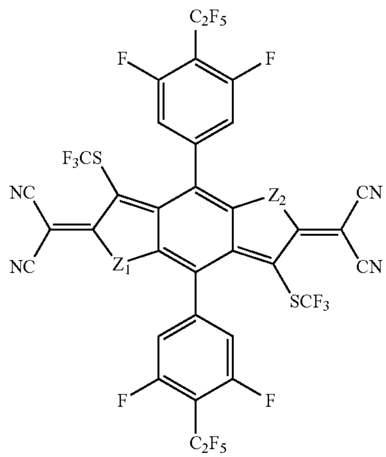

$Z_1$=$Z_1$=O Compound O-306
$Z_1$=$Z_2$=S Compound S-306
$Z_1$=$Z_2$=Se Compound Se-306

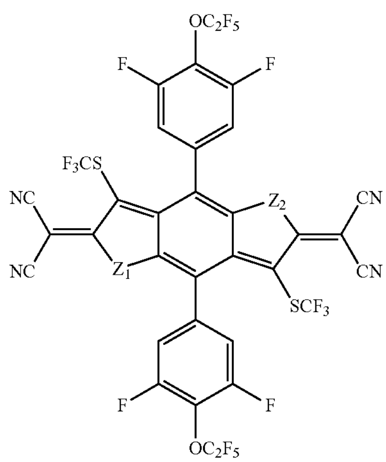

$Z_1$=$Z_1$=O Compound O-307
$Z_1$=$Z_2$=S Compound S-307
$Z_1$=$Z_2$=Se Compound Se-307

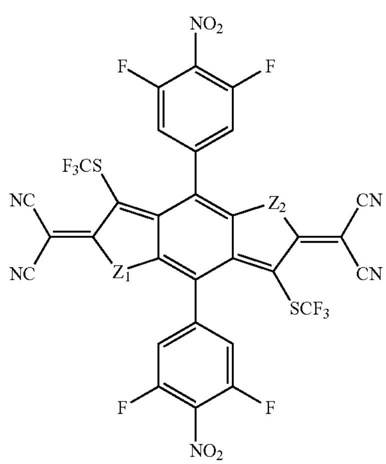

$Z_1$=$Z_1$=O Compound O-308
$Z_1$=$Z_2$=S Compound S-308
$Z_1$=$Z_2$=Se Compound Se-308

-continued

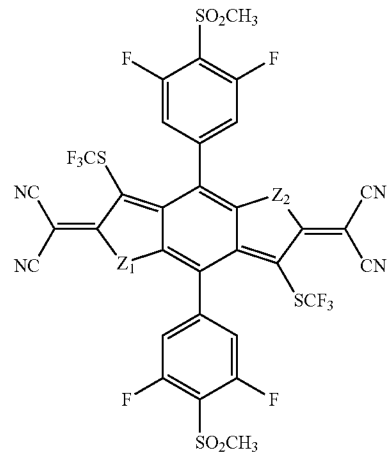

$Z_1$=$Z_1$=O Compound O-309
$Z_1$=$Z_2$=S Compound S-309
$Z_1$=$Z_2$=Se Compound Se-309

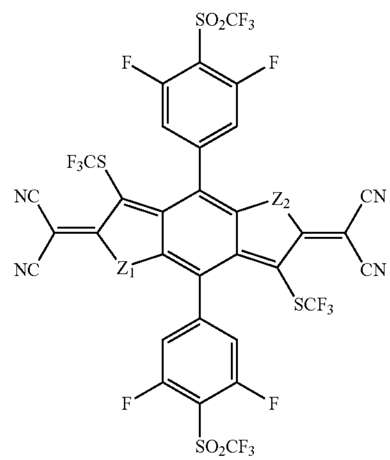

$Z_1$=$Z_1$=O Compound O-310
$Z_1$=$Z_2$=S Compound S-310
$Z_1$=$Z_2$=Se Compound Se-310

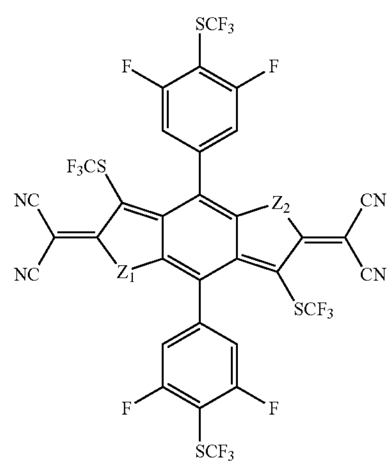

$Z_1$=$Z_1$=O Compound O-311
$Z_1$=$Z_2$=S Compound S-311
$Z_1$=$Z_2$=Se Compound Se-311

-continued

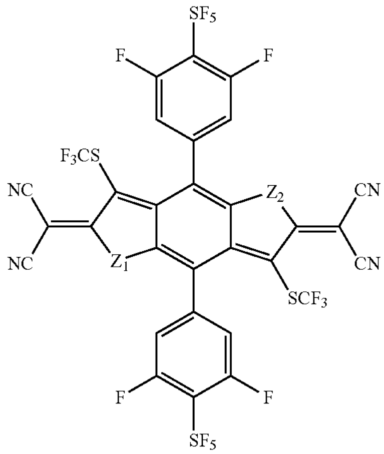

$Z_1$=$Z_1$=O Compound O-312
$Z_1$=$Z_2$=S Compound S-312
$Z_1$=$Z_2$=Se Compound Se-312

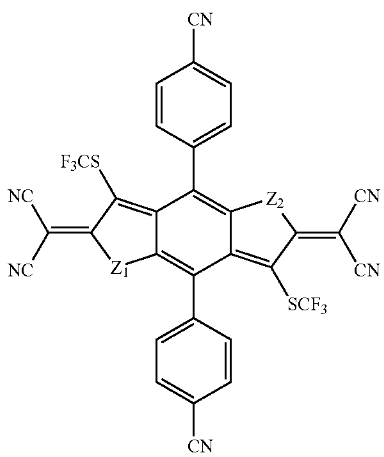

$Z_1$=$Z_1$=O Compound O-313
$Z_1$=$Z_2$=S Compound S-313
$Z_1$=$Z_2$=Se Compound Se-313

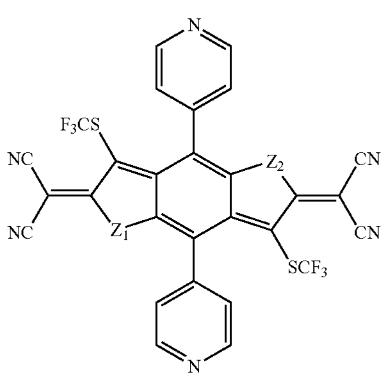

$Z_1$=$Z_1$=O Compound O-314
$Z_1$=$Z_2$=S Compound S-314
$Z_1$=$Z_2$=Se Compound Se-314

-continued

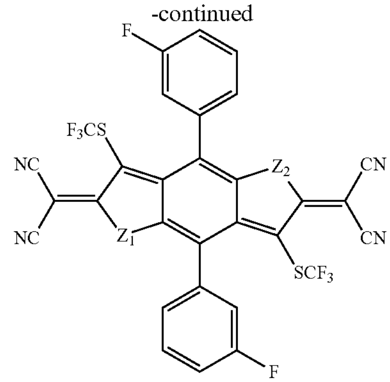

$Z_1$=$Z_1$=O Compound O-315
$Z_1$=$Z_2$=S Compound S-315
$Z_1$=$Z_2$=Se Compound Se-315

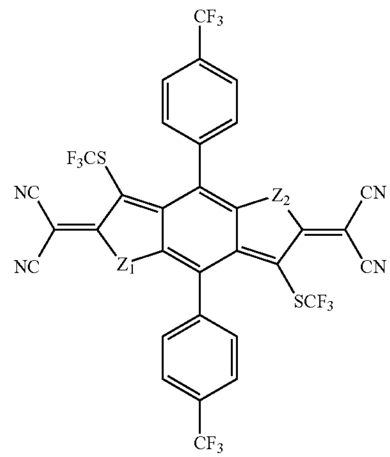

$Z_1$=$Z_1$=O Compound O-316
$Z_1$=$Z_2$=S Compound S-316
$Z_1$=$Z_2$=Se Compound Se-316

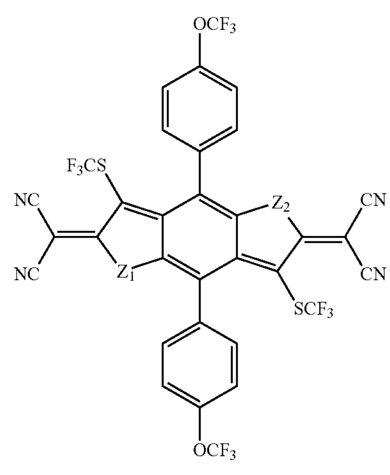

$Z_1$=$Z_1$=O Compound O-317
$Z_1$=$Z_2$=S Compound S-317
$Z_1$=$Z_2$=Se Compound Se-317

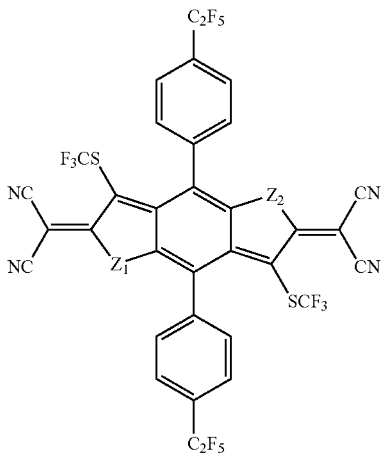

$Z_1$=$Z_1$=O Compound O-318
$Z_1$=$Z_2$=S Compound S-318
$Z_1$=$Z_2$=Se Compound Se-318

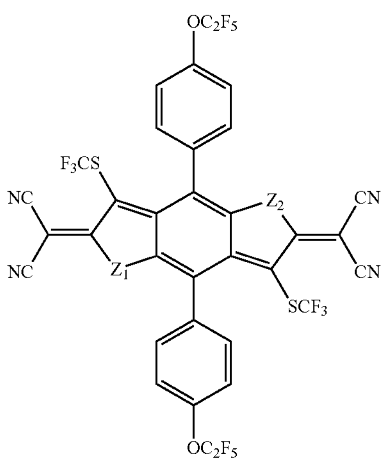

$Z_1$=$Z_1$=O Compound O-319
$Z_1$=$Z_2$=S Compound S-319
$Z_1$=$Z_2$=Se Compound Se-319

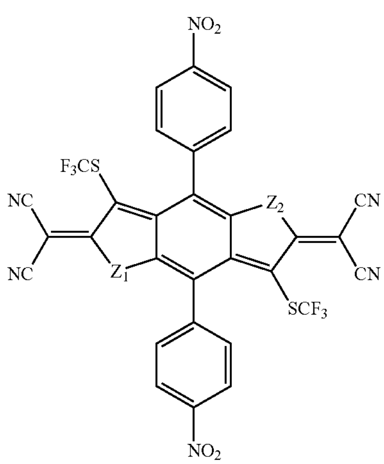

$Z_1$=$Z_1$=O Compound O-320
$Z_1$=$Z_2$=S Compound S-320
$Z_1$=$Z_2$=Se Compound Se-320

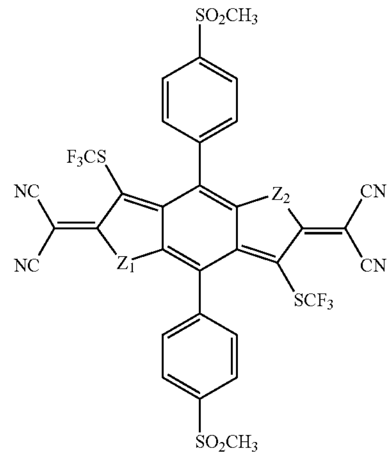

$Z_1$=$Z_1$=O Compound O-321
$Z_1$=$Z_2$=S Compound S-321
$Z_1$=$Z_2$=Se Compound Se-321

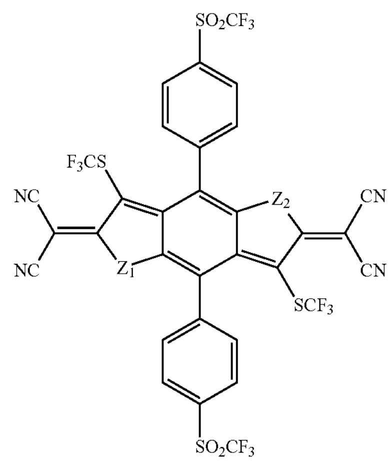

$Z_1$=$Z_1$=O Compound O-322
$Z_1$=$Z_2$=S Compound S-322
$Z_1$=$Z_2$=Se Compound Se-322

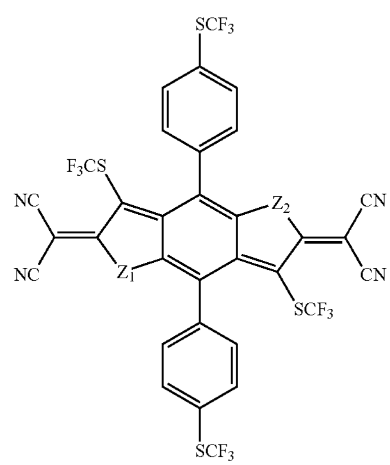

$Z_1$=$Z_1$=O Compound O-323
$Z_1$=$Z_2$=S Compound S-323
$Z_1$=$Z_2$=Se Compound Se-323

-continued

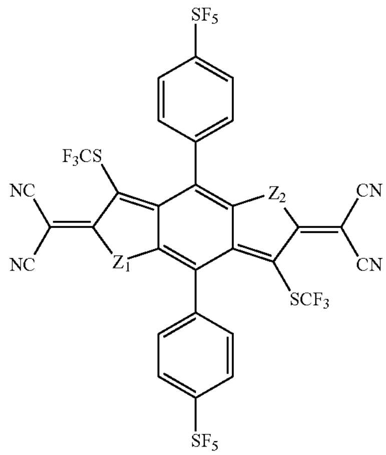

$Z_1$=$Z_1$=O Compound O-324
$Z_1$=$Z_2$=S Compound S-324
$Z_1$=$Z_2$=Se Compound Se-324

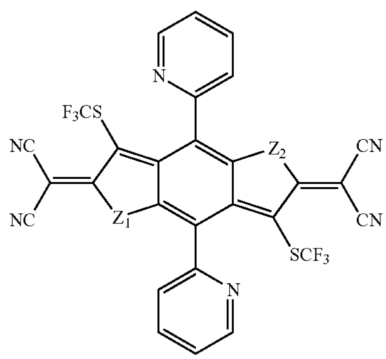

$Z_1$=$Z_1$=O Compound O-325
$Z_1$=$Z_2$=S Compound S-325
$Z_1$=$Z_2$=Se Compound Se-325

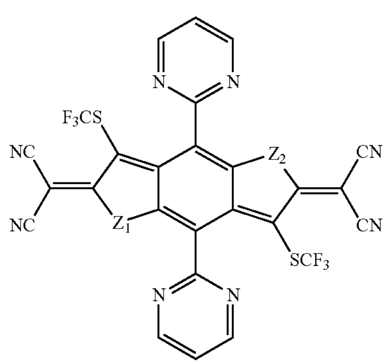

$Z_1$=$Z_1$=O Compound O-326
$Z_1$=$Z_2$=S Compound S-326
$Z_1$=$Z_2$=Se Compound Se-326

-continued

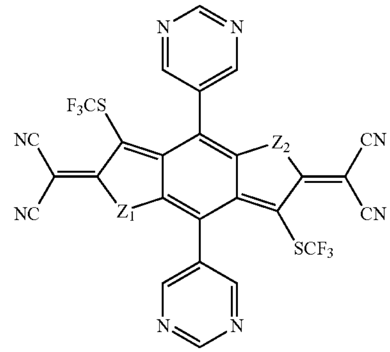

$Z_1$=$Z_1$=O Compound O-327
$Z_1$=$Z_2$=S Compound S-327
$Z_1$=$Z_2$=Se Compound Se-327

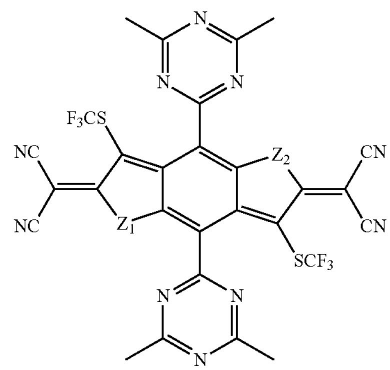

$Z_1$=$Z_1$=O Compound O-328
$Z_1$=$Z_2$=S Compound S-328
$Z_1$=$Z_2$=Se Compound Se-328

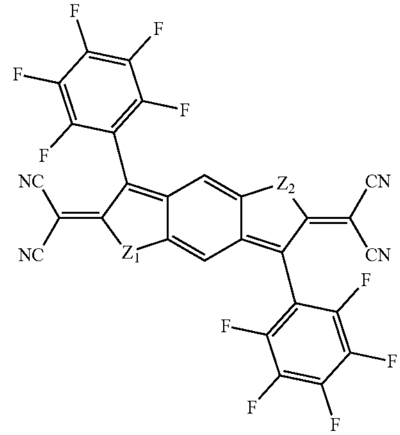

$Z_1$=$Z_1$=O Compound O-329
$Z_1$=$Z_2$=S Compound S-329
$Z_1$=$Z_2$=Se Compound Se-329

-continued

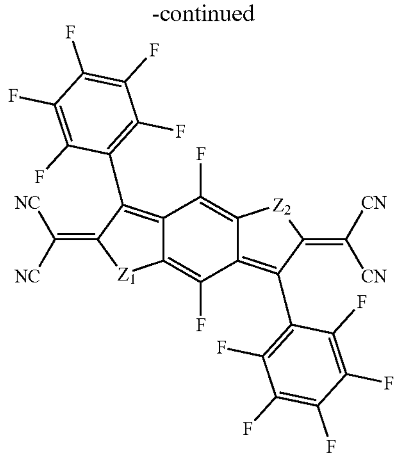

$Z_1$=$Z_1$=O Compound O-330
$Z_1$=$Z_2$=S Compound S-330
$Z_1$=$Z_2$=Se Compound Se-330

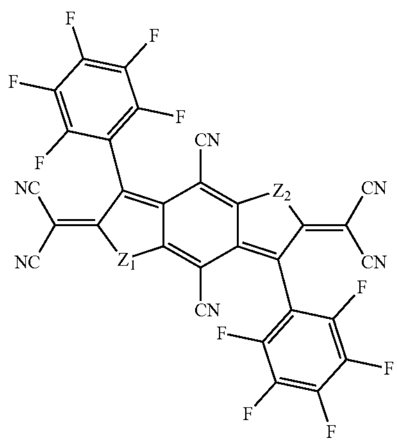

$Z_1$=$Z_1$=O Compound O-331
$Z_1$=$Z_2$=S Compound S-331
$Z_1$=$Z_2$=Se Compound Se-331

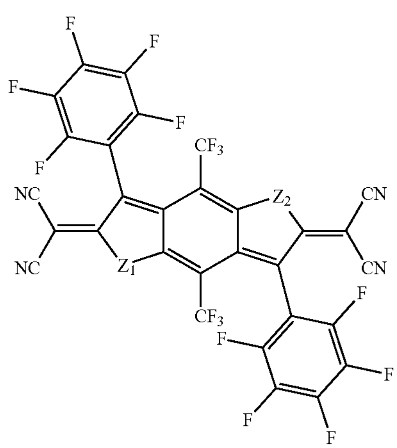

$Z_1$=$Z_1$=O Compound O-332
$Z_1$=$Z_2$=S Compound S-332
$Z_1$=$Z_2$=Se Compound Se-332

-continued

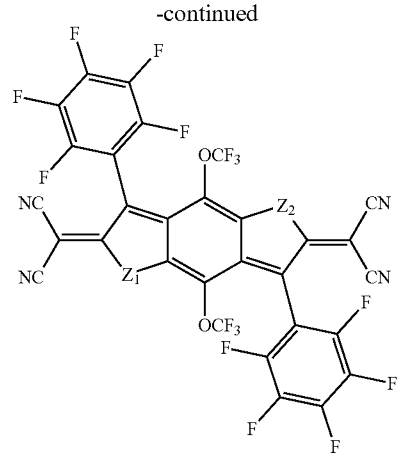

$Z_1$=$Z_1$=O Compound O-333
$Z_1$=$Z_2$=S Compound S-333
$Z_1$=$Z_2$=Se Compound Se-333

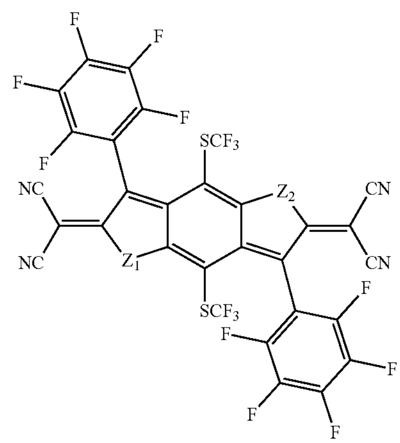

$Z_1$=$Z_1$=O Compound O-334
$Z_1$=$Z_2$=S Compound S-334
$Z_1$=$Z_2$=Se Compound Se-334

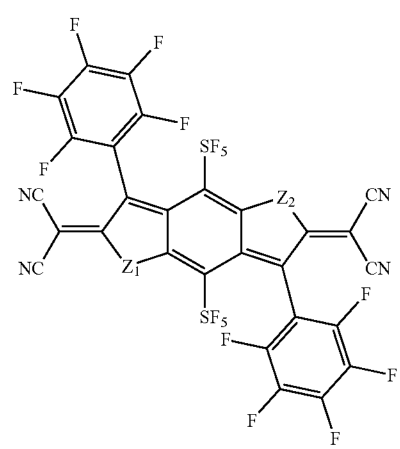

$Z_1$=$Z_1$=O Compound O-335
$Z_1$=$Z_2$=S Compound S-335
$Z_1$=$Z_2$=Se Compound Se-335

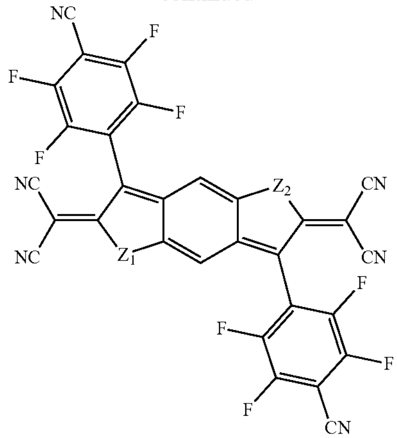

$Z_1$=$Z_1$=O Compound O-336
$Z_1$=$Z_2$=S Compound S-336
$Z_1$=$Z_2$=Se Compound Se-336

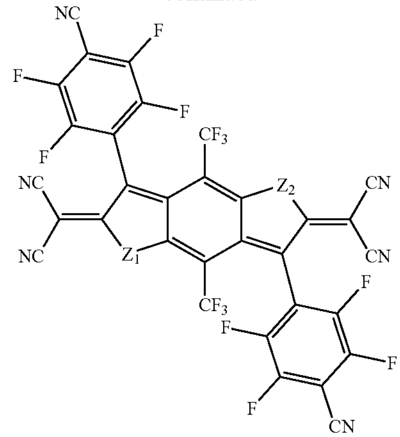

$Z_1$=$Z_1$=O Compound O-339
$Z_1$=$Z_2$=S Compound S-339
$Z_1$=$Z_2$=Se Compound Se-339

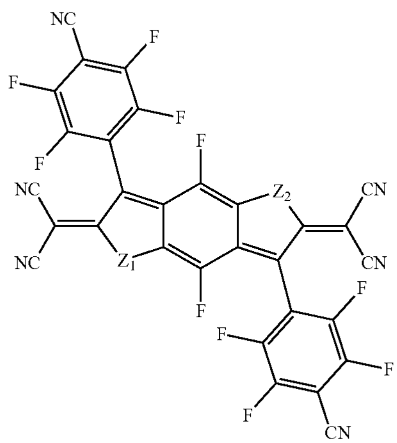

$Z_1$=$Z_1$=O Compound O-337
$Z_1$=$Z_2$=S Compound S-337
$Z_1$=$Z_2$=Se Compound Se-337

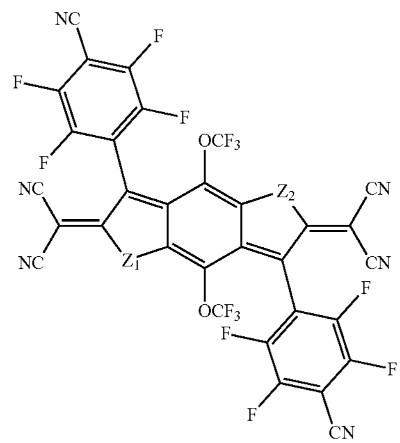

$Z_1$=$Z_1$=O Compound O-340
$Z_1$=$Z_2$=S Compound S-340
$Z_1$=$Z_2$=Se Compound Se-340

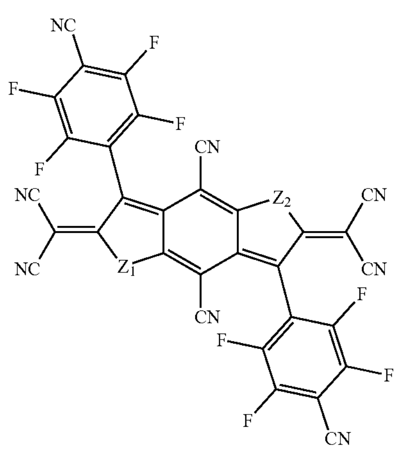

$Z_1$=$Z_1$=O Compound O-338
$Z_1$=$Z_2$=S Compound S-338
$Z_1$=$Z_2$=Se Compound Se-338

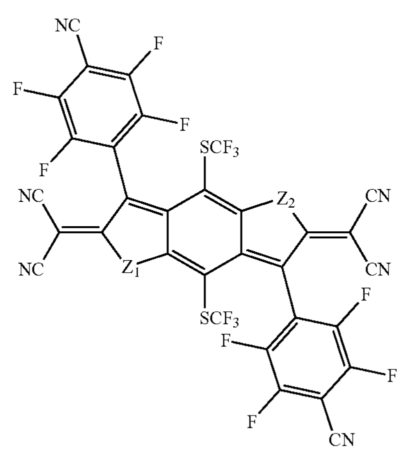

$Z_1$=$Z_1$=O Compound O-341
$Z_1$=$Z_2$=S Compound S-341
$Z_1$=$Z_2$=Se Compound Se-341

-continued

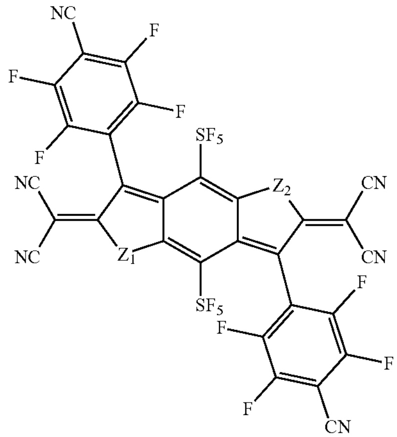

$Z_1=Z_1=O$ Compound O-342
$Z_1=Z_2=S$ Compound S-342
$Z_1=Z_2=Se$ Compound Se-342

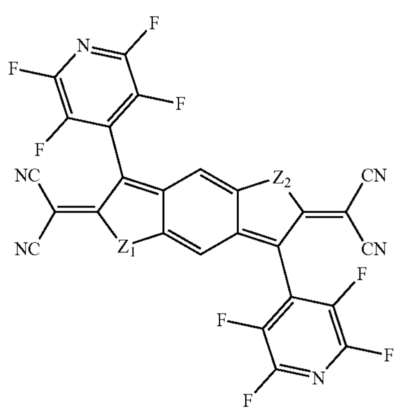

$Z_1=Z_1=O$ Compound O-343
$Z_1=Z_2=S$ Compound S-343
$Z_1=Z_2=Se$ Compound Se-343

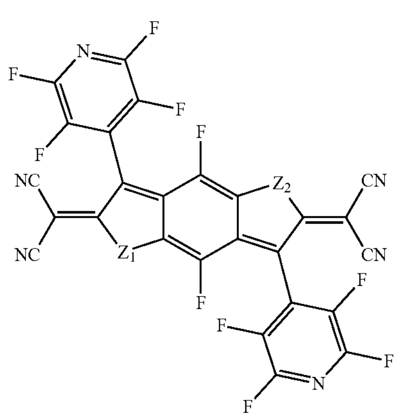

$Z_1=Z_1=O$ Compound O-344
$Z_1=Z_2=S$ Compound S-344
$Z_1=Z_2=Se$ Compound Se-344

-continued

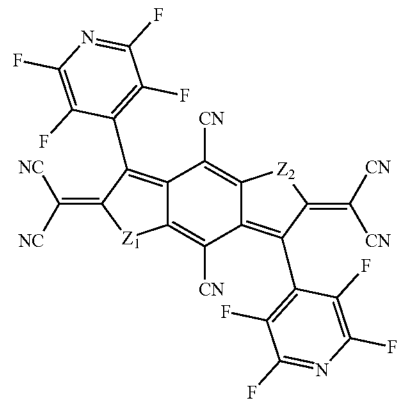

$Z_1=Z_1=O$ Compound O-345
$Z_1=Z_2=S$ Compound S-345
$Z_1=Z_2=Se$ Compound Se-345

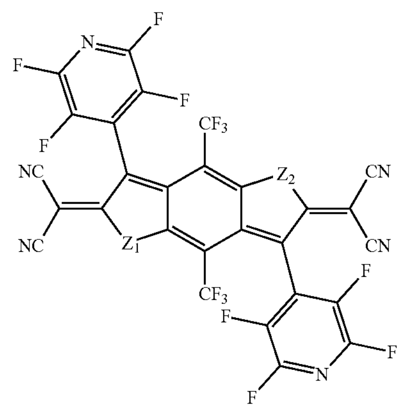

$Z_1=Z_1=O$ Compound O-346
$Z_1=Z_2=S$ Compound S-346
$Z_1=Z_2=Se$ Compound Se-346

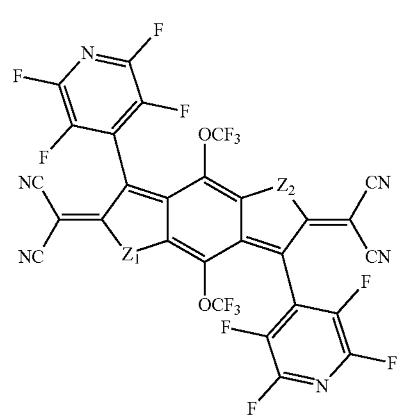

$Z_1=Z_1=O$ Compound O-347
$Z_1=Z_2=S$ Compound S-347
$Z_1=Z_2=Se$ Compound Se-347

-continued

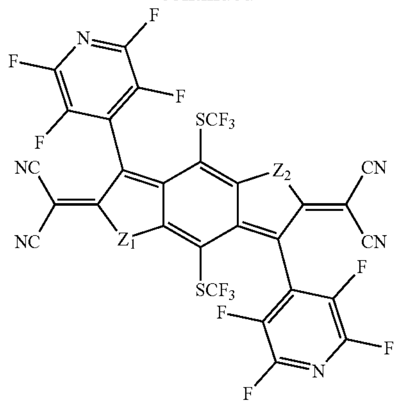

$Z_1$=$Z_1$=O Compound O-348
$Z_1$=$Z_2$=S Compound S-348
$Z_1$=$Z_2$=Se Compound Se-348

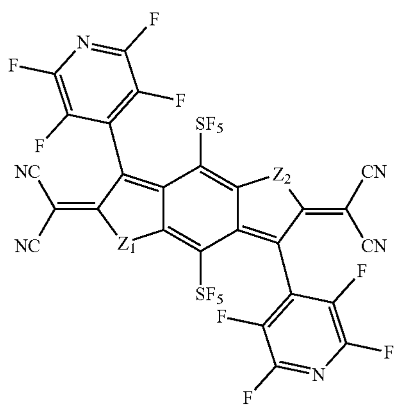

$Z_1$=$Z_1$=O Compound O-349
$Z_1$=$Z_2$=S Compound S-349
$Z_1$=$Z_2$=Se Compound Se-349

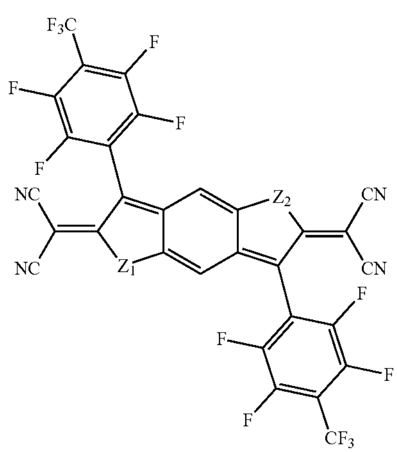

$Z_1$=$Z_1$=O Compound O-350
$Z_1$=$Z_2$=S Compound S-350
$Z_1$=$Z_2$=Se Compound Se-350

-continued

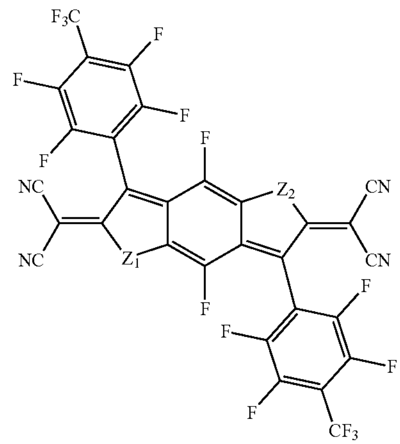

$Z_1$=$Z_1$=O Compound O-351
$Z_1$=$Z_2$=S Compound S-351
$Z_1$=$Z_2$=Se Compound Se-351

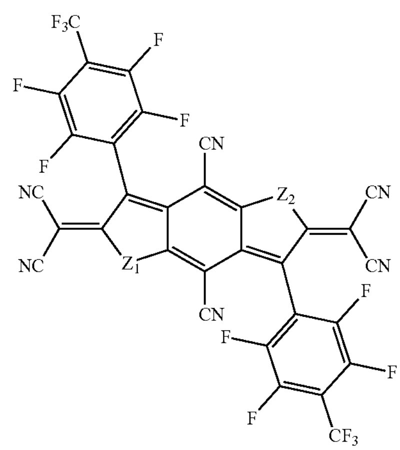

$Z_1$=$Z_1$=O Compound O-352
$Z_1$=$Z_2$=S Compound S-352
$Z_1$=$Z_2$=Se Compound Se-352

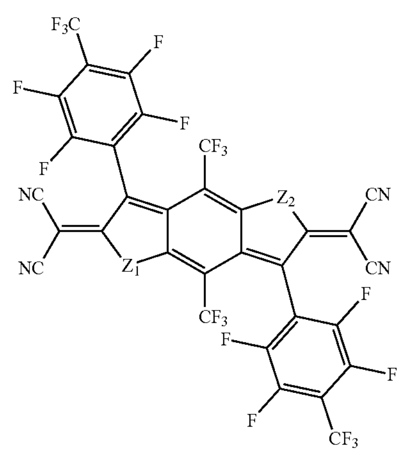

$Z_1$=$Z_1$=O Compound O-353
$Z_1$=$Z_2$=S Compound S-353
$Z_1$=$Z_2$=Se Compound Se-353

-continued

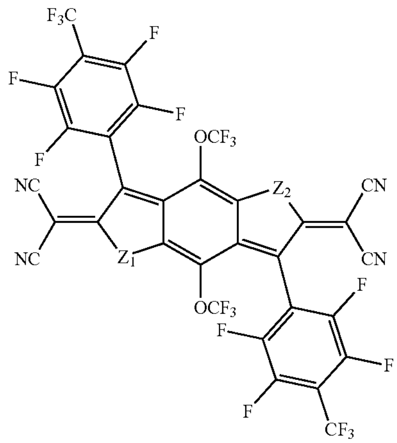

$Z_1$=$Z_1$=O Compound O-354
$Z_1$=$Z_2$=S Compound S-354
$Z_1$=$Z_2$=Se Compound Se-354

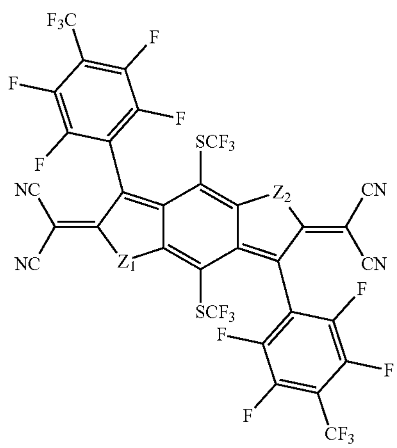

$Z_1$=$Z_1$=O Compound O-355
$Z_1$=$Z_2$=S Compound S-355
$Z_1$=$Z_2$=Se Compound Se-355

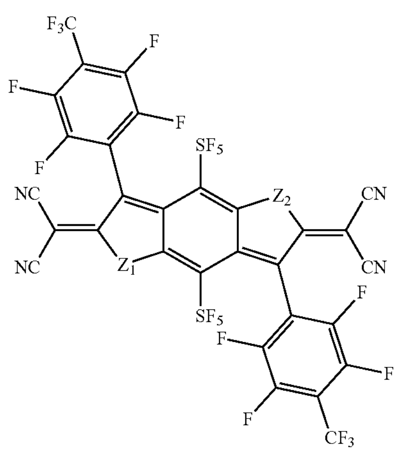

$Z_1$=$Z_1$=O Compound O-356
$Z_1$=$Z_2$=S Compound S-356
$Z_1$=$Z_2$=Se Compound Se-356

-continued

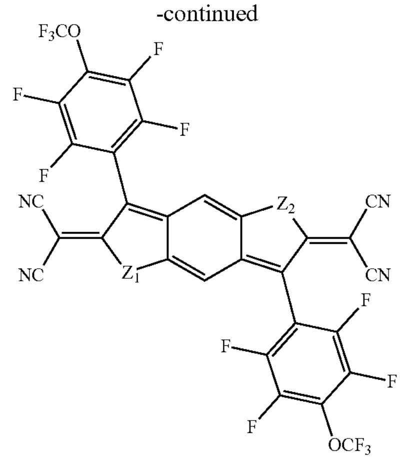

$Z_1$=$Z_1$=O Compound O-357
$Z_1$=$Z_2$=S Compound S-357
$Z_1$=$Z_2$=Se Compound Se-357

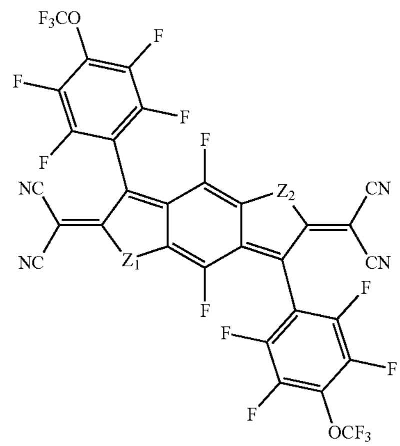

$Z_1$=$Z_1$=O Compound O-358
$Z_1$=$Z_2$=S Compound S-358
$Z_1$=$Z_2$=Se Compound Se-358

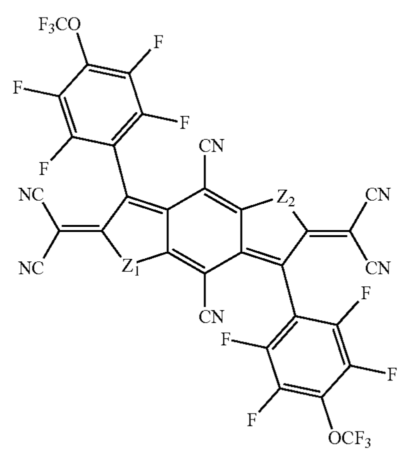

$Z_1$=$Z_1$=O Compound O-359
$Z_1$=$Z_2$=S Compound S-359
$Z_1$=$Z_2$=Se Compound Se-359

-continued

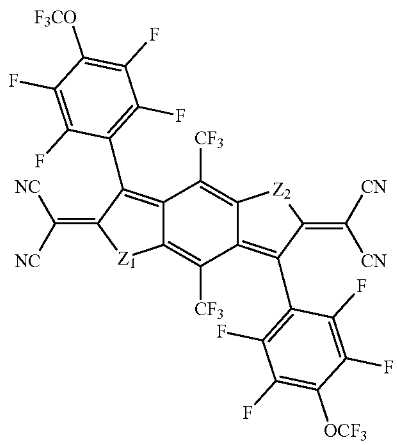

$Z_1$=$Z_1$=O Compound O-360
$Z_1$=$Z_2$=S Compound S-360
$Z_1$=$Z_2$=Se Compound Se-360

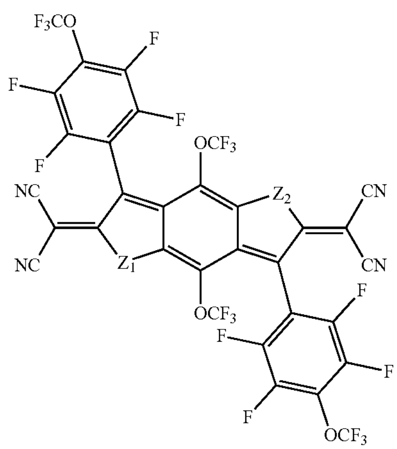

$Z_1$=$Z_1$=O Compound O-361
$Z_1$=$Z_2$=S Compound S-361
$Z_1$=$Z_2$=Se Compound Se-361

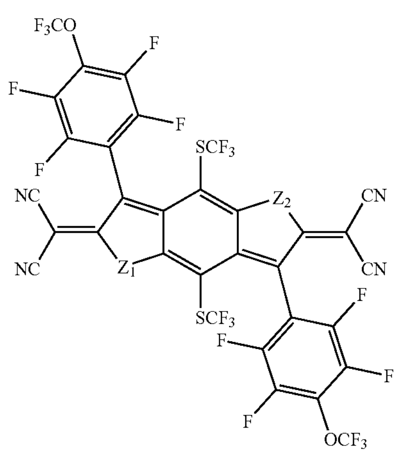

$Z_1$=$Z_1$=O Compound O-362
$Z_1$=$Z_2$=S Compound S-362
$Z_1$=$Z_2$=Se Compound Se-362

-continued

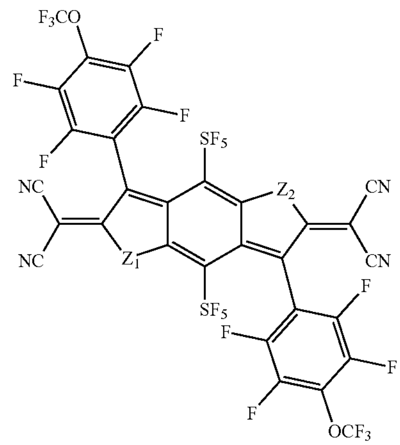

$Z_1$=$Z_1$=O Compound O-363
$Z_1$=$Z_2$=S Compound S-363
$Z_1$=$Z_2$=Se Compound Se-363

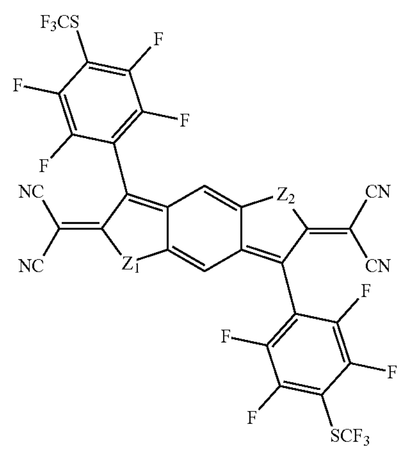

$Z_1$=$Z_1$=O Compound O-364
$Z_1$=$Z_2$=S Compound S-364
$Z_1$=$Z_2$=Se Compound Se-364

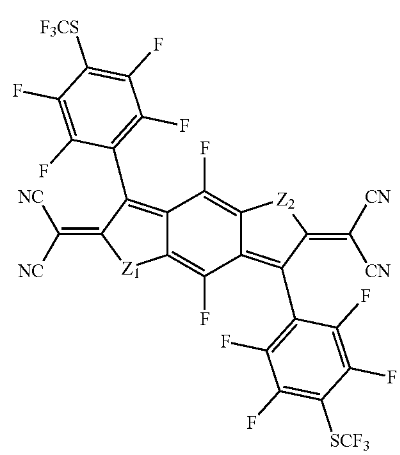

$Z_1$=$Z_1$=O Compound O-365
$Z_1$=$Z_2$=S Compound S-365
$Z_1$=$Z_2$=Se Compound Se-365

-continued

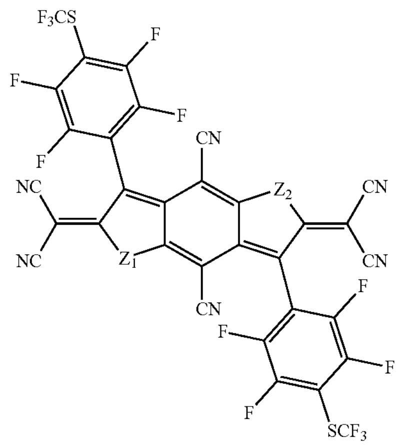

$Z_1$=$Z_1$=O Compound O-366
$Z_1$=$Z_2$=S Compound S-366
$Z_1$=$Z_2$=Se Compound Se-366

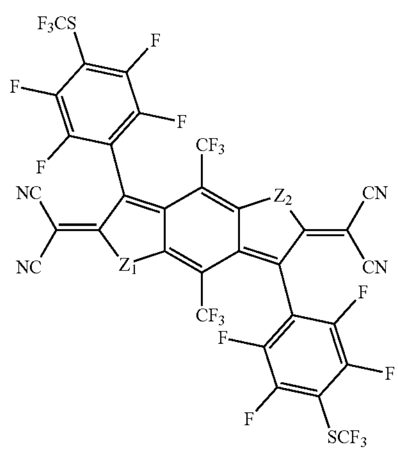

$Z_1$=$Z_1$=O Compound O-367
$Z_1$=$Z_2$=S Compound S-367
$Z_1$=$Z_2$=Se Compound Se-367

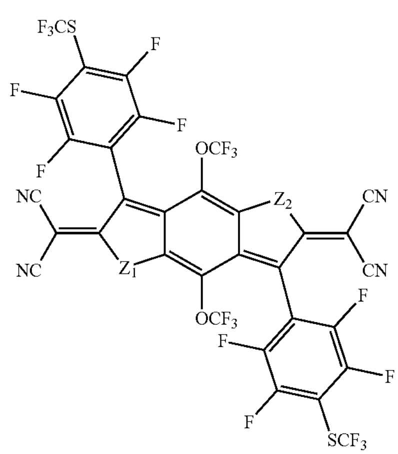

$Z_1$=$Z_1$=O Compound O-368
$Z_1$=$Z_2$=S Compound S-368
$Z_1$=$Z_2$=Se Compound Se-368

-continued

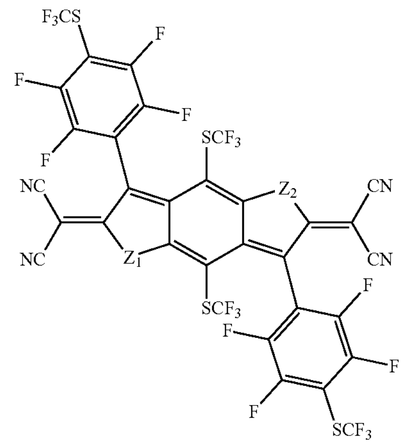

$Z_1$=$Z_1$=O Compound O-369
$Z_1$=$Z_2$=S Compound S-369
$Z_1$=$Z_2$=Se Compound Se-369

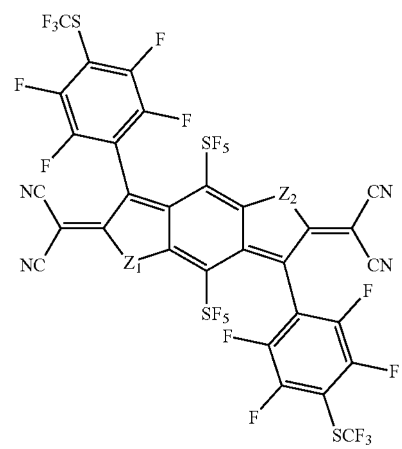

$Z_1$=$Z_1$=O Compound O-370
$Z_1$=$Z_2$=S Compound S-370
$Z_1$=$Z_2$=Se Compound Se-370

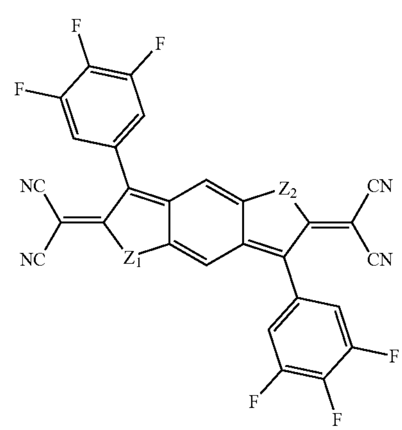

$Z_1$=$Z_1$=O Compound O-371
$Z_1$=$Z_2$=S Compound S-371
$Z_1$=$Z_2$=Se Compound Se-371

-continued

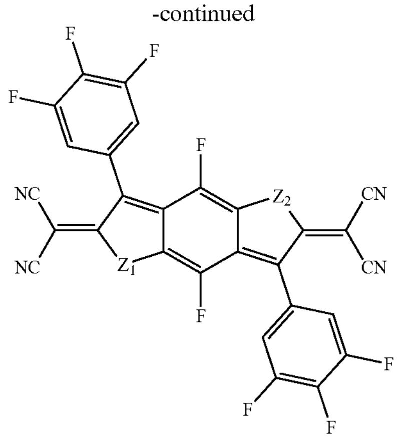

$Z_1$=$Z_1$=O Compound O-372
$Z_1$=$Z_2$=S Compound S-372
$Z_1$=$Z_2$=Se Compound Se-372

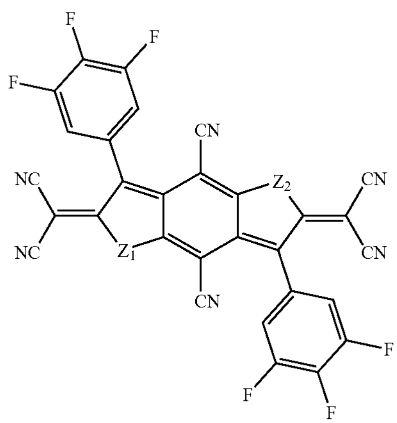

$Z_1$=$Z_1$=O Compound O-373
$Z_1$=$Z_2$=S Compound S-373
$Z_1$=$Z_2$=Se Compound Se-373

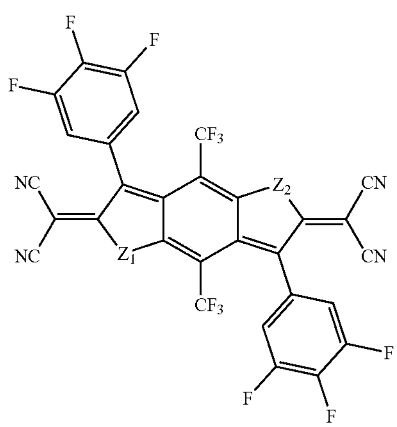

$Z_1$=$Z_1$=O Compound O-374
$Z_1$=$Z_2$=S Compound S-374
$Z_1$=$Z_2$=Se Compound Se-374

-continued

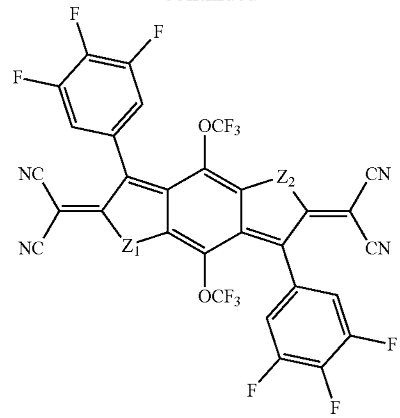

$Z_1$=$Z_1$=O Compound O-375
$Z_1$=$Z_2$=S Compound S-375
$Z_1$=$Z_2$=Se Compound Se-375

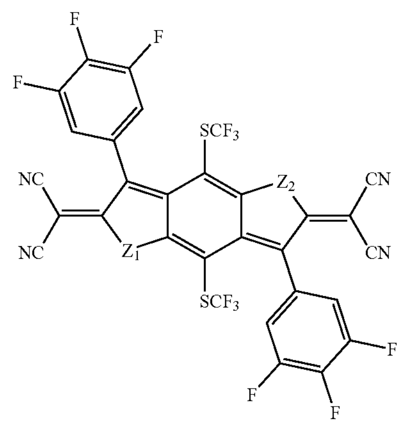

$Z_1$=$Z_1$=O Compound O-376
$Z_1$=$Z_2$=S Compound S-376
$Z_1$=$Z_2$=Se Compound Se-376

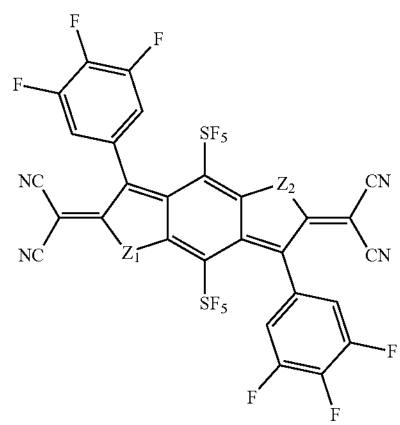

$Z_1$=$Z_1$=O Compound O-377
$Z_1$=$Z_2$=S Compound S-377
$Z_1$=$Z_2$=Se Compound Se-377

-continued

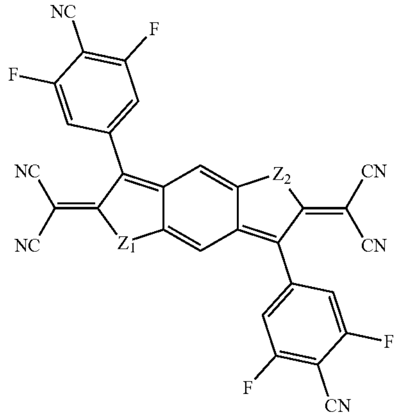

$Z_1$=$Z_1$=O Compound O-378
$Z_1$=$Z_2$=S Compound S-378
$Z_1$=$Z_2$=Se Compound Se-378

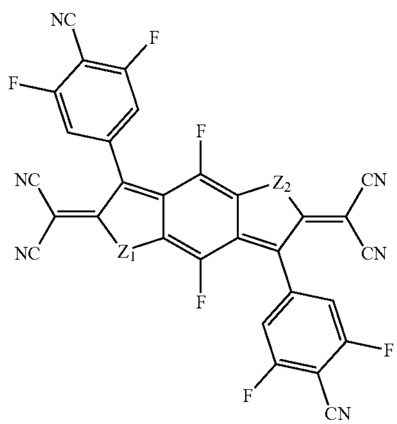

$Z_1$=$Z_1$=O Compound O-379
$Z_1$=$Z_2$=S Compound S-379
$Z_1$=$Z_2$=Se Compound Se-379

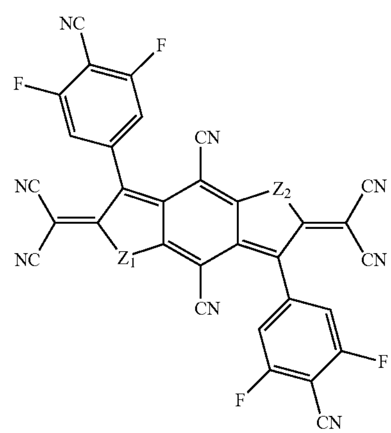

$Z_1$ = $Z_2$ = O Compound O-380
$Z_1$ = $Z_2$ = S Compound S-380
$Z_1$ = $Z_2$ = Se Compound Se-380

-continued

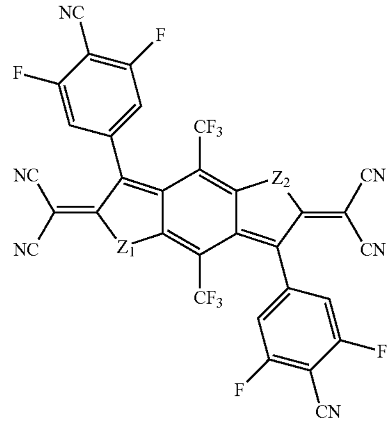

$Z_1$ = $Z_2$ = O Compound O-381
$Z_1$ = $Z_2$ = S Compound S-381
$Z_1$ = $Z_2$ = Se Compound Se-381

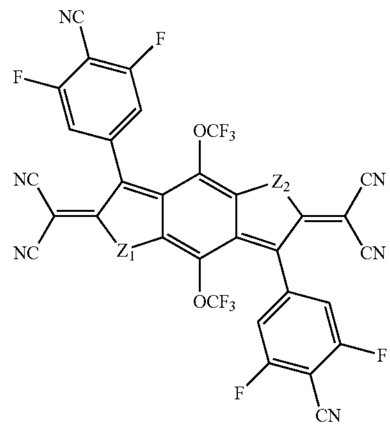

$Z_1$ = $Z_2$ = O Compound O-382
$Z_1$ = $Z_2$ = S Compound S-382
$Z_1$ = $Z_2$ = Se Compound Se-382

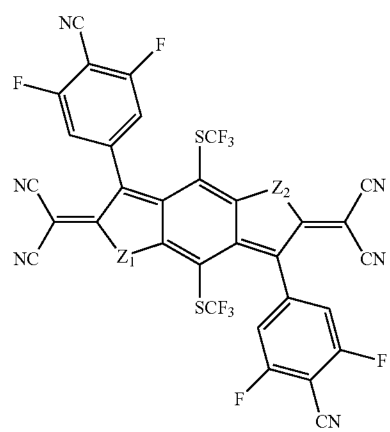

$Z_1$ = $Z_2$ = O Compound O-383
$Z_1$ = $Z_2$ = S Compound S-383
$Z_1$ = $Z_2$ = Se Compound Se-383

-continued

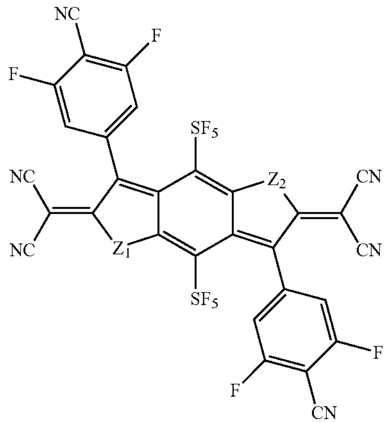

$Z_1 = Z_2 =$ O Compound O-384
$Z_1 = Z_2 =$ S Compound S-384
$Z_1 = Z_2 =$ Se Compound Se-384

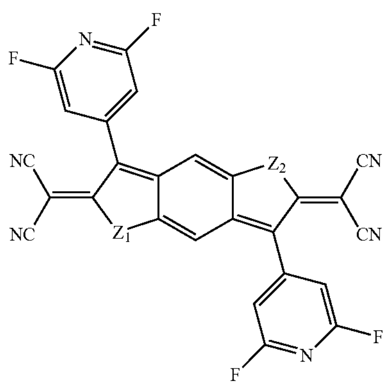

$Z_1 = Z_2 =$ O Compound O-385
$Z_1 = Z_2 =$ S Compound S-385
$Z_1 = Z_2 =$ Se Compound Se-385

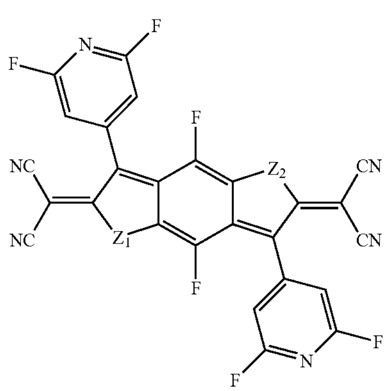

$Z_1 = Z_2 =$ O Compound O-386
$Z_1 = Z_2 =$ S Compound S-386
$Z_1 = Z_2 =$ Se Compound Se-386

-continued

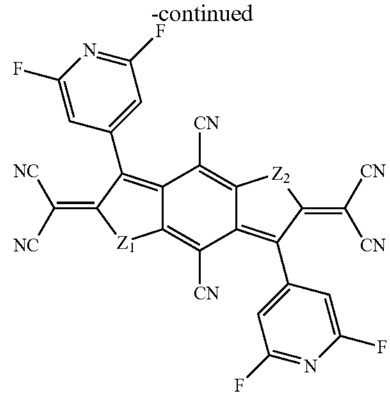

$Z_1 = Z_2 =$ O Compound O-387
$Z_1 = Z_2 =$ S Compound S-387
$Z_1 = Z_2 =$ Se Compound Se-387

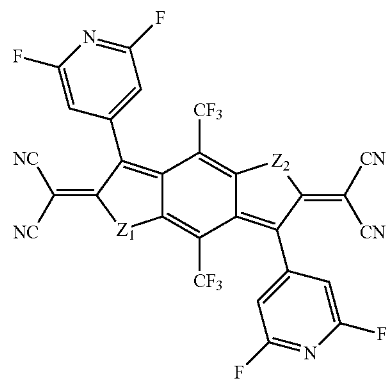

$Z_1 = Z_2 =$ O Compound O-388
$Z_1 = Z_2 =$ S Compound S-388
$Z_1 = Z_2 =$ Se Compound Se-388

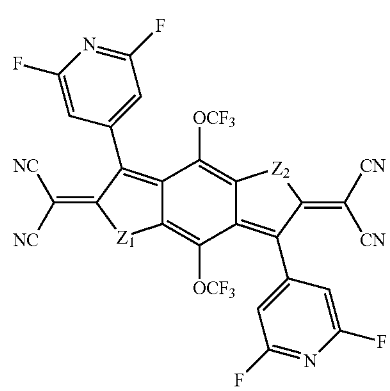

$Z_1 = Z_2 =$ O Compound O-389
$Z_1 = Z_2 =$ S Compound S-389
$Z_1 = Z_2 =$ Se Compound Se-389

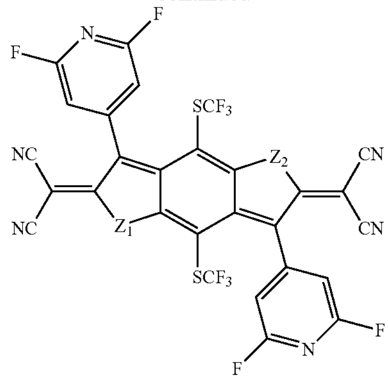

$Z_1 = Z_2 = O$ Compound O-390
$Z_1 = Z_2 = S$ Compound S-390
$Z_1 = Z_2 = Se$ Compound Se-390

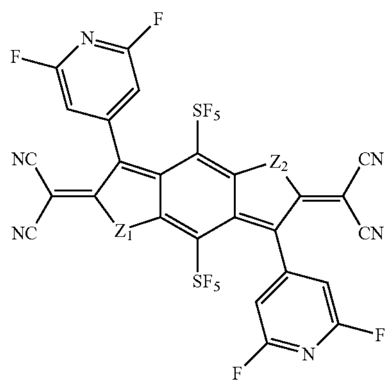

$Z_1 = Z_2 = O$ Compound O-391
$Z_1 = Z_2 = S$ Compound S-391
$Z_1 = Z_2 = Se$ Compound Se-391

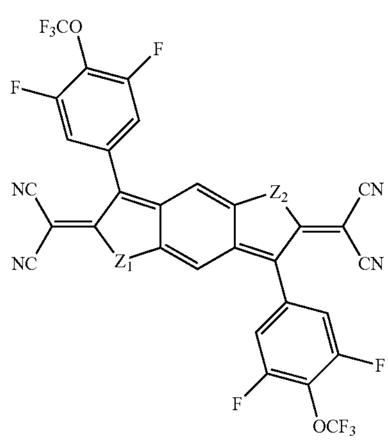

$Z_1 = Z_2 = O$ Compound O-392
$Z_1 = Z_2 = S$ Compound S-392
$Z_1 = Z_2 = Se$ Compound Se-392

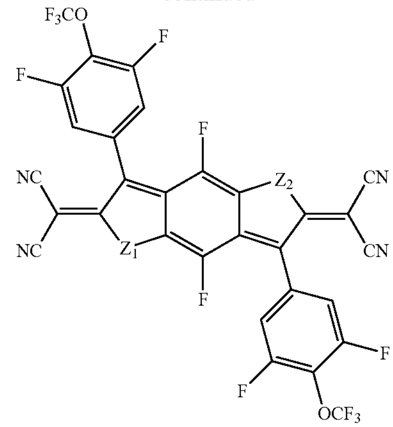

$Z_1 = Z_2 = O$ Compound O-393
$Z_1 = Z_2 = S$ Compound S-393
$Z_1 = Z_2 = Se$ Compound Se-393

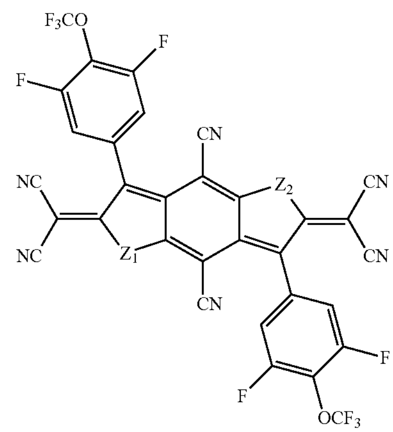

$Z_1 = Z_2 = O$ Compound O-394
$Z_1 = Z_2 = S$ Compound S-394
$Z_1 = Z_2 = Se$ Compound Se-394

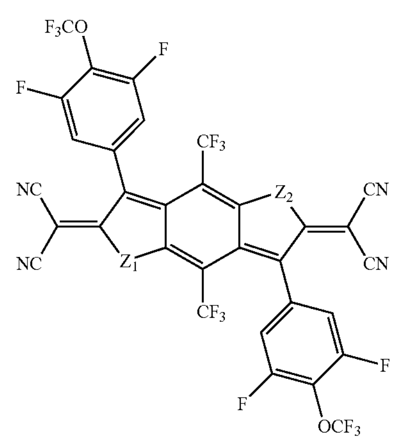

$Z_1 = Z_2 = O$ Compound O-395
$Z_1 = Z_2 = S$ Compound S-395
$Z_1 = Z_2 = Se$ Compound Se-395

-continued

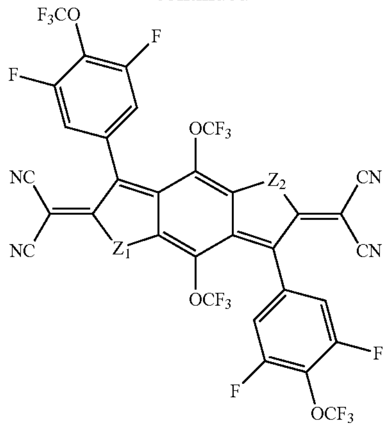

$Z_1 = Z_2 = O$ Compound O-396
$Z_1 = Z_2 = S$ Compound S-396
$Z_1 = Z_2 = Se$ Compound Se-396

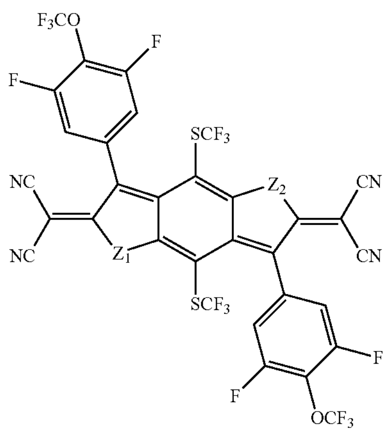

$Z_1 = Z_2 = O$ Compound O-397
$Z_1 = Z_2 = S$ Compound S-397
$Z_1 = Z_2 = Se$ Compound Se-397

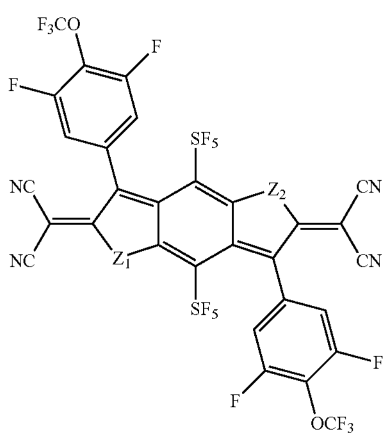

$Z_1 = Z_2 = O$ Compound O-398
$Z_1 = Z_2 = S$ Compound S-398
$Z_1 = Z_2 = Se$ Compound Se-398

-continued

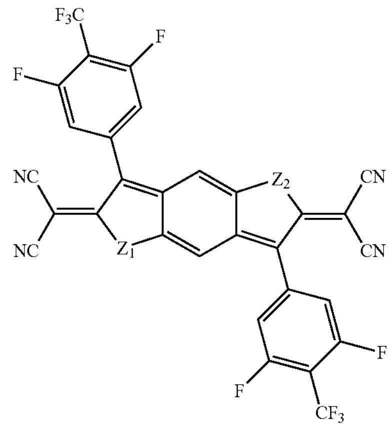

$Z_1 = Z_2 = O$ Compound O-399
$Z_1 = Z_2 = S$ Compound S-399
$Z_1 = Z_2 = Se$ Compound Se-399

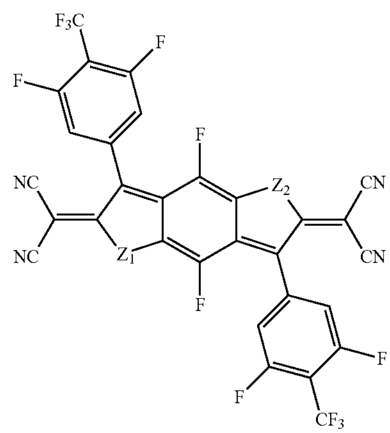

$Z_1 = Z_2 = O$ Compound O-400
$Z_1 = Z_2 = S$ Compound S-400
$Z_1 = Z_2 = Se$ Compound Se-400

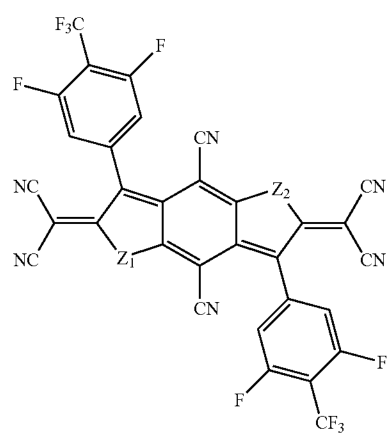

$Z_1 = Z_2 = O$ Compound O-401
$Z_1 = Z_2 = S$ Compound S-401
$Z_1 = Z_2 = Se$ Compound Se-401

-continued

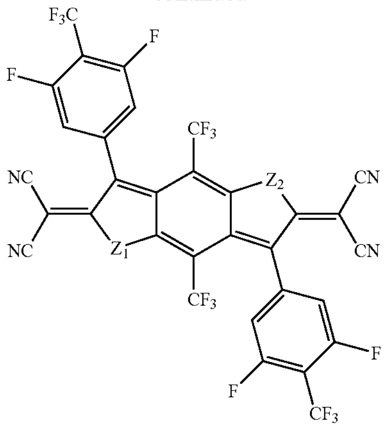

$Z_1 = Z_2 =$ O Compound O-402
$Z_1 = Z_2 =$ S Compound S-402
$Z_1 = Z_2 =$ Se Compound Se-402

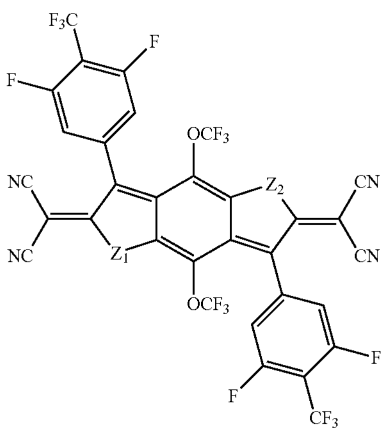

$Z_1 = Z_2 =$ O Compound O-403
$Z_1 = Z_2 =$ S Compound S-403
$Z_1 = Z_2 =$ Se Compound Se-403

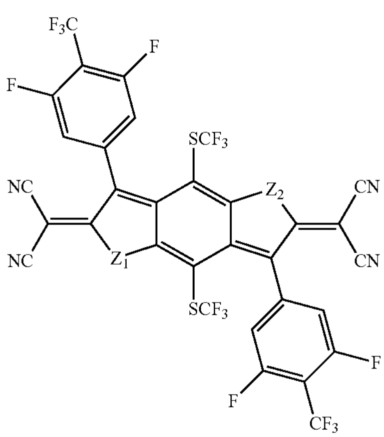

$Z_1 = Z_2 =$ O Compound O-404
$Z_1 = Z_2 =$ S Compound S-404
$Z_1 = Z_2 =$ Se Compound Se-404

-continued

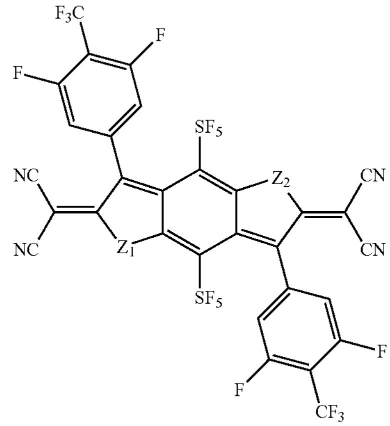

$Z_1 = Z_2 =$ O Compound O-405
$Z_1 = Z_2 =$ S Compound S-405
$Z_1 = Z_2 =$ Se Compound Se-405

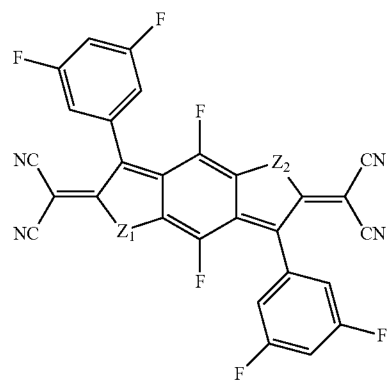

$Z_1 = Z_2 =$ O Compound O-406
$Z_1 = Z_2 =$ S Compound S-406
$Z_1 = Z_2 =$ Se Compound Se-406

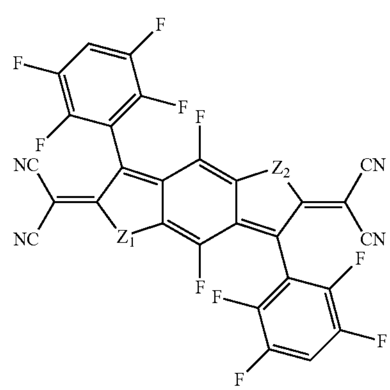

$Z_1 = Z_2 =$ O Compound O-407
$Z_1 = Z_2 =$ S Compound S-407
$Z_1 = Z_2 =$ Se Compound Se-407

-continued

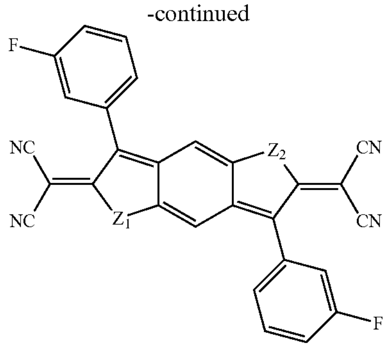

$Z_1 = Z_2 =$ O Compound O-408
$Z_1 = Z_2 =$ S Compound S-408
$Z_1 = Z_2 =$ Se Compound Se-408

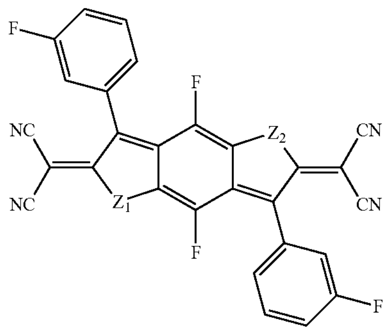

$Z_1 = Z_2 =$ O Compound O-409
$Z_1 = Z_2 =$ S Compound S-409
$Z_1 = Z_2 =$ Se Compound Se-409

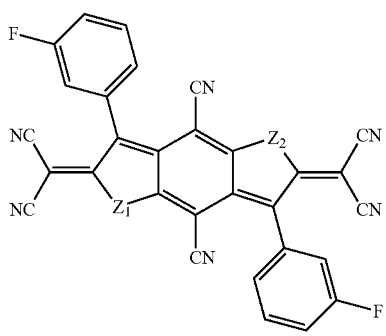

$Z_1 = Z_2 =$ O Compound O-410
$Z_1 = Z_2 =$ S Compound S-410
$Z_1 = Z_2 =$ Se Compound Se-410

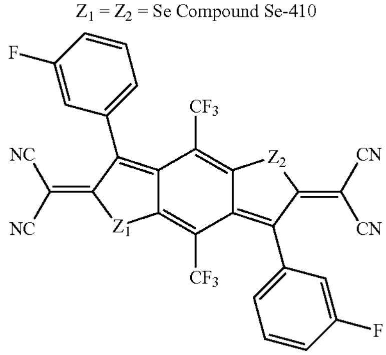

$Z_1 = Z_2 =$ O Compound O-411
$Z_1 = Z_2 =$ S Compound S-411
$Z_1 = Z_2 =$ Se Compound Se-411

-continued

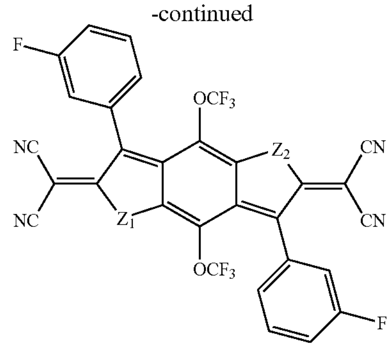

$Z_1 = Z_2 =$ O Compound O-412
$Z_1 = Z_2 =$ S Compound S-412
$Z_1 = Z_2 =$ Se Compound Se-412

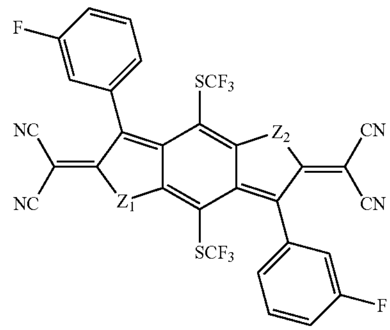

$Z_1 = Z_2 =$ O Compound O-413
$Z_1 = Z_2 =$ S Compound S-413
$Z_1 = Z_2 =$ Se Compound Se-413

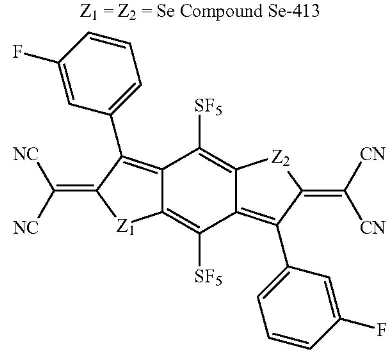

$Z_1 = Z_2 =$ O Compound O-414
$Z_1 = Z_2 =$ S Compound S-414
$Z_1 = Z_2 =$ Se Compound Se-414

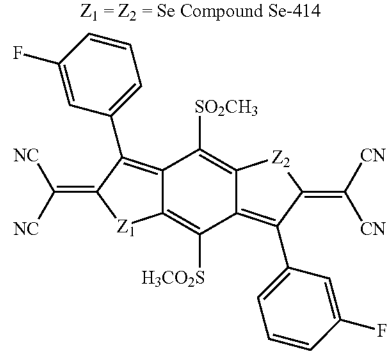

$Z_1 = Z_2 =$ O Compound O-415
$Z_1 = Z_2 =$ S Compound S-415
$Z_1 = Z_2 =$ Se Compound Se-415

-continued

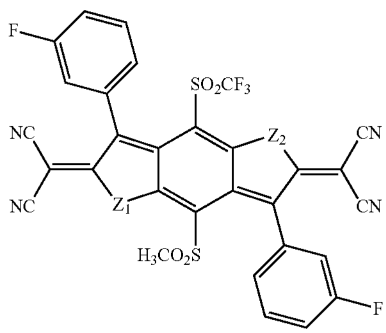

$Z_1 = Z_2 = O$ Compound O-416
$Z_1 = Z_2 = S$ Compound S-416
$Z_1 = Z_2 = Se$ Compound Se-416

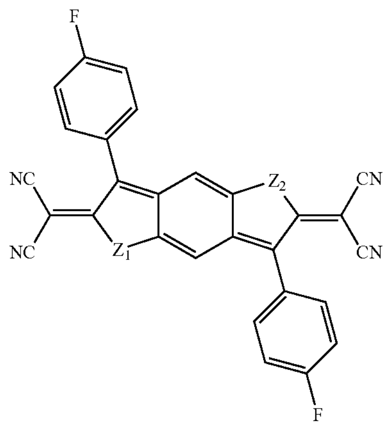

$Z_1 = Z_2 = O$ Compound O-417
$Z_1 = Z_2 = S$ Compound S-417
$Z_1 = Z_2 = Se$ Compound Se-417

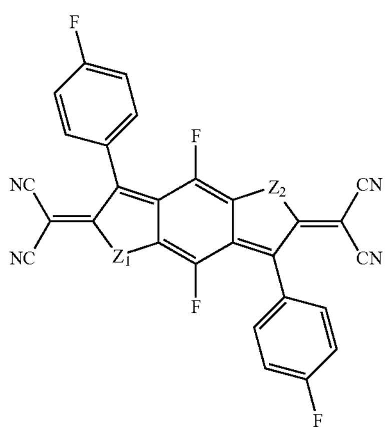

$Z_1 = Z_2 = O$ Compound O-418
$Z_1 = Z_2 = S$ Compound S-418
$Z_1 = Z_2 = Se$ Compound Se-418

-continued

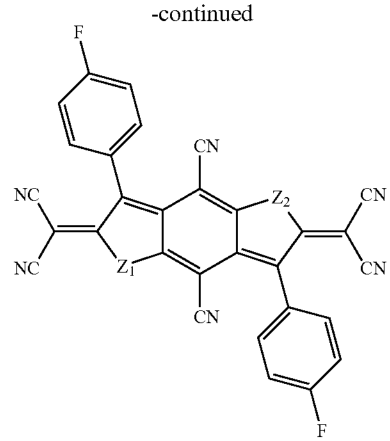

$Z_1 = Z_2 = O$ Compound O-419
$Z_1 = Z_2 = S$ Compound S-419
$Z_1 = Z_2 = Se$ Compound Se-419

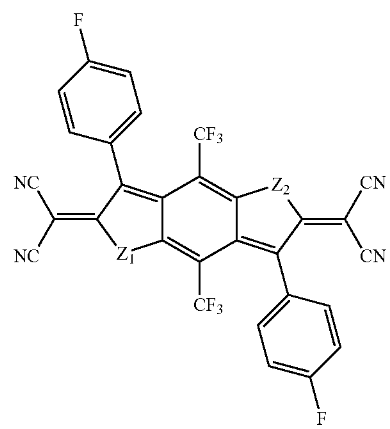

$Z_1 = Z_2 = O$ Compound O-420
$Z_1 = Z_2 = S$ Compound S-420
$Z_1 = Z_2 = Se$ Compound Se-420

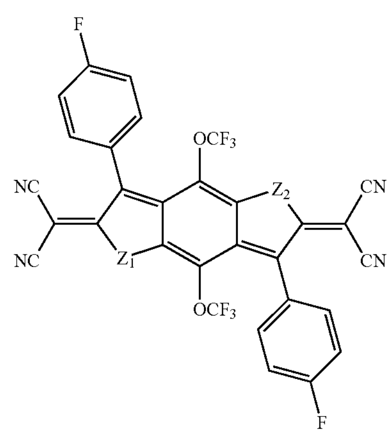

$Z_1 = Z_2 = O$ Compound O-421
$Z_1 = Z_2 = S$ Compound S-421
$Z_1 = Z_2 = Se$ Compound Se-421

-continued

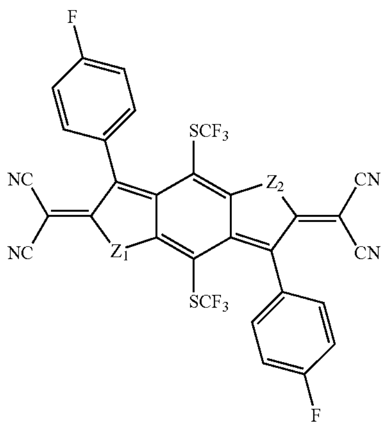

$Z_1 = Z_2 = O$ Compound O-422
$Z_1 = Z_2 = S$ Compound S-422
$Z_1 = Z_2 = Se$ Compound Se-422

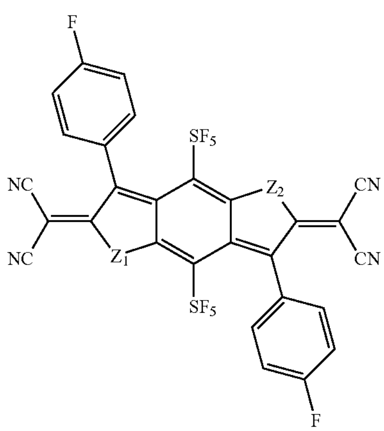

$Z_1 = Z_2 = O$ Compound O-423
$Z_1 = Z_2 = S$ Compound S-423
$Z_1 = Z_2 = Se$ Compound Se-423

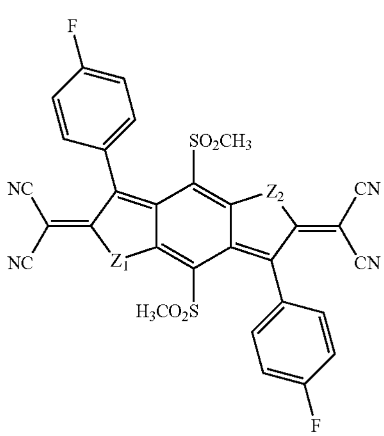

$Z_1 = Z_2 = O$ Compound O-424
$Z_1 = Z_2 = S$ Compound S-424
$Z_1 = Z_2 = Se$ Compound Se-424

-continued

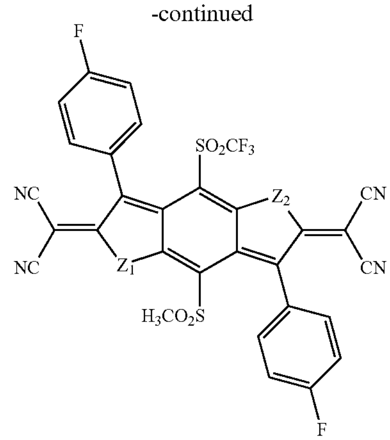

$Z_1 = Z_2 = O$ Compound O-425
$Z_1 = Z_2 = S$ Compound S-425
$Z_1 = Z_2 = Se$ Compound Se-425

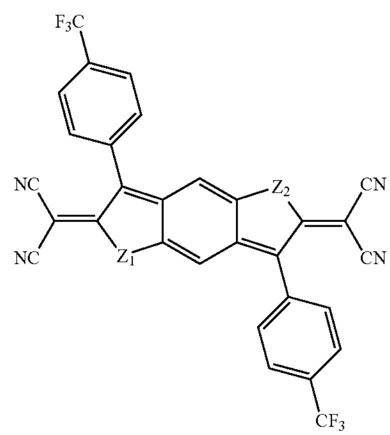

$Z_1 = Z_2 = O$ Compound O-426
$Z_1 = Z_2 = S$ Compound S-426
$Z_1 = Z_2 = Se$ Compound Se-426

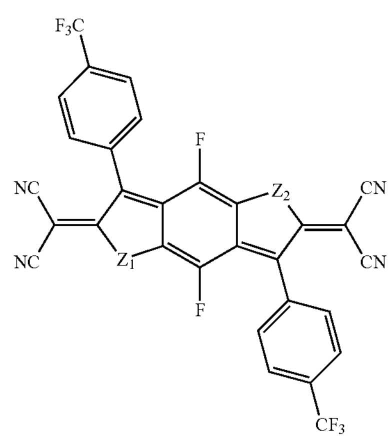

$Z_1 = Z_2 = O$ Compound O-427
$Z_1 = Z_2 = S$ Compound S-427
$Z_1 = Z_2 = Se$ Compound Se-427

-continued

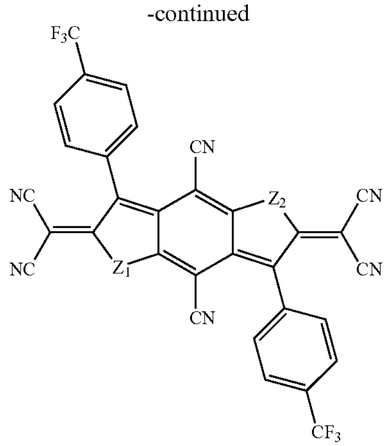

$Z_1 = Z_2 = O$ Compound O-428
$Z_1 = Z_2 = S$ Compound S-428
$Z_1 = Z_2 = Se$ Compound Se-428

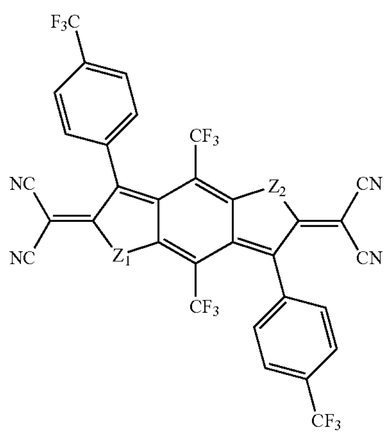

$Z_1 = Z_2 = O$ Compound O-429
$Z_1 = Z_2 = S$ Compound S-429
$Z_1 = Z_2 = Se$ Compound Se-429

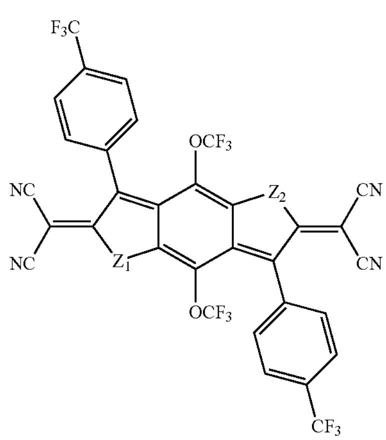

$Z_1 = Z_2 = O$ Compound O-430
$Z_1 = Z_2 = S$ Compound S-430
$Z_1 = Z_2 = Se$ Compound Se-430

-continued

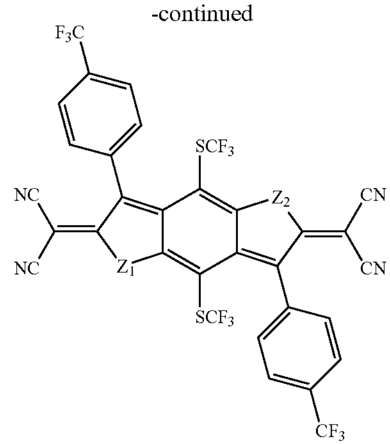

$Z_1 = Z_2 = O$ Compound O-431
$Z_1 = Z_2 = S$ Compound S-431
$Z_1 = Z_2 = Se$ Compound Se-431

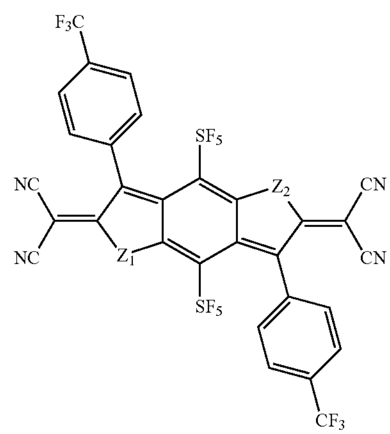

$Z_1 = Z_2 = O$ Compound O-432
$Z_1 = Z_2 = S$ Compound S-432
$Z_1 = Z_2 = Se$ Compound Se-432

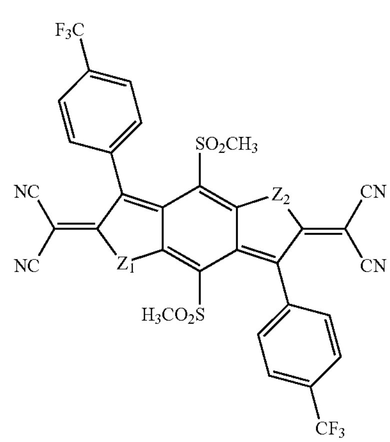

$Z_1 = Z_2 = O$ Compound O-433
$Z_1 = Z_2 = S$ Compound S-433
$Z_1 = Z_2 = Se$ Compound Se-433

-continued

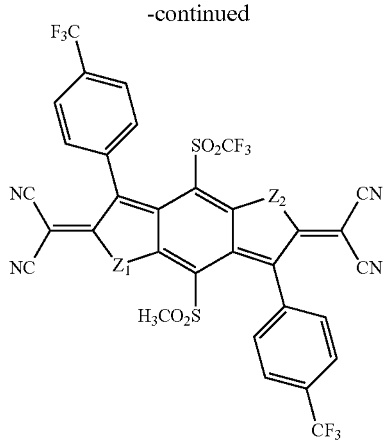

$Z_1 = Z_2 = O$ Compound O-434
$Z_1 = Z_2 = S$ Compound S-434
$Z_1 = Z_2 = Se$ Compound Se-434

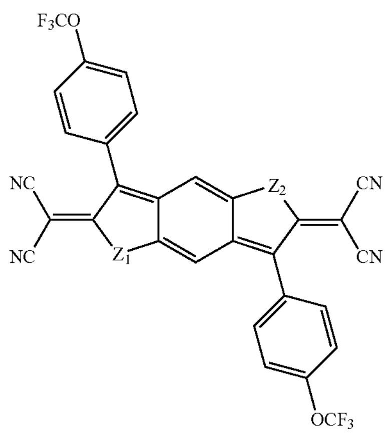

$Z_1 = Z_2 = O$ Compound O-435
$Z_1 = Z_2 = S$ Compound S-435
$Z_1 = Z_2 = Se$ Compound Se-435

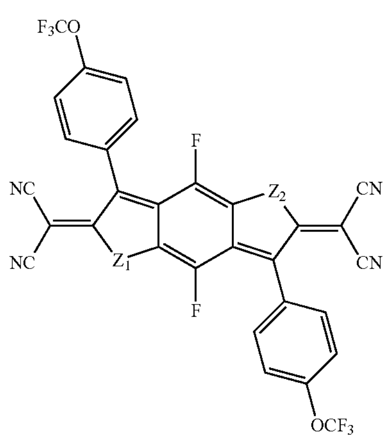

$Z_1 = Z_2 = O$ Compound O-436
$Z_1 = Z_2 = S$ Compound S-436
$Z_1 = Z_2 = Se$ Compound Se-436

-continued

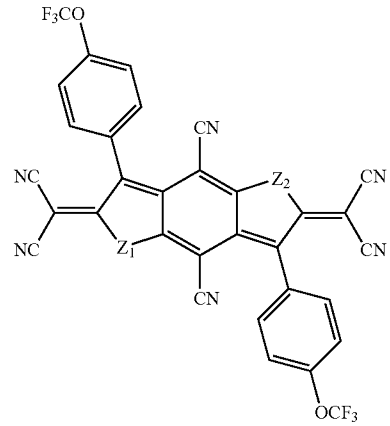

$Z_1 = Z_2 = O$ Compound O-437
$Z_1 = Z_2 = S$ Compound S-437
$Z_1 = Z_2 = Se$ Compound Se-437

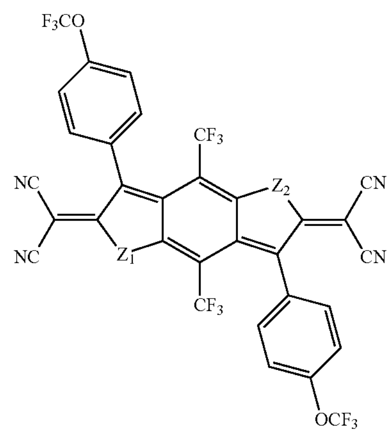

$Z_1 = Z_2 = O$ Compound O-438
$Z_1 = Z_2 = S$ Compound S-438
$Z_1 = Z_2 = Se$ Compound Se-438

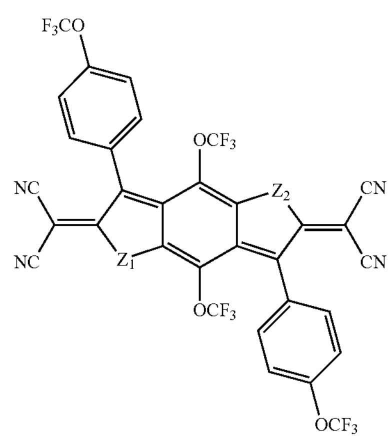

$Z_1 = Z_2 = O$ Compound O-439
$Z_1 = Z_2 = S$ Compound S-439
$Z_1 = Z_2 = Se$ Compound Se-439

-continued

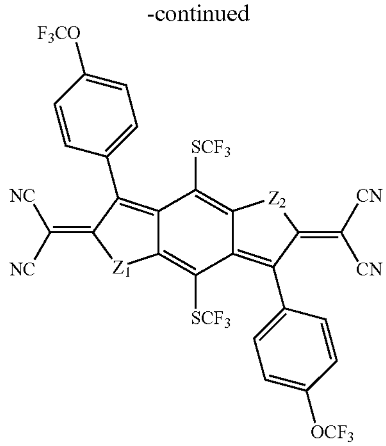

$Z_1 = Z_2 =$ O Compound O-440
$Z_1 = Z_2 =$ S Compound S-440
$Z_1 = Z_2 =$ Se Compound Se-440

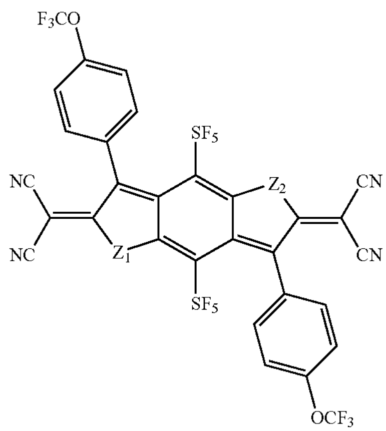

$Z_1 = Z_2 =$ O Compound O-441
$Z_1 = Z_2 =$ S Compound S-441
$Z_1 = Z_2 =$ Se Compound Se-441

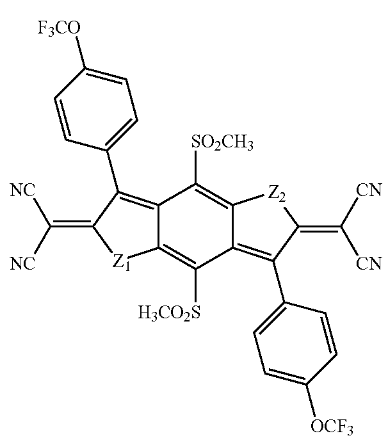

$Z_1 = Z_2 =$ O Compound O-442
$Z_1 = Z_2 =$ S Compound S-442
$Z_1 = Z_2 =$ Se Compound Se-442

-continued

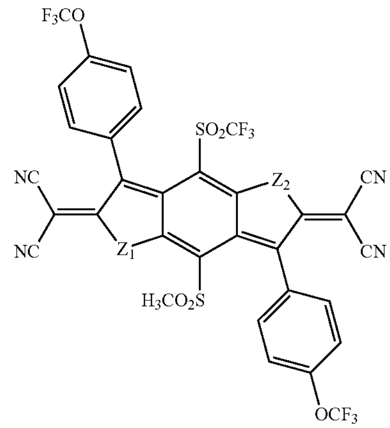

$Z_1 = Z_2 =$ O Compound O-443
$Z_1 = Z_2 =$ S Compound S-443
$Z_1 = Z_2 =$ Se Compound Se-443

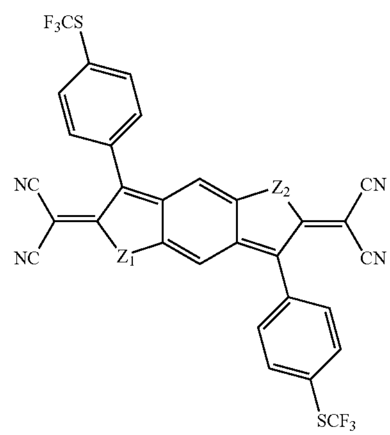

$Z_1 = Z_2 =$ O Compound O-444
$Z_1 = Z_2 =$ S Compound S-444
$Z_1 = Z_2 =$ Se Compound Se-444

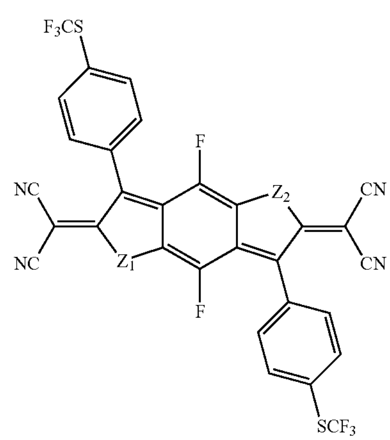

$Z_1 = Z_2 =$ O Compound O-445
$Z_1 = Z_2 =$ S Compound S-445
$Z_1 = Z_2 =$ Se Compound Se-445

-continued

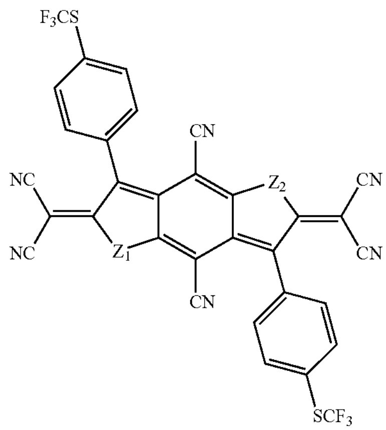

$Z_1 = Z_2 =$ O Compound O-446
$Z_1 = Z_2 =$ S Compound S-446
$Z_1 = Z_2 =$ Se Compound Se-446

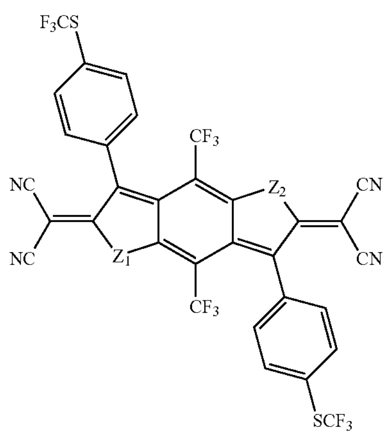

$Z_1 = Z_2 =$ O Compound O-447
$Z_1 = Z_2 =$ S Compound S-447
$Z_1 = Z_2 =$ Se Compound Se-447

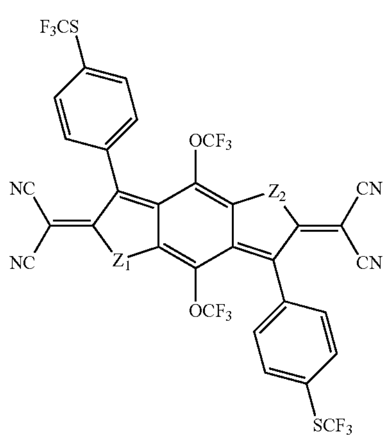

$Z_1 = Z_2 =$ O Compound O-448
$Z_1 = Z_2 =$ S Compound S-448
$Z_1 = Z_2 =$ Se Compound Se-448

-continued

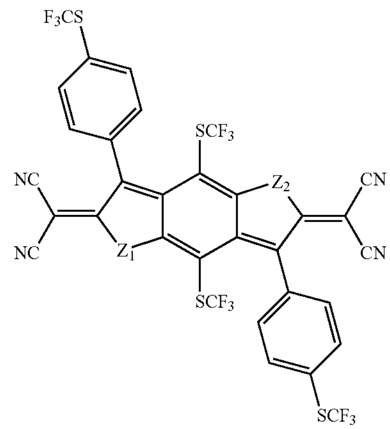

$Z_1 = Z_2 =$ O Compound O-449
$Z_1 = Z_2 =$ S Compound S-449
$Z_1 = Z_2 =$ Se Compound Se-449

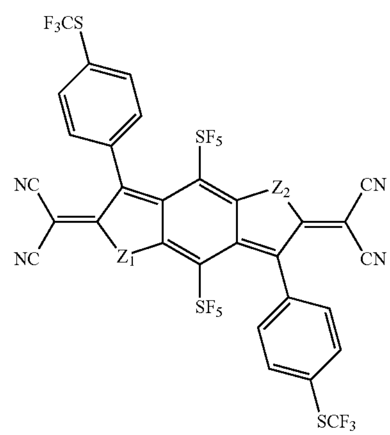

$Z_1 = Z_2 =$ O Compound O-450
$Z_1 = Z_2 =$ S Compound S-450
$Z_1 = Z_2 =$ Se Compound Se-450

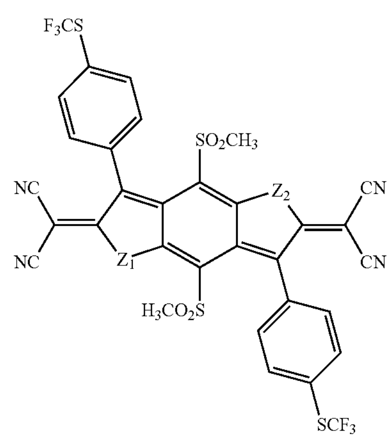

$Z_1 = Z_2 =$ O Compound O-451
$Z_1 = Z_2 =$ S Compound S-451
$Z_1 = Z_2 =$ Se Compound Se-451

-continued

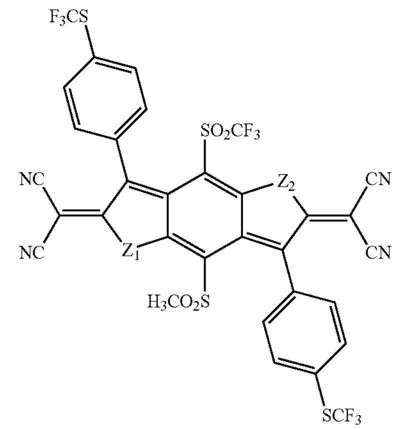

$Z_1 = Z_2 =$ O Compound O-452
$Z_1 = Z_2 =$ S Compound S-452
$Z_1 = Z_2 =$ Se Compound Se-452

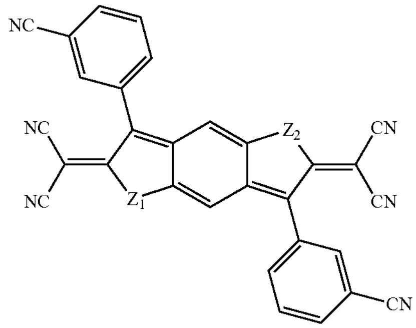

$Z_1 = Z_2 =$ O Compound O-453
$Z_1 = Z_2 =$ S Compound S-453
$Z_1 = Z_2 =$ Se Compound Se-453

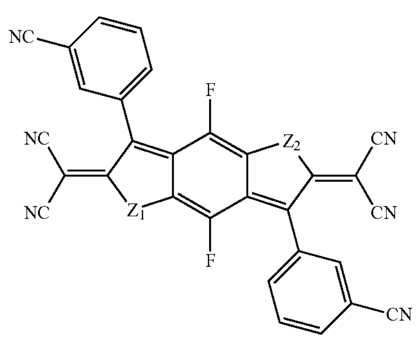

$Z_1 = Z_2 =$ O Compound O-454
$Z_1 = Z_2 =$ S Compound S-454
$Z_1 = Z_2 =$ Se Compound Se-454

-continued

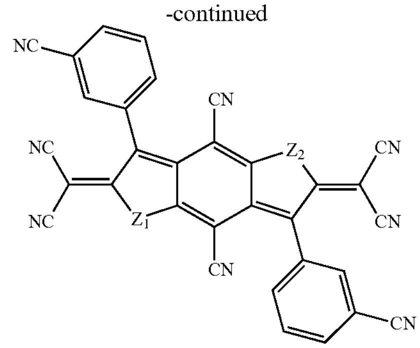

$Z_1 = Z_2 =$ O Compound O-455
$Z_1 = Z_2 =$ S Compound S-455
$Z_1 = Z_2 =$ Se Compound Se-455

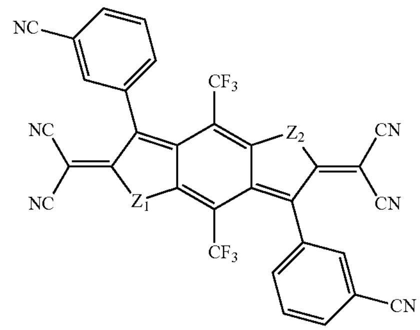

$Z_1 = Z_2 =$ O Compound O-456
$Z_1 = Z_2 =$ S Compound S-456
$Z_1 = Z_2 =$ Se Compound Se-456

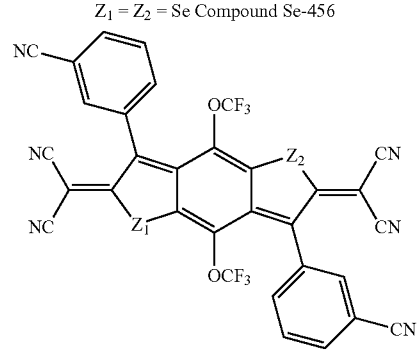

$Z_1 = Z_2 =$ O Compound O-457
$Z_1 = Z_2 =$ S Compound S-457
$Z_1 = Z_2 =$ Se Compound Se-457

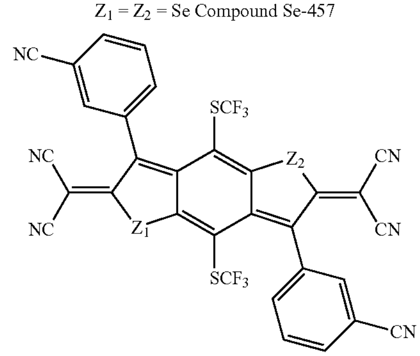

$Z_1 = Z_2 =$ O Compound O-458
$Z_1 = Z_2 =$ S Compound S-458
$Z_1 = Z_2 =$ Se Compound Se-458

-continued

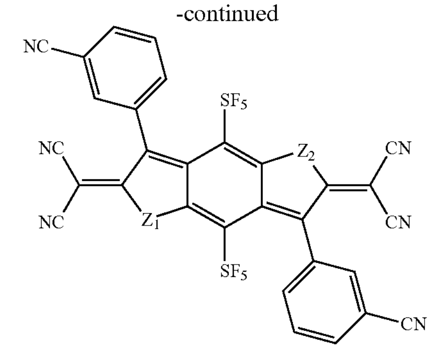

$Z_1 = Z_2 =$ O Compound O-459
$Z_1 = Z_2 =$ S Compound S-459
$Z_1 = Z_2 =$ Se Compound Se-459

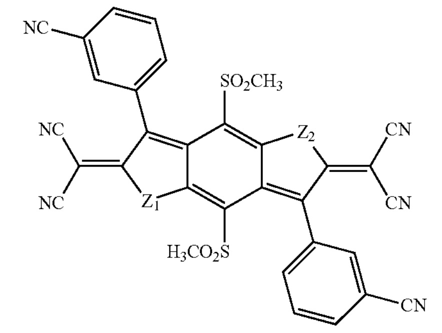

$Z_1 = Z_2 =$ O Compound O-460
$Z_1 = Z_2 =$ S Compound S-460
$Z_1 = Z_2 =$ Se Compound Se-460

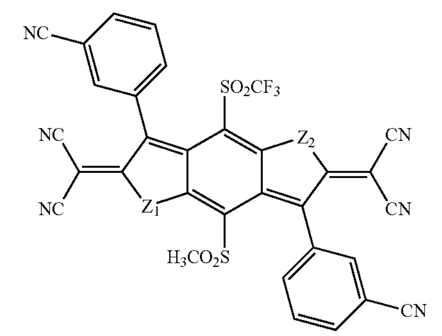

$Z_1 = Z_2 =$ O Compound O-461
$Z_1 = Z_2 =$ S Compound S-461
$Z_1 = Z_2 =$ Se Compound Se-461

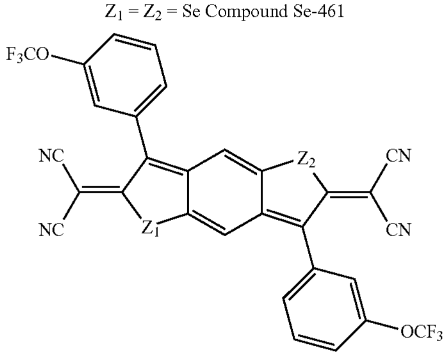

$Z_1 = Z_2 =$ O Compound O-462
$Z_1 = Z_2 =$ S Compound S-462
$Z_1 = Z_2 =$ Se Compound Se-462

-continued

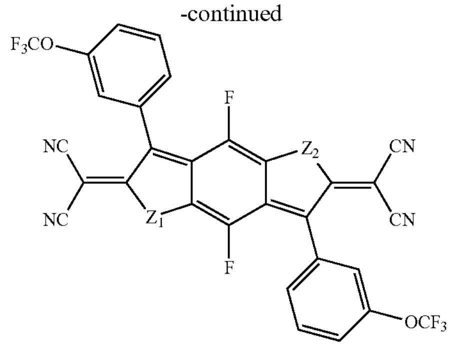

$Z_1 = Z_2 =$ O Compound O-463
$Z_1 = Z_2 =$ S Compound S-463
$Z_1 = Z_2 =$ Se Compound Se-463

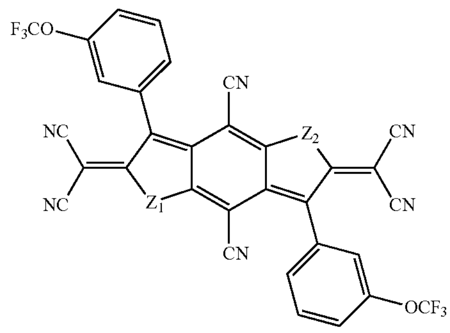

$Z_1 = Z_2 =$ O Compound O-464
$Z_1 = Z_2 =$ S Compound S-464
$Z_1 = Z_2 =$ Se Compound Se-464

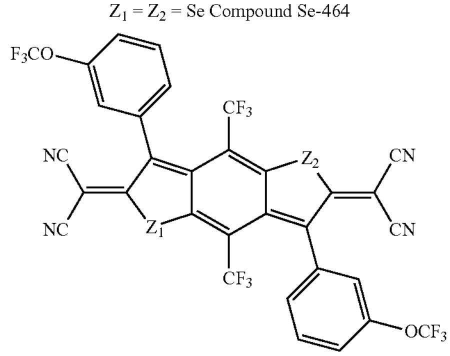

$Z_1 = Z_2 =$ O Compound O-465
$Z_1 = Z_2 =$ S Compound S-465
$Z_1 = Z_2 =$ Se Compound Se-465

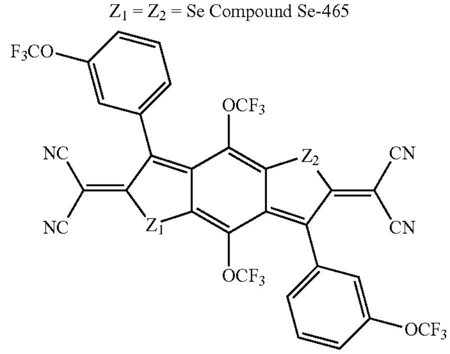

$Z_1 = Z_2 =$ O Compound O-466
$Z_1 = Z_2 =$ S Compound S-466
$Z_1 = Z_2 =$ Se Compound Se-466

-continued

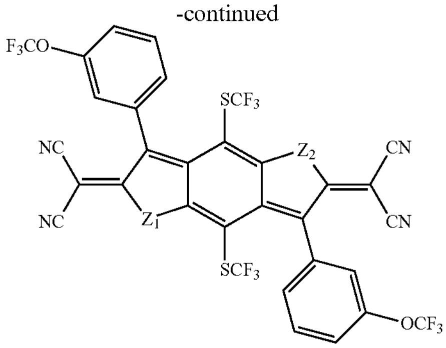

$Z_1 = Z_2 =$ O Compound O-467
$Z_1 = Z_2 =$ S Compound S-467
$Z_1 = Z_2 =$ Se Compound Se-467

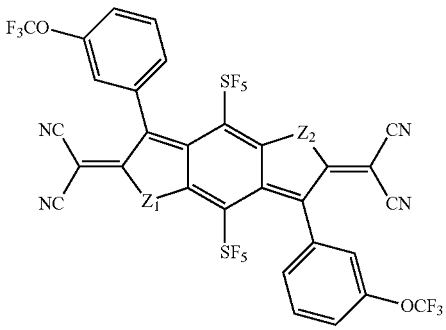

$Z_1 = Z_2 =$ O Compound O-468
$Z_1 = Z_2 =$ S Compound S-468
$Z_1 = Z_2 =$ Se Compound Se-468

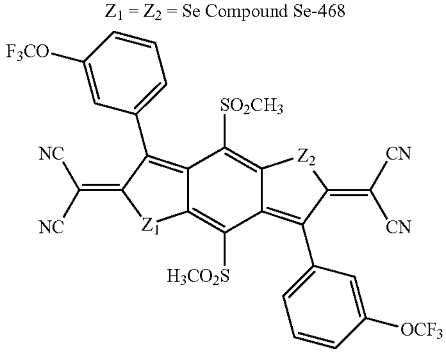

$Z_1 = Z_2 =$ O Compound O-469
$Z_1 = Z_2 =$ S Compound S-469
$Z_1 = Z_2 =$ Se Compound Se-469

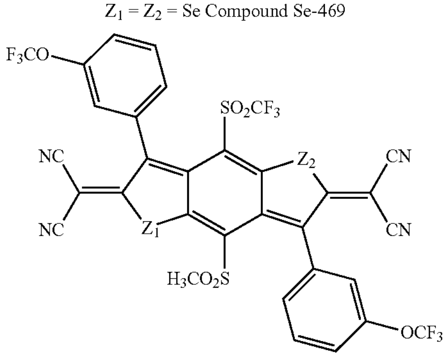

$Z_1 = Z_2 =$ O Compound O-470
$Z_1 = Z_2 =$ S Compound S-470
$Z_1 = Z_2 =$ Se Compound Se-470

-continued

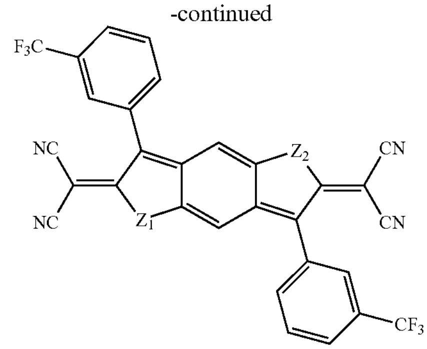

$Z_1 = Z_2 =$ O Compound O-471
$Z_1 = Z_2 =$ S Compound S-471
$Z_1 = Z_2 =$ Se Compound Se-471

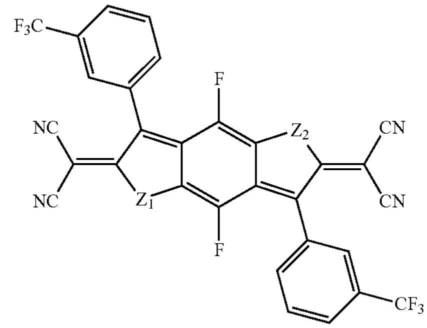

$Z_1 = Z_2 =$ O Compound O-472
$Z_1 = Z_2 =$ S Compound S-472
$Z_1 = Z_2 =$ Se Compound Se-472

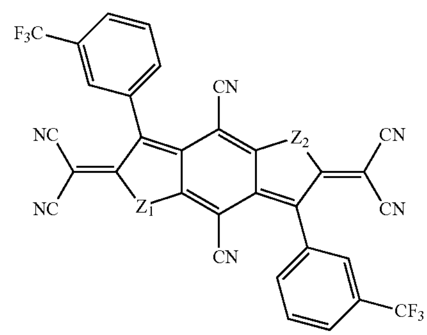

$Z_1 = Z_2 =$ O Compound O-473
$Z_1 = Z_2 =$ S Compound S-473
$Z_1 = Z_2 =$ Se Compound Se-473

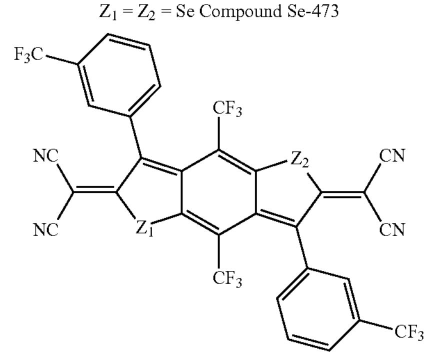

$Z_1 = Z_2 =$ O Compound O-474
$Z_1 = Z_2 =$ S Compound S-474
$Z_1 = Z_2 =$ Se Compound Se-474

-continued

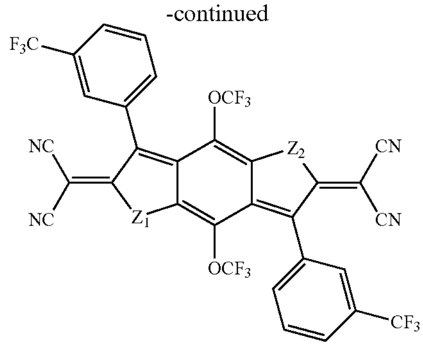

$Z_1 = Z_2 =$ O Compound O-475
$Z_1 = Z_2 =$ S Compound S-475
$Z_1 = Z_2 =$ Se Compound Se-475

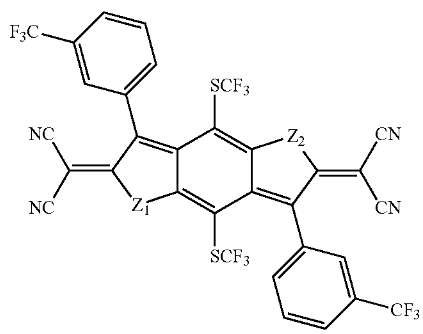

$Z_1 = Z_2 =$ O Compound O-476
$Z_1 = Z_2 =$ S Compound S-476
$Z_1 = Z_2 =$ Se Compound Se-476

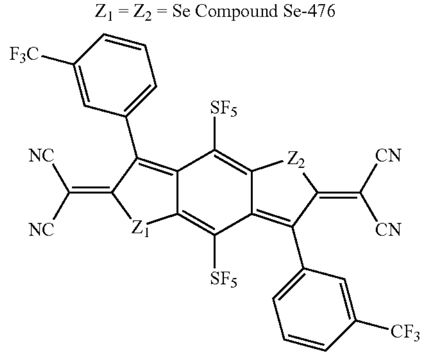

$Z_1 = Z_2 =$ O Compound O-477
$Z_1 = Z_2 =$ S Compound S-477
$Z_1 = Z_2 =$ Se Compound Se-477

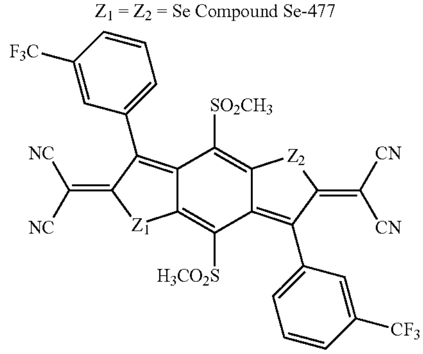

$Z_1 = Z_2 =$ O Compound O-478
$Z_1 = Z_2 =$ S Compound S-478
$Z_1 = Z_2 =$ Se Compound Se-478

-continued

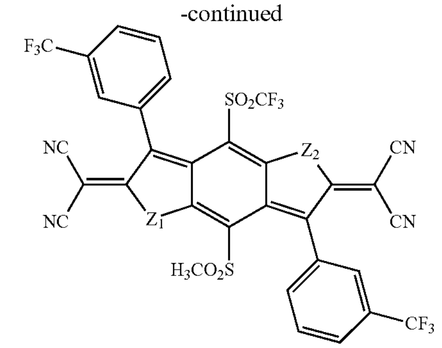

$Z_1 = Z_2 =$ O Compound O-479
$Z_1 = Z_2 =$ S Compound S-479
$Z_1 = Z_2 =$ Se Compound Se-479

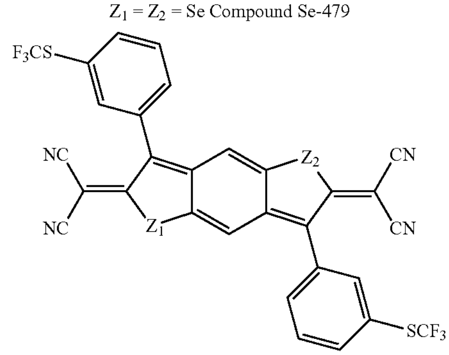

$Z_1 = Z_2 =$ O Compound O-480
$Z_1 = Z_2 =$ S Compound S-480
$Z_1 = Z_2 =$ Se Compound Se-480

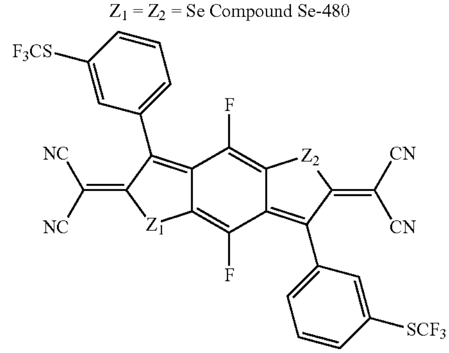

$Z_1 = Z_2 =$ O Compound O-481
$Z_1 = Z_2 =$ S Compound S-481
$Z_1 = Z_2 =$ Se Compound Se-481

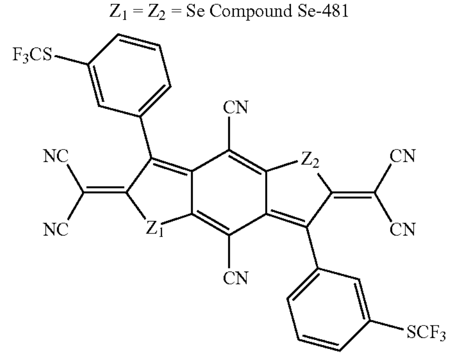

$Z_1 = Z_2 =$ O Compound O-482
$Z_1 = Z_2 =$ S Compound S-482
$Z_1 = Z_2 =$ Se Compound Se-482

-continued

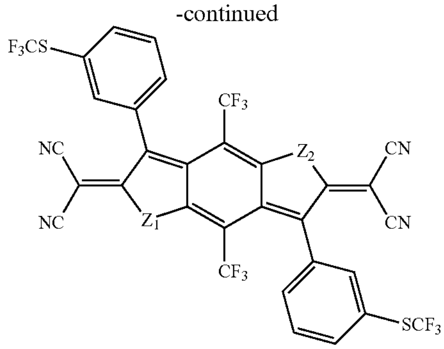

$Z_1 = Z_2 = O$ Compound O-483
$Z_1 = Z_2 = S$ Compound S-483
$Z_1 = Z_2 = Se$ Compound Se-483

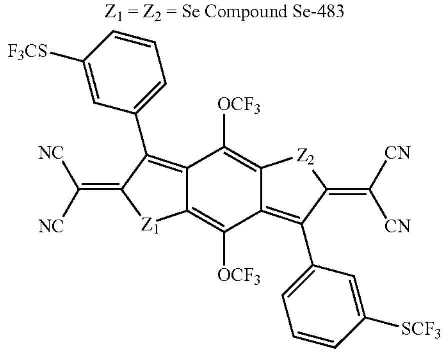

$Z_1 = Z_2 = O$ Compound O-484
$Z_1 = Z_2 = S$ Compound S-484
$Z_1 = Z_2 = Se$ Compound Se-484

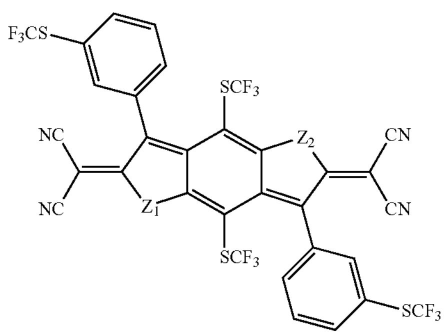

$Z_1 = Z_2 = O$ Compound O-485
$Z_1 = Z_2 = S$ Compound S-485
$Z_1 = Z_2 = Se$ Compound Se-485

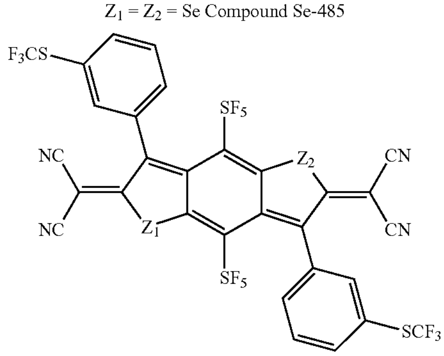

$Z_1 = Z_2 = O$ Compound O-486
$Z_1 = Z_2 = S$ Compound S-486
$Z_1 = Z_2 = Se$ Compound Se-486

-continued

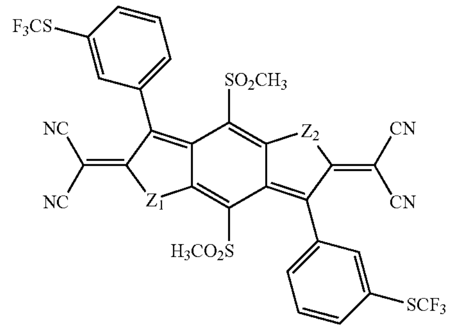

$Z_1 = Z_2 = O$ Compound O-487
$Z_1 = Z_2 = S$ Compound S-487
$Z_1 = Z_2 = Se$ Compound Se-487

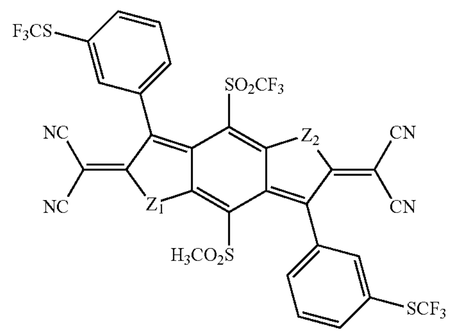

$Z_1 = Z_2 = O$ Compound O-488
$Z_1 = Z_2 = S$ Compound S-488
$Z_1 = Z_2 = Se$ Compound Se-488

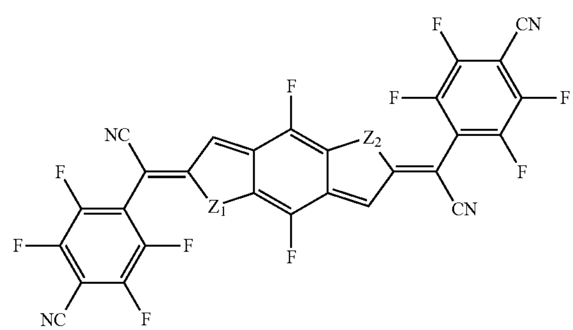

$Z_1 = Z_2 = O$ Compound O-489
$Z_1 = Z_2 = S$ Compound S-489
$Z_1 = Z_2 = Se$ Compound Se-489

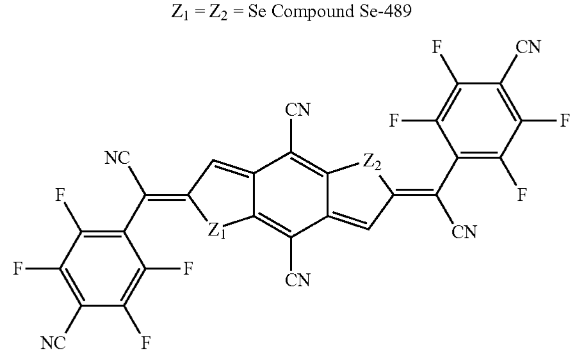

$Z_1 = Z_2 = O$ Compound O-490
$Z_1 = Z_2 = S$ Compound S-490
$Z_1 = Z_2 = Se$ Compound Se-490

-continued

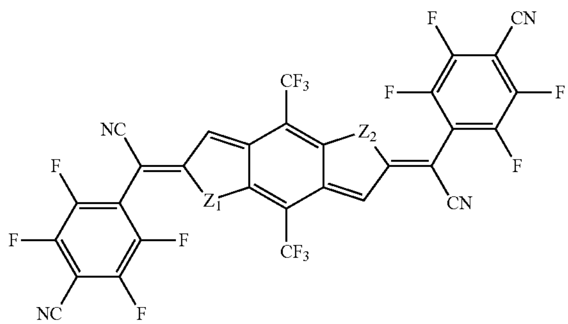

$Z_1 = Z_2 = O$ Compound O-491
$Z_1 = Z_2 = S$ Compound S-491
$Z_1 = Z_2 = Se$ Compound Se-491

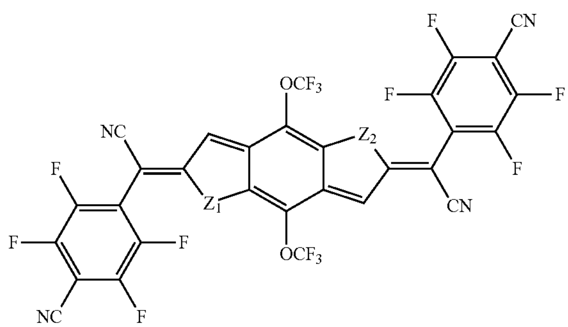

$Z_1 = Z_2 = O$ Compound O-492
$Z_1 = Z_2 = S$ Compound S-492
$Z_1 = Z_2 = Se$ Compound Se-492

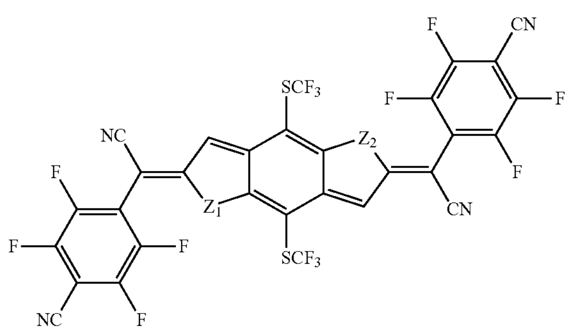

$Z_1 = Z_2 = O$ Compound O-493
$Z_1 = Z_2 = S$ Compound S-493
$Z_1 = Z_2 = Se$ Compound Se-493

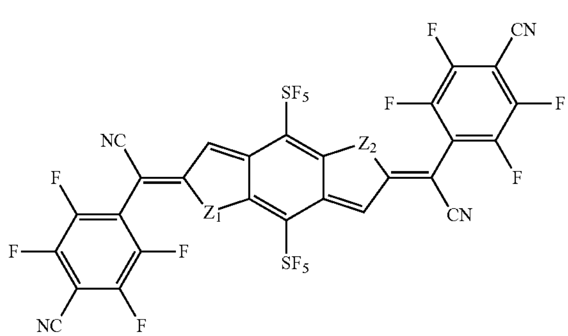

$Z_1 = Z_2 = O$ Compound O-494
$Z_1 = Z_2 = S$ Compound S-494
$Z_1 = Z_2 = Se$ Compound Se-494

-continued

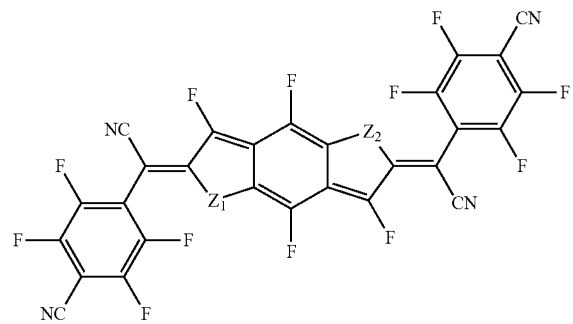

$Z_1 = Z_2 = O$ Compound O-495
$Z_1 = Z_2 = S$ Compound S-495
$Z_1 = Z_2 = Se$ Compound Se-495

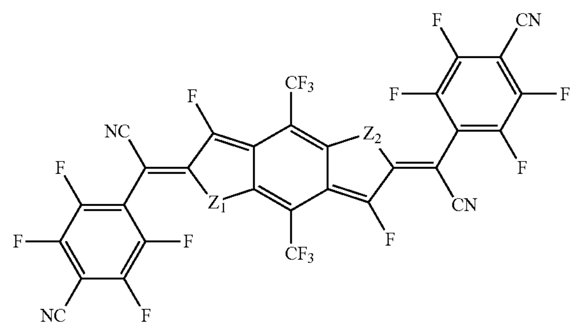

$Z_1 = Z_2 = O$ Compound O-496
$Z_1 = Z_2 = S$ Compound S-496
$Z_1 = Z_2 = Se$ Compound Se-496

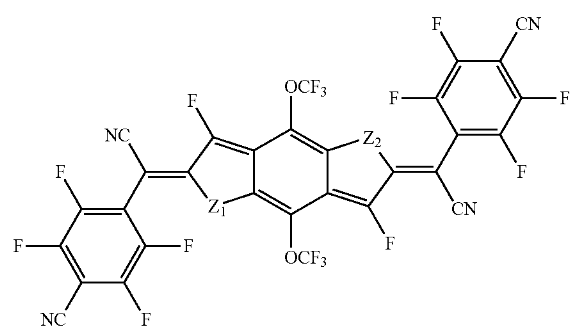

$Z_1 = Z_2 = O$ Compound O-497
$Z_1 = Z_2 = S$ Compound S-497
$Z_1 = Z_2 = Se$ Compound Se-497

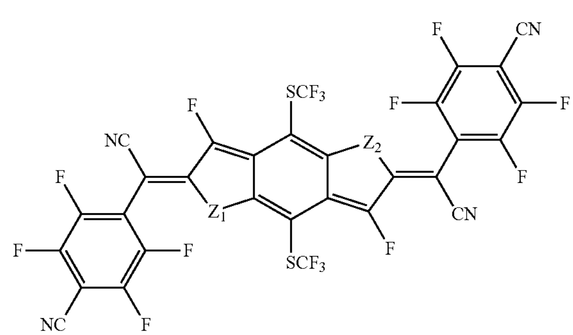

$Z_1 = Z_2 = O$ Compound O-498
$Z_1 = Z_2 = S$ Compound S-498
$Z_1 = Z_2 = Se$ Compound Se-498

-continued

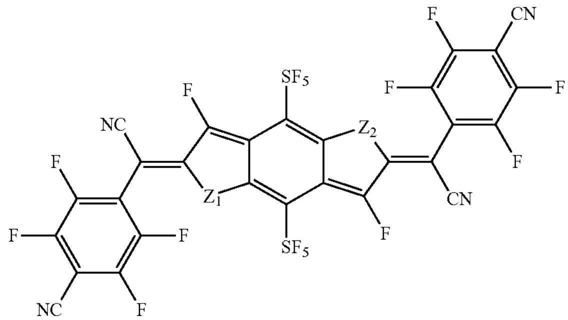

$Z_1 = Z_2 = O$ Compound O-499
$Z_1 = Z_2 = S$ Compound S-499
$Z_1 = Z_2 = Se$ Compound Se-499

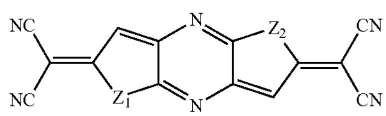

$Z_1 = Z_2 = O$ Compound O-500
$Z_1 = Z_2 = S$ Compound S-500
$Z_1 = Z_2 = Se$ Compound Se-500

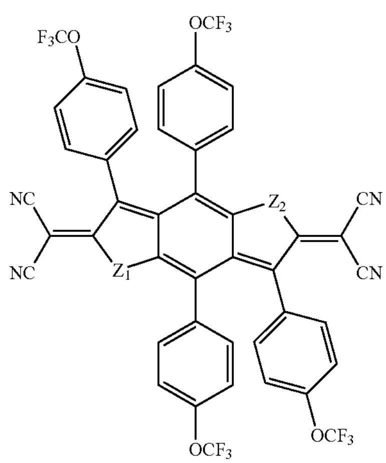

$Z_1 = Z_2 = O$ Compound O-501
$Z_1 = Z_2 = S$ Compound S-501
$Z_1 = Z_2 = Se$ Compound Se-501

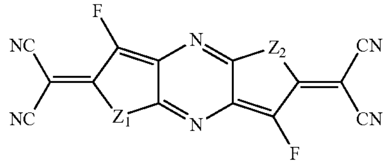

$Z_1 = Z_2 = O$ Compound O-502
$Z_1 = Z_2 = S$ Compound S-502
$Z_1 = Z_2 = Se$ Compound Se-502

-continued

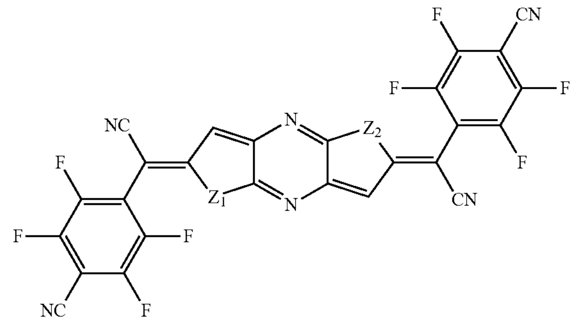

$Z_1 = Z_2 = O$ Compound O-503
$Z_1 = Z_2 = S$ Compound S-503
$Z_1 = Z_2 = Se$ Compound Se-503

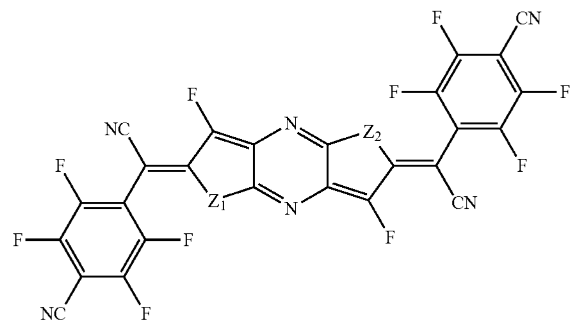

$Z_1 = Z_2 = O$ Compound O-504
$Z_1 = Z_2 = S$ Compound S-504
$Z_1 = Z_2 = Se$ Compound Se-504

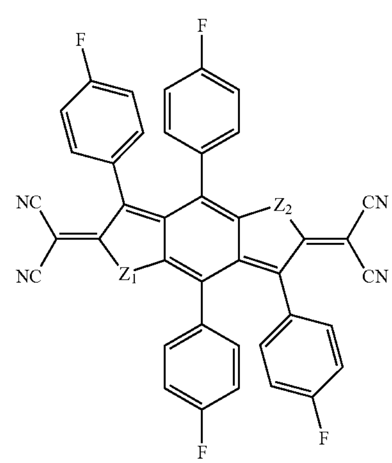

$Z_1 = Z_2 = O$ Compound O-505
$Z_1 = Z_2 = S$ Compound S-505
$Z_1 = Z_2 = Se$ Compound Se-505

-continued

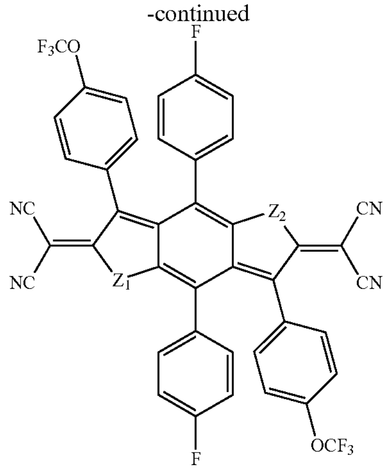

$Z_1 = Z_2 = O$ Compound O-506
$Z_1 = Z_2 = S$ Compound S-506
$Z_1 = Z_2 = Se$ Compound Se-506

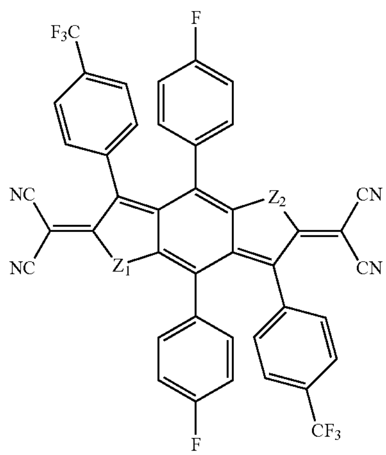

$Z_1 = Z_2 = O$ Compound O-507
$Z_1 = Z_2 = S$ Compound S-507
$Z_1 = Z_2 = Se$ Compound Se-507

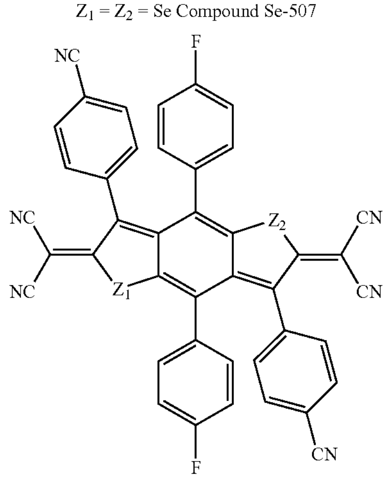

$Z_1 = Z_2 = O$ Compound O-508
$Z_1 = Z_2 = S$ Compound S-508
$Z_1 = Z_2 = Se$ Compound Se-508

-continued

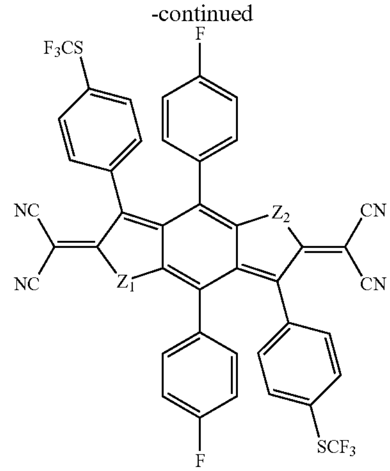

$Z_1 = Z_2 = O$ Compound O-509
$Z_1 = Z_2 = S$ Compound S-509
$Z_1 = Z_2 = Se$ Compound Se-509

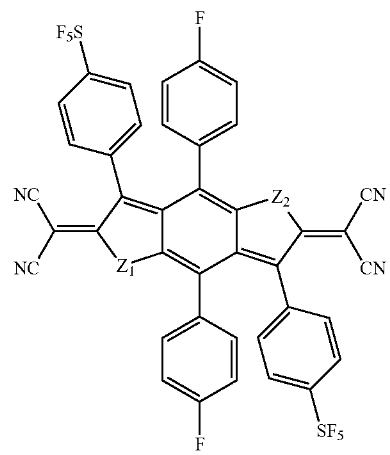

$Z_1 = Z_2 = O$ Compound O-510
$Z_1 = Z_2 = S$ Compound S-510
$Z_1 = Z_2 = Se$ Compound Se-510

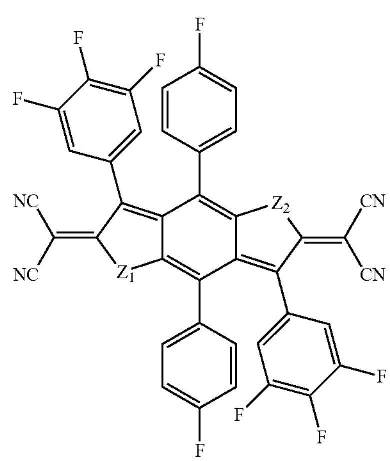

$Z_1 = Z_2 = O$ Compound O-511
$Z_1 = Z_2 = S$ Compound S-511
$Z_1 = Z_2 = Se$ Compound Se-511

-continued

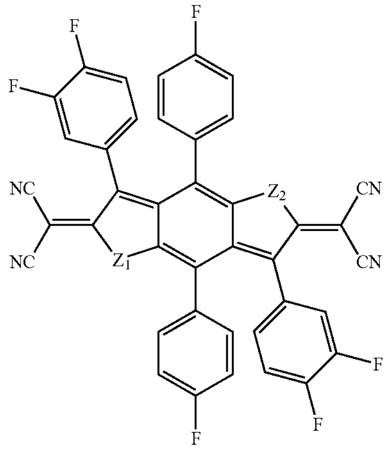

$Z_1 = Z_2 = O$ Compound O-512
$Z_1 = Z_2 = S$ Compound S-512
$Z_1 = Z_2 = Se$ Compound Se-512

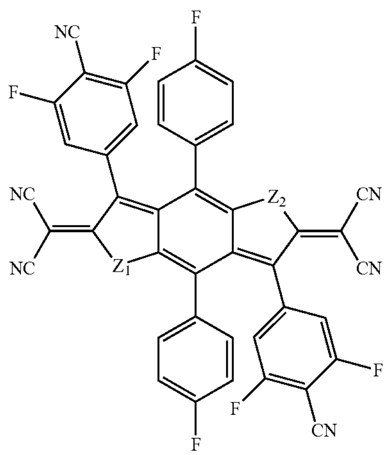

$Z_1 = Z_2 = O$ Compound O-513
$Z_1 = Z_2 = S$ Compound S-513
$Z_1 = Z_2 = Se$ Compound Se-513

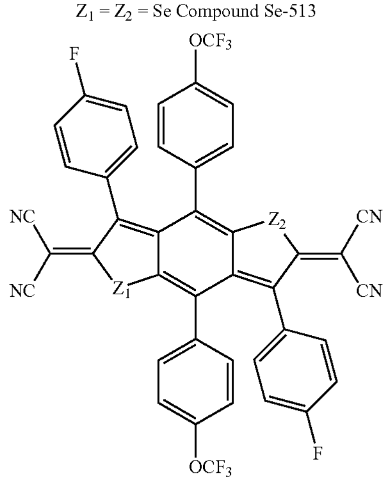

$Z_1 = Z_2 = O$ Compound O-514
$Z_1 = Z_2 = S$ Compound S-514
$Z_1 = Z_2 = Se$ Compound Se-514

-continued

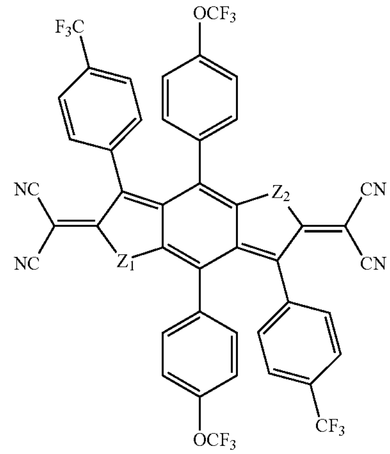

$Z_1 = Z_2 = O$ Compound O-515
$Z_1 = Z_2 = S$ Compound S-515
$Z_1 = Z_2 = Se$ Compound Se-515

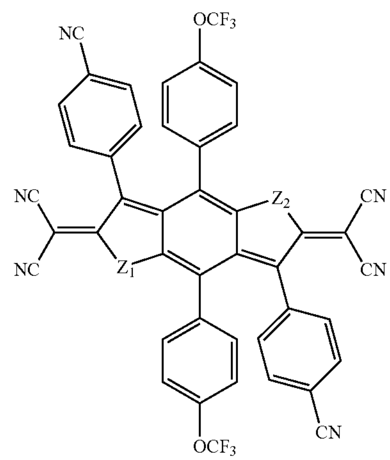

$Z_1 = Z_2 = O$ Compound O-516
$Z_1 = Z_2 = S$ Compound S-516
$Z_1 = Z_2 = Se$ Compound Se-516

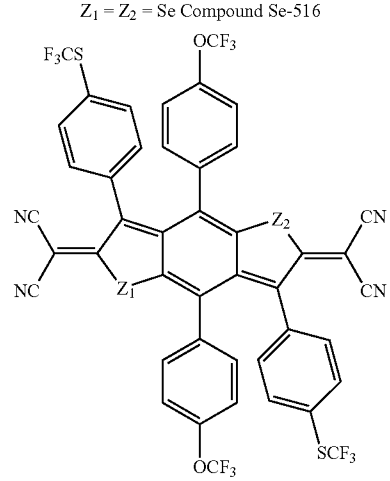

$Z_1 = Z_2 = O$ Compound O-517
$Z_1 = Z_2 = S$ Compound S-517
$Z_1 = Z_2 = Se$ Compound Se-517

-continued

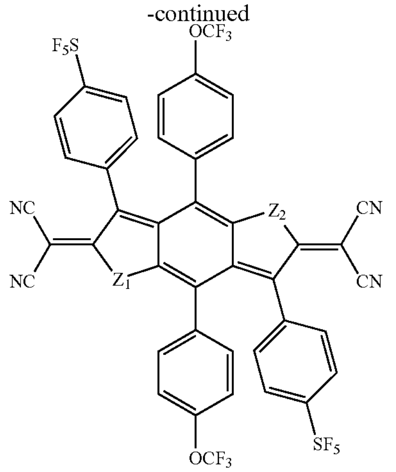

$Z_1 = Z_2 = O$ Compound O-518
$Z_1 = Z_2 = S$ Compound S-518
$Z_1 = Z_2 = Se$ Compound Se-518

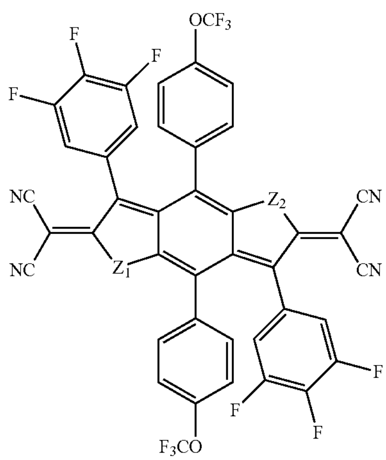

$Z_1 = Z_2 = O$ Compound O-519
$Z_1 = Z_2 = S$ Compound S-519
$Z_1 = Z_2 = Se$ Compound Se-519

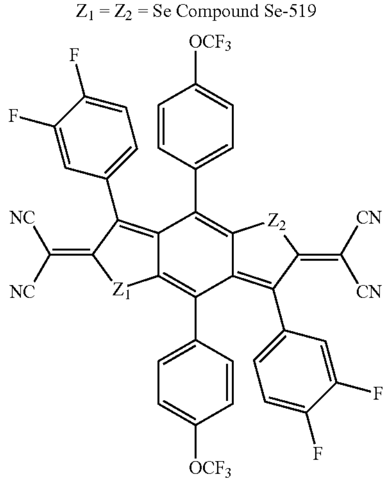

$Z_1 = Z_2 = O$ Compound O-520
$Z_1 = Z_2 = S$ Compound S-520
$Z_1 = Z_2 = Se$ Compound Se-520

-continued

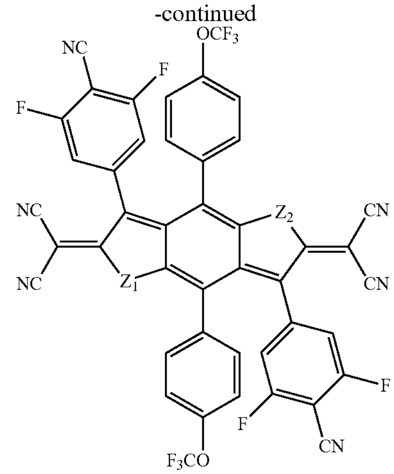

$Z_1 = Z_2 = O$ Compound O-521
$Z_1 = Z_2 = S$ Compound S-521
$Z_1 = Z_2 = Se$ Compound Se-521

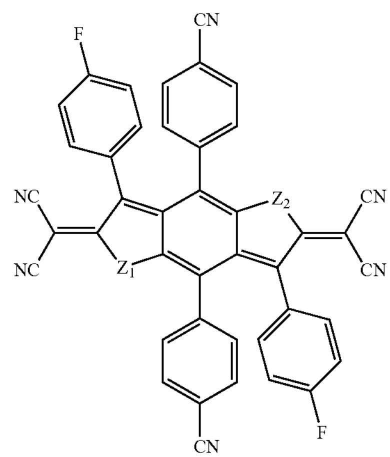

$Z_1 = Z_2 = O$ Compound O-522
$Z_1 = Z_2 = S$ Compound S-522
$Z_1 = Z_2 = Se$ Compound Se-522

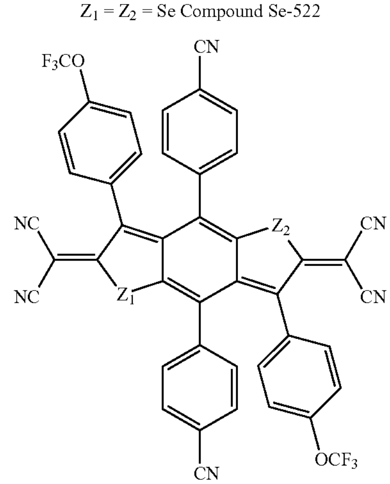

$Z_1 = Z_2 = O$ Compound O-523
$Z_1 = Z_2 = S$ Compound S-523
$Z_1 = Z_2 = Se$ Compound Se-523

-continued

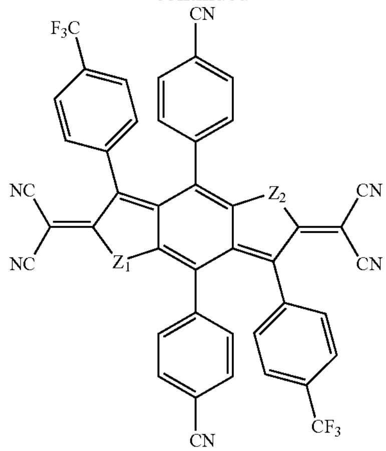

$Z_1 = Z_2 =$ O Compound O-524
$Z_1 = Z_2 =$ S Compound S-524
$Z_1 = Z_2 =$ Se Compound Se-524

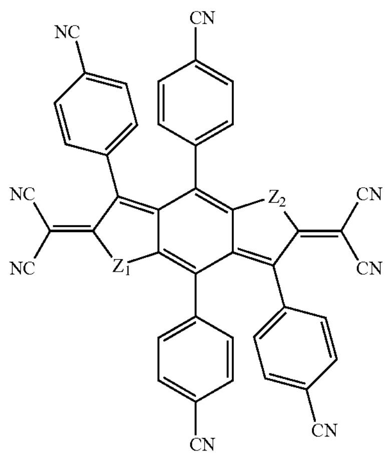

$Z_1 = Z_2 =$ O Compound O-525
$Z_1 = Z_2 =$ S Compound S-525
$Z_1 = Z_2 =$ Se Compound Se-525

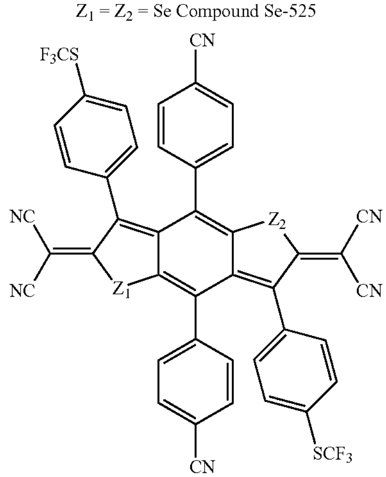

$Z_1 = Z_2 =$ O Compound O-526
$Z_1 = Z_2 =$ S Compound S-526
$Z_1 = Z_2 =$ Se Compound Se-526

-continued

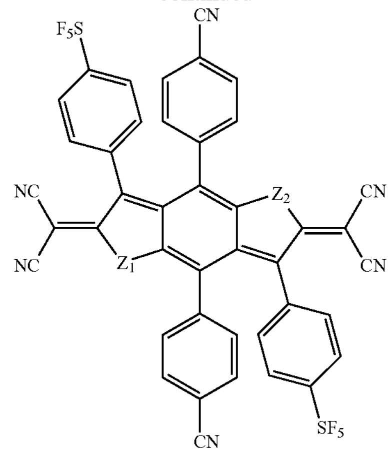

$Z_1 = Z_2 =$ O Compound O-527
$Z_1 = Z_2 =$ S Compound S-527
$Z_1 = Z_2 =$ Se Compound Se-527

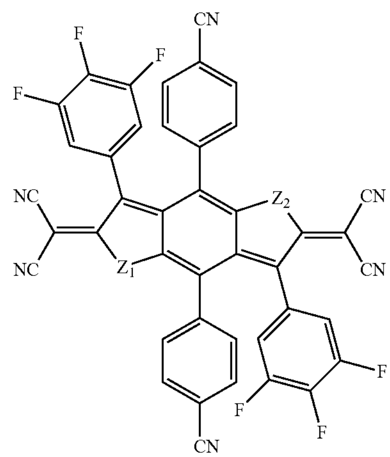

$Z_1 = Z_2 =$ O Compound O-528
$Z_1 = Z_2 =$ S Compound S-528
$Z_1 = Z_2 =$ Se Compound Se-528

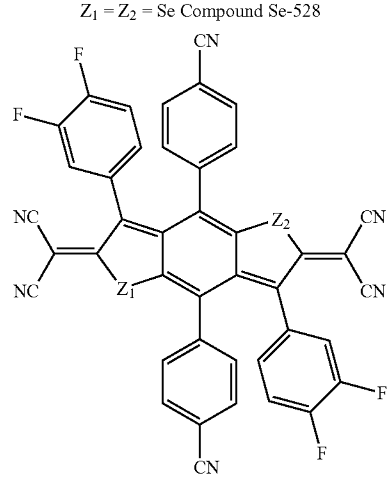

$Z_1 = Z_2 =$ O Compound O-529
$Z_1 = Z_2 =$ S Compound S-529
$Z_1 = Z_2 =$ Se Compound Se-529

-continued

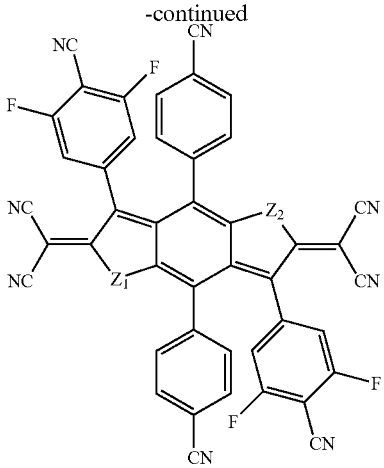

$Z_1 = Z_2 = O$ Compound O-530
$Z_1 = Z_2 = S$ Compound S-530
$Z_1 = Z_2 = Se$ Compound Se-530

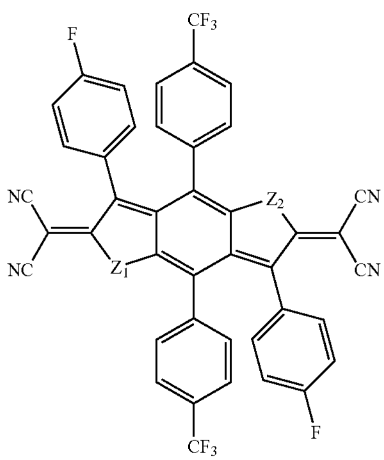

$Z_1 = Z_2 = O$ Compound O-531
$Z_1 = Z_2 = S$ Compound S-531
$Z_1 = Z_2 = Se$ Compound Se-531

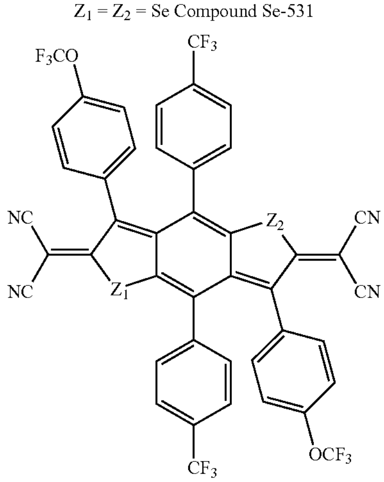

$Z_1 = Z_2 = O$ Compound O-532
$Z_1 = Z_2 = S$ Compound S-532
$Z_1 = Z_2 = Se$ Compound Se-532

-continued

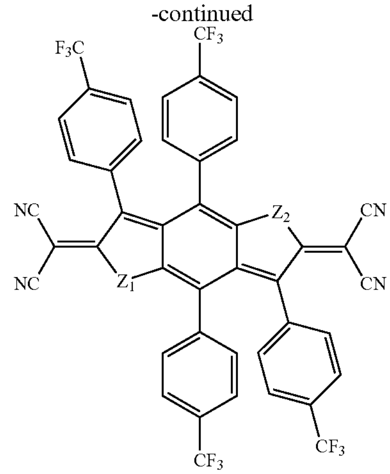

$Z_1 = Z_2 = O$ Compound O-533
$Z_1 = Z_2 = S$ Compound S-533
$Z_1 = Z_2 = Se$ Compound Se-533

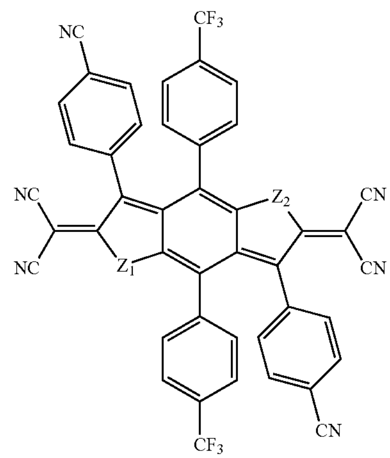

$Z_1 = Z_2 = O$ Compound O-534
$Z_1 = Z_2 = S$ Compound S-534
$Z_1 = Z_2 = Se$ Compound Se-534

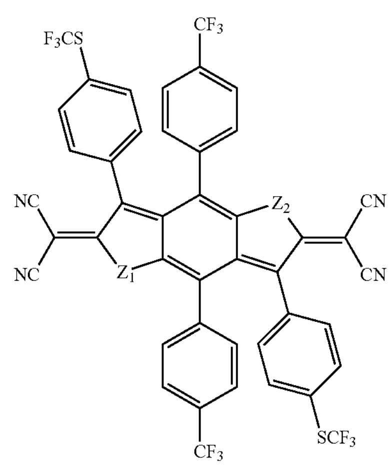

$Z_1 = Z_2 = O$ Compound O-535
$Z_1 = Z_2 = S$ Compound S-535
$Z_1 = Z_2 = Se$ Compound Se-535

-continued

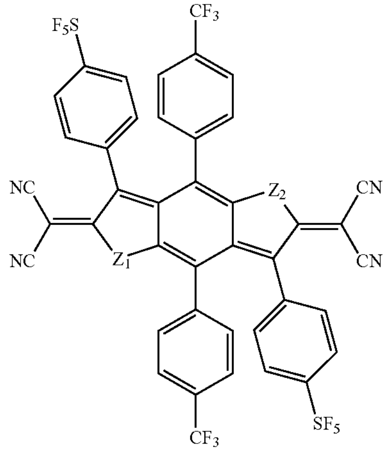

$Z_1 = Z_2 = O$ Compound O-536
$Z_1 = Z_2 = S$ Compound S-536
$Z_1 = Z_2 = Se$ Compound Se-536

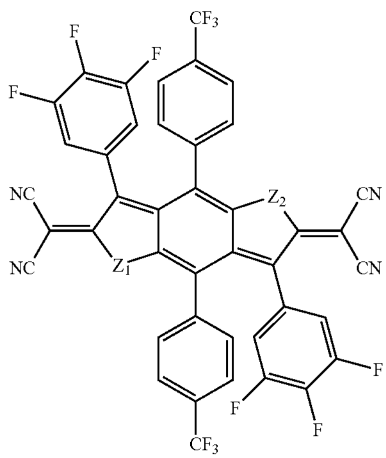

$Z_1 = Z_2 = O$ Compound O-537
$Z_1 = Z_2 = S$ Compound S-537
$Z_1 = Z_2 = Se$ Compound Se-537

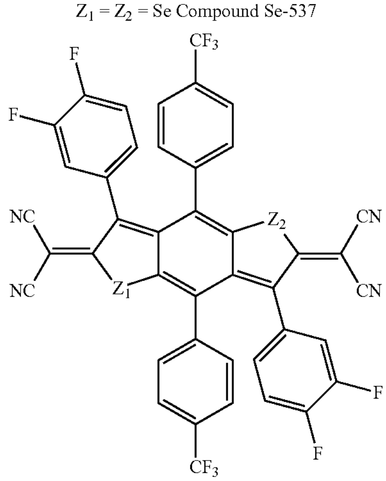

$Z_1 = Z_2 = O$ Compound O-538
$Z_1 = Z_2 = S$ Compound S-538
$Z_1 = Z_2 = Se$ Compound Se-538

-continued

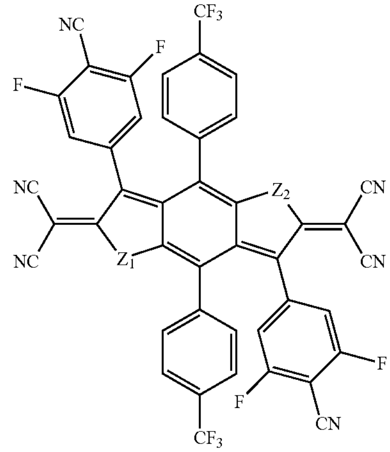

$Z_1 = Z_2 = O$ Compound O-539
$Z_1 = Z_2 = S$ Compound S-539
$Z_1 = Z_2 = Se$ Compound Se-539

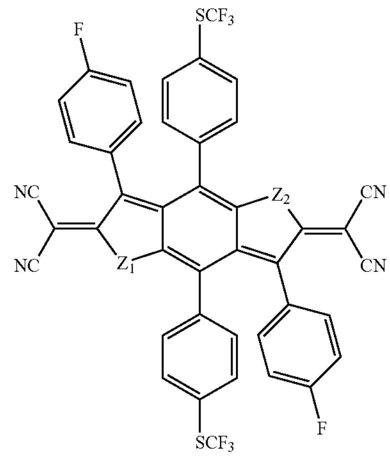

$Z_1 = Z_2 = O$ Compound O-540
$Z_1 = Z_2 = S$ Compound S-540
$Z_1 = Z_2 = Se$ Compound Se-540

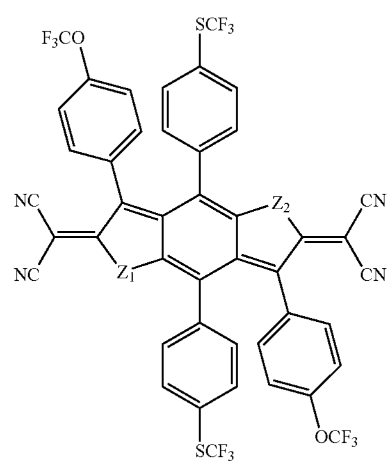

$Z_1 = Z_2 = O$ Compound O-541
$Z_1 = Z_2 = S$ Compound S-541
$Z_1 = Z_2 = Se$ Compound Se-541

-continued

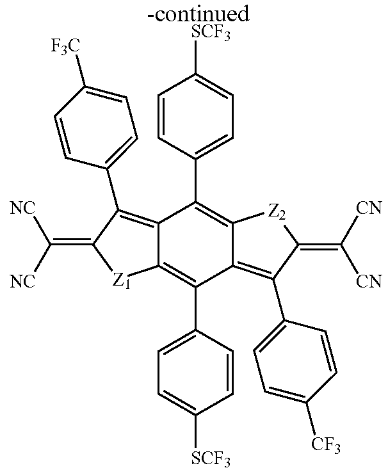

$Z_1 = Z_2 = O$ Compound O-542
$Z_1 = Z_2 = S$ Compound S-542
$Z_1 = Z_2 = Se$ Compound Se-542

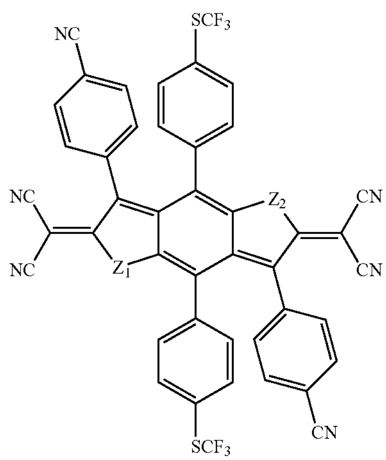

$Z_1 = Z_2 = O$ Compound O-543
$Z_1 = Z_2 = S$ Compound S-543
$Z_1 = Z_2 = Se$ Compound Se-543

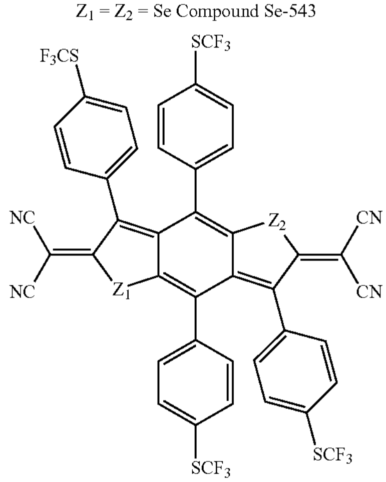

$Z_1 = Z_2 = O$ Compound O-544
$Z_1 = Z_2 = S$ Compound S-544
$Z_1 = Z_2 = Se$ Compound Se-544

-continued

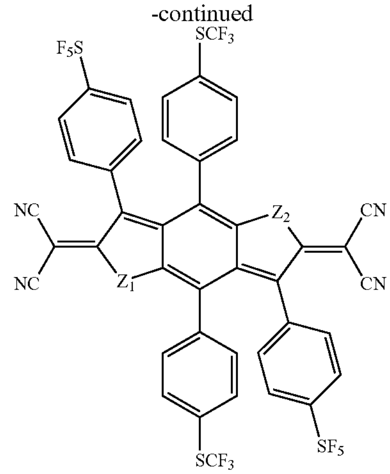

$Z_1 = Z_2 = O$ Compound O-545
$Z_1 = Z_2 = S$ Compound S-545
$Z_1 = Z_2 = Se$ Compound Se-545

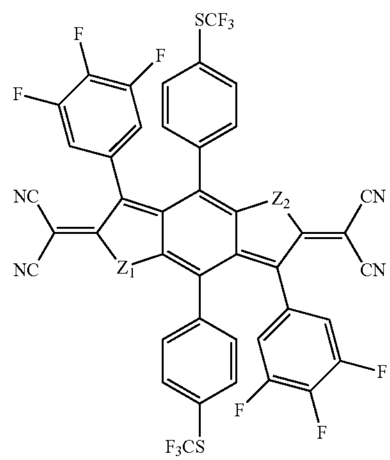

$Z_1 = Z_2 = O$ Compound O-546
$Z_1 = Z_2 = S$ Compound S-546
$Z_1 = Z_2 = Se$ Compound Se-546

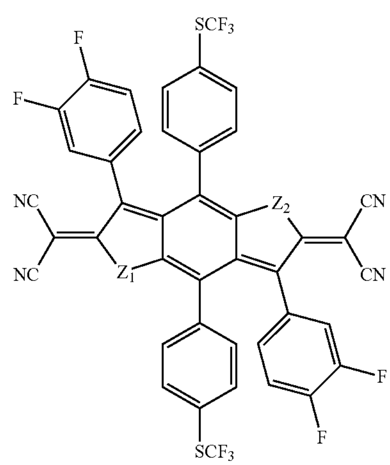

$Z_1 = Z_2 = O$ Compound O-547
$Z_1 = Z_2 = S$ Compound S-547
$Z_1 = Z_2 = Se$ Compound Se-547

-continued

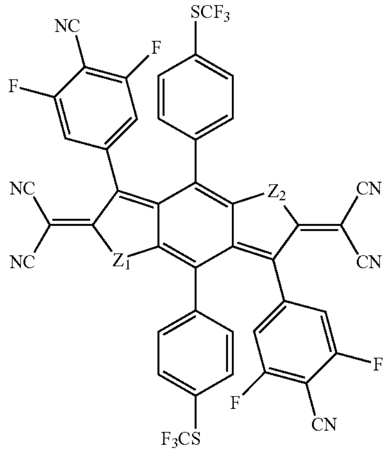

$Z_1 = Z_2 =$ O Compound O-548
$Z_1 = Z_2 =$ S Compound S-548
$Z_1 = Z_2 =$ Se Compound Se-548

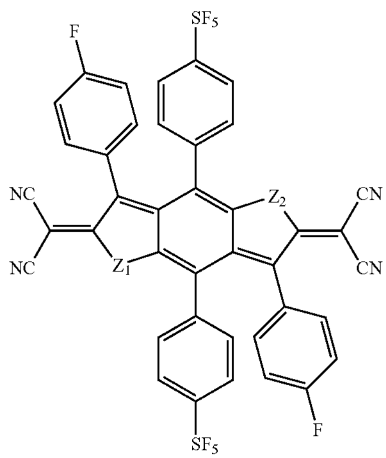

$Z_1 = Z_2 =$ O Compound O-549
$Z_1 = Z_2 =$ S Compound S-549
$Z_1 = Z_2 =$ Se Compound Se-549

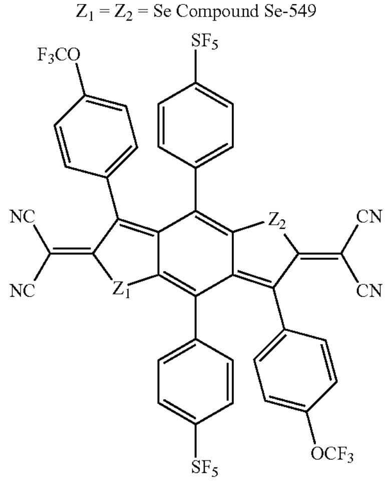

$Z_1 = Z_2 =$ O Compound O-550
$Z_1 = Z_2 =$ S Compound S-550
$Z_1 = Z_2 =$ Se Compound Se-550

-continued

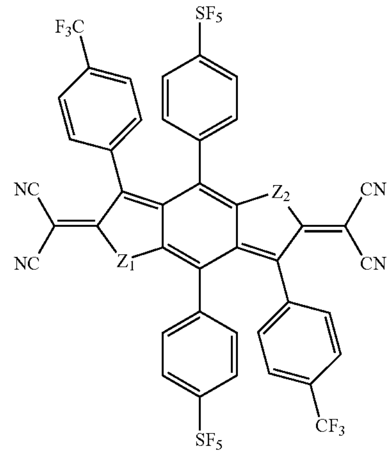

$Z_1 = Z_2 =$ O Compound O-551
$Z_1 = Z_2 =$ S Compound S-551
$Z_1 = Z_2 =$ Se Compound Se-551

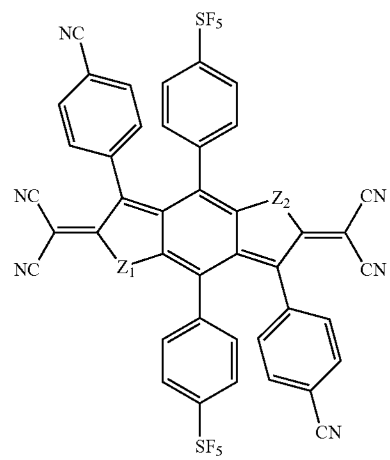

$Z_1 = Z_2 =$ O Compound O-552
$Z_1 = Z_2 =$ S Compound S-552
$Z_1 = Z_2 =$ Se Compound Se-552

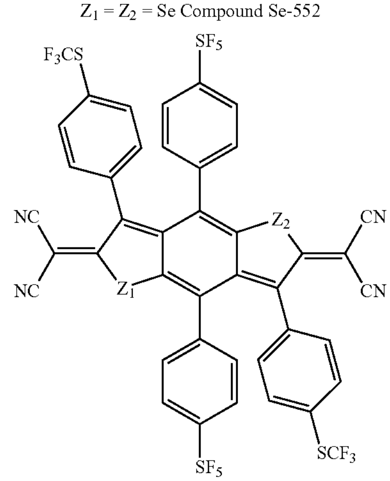

$Z_1 = Z_2 =$ O Compound O-553
$Z_1 = Z_2 =$ S Compound S-553
$Z_1 = Z_2 =$ Se Compound Se-553

-continued

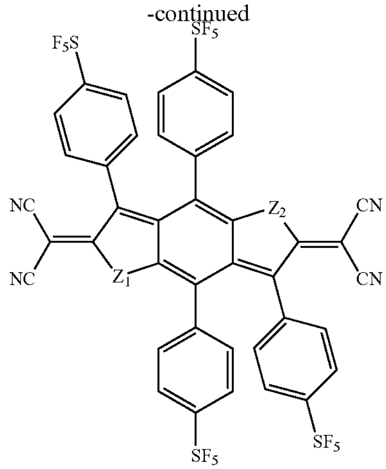

$Z_1 = Z_2 = O$ Compound O-554
$Z_1 = Z_2 = S$ Compound S-554
$Z_1 = Z_2 = Se$ Compound Se-554

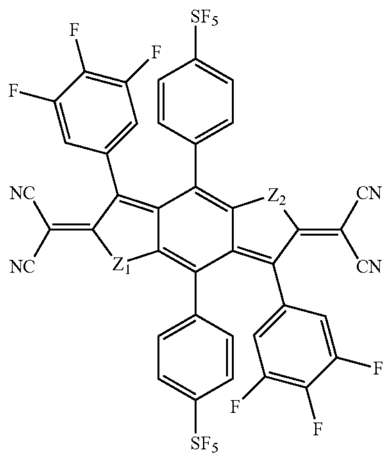

$Z_1 = Z_2 = O$ Compound O-555
$Z_1 = Z_2 = S$ Compound S-555
$Z_1 = Z_2 = Se$ Compound Se-555

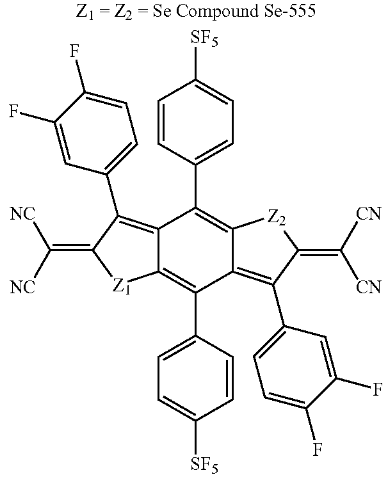

$Z_1 = Z_2 = O$ Compound O-556
$Z_1 = Z_2 = S$ Compound S-556
$Z_1 = Z_2 = Se$ Compound Se-556

-continued

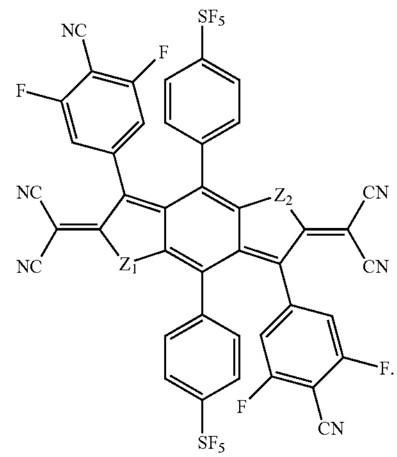

$Z_1 = Z_2 = O$ Compound O-557
$Z_1 = Z_2 = S$ Compound S-557
$Z_1 = Z_2 = Se$ Compound Se-557

11. An electroluminescent device comprising an anode, a cathode, and an organic layer disposed between the anode and the cathode, further comprising the compound of claim 1.

12. The device of claim 11, wherein the organic layer is a charge transporting layer.

13. The device of claim 12, wherein the organic layer further comprises an arylamine compound.

14. The device of claim 11, wherein the organic layer is a hole injection layer.

15. The device of claim 14, wherein the organic layer further comprises an arylamine compound.

16. The device of claim 11, wherein the device further comprises a light emitting layer.

17. An organic light-emitting device comprising a plurality of stacks between an anode and a cathode, the stacks comprise a first light-emitting layer and a second light-emitting layer, wherein the first stack comprises a first light-emitting layer, the second stack comprises a second light-emitting layer, and a charge generation layer is disposed between the first stack and the second stack, wherein the charge generation layer comprises a p type charge generation layer and an n type charge generation layer, wherein the p type charge generation layer comprises the compound of claim 1.

18. The compound of claim 1, wherein $Z_1$ and $Z_2$ are O.

* * * * *